US009188865B2

(12) United States Patent
Yokokawa et al.

(10) Patent No.: US 9,188,865 B2
(45) Date of Patent: Nov. 17, 2015

(54) ACTINIC RAY-SENSITIVE OR RADIATION-SENSITIVE COMPOSITION, RESIST FILM USING THE SAME, PATTERN FORMING METHOD, METHOD FOR MANUFACTURING ELECTRONIC DEVICE, AND ELECTRONIC DEVICE

(71) Applicant: FUJIFILM CORPORATION, Tokyo (JP)

(72) Inventors: Natsumi Yokokawa, Shizuoka (JP); Hiroo Takizawa, Shizuoka (JP); Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/476,936

(22) Filed: Sep. 4, 2014

(65) Prior Publication Data

US 2015/0010857 A1 Jan. 8, 2015

Related U.S. Application Data

(63) Continuation of application No. PCT/JP2013/058467, filed on Mar. 18, 2013.

(30) Foreign Application Priority Data

Mar. 21, 2012 (JP) ................................ 2012-064522

(51) Int. Cl.
*G03F 7/039* (2006.01)
*G03F 7/038* (2006.01)
(Continued)

(52) U.S. Cl.
CPC ................ *G03F 7/0392* (2013.01); *C08F 8/02* (2013.01); *C08F 8/12* (2013.01); *C08F 8/14* (2013.01);
(Continued)

(58) Field of Classification Search
None
See application file for complete search history.

(56) References Cited

U.S. PATENT DOCUMENTS

2006/0177763 A1 8/2006 Matsuoka et al.
2007/0148584 A1 6/2007 Takeda et al.

(Continued)

FOREIGN PATENT DOCUMENTS

JP 9-179300 A 7/1997
JP 2004-348014 A 12/2004

(Continued)

OTHER PUBLICATIONS

Office Action date Feb. 10, 2015, issued by the Korean Intellectual Property Office in counterpart Korean Application No. 10-2014-7026082.

(Continued)

*Primary Examiner* — Sin Lee
(74) *Attorney, Agent, or Firm* — Sughrue Mion, PLLC

(57) ABSTRACT

There is provided an actinic ray-sensitive or radiation-sensitive resin composition containing a resin (P) having a repeating unit represented by the following Formula (A) and having at least two of a repeating unit represented by the following Formula (B), a repeating unit represented by the following Formula (C), a repeating unit represented by the following Formula (D) and a repeating unit represented by the following Formula (E).

(A)

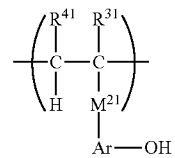

(B)

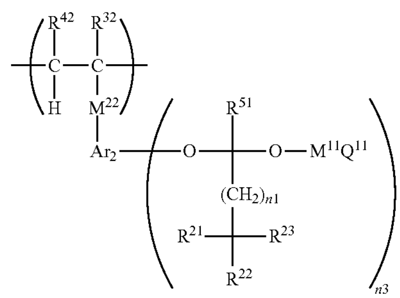

(C)

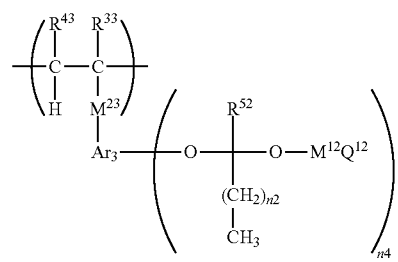

(D)

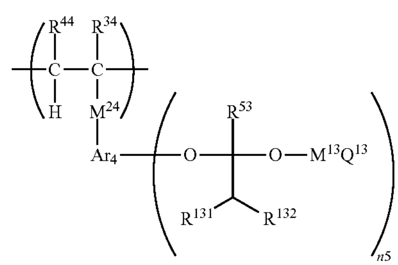

(E)

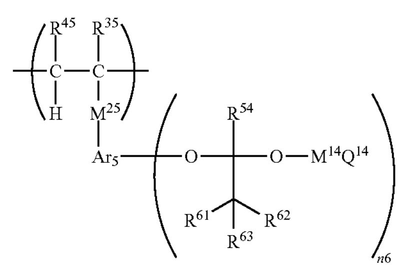

11 Claims, No Drawings

(51) Int. Cl.

| | |
|---|---|
| ***G03F 7/004*** | (2006.01) |
| ***G03F 7/30*** | (2006.01) |
| ***C08F 212/14*** | (2006.01) |
| ***C08F 12/24*** | (2006.01) |
| ***C08F 212/32*** | (2006.01) |
| ***C08F 220/18*** | (2006.01) |
| ***C08F 220/20*** | (2006.01) |
| ***C08F 232/08*** | (2006.01) |
| ***C08F 8/02*** | (2006.01) |
| ***C08F 8/12*** | (2006.01) |
| ***C08F 8/14*** | (2006.01) |
| ***C08F 8/34*** | (2006.01) |
| ***C08F 8/36*** | (2006.01) |
| ***C08F 220/30*** | (2006.01) |
| *C08F 12/20* | (2006.01) |
| *C08F 12/30* | (2006.01) |

(52) U.S. Cl.

CPC ... *C08F 8/34* (2013.01); *C08F 8/36* (2013.01); *C08F 12/24* (2013.01); *C08F 212/14* (2013.01); *C08F 212/32* (2013.01); *C08F 220/18* (2013.01); *C08F 220/20* (2013.01); *C08F 220/30* (2013.01); *C08F 232/08* (2013.01); *G03F 7/0045* (2013.01); *G03F 7/038* (2013.01); *G03F 7/039* (2013.01); *G03F 7/0397* (2013.01); *G03F 7/30* (2013.01); *C08F 12/20* (2013.01); *C08F 12/30* (2013.01); *C08F 2800/10* (2013.01)

(56) References Cited

U.S. PATENT DOCUMENTS

| | | | |
|---|---|---|---|
| 2008/0020289 | A1 | 1/2008 | Hatakeyama et al. |
| 2009/0035702 | A1 | 2/2009 | Matsuoka et al. |

FOREIGN PATENT DOCUMENTS

| | | | |
|---|---|---|---|
| JP | 2005-232396 | A | 9/2005 |
| JP | 2008-7743 | A | 1/2008 |
| JP | 2008-50568 | A | 3/2008 |
| JP | 2011-154216 | A | 8/2011 |
| WO | 2005/023880 | A1 | 3/2005 |
| WO | 2010/104074 | A1 | 9/2010 |

OTHER PUBLICATIONS

International Search Report dated Apr. 23, 2013 issued in International Application No. PCT/JP2013/058467 (PCT/ISA/210).

Written Opinion dated Apr. 23, 2013 issued in International Application No. PCT/JP2013/058467 (PCT/ISA/237).

Office Action dated Sep. 16, 2014, issued by the Japanese Patent Office in counterpart Japanese Application No. 2012-064522.

Communication dated Jun. 12, 2015 issued by the Korean Intellectual Property Office in counterpart Korean Patent Application No. 10-2014-7026082 English Translation.

ACTINIC RAY-SENSITIVE OR RADIATION-SENSITIVE COMPOSITION, RESIST FILM USING THE SAME, PATTERN FORMING METHOD, METHOD FOR MANUFACTURING ELECTRONIC DEVICE, AND ELECTRONIC DEVICE

CROSS REFERENCE TO RELATED APPLICATION

This is a continuation of International application No. PCT/JP2013/058467 filed on Mar. 18, 2013, and claims priority from Japanese Patent Application No. 2012-064522 filed on Mar. 21, 2012, the entire disclosures of which are incorporated herein by reference.

TECHNICAL FIELD

The present invention relates to an actinic ray-sensitive or radiation-sensitive composition, an actinic ray-sensitive or radiation-sensitive film using the same, a pattern forming method, a method for manufacturing an electronic device, and an electronic device. More specifically, the present invention relates to an actinic ray-sensitive or radiation-sensitive composition suitably used in a super micro lithography process such as a manufacturing process of a super LSI and high capacity microchip, a fabricating process of a mold structure for nano-imprint and a manufacturing process of a high-density information recording medium, and other photo-fabrication process, an actinic ray-sensitive or radiation-sensitive film using the same, a pattern forming method, a method for manufacturing an electronic device, and an electronic device.

BACKGROUND ART

A micromachining by a lithography using a photoresist composition has been conducted in a conventional manufacturing process of a semiconductor device such as an IC or LSI. Recently, an ultrafine pattern formation of a submicron region or a quarter micron region has been required as an integration level of an integrated circuit becomes higher. Accordingly, an exposure wavelength has a tendency to become shorter from g line to i line, and further to a KrF excimer laser ray. Furthermore, development of a lithography using an electron beam or X-ray or EUV ray other than the excimer laser ray is progressing.

Particularly, electron beam lithography takes a seat as a pattern forming technique of the next generation or the next of the next generation, and a positive type resist of a high sensitivity and high resolution is desired. Particularly, a high sensitization is very important problem to be solved for shortening of a processing time of wafer. However, when intending to a high sensitization for a positive type resist for electron beam, a resolution is prone to be reduced.

Accordingly, the high sensitivity and the high resolution, and furthermore, a good pattern shape are in a relationship of tradeoff therebetween and thus it is very important how to satisfy them at the same time.

Similarly, for a lithography using an X-ray or EUV ray, it is important to satisfy a high sensitivity, a high resolution and a good pattern shape at the same time, and thus, it is required to solve the problems.

In order to solve the problems, for example, Japanese Patent Application Laid-Open No. H9-179300, International Publication WO 2005/23880, Japanese Patent Application Laid-Open No. 2005-232396, and Japanese Patent Application Laid-Open No. 2004-348014 disclose a resist composition using a resin having an acetal type protecting group. According to the documents, the resolution and the sensitivity are said to be improved.

However, further performance improvement is required for the resolution and the sensitivity, and furthermore, the pattern shape and exposure latitude (EL).

An object of the present invention is to provide an actinic ray-sensitive or radiation-sensitive composition satisfying a high resolution property (high resolution and the like), a high sensitivity, a good pattern shape, a good roughness characteristic, a good flare resistance and a good exposure latitude (EL) at the same time, an actinic ray-sensitive or radiation-sensitive film using the same, a pattern forming method, a method for manufacturing an electronic device, and an electronic device.

Further, another object of the present invention is to impart a resistance (hereinafter, flare resistance) to flare (which is an EUV ray reflected from a wafer, and affects even originally unexposed portion) derived from an EUV exposure apparatus. For this object, the present invention provides a means for making the sensitivity and the flare resistance compatible because reducing the reactivity of a deprotected group causes the sensitivity to decrease.

SUMMARY OF INVENTION

That is, the present invention is as follows.

(1) An actinic ray-sensitive or radiation-sensitive resin composition containing: a resin (P) having a repeating unit represented by the following Formula (A) and having at least two of a repeating unit represented by the following Formula (B), a repeating unit represented by the following Formula (C), a repeating unit represented by the following Formula (D) and a repeating unit represented by the following Formula (E):

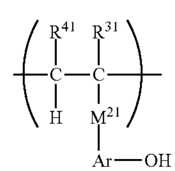

(A)

wherein in Formula (A), $R^{41}$ represents a hydrogen atom or an alkyl group, $R^{41}$, and $M^{21}$ or Ar may be bound with each other to form a ring, and in that case, $R^{41}$ represents an alkylene group;

$R^{31}$ represents a hydrogen atom or an alkyl group;

$M^{21}$ represents a single bond or a divalent linking group, and in the case of being bound with $R^{41}$ to form a ring, represents a trivalent linking group; and Ar represents a divalent aromatic ring group, and in the case of being bound with $R^{41}$ to form a ring, represents a trivalent aromatic ring group:

(B)

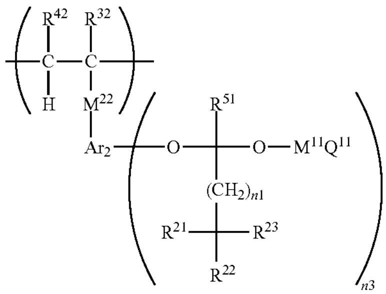

wherein in Formula (B), $R^{51}$ represents a hydrogen atom or an alkyl group;

each of $R^{21}$ to $R^{23}$ independently represents a hydrogen atom, an alkyl group, a cycloalkyl group, an aryl group, an aralkyl group or a heterocyclic group, and each of at least two of $R^{21}$ to $R^{23}$ independently represents an alkyl group, a cycloalkyl group, an aryl group, an aralkyl group or a heterocyclic group;

at least two of $R^{21}$ to $R^{23}$ may be bound with each other to form a ring, provided that at least one of $R^{21}$ to $R^{23}$, and $M^{11}$ or $Q^{11}$ are not bound to form a ring;

$R^{32}$ represents a hydrogen atom or an alkyl group;

$R^{42}$ represents a hydrogen atom or an alkyl group, $R^{42}$, and $M^{22}$ or $Ar_2$ may be bound with each other to form a ring, and in that case, $R^{42}$ represents an alkylene group;

$M^{22}$ represents a single bond or a divalent linking group, and in the case of being bound with $R^{42}$ to form a ring, represents a trivalent linking group;

$Ar_2$ represents a (n3+1)-valent aromatic ring group, and in the case of being bound with $R^{42}$ to form a ring, represents a (n3+2)-valent aromatic ring group;

$M^{11}$ represents a single bond or a divalent linking group;

$Q^{11}$ represents an alkyl group, a cycloalkyl group, an aryl group or a heterocyclic group;

when $M^{11}$ is a divalent linking group, $Q^{11}$ may be bound via a single bond or a separate linking group to $M^{11}$ to form a ring;

n1 represents an integer of 1 or more; and n3 represents an integer of 1 or more:

(C)

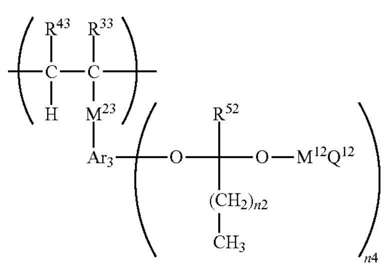

wherein in Formula (C), $R^{52}$ represents a hydrogen atom or an alkyl group;

$R^{33}$ represents a hydrogen atom or an alkyl group;

$R^{43}$ represents a hydrogen atom or an alkyl group, $R^{43}$, and $M^{23}$ or $Ar_3$ may be bound with each other to form a ring, and in that case, $R^{43}$ represents an alkylene group;

$M^{23}$ represents a single bond or a divalent linking group, and in the case of being bound with $R^{43}$ to form a ring, represents a trivalent linking group;

$Ar_3$ represents a (n4+1)-valent aromatic ring group, and in the case of being bound with $R^{43}$ to form a ring, represents a (n4+2)-valent aromatic ring group;

$M^{12}$ represents a single bond or a divalent linking group;

$Q^{12}$ represents an alkyl group, a cycloalkyl group, an aryl group or a heterocyclic group;

When $M^{12}$ is a divalent linking group, $Q^{12}$ may be bound via a single bond or a separate linking group to $M^{12}$ to form a ring;

n2 represents an integer of 0 or more; and n4 represents an integer of 1 or more:

(D)

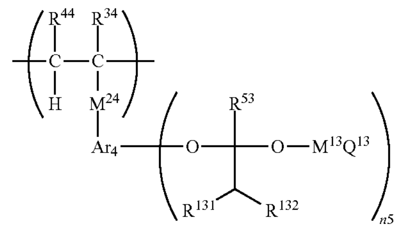

wherein in Formula (D), $R^{53}$ represents a hydrogen atom or an alkyl group;

each of $R^{131}$ and $R^{132}$ independently represents an alkyl group, a cycloalkyl group, an aryl group, an aralkyl group or a heterocyclic group, and each of $R^{131}$ and $R^{132}$ may be bound with each other to form a ring;

$R^{34}$ represents a hydrogen atom or an alkyl group;

$R^{44}$ represents a hydrogen atom or an alkyl group, $R^{44}$, and $M^{24}$ or $Ar_4$ may be bound with each other to form a ring, and in that case, $R^{44}$ represents an alkylene group;

$M^{24}$ represents a single bond or a divalent linking group, and in the case of being bound with $R^{44}$ to form a ring, represents a trivalent linking group;

$Ar_4$ represents a (n5+1)-valent aromatic ring group, and in the case of being bound with $R^{44}$ to form a ring, represents a (n5+2)-valent aromatic ring group;

$M^{13}$ represents a single bond or a divalent linking group;

$Q^{13}$ represents an alkyl group, a cycloalkyl group, an aryl group or a heterocyclic group;

when $M^{13}$ is a divalent linking group, $Q^{13}$ may be bound via a single bond or a separate linking group to $M^{13}$ to form a ring; and n5 represents an integer of 1 or more:

(E)

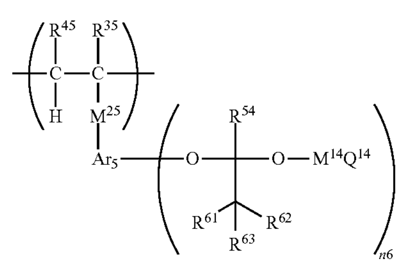

wherein in Formula (E), $R^{54}$ represents a hydrogen atom or an alkyl group;

each of $R^{61}$ to $R^{63}$ independently represents an organic group in which an atom bound to C in —C($R^{61}R^{62}R^{63}$)) is a carbon atom, and at least two of $R^{61}$, $R^{62}$ and $R^{63}$ may be bound with each other to form a ring;

$R^{35}$ represents a hydrogen atom or an alkyl group;

$R^{45}$ represents a hydrogen atom or an alkyl group, $R^{45}$, and $M^{25}$ or $Ar_5$ may be bound with each other to form a ring, and in that case, $R^{45}$ represents an alkylene group;

$M^{25}$ represents a single bond or a divalent linking group, and in the case of being bound with $R^{45}$ to form a ring, represents a trivalent linking group;

$Ar_5$ represents a (n6+1)-valent aromatic ring group, and in the case of being bound with $R^{45}$ to form a ring, represents a (n6+2)-valent aromatic ring group;

$M^{14}$ represents a single bond or a divalent linking group;

$Q^{14}$ represents an alkyl group, a cycloalkyl group, an aryl group or a heterocyclic group; and n6 represents an integer of 1 or more.

(2) The actinic ray-sensitive or radiation-sensitive resin composition of (1), wherein the resin (P) has the repeating unit represented by Formula (A) and has at least two of the repeating unit represented by Formula (B), the repeating unit represented by Formula (C) and the repeating unit represented by Formula (E).

(3) The actinic ray-sensitive or radiation-sensitive resin composition of (1) or (2), wherein the resin (P) has the repeating unit represented by Formula (A), the repeating unit represented by Formula (B) and the repeating unit represented by Formula (E).

(4) The actinic ray-sensitive or radiation-sensitive resin composition of (3), wherein, in Formula (B), n1 is 1.

(5) The actinic ray-sensitive or radiation-sensitive resin composition of (3) or (4), wherein, in Formula (B), $R^{51}$ is a hydrogen atom.

(6) The actinic ray-sensitive or radiation-sensitive resin composition of any one of (3) to (5), wherein, in Formula (B), $R^{21}$ to $R^{23}$ are an alkyl group.

(7) The actinic ray-sensitive or radiation-sensitive resin composition of any one of (1) to (6), wherein, in Formulas (B), (C), (D) and (E), a group represented by $-M^{11}-Q^{11}$, a group represented by $-M^{12}-Q^{12}$, a group represented by $-M^{13}-Q^{13}$ and a group represented by $-M^{14}-Q^{14}$ are an alkyl group, a cycloalkyl group, an aralkyl group, an aryloxyalkyl group or a heterocyclic group.

(8) The actinic ray-sensitive or radiation-sensitive resin composition of any one of (1) to (7), wherein, in Formulas (B), (C), (D) and (E), $M^{21}$ to $M^{25}$ are a single bond, and Ar and $Ar_2$ to $Ar_5$ are a phenylene group.

(9) The actinic ray-sensitive or radiation-sensitive resin composition of any one of (1) to (8), wherein the resin (P) further has a non-decomposable repeating unit represented by the following Formula (3):

(3)

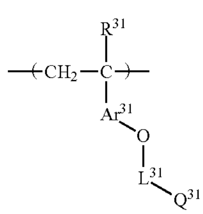

wherein in Formula (3), $R^{31}$ represents a hydrogen atom or an methyl group;

$Ar^{31}$ represents an arylene group;

$L^{31}$ represents a single bond or a divalent linking group; and $Q^{31}$ represents a cycloalkyl group or an aryl group.

(10) The actinic ray-sensitive or radiation-sensitive resin composition of any one of (1) to (9), wherein the resin (P) further has a repeating unit represented by the following Formula (4):

(4)

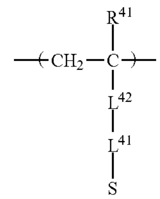

wherein in Formula (4), $R^{41}$ represents a hydrogen atom or an methyl group;

$L^{41}$ represents a single bond or a divalent linking group;

$L^{42}$ represents a divalent linking group; and

S represents a structural moiety capable of generating an acid in a side chain upon irradiation with an actinic ray or radiation.

(11) A resist film formed by the actinic ray-sensitive or radiation-sensitive resin composition of any one of (1) to (10).

(12) A pattern forming method comprising exposing and developing the resist film of (11).

(13) A method for manufacturing an electronic device comprising the method of (12).

(14) An electronic device manufactured by the method of (13).

It is further preferred that the present invention has the following constitution.

(15) The actinic ray-sensitive or radiation-sensitive composition of any one of (1) to (10) further containing a compound generating an acid upon irradiation with an actinic ray or radiation.

(16) The actinic ray-sensitive or radiation-sensitive composition of any one of (1) to (10) further containing a basic compound.

(17) The actinic ray-sensitive or radiation-sensitive composition of any one of (1) to (10) further containing a solvent.

(18) The actinic ray-sensitive or radiation-sensitive composition of any one of (1) to (10) further containing a surfactant.

DESCRIPTION OF EMBODIMENTS

Hereinafter, embodiments of the present invention will be described in detail.

In representing a group (atomic group) in the present specification, the representation which does not specify substitution or unsubstitution also includes having substituents along with having no substituent. For example, "an alkyl group" which does not specify substitution or unsubstitution includes not only an alkyl group having no substituent (an unsubstituted alkyl group) but also an alkyl group having a substituent (a substituted alkyl group).

The term "actinic ray" or "radiation" in the present specification refers to, for example, a bright line spectrum of a mercury lamp, far-ultraviolet rays represented by an excimer laser, extreme ultraviolet (EUV) rays, X-rays, an electron beam (EB) and the like. Further, the term "light" in the present invention refers to the actinic rays or the radiations.

In addition, unless otherwise specifically indicated, the term "exposure" in the present specification includes not only the exposure performed using a mercury lamp, far-ultraviolet rays represented by an excimer laser, extreme ultraviolet rays, X-rays, EUV rays and the like, but also drawing performed by a particle beam such as an electron beam and an ion beam.

The actinic ray-sensitive or radiation-sensitive composition according to the present invention is, for example, a positive type composition, and typically a positive type resist composition. Hereinafter, the configuration of the composition will be described.

[1] Resin (P)

The actinic ray-sensitive or radiation-sensitive composition according to the present invention contains a resin (P) which contains a repeating unit represented by the following Formula (A), and contains at least two of a repeating unit represented by the following Formula (B), a repeating unit represented by the following Formula (C), a repeating unit represented by the following Formula (D) and a repeating unit represented by the following Formula (E).

Accordingly, it is possible to satisfy a high resolution property (high resolution and the like), a high sensitivity, a good pattern shape, a good roughness characteristic, a good flare resistance and a good exposure latitude (EL) at the same time. Although the reason is not clear, it is assumed as follows.

First, all the repeating units represented by Formula (B) to Formula (E) are acid-decomposable repeating units having a group capable of decomposing by the action of an acid to generate "a hydroxyl group, as a polar group, binding to an aromatic group".

However, the repeating units represented by Formula (B) to Formula (E) have a different structure of a group capable of leaving by the action of an acid (protecting group) from each other.

It is considered that the acid decomposition reaction rate of the acid-decomposable repeating units included in the present invention tends to be highest in the repeating unit represented by Formula (B), and then, to be high in the repeating unit represented by Formula (C), the repeating unit represented by Formula (D) and the repeating unit represented by Formula (E) in this order in consideration of the structure of the protecting group. Accordingly, since the resin (P) has a plurality of acid-decomposable repeating units whose acid decomposition reaction rates are different from each other, the deprotection of the protecting groups by the action of an acid proceeds in a plurality of steps. As a result, the acid decomposition reaction rate and the acid diffusion are balanced, and thus, acid decomposition reaction proceeds uniformly in a film, thereby realizing a good pattern shape and roughness characteristic and an excellent exposure latitude.

Further, it is considered that there is a problem in that a film reduction due to a flare photosensitization is prone to occur, especially in an EUV exposure. Generally, the flare resistance may be enhanced by reducing the reactivity of the acid-decomposable group, but the sensitivity is prone to decrease.

In the present invention, however, since acid-decomposable groups with low reactivity co-exist even though a part of the acid-decomposable groups with high reactivity is acid-decomposed by photosensitizing to flare, the dissolution rate is suppressed, and thus, the film reduction does not occur in unexposed portions. Meanwhile, since acid-decomposable groups with low reactivity are also acid-decomposed in exposed portions that generated an acid sufficiently, it is possible to enhance the flare resistance while maintaining high sensitivity.

Further, since the acid-decomposable group in the repeating unit represented by Formula (B), (D) or (E) which may be possessed by the resin (P) is not stabilized by the super-conjugation effect due to a C—H bond of a carbocation intermediate generated in the course of decomposing by the action of an acid, compared to an acid-labile group in which all of $R^{61}$, $R^{62}$ and $R^{63}$ are a hydrogen atom, it is assumed that the activation energy of acid decomposition reaction is further increased.

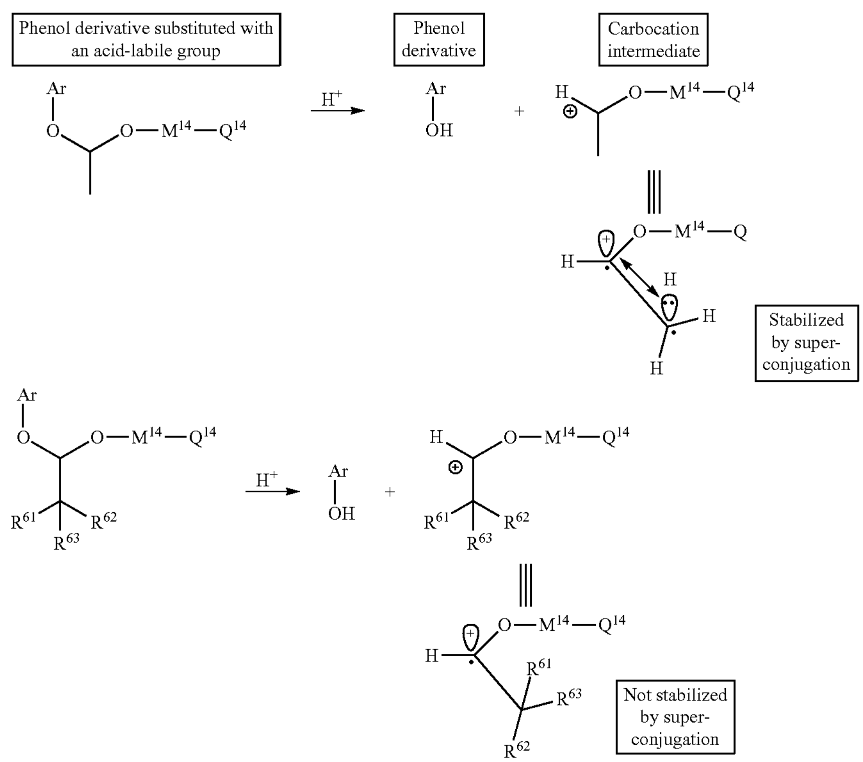

And, since the resin (P) has at least two of the repeating unit represented by Formula (B), the repeating unit represented by Formula (C), the repeating unit represented by Formula (D)

and the repeating unit represented by Formula (E), the resin (P) has, as an acid-decomposable unit, at least one of the repeating unit represented by Formula (B), (D) or (E) with a high activation energy of the acid decomposition reaction as described above.

As a result, the decomposition of the acid-decomposable group is suppressed near room temperature, and competing between the neutralization reaction of the acid generated from a compound capable of generating an acid upon irradiation with an actinic ray or radiation and the acid generated by the decomposition reaction of the acid-decomposable group, and the decomposition reaction of the acid-decomposable group, is solved, thereby enhancing the resolution property and improving the roughness characteristic.

The repeating unit represented by Formula (A) will be described in detail.

(A)

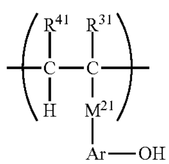

In Formula (A), $R^{41}$ represents a hydrogen atom or an alkyl group. $R^{41}$ and $M^{21}$ or Ar may be bound with each other to form a ring, and in that case, $R^{41}$ represents an alkylene group.

$R^{31}$ represents a hydrogen atom or an alkyl group.

$M^{21}$ represents a single bond or a divalent linking group, and in the case of being bound with $R^{41}$ to form a ring, represents a trivalent linking group.

Ar represents a divalent aromatic ring group, and in the case of being bound with $R^{41}$ to form a ring, represents a trivalent aromatic ring group.

The alkyl group of $R^{31}$ and $R^{41}$ may have a substituent (preferably a fluorine atom), and is preferably an alkyl group having 1 to 5 carbon atoms, more preferably an alkyl group having 1 to 3 carbon atoms, still more preferably a methyl group or a trifluoromethyl group.

Each of $R^{31}$ and $R^{41}$ is independently preferably a hydrogen atom, a methyl group or a trifluoromethyl group, and more preferably a hydrogen atom.

It is preferred that at least one of $R^{31}$ and $R^{41}$ is a hydrogen atom, and it is more preferred that both are a hydrogen atom.

The alkylene group as $R^{41}$ in the case where $R^{41}$ and $M^{21}$ or Ar are bound with each other to form a ring is more preferably an alkylene group having 1 to 3, and preferably 1 or 2 carbon atoms.

The divalent group as $M^{21}$ is preferably an alkylene group (preferably an alkylene group having 1 to 3 carbon atoms), —O—, —CO—, —N($R_0$)— or a group formed by combining two or more thereof. $R_0$ in —N($R_0$)— is a hydrogen atom or alkyl group (for example, an alkyl group having 1 to 8 carbon atoms, and particularly a methyl group, an ethyl group, a propyl group, an n-butyl group, a sec-butyl group, a hexyl group, an octyl group and the like).

Specific examples of the divalent linking group may include —COO—, —$COOCH_2$—, —COO—$CH_2$—$CH_2$—, —O— and —CONH—.

$M^{21}$ is more preferably a single bond or —COO—, and still more preferably a single bond.

Ar represents a divalent aromatic ring group. The divalent aromatic ring group may have a substituent, and preferred examples thereof may include an arylene group having 6 to 18 carbon atoms (more preferably 6 to 10 carbon atoms) such as a phenylene group, a tolylene group and a naphthylene group or a divalent aromatic ring group containing a heterocycle such as thiophene, furan, pyrrole, benzothiophene, benzofuran, benzopyrrole, triazine, imidazole, benzimidazole, triazole, thiadiazole, thiazole or the like.

Specific examples of the trivalent aromatic ring group as Ar in the case where Ar is bound with $R^{41}$ to form a ring may be suitably exemplified by a group formed by removing one arbitrary hydrogen atom from the specific examples of the divalent aromatic ring group as described above.

The aromatic group represented by Ar may have a substituent. The aromatic group is preferably an aromatic group having 6 to 18 carbon atoms which may have a substituent, more preferably a phenylene group or a naphthylene group which may have a substituent, and most preferably a phenylene group which may have a substituent. Further, examples of the substituent which may be possessed may include an alkyl group, a halogen atom, a hydroxyl group, an alkoxy group, a carboxyl group and an alkoxycarbonyl group.

Specific examples of the substituent which may be possessed by the alkylene group as $R^{41}$ and $M^{21}$ may include a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group and the like.

Specific examples of the substituent which may be possessed by each group as Ar may be exemplified by the specific examples of the substituent which may be possessed by the alkylene group as $R^{41}$ and $M^{21}$ as described above.

The carbon number of the substituent which may be possessed by the alkylene group as $R^{41}$ and $M^{21}$ and the substituent which may be possessed by each group as Ar is preferably 8 or less.

Specific examples of the repeating unit represented by Formula (A) are shown below, but not limited thereto.

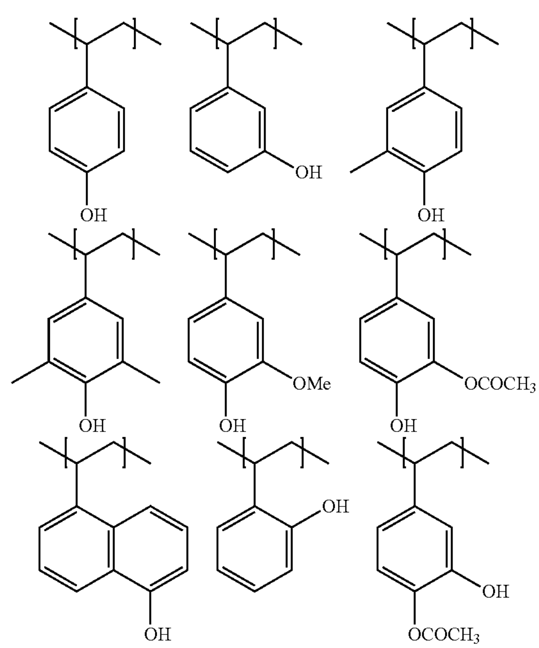

-continued

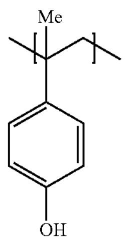
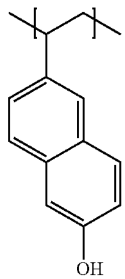
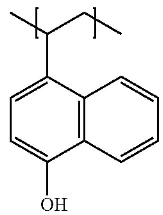
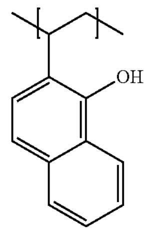
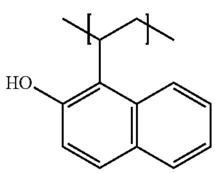
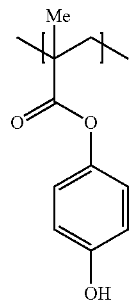
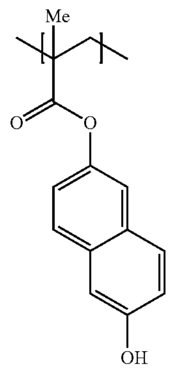
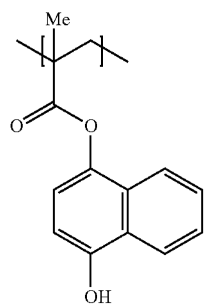
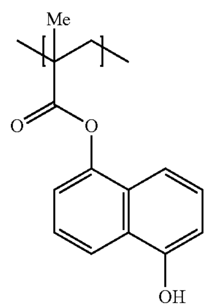
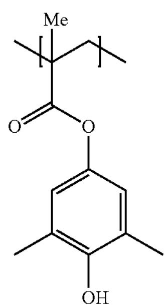
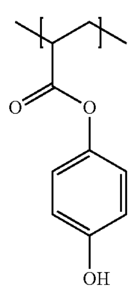
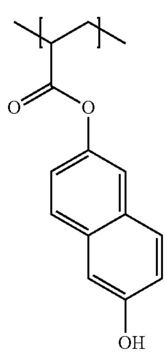
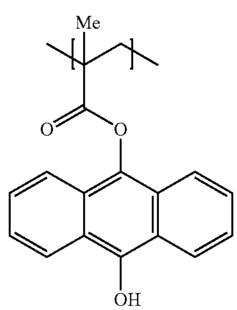
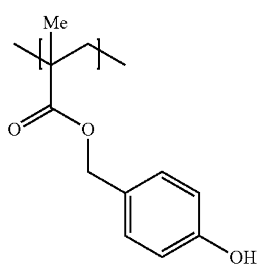

-continued

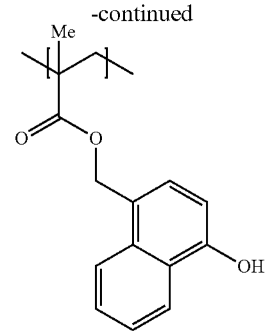
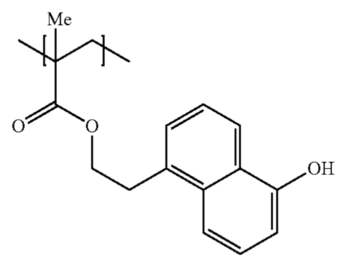
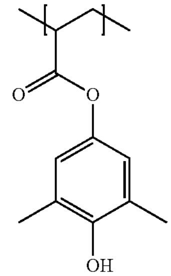
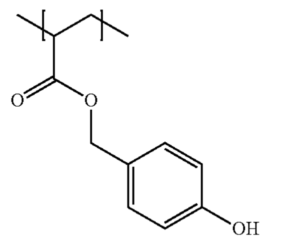
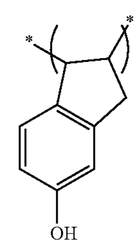

In the resin (P) of the present invention, the repeating unit represented by Formula (A) is preferably present in a range of 1 mol % to 99 mol %, more preferably 10 mol % to 95 mol %, and particularly preferably 15 mol % to 90 mol % based on the total repeating units of the resin (P).

Next, the repeating unit represented by Formula (B) will be described in detail.

(B)

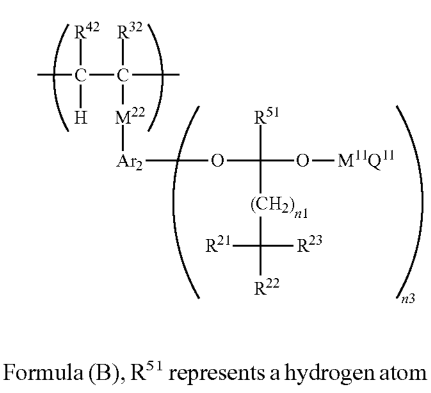

In Formula (B), $R^{51}$ represents a hydrogen atom or an alkyl group.

Each of $R^{21}$ to $R^{23}$ independently represents a hydrogen atom, an alkyl group, a cycloalkyl group, an aryl group, an aralkyl group or a heterocyclic group, and each of at least two of $R^{21}$ to $R^{23}$ independently represents an alkyl group, a cycloalkyl group, an aryl group, an aralkyl group or a heterocyclic group.

At least two of $R^{21}$ to $R^{23}$ may be bound with each other to form a ring. However, at least one of $R^{21}$ to $R^{23}$ and $M^{11}$ or $Q^{11}$ are not bound to form a ring.

$R^{32}$ represents a hydrogen atom or an alkyl group.

$R^{42}$ represents a hydrogen atom or an alkyl group. $R^{42}$ and $M^{22}$ or $Ar_2$ may be bound with each other to form a ring, and in that case, $R^{42}$ represents an alkylene group.

$M^{22}$ represents a single bond or a divalent linking group, and in the case of being bound with $R^{42}$ to form a ring, represents a trivalent linking group.

$Ar_2$ represents a (n3+1)-valent aromatic ring group, and in the case of being bound with $R^{42}$ to form a ring, represents a (n3+2)-valent aromatic ring group.

$M^{11}$ represents a single bond or a divalent linking group.

$Q^{11}$ represents an alkyl group, a cycloalkyl group, an aryl group or a heterocyclic group.

When $M^{11}$ is a divalent linking group, $Q^{11}$ may be bound via a single bond or a separate linking group to $M^{11}$ to form a ring.

n1 represents an integer of 1 or more.

n3 represents an integer of 1 or more.

In Formula (B), the alkyl group of $R^{51}$ is preferably an alkyl group having 1 to 10 carbon atoms, more preferably an alkyl group having 1 to 5 carbon atoms, still more preferably an alkyl group having 1 to 3 carbon atoms, and preferably an alkyl group having 1 or 2 carbon atoms (that is, a methyl group or an ethyl group). Specific examples of $R^{51}$ may include a methyl group, an ethyl group, a n-propyl group, an isopropyl group, a n-butyl group, an isobutyl group, a sec-butyl group, a t-butyl group and the like.

$R^{51}$ is preferably a hydrogen atom or an alkyl group having 1 to 5 carbon atoms, more preferably a hydrogen atom or an alkyl group having 1 to 3 carbon atoms, still more preferably a hydrogen atom, a methyl group or an ethyl group, and particularly preferably a hydrogen atom.

The alkyl group of $R^{21}$ to $R^{23}$ is preferably an alkyl group having 1 to 15 carbon atoms, more preferably an alkyl group having 1 to 10 carbon atoms, and still more preferably an alkyl group having 1 to 6 carbon atoms. Specific examples of $R^{21}$ to $R^{23}$ may include a methyl group, an ethyl group, a propyl group, an isopropyl group, a n-butyl group, a sec-butyl group, a t-butyl group, a neopentyl group, a hexyl group, a 2-ethylhexyl group, an octyl group, a dodecyl group and the like, and the alkyl group of $R^{21}$ to $R^{23}$ is preferably a methyl group, an ethyl group, a propyl group, an isopropyl group or a t-butyl group.

As described above, each of at least two of $R^{21}$ to $R^{23}$ independently represents an alkyl group, a cycloalkyl group, an aryl group, an aralkyl group or a heterocyclic group, and it is preferred that all of $R^{21}$ to $R^{23}$ represent an alkyl group, a cycloalkyl group, an aryl group, an aralkyl group or a heterocyclic group.

The cylcoalkyl group of $R^{21}$ to $R^{23}$ may be either monocyclic or polycyclic, and is preferably a cycloalkyl group having 3 to 15 carbon atoms, more preferably having 3 to 10 carbon atoms, and still more preferably having 3 to 6 carbon atoms. Specific examples of the cycloalkyl group of $R^{21}$ to $R^{23}$ may include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, a 2-norbornyl group and the like. The cycloalkyl group of $R^{21}$ to $R^{23}$ is preferably a cyclopropyl group, a cyclopentyl group or a cyclohexyl group.

The aryl group of $R^{21}$ to $R^{23}$ is preferably an aryl group having 6 to 15 carbon atoms, and more preferably an aryl group having 6 to 12 carbon atoms, and also includes a structure in which a plurality of aromatic rings is linked via a single bond to each other (for example, a biphenyl group and a terphenyl group). Specific examples of the aryl group of $R^{21}$ to $R^{23}$ may include a phenyl group, a naphthyl group, an anthranyl group, a biphenyl group, a terphenyl group and the like. The aryl group of $R^{21}$ to $R^{23}$ is preferably a phenyl group, a naphthyl group or a biphenyl group.

The aralkyl group of $R^{21}$ to $R^{23}$ is preferably an aralkyl group having 6 to 20 carbon atoms, and more preferably an aralkyl group having 7 to 12 carbon atoms. Specific examples of $R^{21}$ to $R^{23}$ may include a benzyl group, a phenethyl group, a naphthylmethyl group, a naphthylethyl group and the like.

The heterocyclic group of $R^{21}$ to $R^{23}$ is preferably a heterocyclic group having 6 to 20 carbon atoms, and more preferably a heterocyclic group having 6 to 12 carbon atoms. Specific examples of $R^{21}$ to $R^{23}$ may include a pyridyl group, a pyrazyl group, a tetrahydrofuranyl group, a tetrahydropyranyl group, a tetrahydrothiophene group, a piperidyl group, a piperazyl group, a furanyl group, a pyranyl group, a chromanyl group and the like.

The alkyl group as $R^{51}$, and the alkyl group, the cycloalkyl group, the aryl group, the aralkyl group and the heterocyclic group as $R^{21}$ to $R^{23}$ may further have a substituent.

Examples of the substituent which may be further possessed by the alkyl group as $R^{15}$ and $R^{21}$ to $R^{23}$ may include a cycloalkyl group, an aryl group, an amino group, an amide group, a ureido group, a urethane group, a hydroxyl group, a carboxyl group, a halogen atom, an alkoxy group, an aralkyloxy group, a thioether group, an acyl group, an acyloxy group, an alkoxycarbonyl group, a cyano group, a nitro group and the like. The substituents may be bound with each other to form a ring, and examples of the ring in the case where the substituents are bound with each other to form a ring may include a cycloalkyl group or phenyl group having 3 to 10 carbon atoms.

The substituent which may be further possessed by the cycloalkyl group as $R^{21}$ to $R^{23}$ may be exemplified by each of the groups as described above as specific examples of the alkyl group and the substituent which may be further possessed by the alkyl group.

Meanwhile, the carbon number of each of the alkyl group and the cycloalkyl group is preferably 1 to 8.

Examples of the substituent which may be further possessed by the aryl group, the aralkyl group and the heterocyclic group as $R^{21}$ to $R^{23}$ may include a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms) and an alkoxycarbonyloxy group (preferably having 2 to 7 carbon atoms) and the like.

At least two of $R^{21}$ to $R^{23}$ may form a ring together.

In the case where at least two of $R^{21}$ to $R^{23}$ are bound with each other to form a ring, examples of the ring to be formed may include a tetrahydropyran ring, a cyclopentane ring, a cyclohexane ring, an adamantane ring, a norbornene ring, a norbornane ring and the like. The ring may have a substituent, and the substituent which may be further possessed may be exemplified by each of the groups as described above as the specific examples of the substituent which may be possessed by the alkyl group and the alkyl group.

In the case where all of $R^{21}$ to $R^{23}$ are bound with each other to form a ring, examples of the ring to be formed may include an adamantane ring, a norbornane ring, a norbornene ring, a bicyclo[2,2,2]octane ring and a bicyclo[3,1,1]heptane ring. Among them, an adamantane ring is particularly preferred. They may have a substituent, and the substitutent which may be possessed may be exemplified by each of the groups as described above as the specific examples of the alkyl group and the substituent which may be further possessed by the alkyl group.

From the viewpoint that the glass transition temperature of the compound (P) may increase and the resolution may be enhanced, it is preferred that each of $R^{21}$ to $R^{23}$ independently represents an alkyl group.

Further, from the viewpoint that the glass transition temperature of the resin (P) may further increase and the resolution may be enhanced, it is preferred that at least two of $R^{21}$ to $R^{23}$ are bound with each other to form a ring, or at least one of $R^{21}$ to $R^{23}$ is a cycloalkyl group, and it is more preferred that all of $R^{21}$ to $R^{23}$ are bound with each other to form a ring.

The group represented by —C($R^{21}$)($R^{22}$)($R^{23}$) in Formula (B) preferably has 15 or less carbon atoms. As a result, the affinity between the resist film thus obtained and a developer becomes sufficient, and thus, it is possible to remove exposed portions more certainly by the developer (that is, a sufficient resolution property can be obtained).

Further, one of performances required to a resist film is a performance that less gas occurs upon exposure (so-called an outgas performance). Since this performance tends to be better when the boiling point of an aldehyde compound or an alcohol compound as a compound (deprotected product) left from a compound by an acid is as high as possible, it is preferred that the group represented by —C($R^{21}$)($R^{22}$)($R^{23}$) has 7 or more carbon atoms.

Specific examples of the group represented by —C($R^{21}$)($R^{22}$)($R^{23}$) are shown below, but the present invention is not limited thereto. In the following specific examples, * represents a bonding to the group represented by —$(CH_2)_{n1}$— in Formula (B).

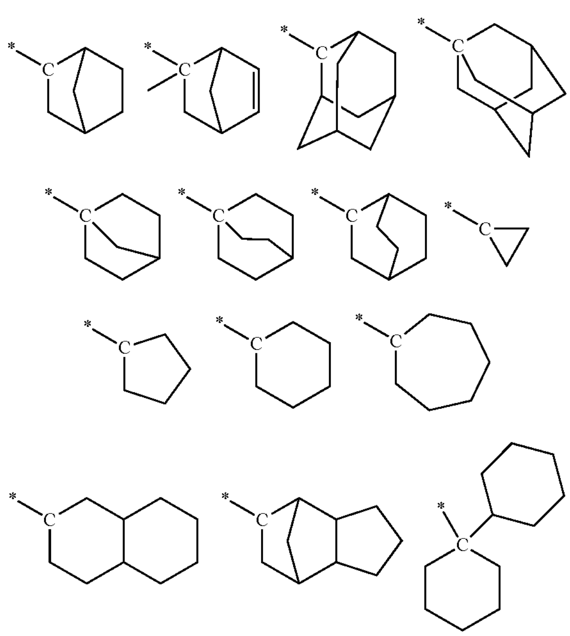

-continued

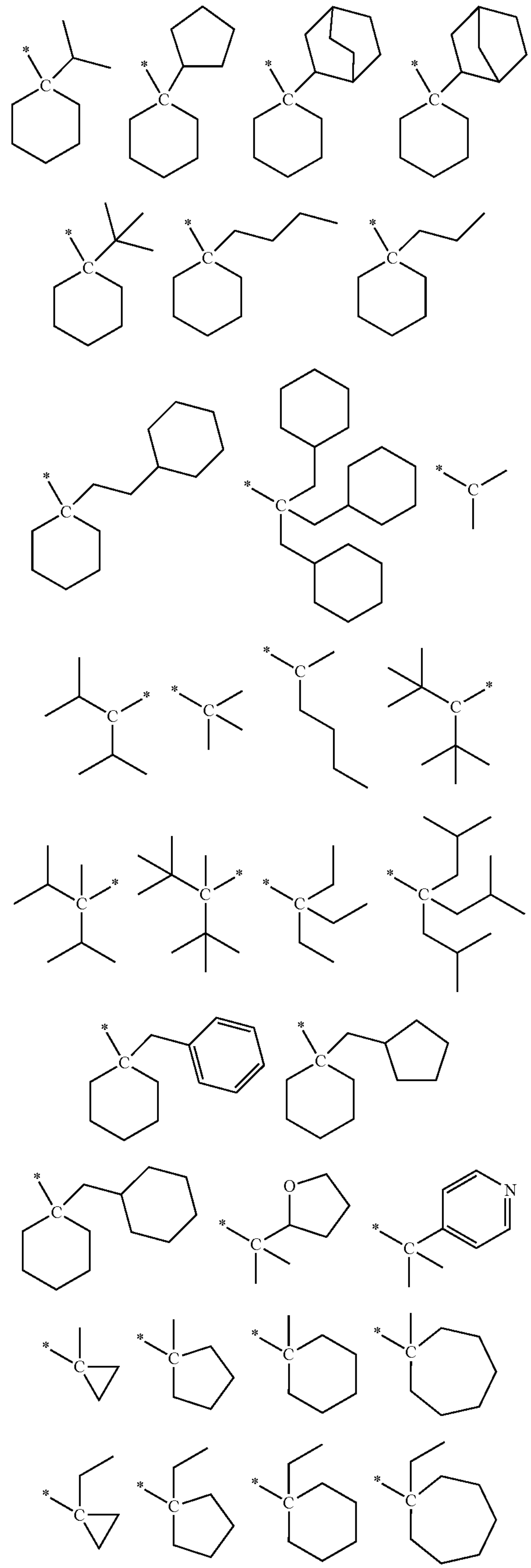

-continued

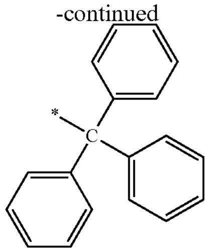

Examples of the divalent linking group as $M^{11}$ may include an alkylene group (preferably an alkylene group having 1 to 8 carbon atoms, for example, a methylene group, an ethylene group, a propylene group, a butylene group, a hexylene group or an octylene group), a cycloalkylene group (preferably a cycloalkylene group having 3 to 15 carbon atoms, for example, a cyclopentylene group or a cyclohexylene group), —S—, —O—, —CO—, —CS—, —$SO_2$—, —$N(R_0)$— or a combination of two or more thereof, and it is preferred that the total carbon number is 20 or less. Herein, $R_0$ is a hydrogen atom or an alkyl group (for example, an alkyl group having 1 to 8 carbon atoms, and particularly a methyl group, an ethyl group, a propyl group, an n-butyl group, a sec-butyl group, a hexyl group, an octyl group and the like).

n1 preferably represents an integer of 1 to 5, more preferably an integer of 1 to 3, still more preferably 1 or 2, and particularly preferably 1. As a result, the resolution property may be further enhanced.

$M^{11}$ is preferably a divalent linking group formed by combining a single bond, an alkylene group or an alkylene group with at least one of —O—, —CO—, —CS— and —$N(R_0)$—, and more preferably a divalent linking group formed by combining a single bond, an alkylene group or an alkylene group with —O—. Herein, $R_0$ has the same meaning as $R_0$ as described above.

$M^{11}$ may further have a substituent, and the substituent which may be further possessed by $M^{11}$ is the same as the substituent which may be possessed by the alkyl group of $R^{21}$ as described above.

Specific examples and preferred examples of the alkyl group as $Q^{11}$ are the same as those described with respect to the alkyl group as $R^{21}$ as described above.

The cylcoalkyl group as $Q^{11}$ may be either monocyclic or polycyclic. The carbon number of the cycloalkyl group is preferably 3 to 10. Examples of the cycloalkyl group may include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, 4-tetracyclo[6.2.1.1$^{3,6}$.0$^{2,7}$]dodecyl group, a 8-tricyclo[5.2.1.0$^{2,6}$]decyl group and a 2-bicyclo[2.2.1]heptyl group. Among them, a cyclopentyl group, a cyclohexyl group, a 2-adamantyl group, a 8-tricyclo[5.2.1.0$^{2,6}$]decyl group and a 2-bicyclo[2.2.1]heptyl group are most preferred.

Specific examples and preferred examples of the aryl group as $Q^{11}$ are the same as those describe with respect to the aryl group as $R^{21}$ as described above.

Specific examples and preferred examples of the heterocyclic group as $Q^{11}$ are the same as those described with respect to the heterocyclic group as $R^{21}$ as described above.

The alkyl group, the cycloalkyl group, the aryl group and the heterocyclic group as $Q^{11}$ may have a substituent, and examples thereof may include an alkyl group, a cycloalkyl group, a cyano group, a halogen atom, a hydroxyl group, an alkoxy group, a carboxyl group and an alkoxycarbonyl group.

The group represented by -$M^{11}$-$Q^{11}$ is preferably an unsubstituted alkyl group, an alkyl group substituted with a cycloalkyl group, a cycloalkyl group, an aralkyl group, an aryloxyalkyl group or a heterocyclic group. Specific examples and preferred examples of the unsubstituted alkyl group as a group represented by -$M^{11}$-$Q^{11}$, the cycloalkyl group in the "cycloalkyl group" and the "alkyl group substituted with a cycloalkyl group" as a group represented by -$M^{11}$-$Q^{11}$, and the aryl group in the "aralkyl group (arylalkyl group)" and the "aryloxyalkyl group" as a group represented by -$M^{11}$-$Q^{11}$ are the same as those described in the alkyl group, the cycloalkyl group and the aryl group as $Q^{11}$, respectively.

Specific examples and preferred examples of the alkyl moiety in the "alkyl group substituted with a cycloalkyl group", the "aralkyl group (arylalkyl group)" and the "aryloxyalkyl group" as a group represented by -$M^{11}$-$Q^{11}$ are the same as those described in the alkylene group as $M^{11}$, respectively.

Specific examples and preferred examples of the heterocyclic group as a group represented by -$M^{11}$-$Q^{11}$ are the same as those described in the heterocyclic group as $Q^{11}$.

Specific examples of the group represented by -$M^{11}$-$Q^{11}$ may include a methyl group, an ethyl group, an isopropyl group, a cyclopentyl group, a cyclohexyl group, a cyclohexylethyl group, a 2-adamantyl group, a 8-tricyclo[5.2.1.0$^{2,6}$]decyl group, a 2-bicyclo[2.2.1]heptyl group, a benzyl group, a 2-phenethyl group, a 2-phenoxyethylene group and the like.

Further, as described above, in the case where $M^{11}$ is a divalent linking group, $Q^{11}$ may be bound via a single bond or a separate linking group to $M^{11}$ to form a ring. Examples of the separate linking group may include an alkylene group (preferably an alkylene group having 1 to 3 carbon atoms), and the ring to be formed is preferably a 5- or 6-membered ring.

Specific examples of the group represented by -$M^{11}$-$Q^{11}$ are shown below, but the present invention is not limited thereto. In the following specific examples, * represents a bonding to an oxygen atom in Formula (B). Further, Me represents a methyl group, Et represents an ethyl group, and Pr represents a n-propyl group.

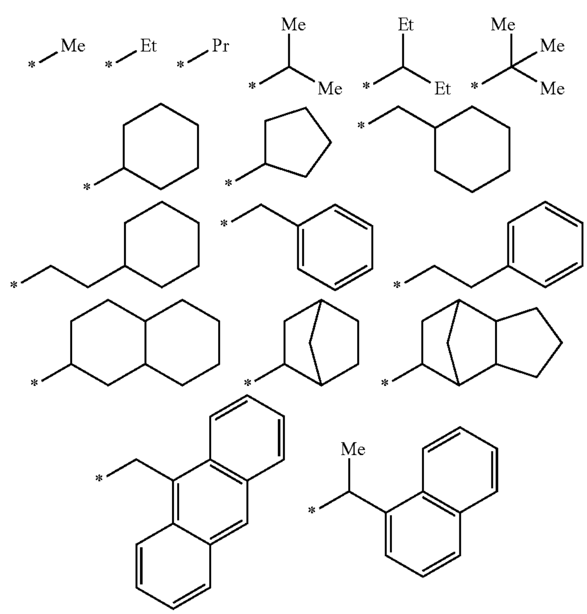

-continued

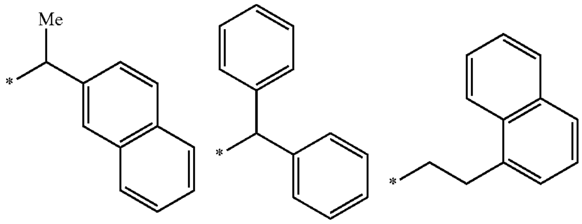

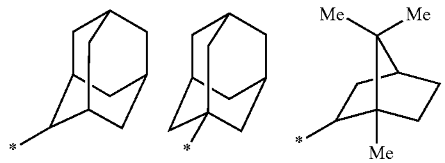

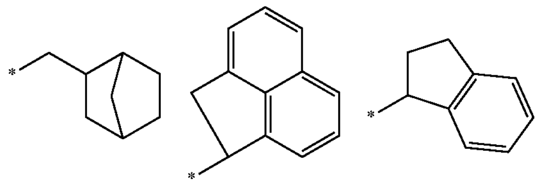

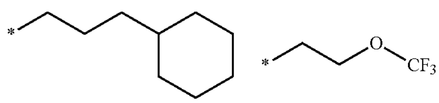

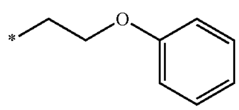

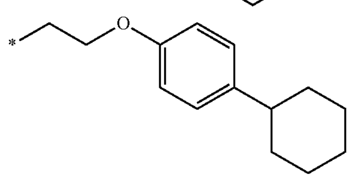

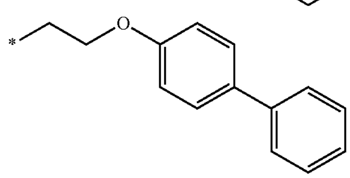

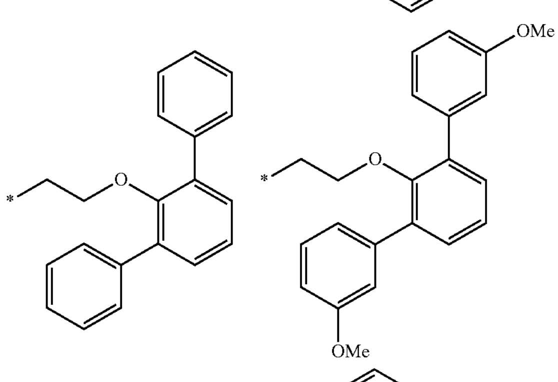

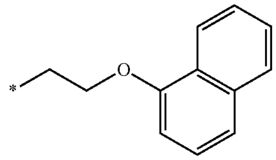

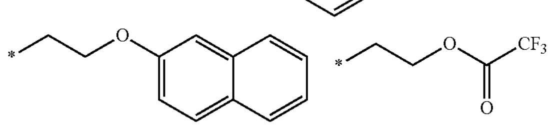

-continued

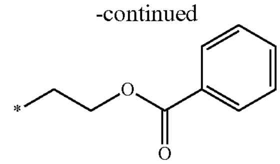

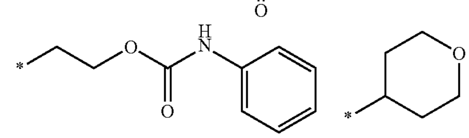

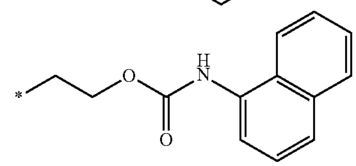

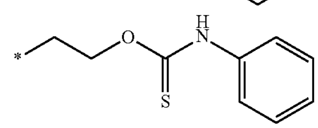

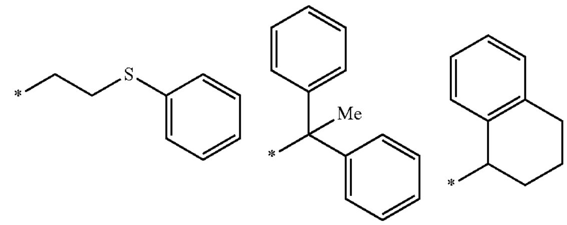

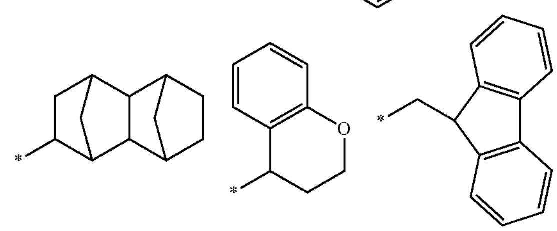

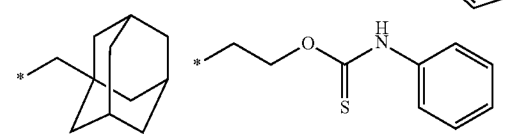

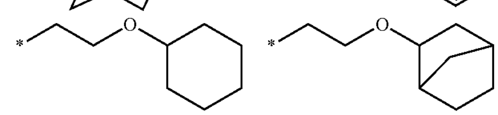

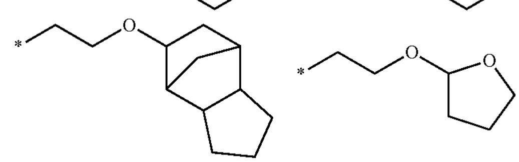

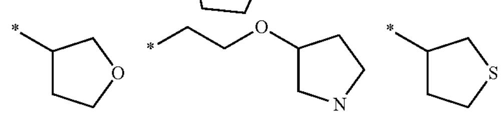

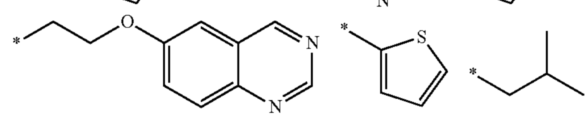

Further, as described above, at least one of $R^{21}$ to $R^{23}$, and $M^{11}$ or $Q^{11}$ are not bound to form a ring because the effect of the present invention is not exhibited. Specifically, the structures as shown below are not included in Formula (B). The reason is assumed that the alkyl group extended from the carbon atom inserted between two oxygen atoms is fixed as a ring structure in the following structures such that the glass transition temperature of the following compound does not become high enough to exhibit the effect of the present invention.

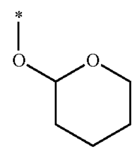
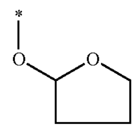
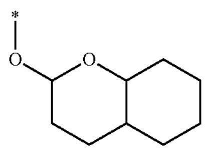
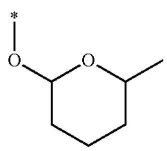
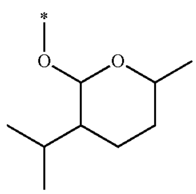

n3 is preferably an integer of 1 to 3, and more preferably 1.

n1 is preferably an integer of 1 to 4, and more preferably 1.

Specific examples and preferred range of $Ar_2$, $M^{22}$, $R^{32}$ and $R^{42}$ are the same as those described with respect to Ar, $M^{21}$, $R^{31}$ and $R^{41}$ in Formula (A).

Specific examples of the group represented by Formula (B) are shown below, but the present invention is not limited thereto. In the following specific examples, * represents a bonding to a oxygen atom in a phenolic hydroxyl group.

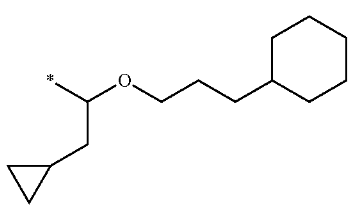
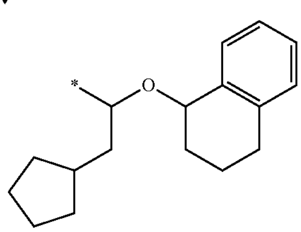

-continued

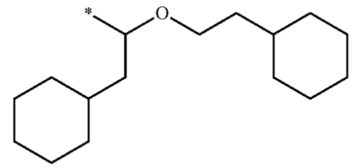
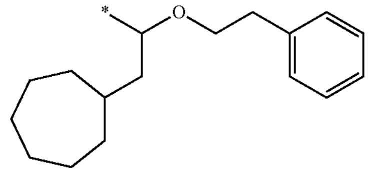
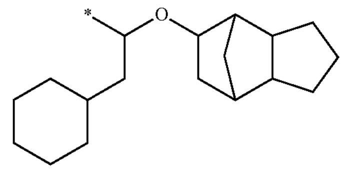
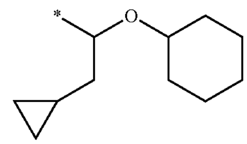
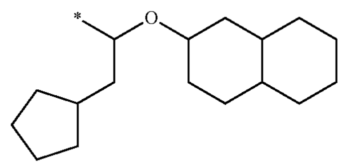
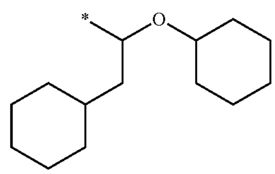
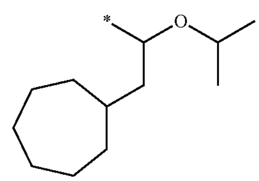
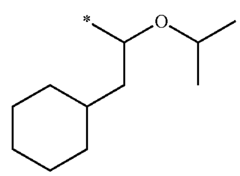
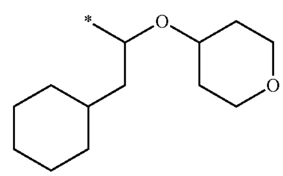
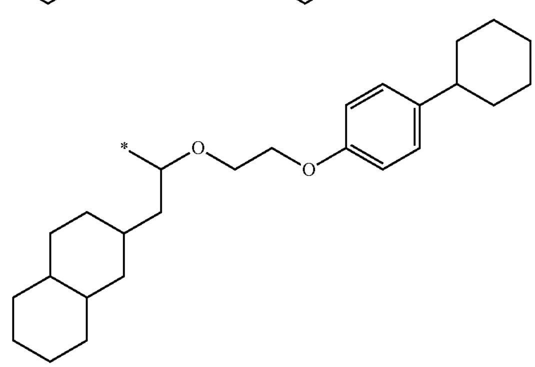
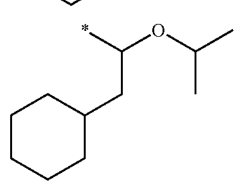
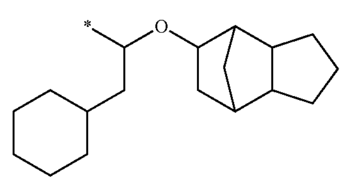

-continued
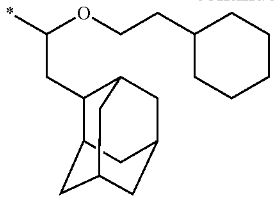
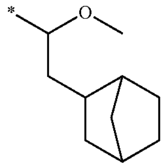
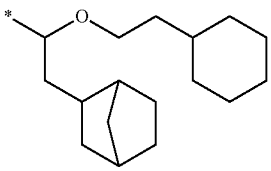
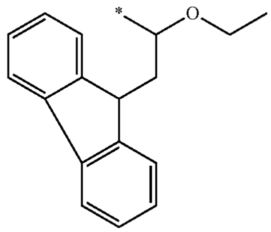
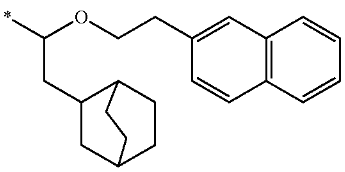
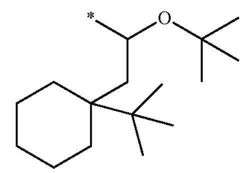
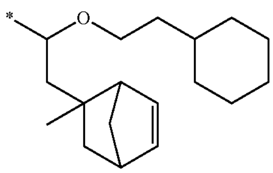
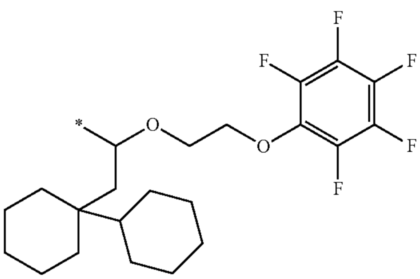
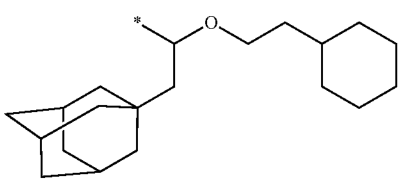
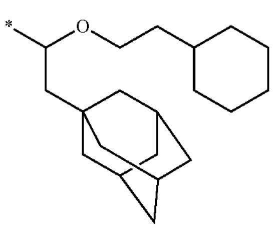
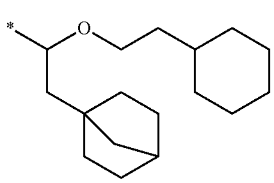
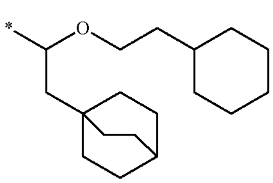
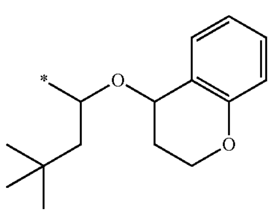
-continued
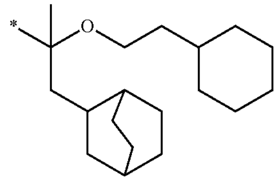
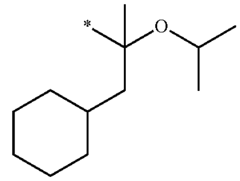
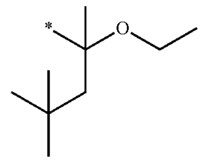
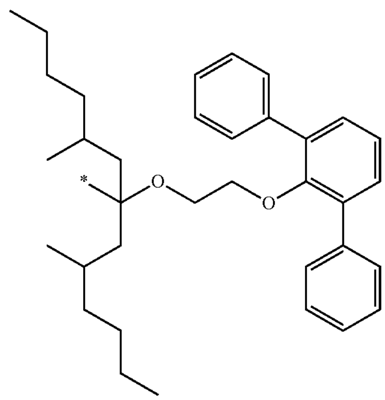
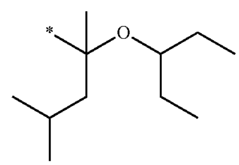
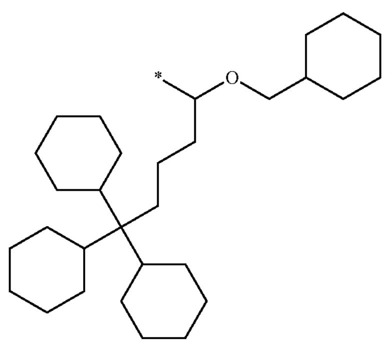
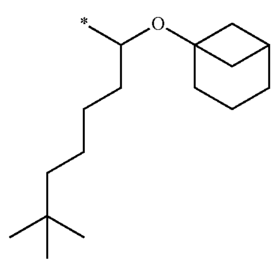

-continued
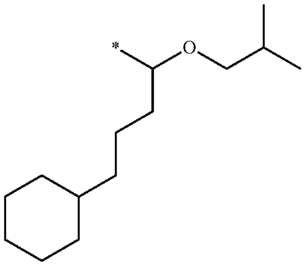
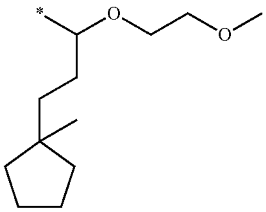
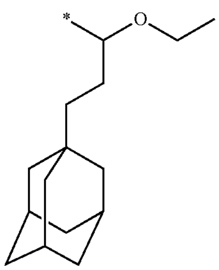
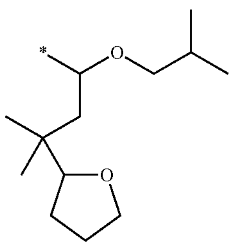
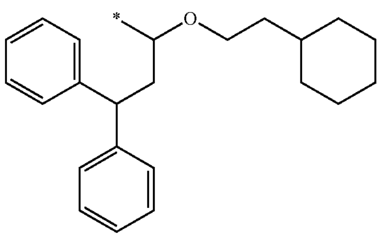
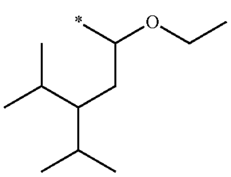
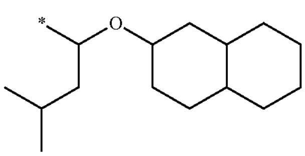
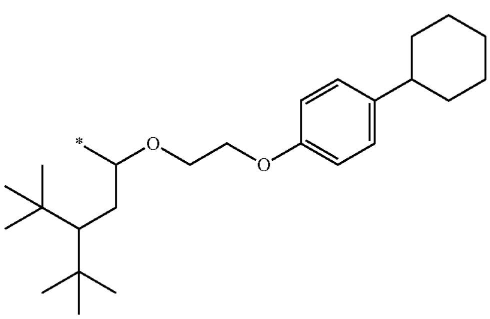
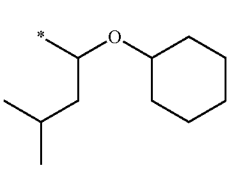
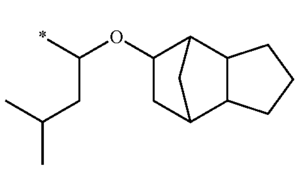
-continued
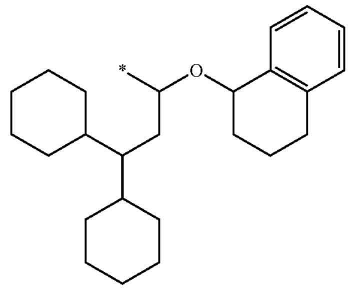
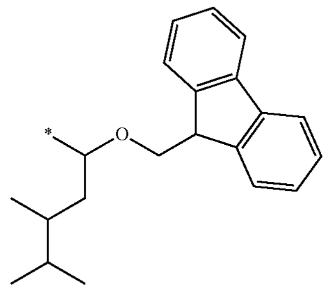
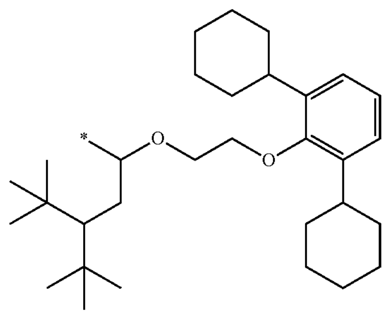
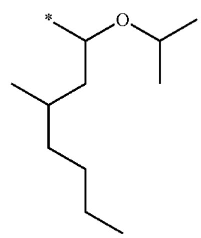
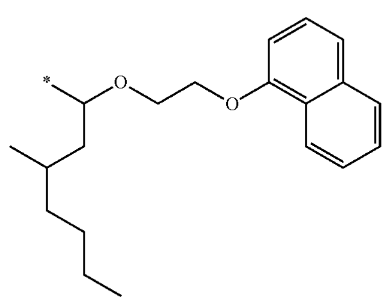
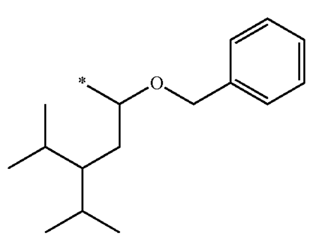
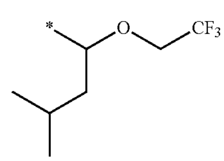

-continued

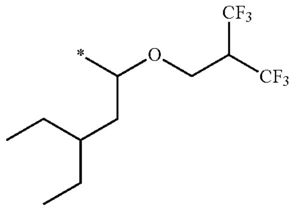

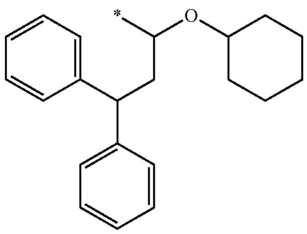

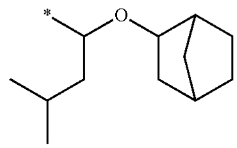

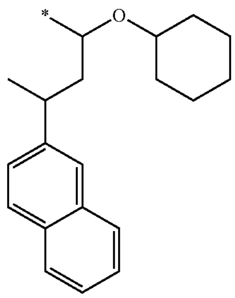

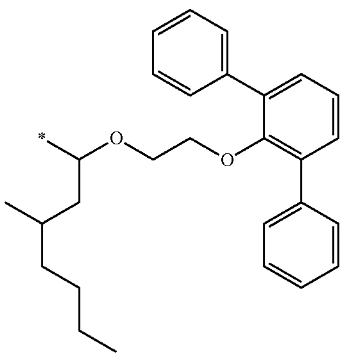

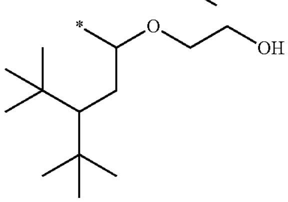

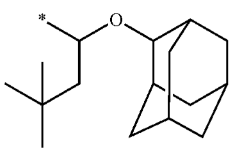

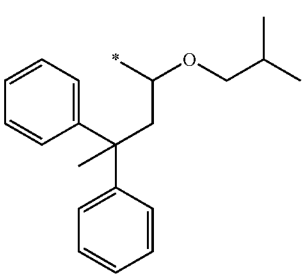

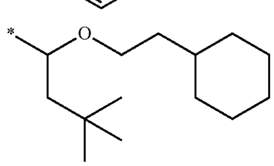

-continued

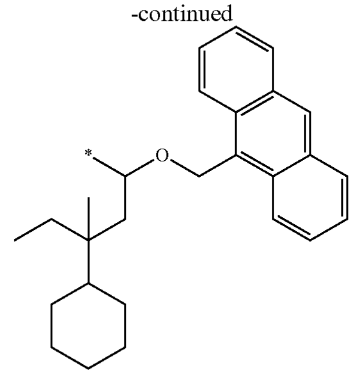

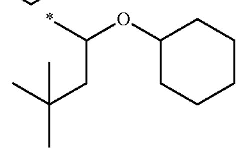

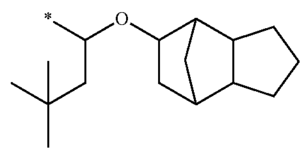

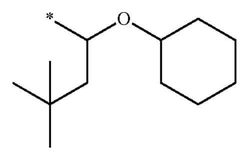

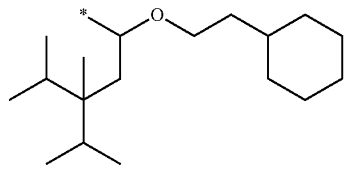

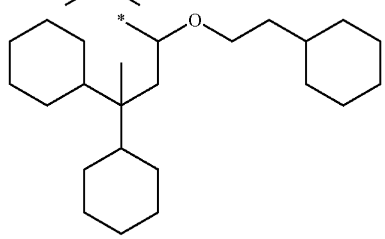

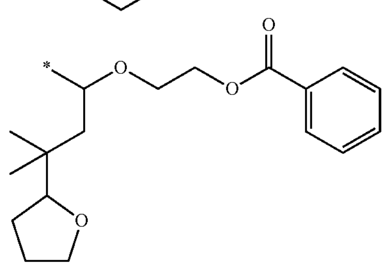

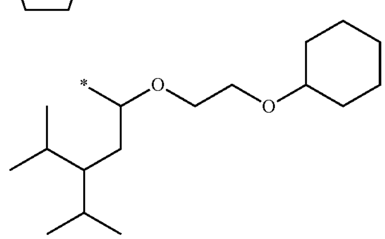

Specific examples of the structure represented by the following Formula (B1) in the repeating unit represented by Formula (B) are shown below, but the present invention is not limited thereto. In the following specific examples, "." represents a bonding to an acetal structure represented in brackets in Formula (B), and for example, if there are two bondings, n2 denotes 2.

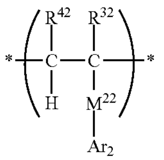
(B1)
$R^{32}$, $R^{42}$, $M^{22}$ and $Ar_2$ in Formula (B1) are the same as $R^{32}$, $R^{42}$, $M^{22}$ and $Ar^2$ in Formula (B).
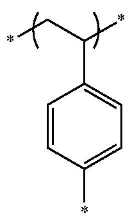
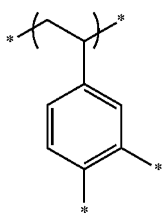
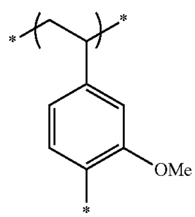
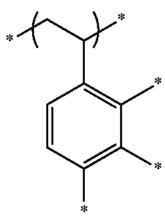
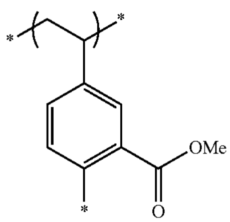
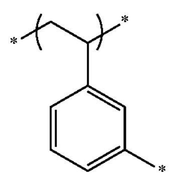
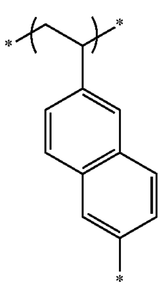
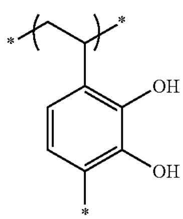
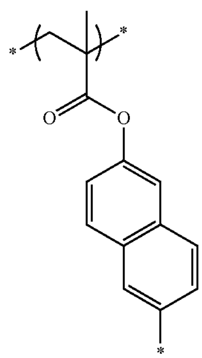
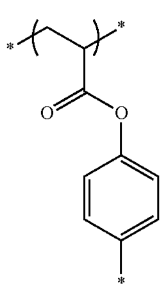
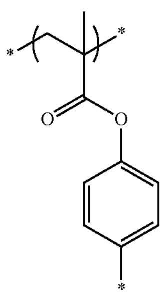
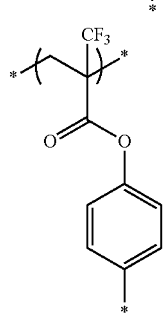
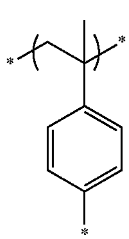
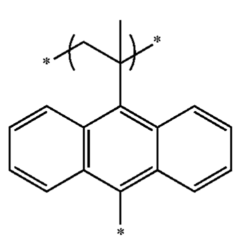
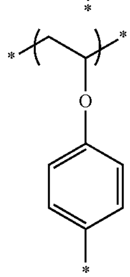
-continued
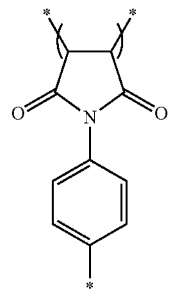
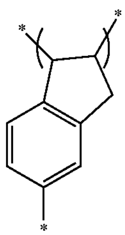
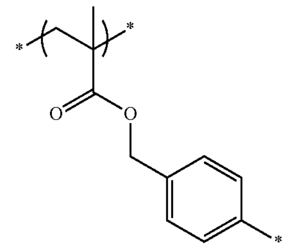
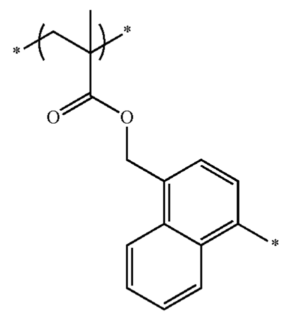
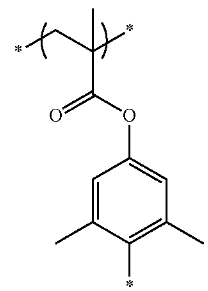
Specific examples of the repeating unit represented by Formula (B) are shown below, but the present invention is not limited thereto.
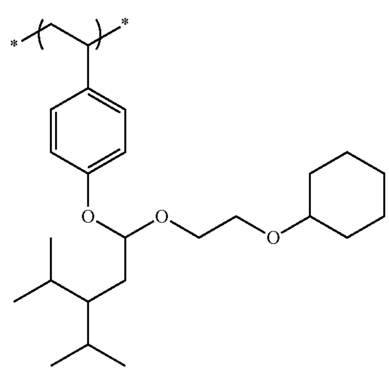
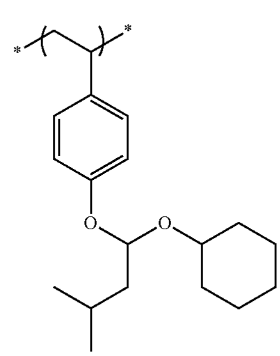

-continued
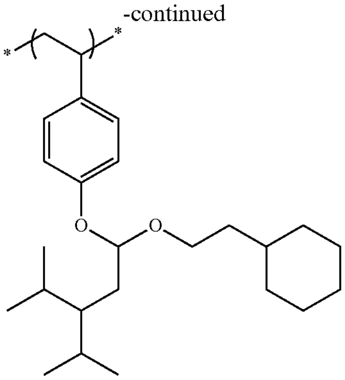
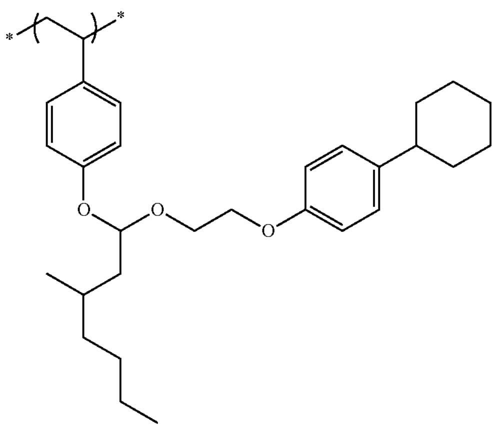
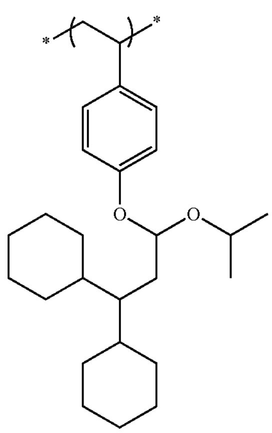
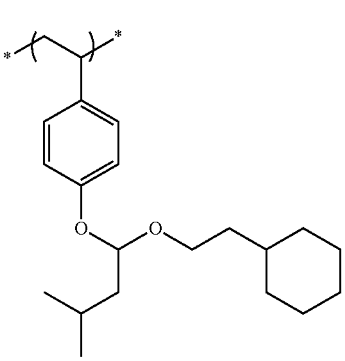
-continued
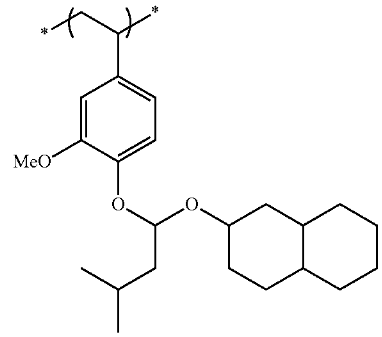
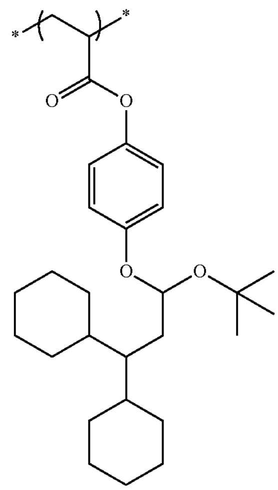
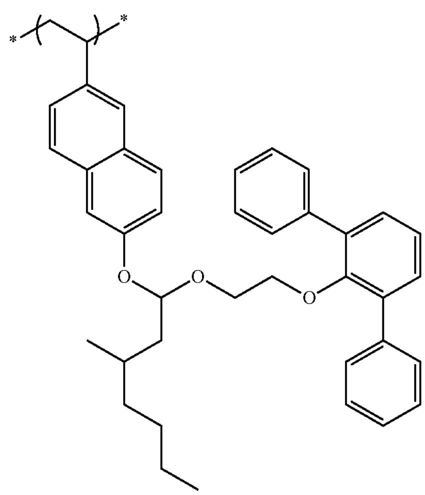
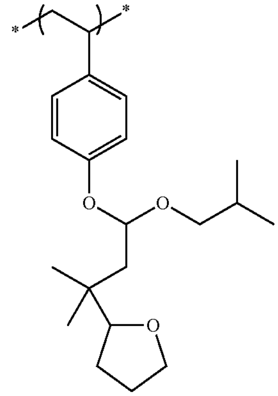

-continued
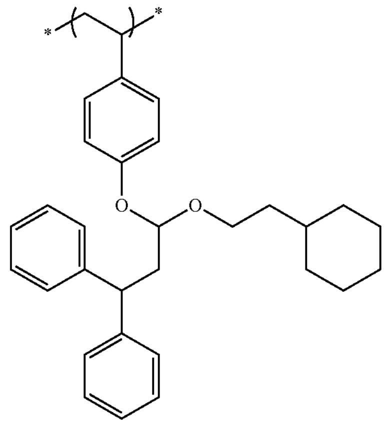
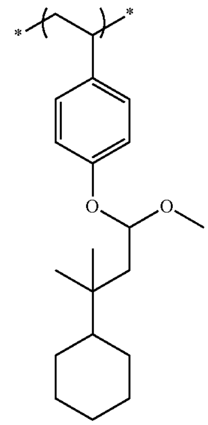
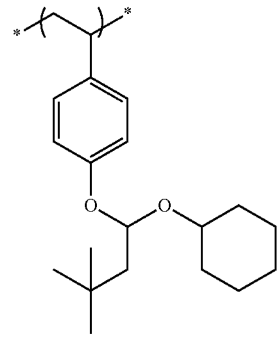
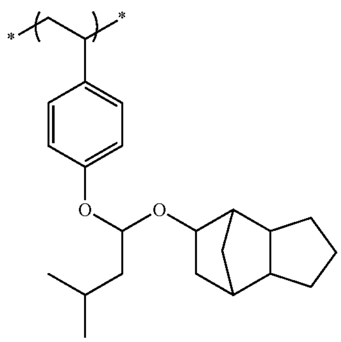
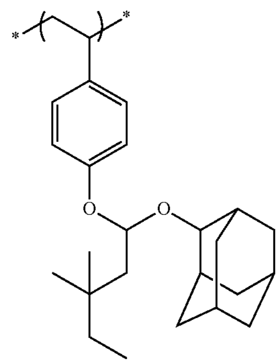
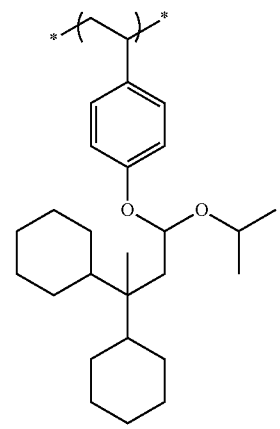
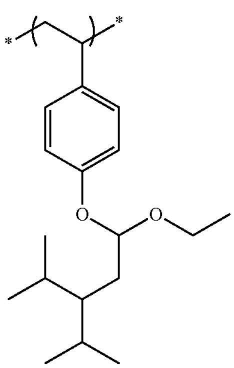
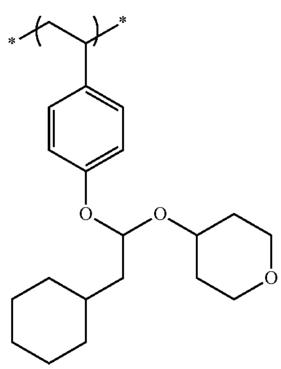
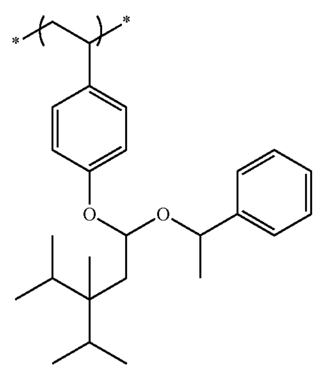
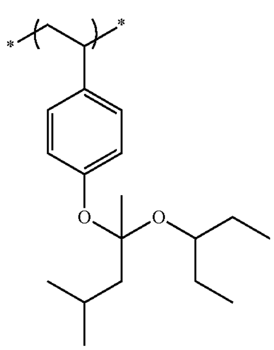
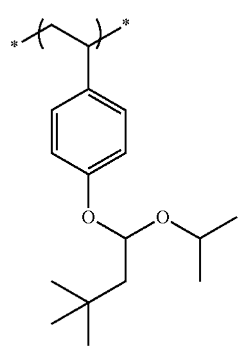
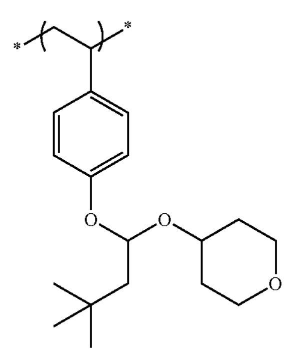

-continued
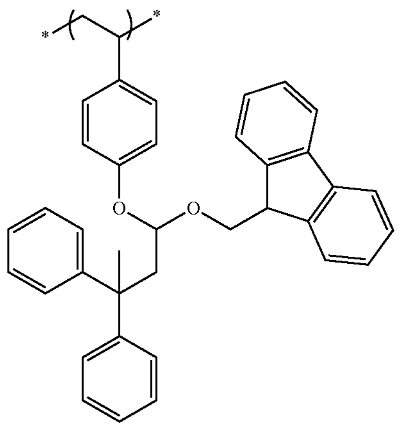
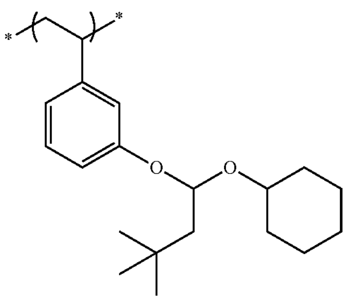
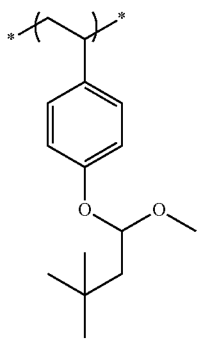
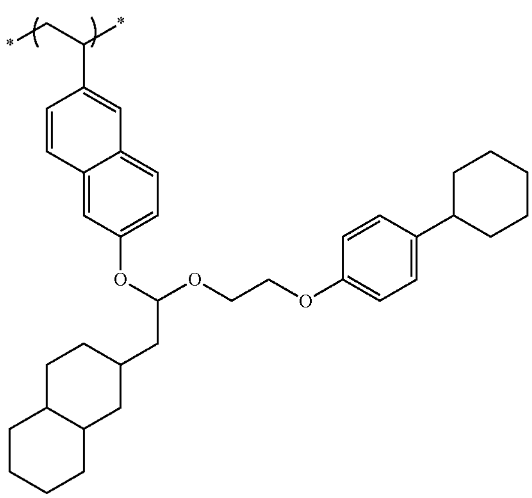
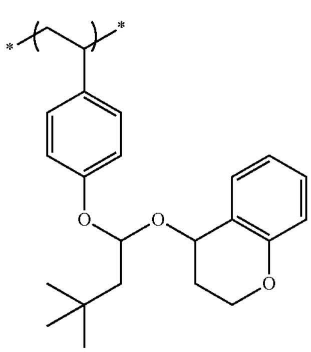
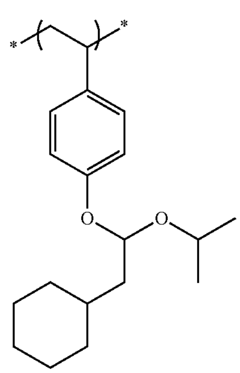
-continued
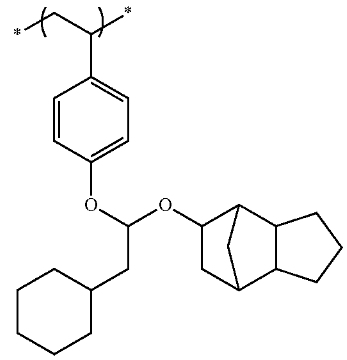
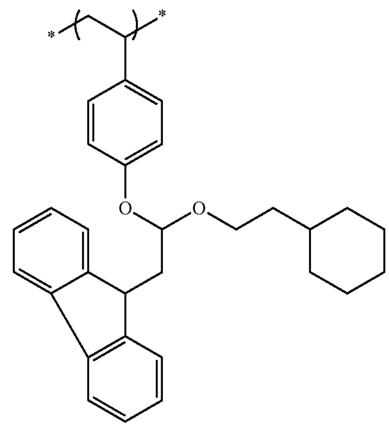
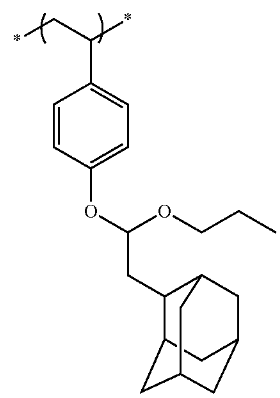
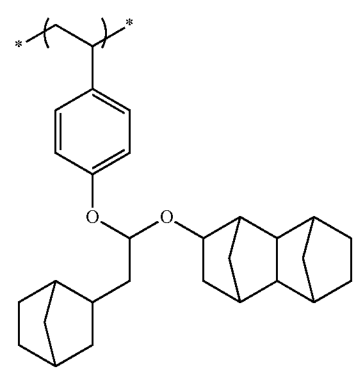

-continued
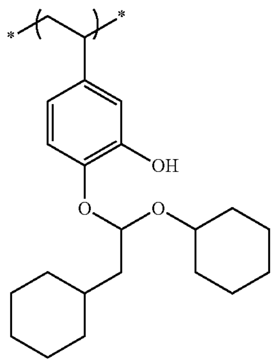
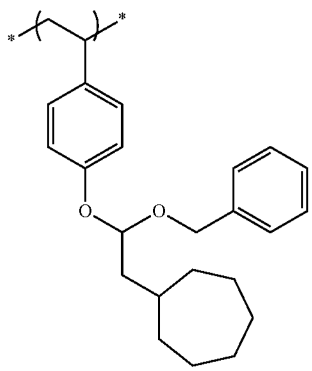
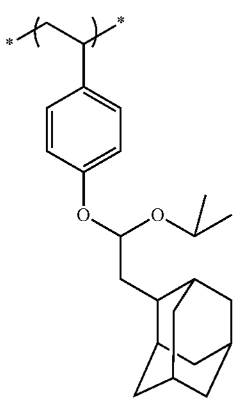
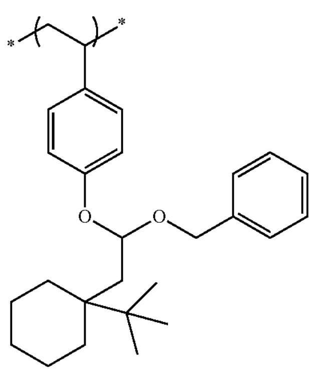
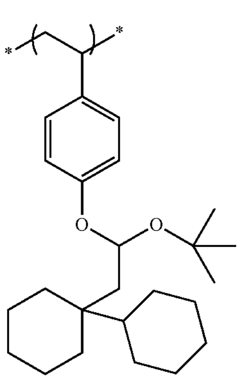
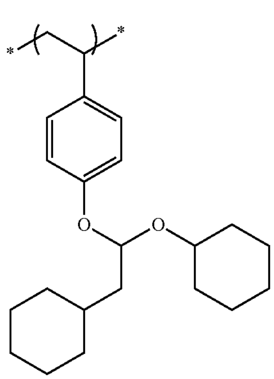
-continued
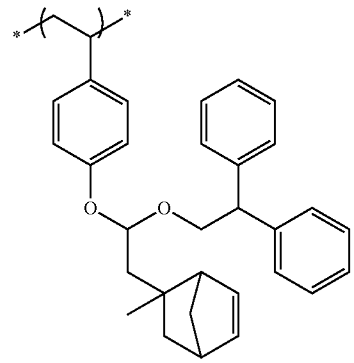
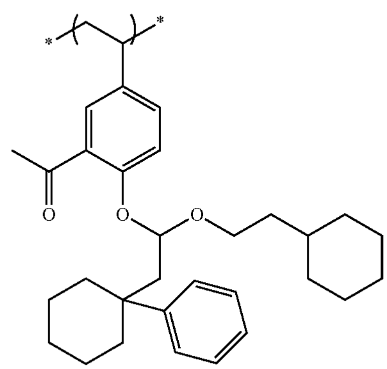
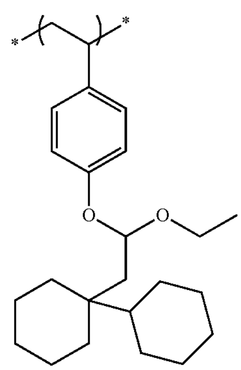
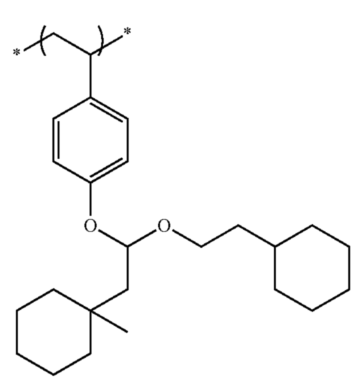

-continued
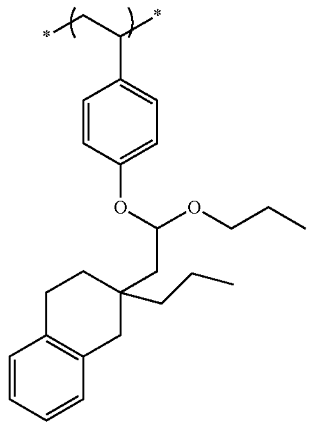
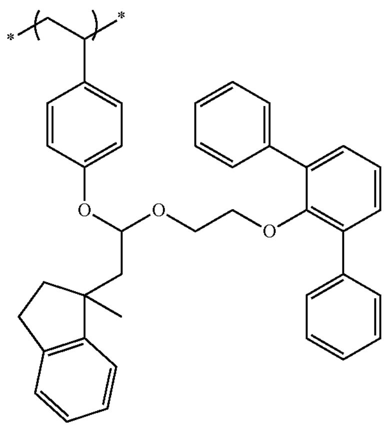
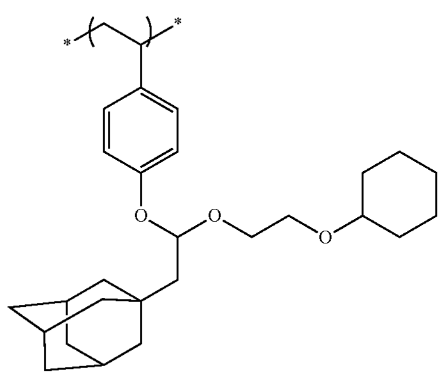
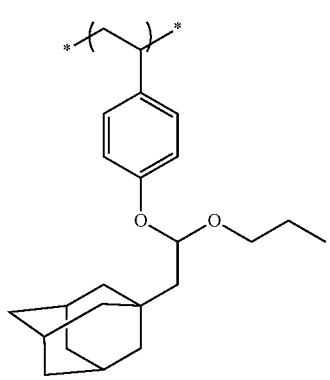
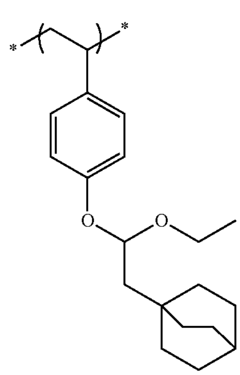
-continued
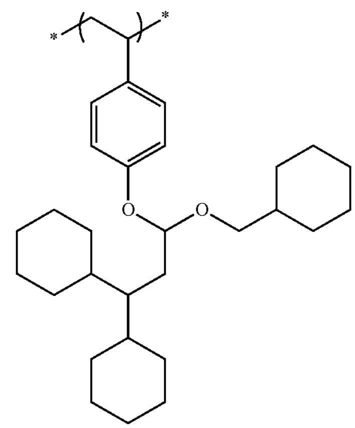
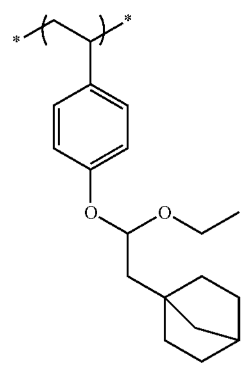
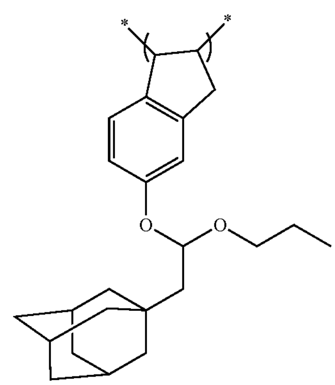
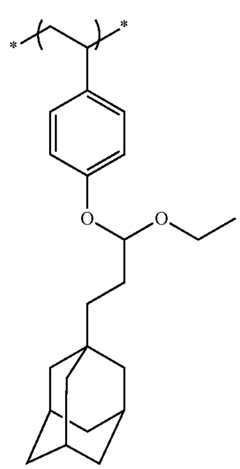
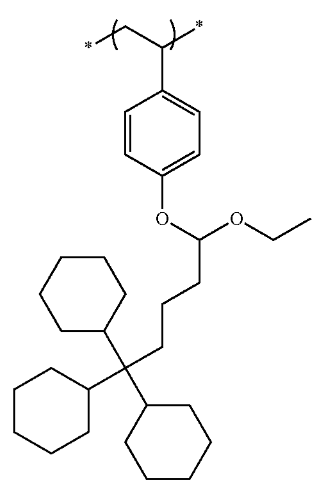
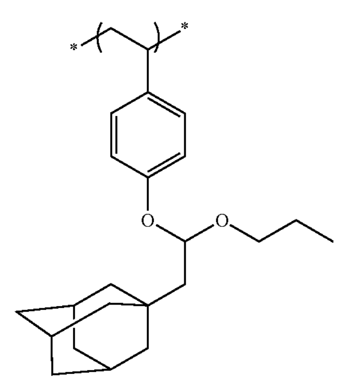

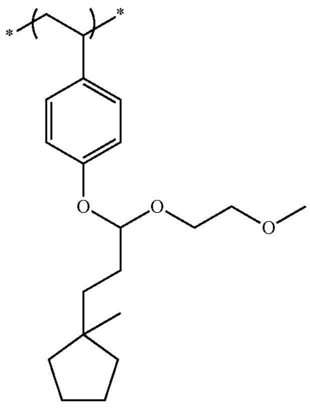
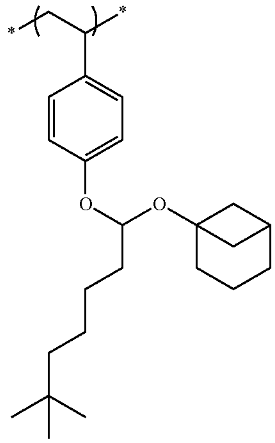
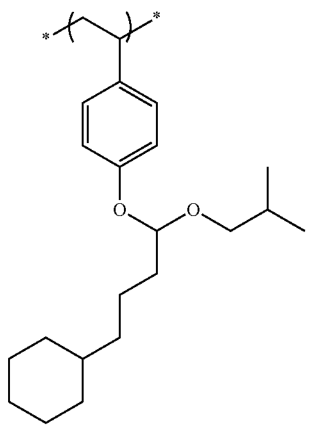
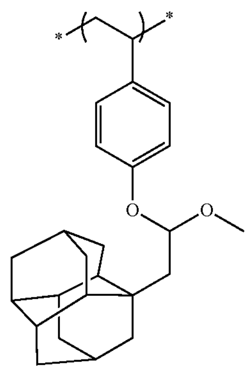
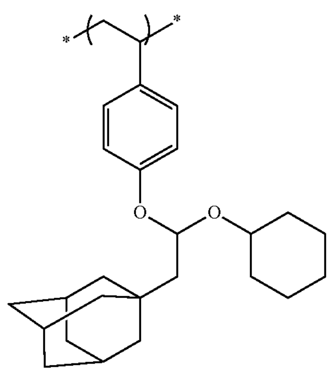
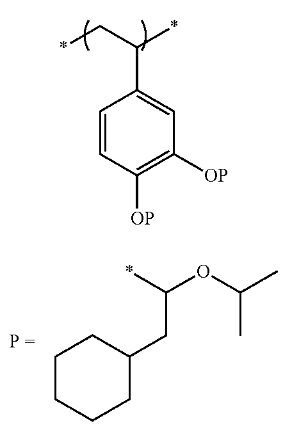
OP
OP
P =
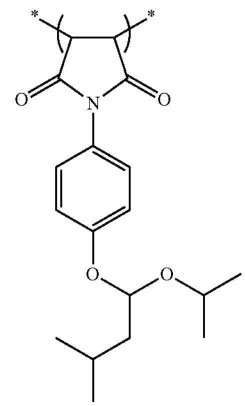
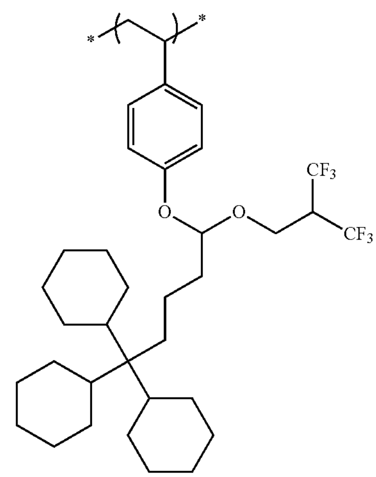
CF3
CF3
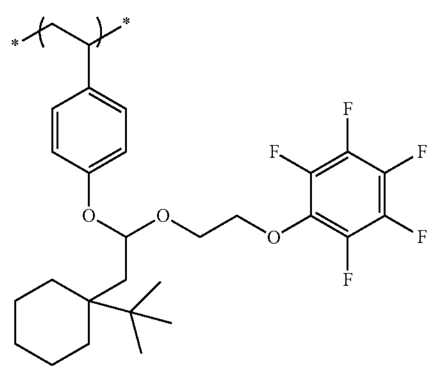
F
F
F
F
F
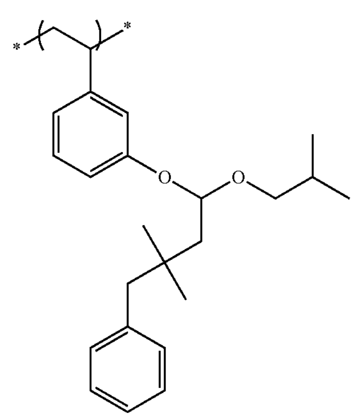

-continued

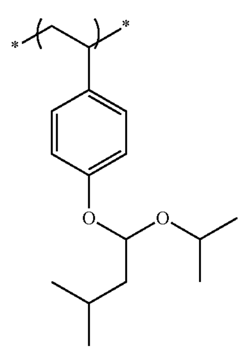

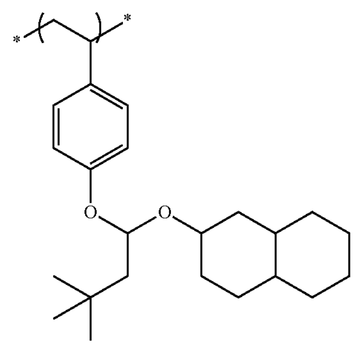

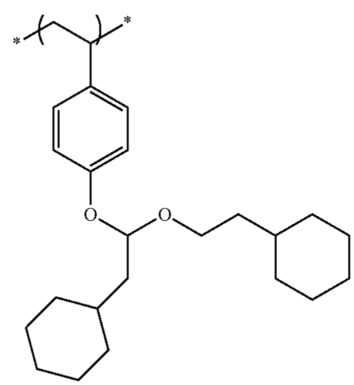

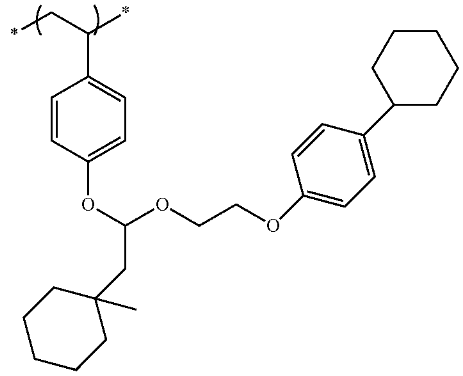

-continued

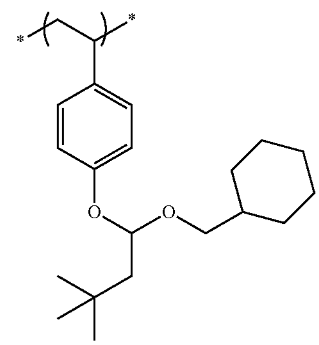

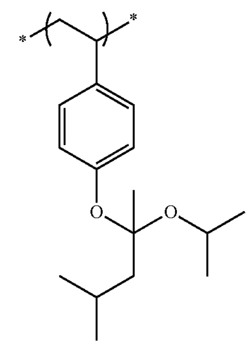

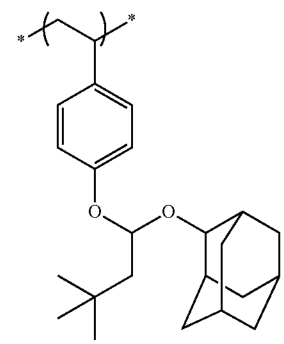

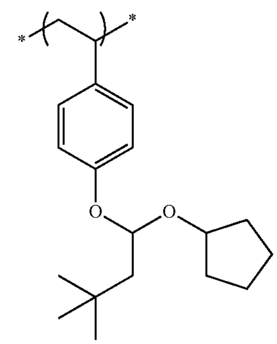

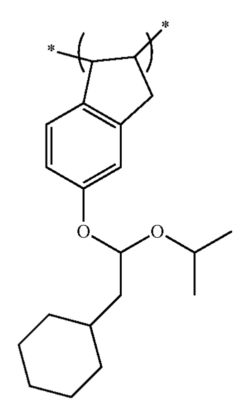

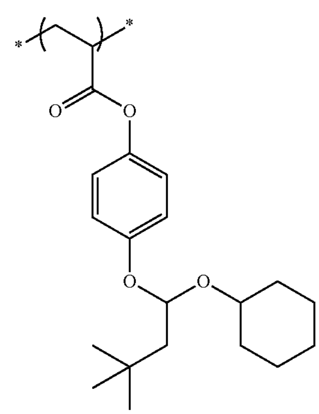

In the case where the resin (P) of the present invention has the repeating unit represented by Formula (B), the repeating unit represented by Formula (B) is preferably present in a range of 1 mol % to 99 mol %, more preferably in a range of 5 mol % to 80 mol %, and particularly preferably in a range of 10 mol % to 50 mol % based on the total repeating units in the resin (P).

The repeating unit represented by Formula (B) may be used either alone or in combination of two or more thereof, but it is preferred that the repeating unit is used alone.

Next, the repeating unit represented by Formula (C) will be described in detail.

(C)

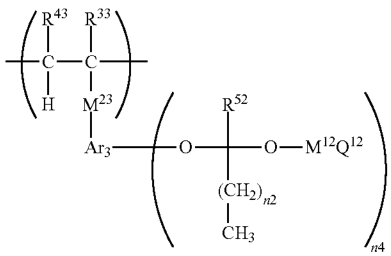

In Formula (C), $R^{52}$ represents a hydrogen atom or an alkyl group.

$R^{33}$ represents a hydrogen atom or an alkyl group.

$R^{43}$ represents a hydrogen atom or an alkyl group. $R^{43}$ and $M^{23}$ or $Ar_3$ may be bound with each other to form a ring, and in that case, $R^{43}$ represents an alkylene group.

$M^{23}$ represents a single bond or a divalent linking group, and in the case of being bound with $R^{43}$ to form a ring, represents a trivalent linking group.

$Ar_3$ represents a (n4+1)-valent aromatic ring group, and in the case of being bound with $R^{43}$ to form a ring, represents a (n4+2)-valent aromatic ring group $M^{12}$ represents a single bond or a divalent linking group.

$Q^{12}$ represents an alkyl group, a cycloalkyl group, an aryl group or a heterocyclic group.

When $M^{12}$ is a divalent linking group, $Q^{12}$ may be bound via a single bond or a separate linking group to $M^{12}$ to form a ring.

n2 represents an integer of 0 or more.

n4 represents an integer of 1 or more.

Specific examples and preferred ranges of $Ar_3$, $M^{23}$, $R^{33}$ and $R^{43}$ are the same as those described with respect to Ar, $M^{21}$, $R^{31}$ and $R^{41}$ in Formula (A).

Specific examples and preferred ranges of $R^{52}$, $M^{12}$, $Q^{12}$ and n4 are the same as those described with respect to $R^{51}$, $M^{11}$, $Q^{11}$ and n3 in Formula (B).

n2 preferably represents an integer of 0 to 5, more preferably an integer of 0 to 1, and still more preferably 0.

Specific examples of the repeating unit represented by Formula (C) are shown below, but the present invention is not limited thereto.

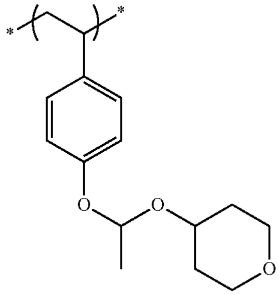

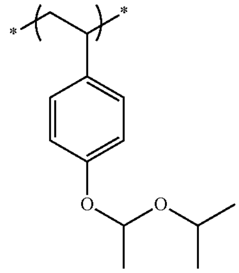

-continued

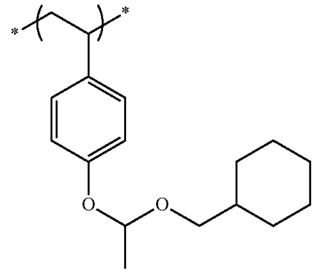

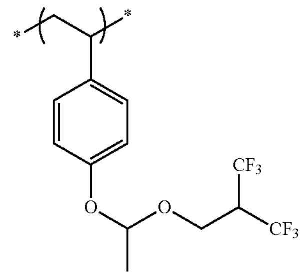

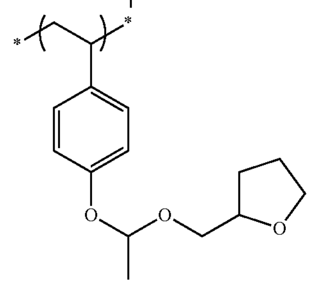

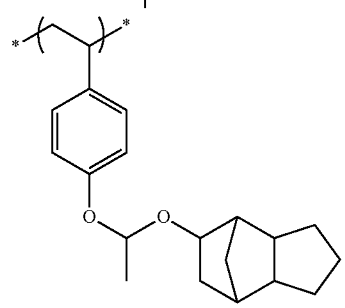

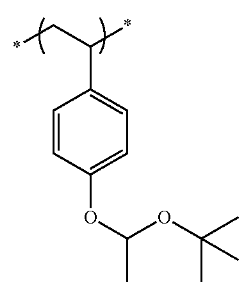

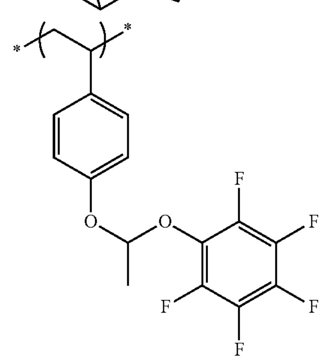

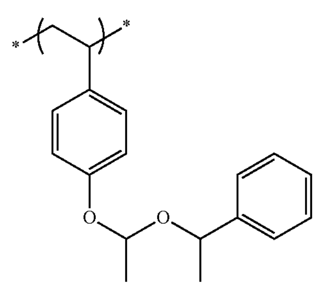

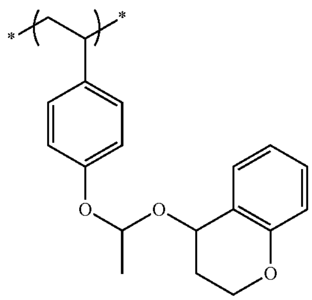
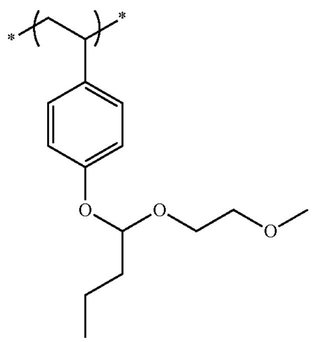
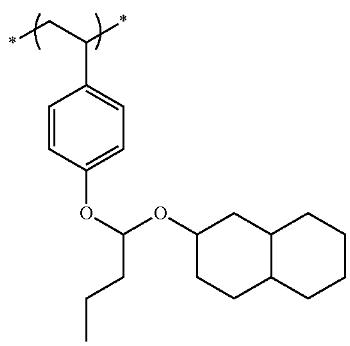
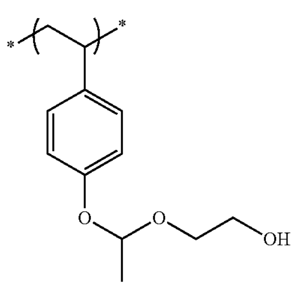
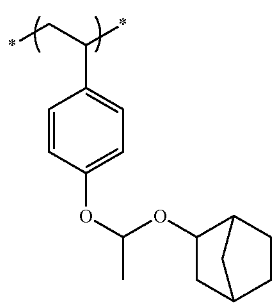
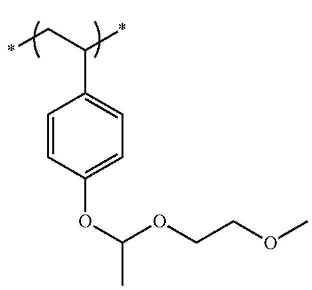
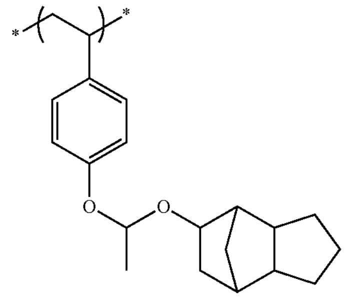
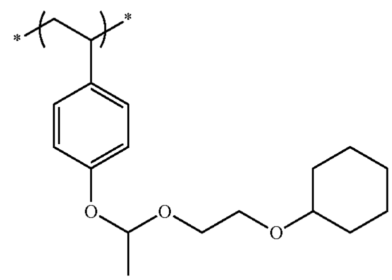
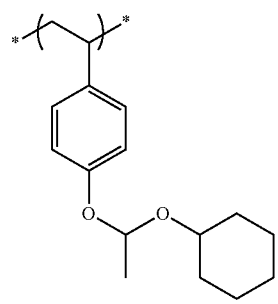
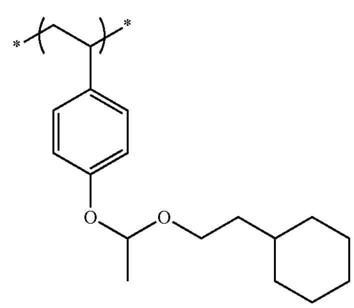
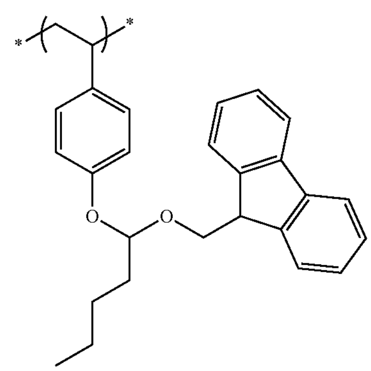

-continued

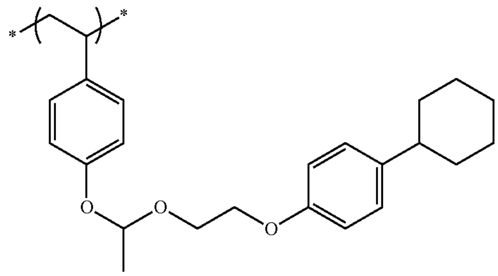

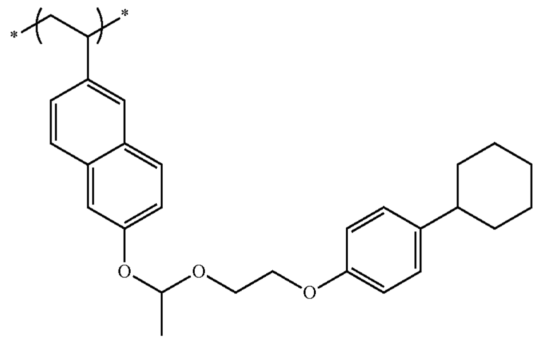

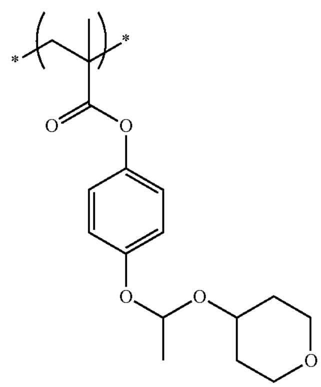

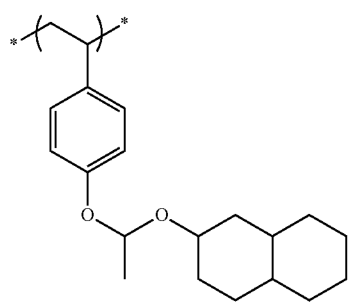

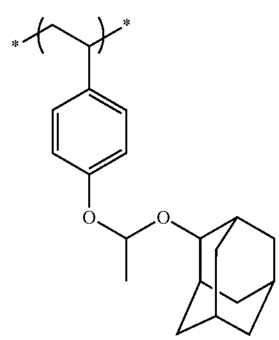

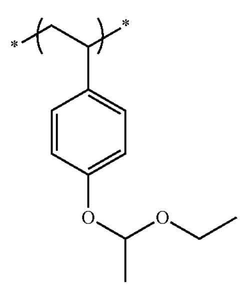

-continued

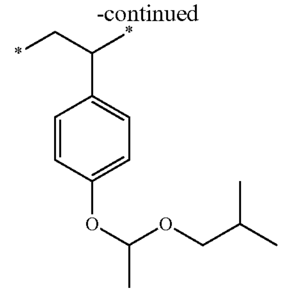

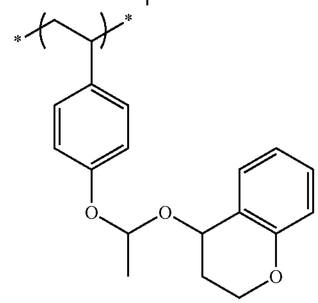

In the case where the resin (P) of the present invention has the repeating unit represented by Formula (C), the repeating unit represented by Formula (C) is preferably present in a range of 1 mol % to 99 mol %, more preferably in a range of 5 mol % to 70 mol %, and particularly preferably in a range of 10 mol % to 40 mol % based on the total repeating units in the resin (P).

Next, the repeating unit represented by Formula (D) will be described in detail.

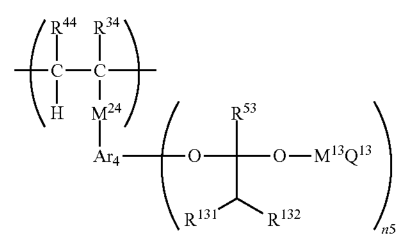

(D)

In Formula (D), $R^{53}$ represents a hydrogen atom or an alkyl group.

Each of $R^{131}$ and $R^{132}$ independently represents an alkyl group, a cycloalkyl group, an aryl group, an aralkyl group or a heterocyclic group, and each of $R^{131}$ and $R^{132}$ may be bound with each other to form a ring.

$R^{34}$ represents a hydrogen atom or an alkyl group.

$R^{44}$ represents a hydrogen atom or an alkyl group. $R^{44}$ and $M^{24}$ or $Ar_4$ may be bound with each other to form a ring, and in that case, $R^{44}$ represents an alkylene group.

$M^{24}$ represents a single bond or a divalent linking group, and in the case of being bound with $R^{44}$ to form a ring, represents a trivalent linking group.

$Ar_4$ represents a (n5+1)-valent aromatic ring group, and in the case of being bound with $R^{44}$ to form a ring, represents a (n5+2)-valent aromatic ring group.

$M^{13}$ represents a single bond or a divalent linking group.

$Q^{13}$ represents an alkyl group, a cycloalkyl group, an aryl group or a heterocyclic group.

When $M^{13}$ is a divalent linking group, $Q^{13}$ may be bound via a single bond or a separate linking group to $M^{13}$ to form a ring.

n5 represents an integer of 1 or more.

Specific examples and preferred ranges of $Ar_4$, $M^{24}$, $R^{34}$ and $R^{44}$ are the same as those described with respect to Ar, $M^{21}$, $R^{31}$ and $R^{41}$ in Formula (A).

Specific examples and preferred ranges of $R^{53}$, $R^{131}$, $R^{132}$, $M^{13}$, $Q^{13}$ and n5 are the same as those described with respect to $R^{51}$, $R^{21}$ to $R^{23}$, $M^{11}$, $Q^{11}$ and n3 in Formula (B).

Specific examples of the repeating unit represented by Formula (D) are shown below, but the present invention is not limited thereto.

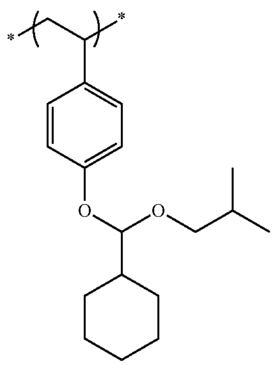

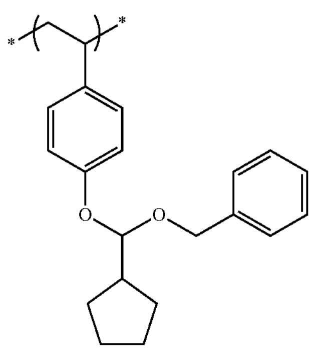

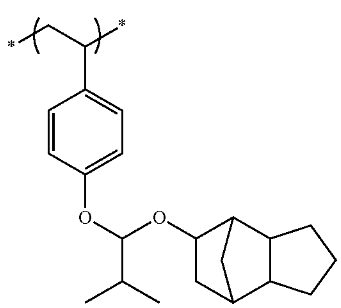

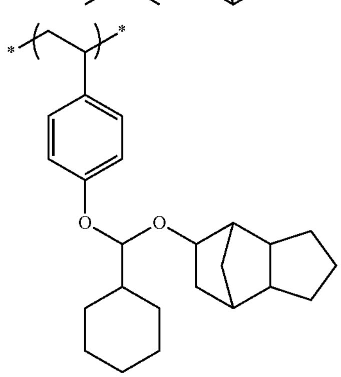

-continued

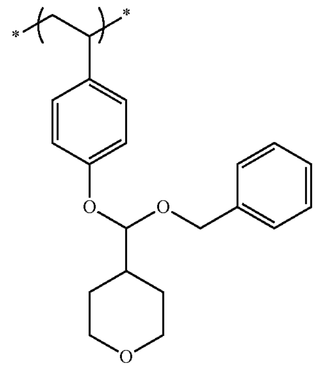

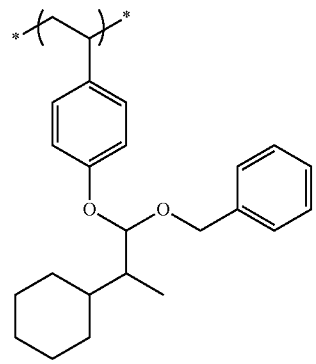

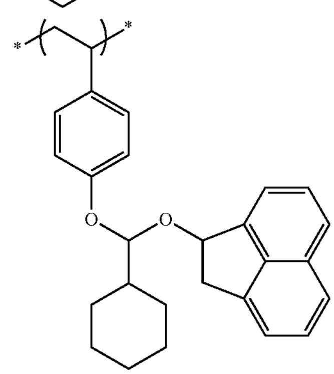

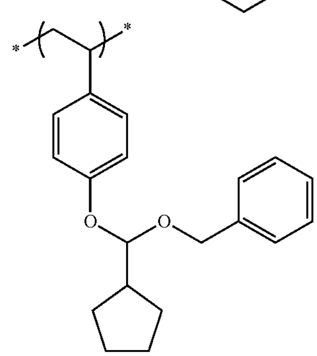

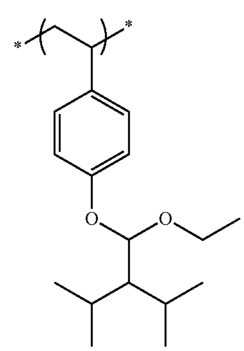

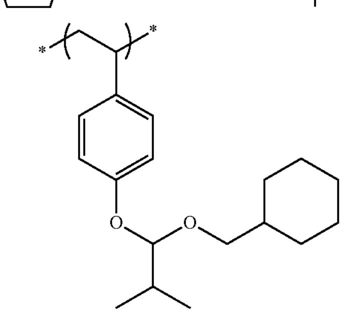

-continued

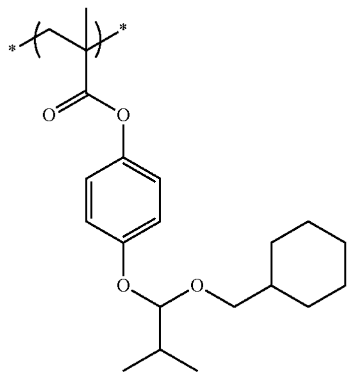

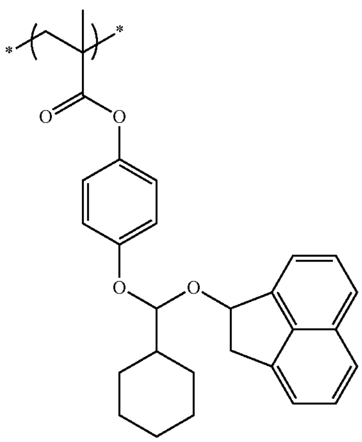

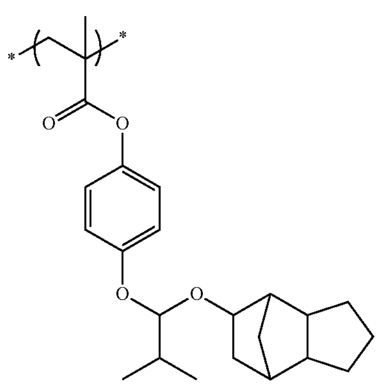

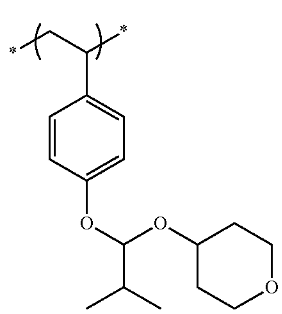

-continued

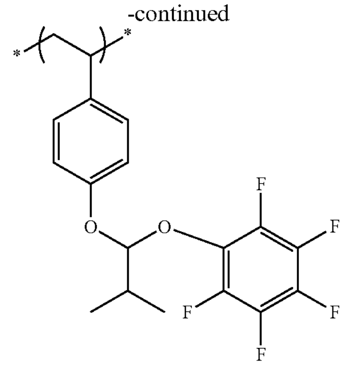

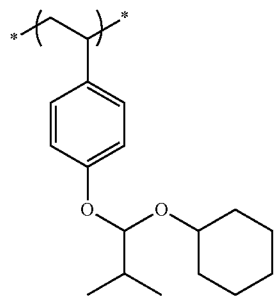

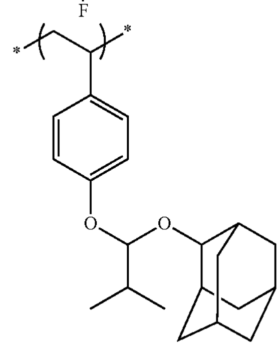

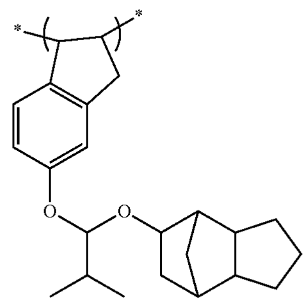

In the case where the resin (P) of the present invention has the repeating unit represented by Formula (D), the repeating unit represented by Formula (D) is preferably present in a range of 1 mol % to 99 mol %, more preferably in a range of 5 mol % to 70 mol %, and particularly preferably in a range of 10 mol % to 40 mol % based on the total repeating units in the resin (P).

Next, the repeating unit represented by Formula (E) will be described in detail.

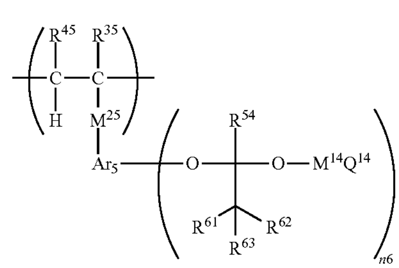

(E)

In Formula (E), $R^{54}$ represents a hydrogen atom or an alkyl group.

Each of $R^{61}$ to $R^{63}$ independently represents an organic group in which the atom bound to C in —C($R^{61}R^{62}R^{63}$) is a carbon atom. At least two of $R^{61}$, $R^{62}$ and $R^{63}$ may be bound with each other to form a ring.

$R^{35}$ represents a hydrogen atom or an alkyl group.

$R^{45}$ represents a hydrogen atom or an alkyl group. $R^{45}$ and $M^{25}$ or $Ar_5$ may be bound with each other to form a ring, and in that case, $R^{45}$ represents an alkylene group.

$M^{25}$ represents a single bond or a divalent linking group, and in the case of being bound with $R^{45}$ to form a ring, represents a trivalent linking group.

$Ar_5$ represents a (n6+1)-valent aromatic ring group, and in the case of being bound with $R^{45}$ to form a ring, represents a (n6+2)-valent aromatic ring group.

$M^{14}$ represents a single bond or a divalent linking group.

$Q^{14}$ represents an alkyl group, a cycloalkyl group, an aryl group or a heterocyclic group.

n6 represents an integer of 1 or more.

Specific examples and preferred ranges of $Ar_5$, $M^{24}$, $R^{35}$ and $R^{45}$ are the same as those described with respect to Ar, $M^{21}$, $R^{31}$ and $R^{41}$ in Formula (A).

Specific examples and preferred ranges of $R^{54}$ and n6 are the same as those described with respect to $R^{51}$ and n3 in Formula (B).

As described above, each of $R^{61}$, $R^{62}$ and $R^{63}$ independently represents an organic group. Herein, the organic group refers to a group containing at least one carbon atom, and one of the carbon atoms contained is bound to C in —($CR^{61}R^{62}R^{63}$).

Further, the sum of the carbon number contained in organic groups represented by $R^{61}$, $R^{62}$ and $R^{63}$ is 4 or more, preferably 6 to 20, and particularly preferably 6 to 10.

The organic group represented by $R^{61}$, $R^{62}$ and $R^{63}$ is preferably an organic group containing a carbon-hydrogen bond moiety. In the case of containing 2 or more carbon atoms, the organic group may be a saturated organic group in which the carbon-carbon bonds are composed of only a single bond, or an unsaturated organic group in which the carbon-carbon bonds include a moiety composed of a double bond or a triple bond. Further, the organic group may contain a heteroatom such as an oxygen atom, a nitrogen atom and a sulfur atom.

Examples of $R^{61}$, $R^{62}$ and $R^{63}$ may include an alkyl group, a cycloalkyl group, an aryl group, an aralkyl group or a heterocyclic group which is linked with a carbon atom. The heterocyclic group which is linked with a carbon atom may be aromatic or non-aromatic.

In an aspect, the carbon number of the alkyl group is preferably 20 or less, and more preferably 8 or less. Example of the alkyl group may include a methyl group, an ethyl group, a propyl group, an isopropyl group, a n-butyl group, a sec-butyl group, a t-butyl group, a hexyl group, a 2-ethylhexyl group, an octyl group and a dodecyl group. Among them, a methyl group, an ethyl group, a propyl group, an isopropyl group and a t-butyl group are particularly preferred.

The cycloalkyl group may be either monocyclic or polycyclic. The carbon number of the cycloalkyl group is preferably 3 to 10. Examples of the cycloalkyl group may include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group and a 2-norbornyl group. Among them, a cyclopentyl group and a cyclohexyl group are preferred.

The aryl group also includes a structure in which a plurality of aromatic rings is linked via a single bond to each other (for example, a biphenyl group and a terphenyl group). The carbon number of the aryl group is preferably 4 to 20, and still more preferably 6 to 14. Examples of the aryl group may include a phenyl group, a naphthyl group, an anthranyl group, a biphenyl group, a terphenyl group and the like. Among them, a phenyl group, a naphthyl group and a biphenyl group are particularly preferred.

The carbon number of the aralkyl group is preferably 6 to 20, and still more preferably 7 to 12. Examples of the aralkyl group may include a benzyl group, a phenethyl group, a naphthylmethyl group and a naphthylethyl group.

The alkyl group, the cycloalkyl group, the aryl group and the aralkyl group may further have a substituent.

Examples of the substituent which may be further possessed by the alkyl group may include a cycloalkyl group, an aryl group, an amino group, an amide group, a ureido group, a urethane group, a hydroxyl group, a carboxyl group, a halogen atom, an alkoxy group, an aralkyloxy group, a thioether group, an acyl group, an acyloxy group, an alkoxycarbonyl group, a cyano group and a nitro group.

The substituent which may be further possessed by the cycloalkyl group may be exemplified by each of the groups as described above as specific examples of the alkyl group and the substituent which may be further possessed by the alkyl group.

Meanwhile, the carbon number of the substituent which may be further possessed by the alkyl group and the cycloalkyl group is preferably 8 or less.

Examples of the substituent which may be further possessed by the aryl group and the aralkyl group may include a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms) and an alkoxycarbonyloxy group (preferably having 2 to 7 carbon atoms).

In the heterocyclic group which is linked with a carbon atom, "linked with a carbon atom" means that the atom bound to C in —($CR^{61}R^{62}R^{63}$) is a carbon atom. The heterocyclic ring may be either an aromatic ring or a no-aromatic ring, and the carbon number is preferably 2 to 20, and more preferably 4 to 14. Examples of the heterocyclic group which is linked with a carbon atom may include a pyrrolyl group, a pyridyl group, a pyrimidyl group, a furanyl group, a thienyl group, a tetrahydrofuranyl group, a tetrahydropyranyl group, a tetrahydrothienyl group, a pyrrolydinyl group, a morpholinyl group and the like.

At least two of $R^{61}$, $R^{62}$ and $R^{63}$ may be bound with each other to form a ring. Here, in the case where at least two of $R^{51}$, $R^{52}$ and $R^{53}$, examples of the ring to be formed may include a cyclopentane ring, a cyclohexane ring, an adamantane ring, a norbornene ring and a norbornane ring. These may have a substituent, and the substituent which may be possessed may be exemplified by each of the group as described above as specific examples of the alkyl group and the substituent which may further possessed by the alkyl group. In the case where all of $R^{61}$, $R^{62}$ and $R^{63}$ are bound with each other to form a ring, examples of the ring to be formed may include an adamantane ring, a norbornane ring, a norbornene ring, a bicyclo[2,2,2]octane ring and a bicyclo[3,1,1]heptane ring. Among them, an adamantane ring is particularly preferred. These may have a substituent, and the substituent which may be possessed may be exemplified by each of the group as described above as specific examples of the alkyl group and the substituent which may further possessed by the alkyl group.

In consideration of enhancement of the dry etching resistance and the glass transition temperature of the compound (P), it is preferred that at least one of $R^{61}$, $R^{62}$ and $R^{63}$ has a cyclic structure, it is more preferred that at least two of $R^{61}$, $R^{62}$ and $R^{63}$ are bound with each other to form a ring, and it is particularly preferred that all of $R^{61}$, $R^{62}$ and $R^{63}$ are bound with each other to form a ring.

Specific examples of the group represented by —($CR^{61}R^{62}R^{63}$) are shown below, but the present invention is not limited thereto.

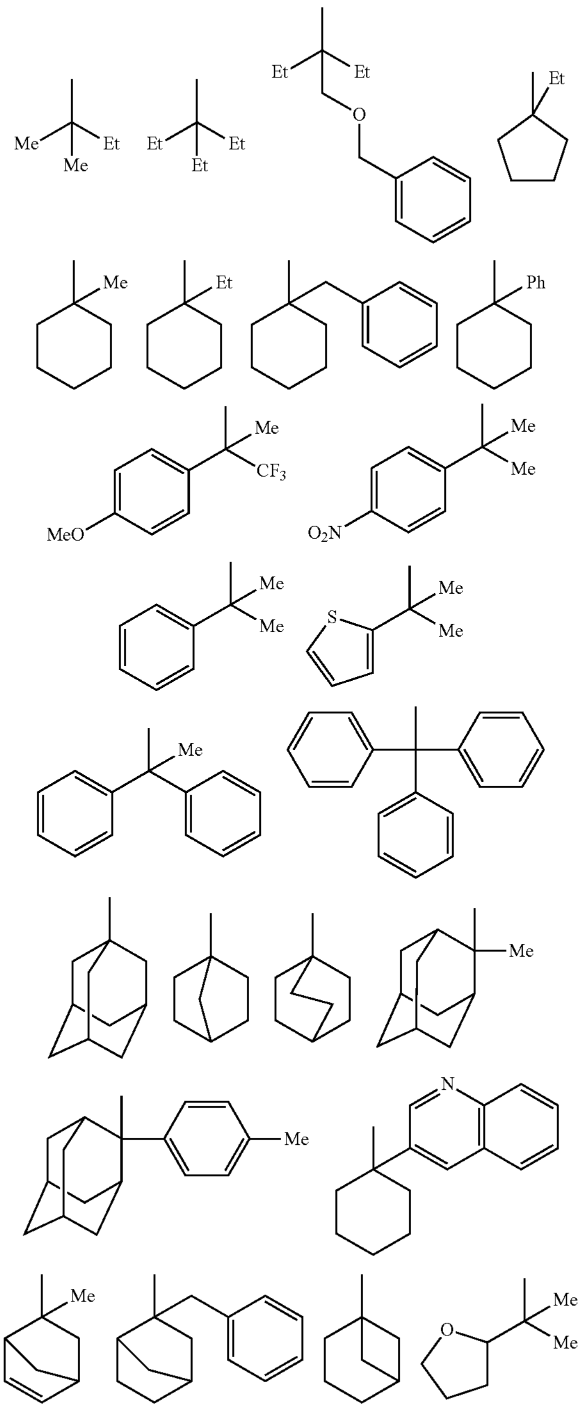

-continued

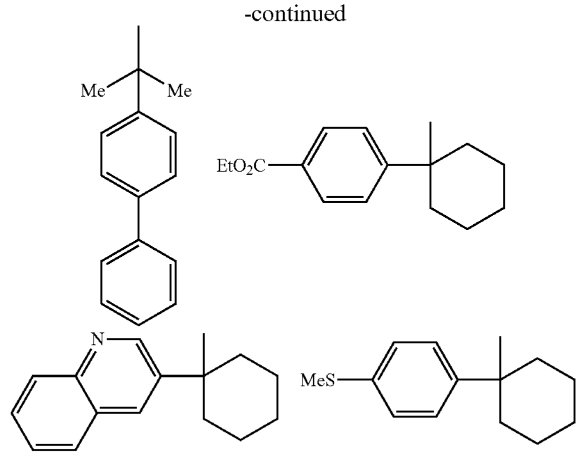

Examples of the divalent linking group as $M^{14}$ may include an alkylene group (preferably an alkylene group having 1 to 8 carbon atoms, for example, a methylene group, an ethylene group, a propylene group, a butylene group, a hexylene group or an octylene group), an cycloalkylene group (preferably a cycloalkylene group having 3 to 15 carbon atoms, for example, a cyclopentylene group or a cyclohexylene group), —S—, —O—, —CO—, —CS—, —$SO_2$—, —N($R^0$)— or a combination of two or more thereof, and preferably has a total carbon number of 20 or less. Here, $R^0$ is a hydrogen atom or alkyl group (for example, an alkyl group having 1 to 8 carbon atoms, and particularly a methyl group, an ethyl group, a propyl group, a n-butyl group, a sec-butyl group, a hexyl group, an octyl group and the like).

$M^{14}$ is preferably a divalent linking group formed by combining a single bond, an alkylene group or an alkylene group with at least one of —O—, —CO—, —CS— and —N($R^0$)—, and more preferably a divalent linking group formed by combining a single bond, an alkylene group or an alkylene group with —O—. Here, $R^0$ has the same meaning as $R^0$ as described above.

$M^{14}$ may further have a substituent, and the substituent which may be further possessed by $M^{14}$ is the same as the substituent which may be further possessed by the alkyl group of $R^{61}$ as described above.

The alkyl group as $Q^{14}$ are the same as, for example, the alkyl group as $R^{61}$ as described above. The cycloalkyl group as $Q^{14}$ may be either monocyclic or polycyclic. The carbon number of the cycloalkyl group is preferably 3 to 10. Examples of the cycloalkyl group may include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.13,6.02,7]dodecyl group, a 8-tricyclo[5.2.1.02,6]decyl group and a 2-bicyclo[2.2.1]heptyl group. Among them, a cyclopentyl group, a cyclohexyl group, a 2-adamantyl group, a 8-tricyclo[5.2.1.02,6]decyl group and a 2-bicyclo[2.2.1]heptyl group are preferred.

The aryl group as $Q^{14}$ may be exemplified by, for example, the aryl group as $R^{61}$ as described above. The carbon number is preferably 3 to 18.

The heterocyclic ring as $Q^{14}$ is preferably a heterocyclic group having 6 to 20 carbon atoms, and more preferably a heterocyclic group having 6 to 12 carbon atoms. Specific examples of the heterocyclic group of $R^{21}$ to $R^{23}$ may include a pyridyl group, a pyrazyl group, a tetrahydrofuranyl group, a tetrahydropyranyl group, a tetrahydrothiophene group, a piperidyl group, a piperazyl group, a furanyl group, a pyranyl group, a chromanyl group, a benzofuranyl group and the like.

The cycloalkyl group and the aryl group as $Q^{14}$ may have a substituent, and examples thereof may include an alkyl group, a cycloalkyl group, a cyano group, a halogen atom, a hydroxyl group, an alkoxy group, a carboxyl group and an alkoxycarbonyl group.

($-M^{14}-Q^{14}$) may be particularly preferably an alkyl group, an alkyl group substituted with a cycloalkyl group, a cycloalkyl group, an aralkyl group, an aryloxyalkyl group or the like which may be substituted with an alkyl group or a cycloalkyl group. Specific examples thereof may be a methyl group, an ethyl group, an isopropyl group, a cyclopentyl group, a cyclohexyl group, a cyclohexylethyl group, a 2-adamantyl group, a 8-tricyclo[5.2.1.02,6]decyl group, a 2-bicyclo[2.2.1]heptyl group, a benzyl group, a 2-phenethyl group, a 2-phenoxyethyl group and the like.

Specific examples of the group represented by $-(M^{14}-Q^{14})$ are shown below, but the present invention is not limited thereto.

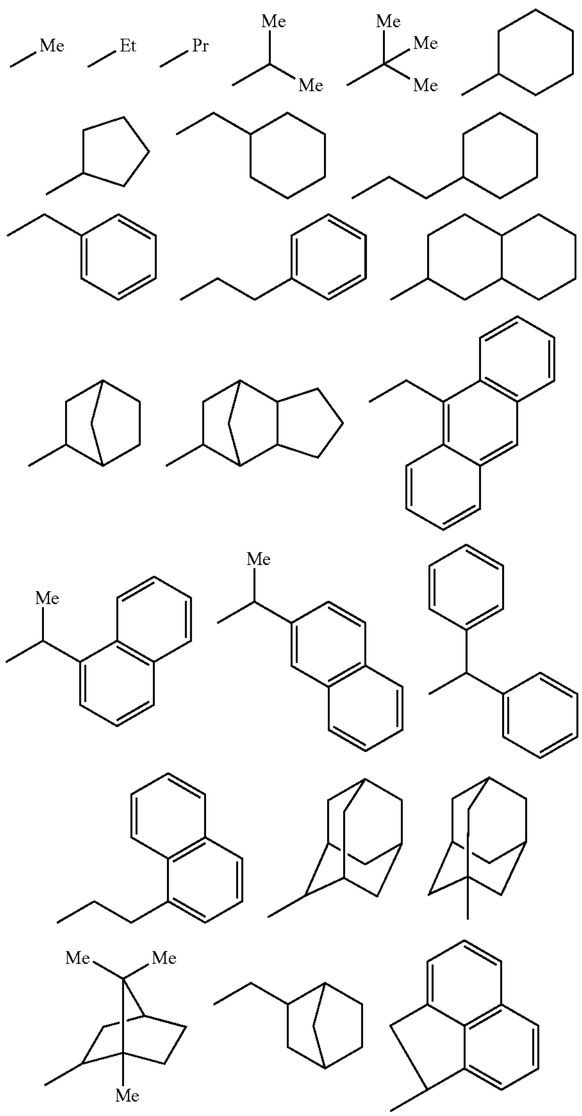

-continued

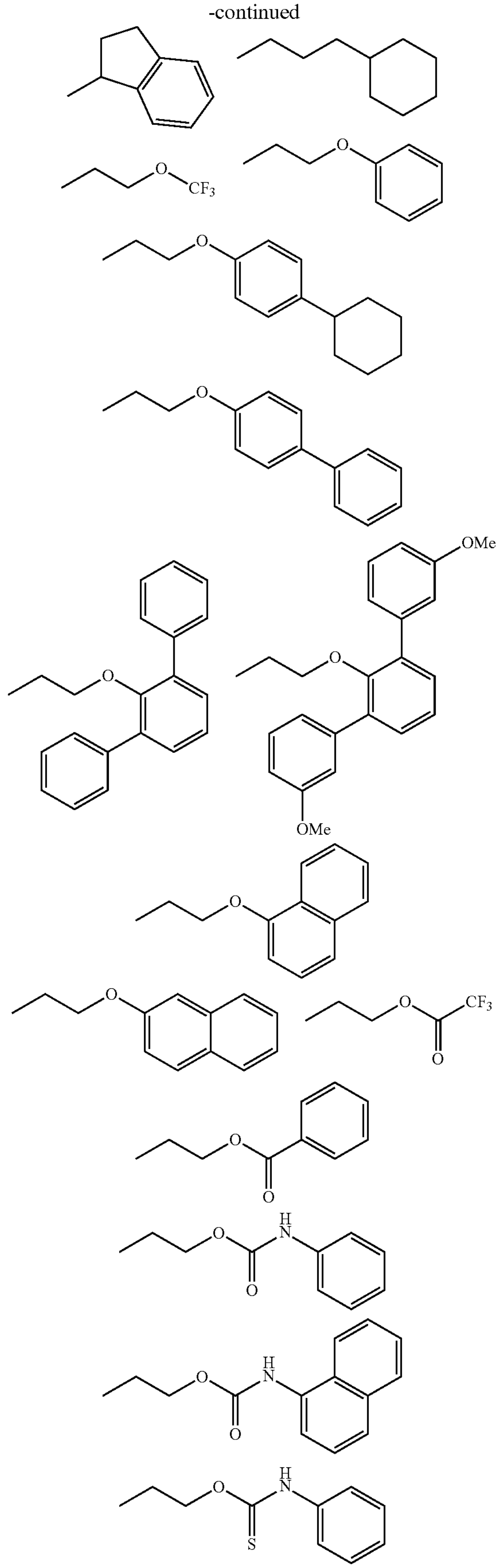

-continued
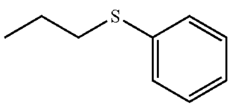
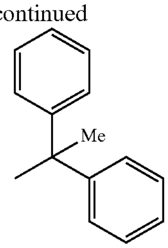
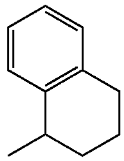
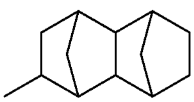
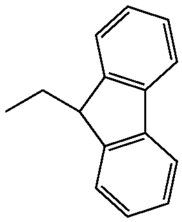
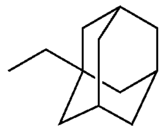
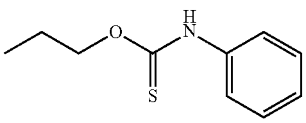
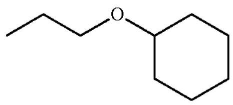
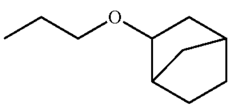
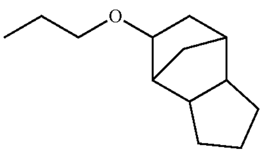
Specific examples of the acid-labile group used in the resin (P) may include groups formed by combining the specific examples of the group represented by —($CR_{61}R_{62}R_{63}$) and the specific examples of the group represented by -($M_{14}$-$Q_{14}$), but are not limited thereto. Preferred examples of the acid-labile group represented by Formula (E) are shown below.
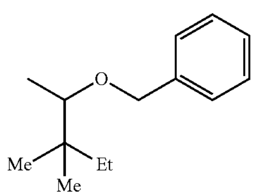
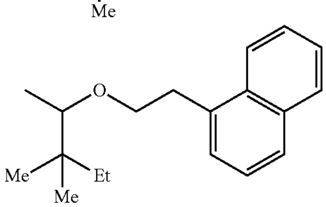
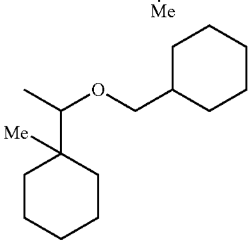
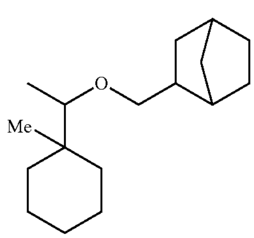
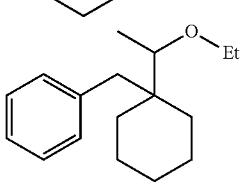
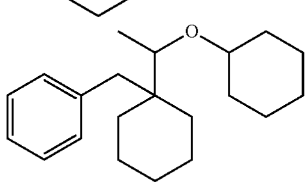
-continued
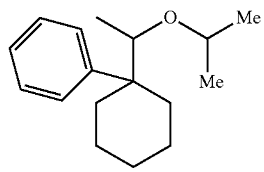
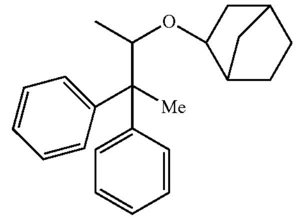
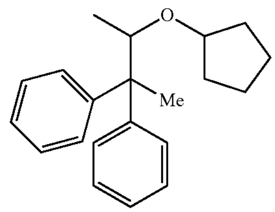
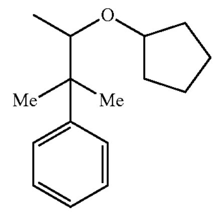
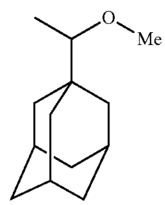
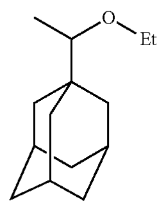
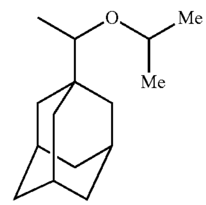
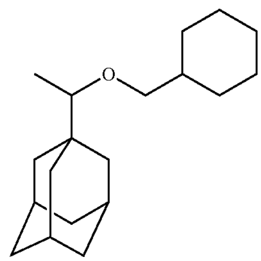
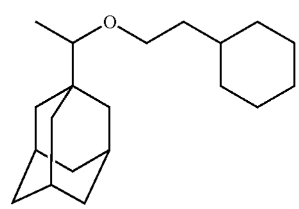
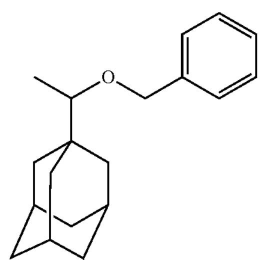
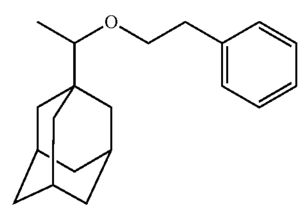
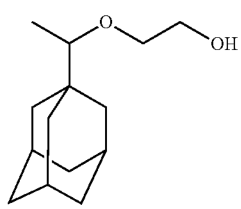
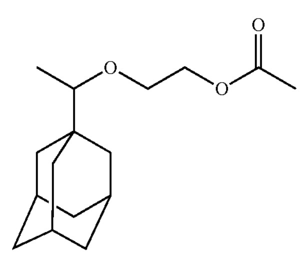
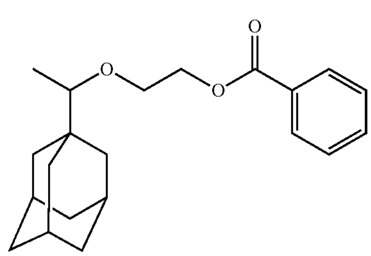

-continued
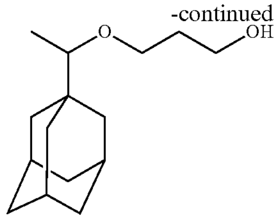
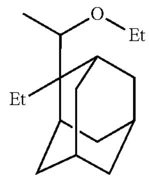
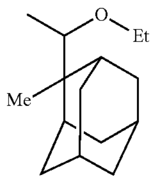
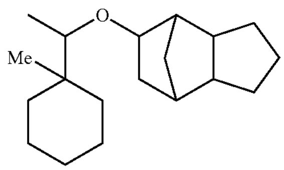
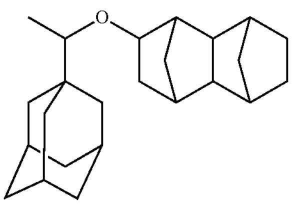
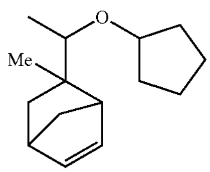
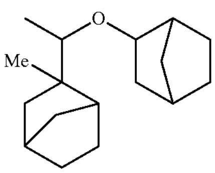
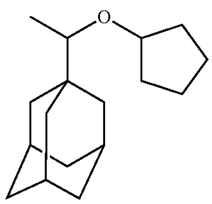
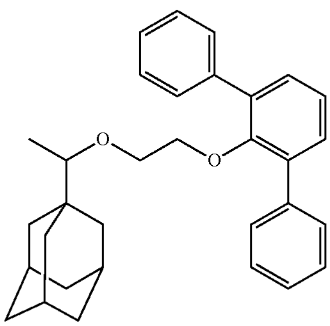
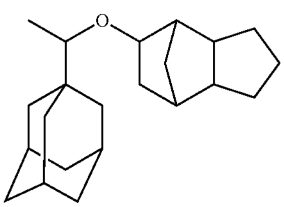
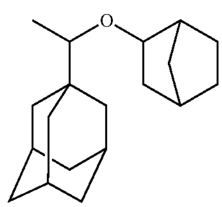
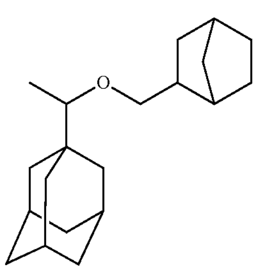
-continued
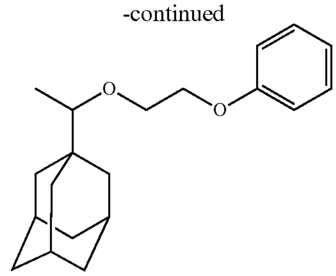
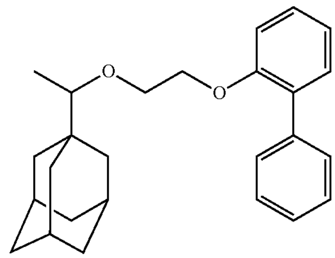
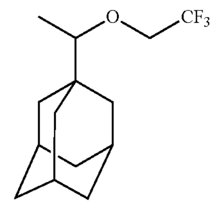
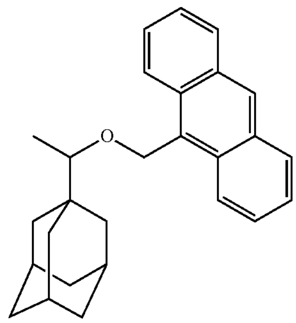
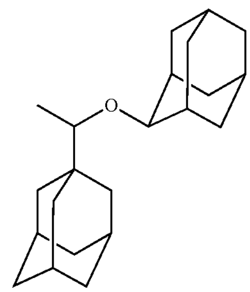
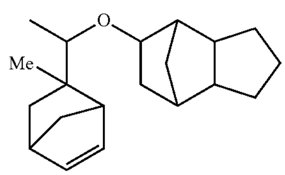
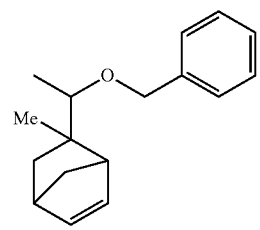
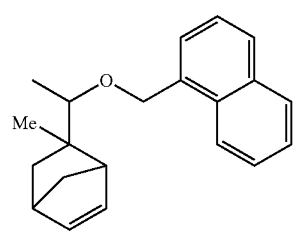
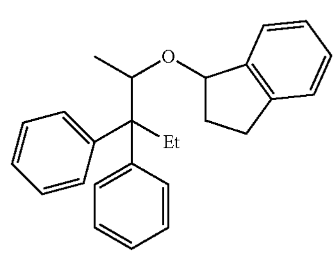

-continued
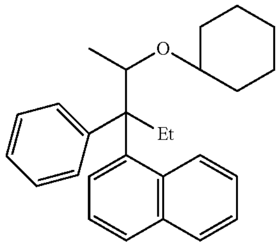
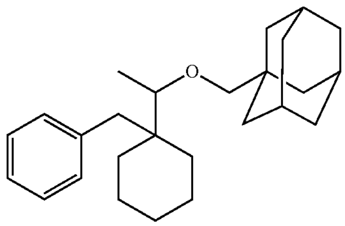
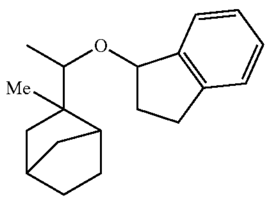
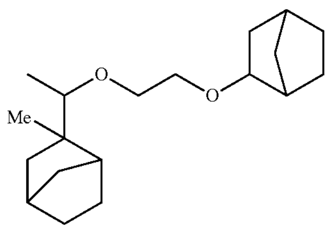
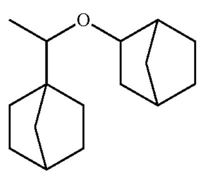
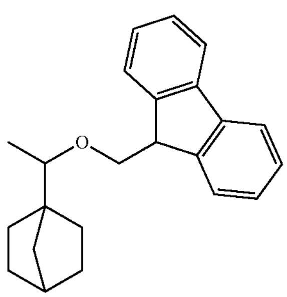
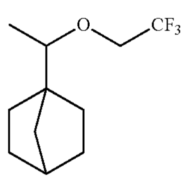
Specific examples of the repeating unit represented by Formula (E) are shown below, but the present invention is not limited thereto.
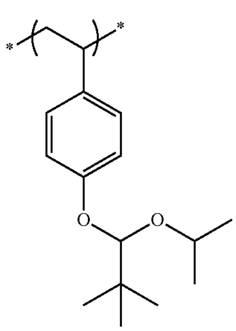
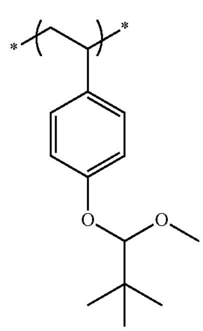
-continued
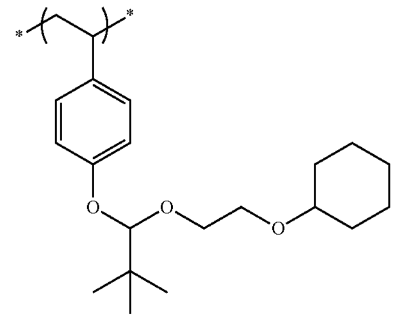
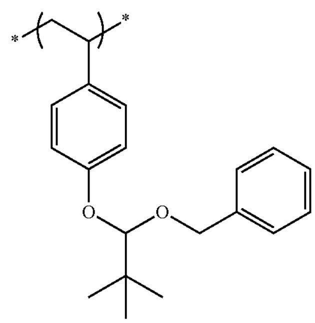
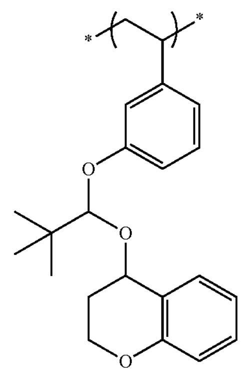
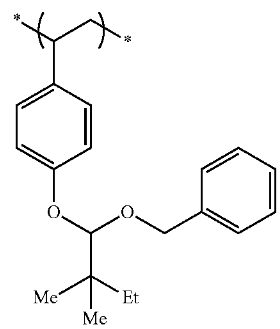
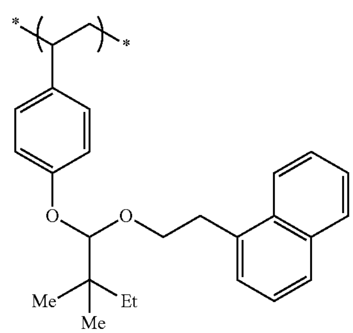
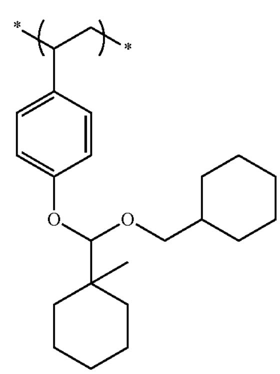

-continued
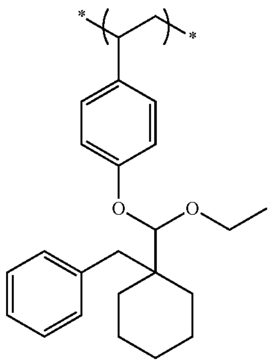
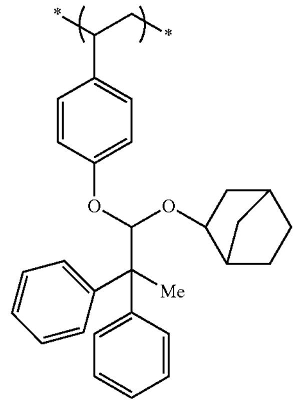
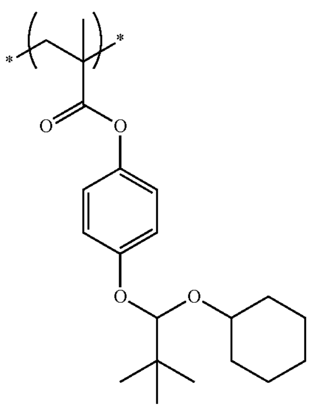
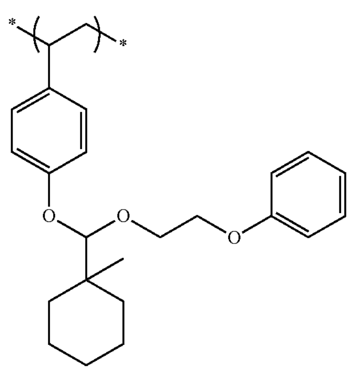
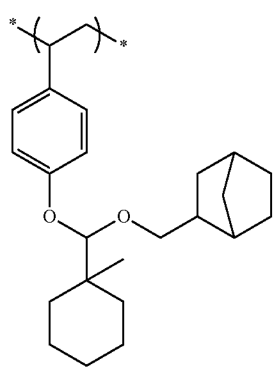
-continued
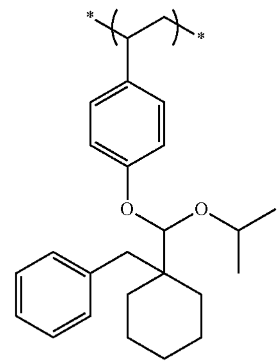
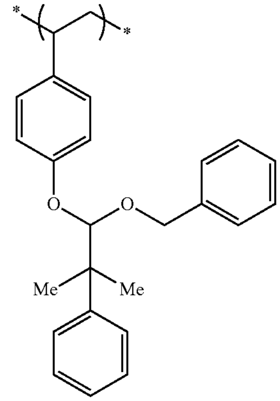
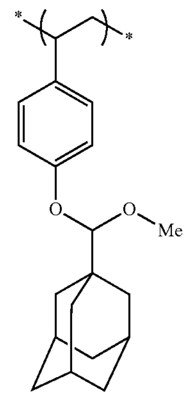
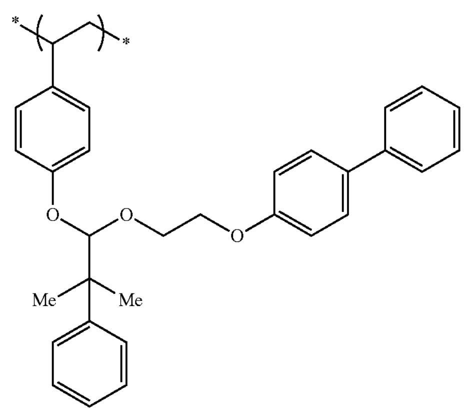
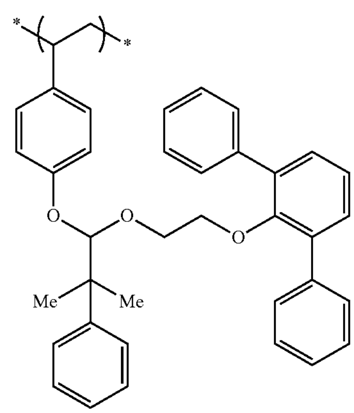

-continued

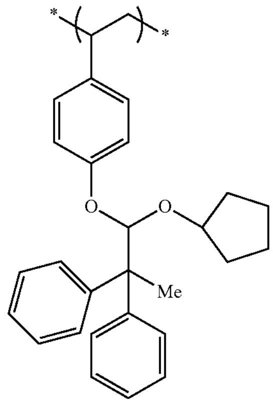

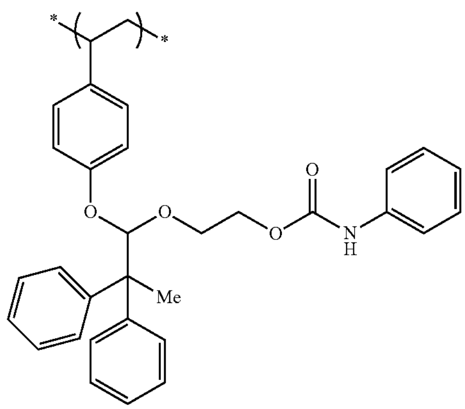

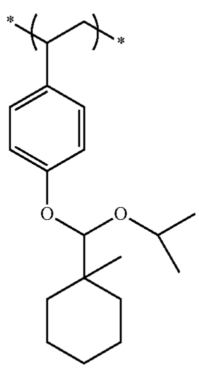

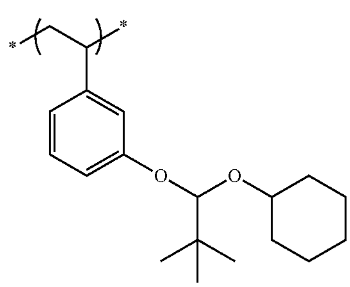

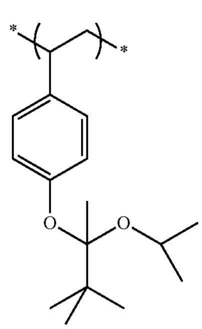

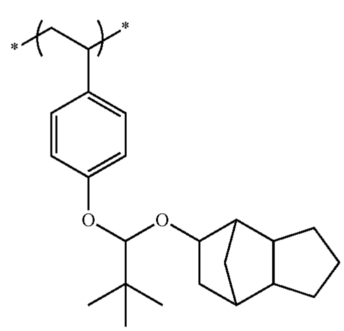

-continued

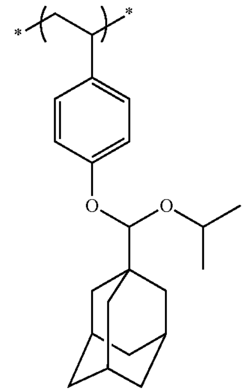

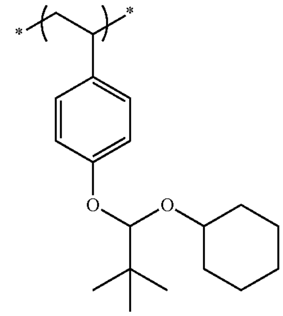

In the case where the resin (P) of the present invention has the repeating unit represented by Formula (E), the repeating unit represented by Formula (E) is preferably present in a range of 1 mol % to 99 mol %, more preferably in a range of 5 mol % to 60 mol %, and particularly preferably in a range of 10 mol % to 30 mol % based on the total repeating units in the resin (P).

The resin (P) of the present invention contains the repeating unit represented by Formula (A), and contains at least two of the repeating unit represented by Formula (B), the repeating unit represented by Formula (C), the repeating unit represented by Formula (D) and the repeating unit represented by Formula (E). It is preferred that the resin (P) of the present invention contains the repeating unit represented by (A), and contains at leas two of the repeating unit represented by Formula (B), the repeating unit represented by Formula (C) and the repeating unit represented by Formula (E), and it is more preferred to contain the repeating unit represented by Formula (A), the repeating unit represented by Formula (B) and the repeating unit represented by Formula (E). As a result, the resolution property upon EB exposure is enhanced, thereby improving the exposure latitude.

The content of the at least two of the repeating unit represented by Formula (B), the repeating unit represented by Formula (C), the repeating unit represented by Formula (D) and the repeating unit represented by Formula (E) is preferably 10 mol % to 70 mol %, more preferably 15 mol % to 65 mol %, and still more preferably 20 mol % to 60 mol % based on the total repeating units in the resin (P).

The content of the repeating unit represented by Formula (2) in the resin (P) is preferably in a range of 5 mol % to 70 mol %, more preferably 7 mol % to 60 mol %, and particularly preferably 10 mol % to 55 mol % based on the total repeating units in the resin (P).

The resin (P) may further contain a repeating unit represented by the following Formula (A1), (A2) or (A3).

(A1)

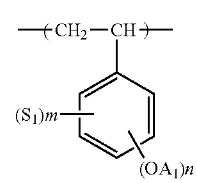

-continued (A2)

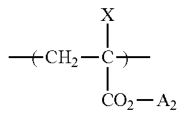

(A3)

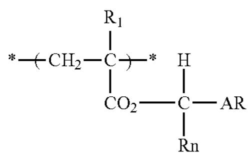

In Formula (A1), n represents an integer of 1 to 5, and m represents an integer of 0 to 4 satisfying the relationship of $1 \leq m+n \leq 5$.

$S_1$ represents a substituent (excluding a hydrogen atom), and when m is 2 or more, each $S_1$ may be the same as or different from every other $S_1$.

$A_1$ represents a hydrogen atom or a group represented by the following Formula (a1) or Formula (a2).

(a1)

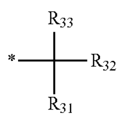

(a2)

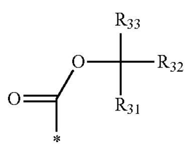

Each of $R_{31}$ to $R_{33}$ independently represents an alkyl group, a cycloalkyl group, an aryl group or a heterocyclic group. The alkyl group, the cycloalkyl group, the aryl group and the heterocyclic group as $R_{31}$ to $R_{33}$ are the same as the specific examples and preferred examples of the alkyl group, the cycloalkyl group, the aryl group and the heterocyclic group as $R^{21}$ to $R^{23}$ in Formula (1).

When n is 2 or more, each $A_1$ may be the same as or different from every other $A_1$.

Specific examples of the repeating unit represented by Formula (A1) are shown below, but are not limited thereto.

Formula (A2)

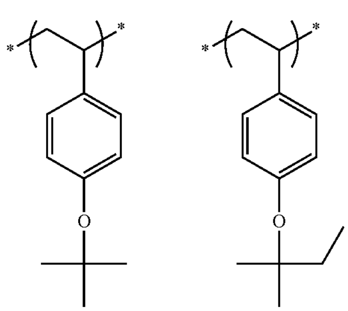

-continued

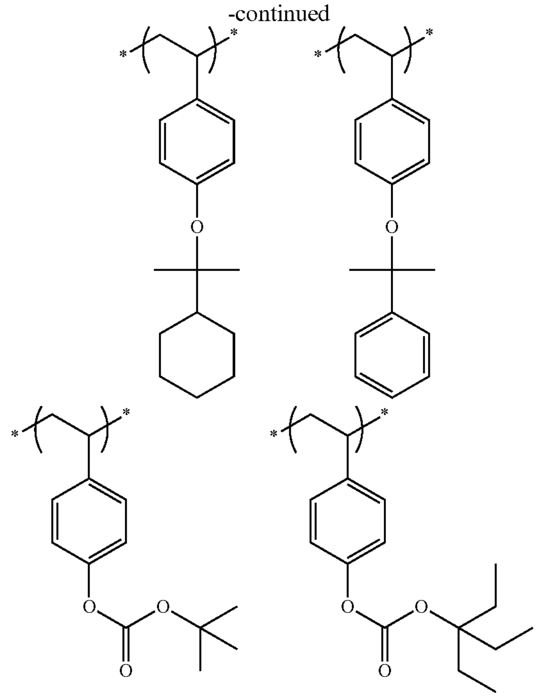

X represents a hydrogen atom or an alkyl group.

$A_2$ represents a group capable of leaving by the action of an acid.

Next, the repeating unit represented by Formula (A2) will be described.

Specific examples and preferred examples of the alkyl group as X may be exemplified by the specific examples and preferred examples of the alkyl group as $R^{31}$ and $R^{41}$ in Formula (A).

$A_2$ may be exemplified by the group represented by Formula (a1) or Formula (a2) as $A_1$ in Formula (A1).

Specific examples of the monomer corresponding to the repeating unit represented by Formula (A2), but are not limited thereto.

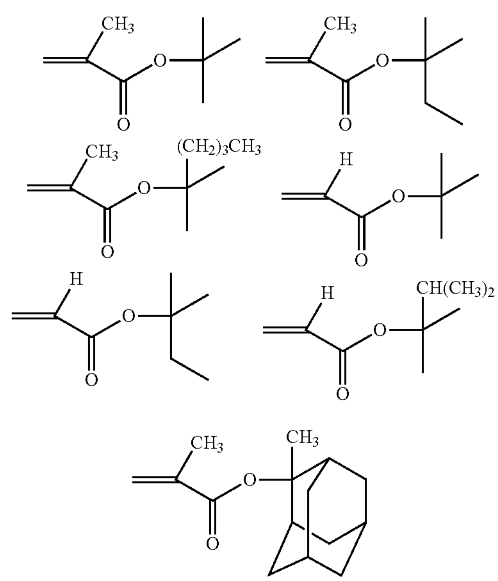

1

-continued
2
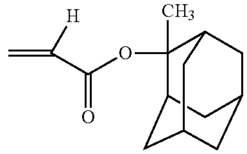
3
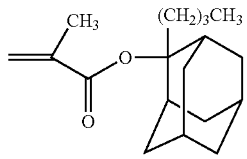
4
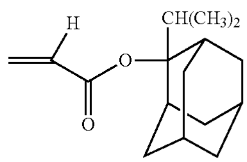
5
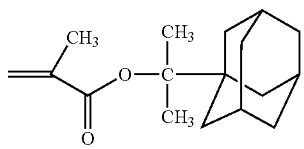
6
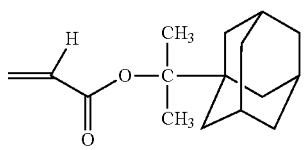
7
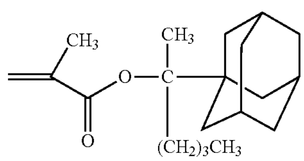
8
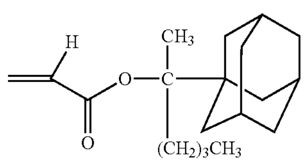
9
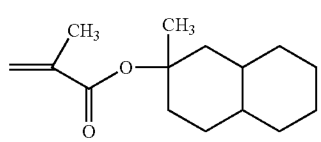
10
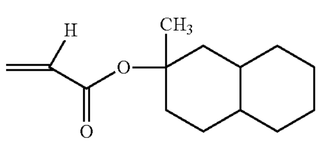
11
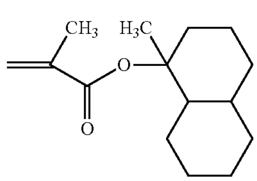
-continued
12
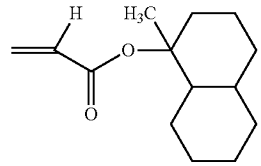
13
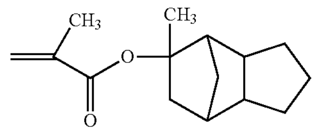
14
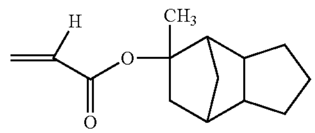
15
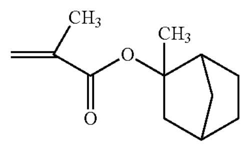
16
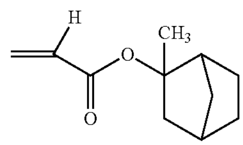
17
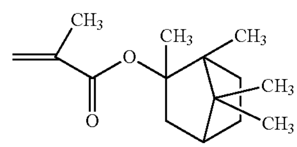
18
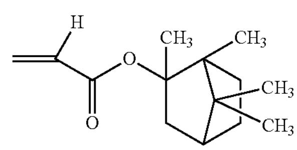
19
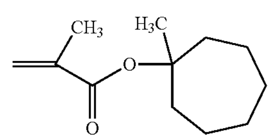
20
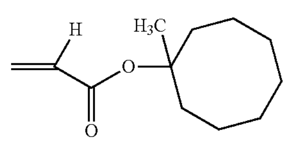
21
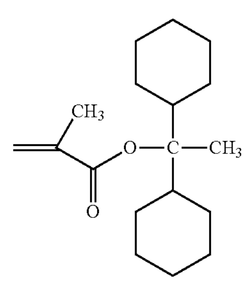

-continued
22
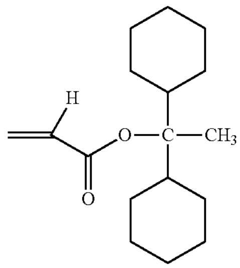
23
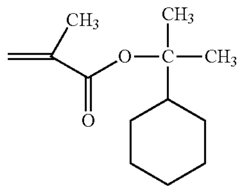
24
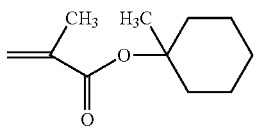
25
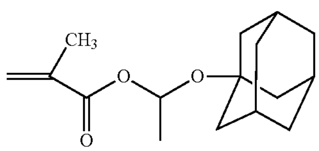
26
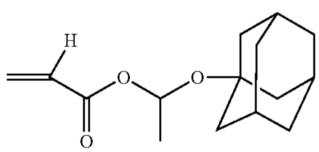
27
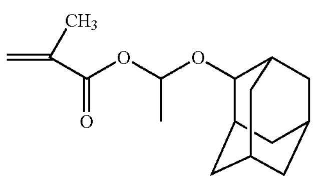
28
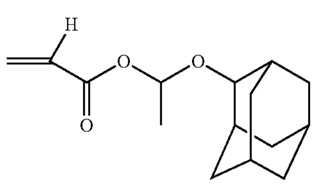
29
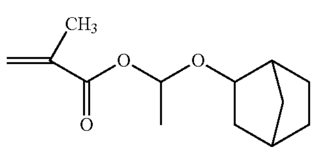
30
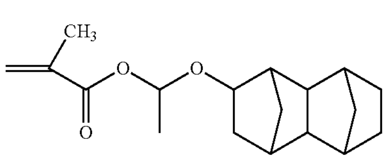
-continued
31
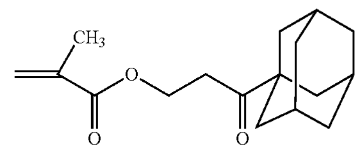
32
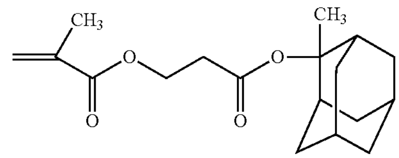
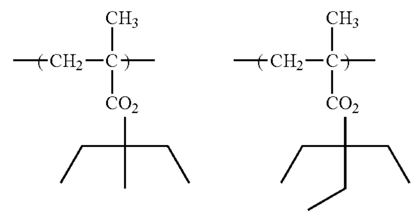
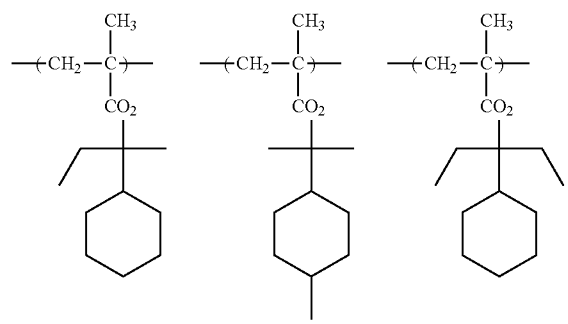
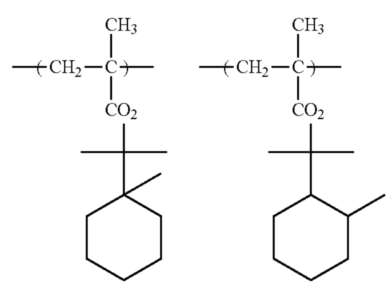
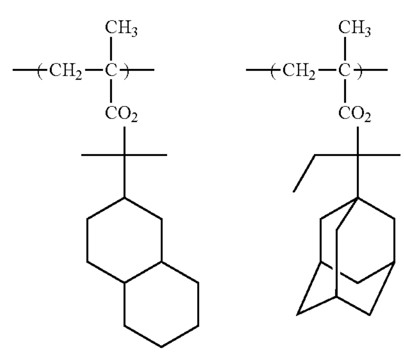

-continued

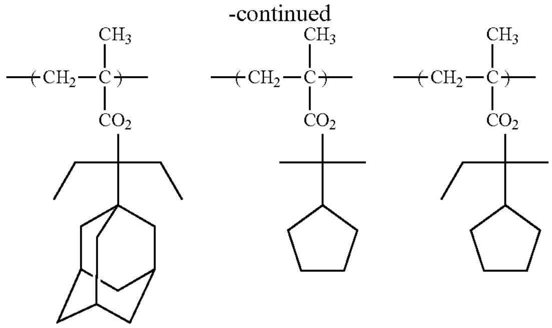

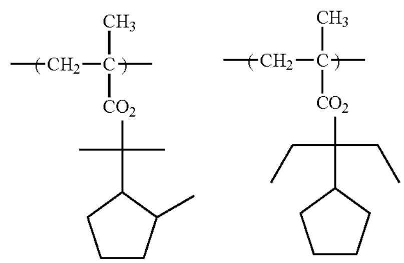

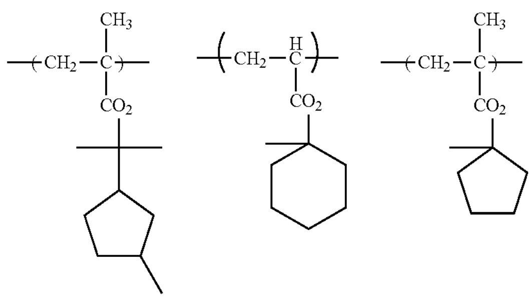

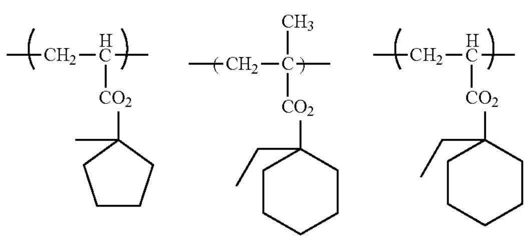

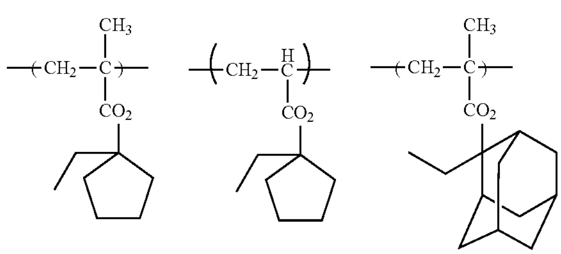

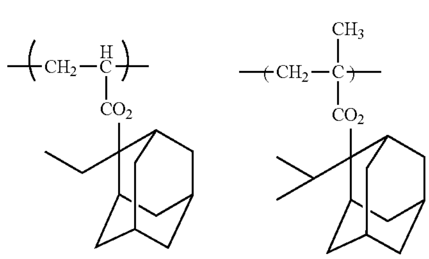

-continued

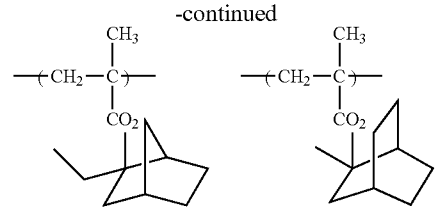

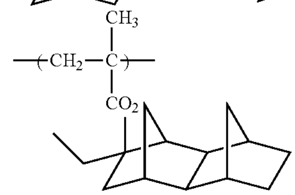

Next, the repeating unit represented by Formula (A3) will be described.

In Formula (A3), AR represents an aryl group.

Rn represents an alkyl group, a cycloalkyl group or an aryl group. Rn and AR may be bound with each other to form a non-aromatic ring.

$R_1$ represents a hydrogen atom, an alkyl group, a cycloalkyl group, a halogen atom, a cyano group or an alkyloxycarbonyl group.

The repeating unit represented by Formula (A3) will be described in detail.

AR represents an aryl group, as described above. The aryl group as AR is preferably an aryl group having 6 to 20 carbon atoms such as a phenyl group, a naphthyl group, an anthryl group or a fluorene group, and more preferably an aryl group having 6 to 15.

In the case where AR is a naphthyl group, an anthryl group or a fluorene group, there is no particular limitation on the bonding position of the carbon atom bound to Rn and AR. For example, when AR is a naphthyl group, the carbon atom may be bound at the α-position of the naphthyl group, or at the β-position. Or, when AR is an anthryl group, the carbon atom may be bound at the 1-position of the anthryl group, or at the 2-position, or at the 9-position.

The aryl group as AR may have one or more substituents. Specific examples of the substituent may include a straight or branched alkyl group having 1 to 20 carbon atoms such as a methyl group, an ethyl group, a propyl group, an isopropyl group, a n-butyl group, an isobutyl group, a t-butyl group, a pentyl group, a hexyl group, an octyl group and a dodecyl group, an alkoxy group containing the alkyl group moiety, a cylcoalkyl group such as a cyclopentyl group and a cyclohexyl group, a cycloalkoxy group containing the cycloalkyl group, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, thiophenecarbonyloxy group, thiophenemethylcarbonyloxy group and a heterocyclic residue structure such as a pyrrolidone residue structure. The substituent is preferably a straight or branched alkyl group having 1 to 5 carbon atoms or an alkoxy group containing the alkyl group, and more preferably a para-methyl group or a para-methoxy group.

In the case where the aryl group as AR has a plurality of substituents, at least two of the plurality of substituents may be bound with each other to form a ring. The ring is preferably a 5- to 8-membered ring, and more preferably 5- or 6-membered ring. Further, the ring may be a heterocyclic ring containing a heteroatom such as an oxygen atom, a nitrogen atom or a sulfur atom in the ring members.

Further, the ring may have a substituent. The substituent may be exemplified by those described below with respect to the further substituent which may be possessed by Rn.

Further, it is preferred that the repeating unit represented by Formula (A3) contains two or more aromatic rings from the viewpoint of the roughness performance. Generally, the number of the aromatic rings possessed by the repeating unit is preferably 5 or less, and more preferably 3 or less.

Further, in the repeating unit represented by Formula (A3), from the viewpoint of the roughness performance, it is more preferred that AR contains two or more aromatic rings, and more preferred that AR is a naphthyl group or a biphenyl group. Generally, the number of the aromatic rings possessed by AR is preferably 5 or less, and more preferably 3 or less.

Rn represents an alkyl group, a cycloalkyl group or aryl group, as described above.

The alkyl group of Rn may be either a straight alkyl group or a branched alkyl group. Examples of the alkyl group may include preferably an alkyl group having 1 to 20 carbon atoms such as a methyl group, an ethyl group, a propyl group, an isopropyl group, a n-butyl group, an isobutyl group, a t-butyl group, a pentyl group, a hexyl group, a cyclohexyl group, an octyl group and a dodecyl group. The alkyl group of R″ is preferably an alkyl group having 1 to 5 carbon atoms, and more preferably an alkyl group having 1 to 3 carbon atoms.

Examples of the cycloalkyl group or Rn may include a cycloalkyl group having 3 to 15 carbon atoms such as a cyclopentyl group and a cyclohexyl group.

Examples of the aryl group of Rn may include an aryl group having 6 to 14 carbon atoms such as a phenyl group, a xylyl group, a toluoyl group, a cumenyl group, a naphthyl group and an anthryl group.

Each of the alkyl group, the cycloalkyl group and the aryl group as Rn may further have a substituent. Example of the substituent may include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group and a heterocyclic residue structure such as a pyrrolidone residue structure. Among them, an alkoxy group, a hydroxyl group, a halogen atom, a nitro group, an acyl group, an acyloxy group, an acylamino group and a sulfonylamino group are particularly preferred.

$R_1$ represents a hydrogen atom, an alkyl group, a cycloalkyl group, a halogen atom, a cyano group or an alkyloxycarbonyl group, as described above.

The alkyl group and the cycloalkyl group as $R_1$ may be exemplified by those described above with respect to Rn. Each of the alkyl group and the cycloalkyl group may have a substituent. The substituent may be exemplified by those described above with respect to Rn.

In the case where $R_1$ is an alkyl group or a cycloalkyl group having a substituent, particularly preferred examples of R may include a trifluoromethyl group, an alkyloxycarbonylmethyl group, an alkylcarbonyloxymethyl group, a hydroxymethyl group and an alkoxymethyl group.

Examples of the halogen atom of $R_1$ may include a fluorine atom, a chlorine atom, a bromine atom and an iodine atom. Among them, a fluorine atom is particularly preferred.

As the alkyl group moiety contained in the alkyloxycarbonyl group of $R_1$, for example, the constitution exemplified above as the alkyl group of $R_1$ may be adapted.

It is preferred that Rn and AR are bound with each other to form a non-aromatic ring, and as a result, especially the roughness performance can be enhanced.

The non-aromatic ring which Rn and AR may be bound with each other to form is preferably a 5- to 8-membered ring, and more preferably 5- or 6-membered ring.

The non-aromatic ring may be either an aliphatic ring or a heterocyclic ring containing a heteroatom such as an oxygen atom, a nitrogen atom and a sulfur atom as a ring member.

The non-aromatic ring may have a substituent. The substituent may be exemplified by those described above with respect to the further substituent which may be possessed by Rn.

Specific examples of the repeating unit represented by Formula (A3) are shown below, but are not limited thereto.

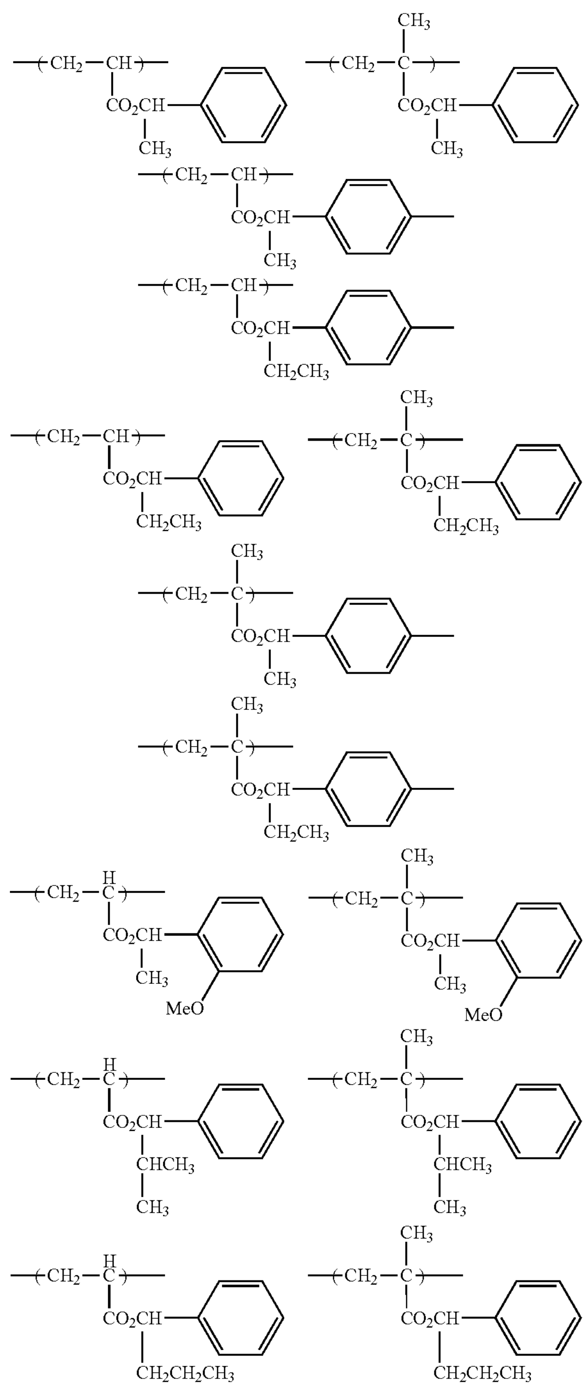

-continued
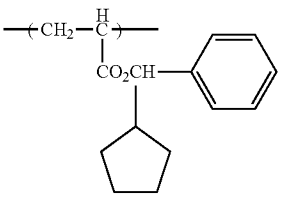
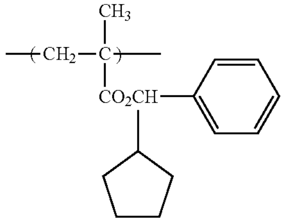
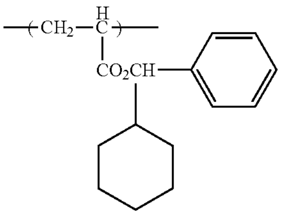
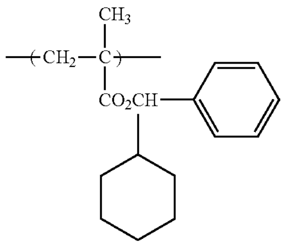
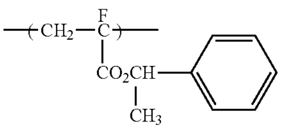
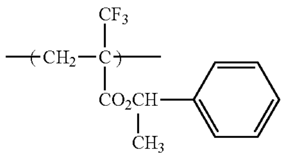
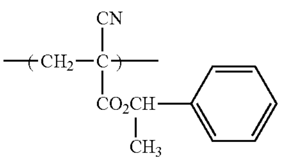
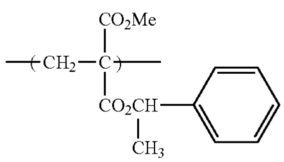
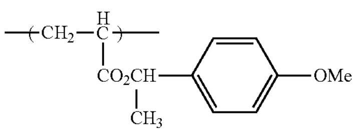
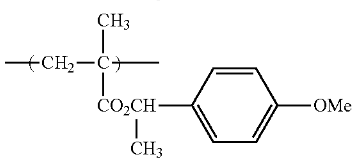
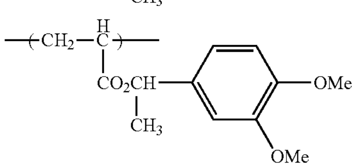
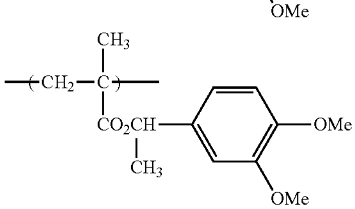
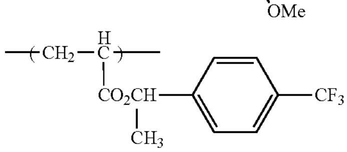
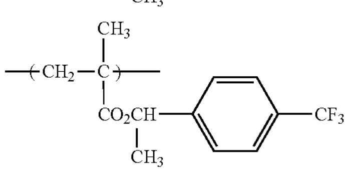
-continued
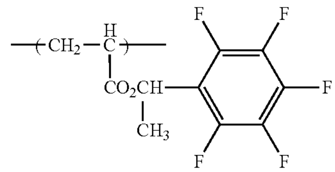
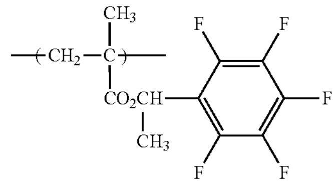
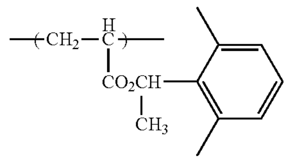
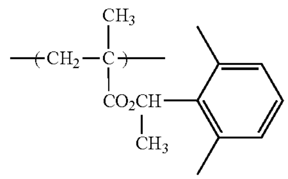
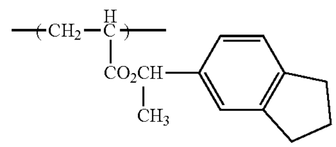
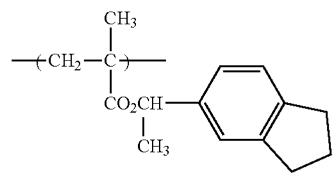
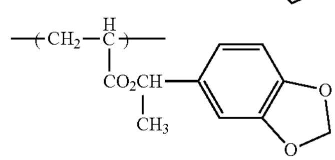
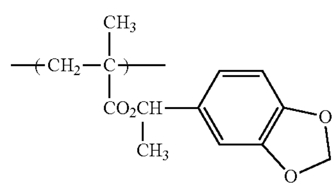
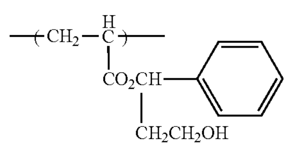
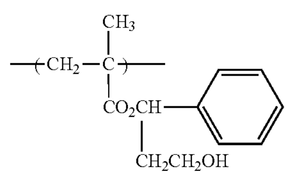
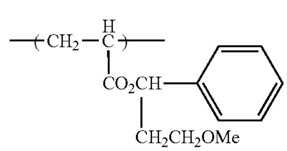
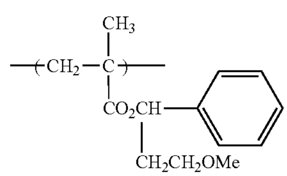
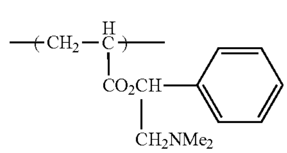
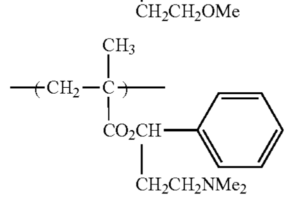

-continued
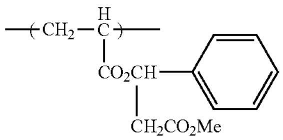
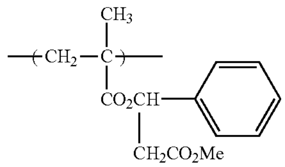
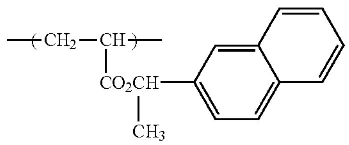
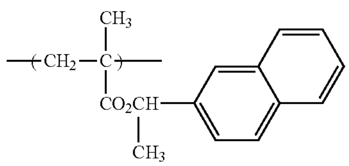
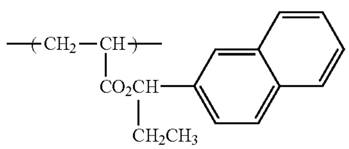
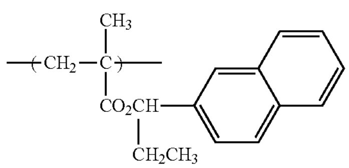
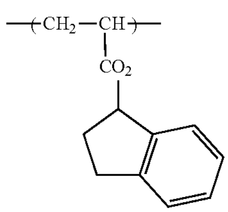
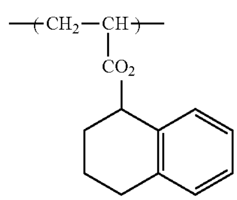
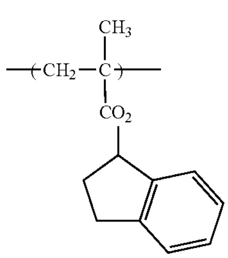
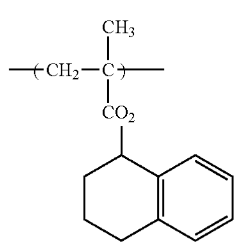
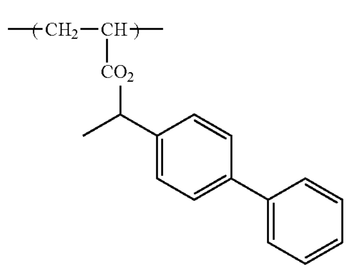
-continued
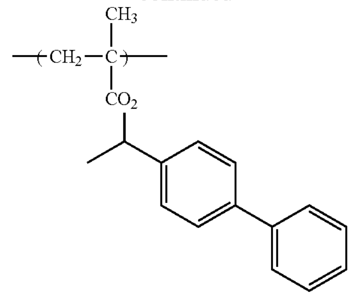
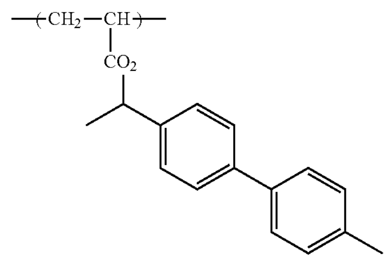
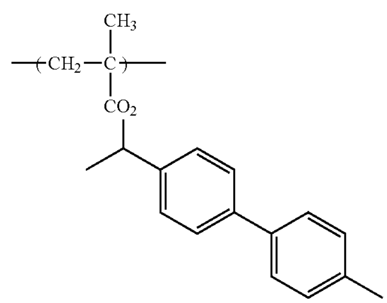
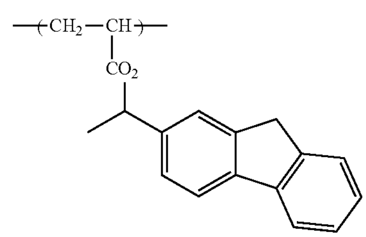
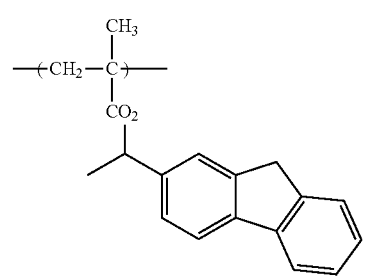
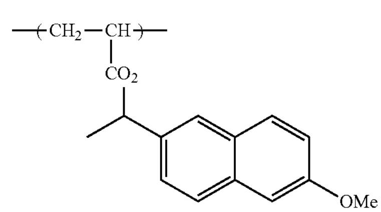

-continued
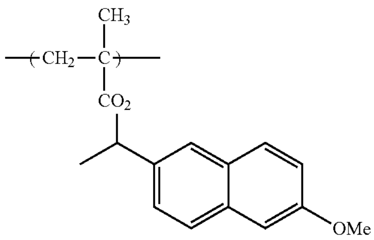
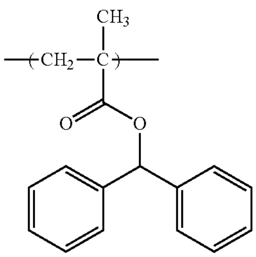
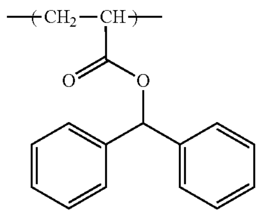
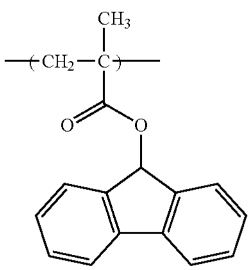
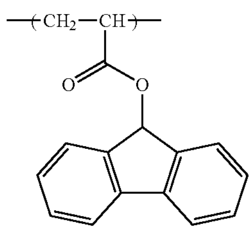
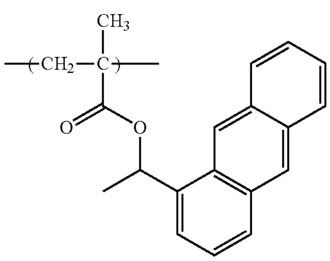
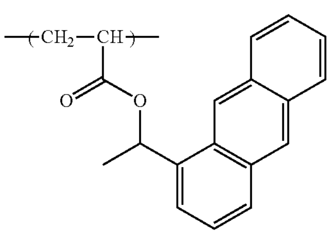
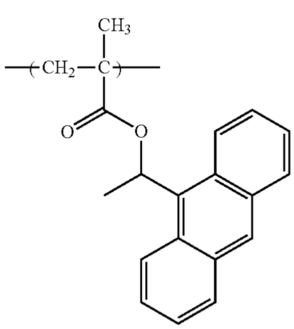
-continued
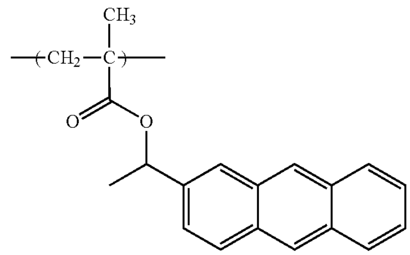
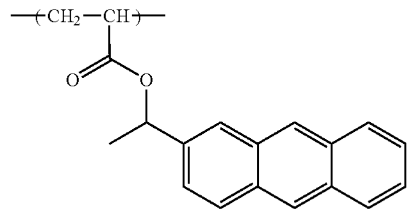
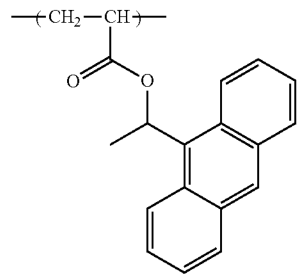
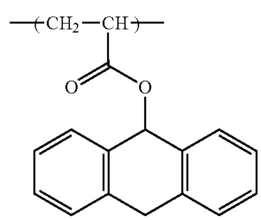
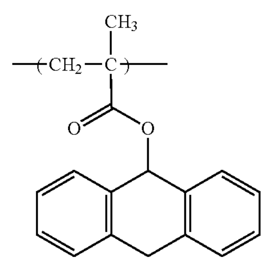
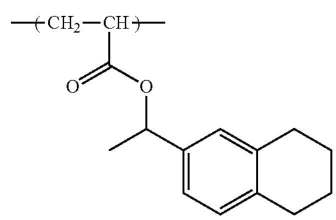
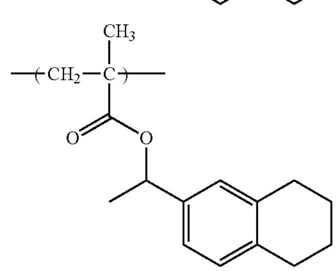
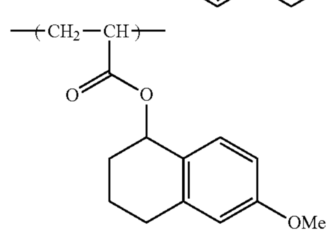

-continued

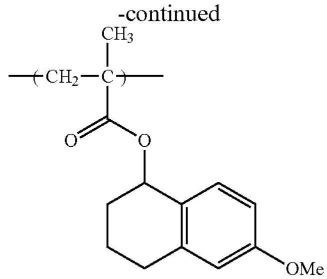

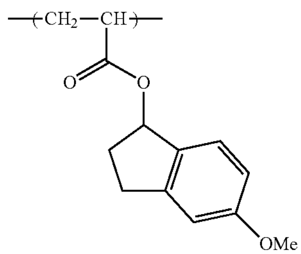

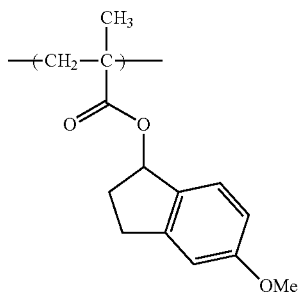

The resin (P) may or may not contain the repeating unit represented by (A1), (A2) or (A3), but in the case of containing the repeating unit, the repeating unit represented by Formula (A1), (A2) or (A3) is preferably in a range of 1 mol % to 50 mol %, more preferably in a range of 1 mol % to 40 mol %, and particularly preferably in a range of 1 mol % to 30 mol % based on the total repeating units of the resin (P).

The resin (P) may further contain a non-decomposable repeating unit represented by the following Formula (3).

(3)

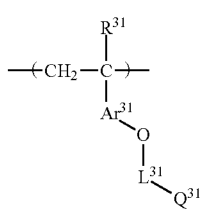

$R^{31}$ represents a hydrogen atom or a methyl group.

$Ar^{31}$ represents an arylene group.

$L^{31}$ represents a single bond or a divalent linking group.

$Q^{31}$ represents a cycloalkyl group or an aryl group.

Herein, "non-composable" means not causing a cleavage of a chemical bond by the action of an acid generated by exposure or an alkali developer.

$R^{31}$ is a hydrogen atom or a methyl group, as described above, and preferably a hydrogen atom. $Ar^{31}$ represents an arylene group, as described above, and specific examples and preferred ranges are the same as the specific examples and the preferred ranges of the arylene group in the case where Ar in Formula (2) is an arylene group.

Examples of the divalent linking group of $L^{31}$ may include an alkylene group, an alkenylene group, —O—, —CO—, —$NR^{32}$—, —S—, —CS— and a combination thereof. Herein, $R^{32}$ represents a hydrogen atom, an alkyl group, a cycloalkyl group, an aryl group, an aralkyl group. The total carbon carbon number of the divalent organic group of $L^{31}$ is preferably 1 to 15, and more preferably 1 to 10.

The alkylene group is preferably an alkylene group having 1 to 8 carbon atoms, more preferably an alkylene group having 1 to 4 carbon atoms, and examples thereof may include a methylene group, an ethylene group, a propylene group, a butylene group, a hexylene group or an octylene group.

The alkenylene group is preferably an alkenylene group having 2 to 8 carbon atoms, and more preferably 2 to 4 carbon atoms.

Specific examples and preferred ranges of the alkyl group, the cycloalkyl group, the aryl group and the aralkyl group represented by $R^{32}$ are the same as the specific examples and the preferred ranges of the alkyl group, the cycloalkyl group, the aryl group, the aralkyl group represented by $R^{21}$ to $R^{23}$ in Formula (B).

The preferred group as $L^{31}$ is a carbonyl group, a methylene group, *—CO—$NR^{32}$—, *—CO—$(CH_2)_n$—O—, *—CO—$(CH_2)_n$—O—CO—, *-$(CH_2)_n$—COO—, *-$(CH_2)_n$—$CONR^{32}$— or *—CO—$(CH_2)_n$—$NR^{32}$—, particularly preferably a carbonyl group, a methylene group, *—CO—$NR^{32}$—, *—$CH_2$—COO—, *—CO—$CH_2$—O—, *—CO—$CH_2$—O—CO—, *—$CH_2$—$CONR^{32}$— or *—CO—$CH_2$—$NR^{32}$—, and especially preferably a carbonyl group, a methylene group, *—CO—$NR^{32}$— or *—$CH_2$—COO—. Herein, n represents an integer of 1 to 10, * represents a linking site to the main chain side, that is, a linking site to the O atom in the formula.

$Q^{31}$ represents a cycloalkyl group or aryl group, as described above, and may have a substituent, and specific examples and preferred ranges of the cycloalkyl group or the aryl group are the same as the specific examples and the preferred ranges of $Q^1$ in Formula (1).

Specific examples of the repeating unit represented by Formula (3), but the present invention is not limited thereto.

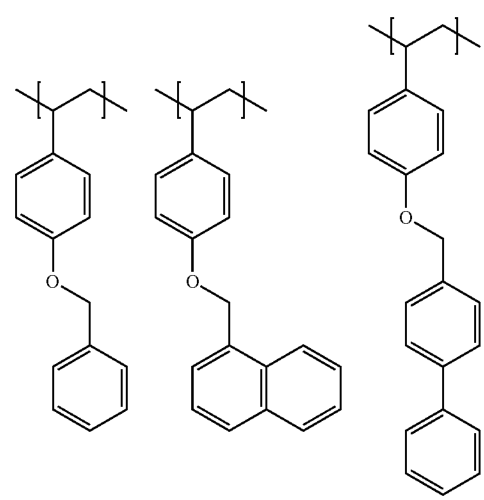

-continued
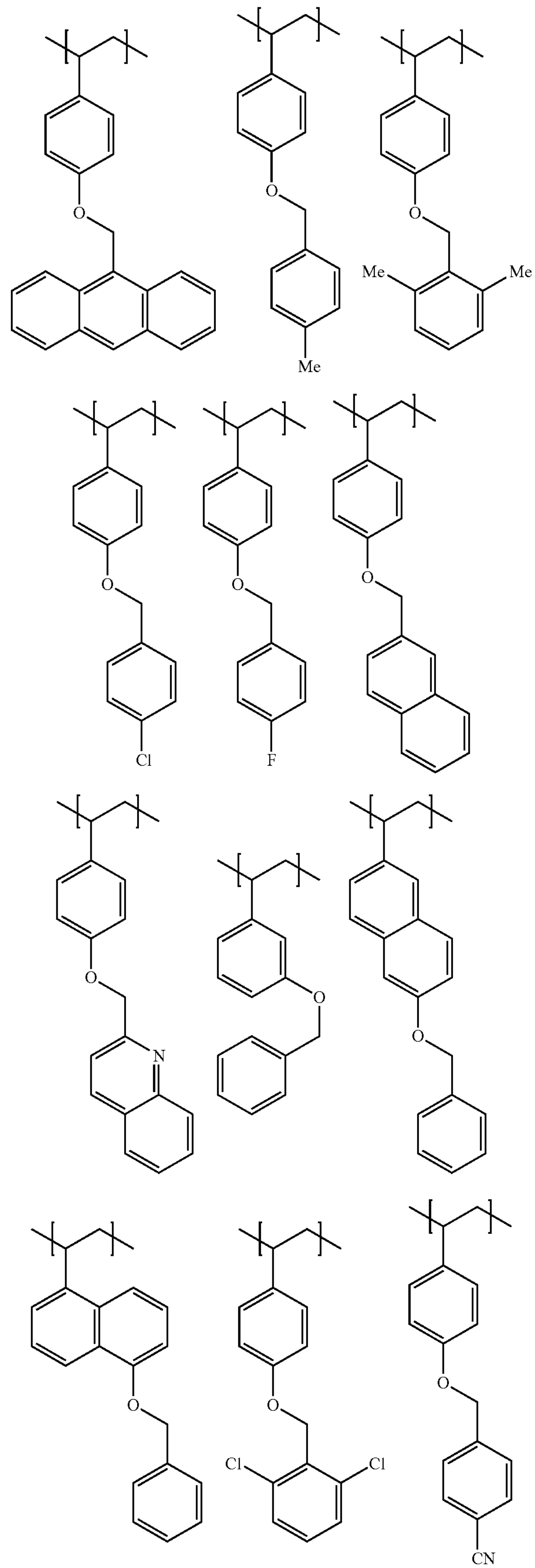
-continued
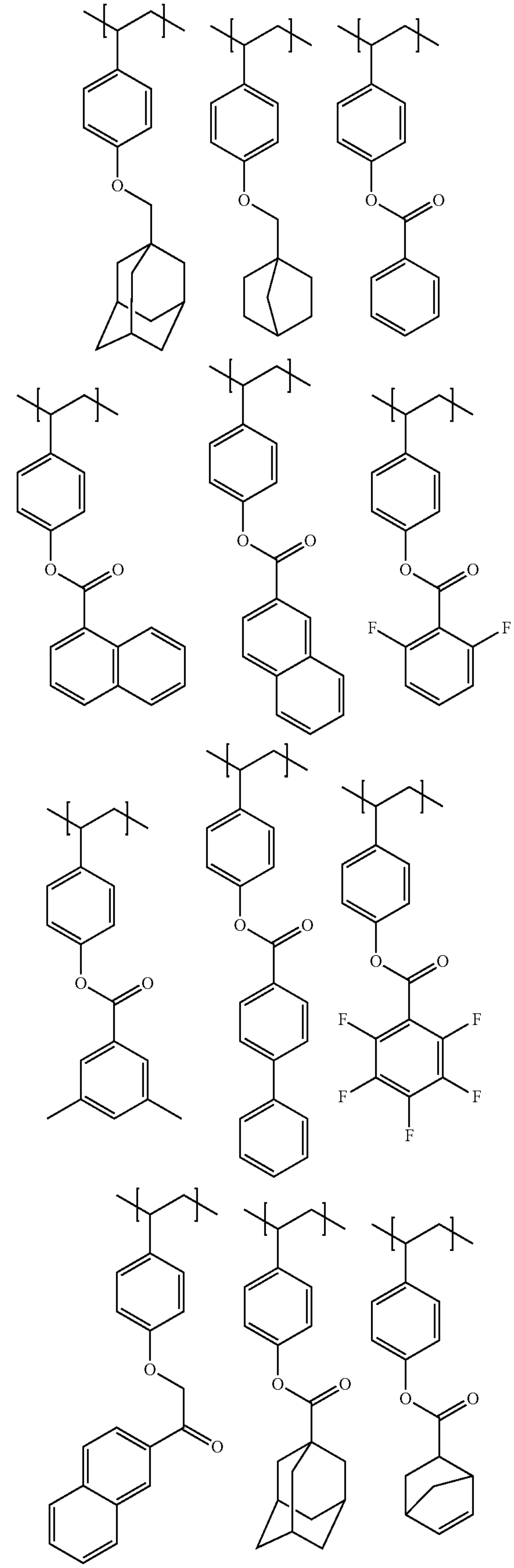

-continued

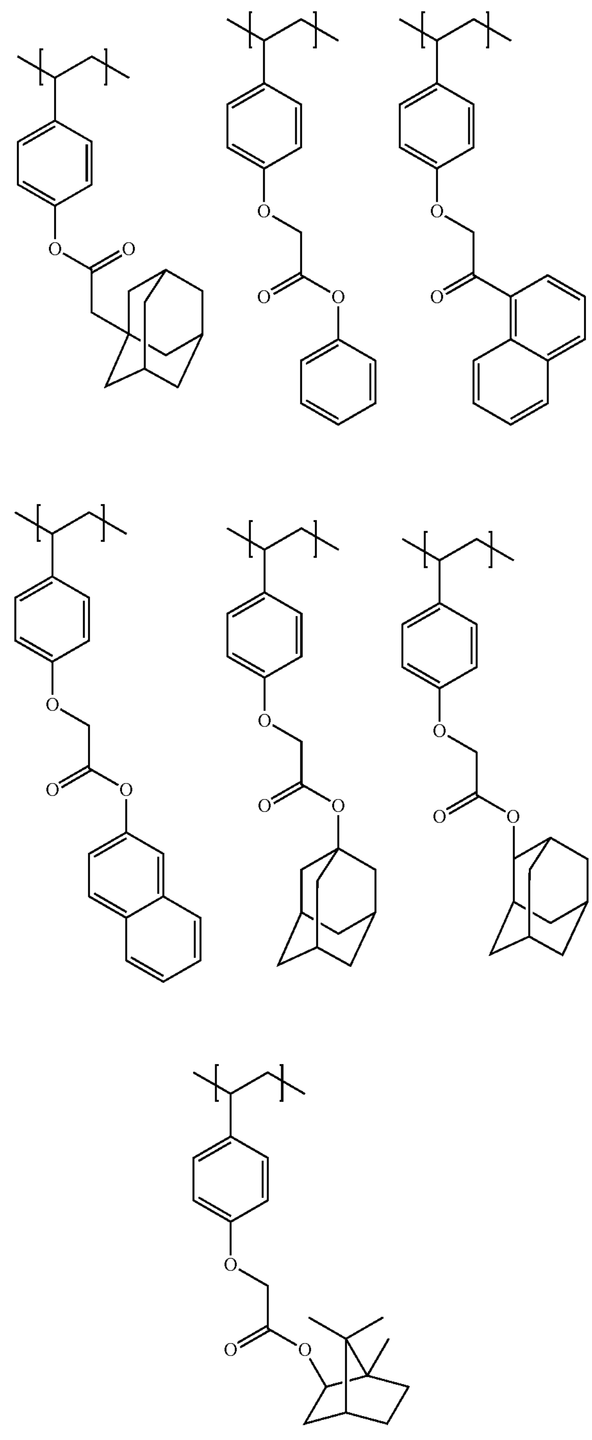

The content of the repeating unit represented by Formula (3) in the resin (P) is preferably in a range of 1 mol % to 30 mol %, more preferably 2 mol % to 20 mol %, and particularly preferably 2 mol % to 10 mol % based on the total repeating units in the resin (P).

The resin (P) of the present invention may further contain a repeating unit represented by the following Formula (4).

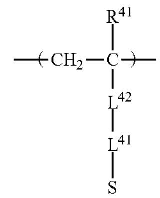

(4)

$R^{41}$ represents a hydrogen atom or a methyl group. $L^{41}$ represents a single bond or a divalent linking group. $L^{42}$ represents a divalent linking group. S represents a structure moiety capable of decomposing upon irradiation with an actinic ray or radiation to generate an acid at the side chain.

$R^{41}$ represents a hydrogen atom or a methyl group, as described above, and more preferably a hydrogen atom.

Examples of the divalent linking group as $L^{41}$ and $L^{42}$ may include an alkylene group, a cycloalkylene group, an arylene group, —O—, —$SO_2$—, —CO—, —N(R)—, —S—, —CS— and a combination of two or more thereof, and the total carbon number is preferably 20 or less. Herein, R represents an aryl group, an alkyl group or a cycloalkyl group.

The divalent linking group of $L^{42}$ is preferably an arylene group, and specific examples and preferred ranges thereof are the same as the specific examples and the preferred ranges of the arylene group in the case where Ar is an arylene group in Formula (A).

In the case where the resin (P) contains the repeating unit represented by Formula (4), at least one of, for example, the resolution, the roughness characteristic and the EL (exposure latitude) is further enhanced.

Examples of the alkylene group of $L^{41}$ and $L^{42}$ may include preferably an alkylene group having 1 to 12 carbon atoms such as a methylene group, an ethylene group, a propylene group, a butylene group, a hexylene group, an octylene group and a dodecanylene group.

Examples of the cycloalkylene group of $L^{41}$ and $L^{42}$ may include preferably a cycloalkylene group having 5 to 8 carbon atoms such as a cyclopentylene group and a cyclohexylene group.

Examples of the arylene of $L^{41}$ and $L^{42}$ may include preferably an arylen group having 6 to 14 carbon atoms such as a phenylene group and a naphthylene group.

The alkylene group, the cycloalkylene group and the arylene group may further have a substituent. Examples of the substituent may include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group.

S represents a structure moiety capable of decomposing upon irradiation with an actinic ray or radiation to generate an acid at the side chain.

S is preferably a structure moiety capable of decomposing upon irradiation with an actinic ray or radiation to generate an acid anion at the side chain of the resin, and more preferably a structure moiety possessed by a compound generating an acid by a known light used in a photo-initiator for cationic photopolymerization, a photo-initiator for radical photopolymerization, a photodecoloring agent for dyes, a photodiscoloring agent or a microresist, and the structure moiety is still more preferably an ionic structure moiety.

S is more preferably an ionic structure moiety containing a sulfonium salt or an iodonium salt. More particularly, S is preferably a group represented by the following Formula (PZI) or Formula (PZII).

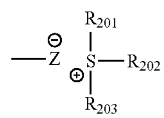

(PZI)

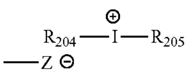

(PZII)

In Formula (PZI),

Each of $R_{201}$ to $R_{203}$ independently represents an organic group.

The carbon number of the organic group as $R_{201}$ to $R_{203}$ is generally 1 to 30, and preferably 1 to 20.

Further, two of $R_{201}$ to $R_{203}$ are bound to form a ring structure, and may contain an oxygen atom, a sulfur atom, an ester bond, an amide bond or a carbonyl group in the ring. Examples of the group which two of $R_{201}$ to $R_{203}$ bound to form may include an alkylene group (for example, a butylene group and a pentylene group). When using a ring structure which two of $R_{201}$ to $R_{203}$ bound to form, it is preferred in that suppression of contamination of an exposure apparatus by decomposition products upon exposure may be expected.

$Z^-$ represents an acid anion generated by decomposing upon irradiation with an actinic ray or radiation, and is preferably a non-nucleophilic anion. Examples of the non-nucleophilic anion as $Z^-$ may include a sulfonate anion, a carboxylate anion, a sulfonylimide anion, a bis(alkylsulfonyl) imide anion, a tris(alkylsulfonyl)methyl anion and the like.

The non-nucleophilic anion refers to an anion having a remarkably low ability to cause a nucleophilic reaction, and an anion capable of suppressing decomposition with the lapse of time by an intramolecular nucleophilic reaction. Accordingly, the stability of the resist composition over time can be enhanced.

Examples of the organic group of $R_{201}$ to $R_{203}$ may include an aryl group, an alkyl group, a cycloalkyl group, a cycloalkenyl group, an indolyl group and the like. Herein, in the cycloalkyl group and the cycloalkenyl group, at least one of carbon atoms forming a ring may be a carbonyl carbon.

It is preferred that at least one of $R_{201}$ to $R_{203}$ is an aryl group, and it is more preferred that all three are an aryl group.

The aryl group in $R_{201}$, $R_{202}$ and $R_{203}$ is preferably a phenyl group or a naphthyl group, and more preferably a phenyl group.

Examples of the alkyl group, the cycloalkyl group and the cycloalkenyl group in $R_{201}$, $R_{202}$ and $R_{203}$ may include preferably a straight or branched alkyl group having 1 to 10 carbon atoms (for example, a methyl group, an ethyl group, a propyl group, a butyl group and a pentyl group), a cycloalkyl group having 3 to 10 carbon atoms (for example, a cyclopentyl group, a cyclohexyl group and a norbornyl group), a cycloalkenyl group having 3 to 10 carbon atoms (for example, a pentadienyl group and a cyclohexenyl group).

The organic group such as an aryl group, an alkyl group, a cycloalkyl group, a cycloalkenyl group and an indolyl group as $R_{201}$, $R_{202}$ and $R_{203}$ may further have a substituent. Examples of the substituent may include a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an arylthio group (preferably having 6 to 14 carbon atoms), a hydroxyalkyl group (preferably having 1 to 15 carbon atoms), an alkylcarbonyl group (preferably having 2 to 15 carbon atoms), a cycloalkylcarbonyl group (preferably having 4 to 15 carbon atoms), an arylcarbonyl group (preferably having 7 to 14 carbon atoms), a cycloalkenyloxy group (preferably having 3 to 15 carbon atoms), a cycloalkenylalkyl group (preferably having 4 to 20 carbon atoms) and the like, but not limited thereto.

In the cycloalkyl group and the cycloalkenyl group as the substituent which may be possessed by each of the groups of $R_{201}$, $R_{202}$ and $R_{203}$, at least one of carbon atoms forming a ring may be a carbonyl carbon.

The substituent which may be possessed by each of the groups of $R_{201}$, $R_{202}$ and $R_{203}$ may further have a substituent, and examples of the further substituent may be exemplified by the above examples of the substituent which may be possessed by each of the groups of $R_{201}$, $R_{202}$ and $R_{203}$, but an alkyl group or a cycloalkyl group is preferred.

Preferred structures in the case where at least one of $R_{201}$ to $R_{203}$ is not an aryl group may include a cation structure such as compounds exemplified in paragraphs 0046 and 0047 of Japanese Patent Application Laid-Open No. 2004-233661 and paragraphs 0040 to 0046 of Japanese Patent Application Laid-Open No. 2003-35948, compounds exemplified as Formula (I-1) to Formula (I-70) in U.S. Patent Application Laid-Open No. 2003/0224288, and compounds exemplified as Formula (IA-1) to Formula (IA-54) and Formula (IB-1) to Formula (IB-24) of U.S. Patent Application Laid-Open No. 2003/0077540.

In Formula (PZII), each of $R_{204}$ and $R_{205}$ independently represents an aryl group, an alkyl group or a cycloalkyl group. The aryl group, the alkyl group and the cycloalkyl group are the same as the aryl group described as the aryl group, the alkyl group and the cycloalkyl group of $R_{201}$ to $R_{203}$ in the above-mentioned compound (PZI).

The aryl group of $R_{204}$, $R_{205}$ may be an aryl group having a heterocyclic structure having an oxygen atom, a nitrogen atom, a sulfur atom or the like. Examples of the aryl group having a heterocyclic structure may be a pyrrole residue structure (a group formed by removing one hydrogen atom from pyrrole), a furan residue structure (a group formed by removing one hydrogen atom from furan), a thiophene residue structure (a group formed by removing one hydrogen atom from thiophene), an indole residue structure (a group formed by removing one hydrogen atom from indole), a benzofuran residue structure (a group formed by removing one hydrogen atom from benzofuran), a benzothiophene residue structure (a group formed by removing one hydrogen atom from benzothiophene) and the like.

The aryl group, the alkyl group and the cycloalkyl group of $R_{204}$ and $R_{205}$ may have a substituent. The substituent may also be exemplified by those which may be possessed by the aryl group, the alkyl group and the cycloalkyl group of $R_{201}$ to $R_{203}$ in the above-mentioned compound (PZI).

$Z^-$ represents an acid anion generated by decomposing upon irradiation with an actinic ray or radiation, is preferably a non-nucleophilic anion, and may be exemplified by $Z^-$ in Formula (PZI).

Preferred specific examples of S are shown below, but not particularly limited thereto. Meanwhile, the symbol * represents a bonding to $L^{41}$.
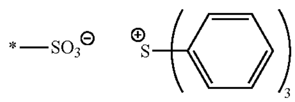
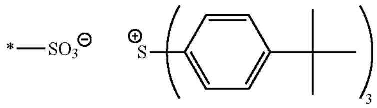
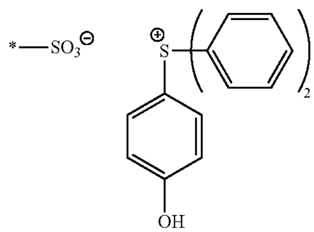
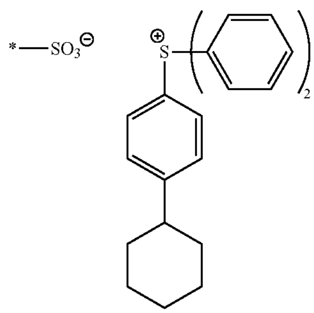
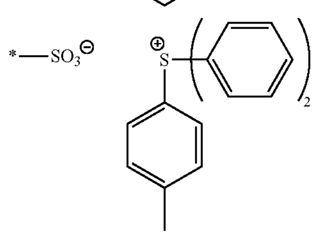
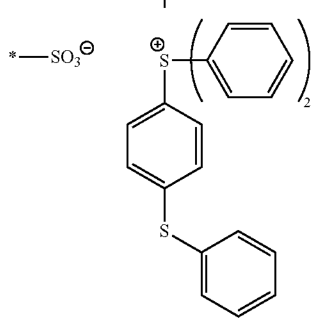
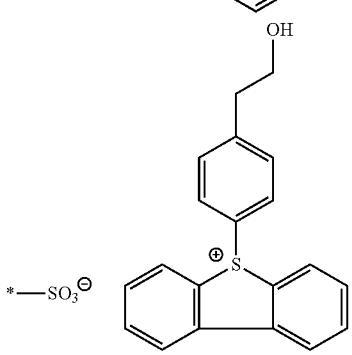
-continued
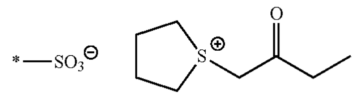
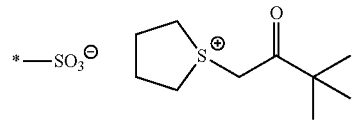
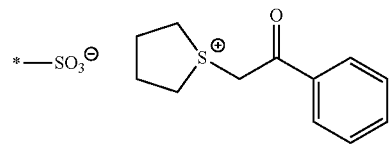
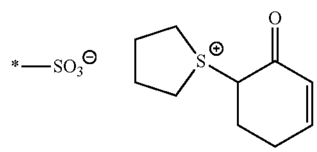
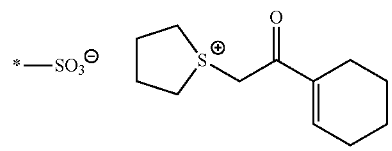
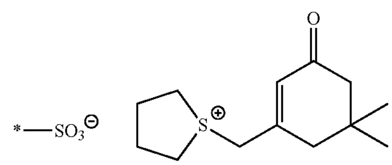
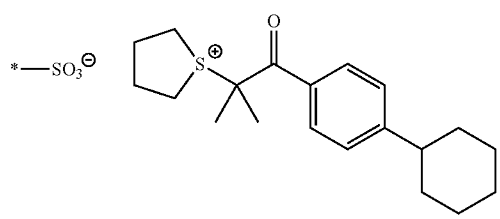
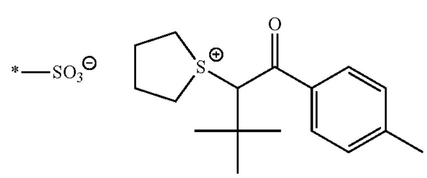
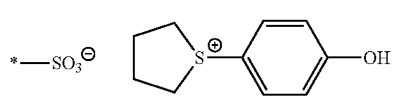
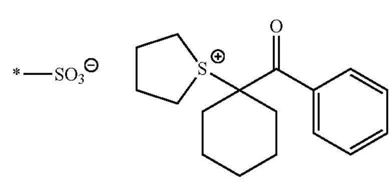
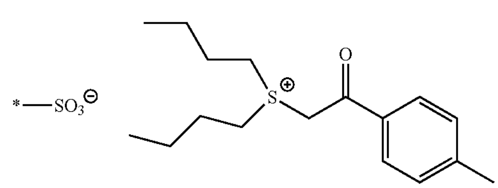

-continued
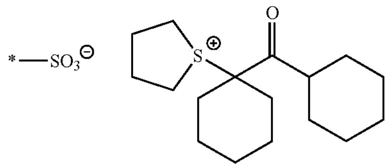
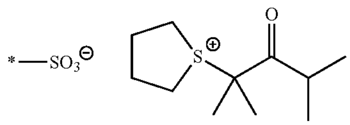
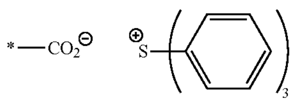
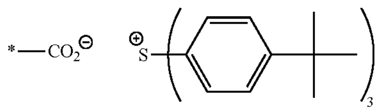
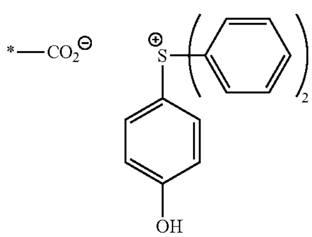
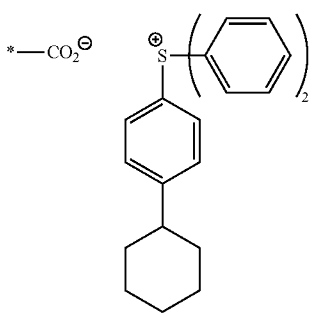
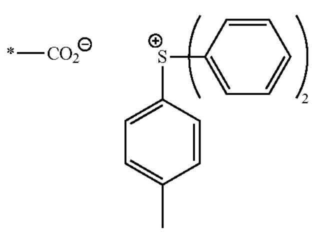
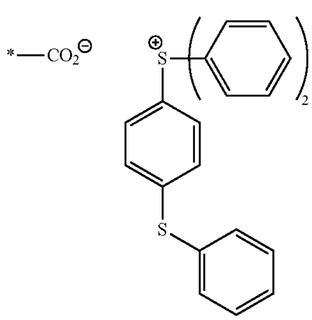
-continued
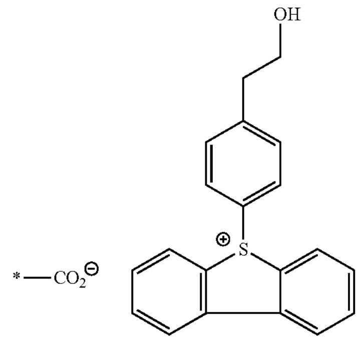
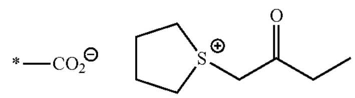
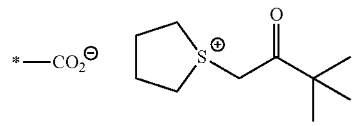
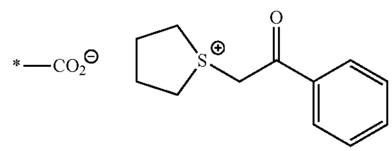
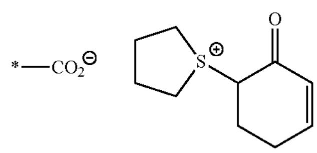
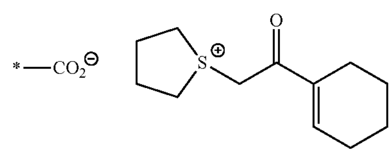
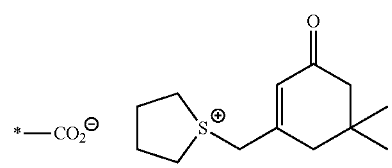
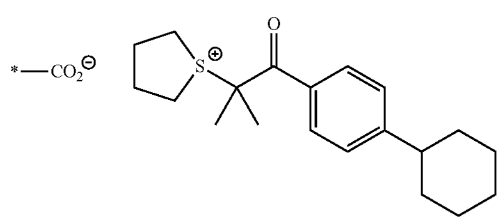
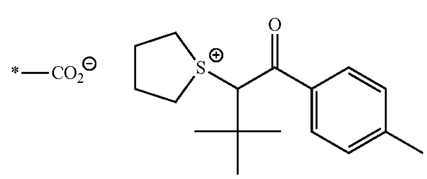
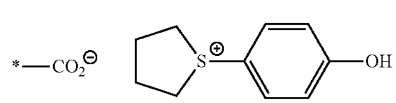

-continued
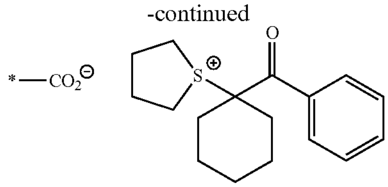
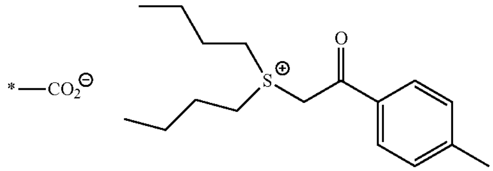
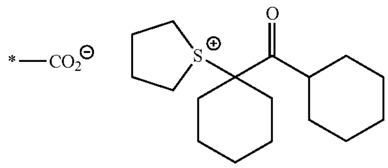
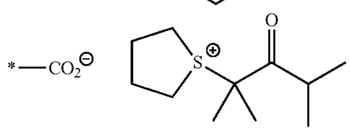
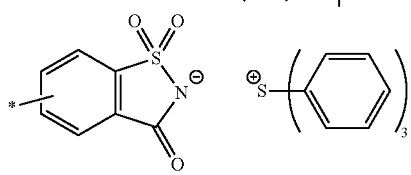
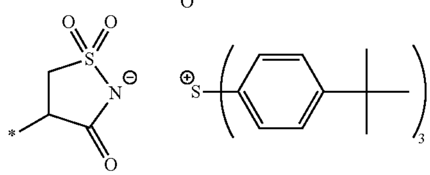
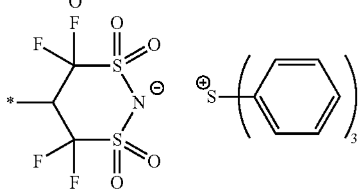
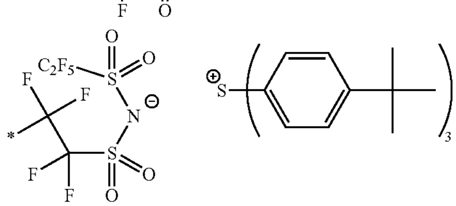
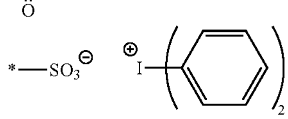
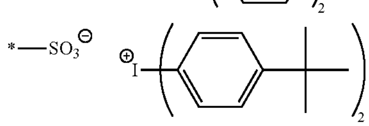
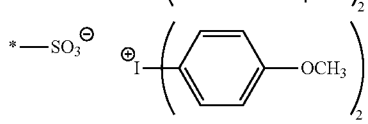
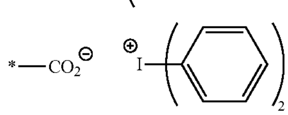
-continued
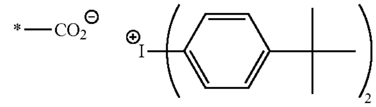
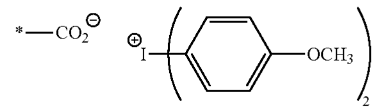
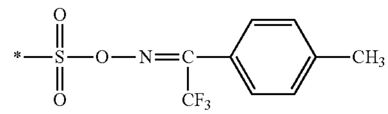
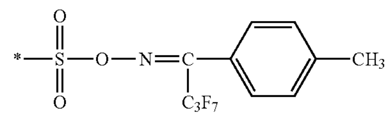
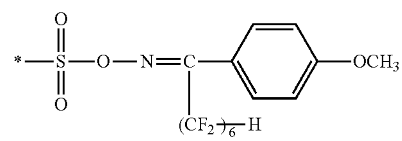
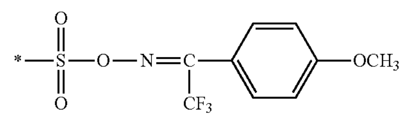
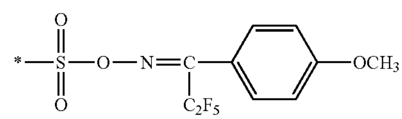
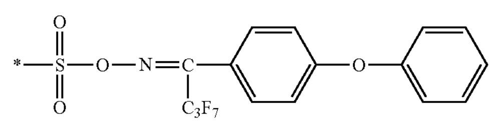
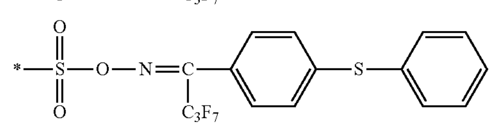
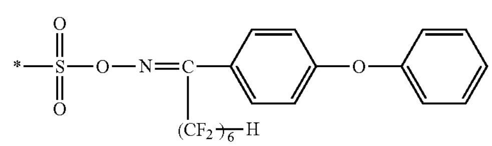
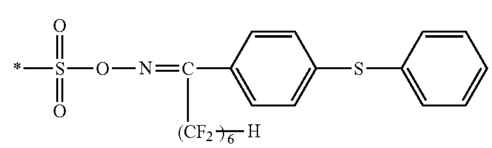
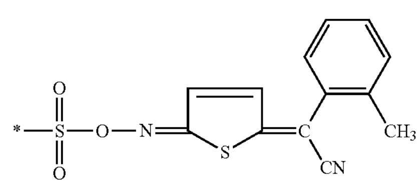
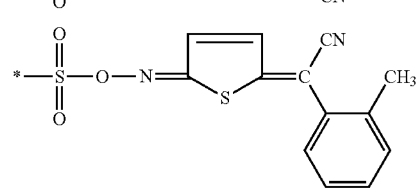

-continued

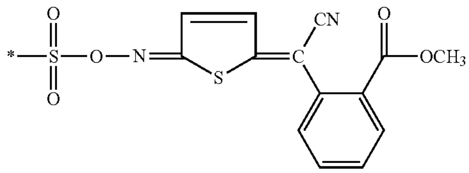

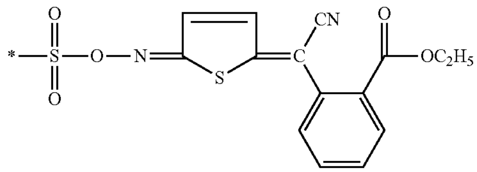

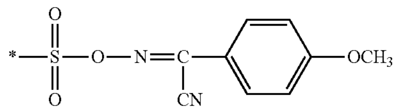

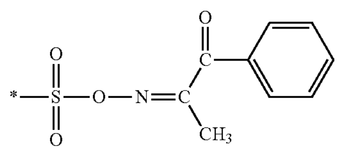

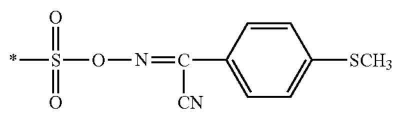

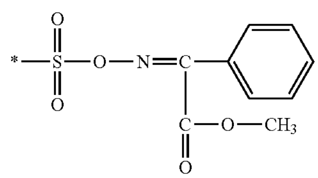

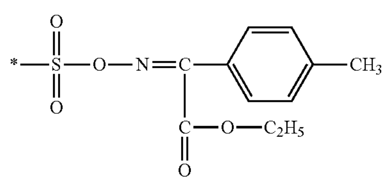

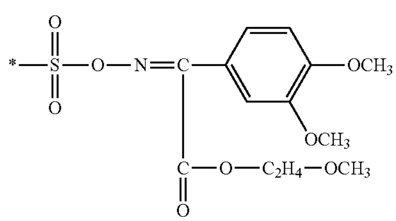

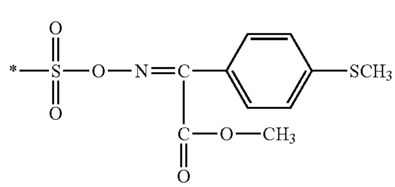

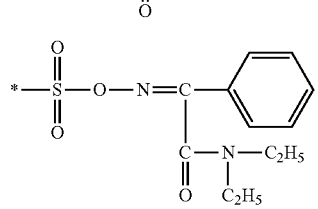

-continued

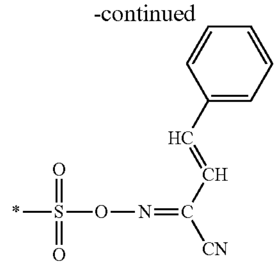

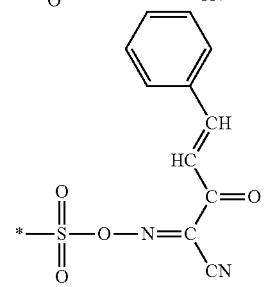

The moiety corresponding to ($-L^{41}-S$) of the repeating unit represented by Formula (4) is preferably represented by the following Formula (6).

(6)

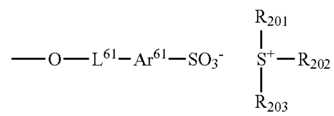

In the formula, $L^{61}$ represents a divalent linking group, and $Ar^{61}$ represents an arylene group. $R_{201}$, $R_{202}$ and $R_{203}$ have the same meaning as $R_{201}$, $R_{202}$ and $R_{203}$ in Formula (PZI), respectively.

Examples of the divalent linking group of $L^{61}$ may include an alkylene group, a cycloalkylene group, —O—, —$SO_2$—, —CO—, —N(R)—, —S—, —CS— and a combination thereof. Herein, R has the same meaning as R in $L^{41}$ of Formula (4). The total carbon number of the divalent linking group of $L^{61}$ is preferably 1 to 15, and more preferably 1 to 10.

The alkylene group and the cycloalkylene group of $L^{61}$ are the same as the alkylene group and the cycloalkylene group in $L^{41}$ of Formula (4), and preferred examples thereof are also the same.

The preferred group as $L^{61}$ is a carbonyl group, a methylene group, *—CO—$(CH_2)_n$—O—, *—CO—$(CH_2)_n$—O—CO—, *—$(CH_2)_n$—COO—, *—$(CH_2)_n$—CONR— or *—CO—$(CH_2)_n$—NR—, and particularly preferably a carbonyl group, *—$CH_2$—COO—, *—CO—$CH_2$—O—, *—CO—$CH_2$—O—CO—, *—$CH_2$—CONR— or *—CO—$CH_2$—NR—. Herein, n represents an integer of 1 to 10. n is preferably an integer of 1 to 6, more preferably an integer of 1 to 3, and most preferably 1. Further, * represents a linking site to the main chain side, that is, a linking site to the O atom in the formula.

$Ar^{61}$ represents an arylene group, and may have a substituent. Examples of the substituent which may be possessed by $Ar^{61}$ may include an alkyl group (preferably having 1 to 8 carbon atoms, and more preferably 1 to 4 carbon atoms), an alkoxy group (preferably having 1 to 8 carbon atoms, and more preferably 1 to 4 carbon atoms), a halogen atom (preferably a fluorine atom, a chlorine atom, a bromine atom and an iodine atom, and more preferably a fluorine atom). The aromatic ring of $Ar^{61}$ may be either an aromatic hydrocarbon ring (for example, a benzene ring and a naphthalene ring) or an aromatic heterocyclic ring (for example, a quinoline ring), and has preferably 6 to 18 carbon atoms, and more preferably 6 to 12 carbon atoms.

$Ar^{61}$ is preferably an unsubstituted or alkyl group- or fluorine atom-substituted arylene group, and more preferably a phenylene group or a naphthylene group.

Specific examples and preferred examples of $R_{201}$, $R_{202}$ and $R_{203}$ are the same as those described with respect to $R_{201}$, $R_{202}$ and $R_{203}$ in Formula (PZI).

A synthesis method of monomers corresponding to the repeating unit represented by Formula (4) is not particularly limited, but for example, in the case of an onium structure, a method of synthesizing by exchanging an acid anion having a polymerizable unsaturated bond corresponding to the repeating unit with a halide of a known onium salt may be used.

More specifically, a desired monomer corresponding to the repeating unit represented by Formula (4) can be synthesized by subjecting a metal ion salt (for example, a sodium ion, potassium ion and the like) or an ammonium salt (ammonium, a triethylammonium salt and the like) of an acid having a polymerizable unsaturated bond corresponding to the repeating unit and an onium salt having a halogen ion (a chloride ion, a bromide ion, an iodide ion and the like) to anionic exchange reaction with stirring in the presence of water or methanol, and liquid-separating and washing with an organic solvent such as dichloromethane, chloroform, ethyl acetate, methyl isobutyl ketone and teterahydroxyfuran, and water.

In addition, the monomer may be synthesized by subjecting to anionic exchange reaction with stirring in the presence of an organic solvent which is separable from water such as dichloromethane, chloroform, ethyl acetate, methyl isobutyl ketone and teterahydroxyfuran, and water, and then liquid-separating and washing with water.

The repeating unit represented by Formula (4) may also be synthesized by introducing an acid anion moiety into a side chain by polymerization, and introducing an onium salt by salt exchange.

Specific examples of the repeating unit represented by Formula (4) are shown below, but the present invention is not limited thereto.

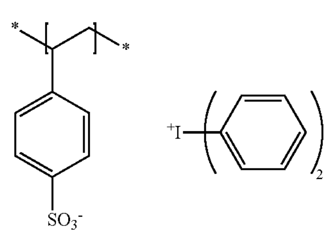

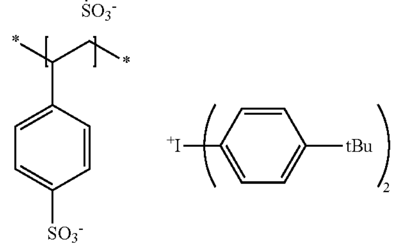

-continued

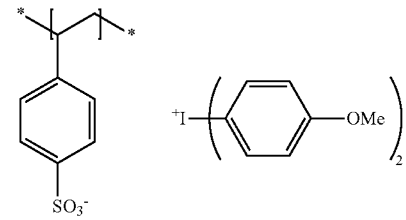

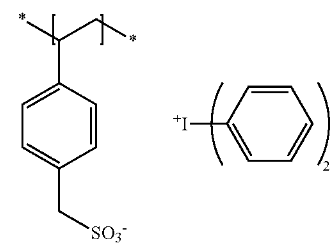

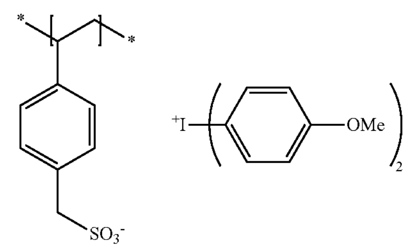

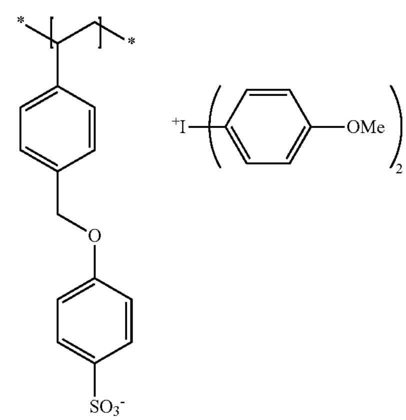

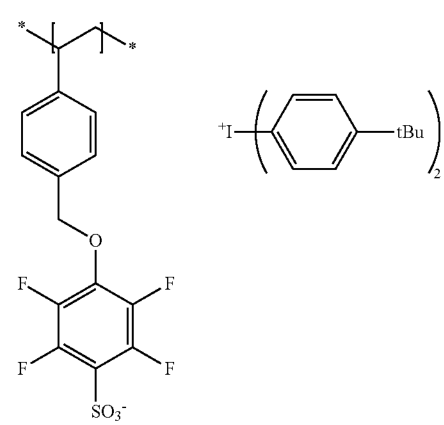

-continued
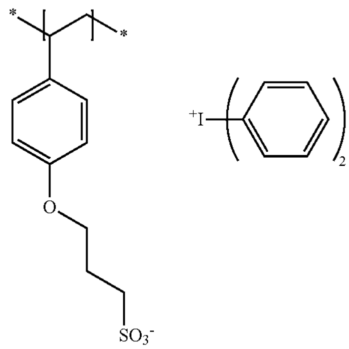
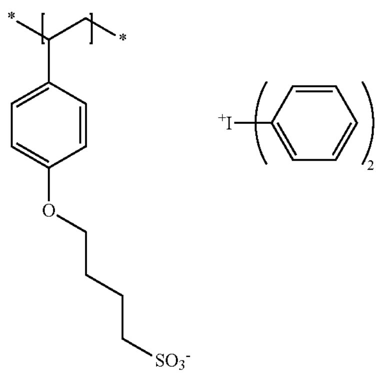
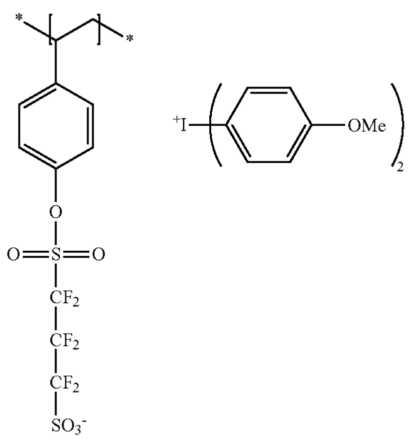
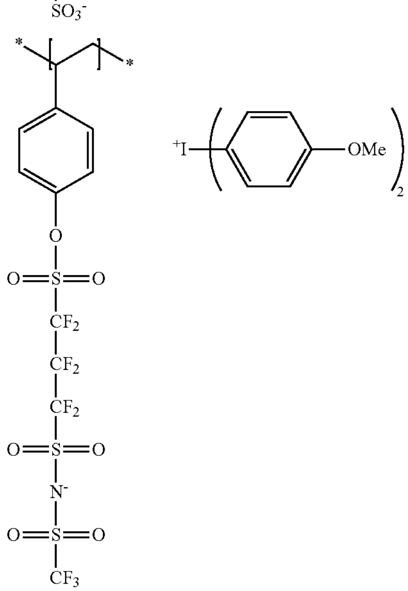
-continued
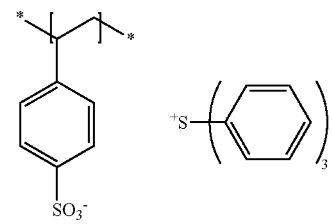
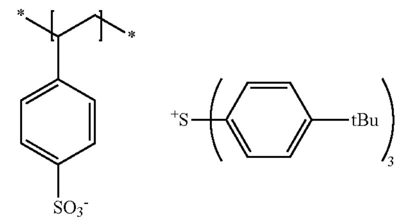
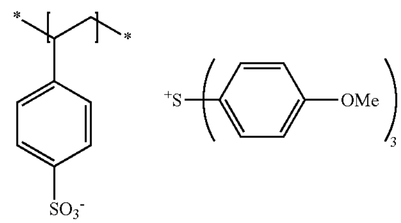
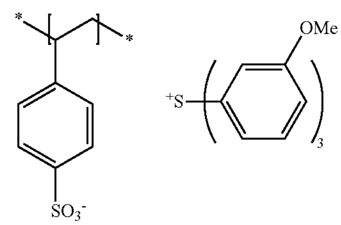
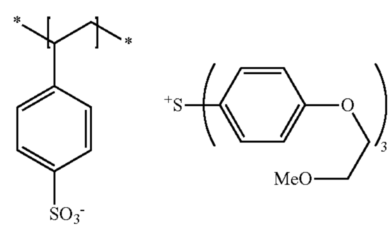
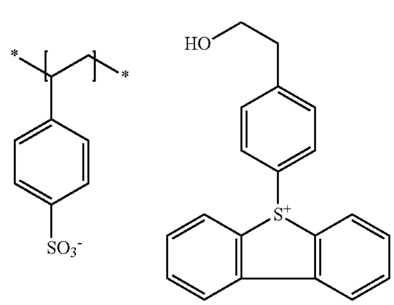
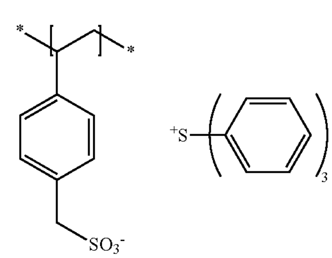

-continued
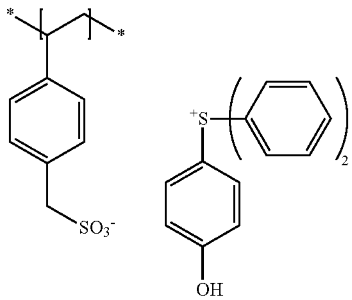
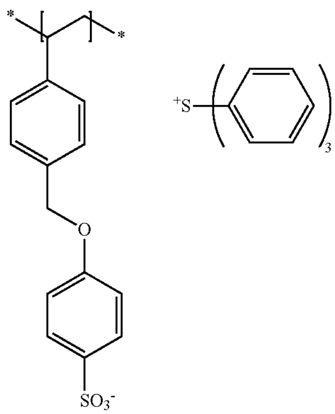
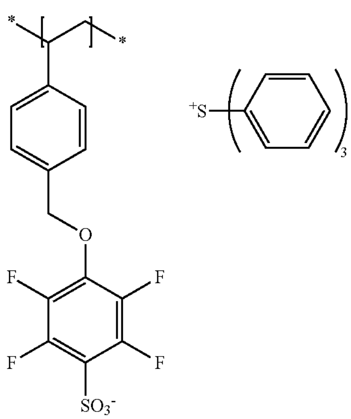
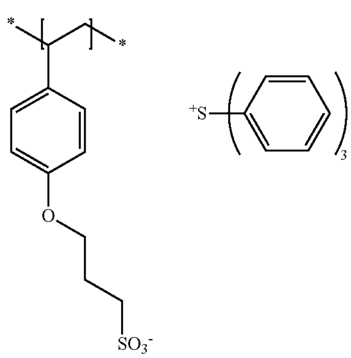
-continued
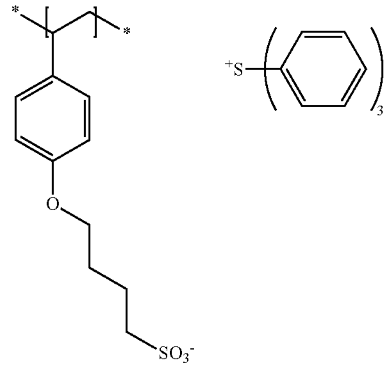
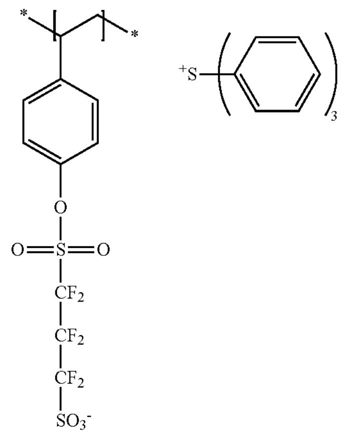
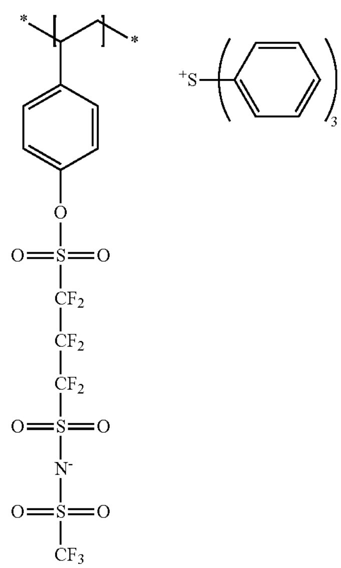
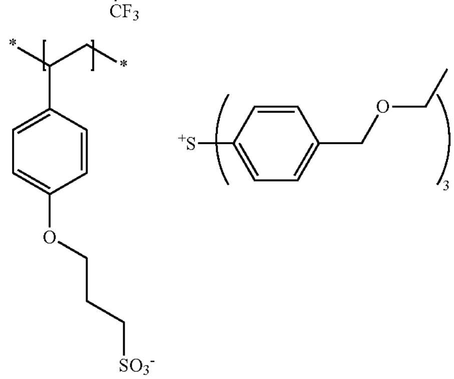

-continued
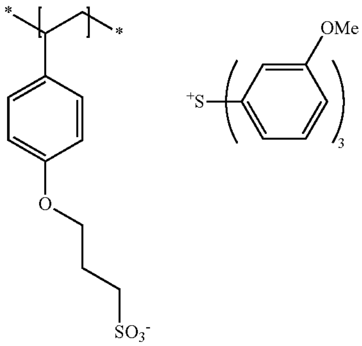
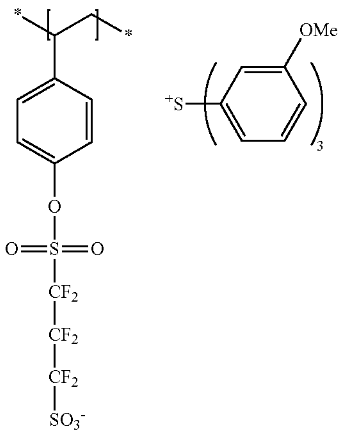
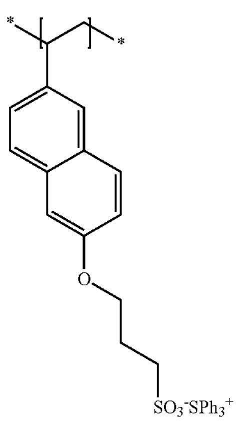
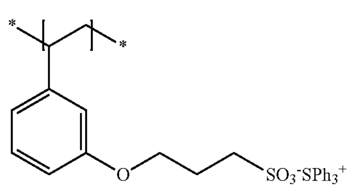
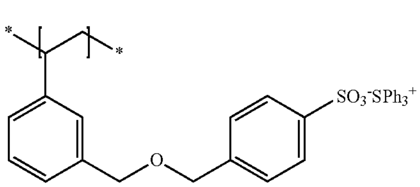
-continued
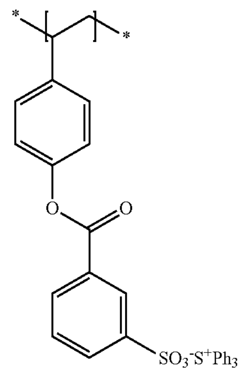
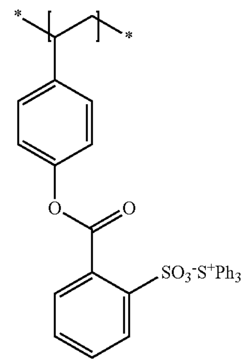
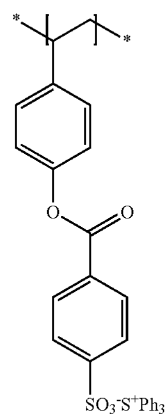
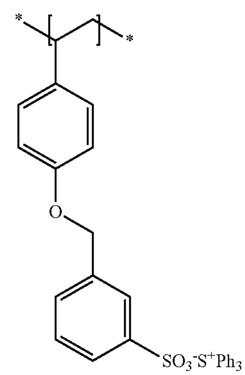
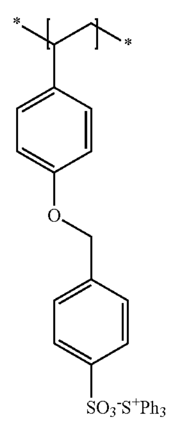
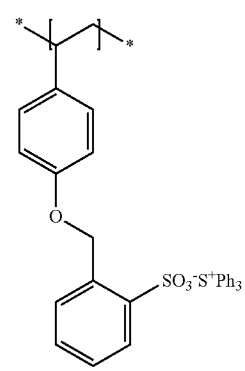
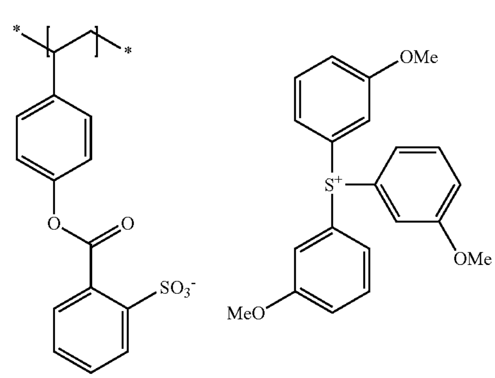

-continued
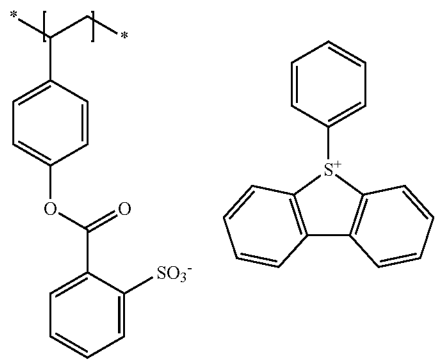
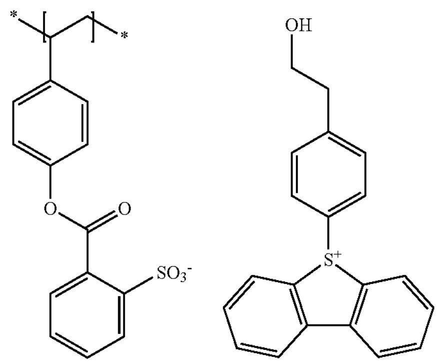
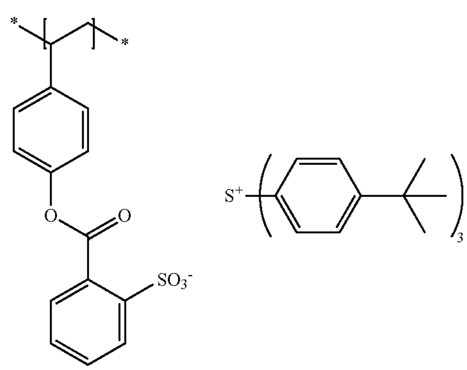
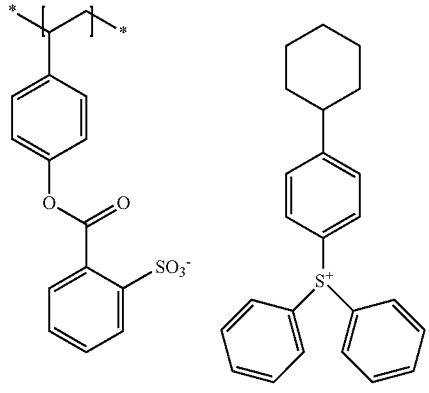
-continued
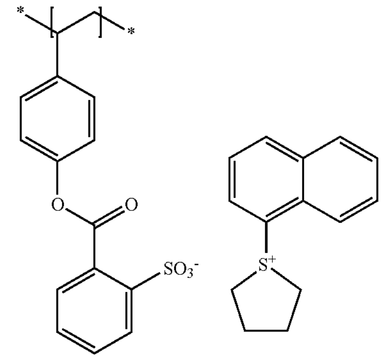
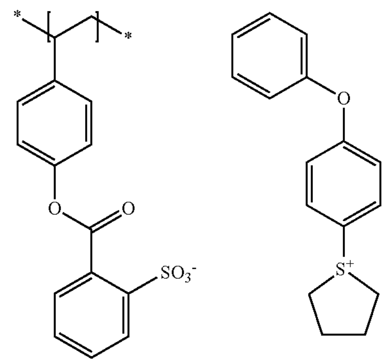
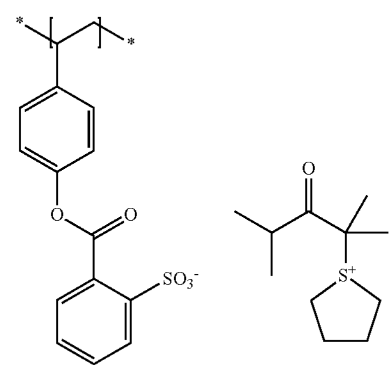
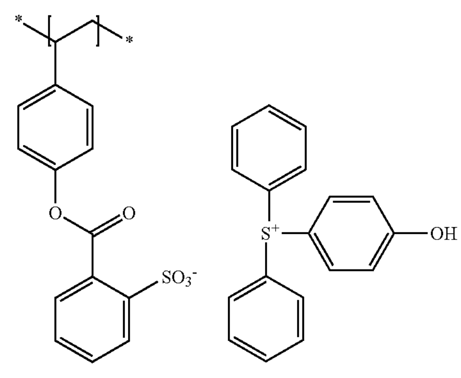

-continued
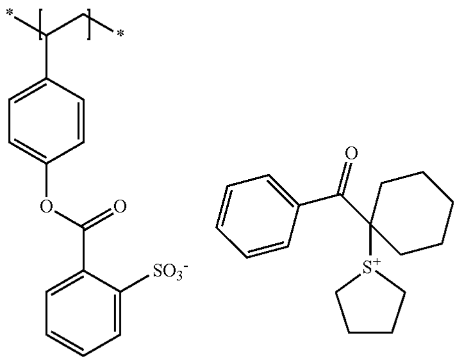
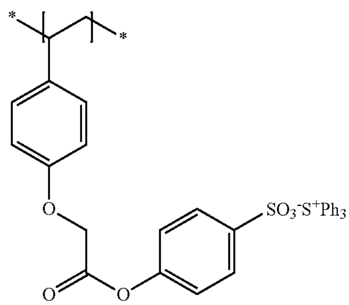
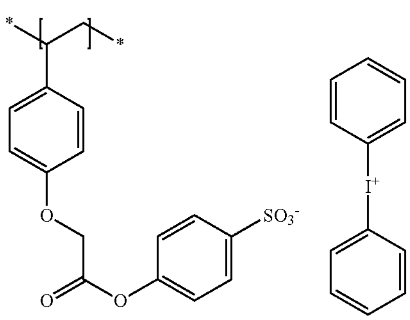
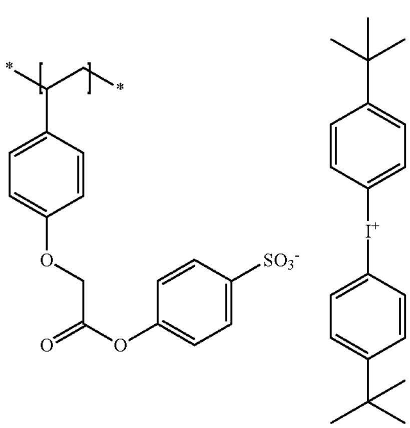
-continued
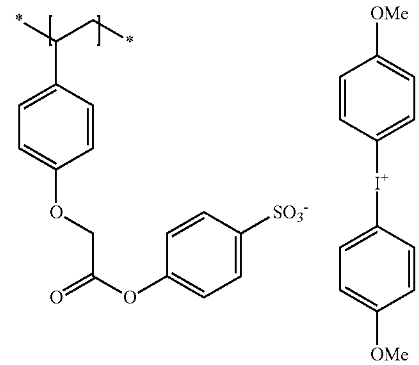
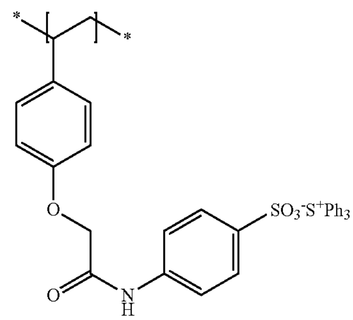
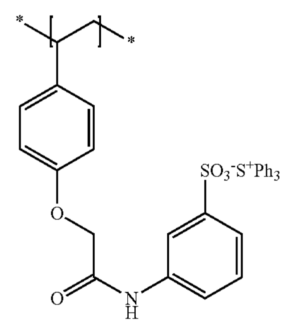
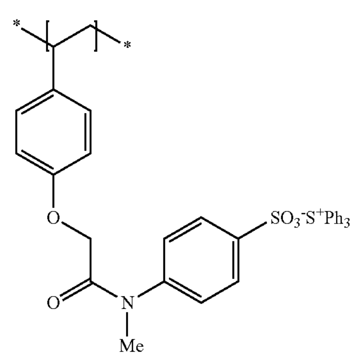

-continued
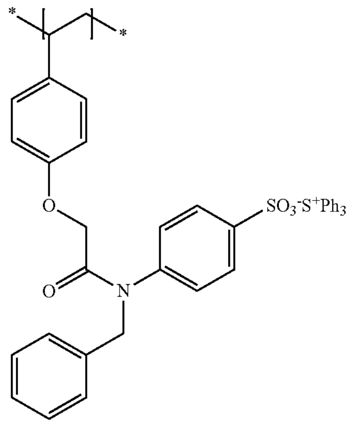
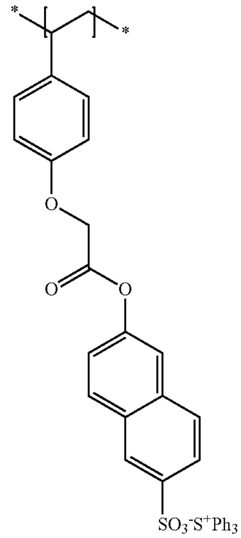
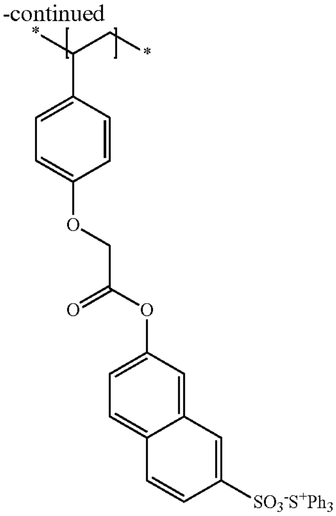
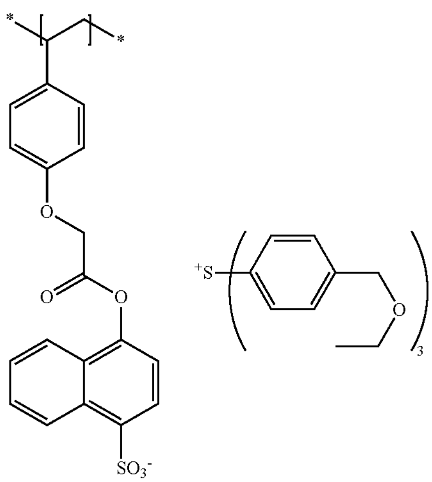
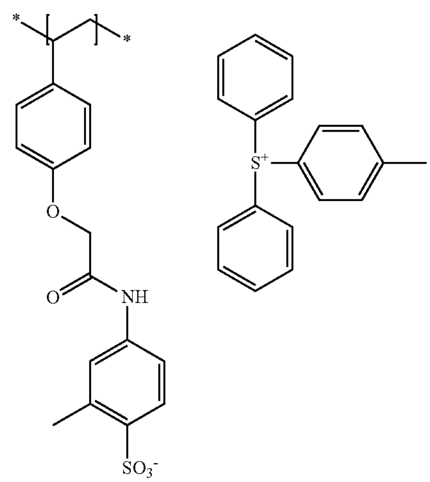
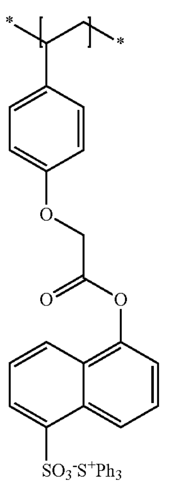
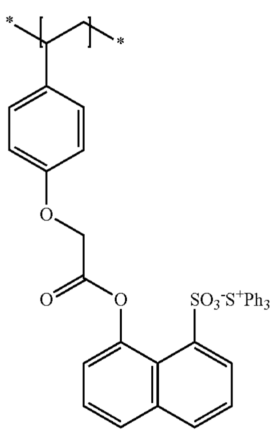
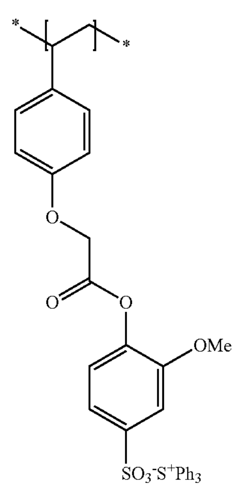
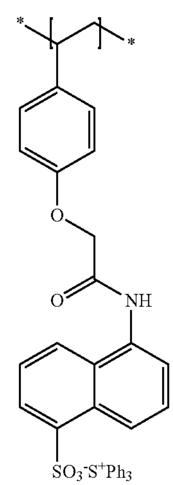

-continued
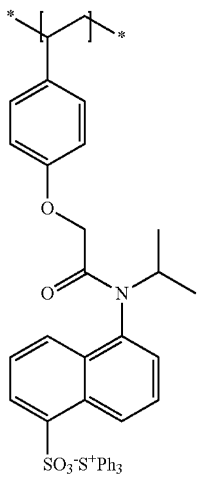
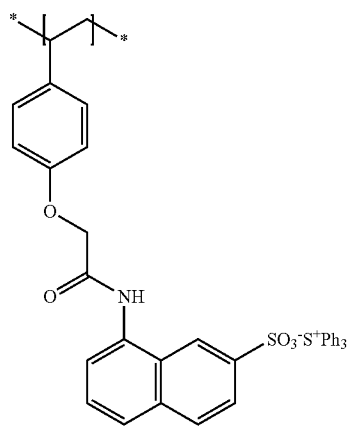
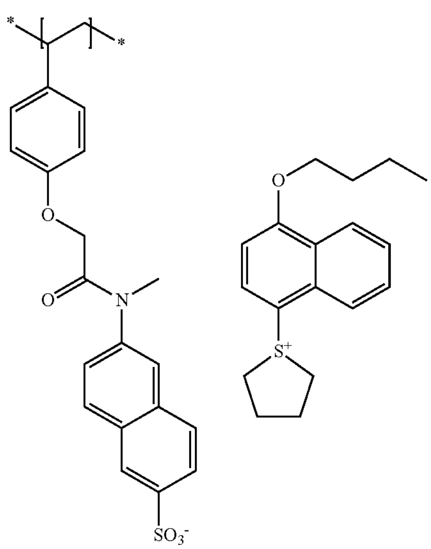
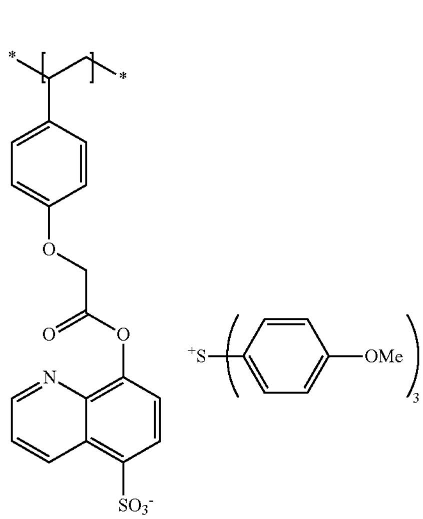
-continued
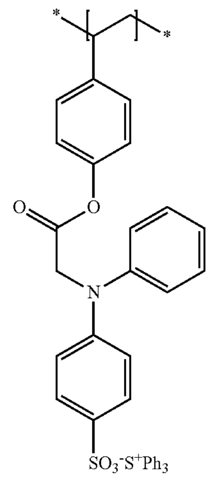
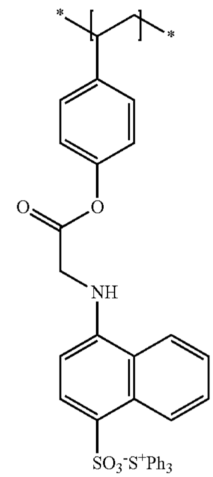
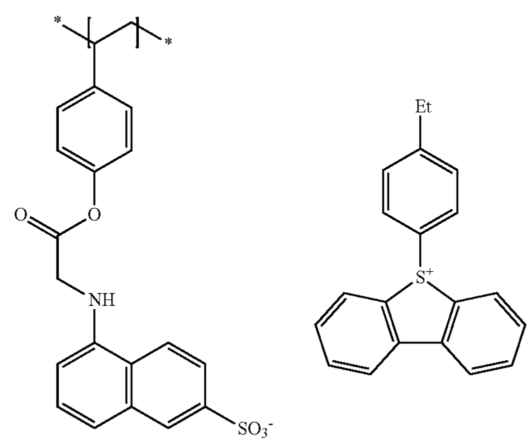
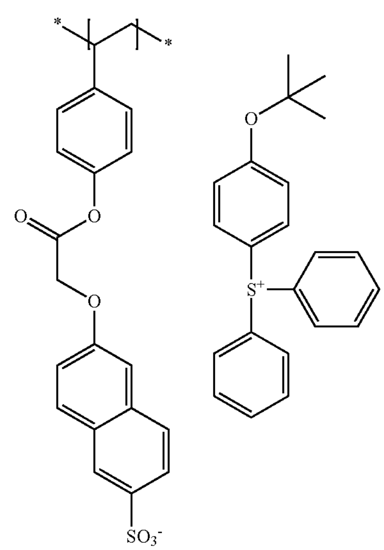

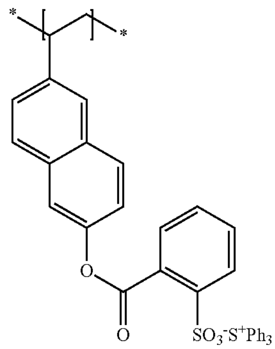
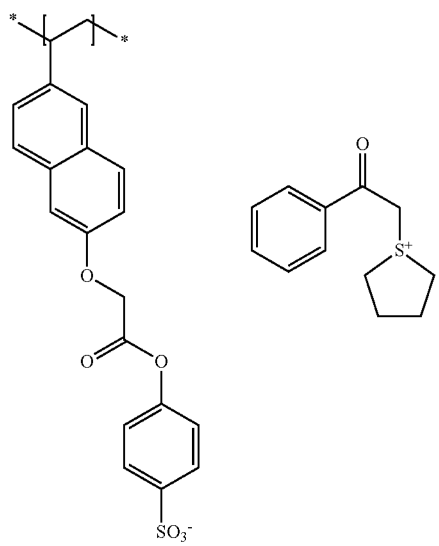
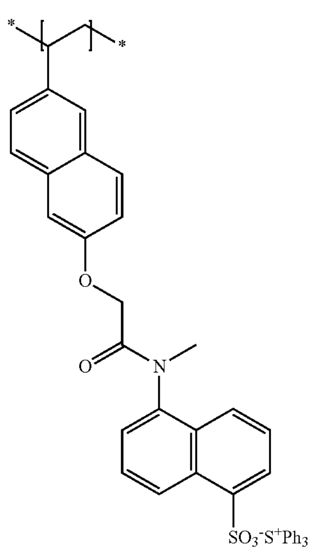
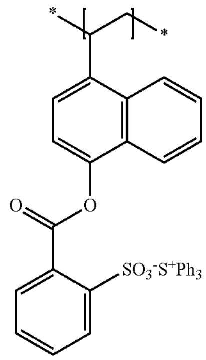
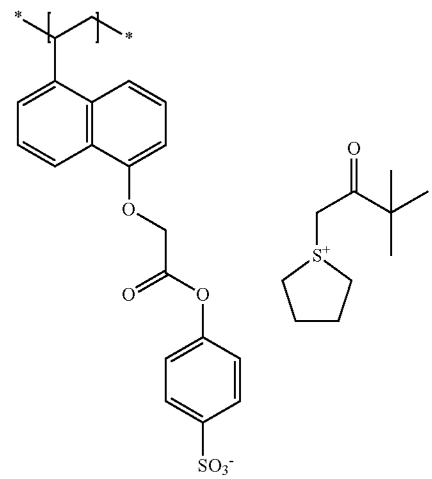
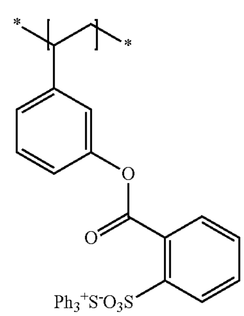
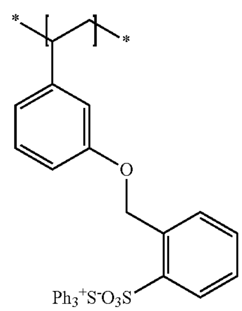
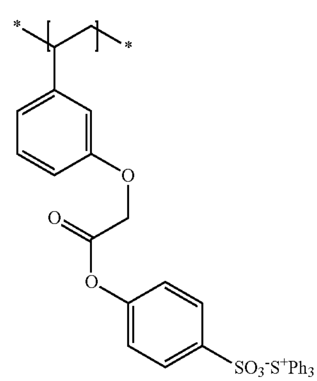

-continued
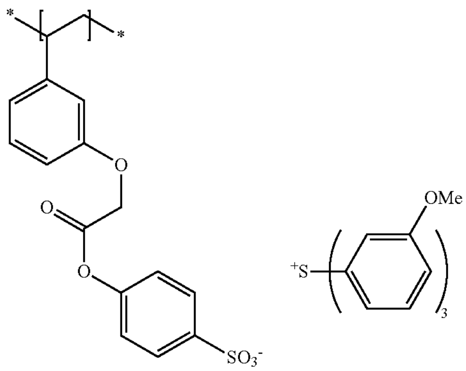
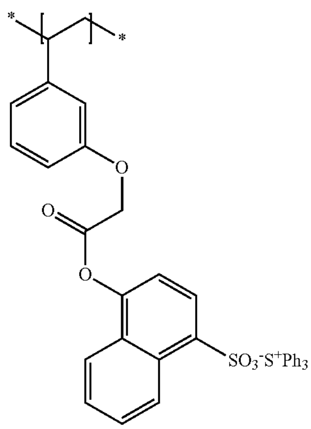
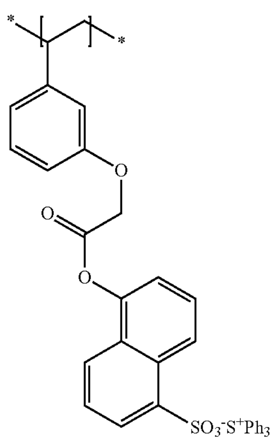
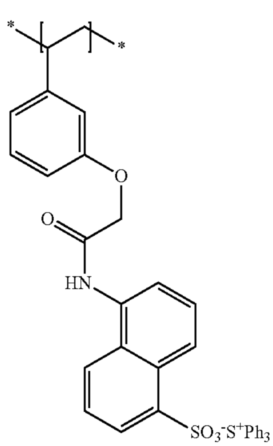
-continued
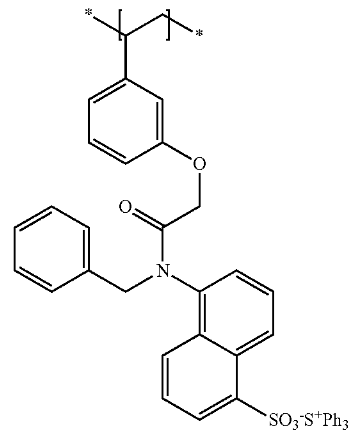
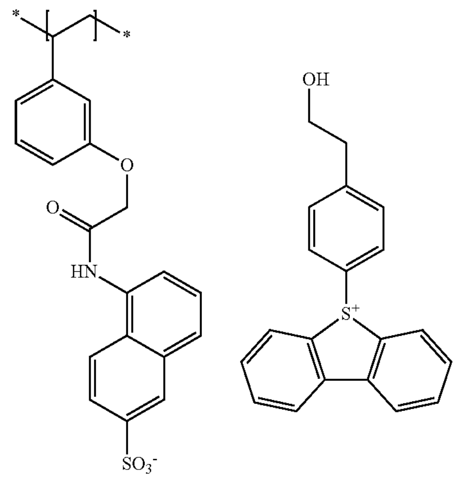
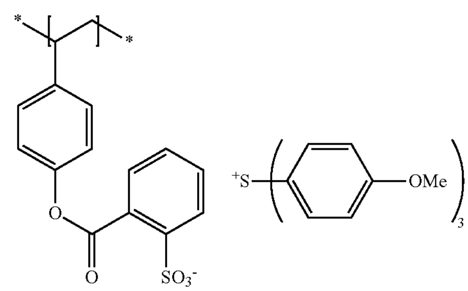
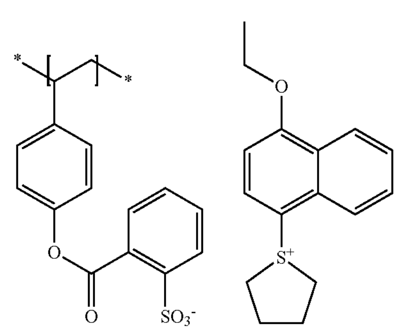

-continued
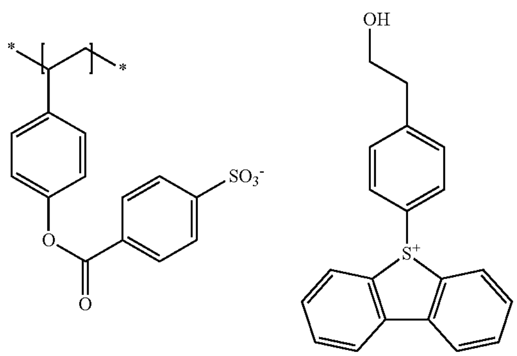
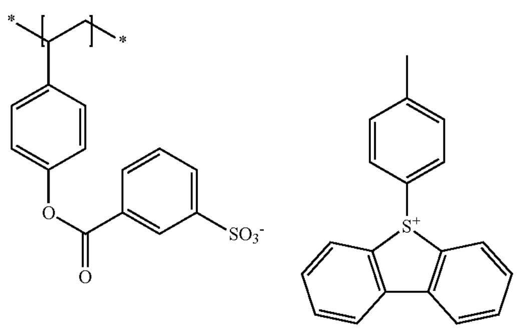
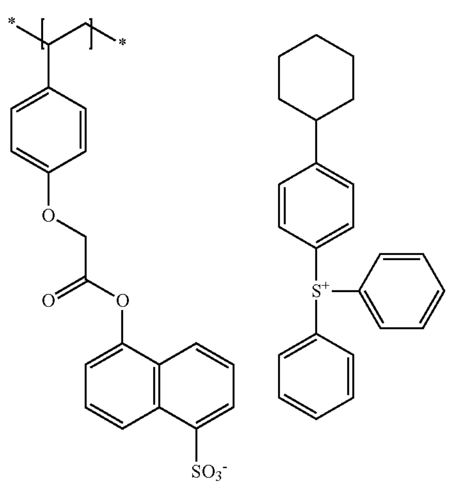
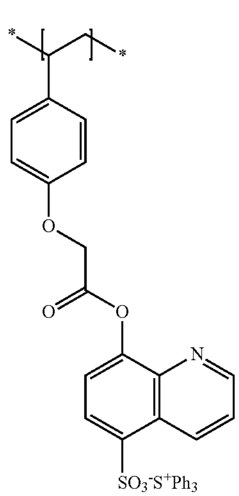
-continued
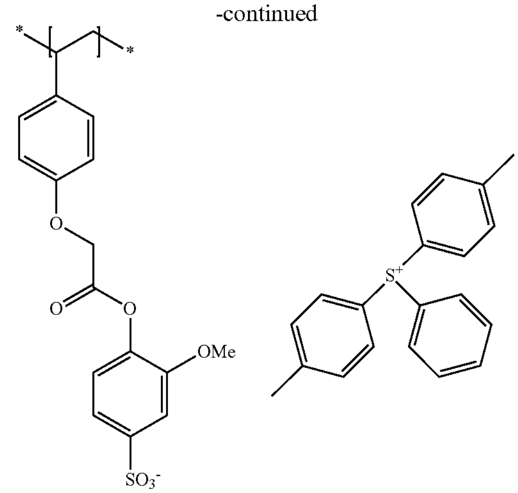
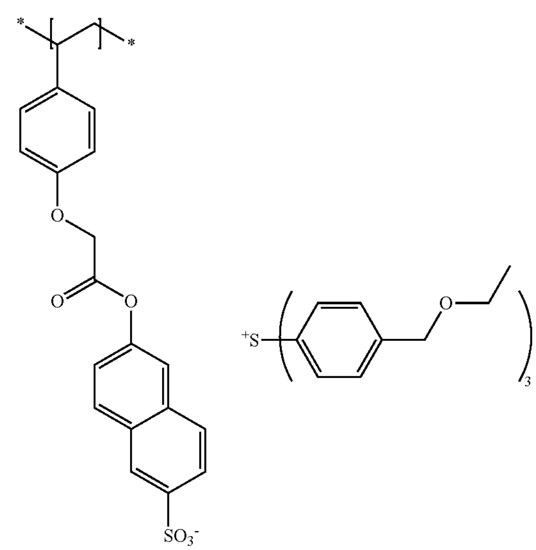
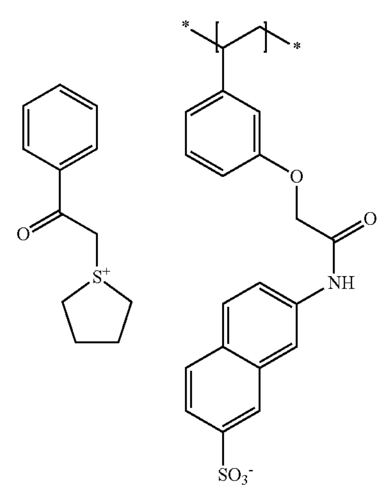

-continued
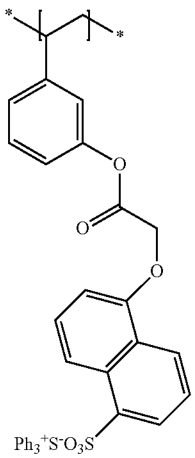
-continued
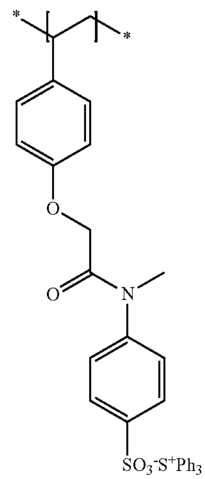
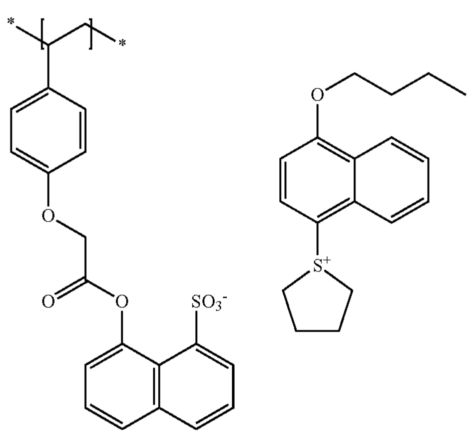
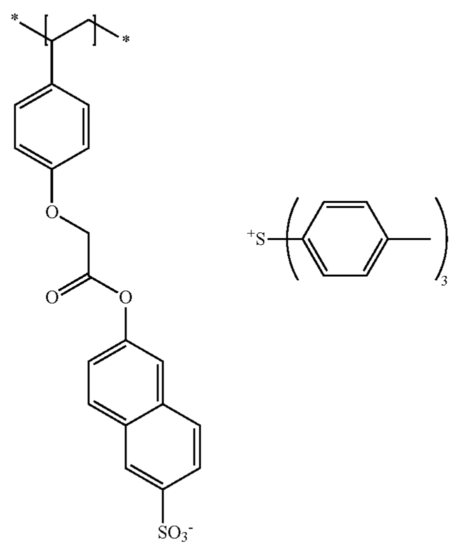
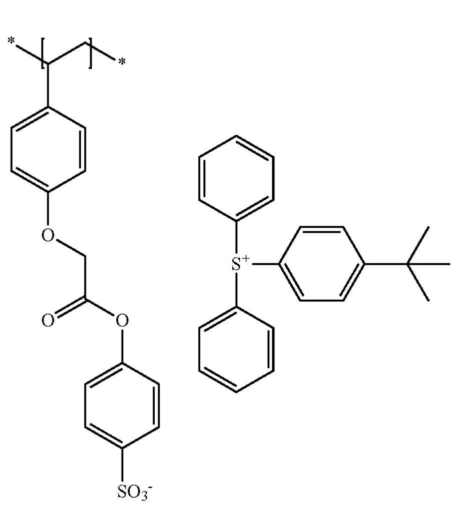
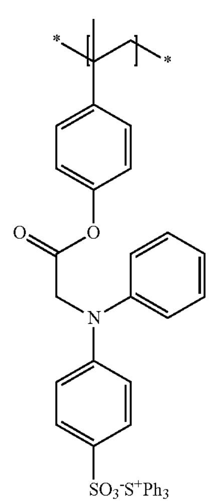
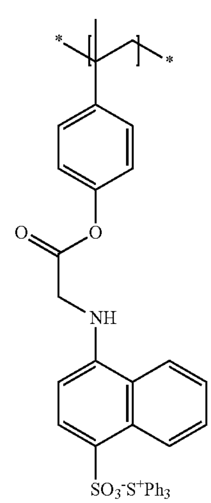

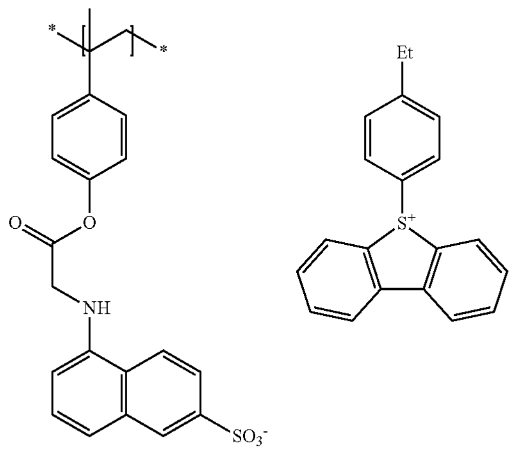
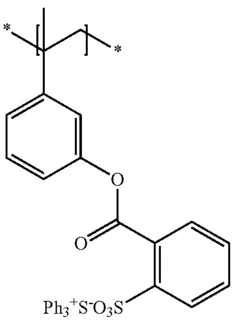
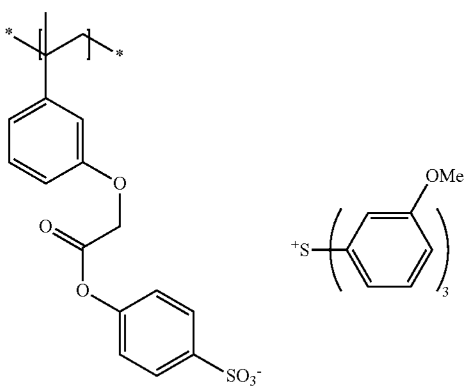
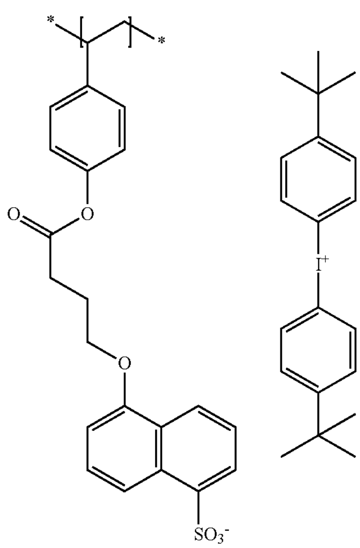
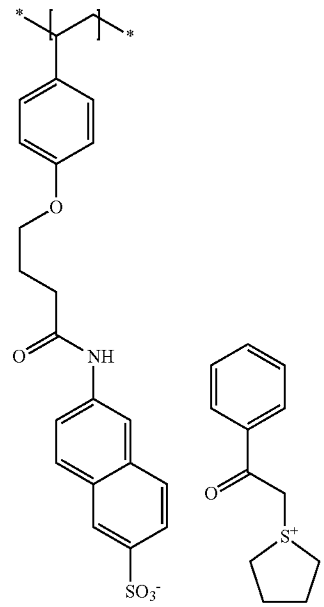
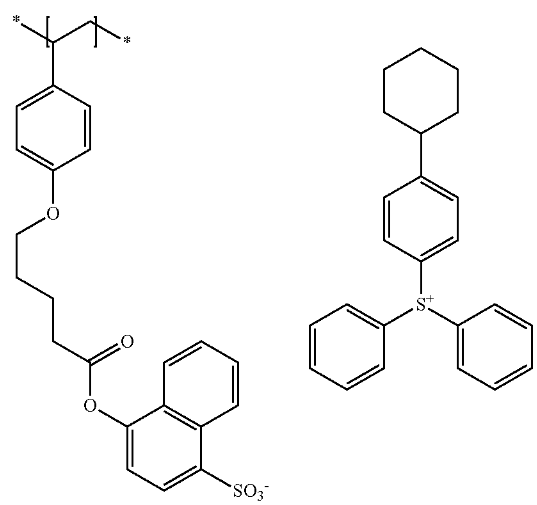
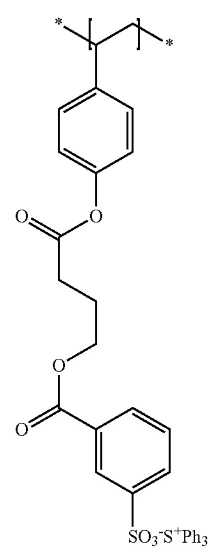
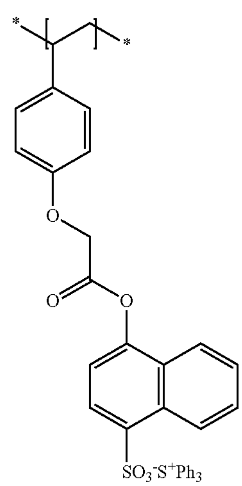

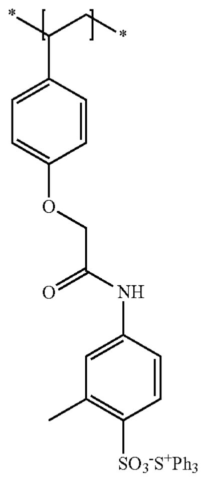
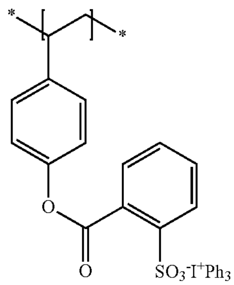
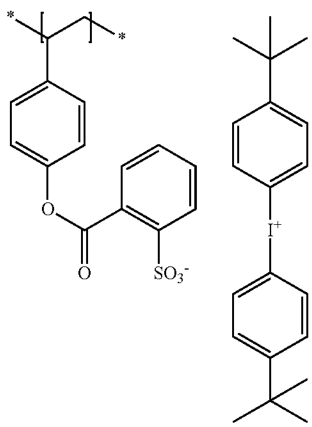
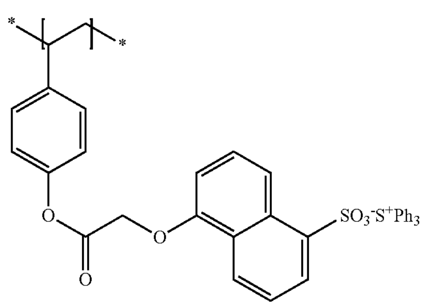
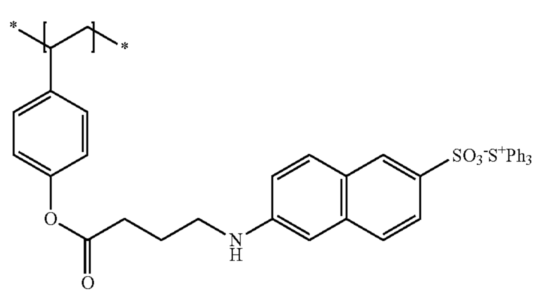
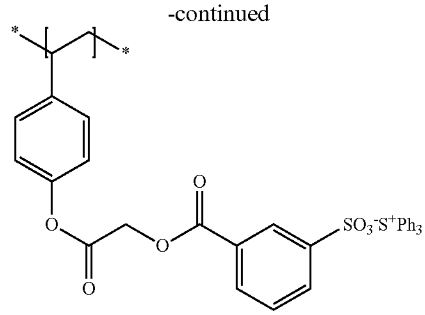
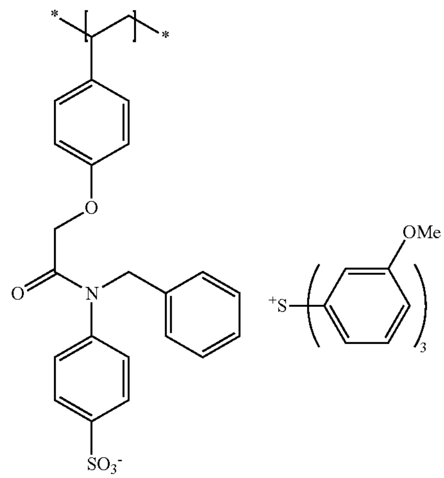
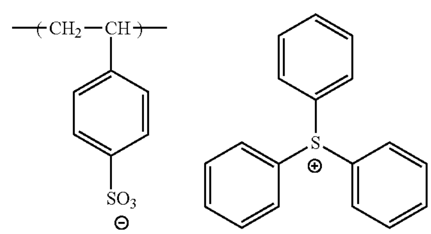
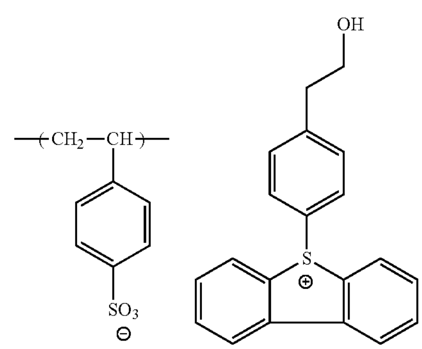
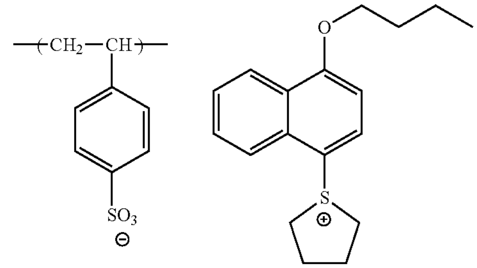

-continued
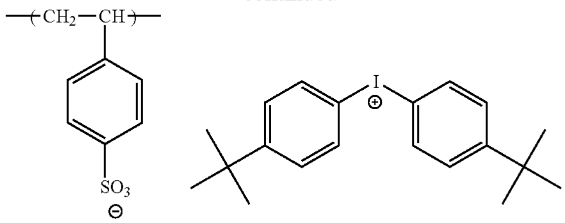
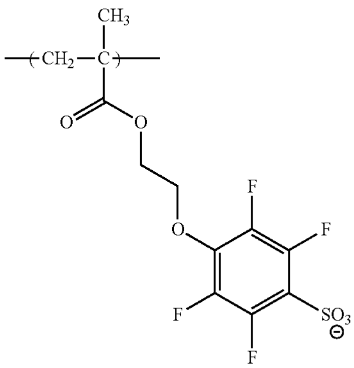
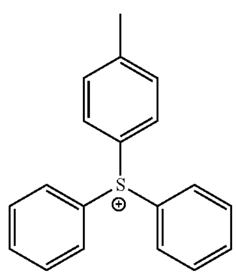
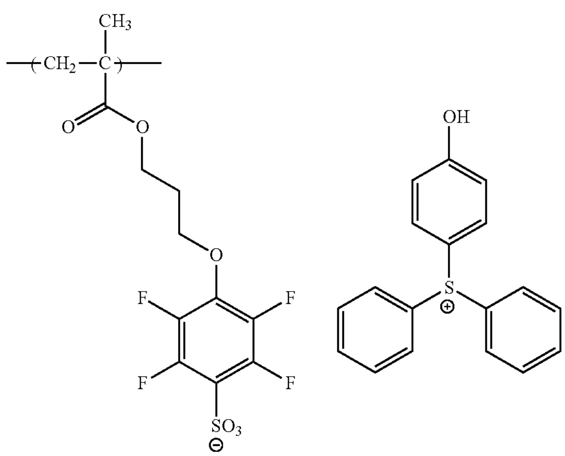
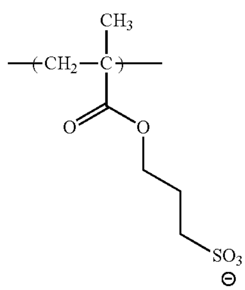
-continued
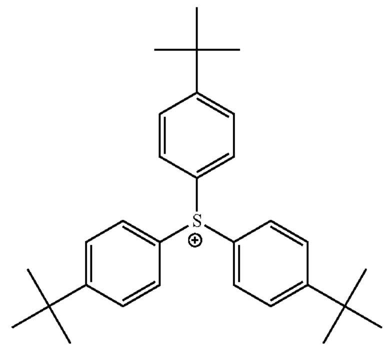
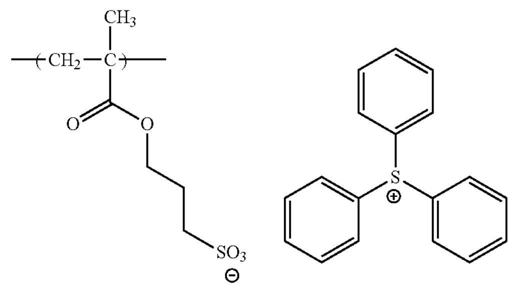
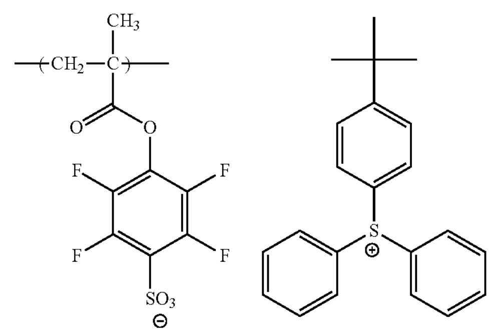
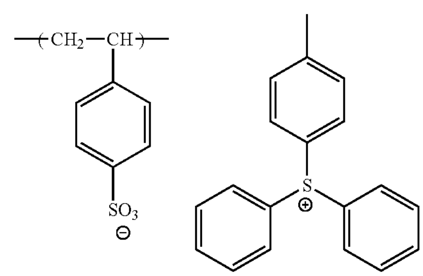
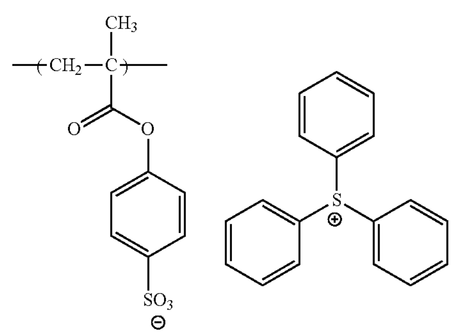

-continued
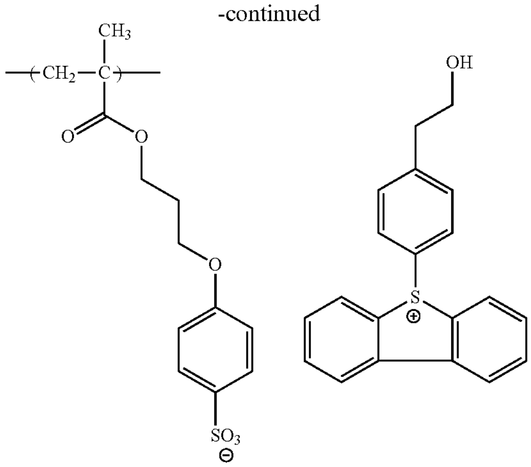
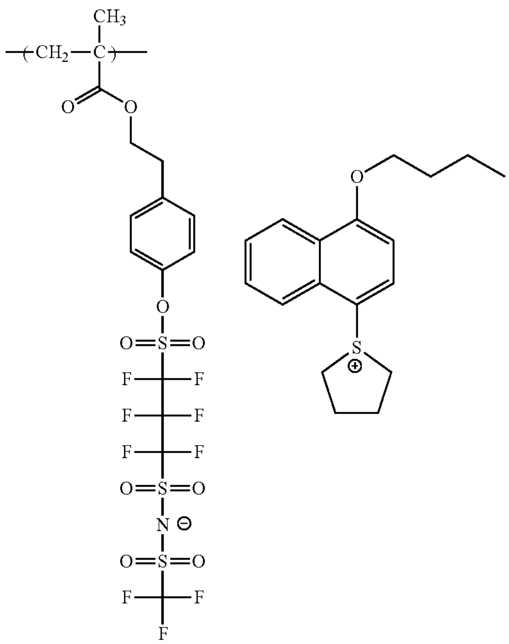
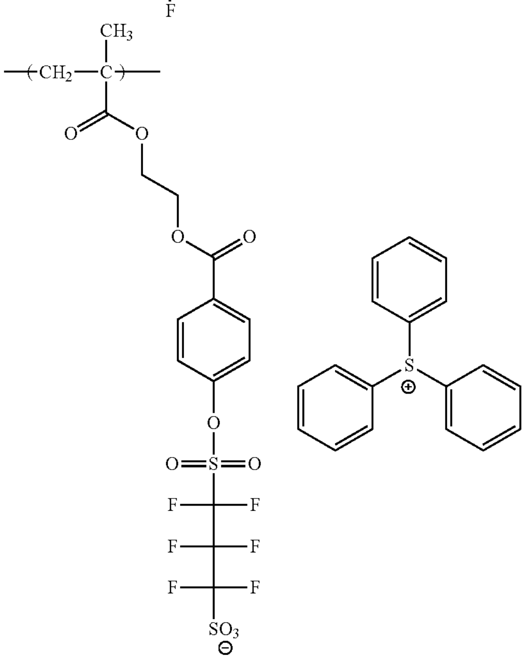
-continued
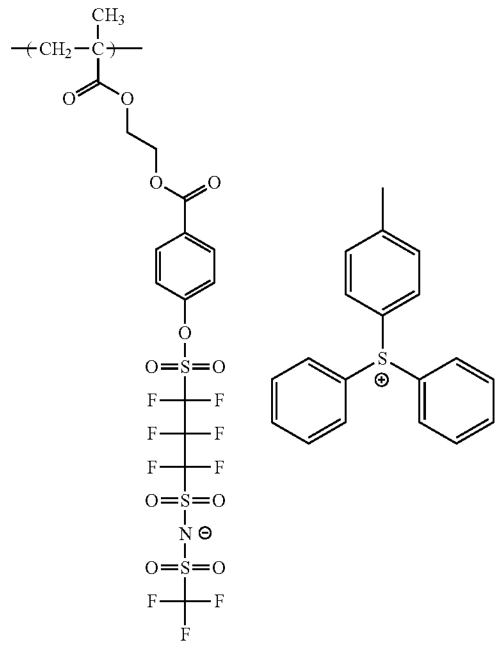
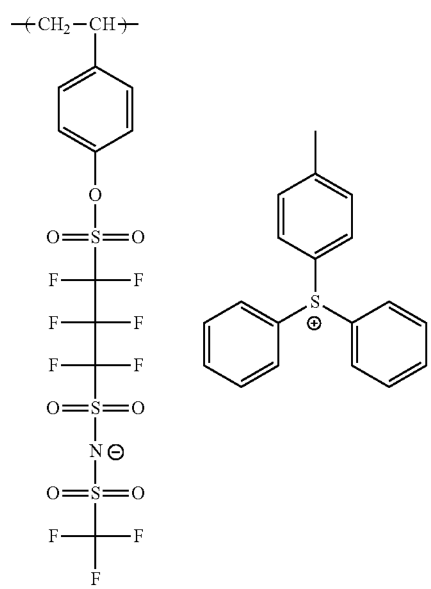

-continued
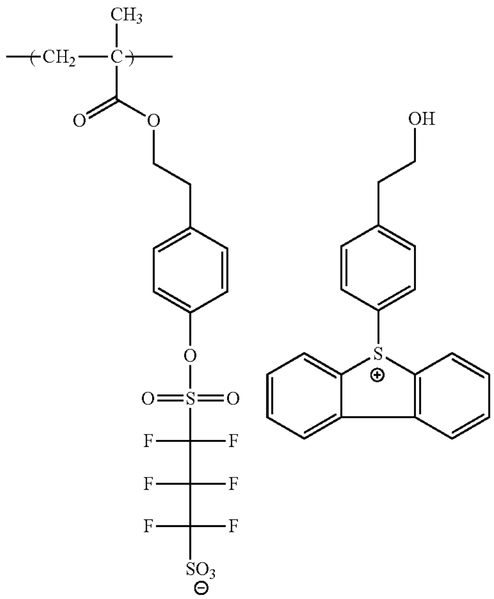
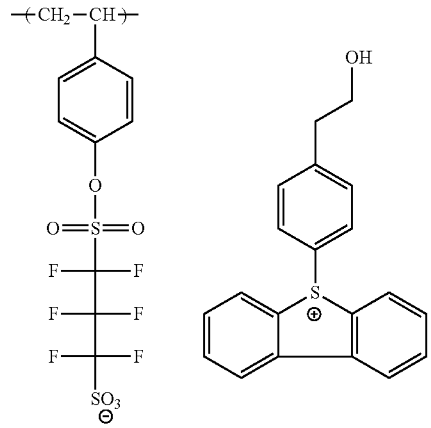
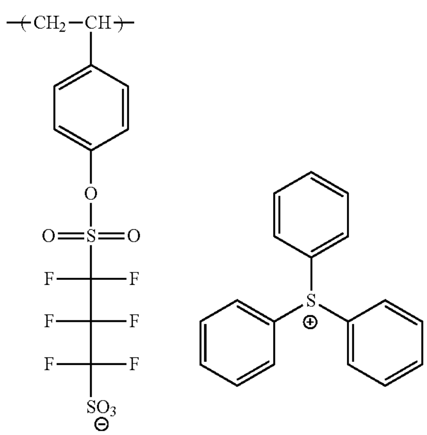
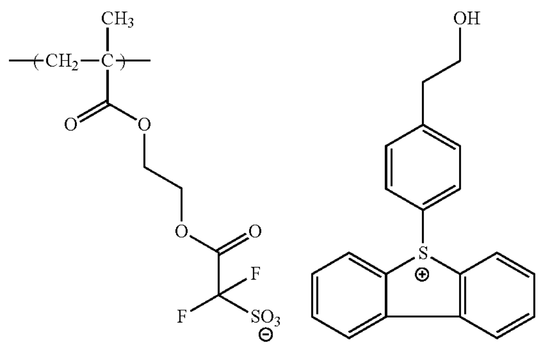
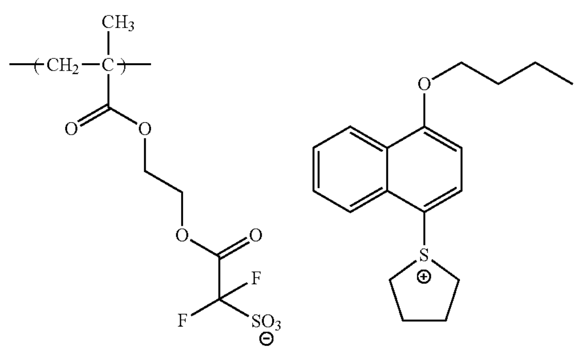
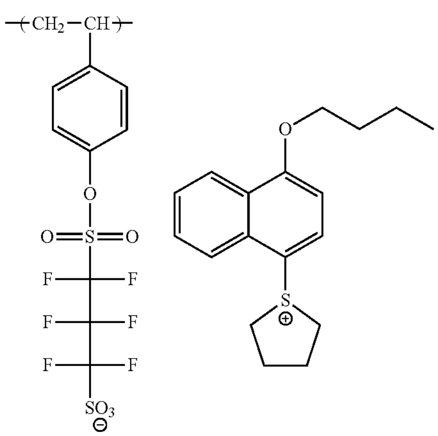
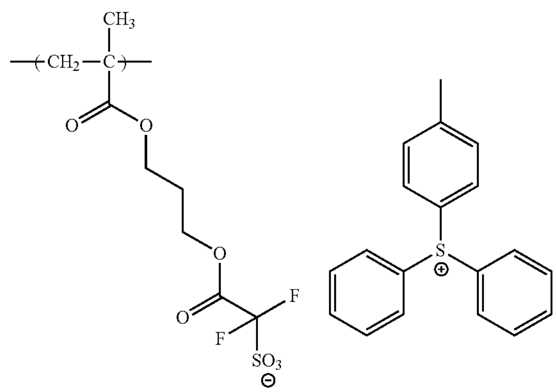

-continued
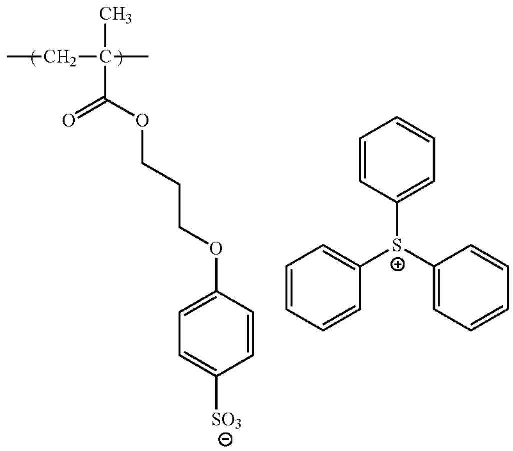
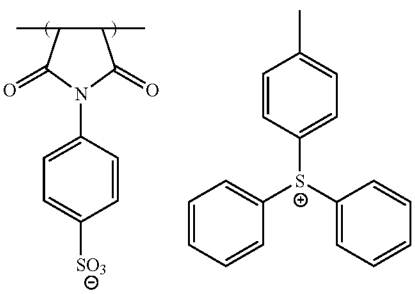
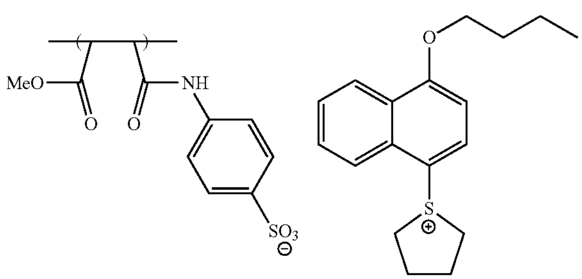
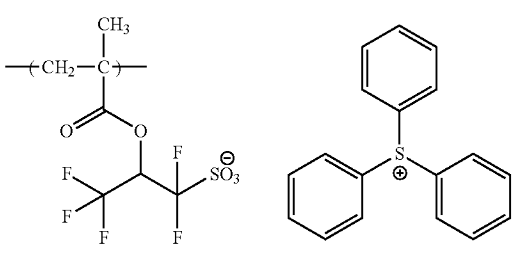
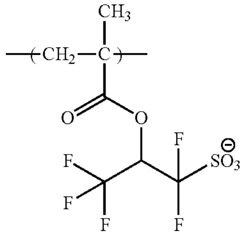
-continued
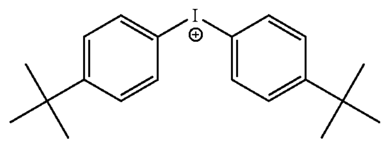
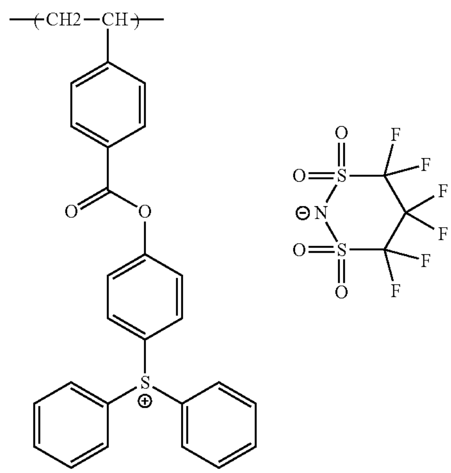
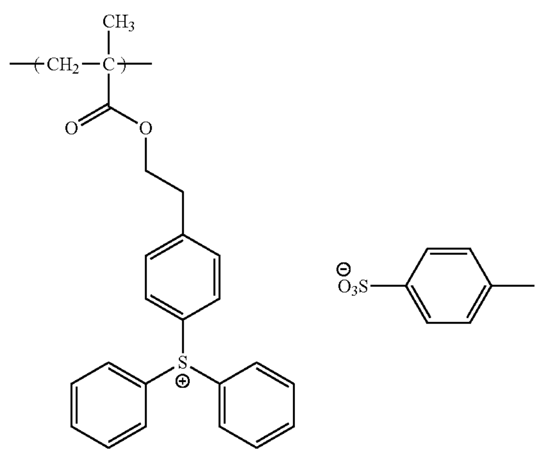
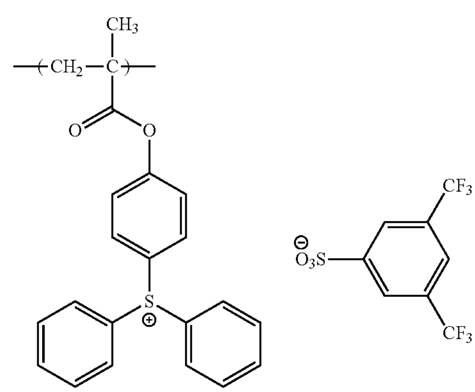

-continued
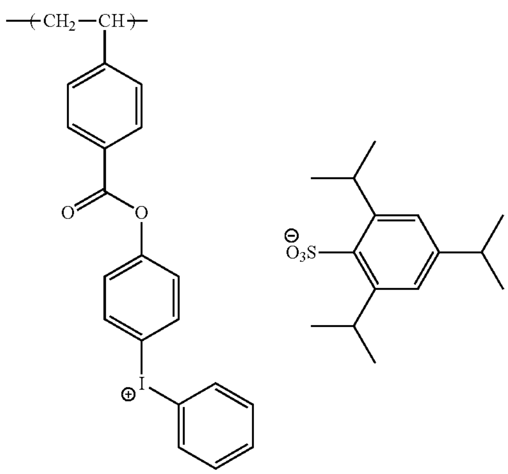
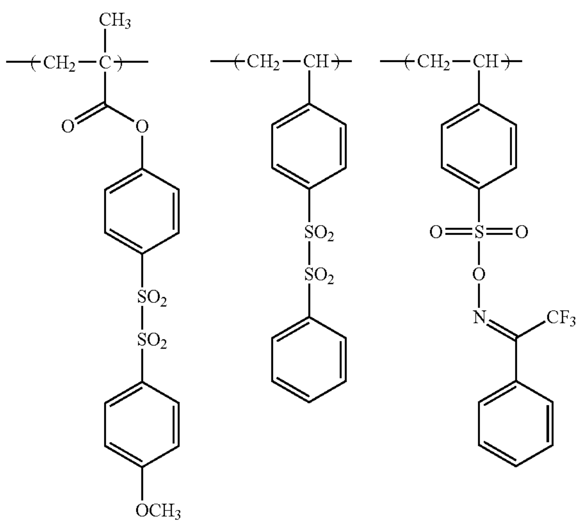
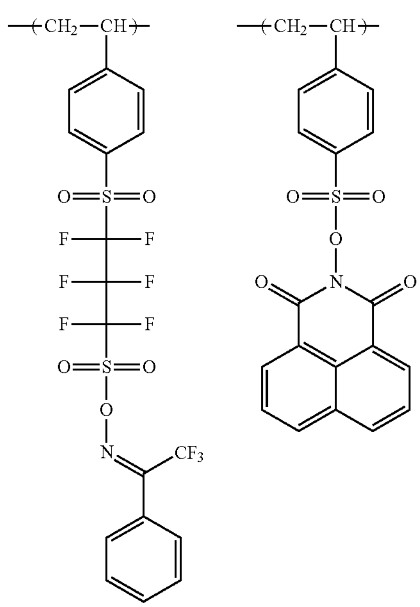
-continued
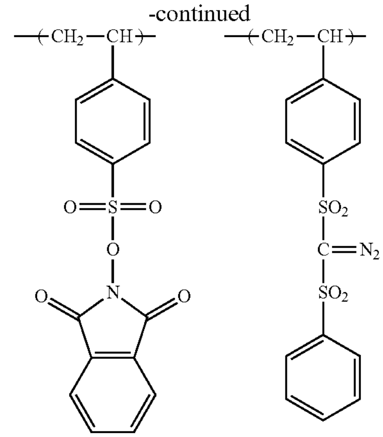
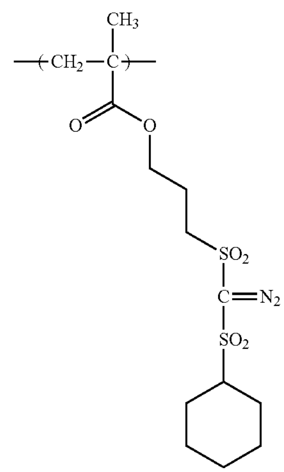
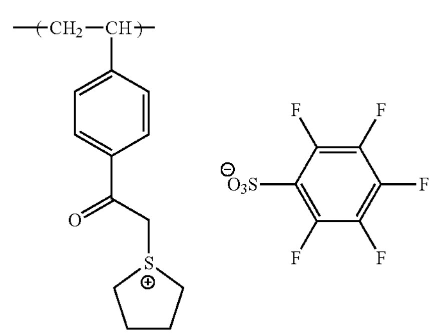
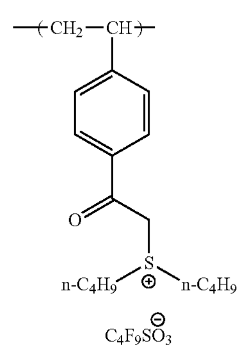

-continued

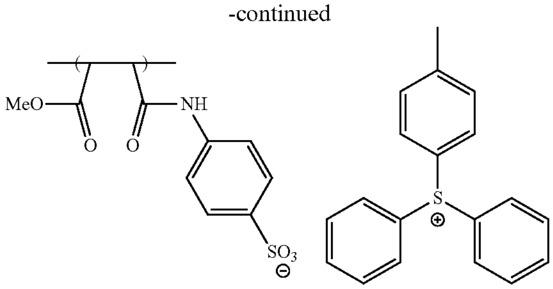

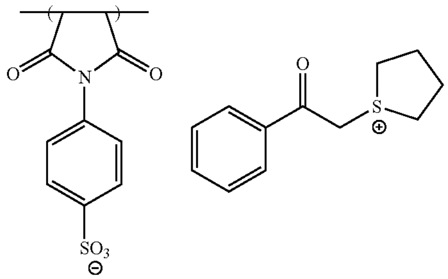

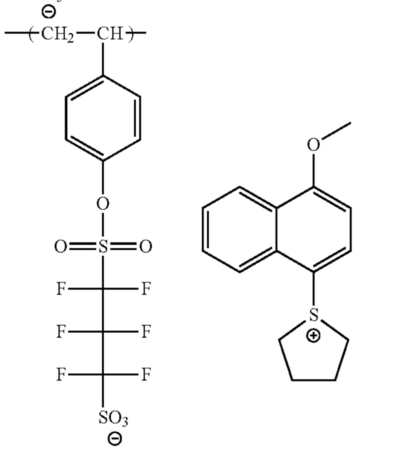

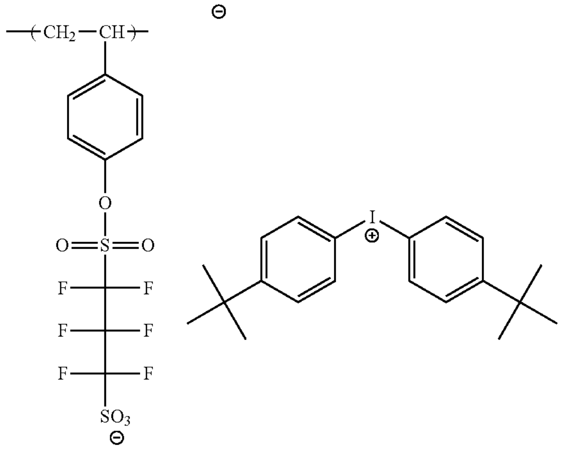

The content of the repeating unit represented by Formula (4) in the resin (P) is preferably in a range of 1 mol % to 40 mol %, more preferably in a range of 2 mol % to 30 mol %, and particularly preferably in a range of 5 mol % to 25 mol % based on the total repeating units of the resin (P).

It is also preferred that the resin (P) has the following repeating unit as other repeating units.

For example, a repeating unit having a group which is decomposed by the action of an alkali developer to increase the dissolution rate in the alkali developer may be exemplified. Examples of the group may include a group having a lactone structure, a group having a phenyl ester structure and the like, and the repeating unit having a group which is decomposed by the action of an alkali developer to increase the dissolution rate in the alkali developer is preferably a repeating unit represented by the following Formula (AII).

(AII)

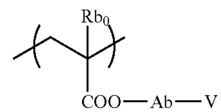

In Formula (AII), V represents a group which is decomposed by the action of an alkali developer to increase the dissolution rate in the alkali developer, $Rb_0$ represents a hydrogen atom or a methyl group, and Ab represents a single bond or a divalent linking group.

V, which is a group capable of decomposing by the action of an alkali developer, is a group having an ester bond, and among them, a group having a lactone structure is more preferred. Any group having a loctone structure may be used as long as the group has a lactone structure, but a 5- to 7-membered ring lactone structure is preferred, and a structure condensed to another ring structure in a form of forming a bicycle structure or a spiro structure to 5- to 7-membered ring lactone structure is preferred.

A preferred Ab is a single bond or a divalent linking group represented by -AZ-$CO_2$-(AZ represents an alkylene group or an aliphatic ring). A preferred AZ is a methylene group, an ethylene group, a cyclohexylene group, an adamatylene group or a norbornylene group.

Specific examples are shown below. In the formulas, Rx represents H or $CH_3$.

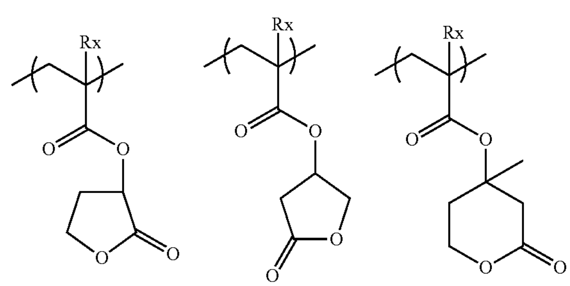

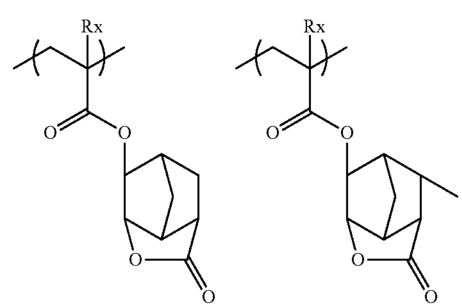

-continued
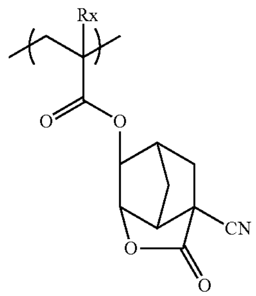
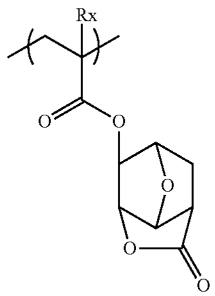
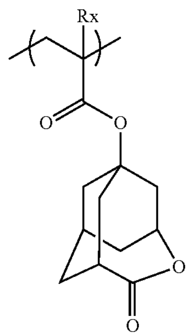
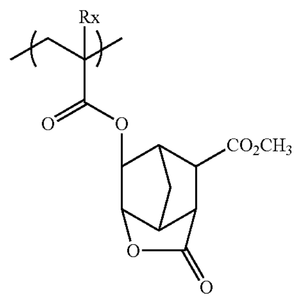
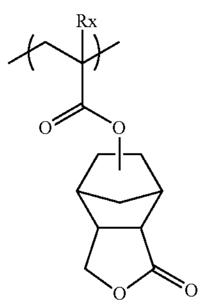
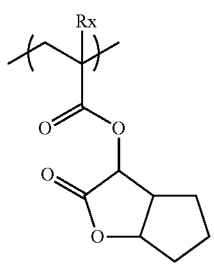
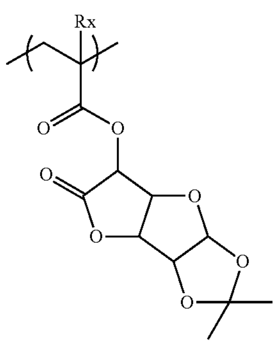
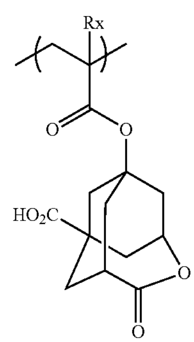
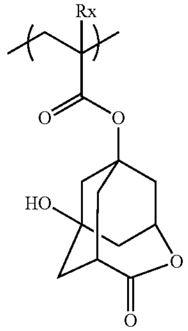
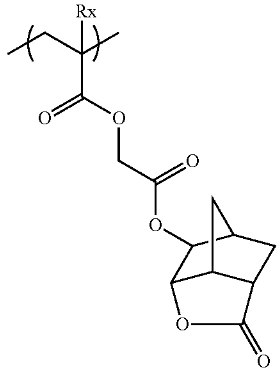
-continued
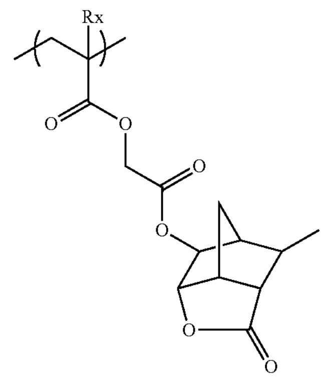
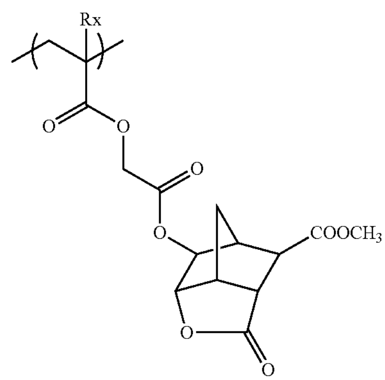
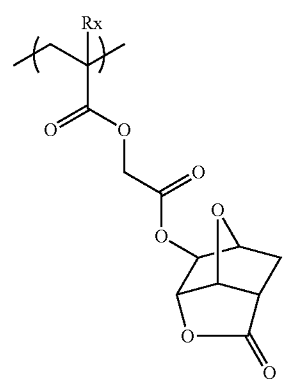
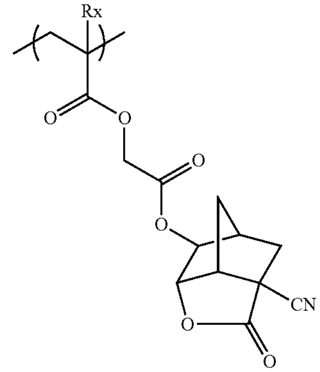

-continued
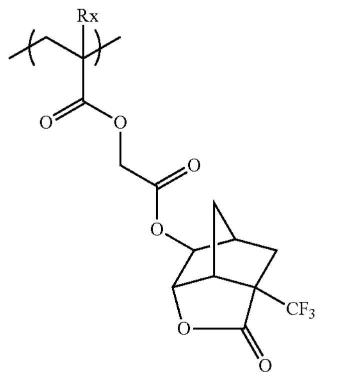
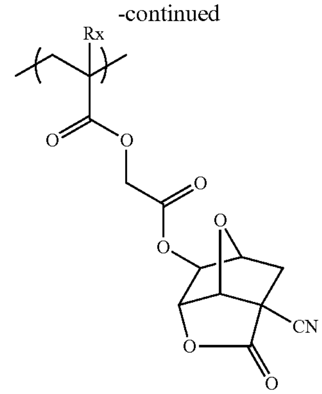
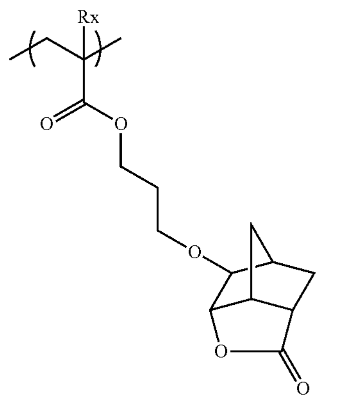
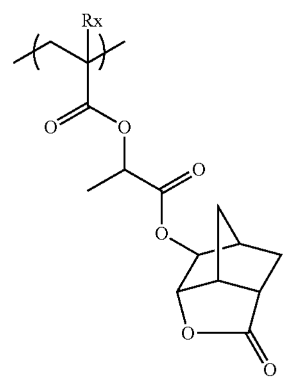
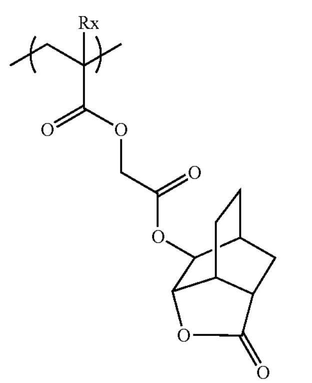
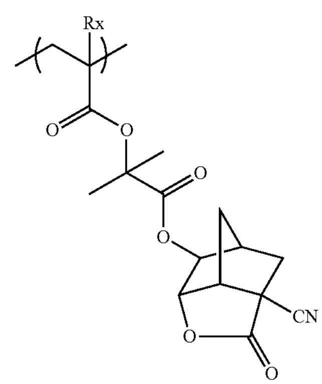
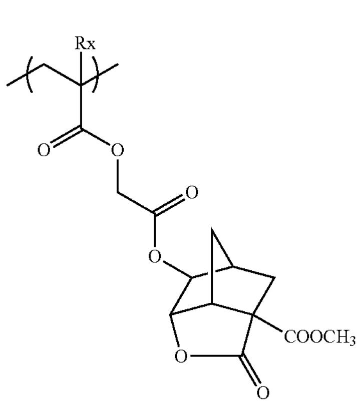
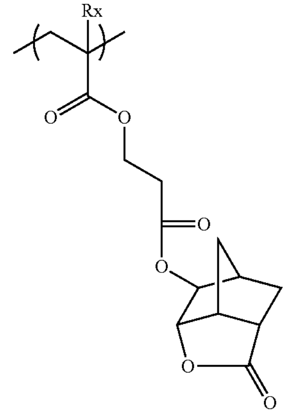
-continued -continued

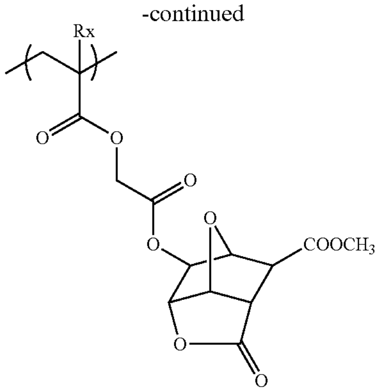

-continued (F3)

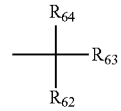

(F4)

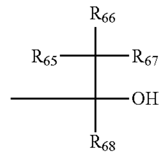

The resin (P) may or may not contain the repeating unit having a group which is decomposed by the action of an alkali developer to increase the dissolution rate in the alkali developer, but when containing, the content of the repeating unit having the group is preferably 5 mol % to 60 mol %, more preferably 7 mol % to 50 mol %, and still more preferably 10 mol % to 40 mol % based on the total repeating units in the resin (P).

The resin (P) may also have a repeating unit containing a fluorine atom. The repeating unit containing a fluorine atom is preferably different from the repeating unit represented by Formula (4).

A fluorine atom may be contained in the main chain in the resin (P) or may be substituted onto a side chain. The repeating unit having a fluorine atom is preferably, for example, a (meth)acrylate-based repeating unit or a styryl-based repeating unit.

The repeating unit having a fluorine atom is preferably a repeating unit having an alkyl group having a fluorine atom, a cycloalkyl group having a fluorine atom or an aryl group having a fluorine atom as a partial structure in an aspect.

The alkyl group having a fluorine atom (preferably having 1 to 10 carbon atoms, and more preferably 1 to 4 carbon atoms) is a straight or branched alkyl group in which at least one hydrogen atom is substituted by a fluorine atom, and may have other substituents.

The cycloalkyl group having a fluorine atom is a monocyclic or polycyclic cycloalkyl group in which at least one hydrogen atom is substituted by a fluorine atom, and may have other substituents.

The aryl group having a fluorine atom is an aryl group such as a phenyl group and a naphthyl group in which at least one hydrogen atom is substituted by a fluorine atom, and may have other substituents.

The alkyl group having a fluorine atom, the cycloalkyl group having a fluorine atom or the aryl group having a fluorine atom may be exemplified by groups represented by any of the following Formula (F2) to Formula (F4), but the present invention is not limited thereto.

(F2)

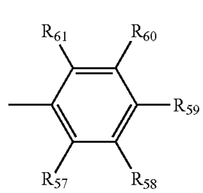

In Formula (F2) to Formula (F4), each of $R_{57}$ to $R_{68}$ independently represents a hydrogen atom, a fluorine atom or an alkyl group (chain form). However, at least one of $R_{57}$ to $R_{61}$, at least one of $R_{62}$ to $R_{64}$, and at least one of $R_{65}$ to $R_{68}$ represent a fluorine atom or a fluoroalkyl group. $R_{62}$ and $R_{63}$ may be bound with each other to form a ring.

Specific examples of the group represented by Formula (F2) may include a p-fluorophenyl group, a pentafluorophenyl group, a 3,5-di(trifluoromethyl)phenyl group and the like.

Specific examples of the group represented by Formula (F3) may include a trifluoromethyl group, a pentafluoropropyl group, a pentafluoroethyl group, a heptafluorobutyl group, a hexafluoroisopropyl group, a heptafluoroisopropyl group, hexafluoro(2-methyl)isopropyl group, a nonafluorobutyl group, an octafluoroan isobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorohexyl group and the like. Among them, a hexafluoroan isopropyl group, a heptafluoroisopropyl group, a hexafluoro(2-methyl)isopropyl group, an octafluoroisobutyl group, a nonafluoro-t-butyl group and a perfluoroisopentyl group are preferred, and a hexafluoro isopropyl group and a heptafluoro isopropyl group are more preferred.

Specific examples of the group represented by Formula (F4) may include —$C(CF_3)_2OH$, —$C(C_2F_5)_2OH$, —$C(CF_3)(CH_3)OH$, —$CH(CF_3)OH$ and the like, and $C(CF_3)_2OH$ is preferred.

The partial structure containing a fluorine atom may be bound directly to the main chain, or may be bound via one or a combination of two or more selected from the group consisting of an alkylene group, a phenylene group, an ether bond, a thioether bond, a carbonyl group, an ester bond, an amide bond, a urethane bond or a ureylene bond to the main chain.

The repeating unit having a fluorine atom may be suitably exemplified by the followings.

(C-Ia)

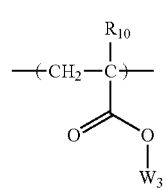

-continued (C-Ib)

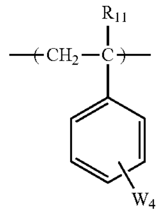

(C-Ic)

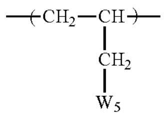

(C-Id)

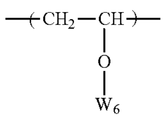

In the formulas, each of $R_{10}$ and $R_{11}$ independently represents a hydrogen atom, a fluorine atom or an alkyl group (preferably a straight or branched alkyl group having 1 to 4 carbon atoms, and examples of an alkyl group having a substituent may include a fluorinated alkyl group).

Each of $W_3$ to $W_6$ independently represents an organic group containing at least one fluorine atom. Specific examples thereof may include atomic groups of Formula (F2) to Formula (F4) as described above in detail.

Further, in another aspect, a resin (Aa) may contain a unit represented by Formula (C-II) or Formula (C-III).

(C-II)

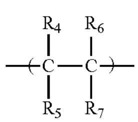

(C-III)

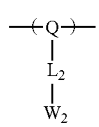

In Formula (C-II), each of $R_4$ to $R_7$ independently represents a hydrogen atom, a fluorine atom, or an alkyl group (preferably a straight or branched alkyl group having 1 to 4 carbon atoms, and an alkyl group having a substituent may be exemplified by, particularly, a fluorinated alkyl group). However, at least one of $R_4$ to $R_7$ represents a fluorine atom. $R_4$ and $R_5$, or $R_6$ and $R_7$ may form a ring.

In Formula (C-III), Q represents an alicyclic structure. The alicyclic structure may be either monocyclic or polycyclic, and may have a substituent. The monocyclic structure is preferably a cycloalkyl group having 3 to 9 carbon atoms, and examples thereof may include a cyclopentyl group, a cyclohexyl group, a cyclobutyl group, a cyclooctyl group and the like. The polycyclic structure may include a group having a bicyclo, tricyclo, tetracyclo structure or the like having 5 or more carbon atoms, and is preferably a cycloalkyl group having 6 to 20 carbon atoms, and examples thereof may include an adamantyl group, a norbornyl group, a dicyclopentyl group, a tricyclodecanyl group, a tetracyclododecyl group and the like. Further, some of carbon atoms in the cycloalkyl group may be substituted by a heteroatom such as an oxygen atom. The alicyclic group of Q is more preferably an alicyclic structure having 5 to 9 carbon atoms.

$W_2$ represents an organic group having at least one fluorine atom. Specific examples thereof may include atomic groups of Formula (F2) to Formula (F4).

$L_2$ represents a single bond or a divalent linking group. Examples of the divalent linking group may include a substituted or unsubstituted arylene group, a substituted or unsubstituted alkylene group, a substituted or unsubstituted cycloalkylene group, —O—, —$SO_2$—, —CO—, —N(R)— (wherein, R represents a hydrogen atom or an alkyl group), —$NHSO_2$— or a divalent linking group in combination of two or more thereof.

Specific examples of the repeating unit containing a fluorine atom are shown below, but the present invention is not limited thereto. Meanwhile, in the specific examples, $X_1$ represents a hydrogen atom, —$CH_3$, —F or —$CF_3$, and $X_2$ represents —F or —$CF_3$.

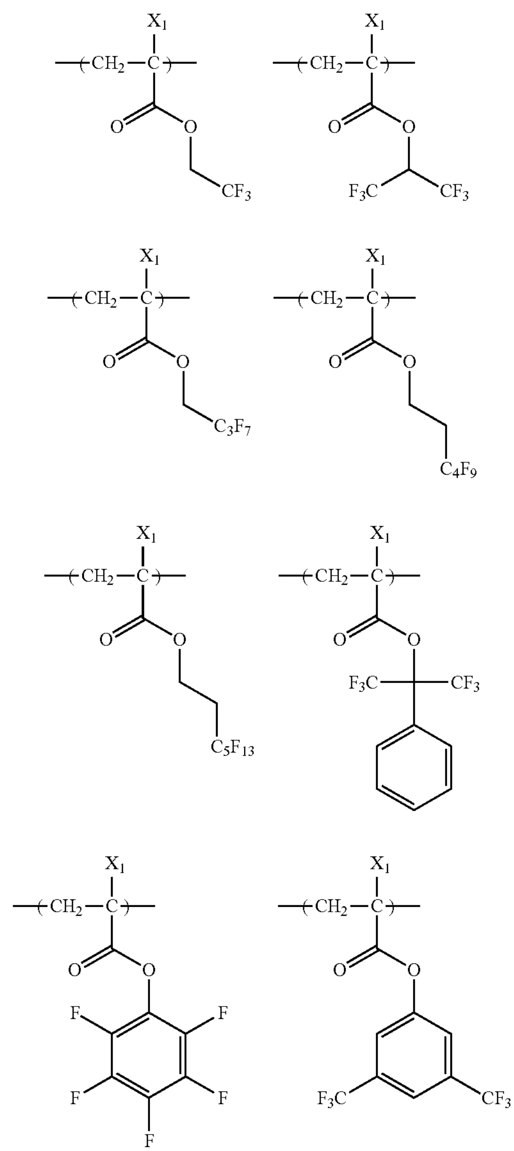

-continued
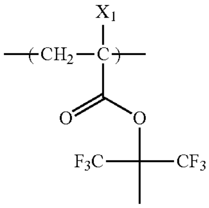
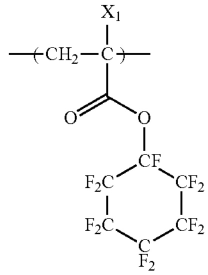
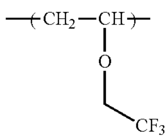
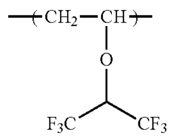
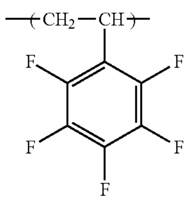
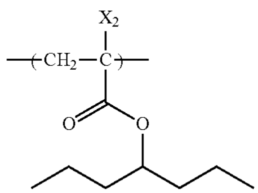
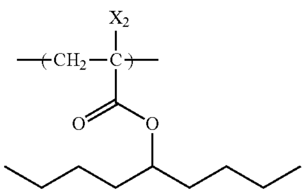
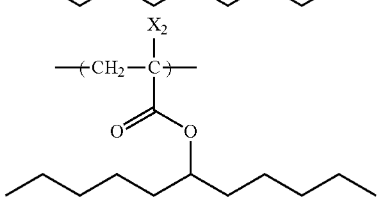
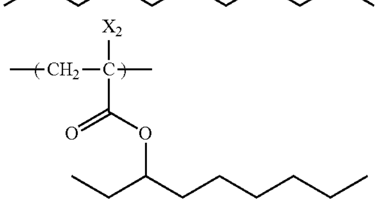
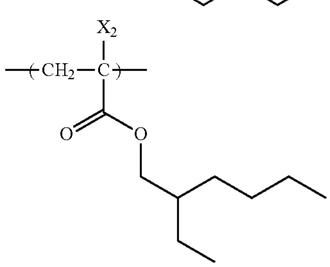
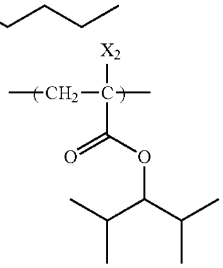
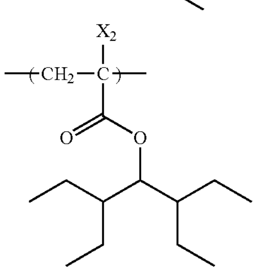
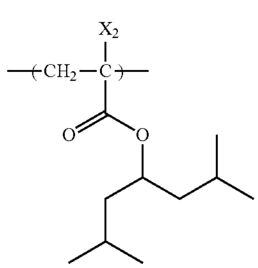
-continued
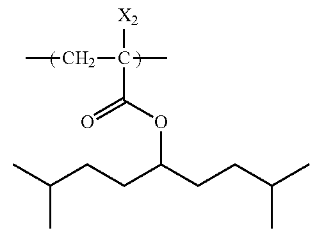
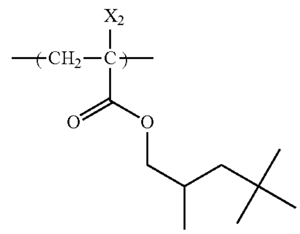
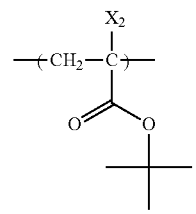
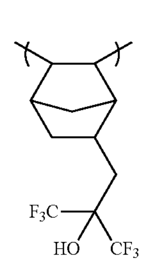
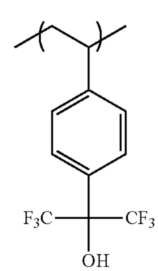
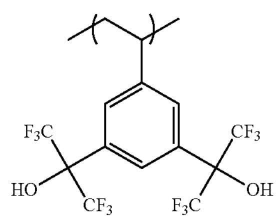
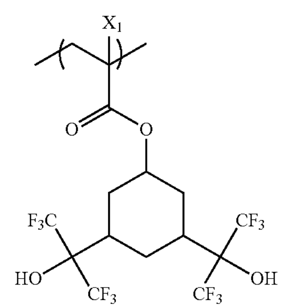
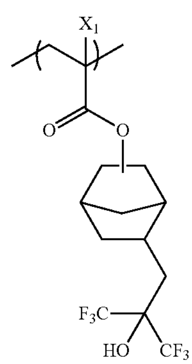
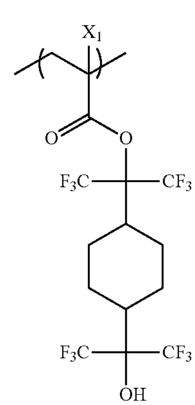

-continued

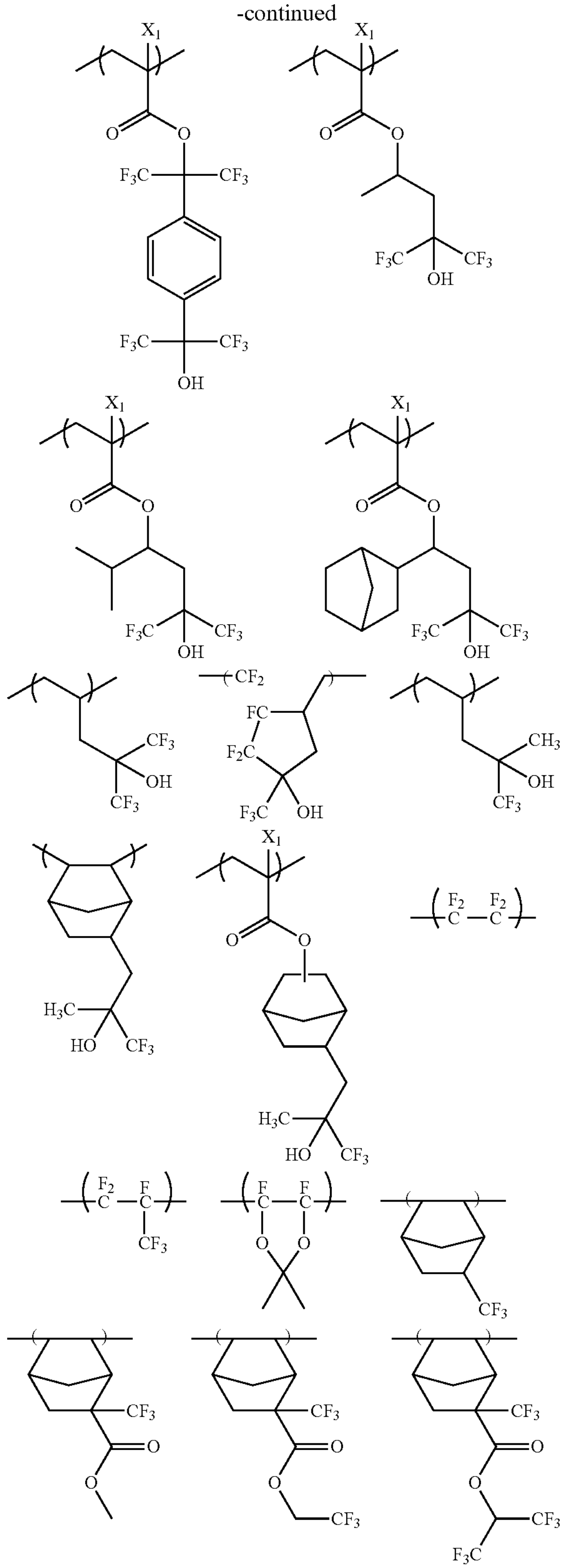

The resin (P) may or may not contain a repeating unit having a fluorine atom, but when containing, the content of the repeating unit having a fluorine atom is preferably 1 mol % to 90 mol %, more preferably 5 mol % to 85 mol %, still more preferably 10 mol % to 80 mol %, and particularly preferably 15 mol % to 75 mol % based on the total repeating units in the resin (P).

Examples of a polymerizable monomer for forming a repeating unit other than that described above in the resin (P) may include styrene, alkyl-substituted styrene, alkoxy-substituted styrene, O-alkylated styrene, O-acylated styrene, hydrogenated hydroxystyrene, maleic anhydride, an acrylic acid derivative (acrylic acid, acrylate ester and the like), a methacrylic acid derivative (methacrylate, methacrylate ester and the like), N-substituted maleimide, acrylonitrile, methacrylonitrile, vinylnaphthalene, vinylanthracene, acenaphthylene, indene which may have a substituent and the like. The substituted styrene is preferably 4-(1-naphthylmethoxy)styrene, 4-benzyloxystyrene, 4-(4-chlorobenzyloxy)styrene, 3-(1-naphthylmethoxy)styrene, 3-benzyloxystyrene, 3-(4-chlorobenzyloxy)styrene or the like.

The resin (P) may be synthesized, for example, by radical, cationic or anionic polymerization of unsaturated monomers corresponding to each repeating unit. Further, it is also possible to synthesize the resin by polymerizing a polymer using unsaturated monomers corresponding to precursors of each repeating unit, and then, modifying the synthesized polymer with a low molecular weight compound to convert to a desired repeating unit. In any cases, it is preferred in that the molecular weight distribution of the obtained polymer compound becomes uniform by using living polymerization such as living anionic polymerization.

The weight average molecular weight of the resin (P) used in the present invention is preferably 1,000 to 200,000, more preferably 2,000 to 50,000, still more preferably and 2,000 to 15,000. Preferred polydispersity (molecular weight distribution) (Mw/Mn) of the resin (P) is 1.0 to 1.7, and more preferably 1.0 to 1.3. The weight average molecular weight and the polydispersity of the resin (P) are defined in terms of polystyrene by the GPC method.

The resin (P) may be used either alone or in combination of two or more thereof.

In the actinic ray-sensitive or radiation-sensitive composition of the present invention, the blending ratio of the resin (P) is preferably 30% by mass to 99% by mass, and more preferably 60% by mass to 95% by mass in the whole composition.

Specific examples of the resin are shown below, but the present invention is not limited thereto.

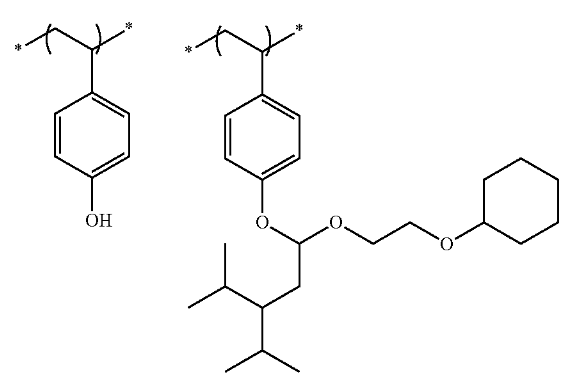

-continued
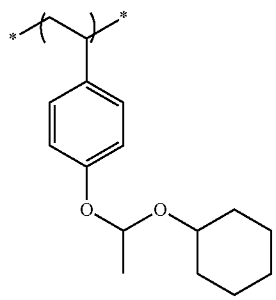
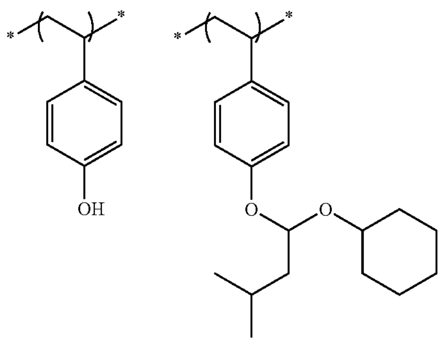
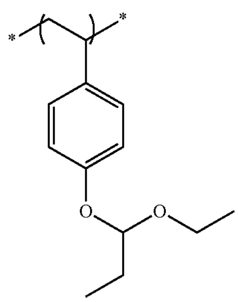
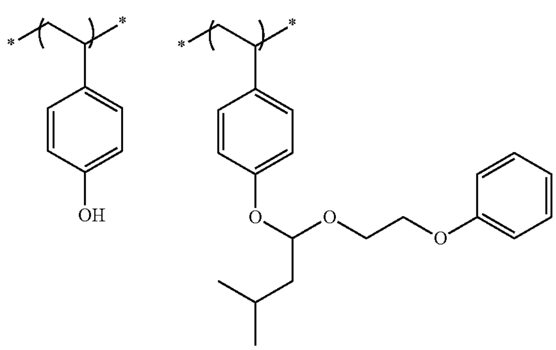
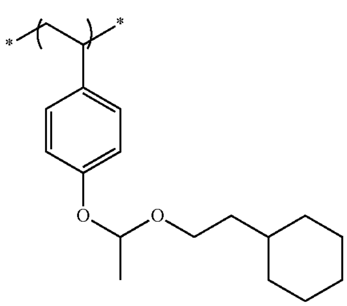
-continued
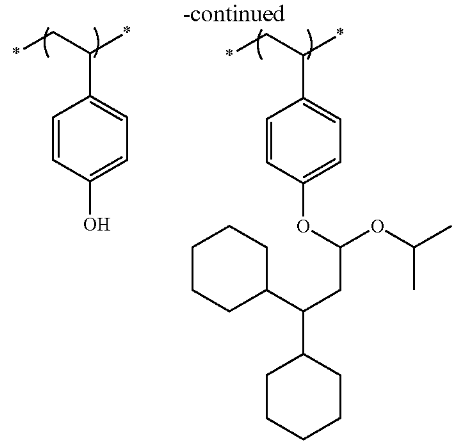
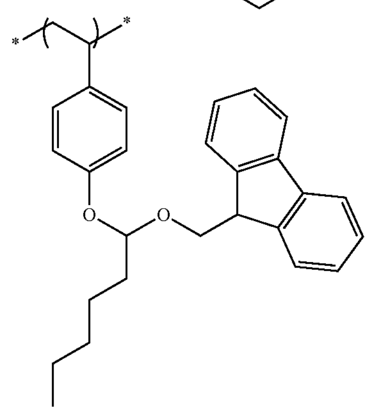
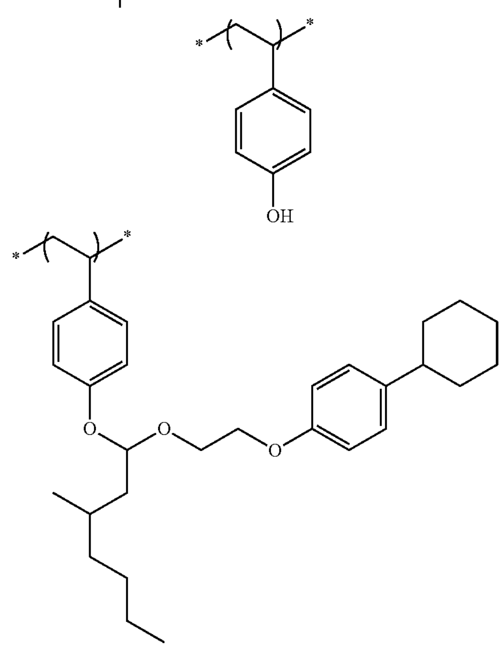
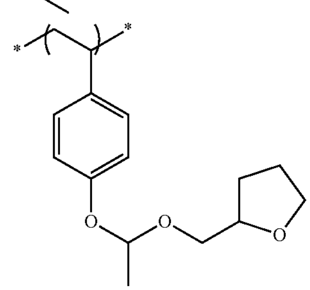

-continued
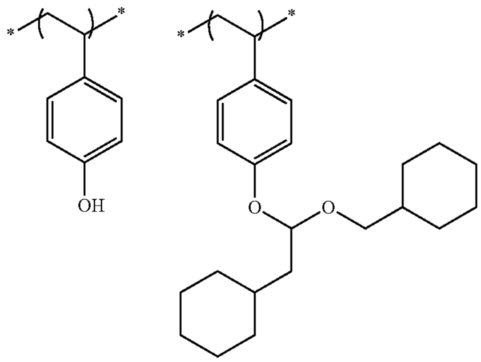
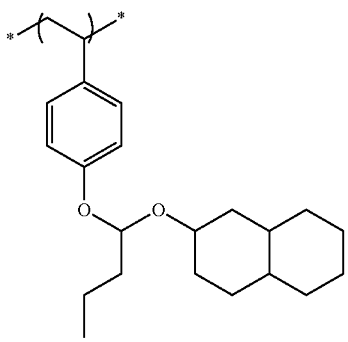
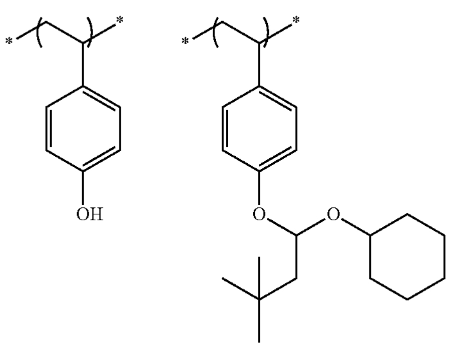
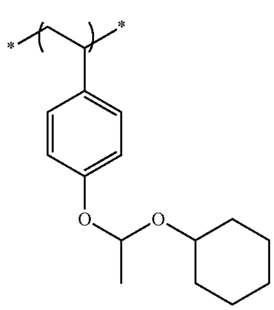
-continued
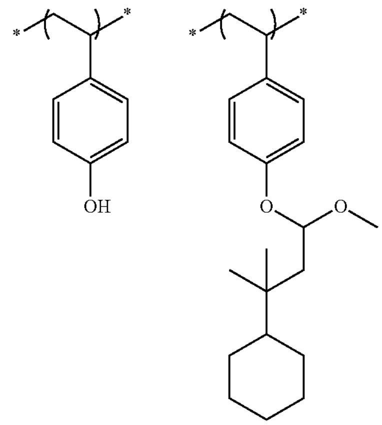
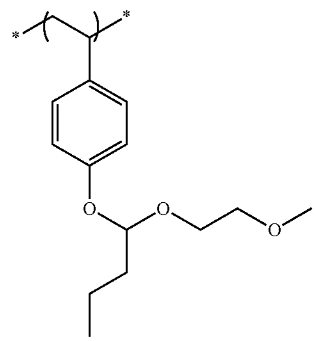
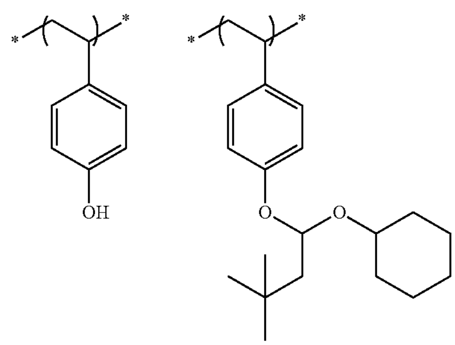
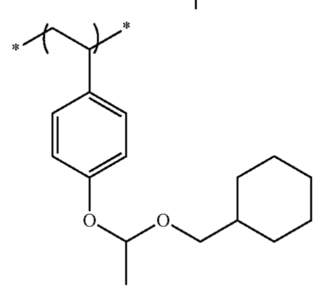
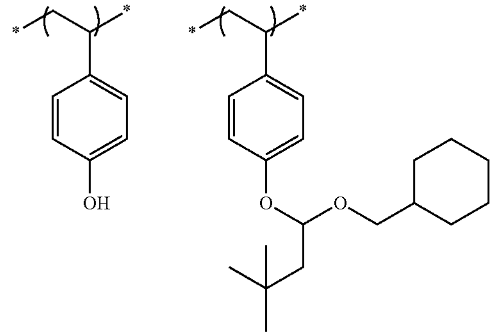

-continued
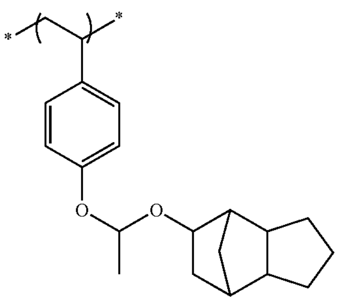
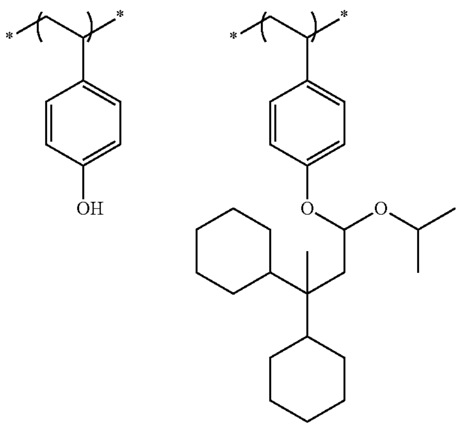
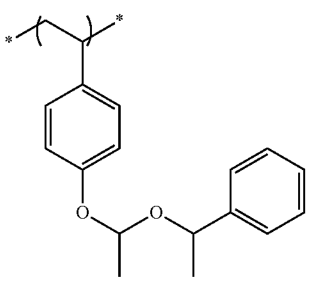
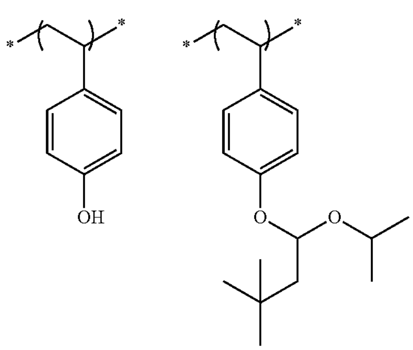
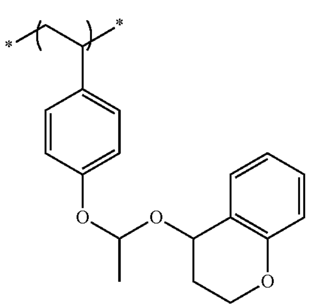
-continued
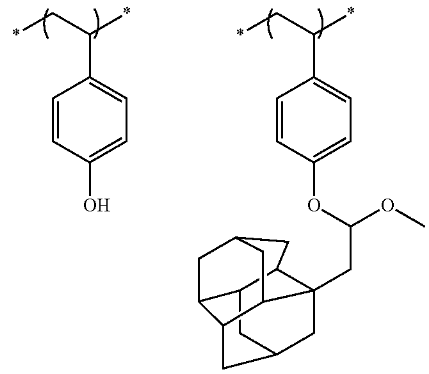
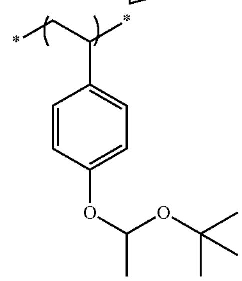
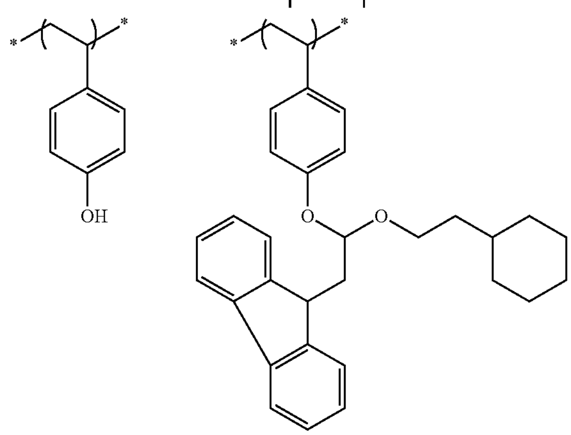
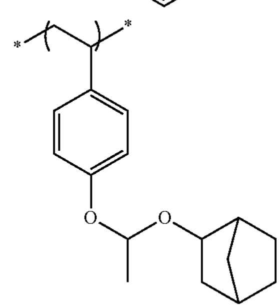
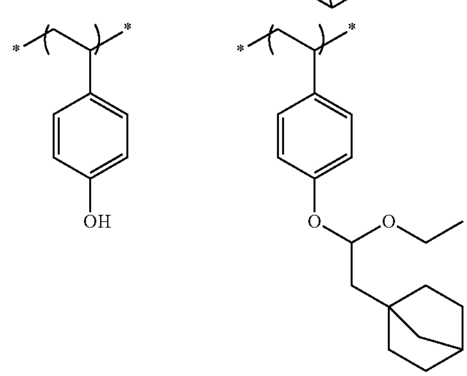

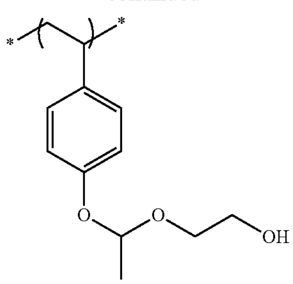
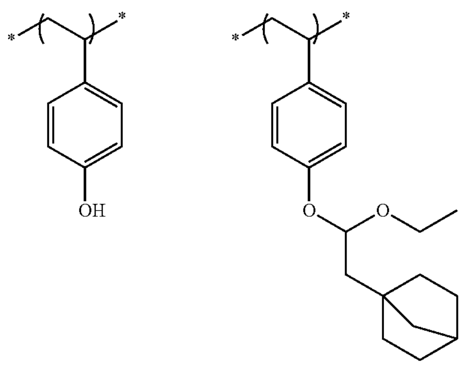
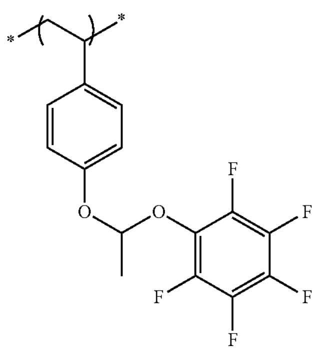
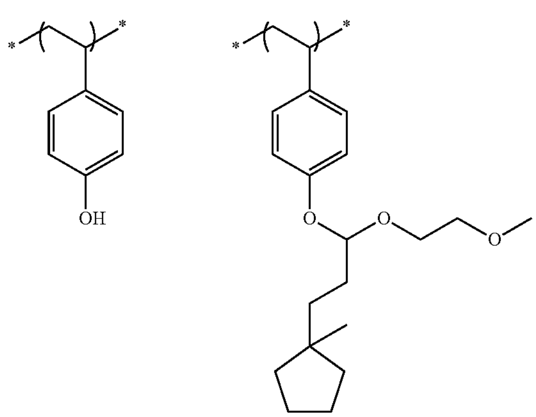
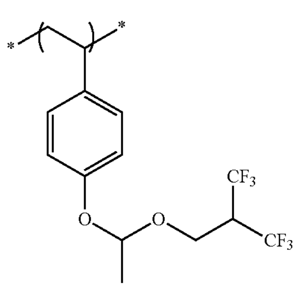
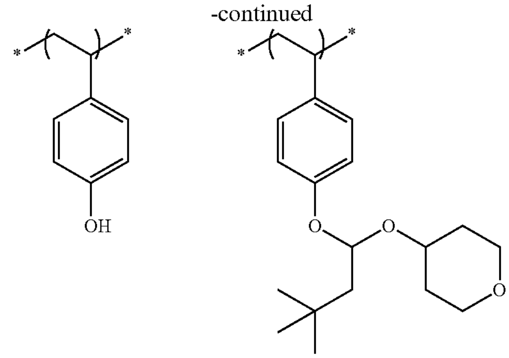
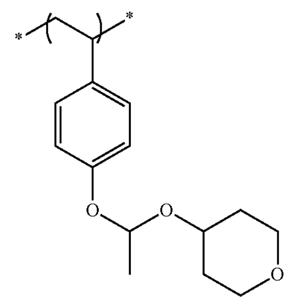
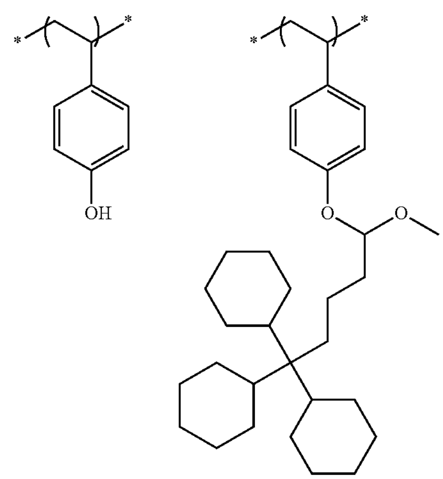
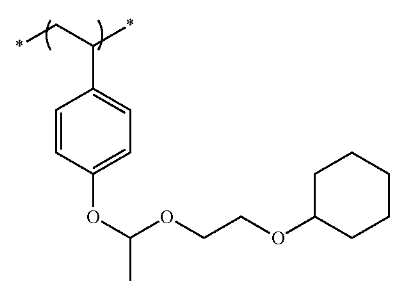

-continued
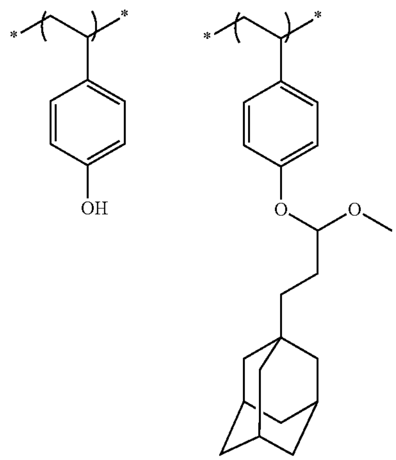
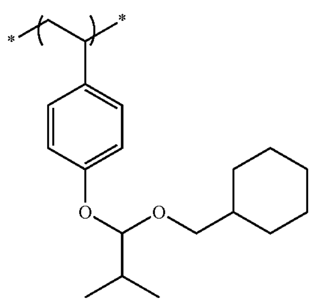
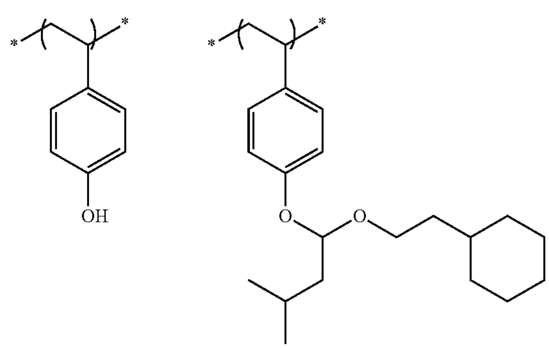
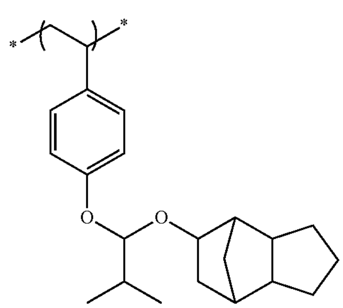
-continued
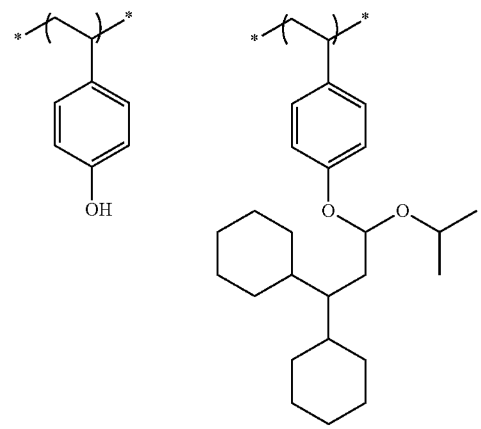
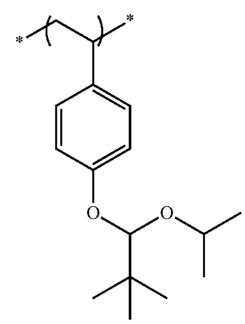
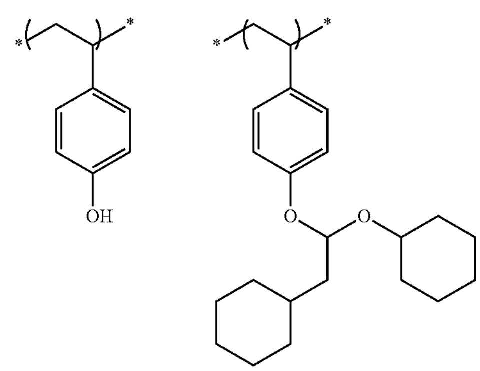
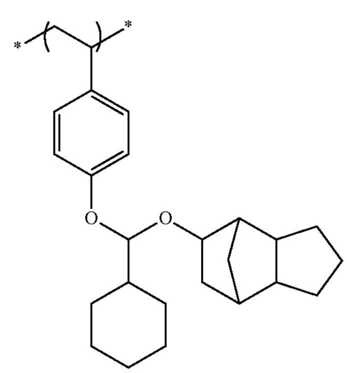

-continued
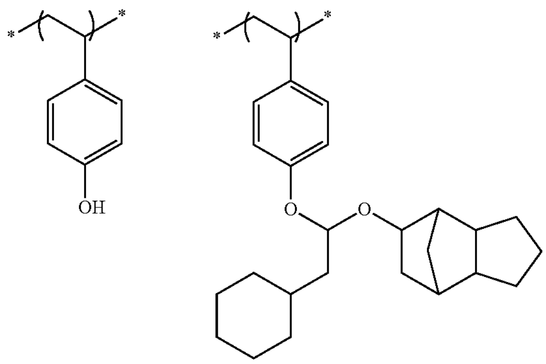
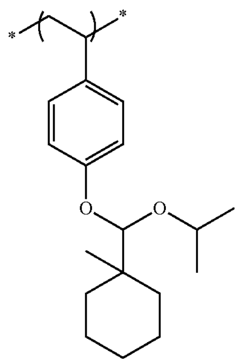
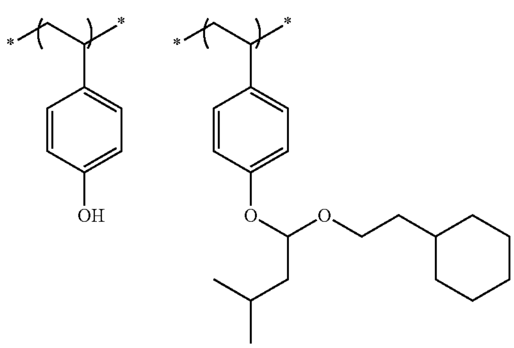
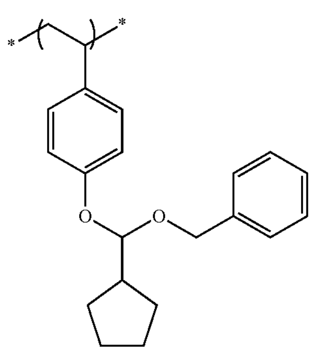
-continued
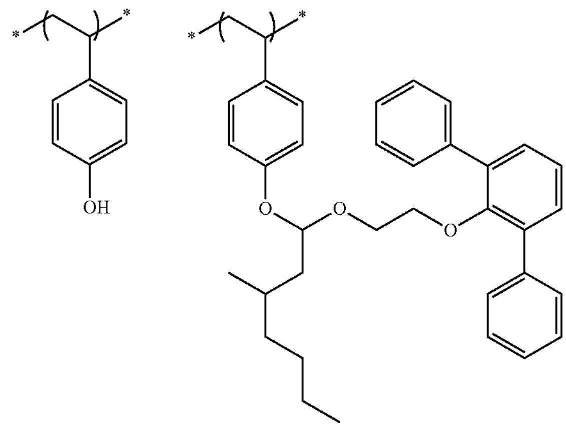
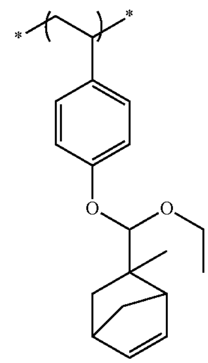
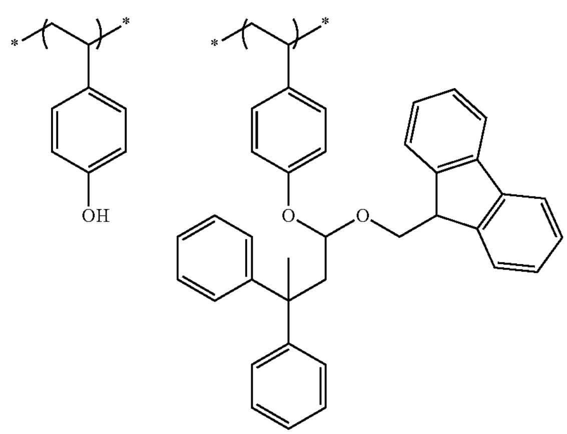
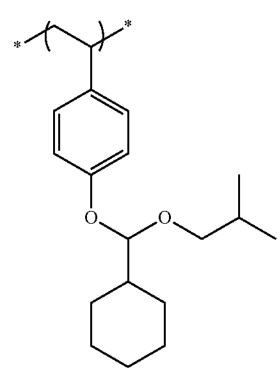

-continued
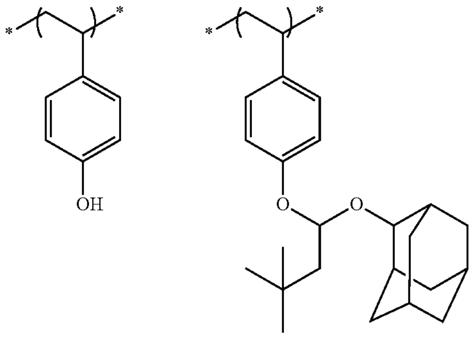
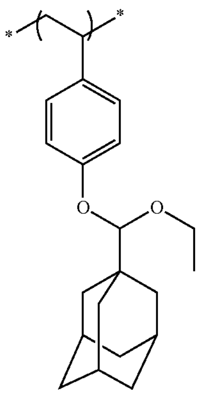
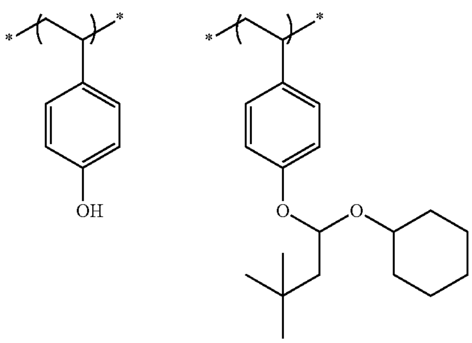
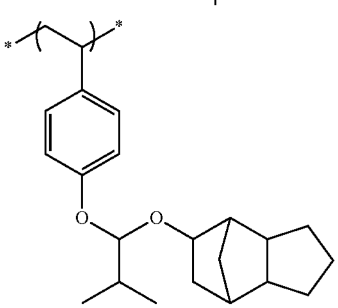
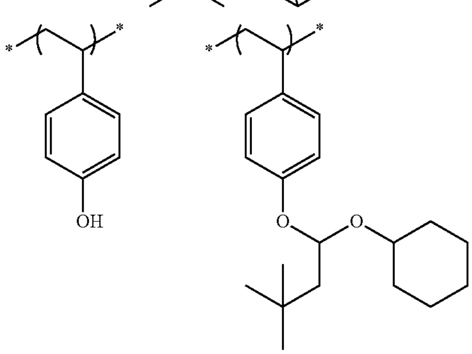
-continued
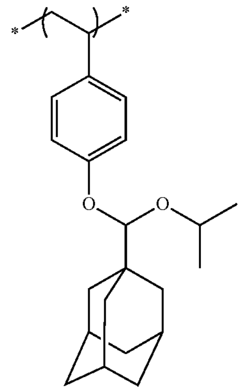
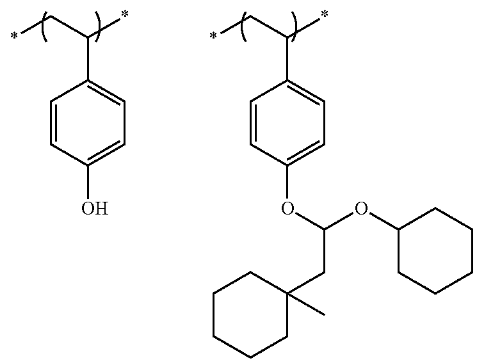
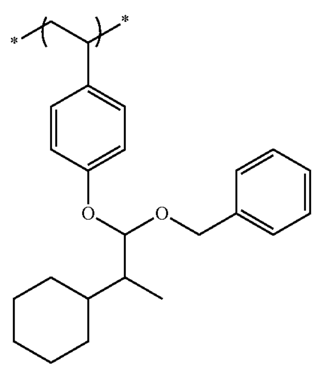
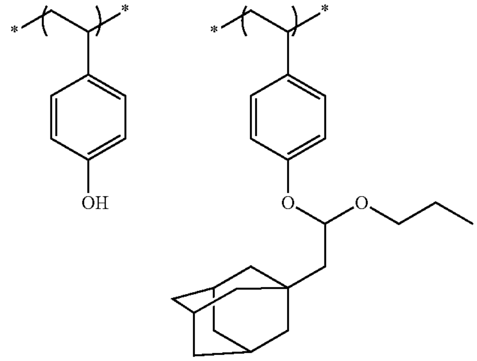

-continued
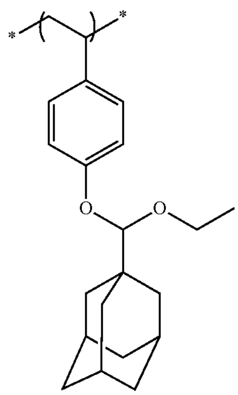
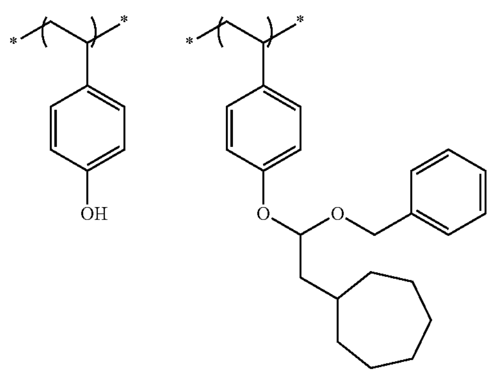
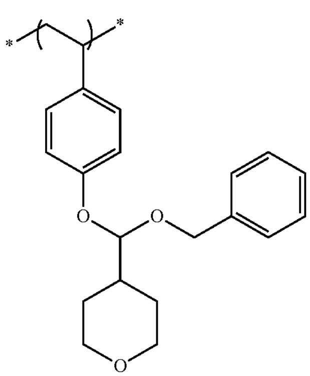
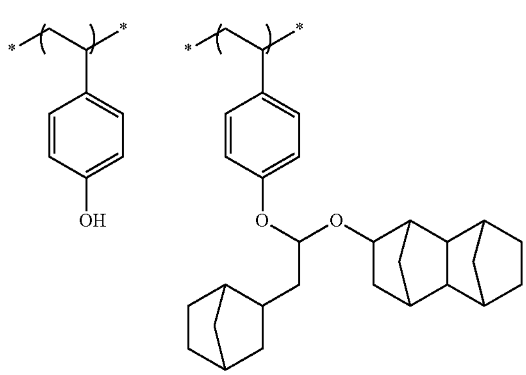
-continued
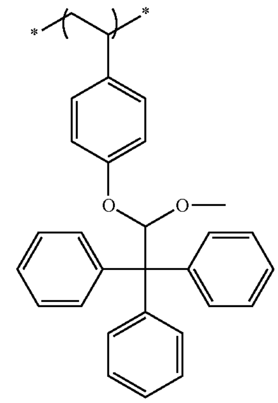
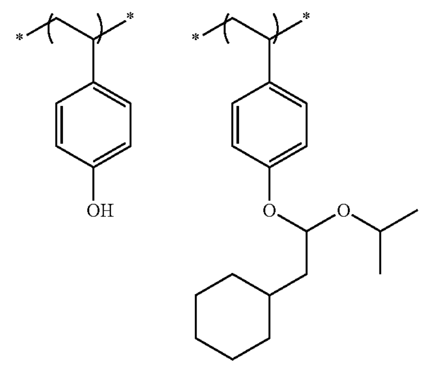
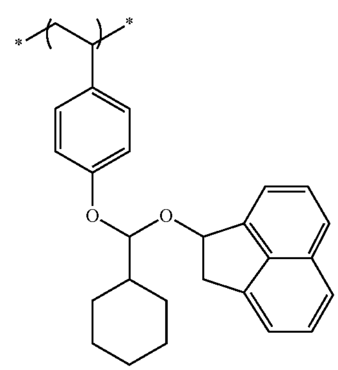
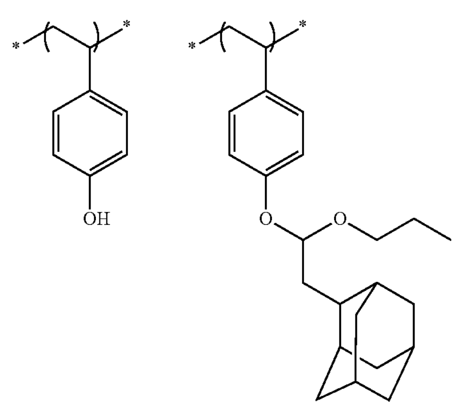

-continued
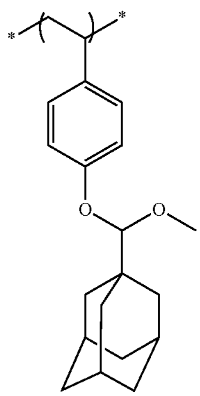
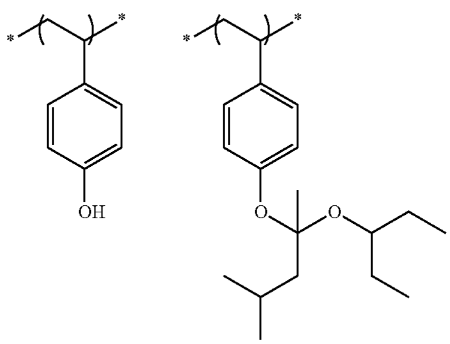
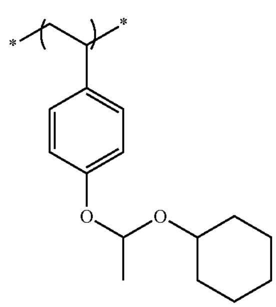
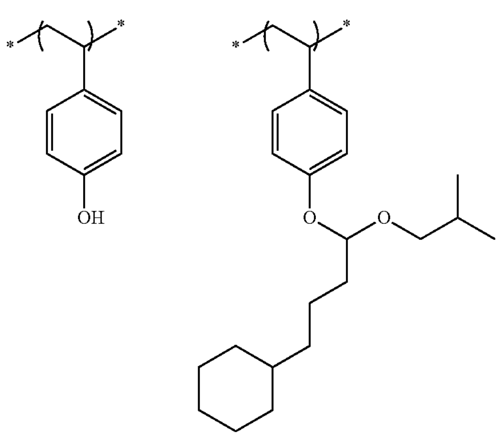
-continued
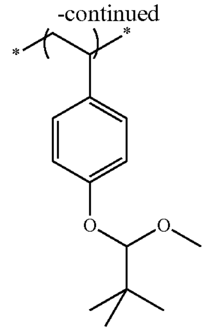
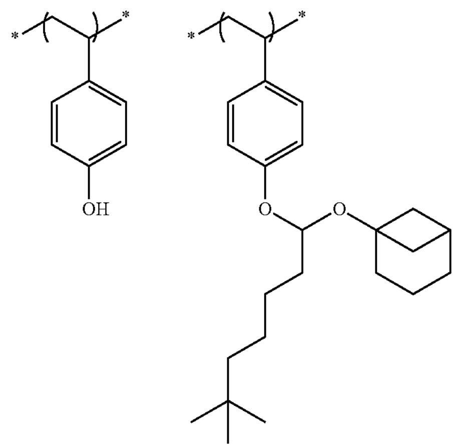
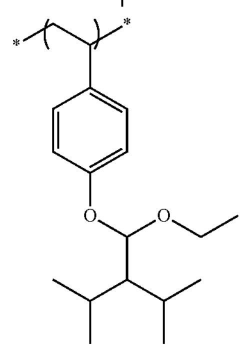
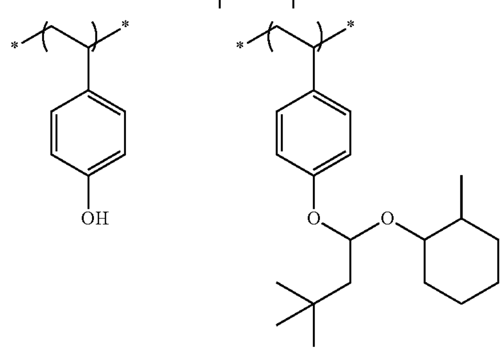
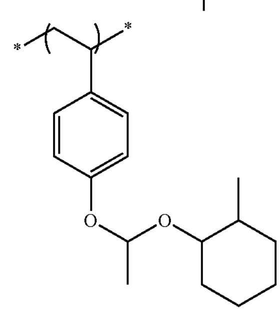

-continued
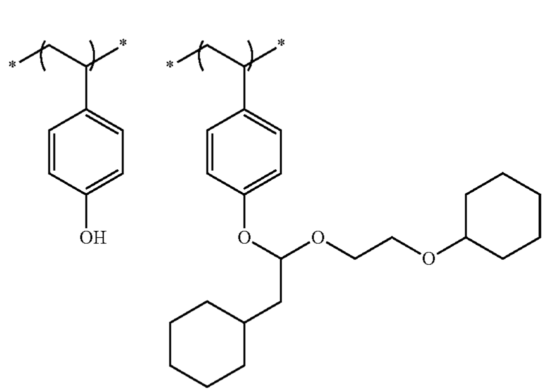
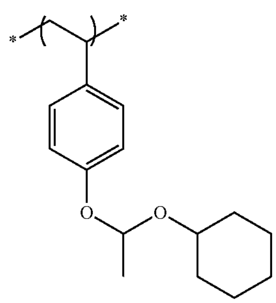
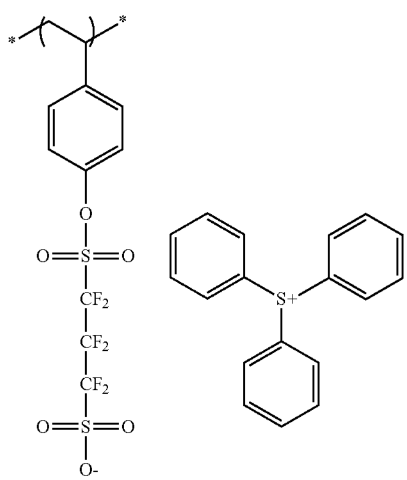
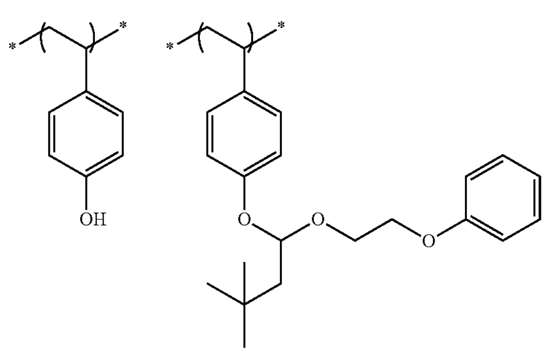
-continued
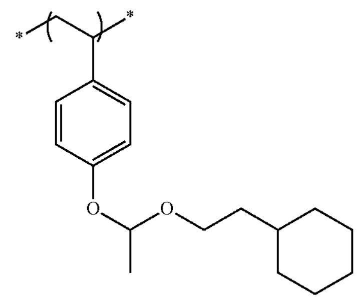
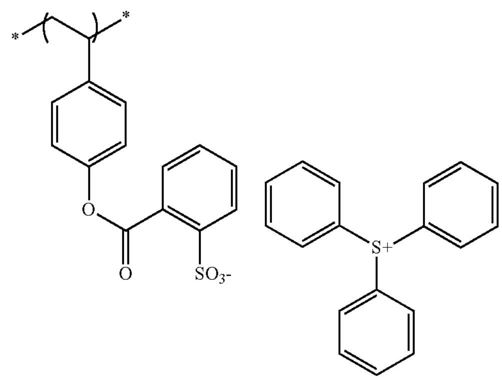
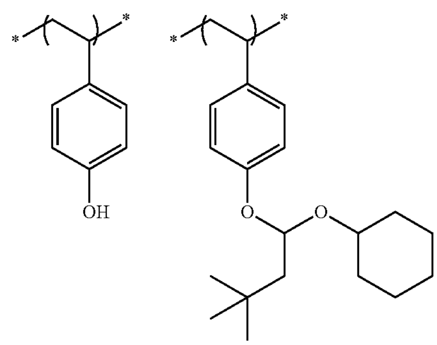
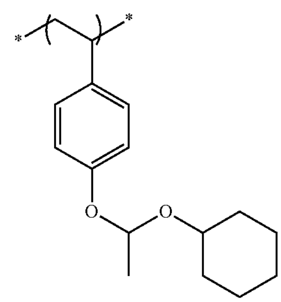
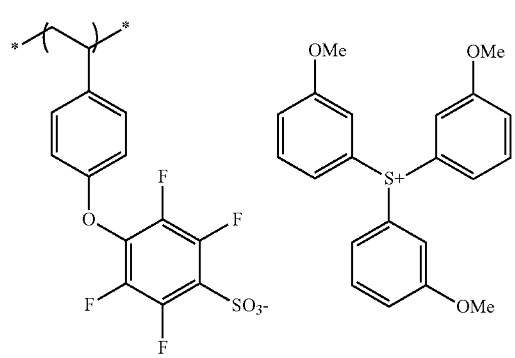

-continued
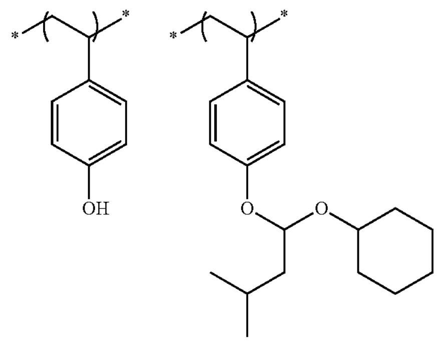
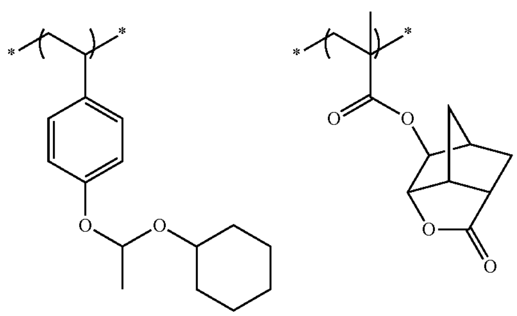
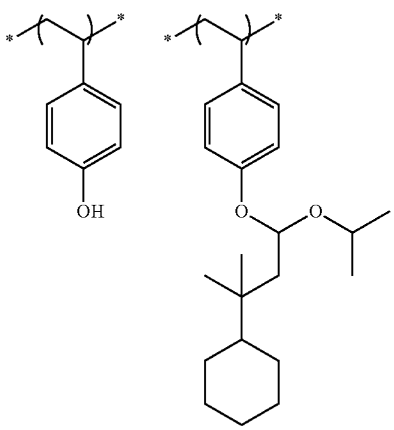
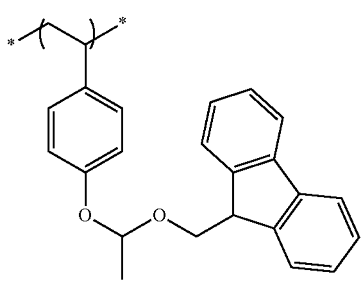
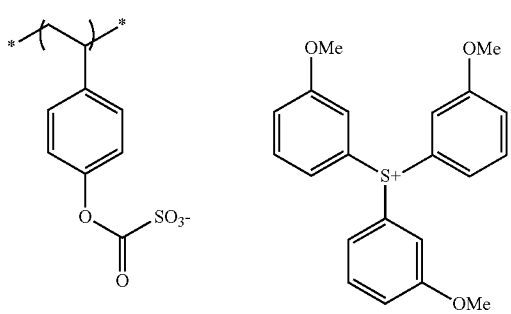
-continued
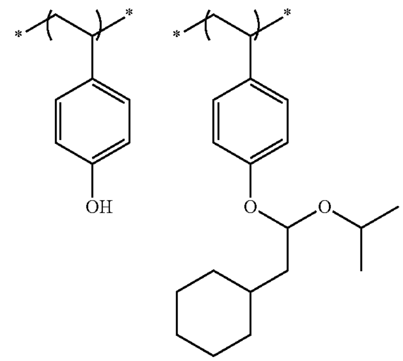
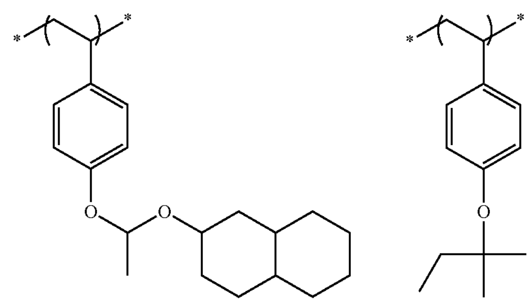
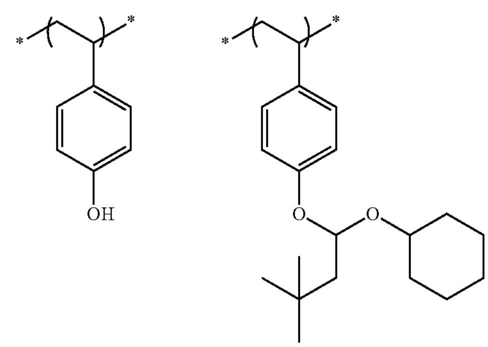
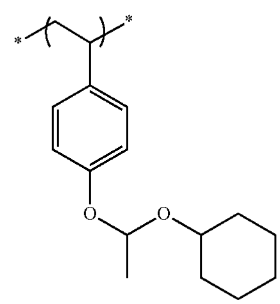
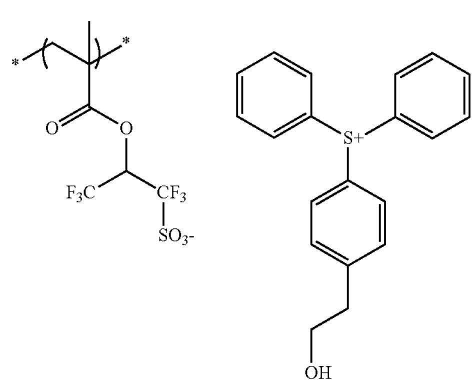

-continued
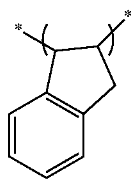
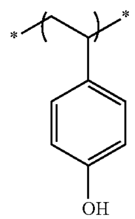
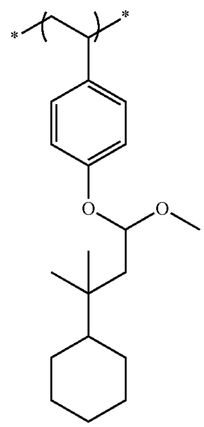
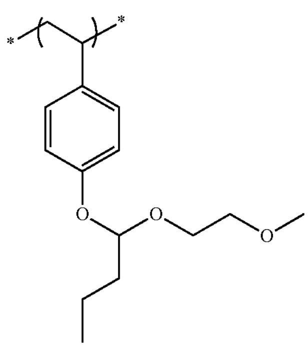
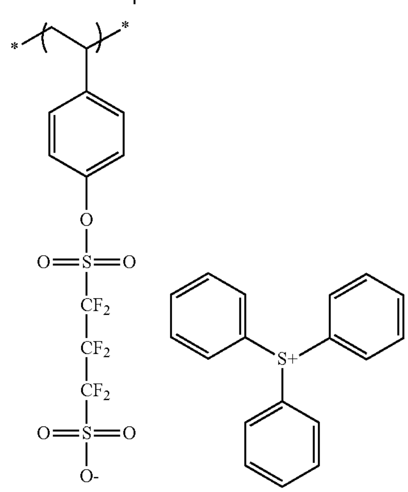
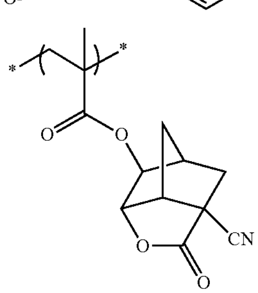
-continued
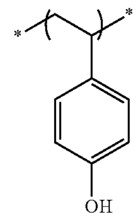
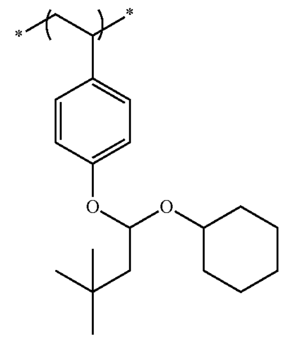
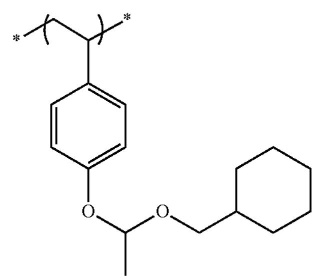
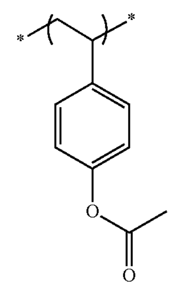
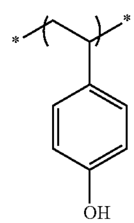
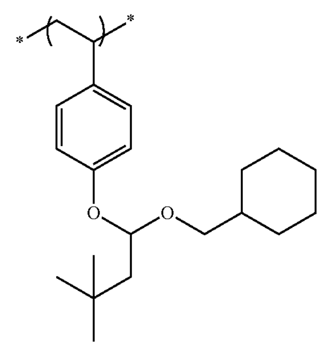
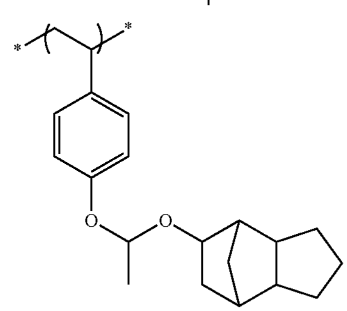
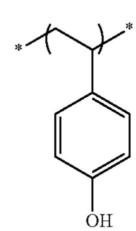
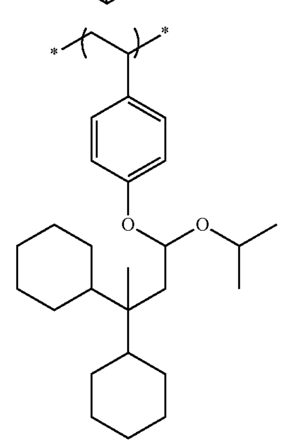

-continued
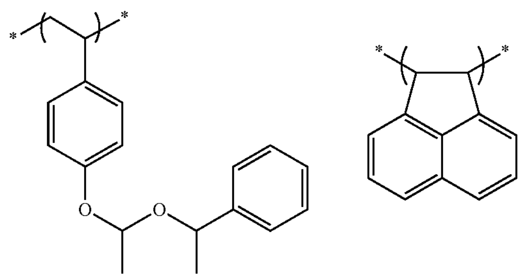
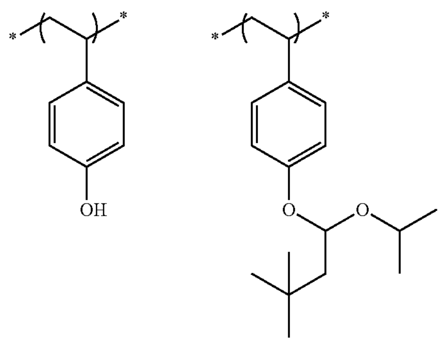
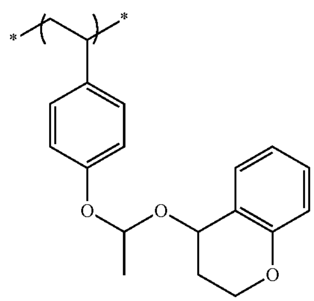
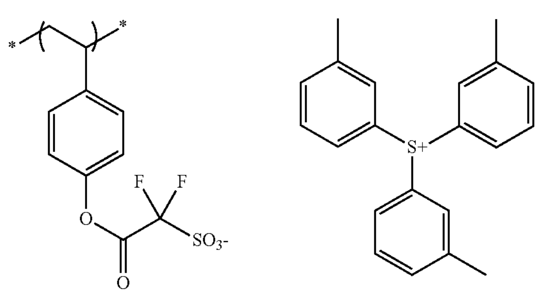
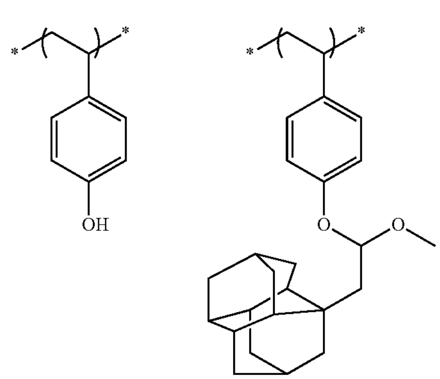
-continued
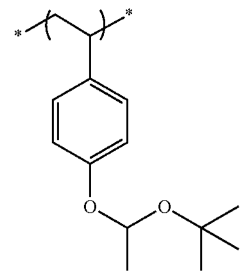
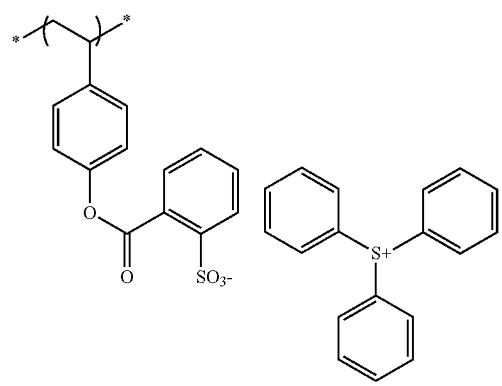
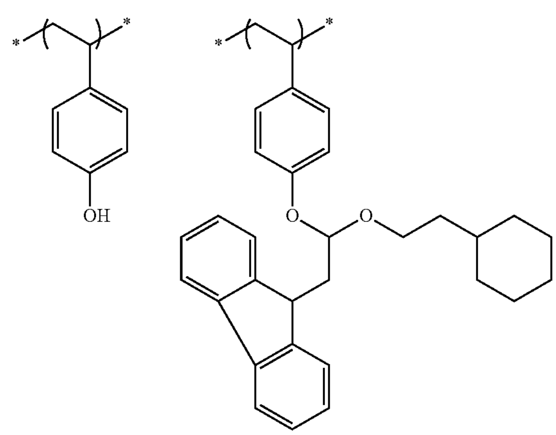
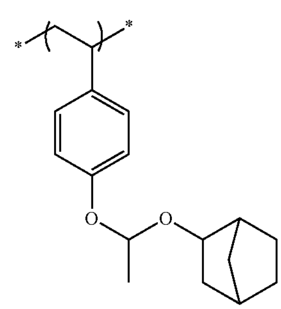

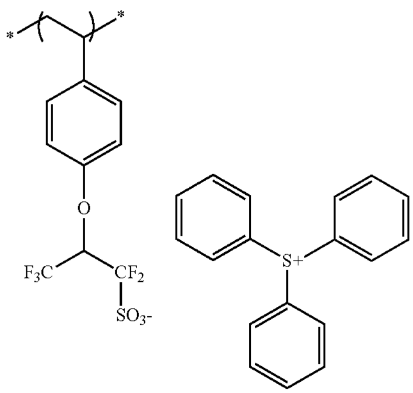
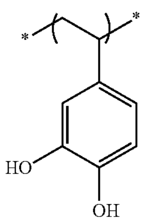
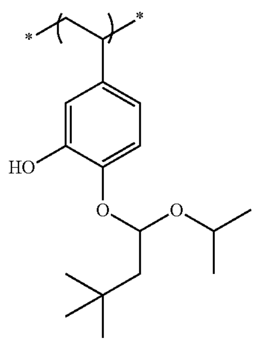
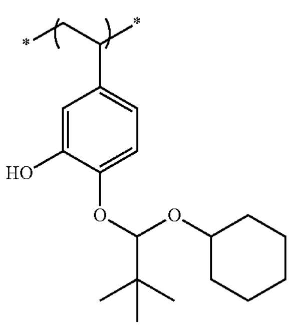
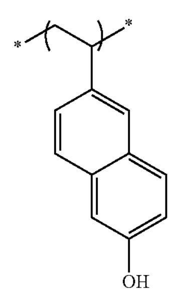
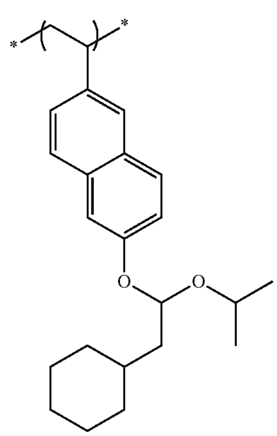
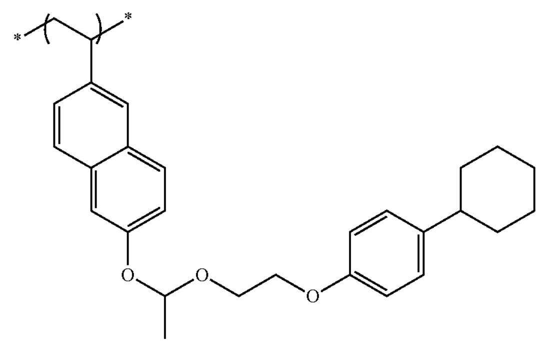
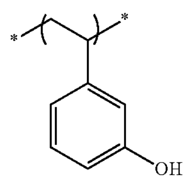
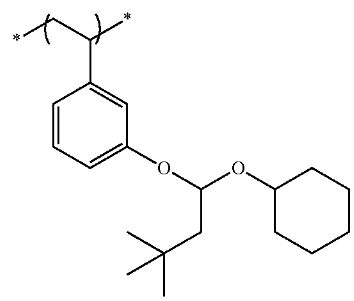
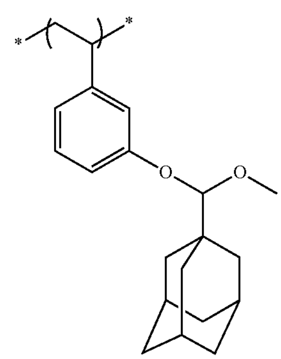
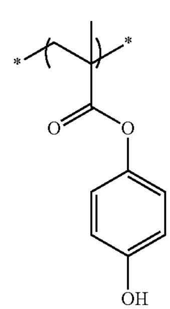
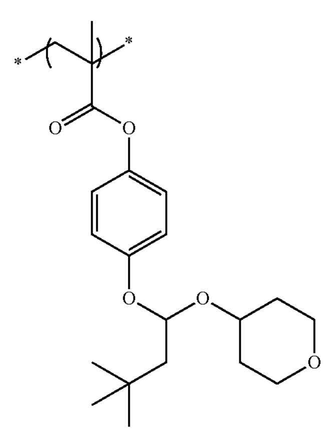

-continued
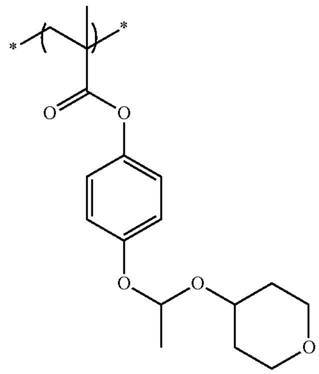
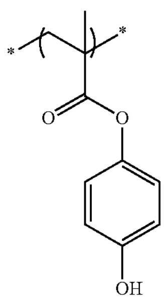
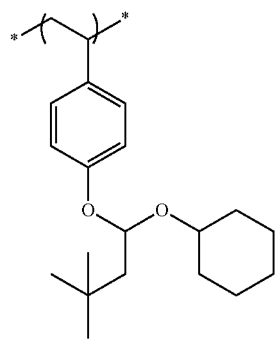
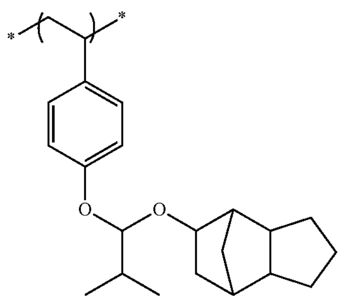
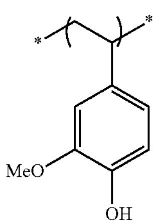
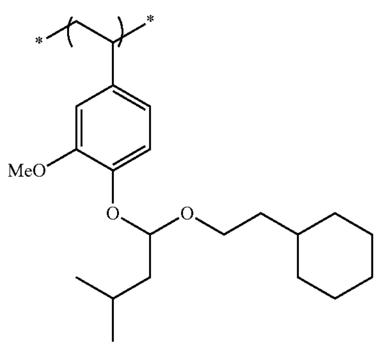
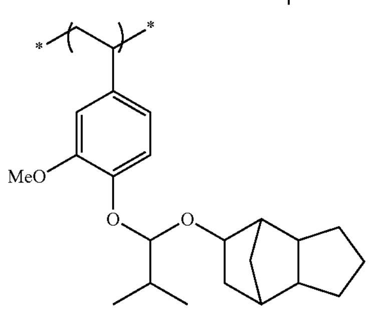
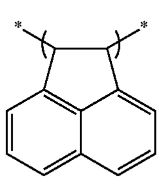
-continued
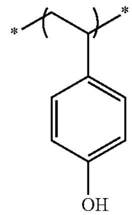
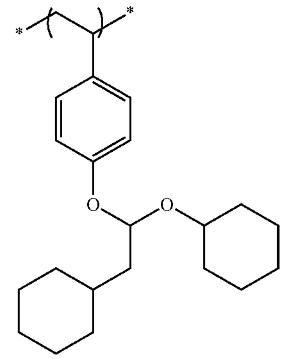
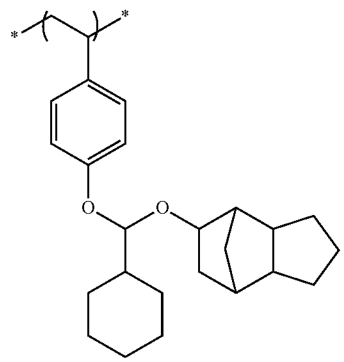
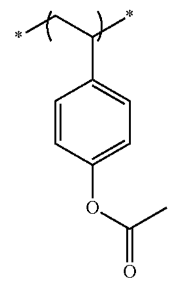
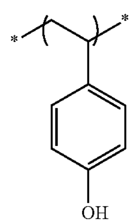
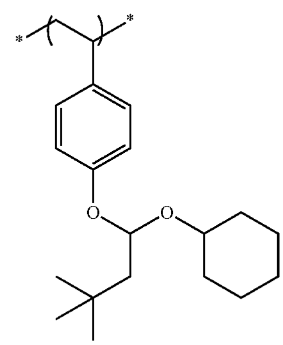
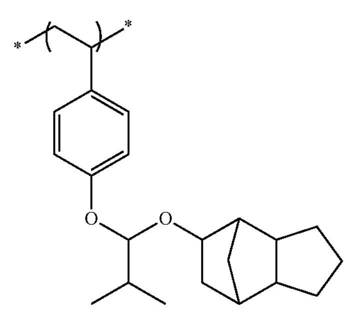
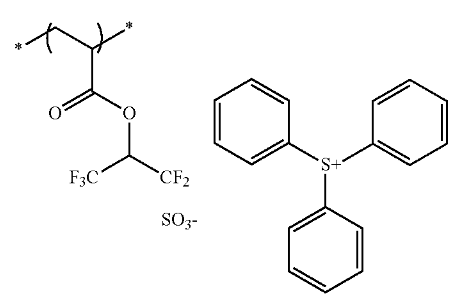

-continued
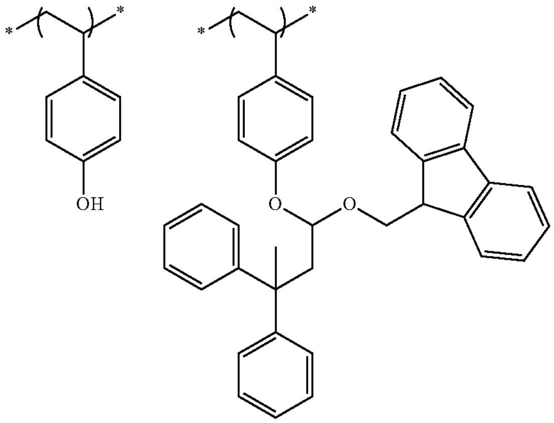
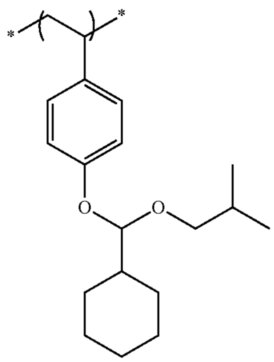
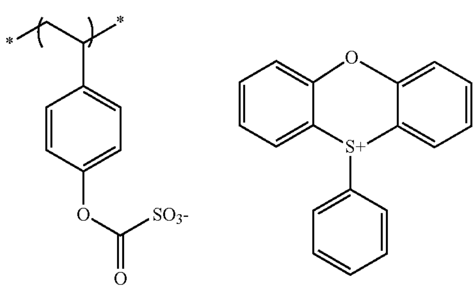
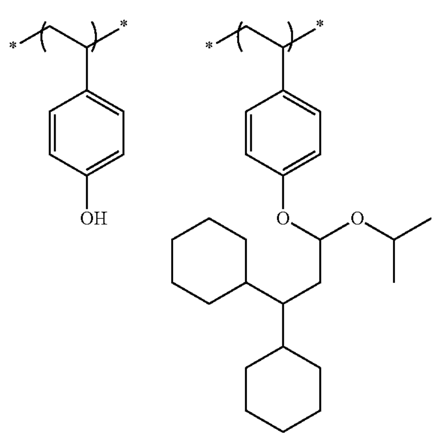
-continued
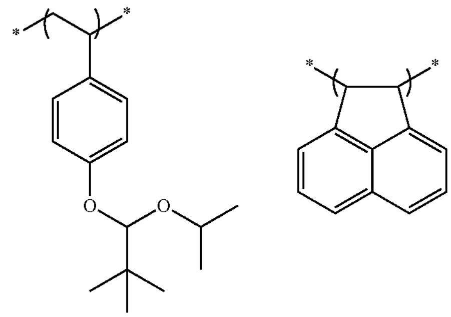
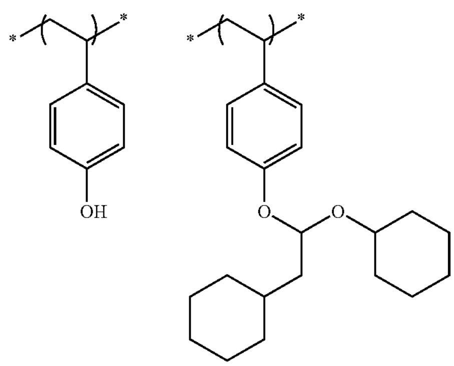
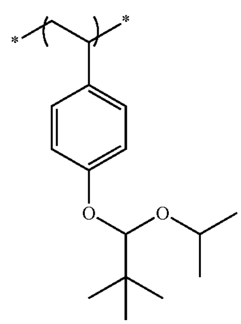
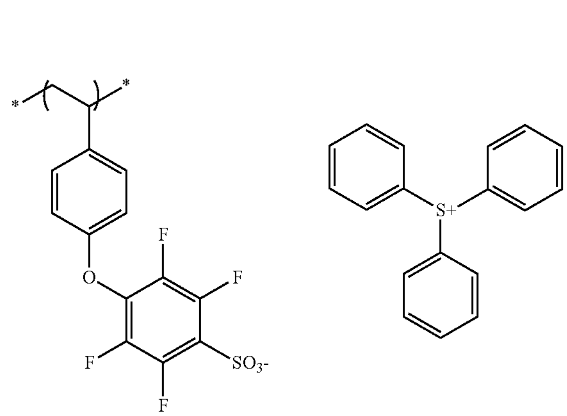

-continued
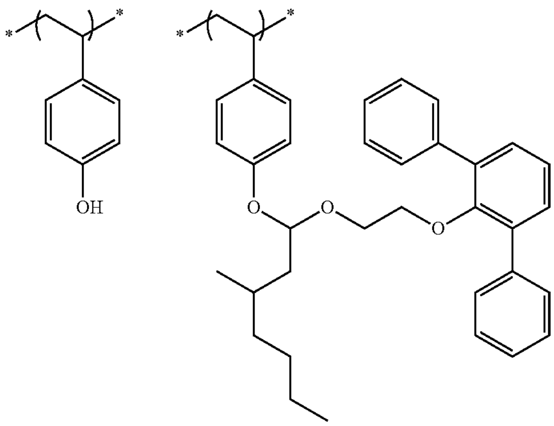
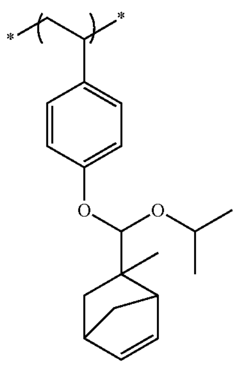
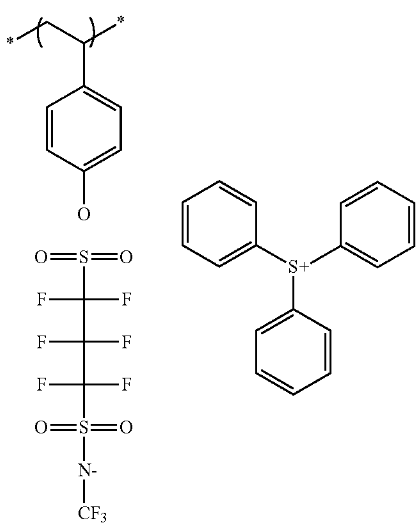
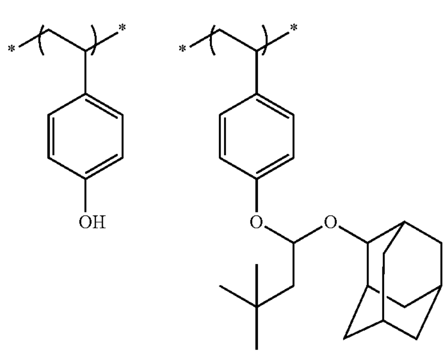
-continued
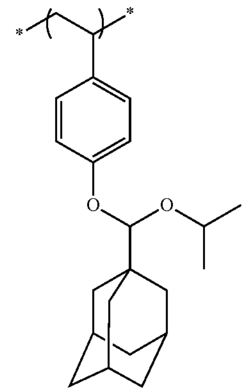
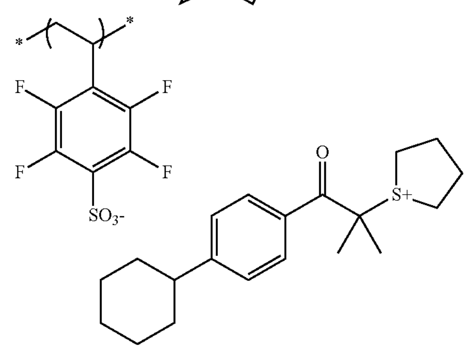
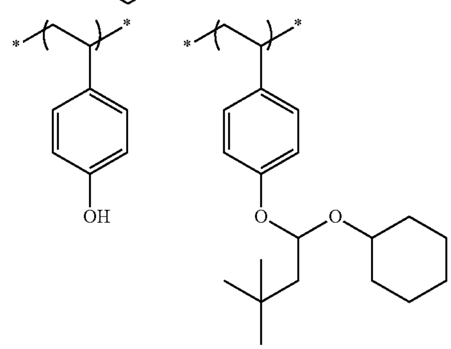
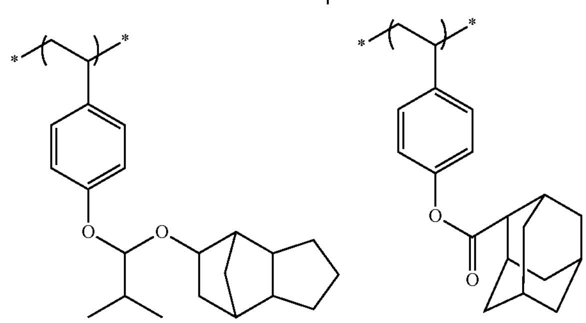
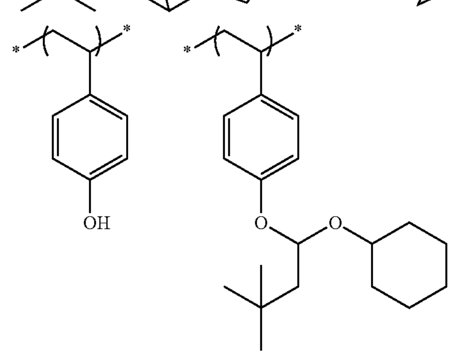

-continued
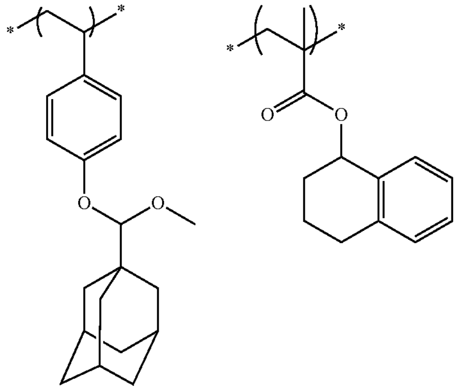
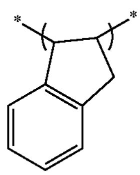
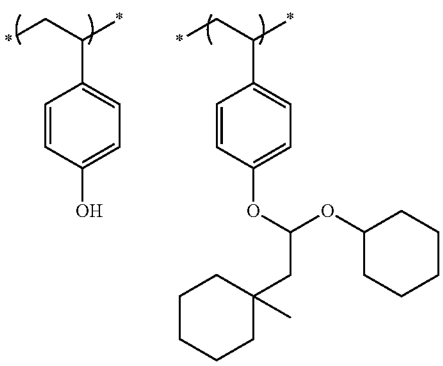
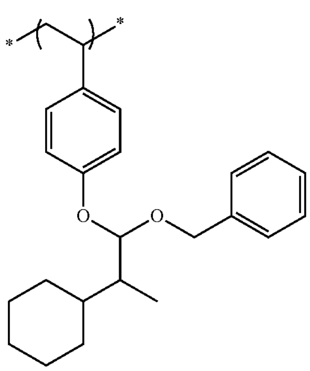
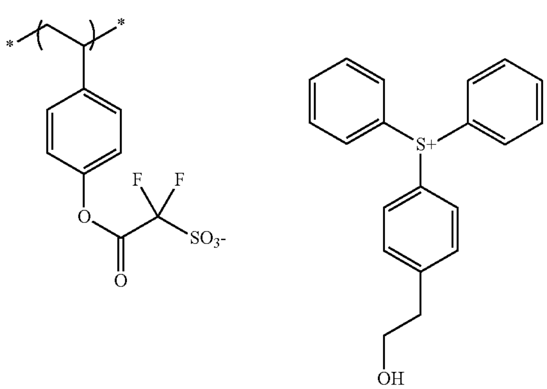
-continued
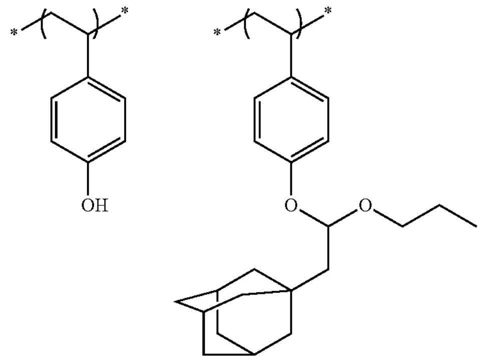
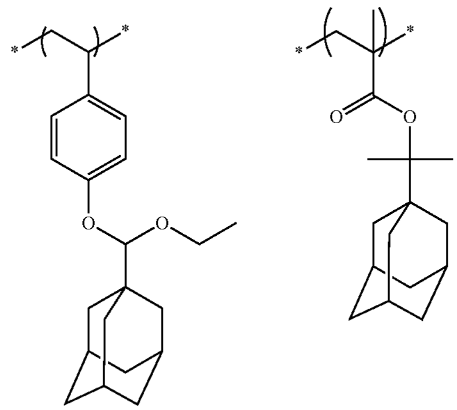
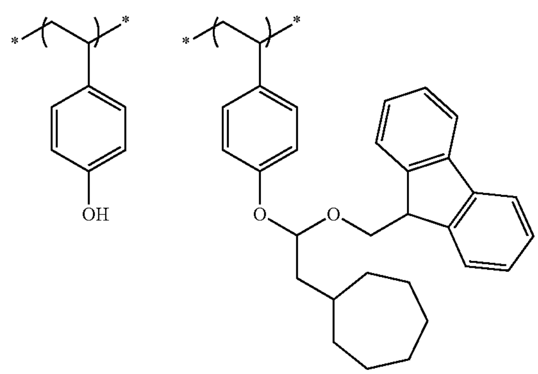
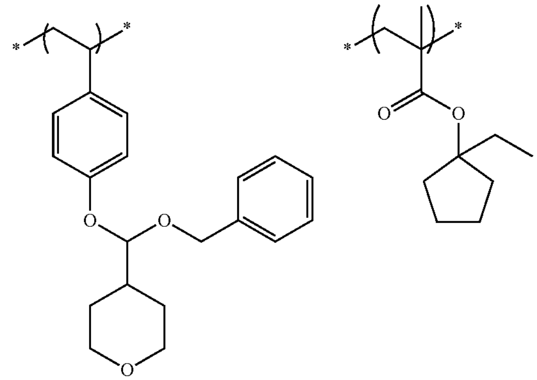

-continued
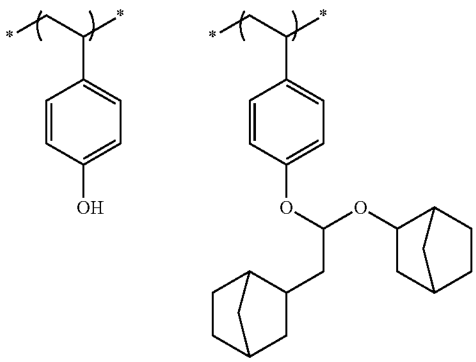
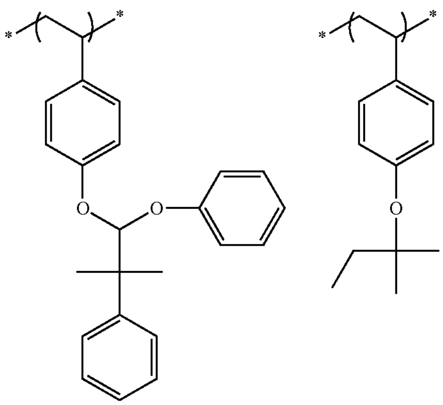
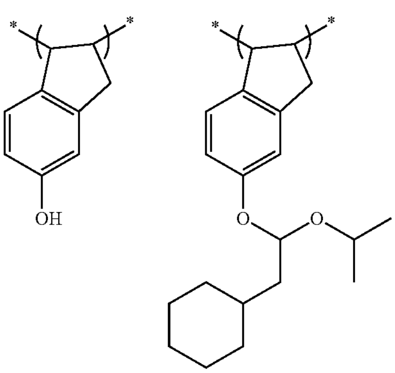
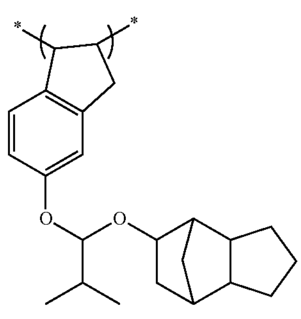
-continued
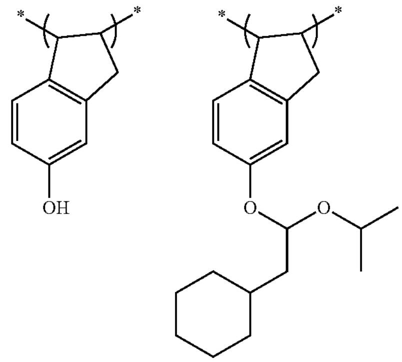
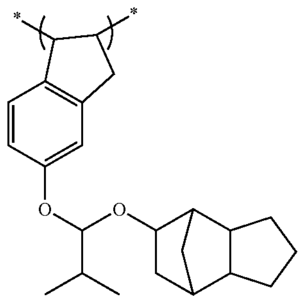
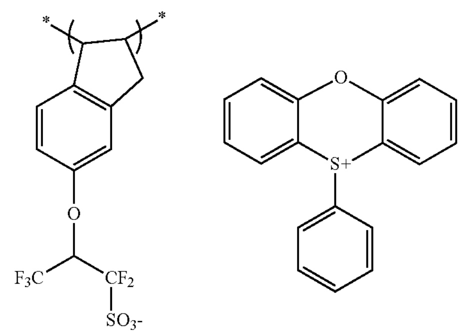
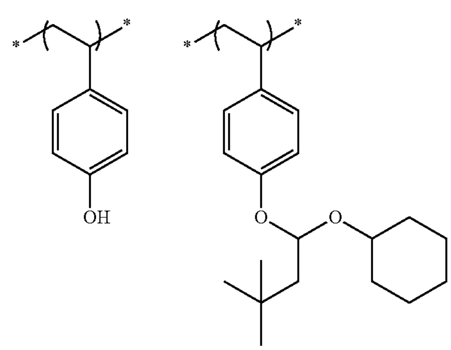
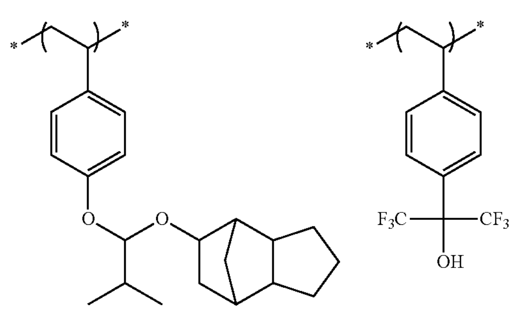

-continued
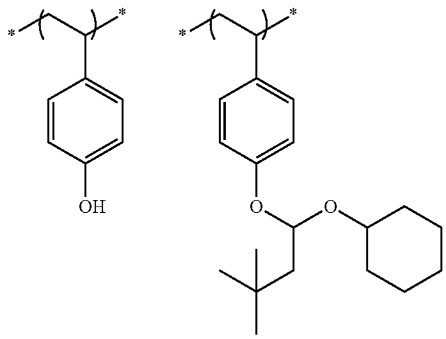
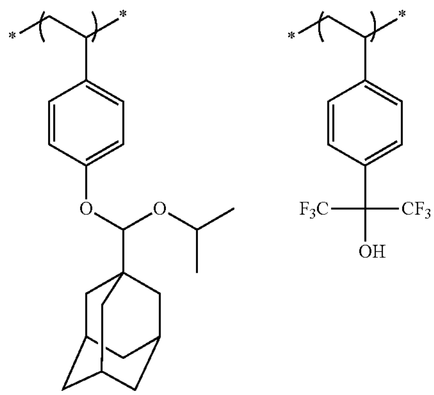
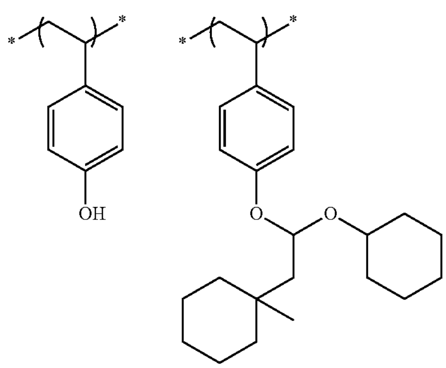
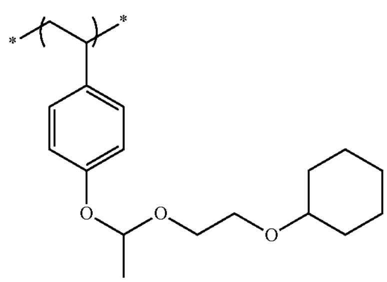
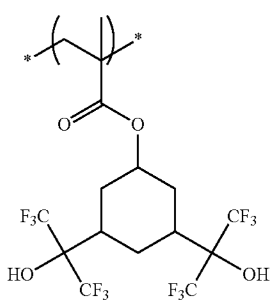
-continued
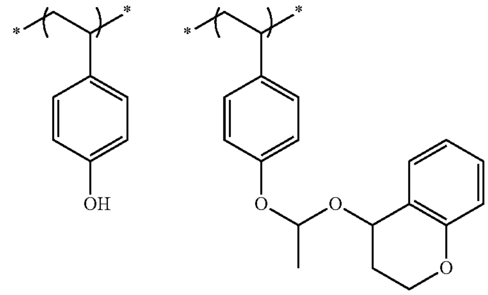
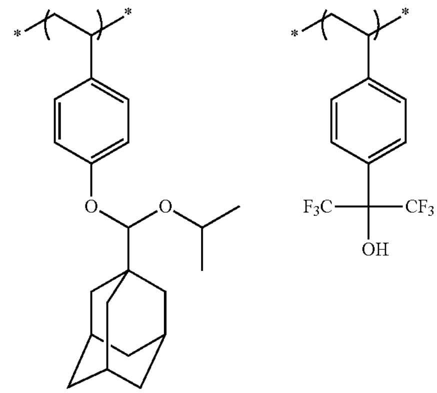
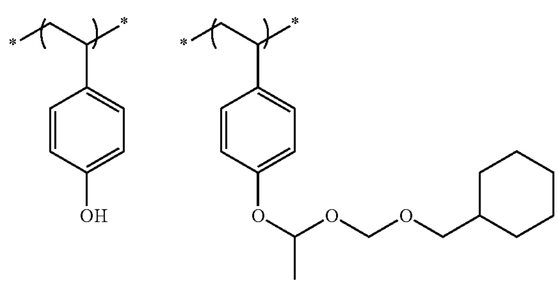
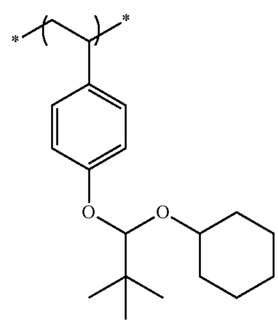
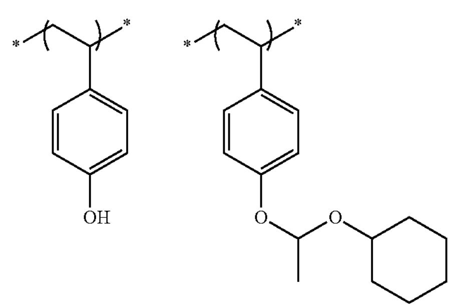

-continued
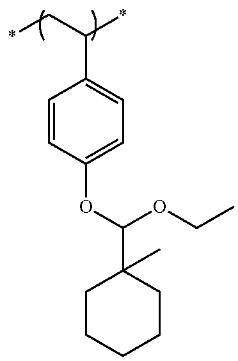
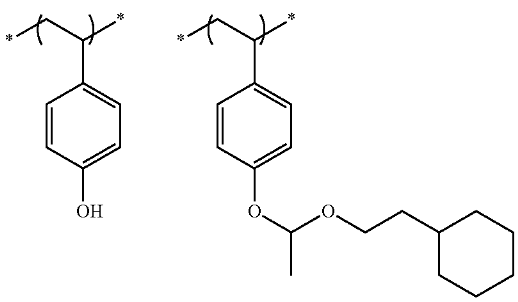
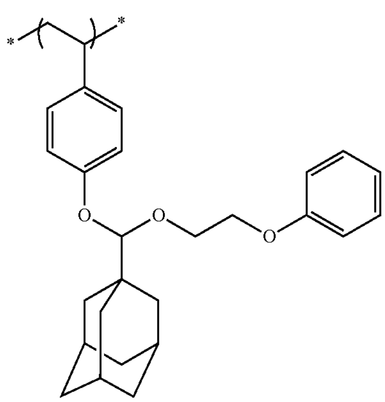
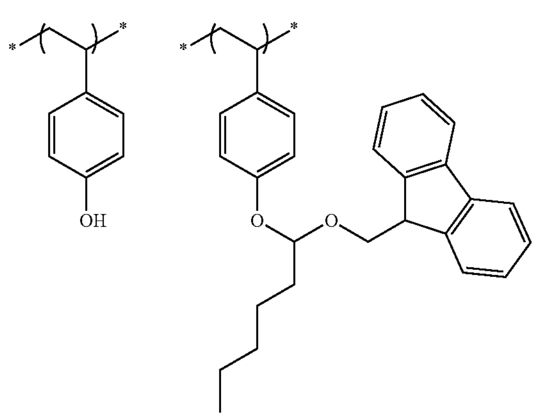
-continued
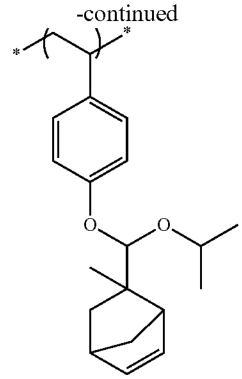
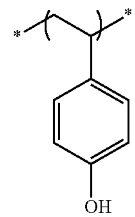
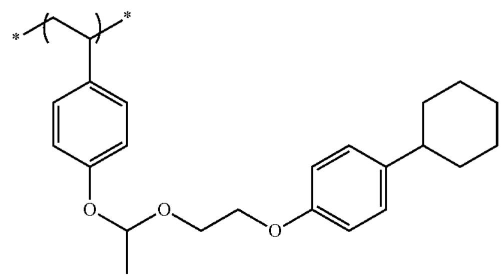
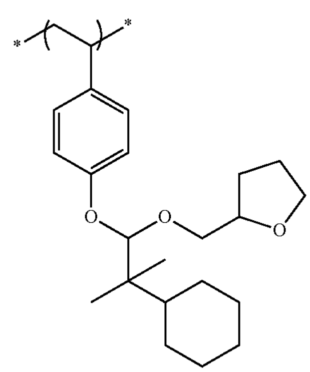
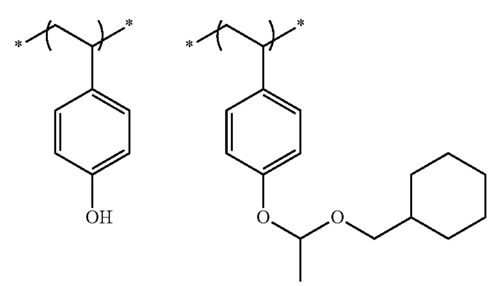

-continued
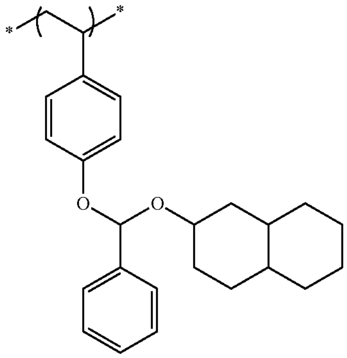
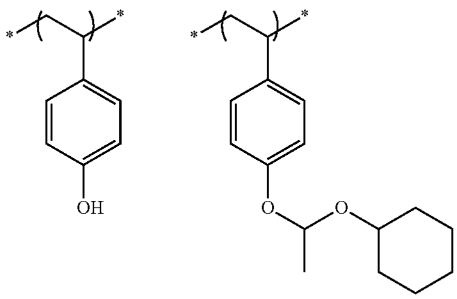
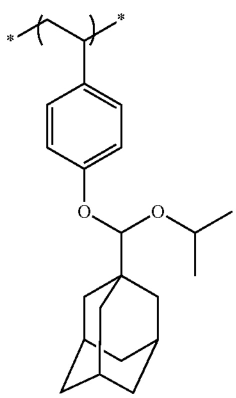
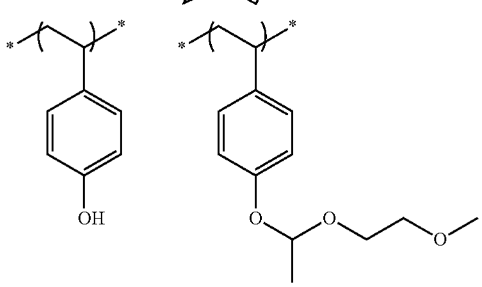
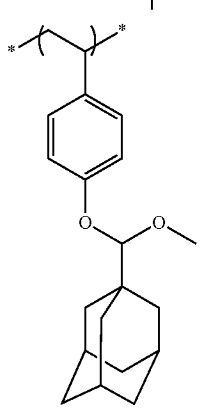
-continued
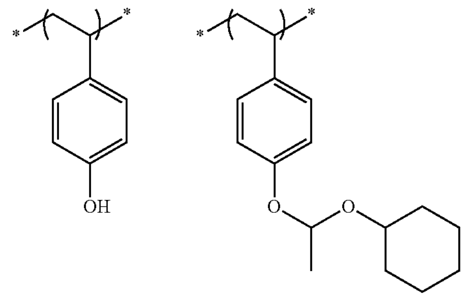
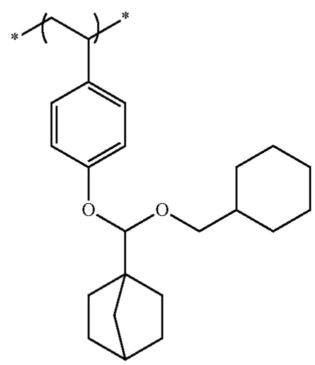
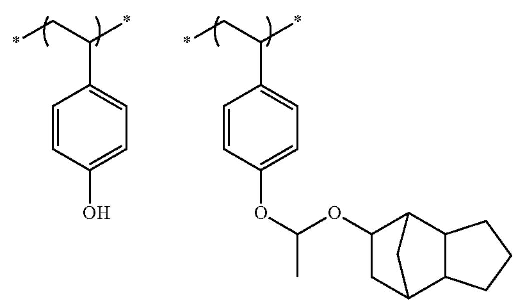
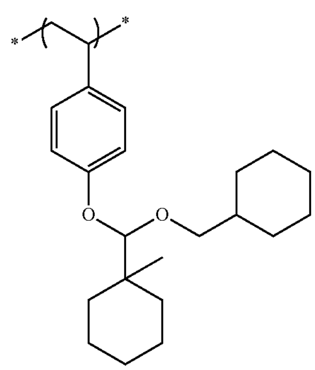
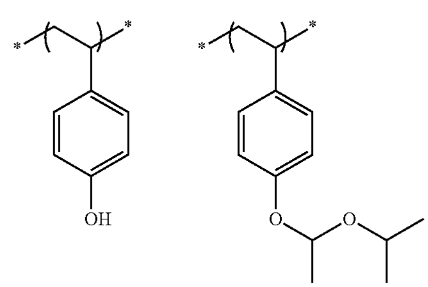

-continued
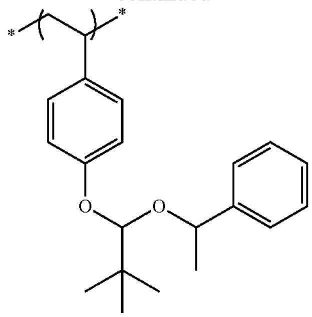
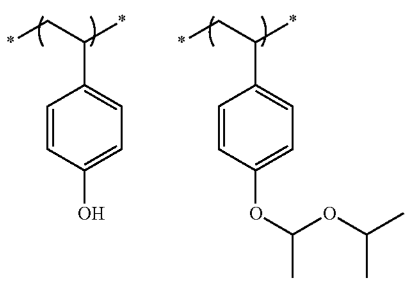
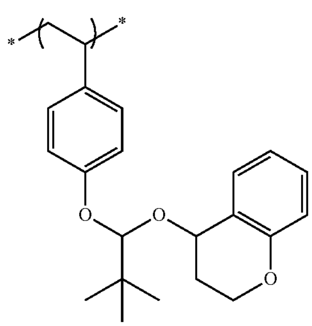
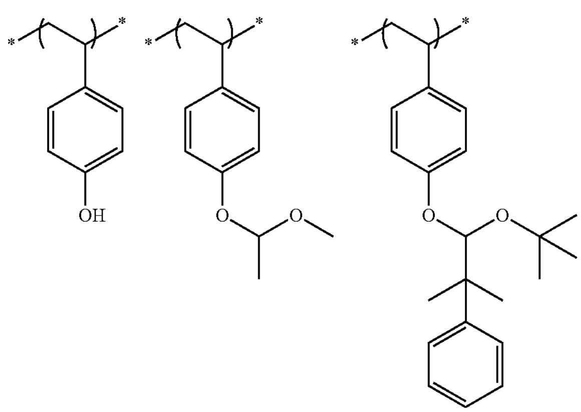
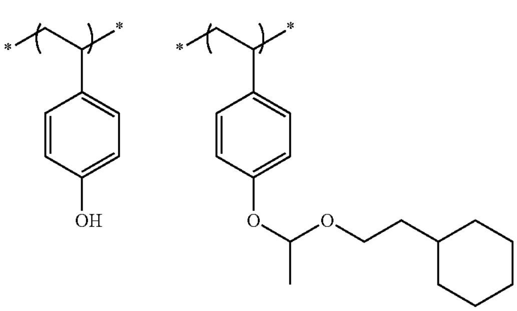
-continued
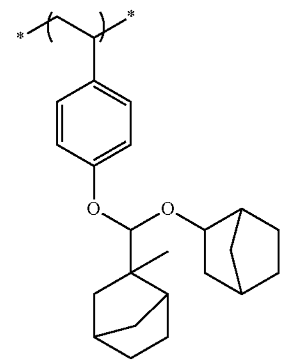
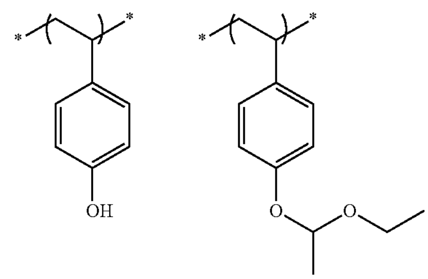
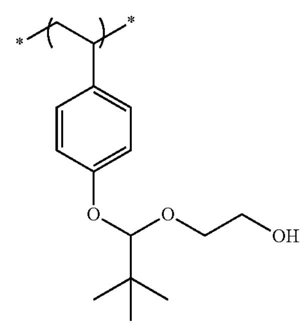
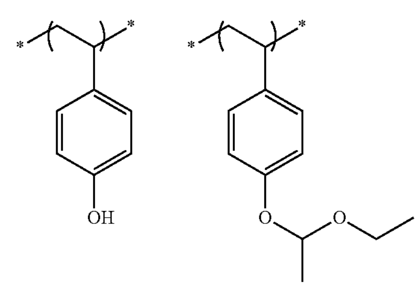
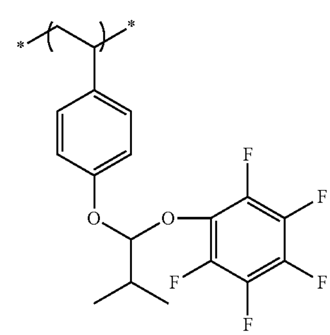

-continued
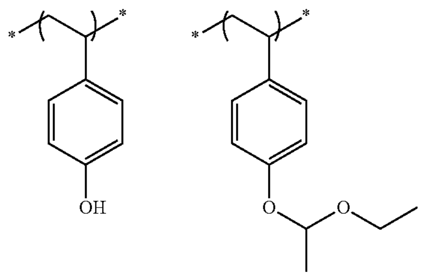
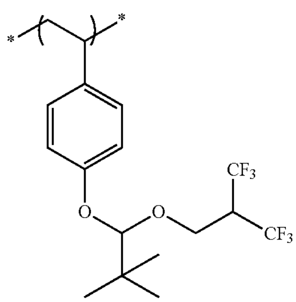
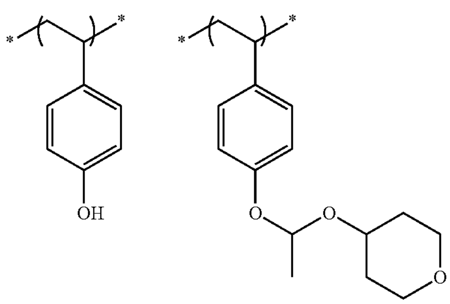
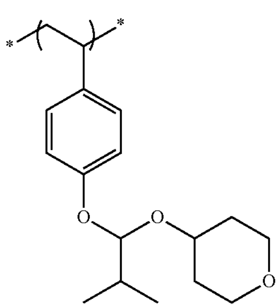
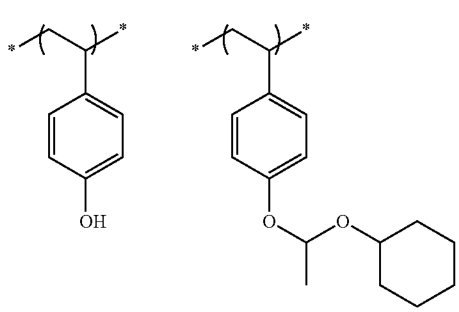
-continued
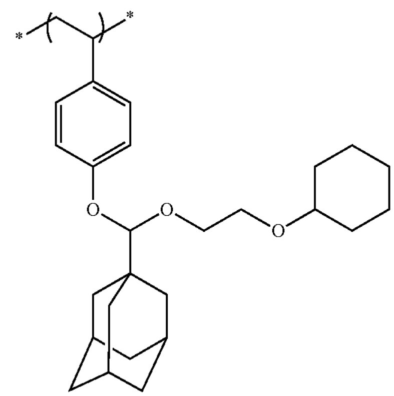
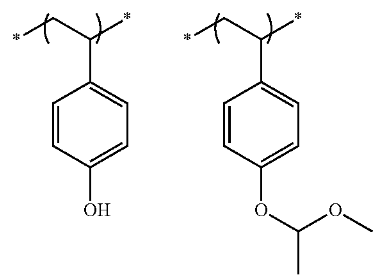
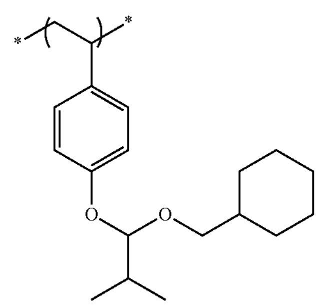
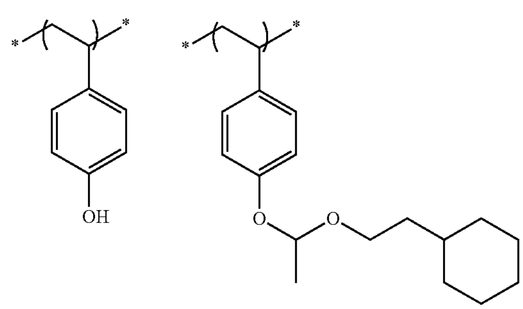
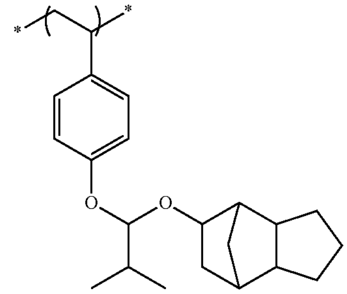

-continued
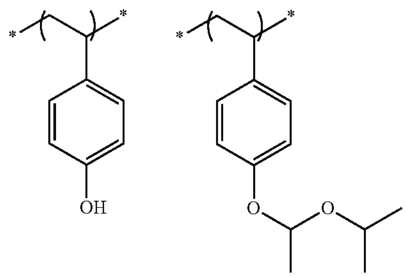
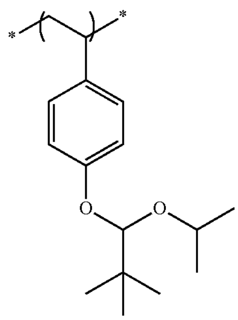
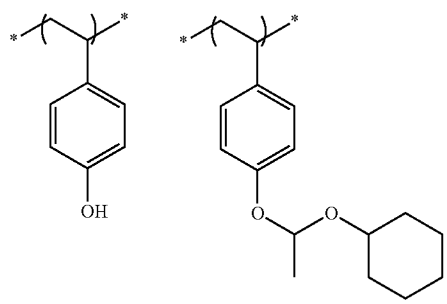
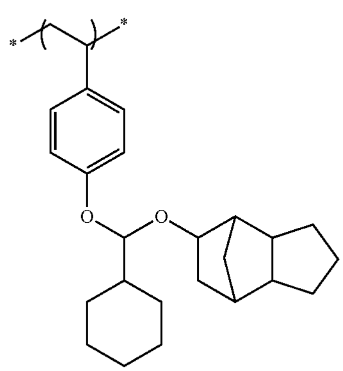
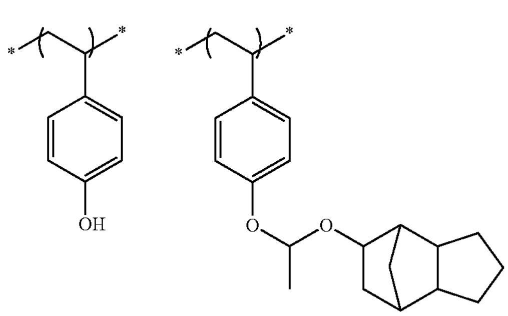
-continued
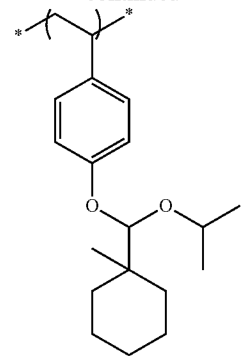
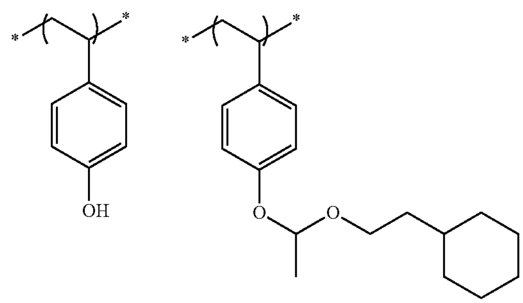
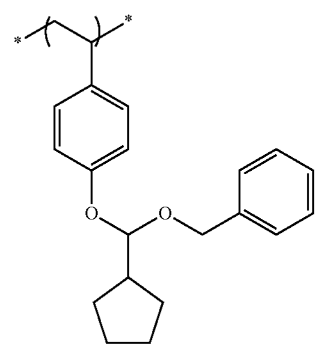
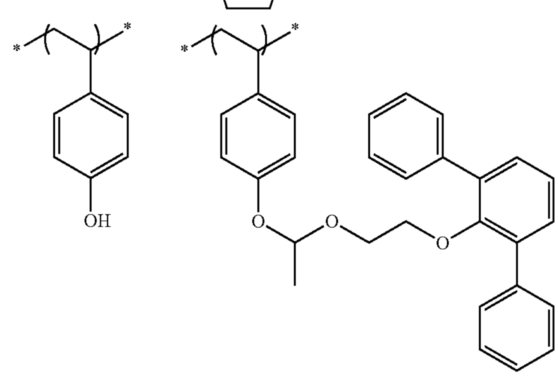
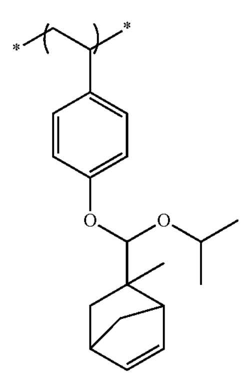

-continued
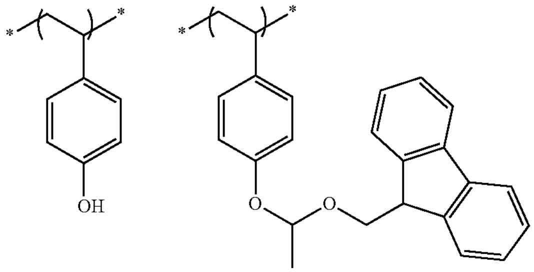
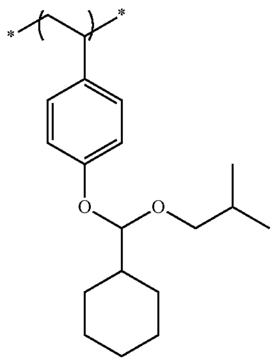
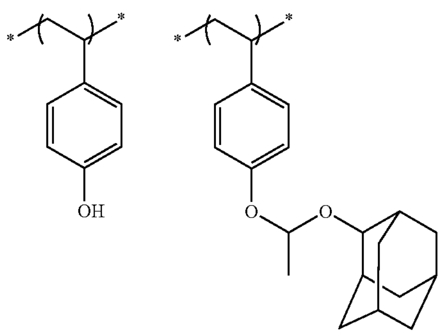
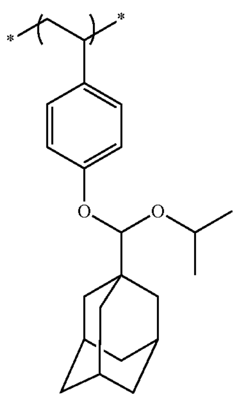
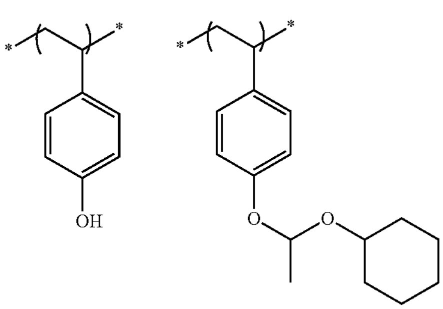
-continued
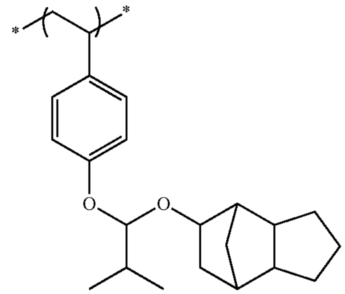
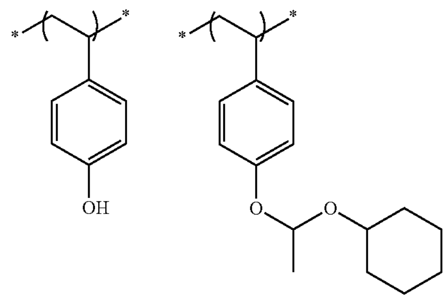
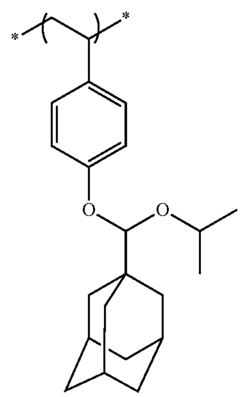
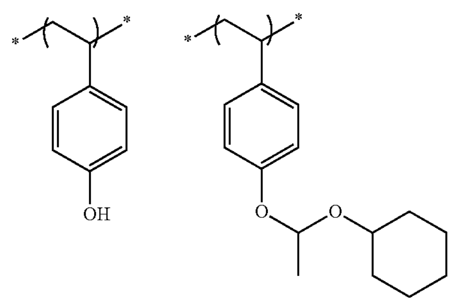
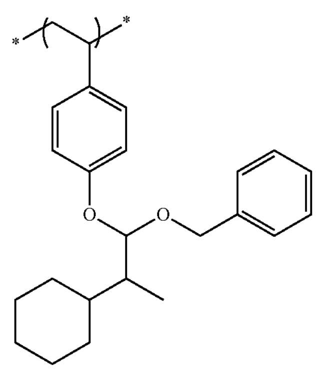

-continued
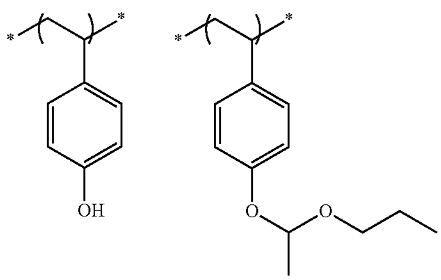
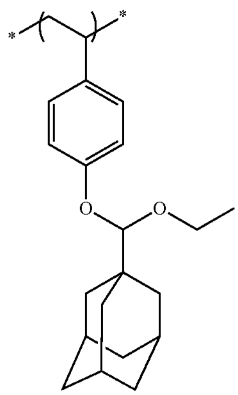
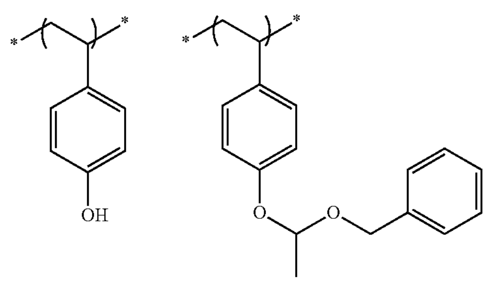
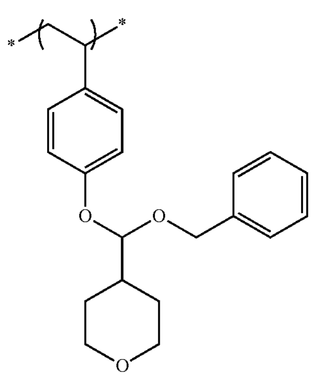
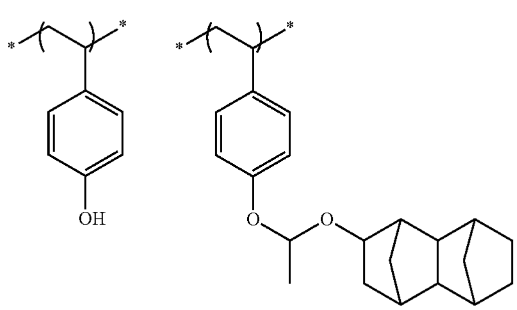
-continued
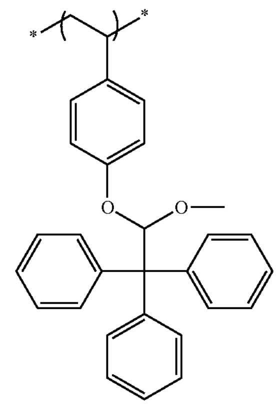
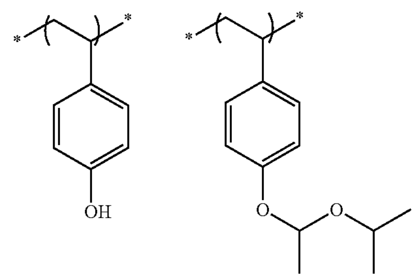
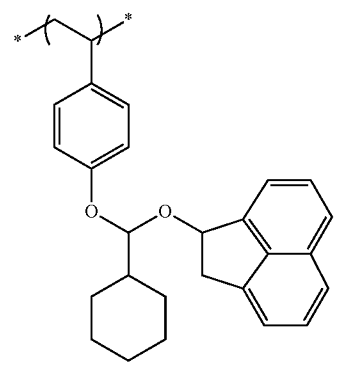
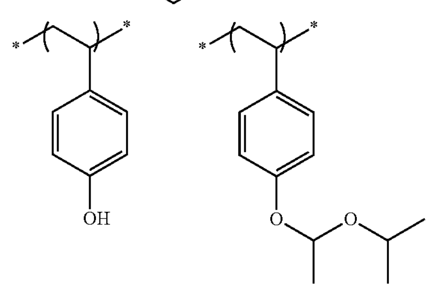
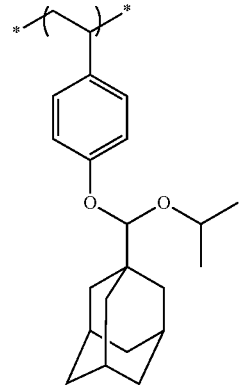

-continued
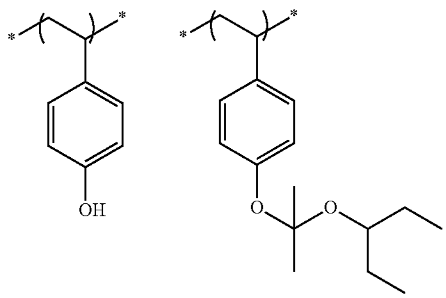
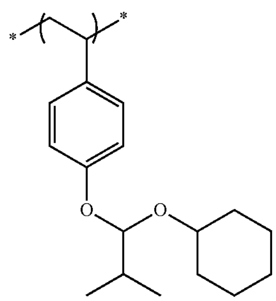
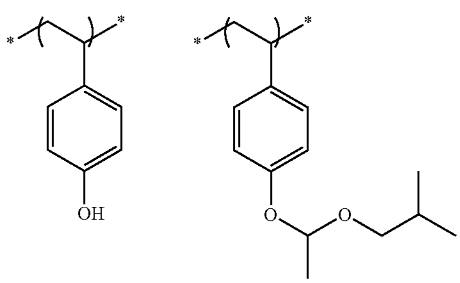
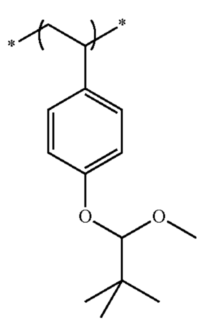
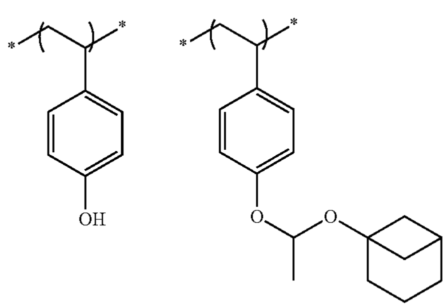
-continued
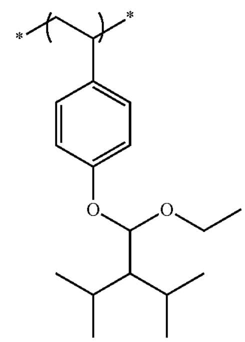
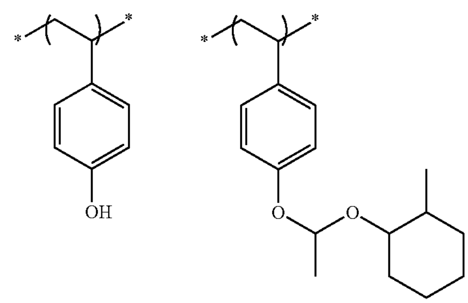
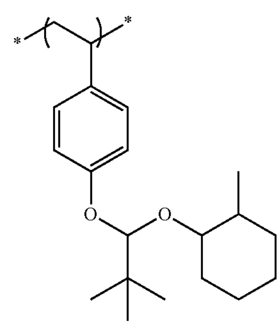
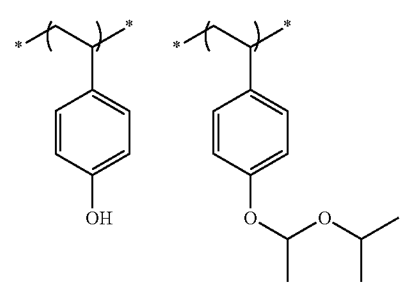
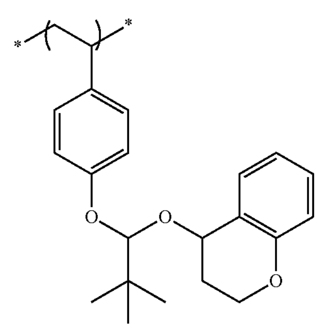

-continued
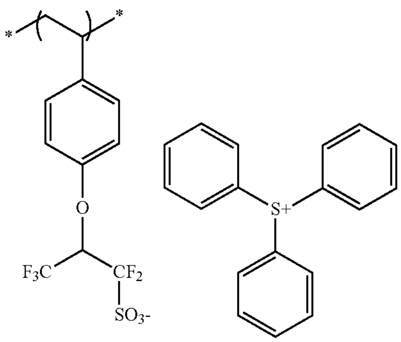
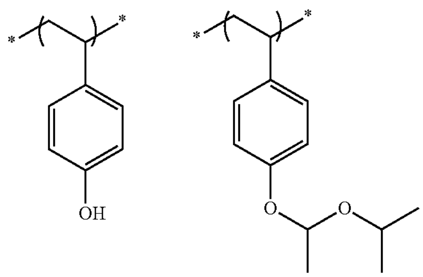
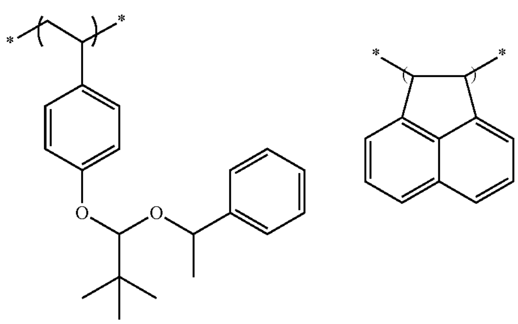
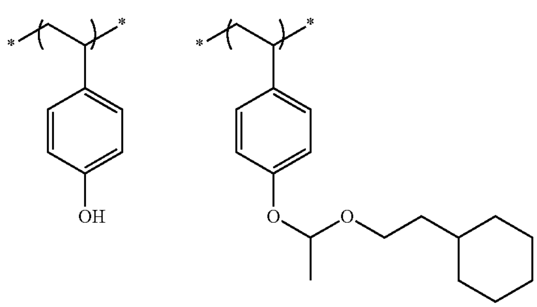
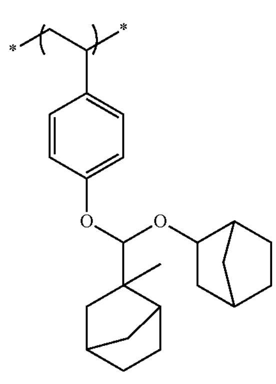
-continued
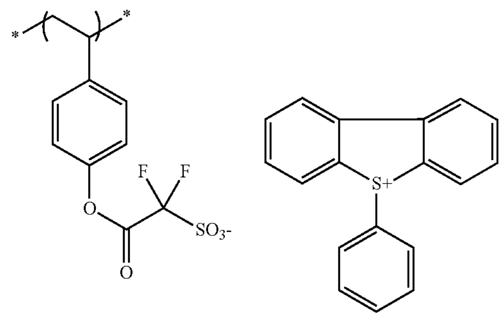
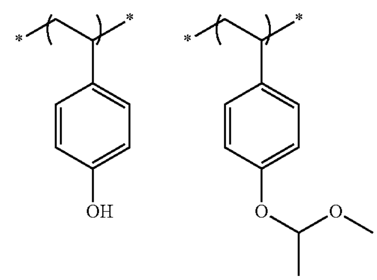
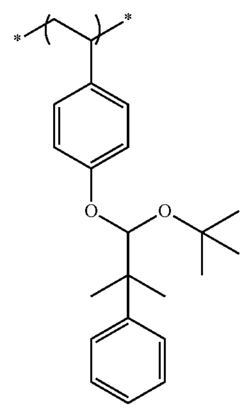
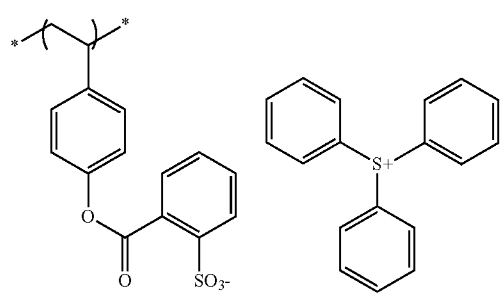
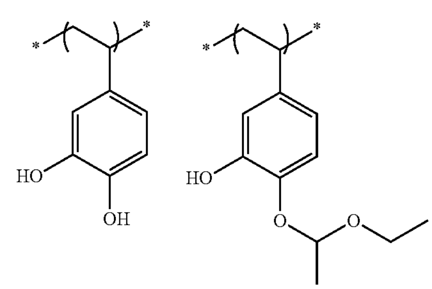

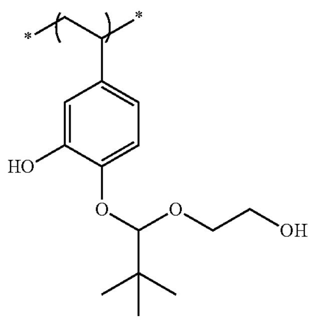
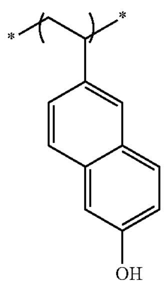
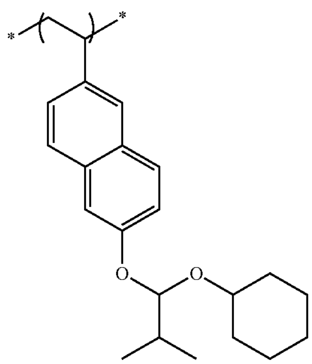
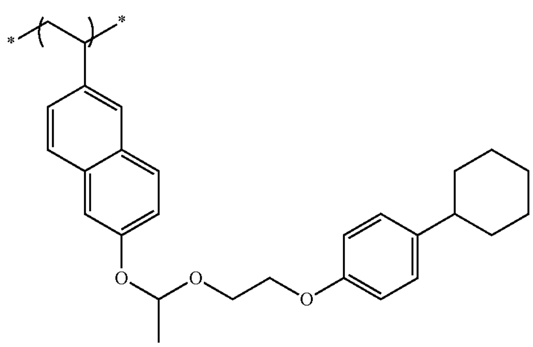
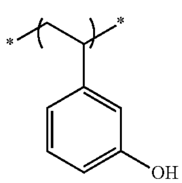
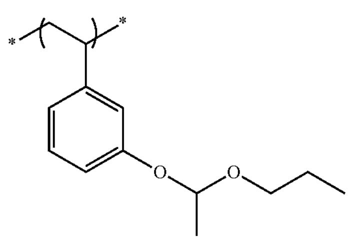
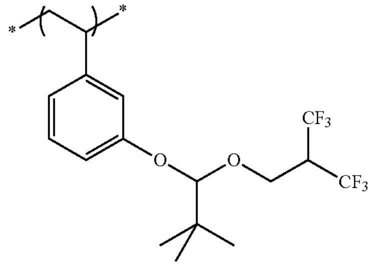
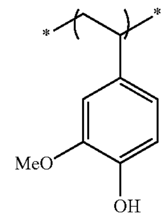
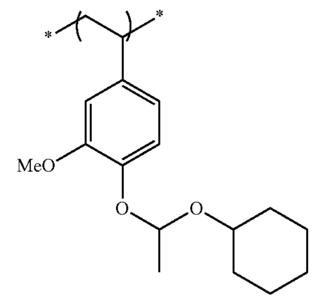
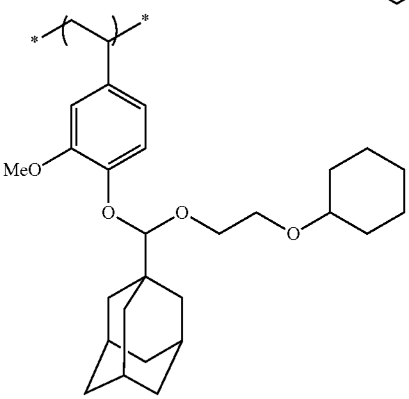
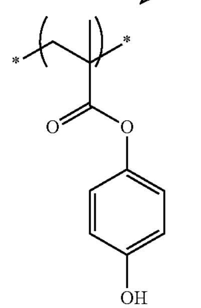
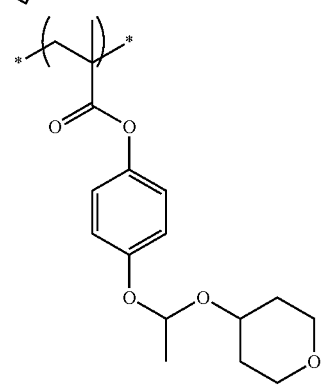
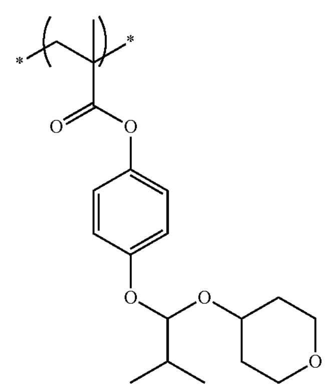
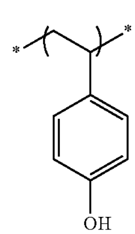
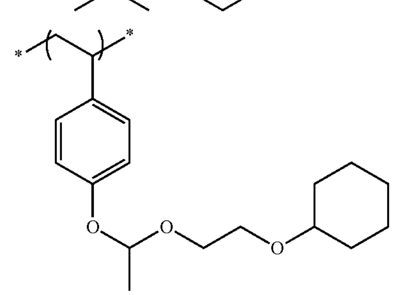

-continued
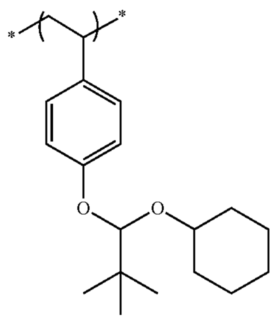
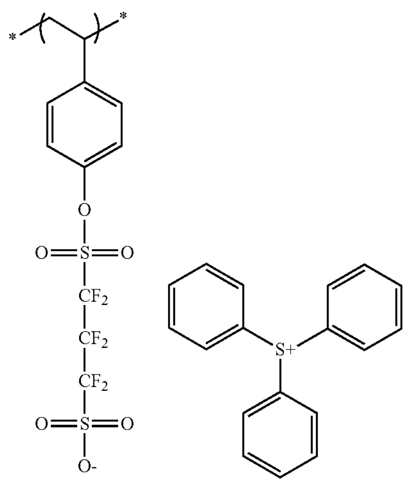
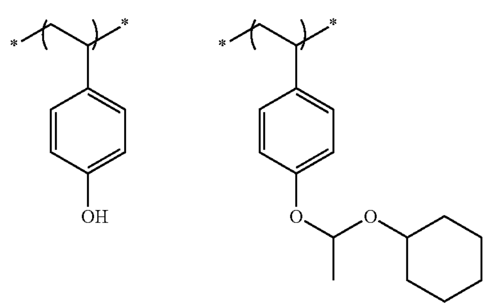
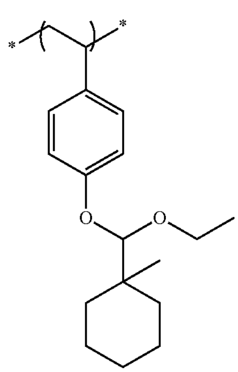
-continued
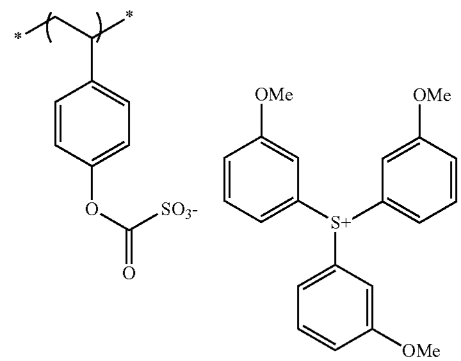
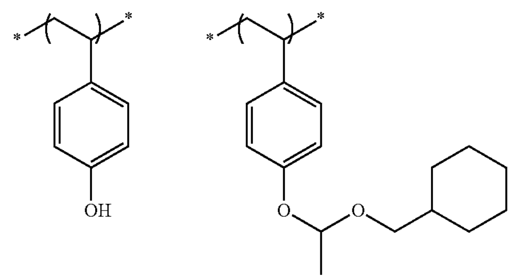
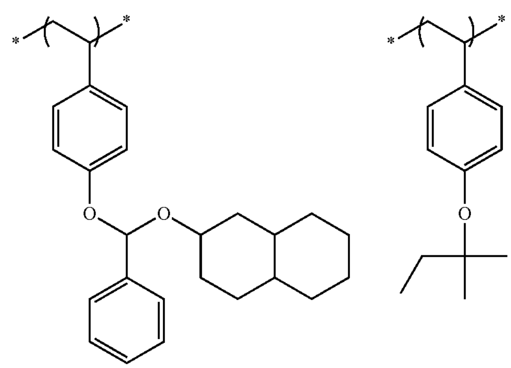
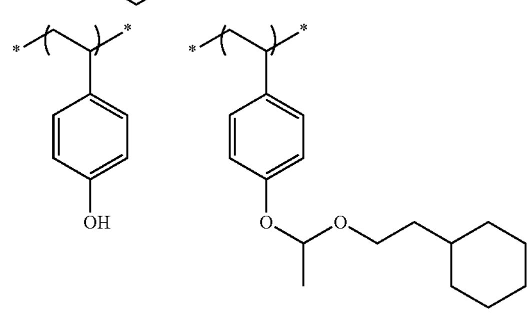
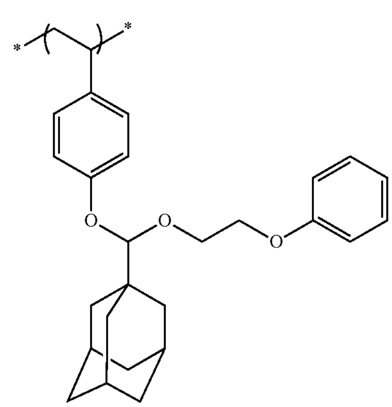

-continued
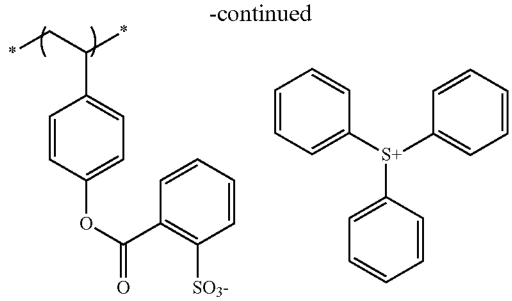
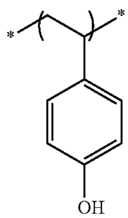
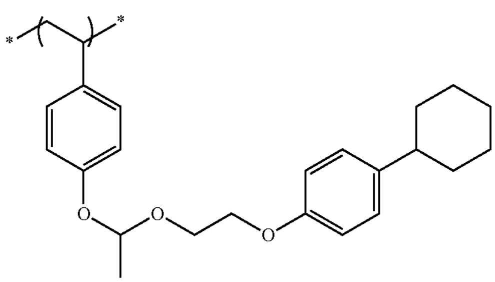
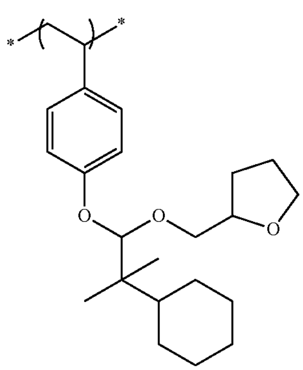
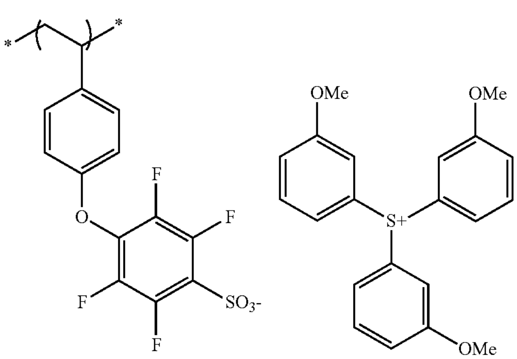
-continued
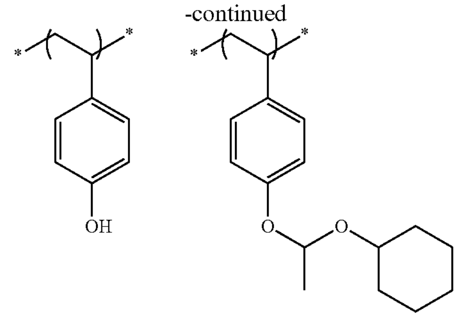
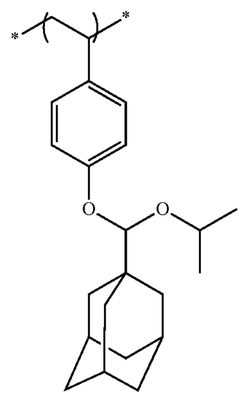
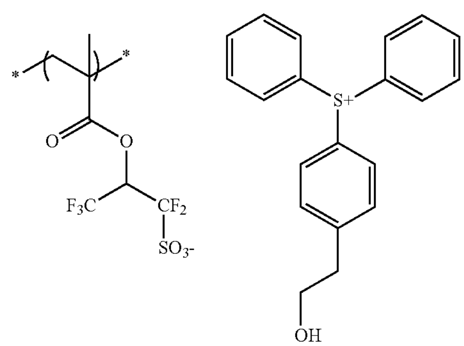
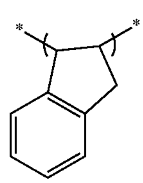
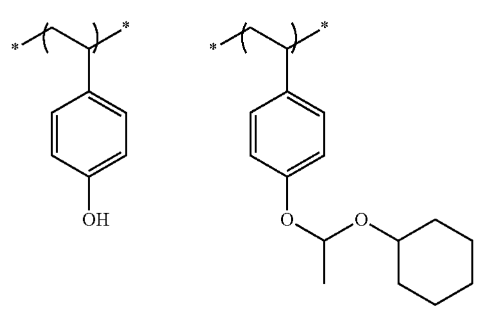

-continued
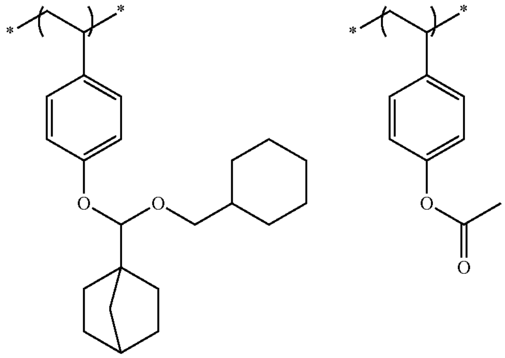
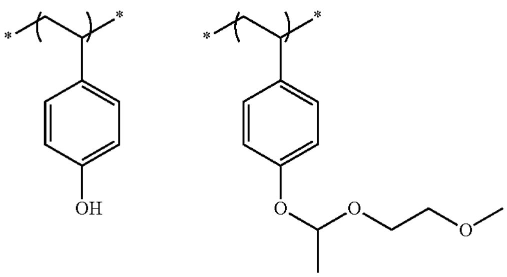
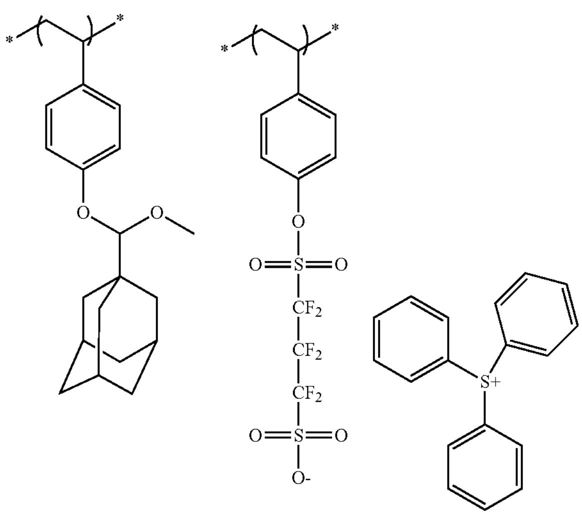
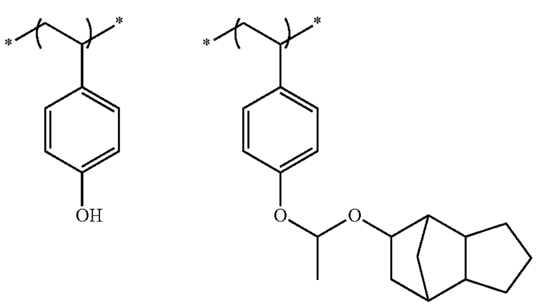
-continued
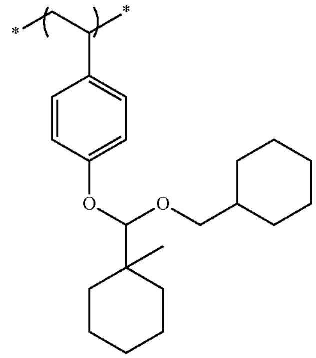
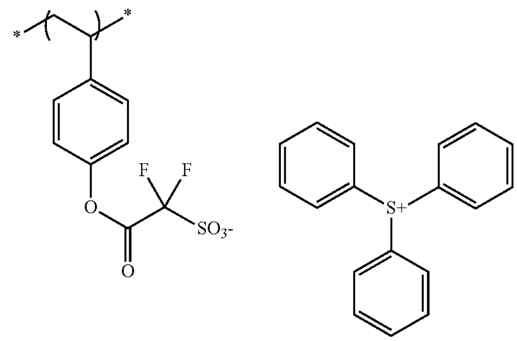
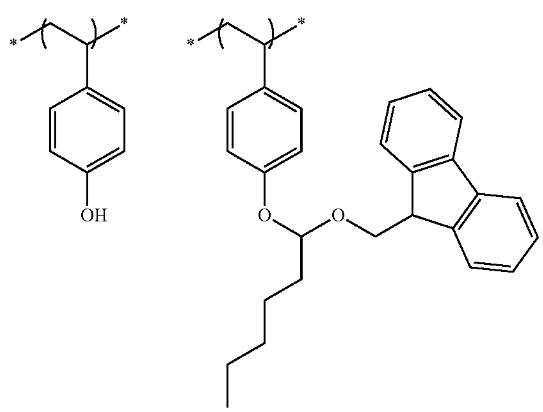
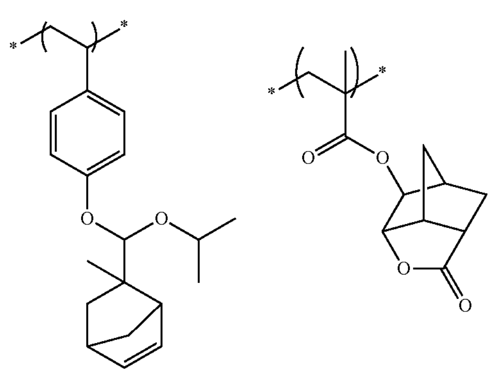

-continued
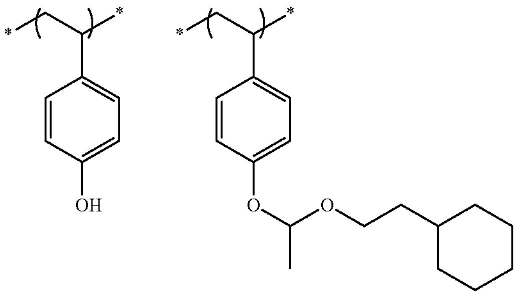
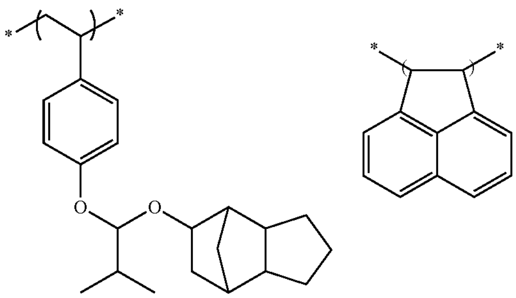
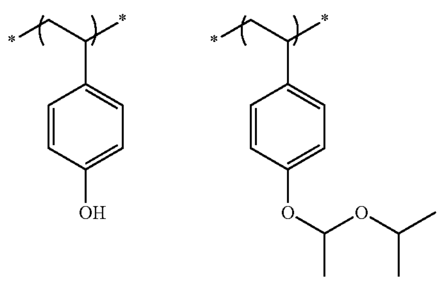
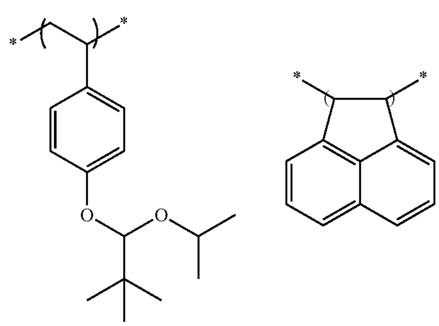
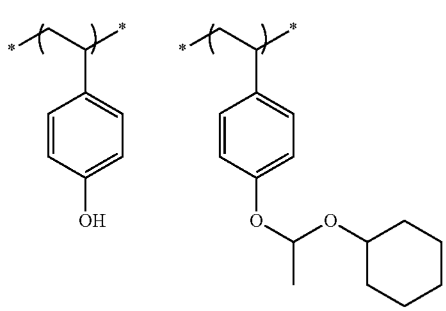
-continued
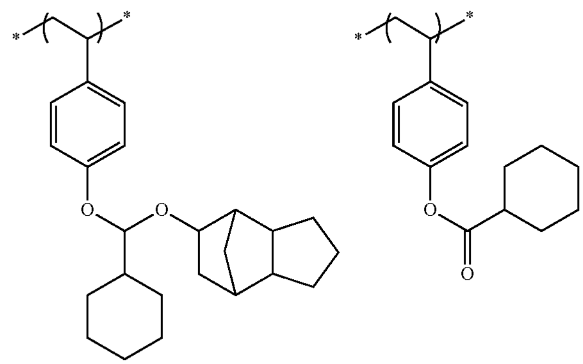
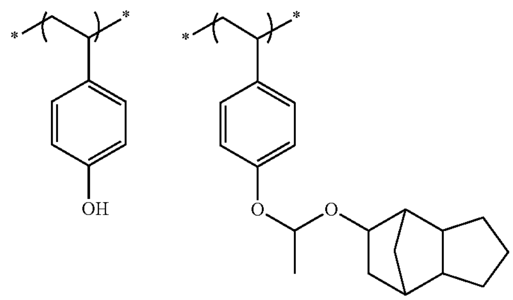
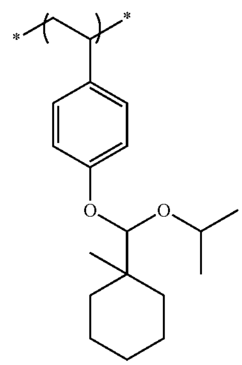
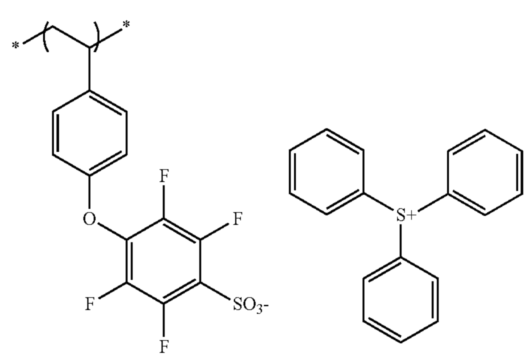
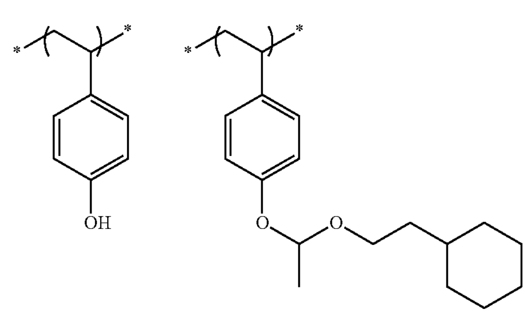

-continued
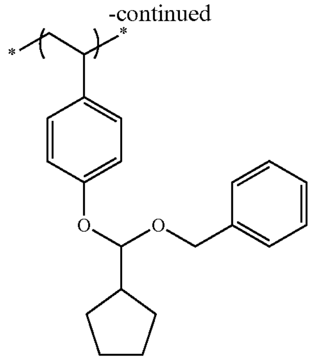
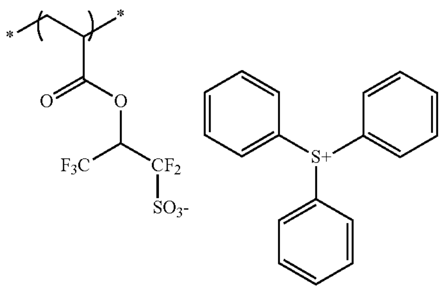
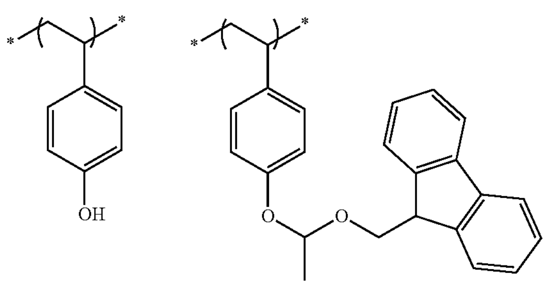
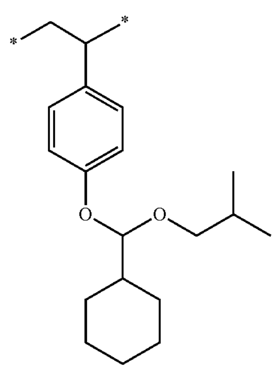
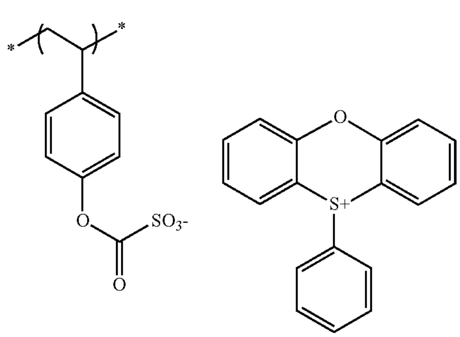
-continued
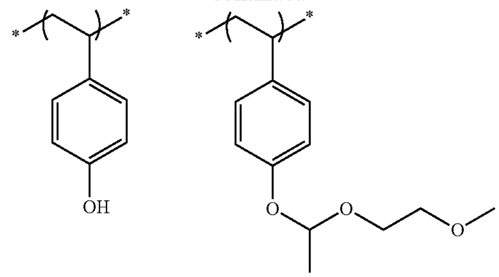
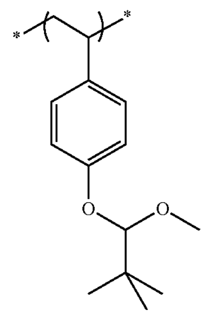
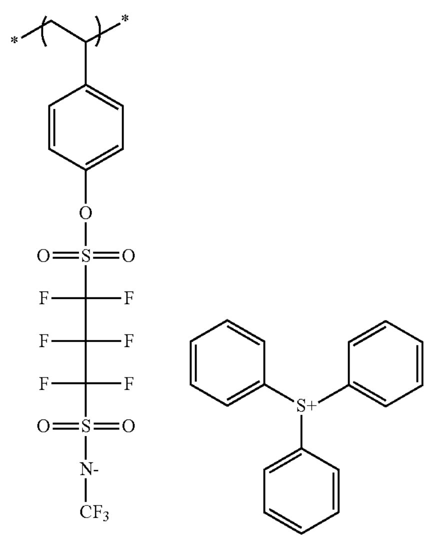
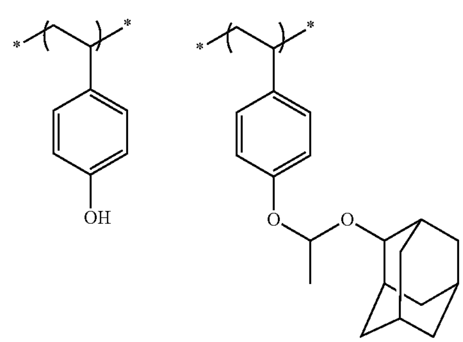

-continued
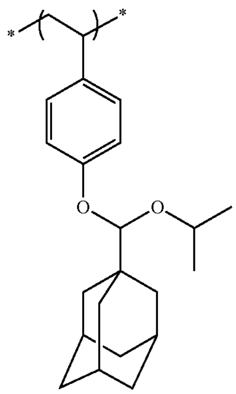
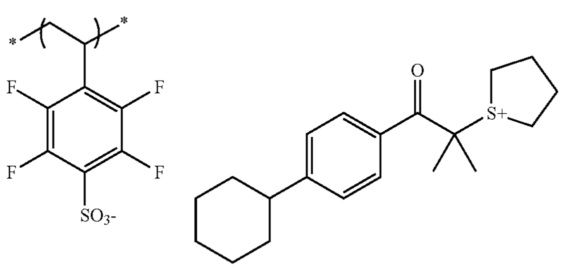
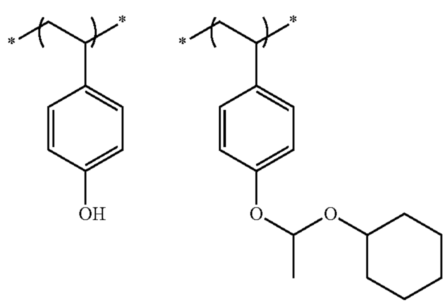
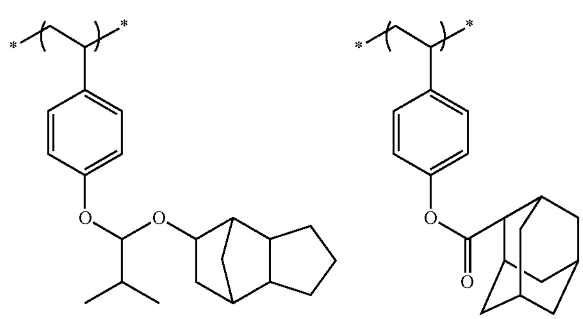
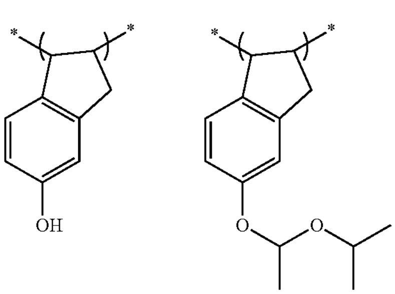
-continued
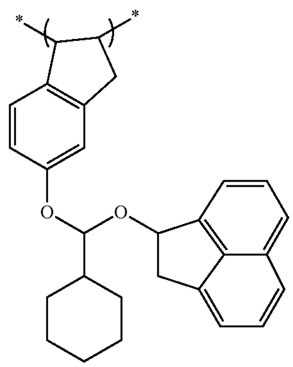
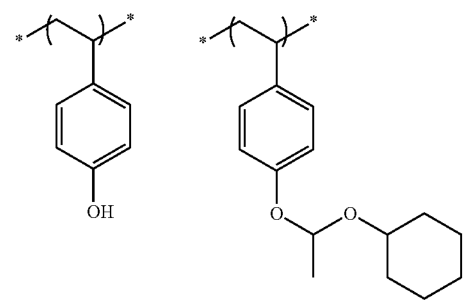
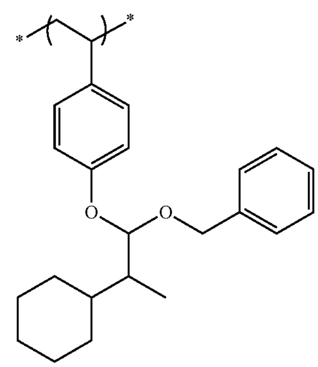
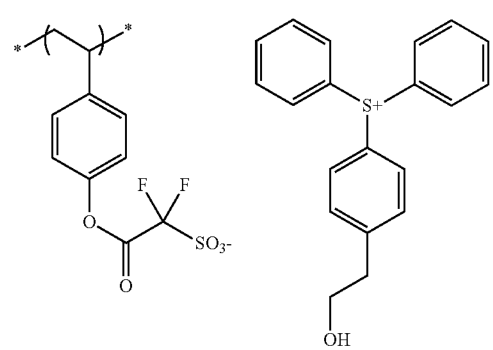
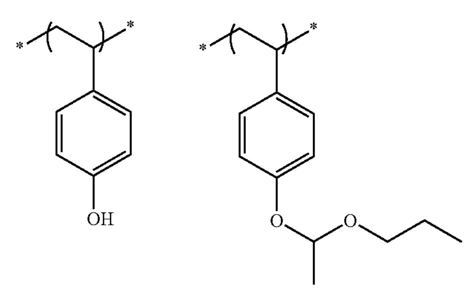

-continued
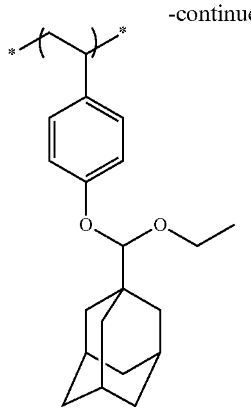
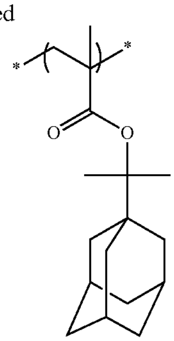
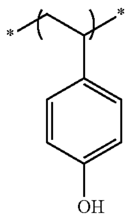
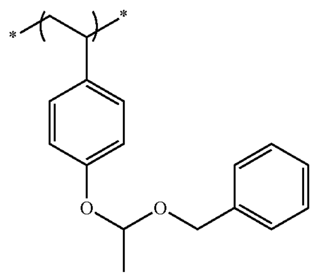
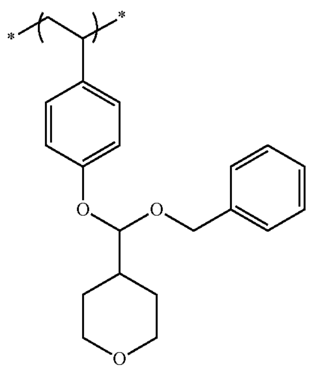
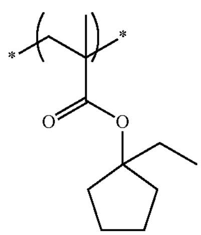
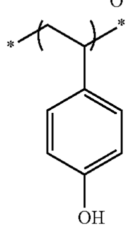
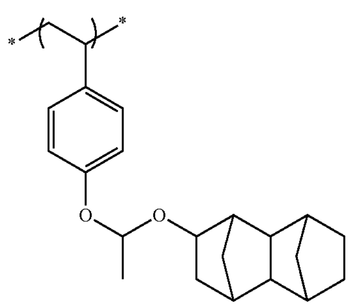
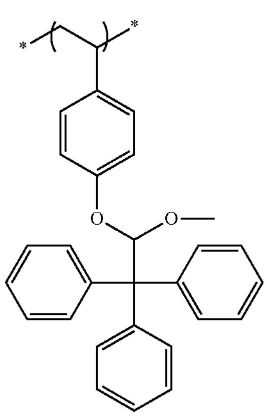
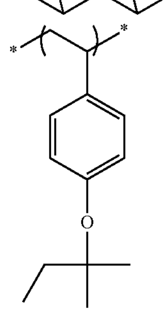
-continued
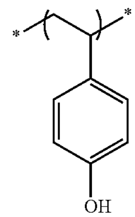
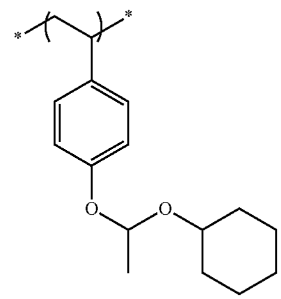
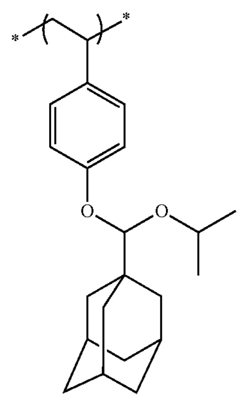
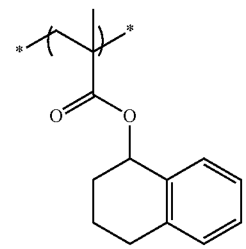
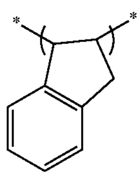
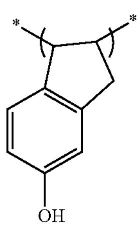
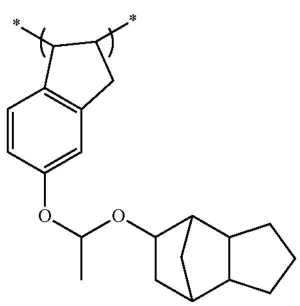
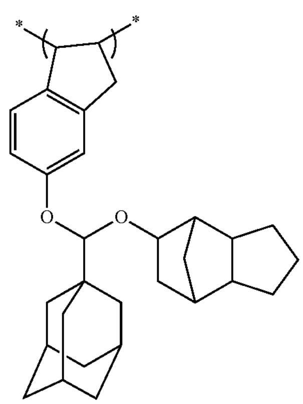

-continued
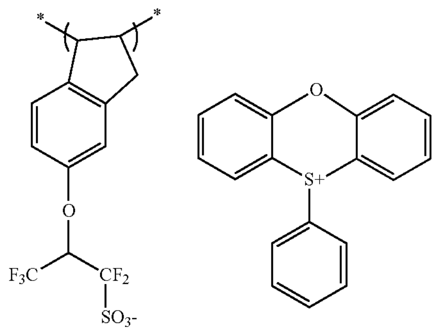
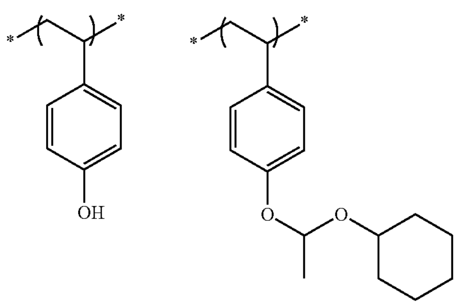
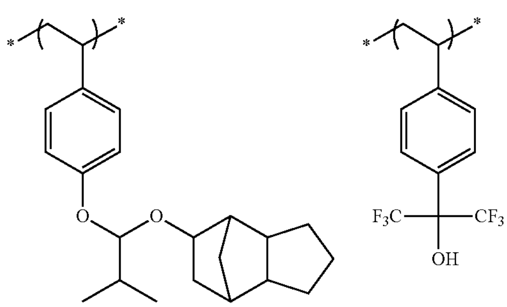
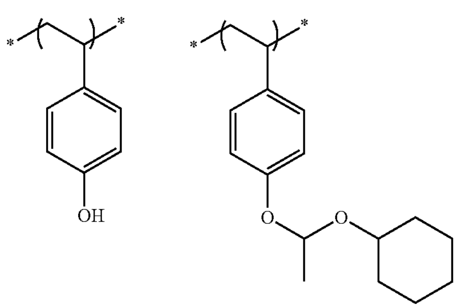
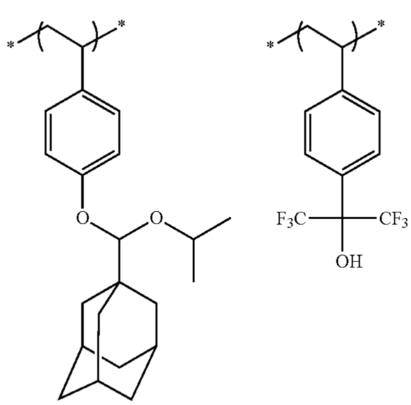
-continued
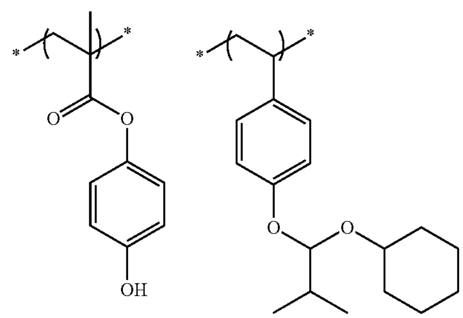
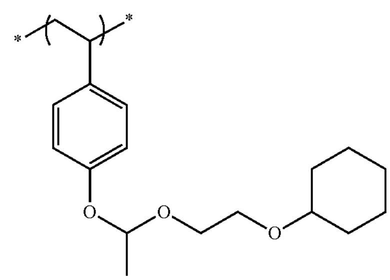
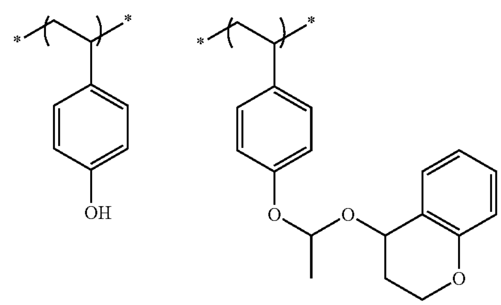
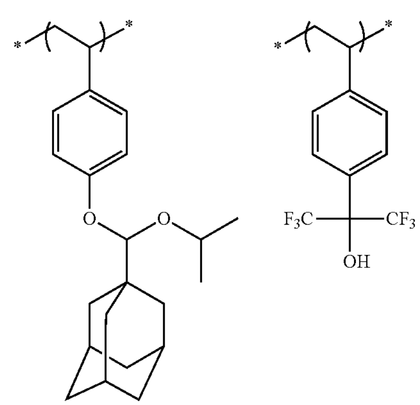
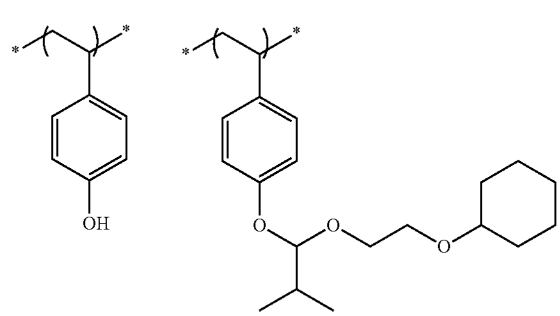

-continued
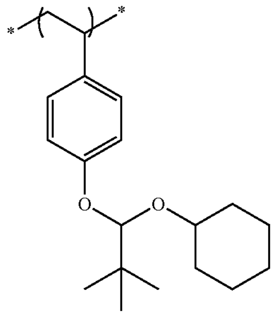
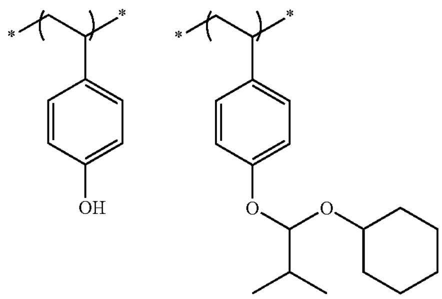
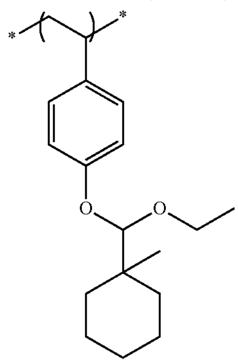
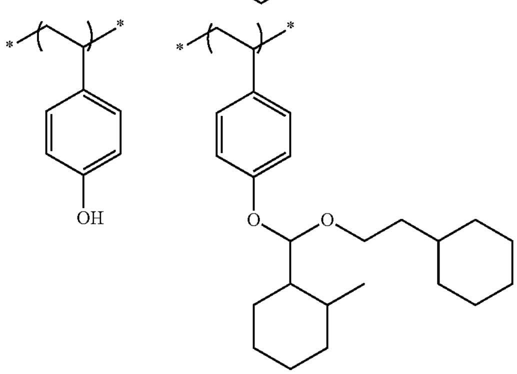
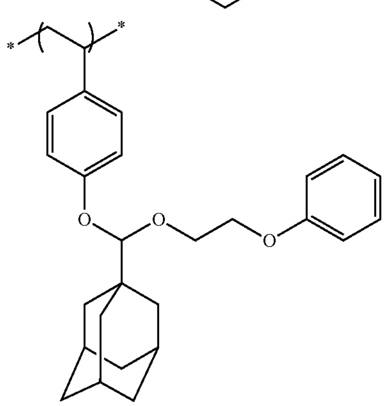
-continued
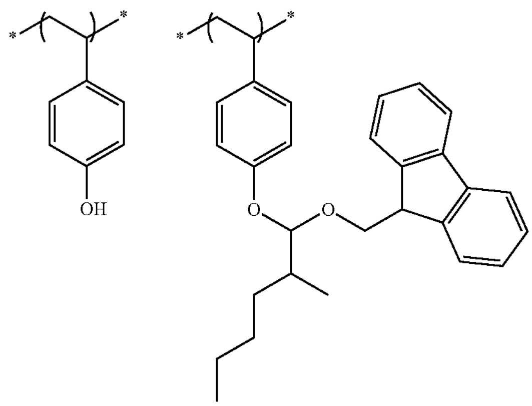
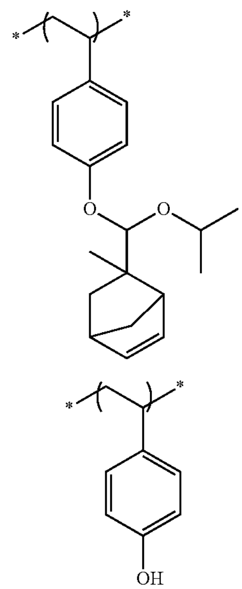
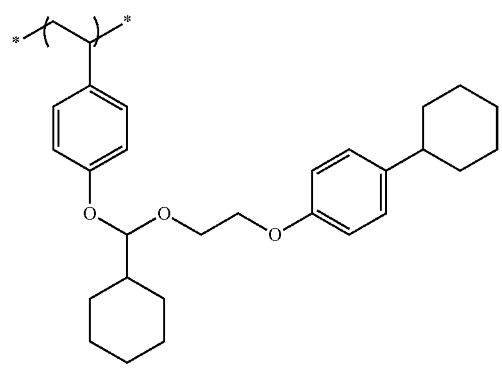
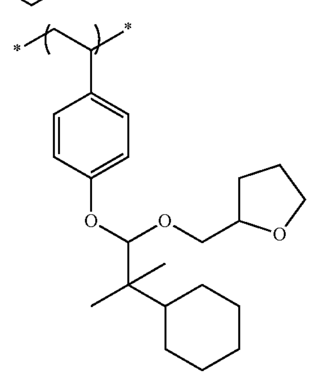

-continued
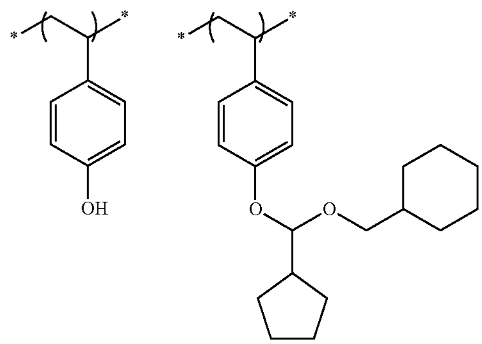
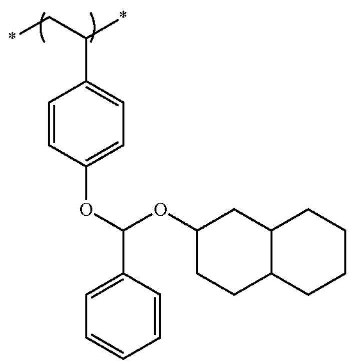
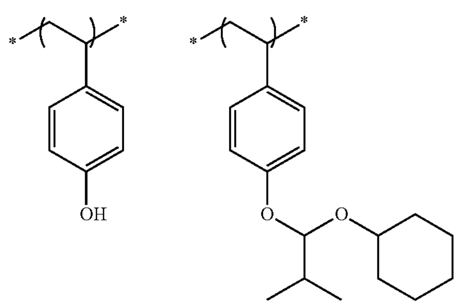
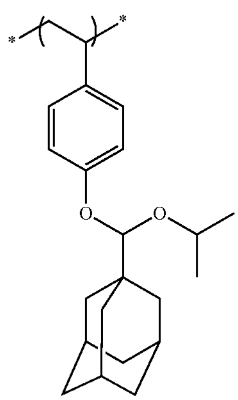
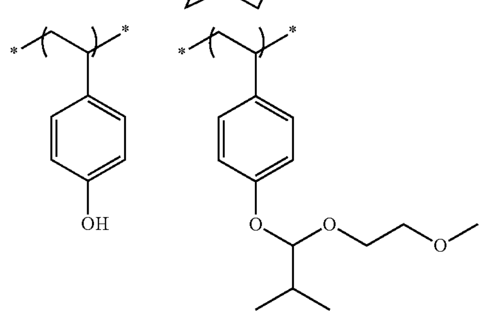
-continued
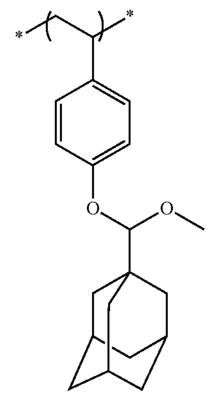
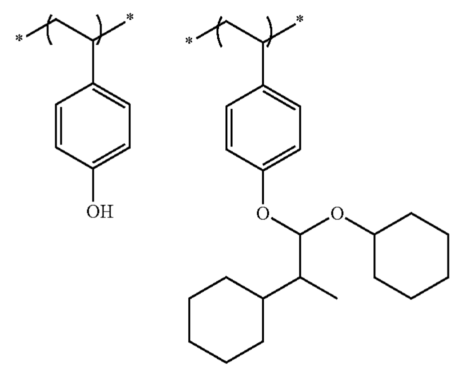
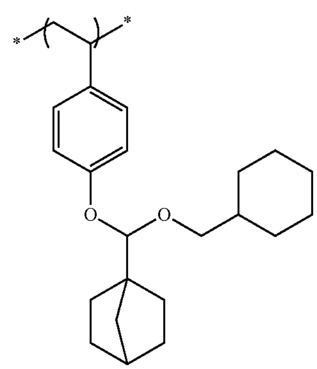
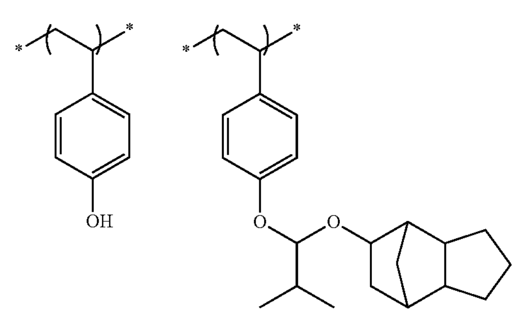

-continued
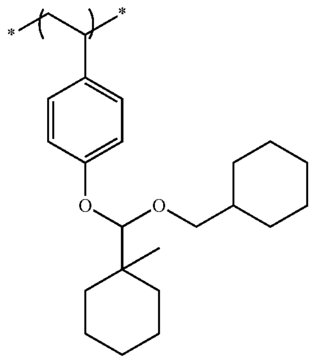
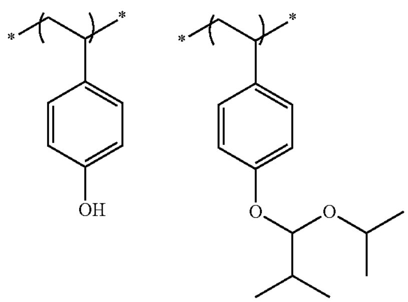
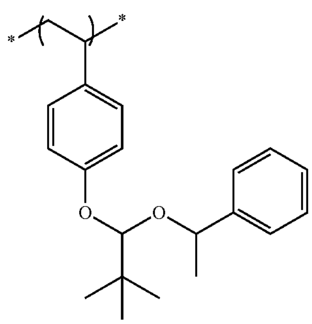
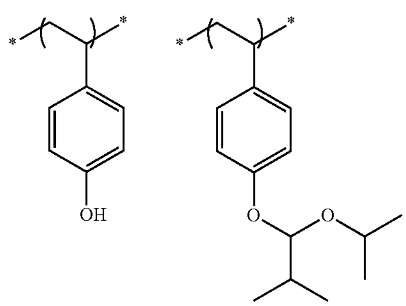
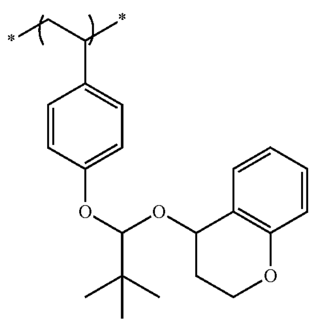
-continued
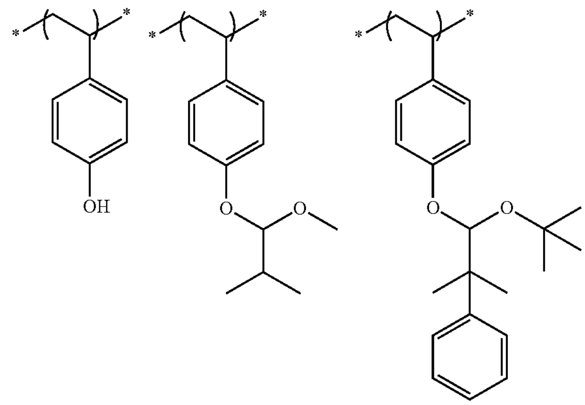
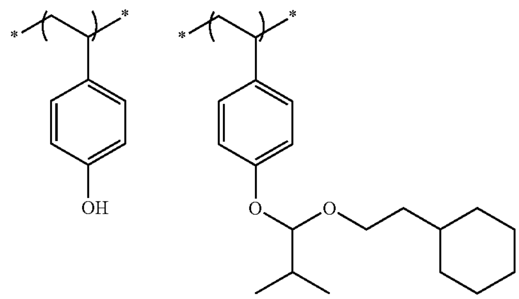
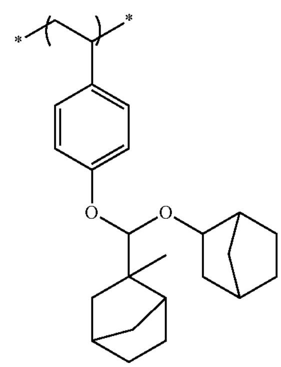
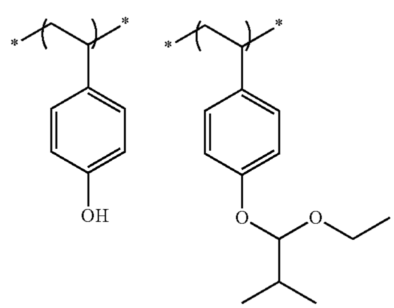
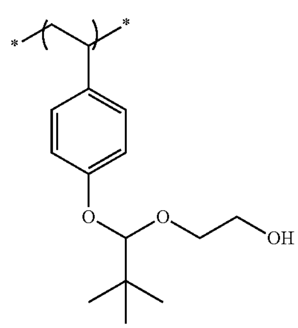

-continued
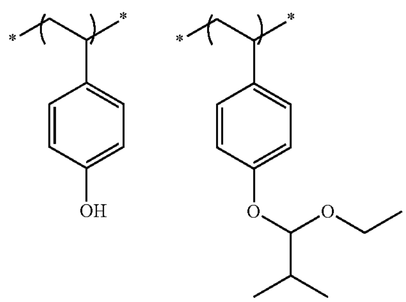
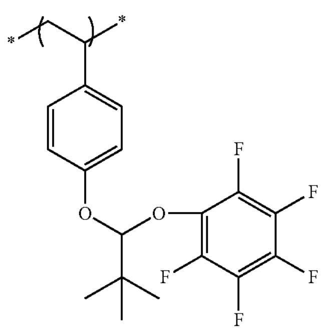
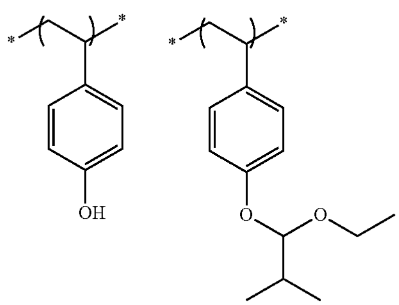
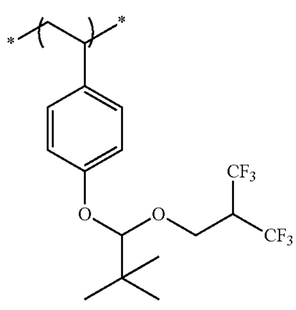
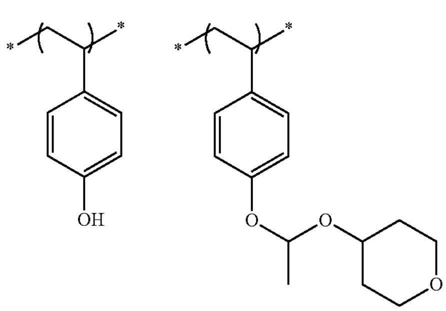
-continued
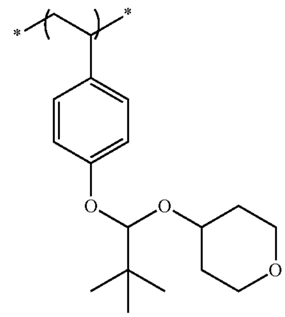
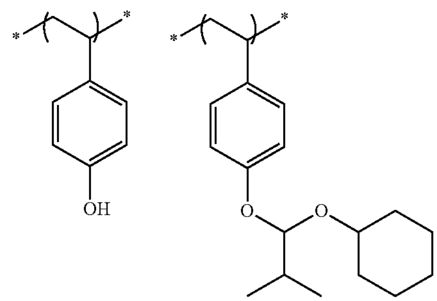
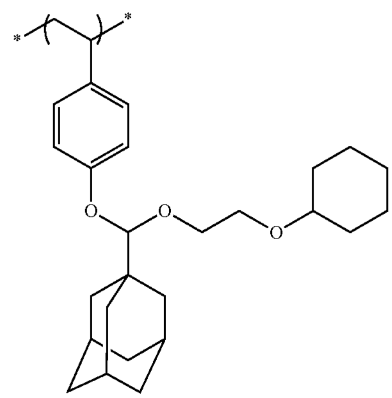
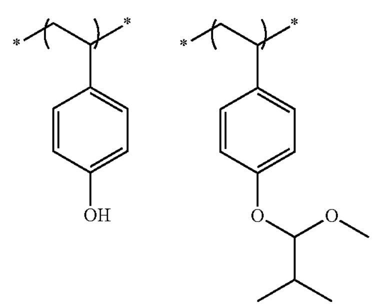
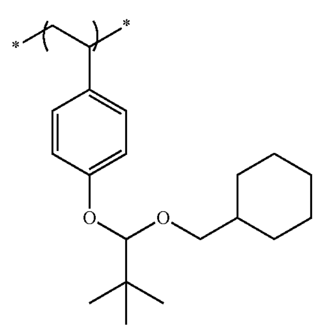

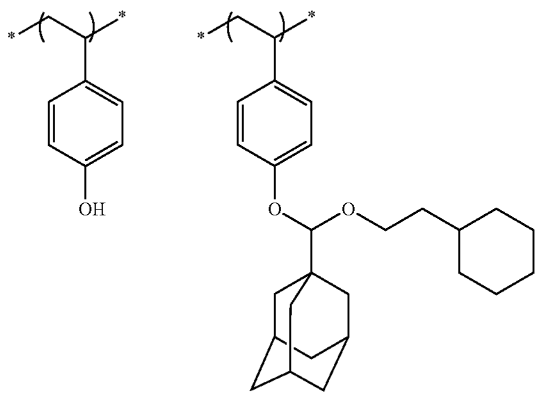
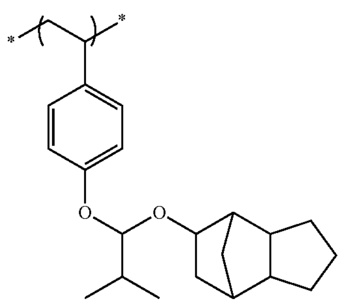
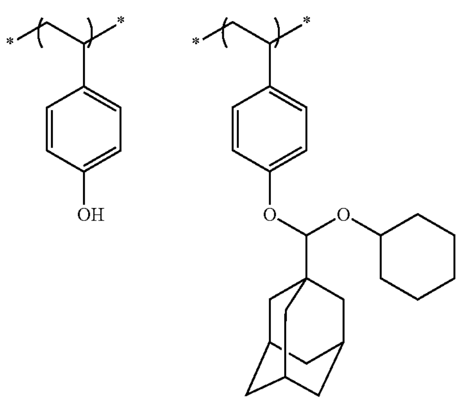
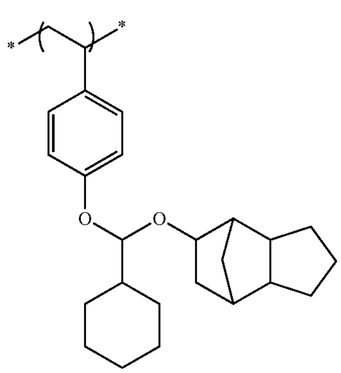
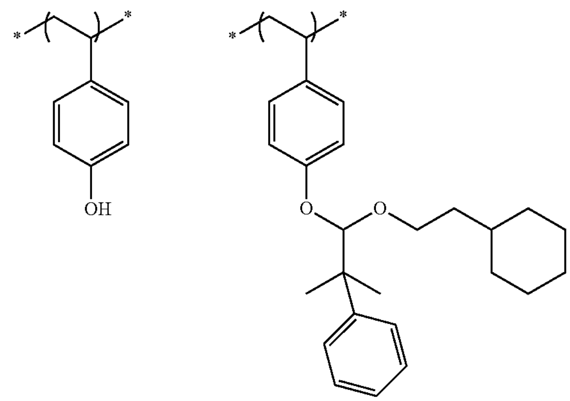
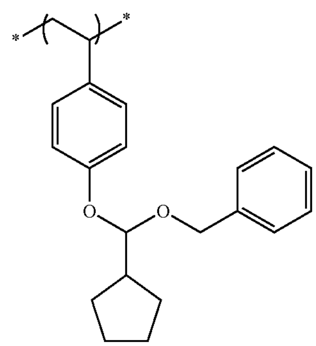
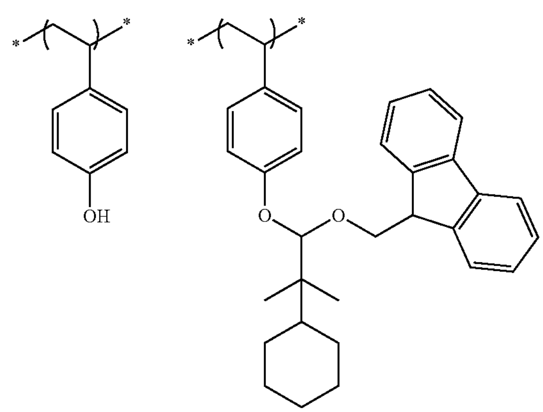
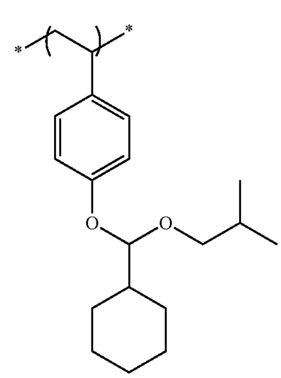

-continued
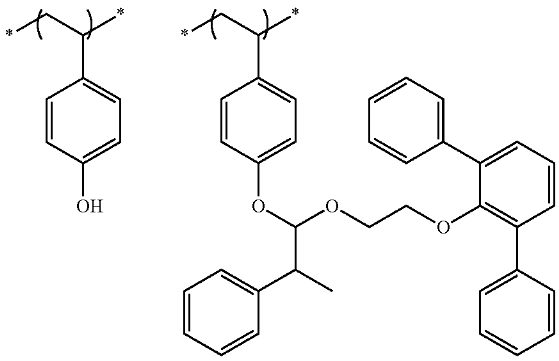
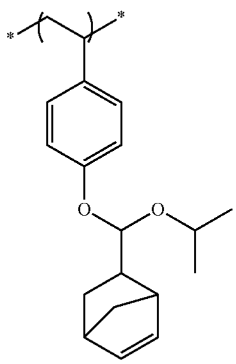
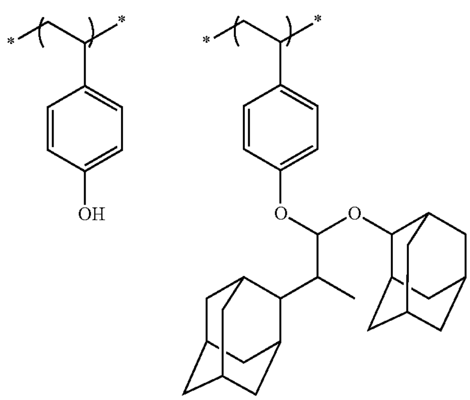
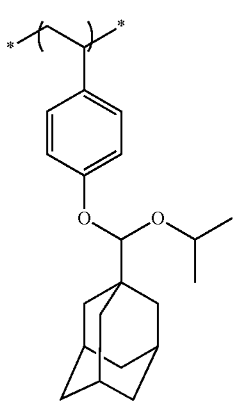
-continued
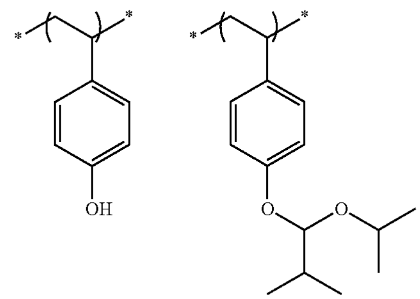
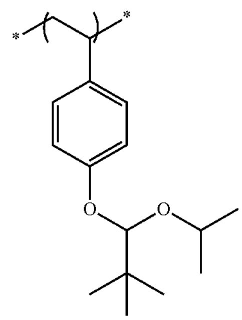
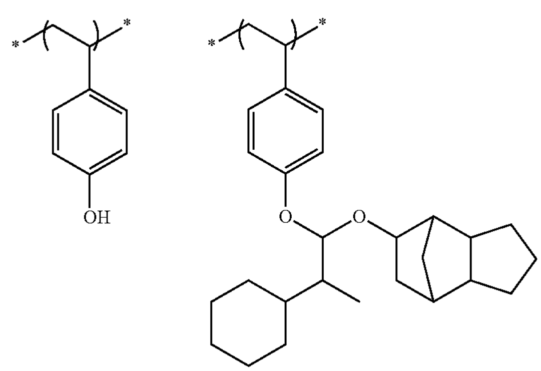
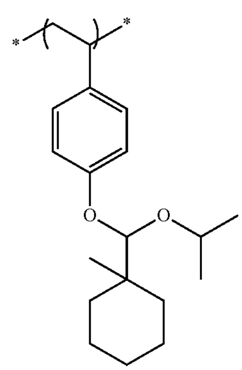
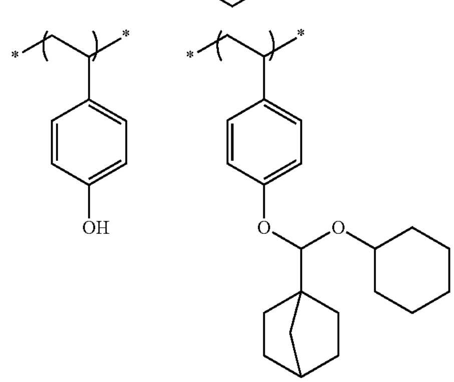

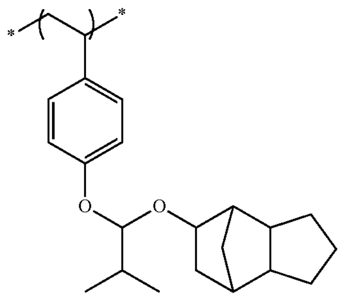
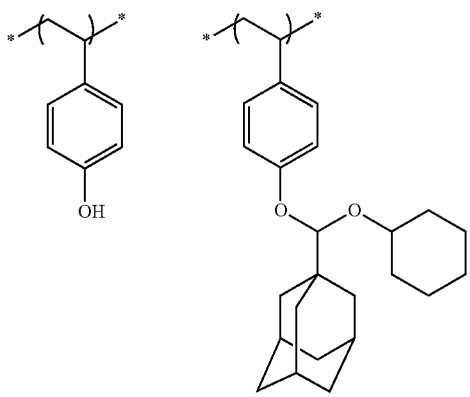
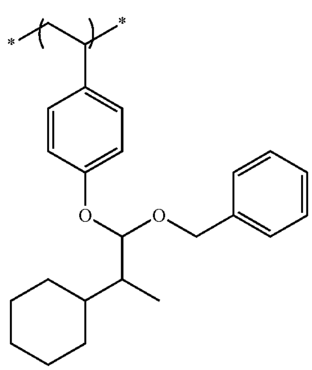
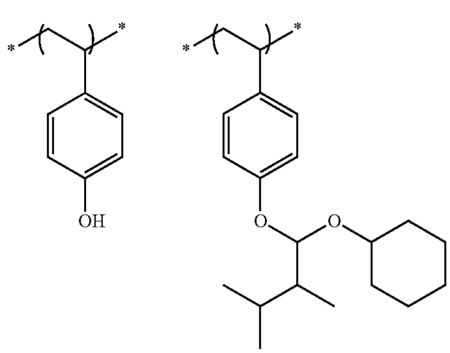
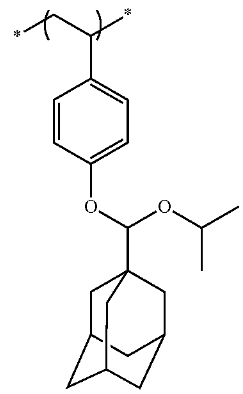
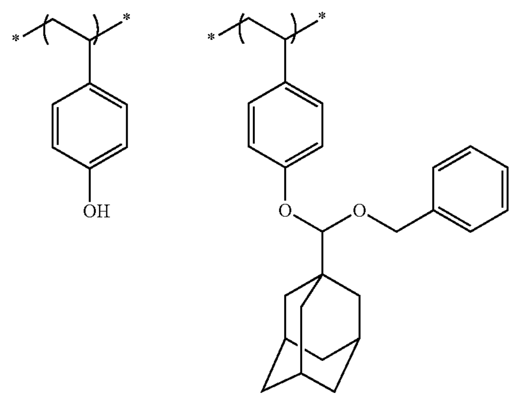
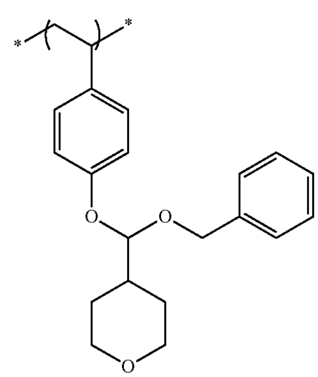
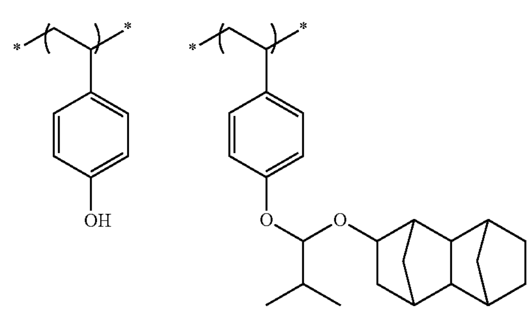

-continued
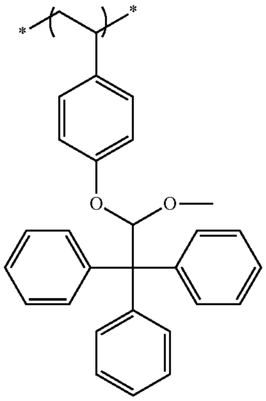
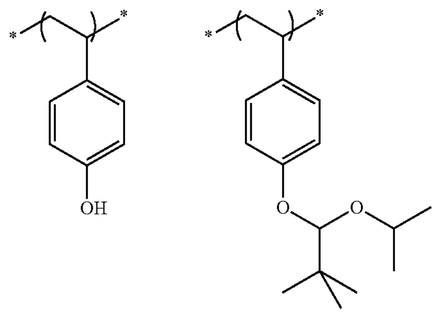
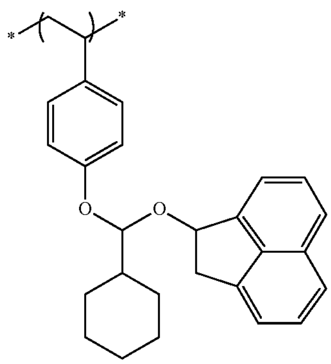
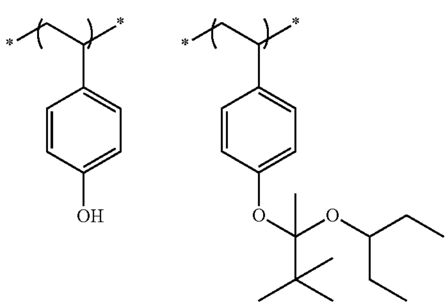
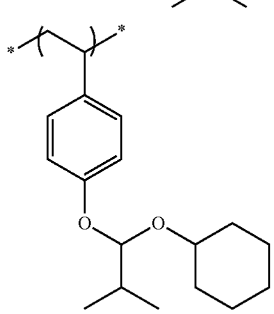
-continued
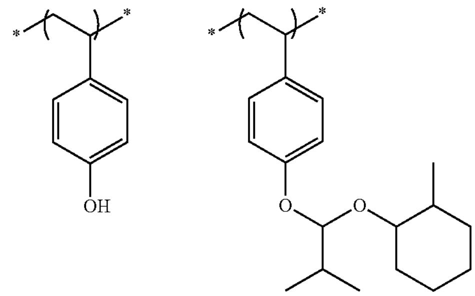
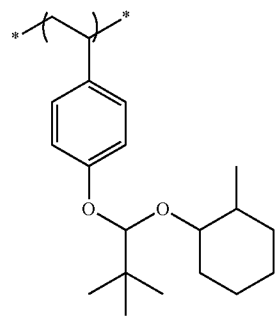
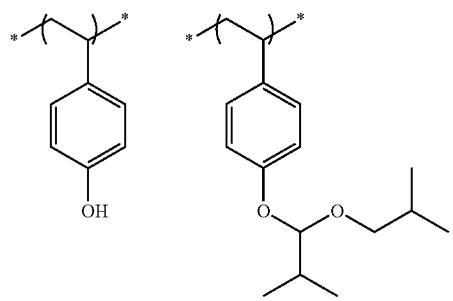
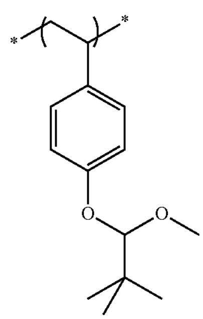
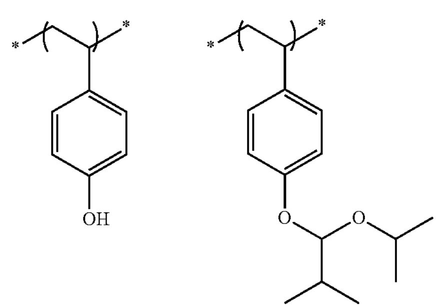

-continued
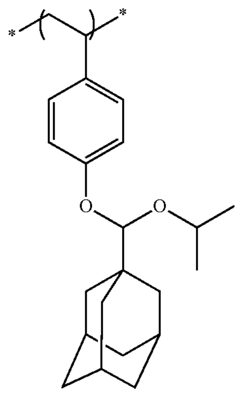
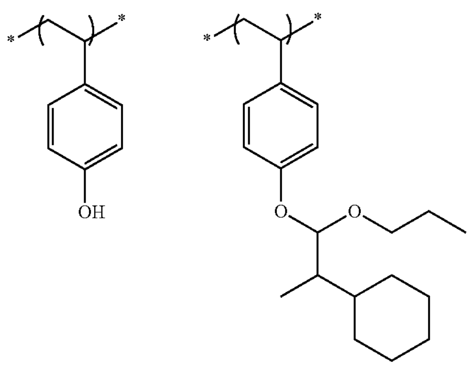
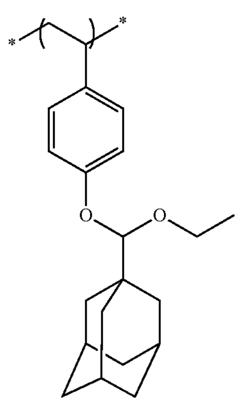
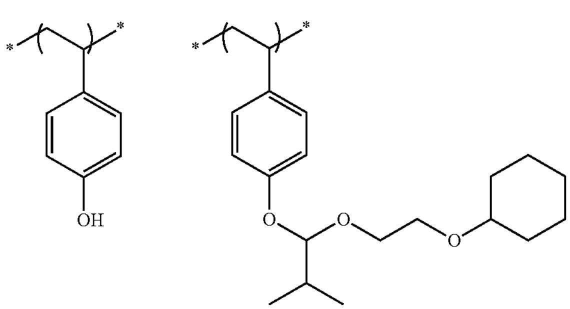
-continued
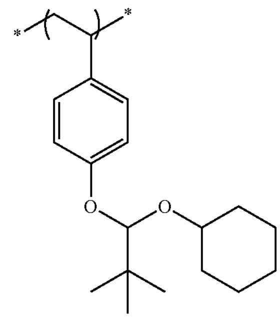
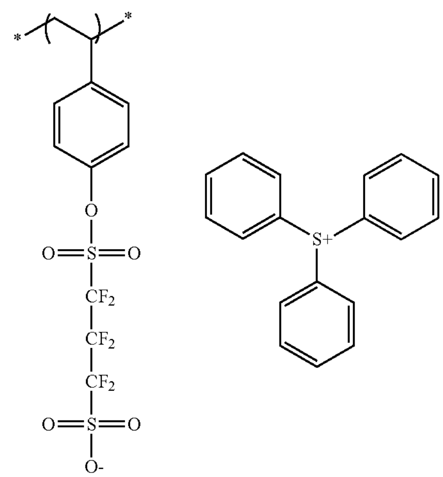
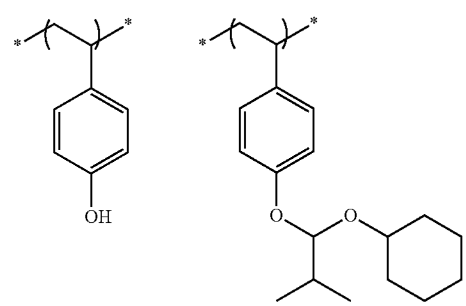
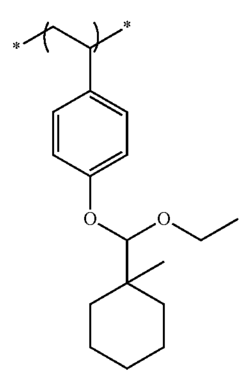

-continued
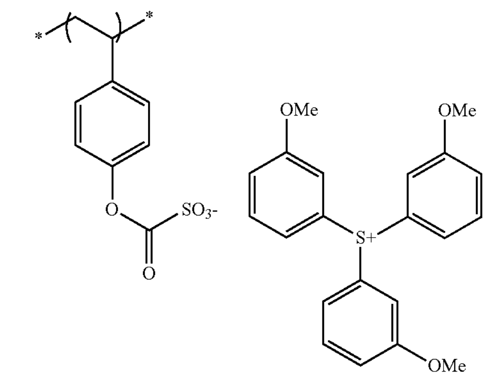
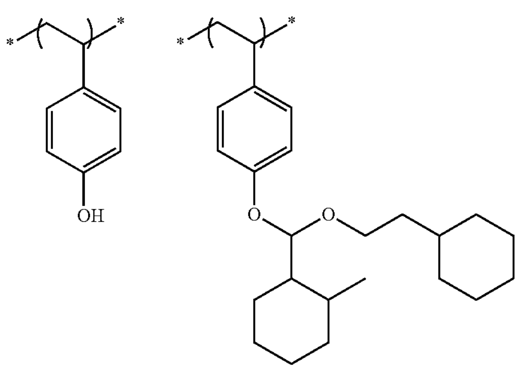
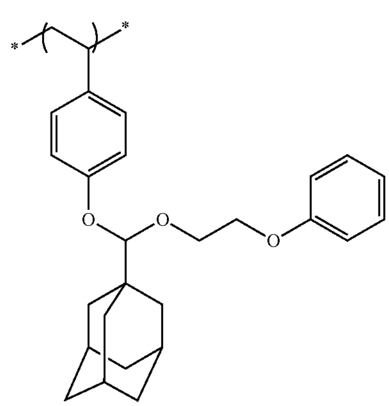
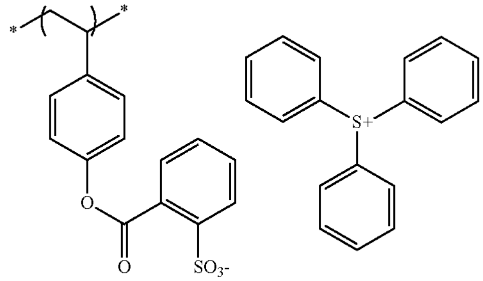
-continued
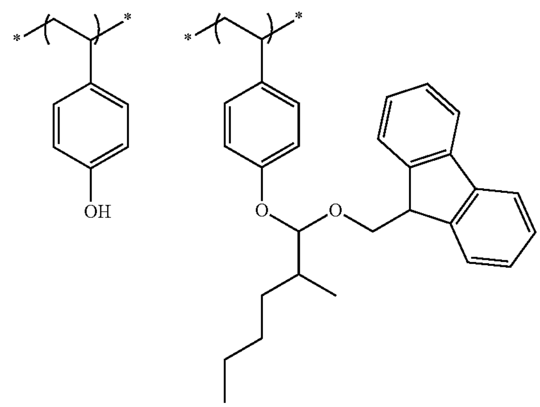
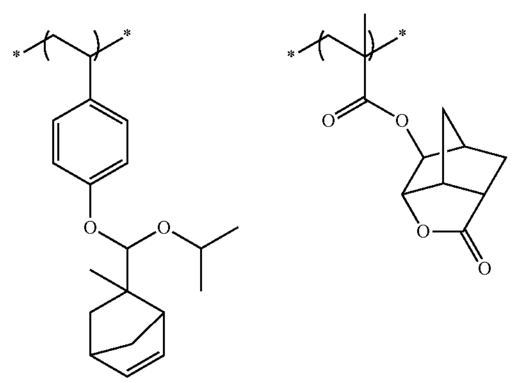
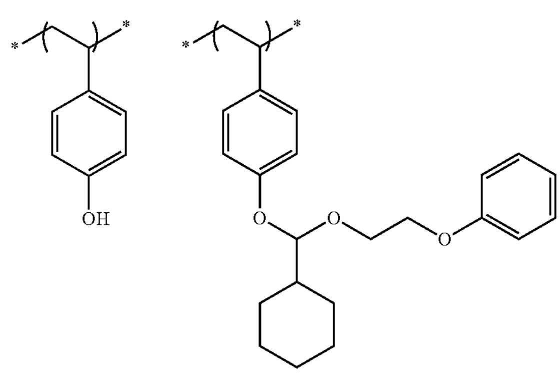
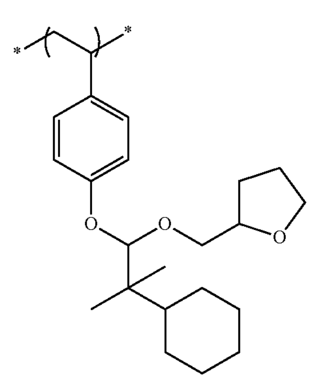

-continued
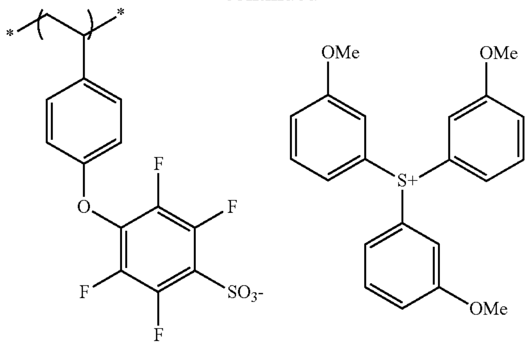
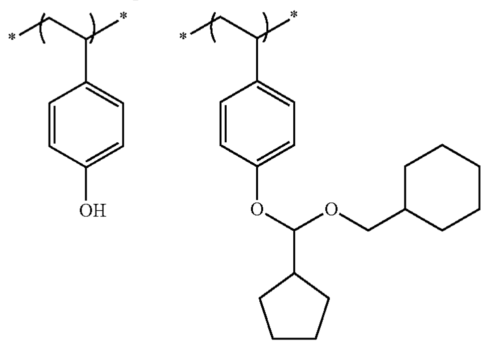
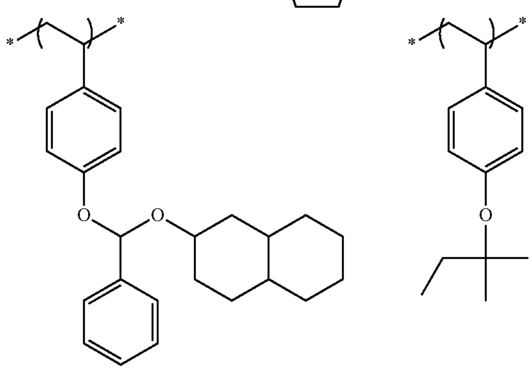
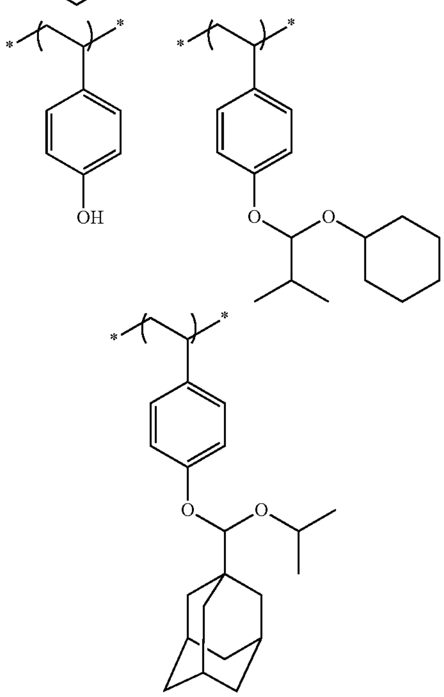
-continued
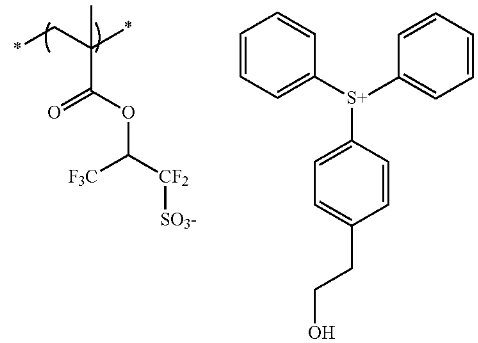
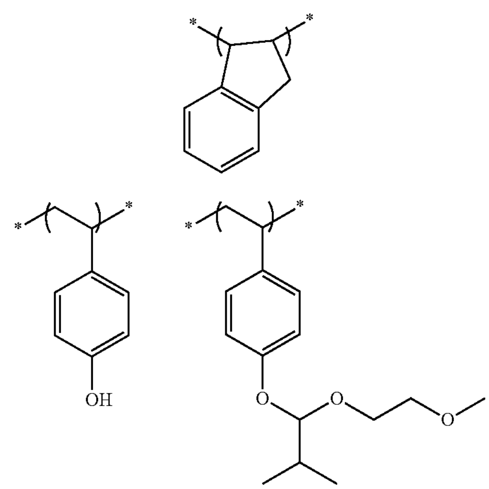
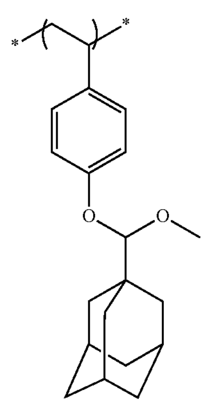
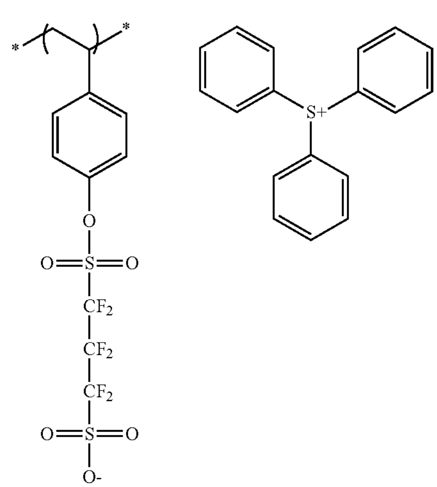

-continued
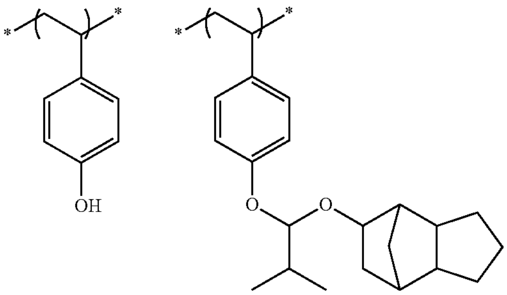
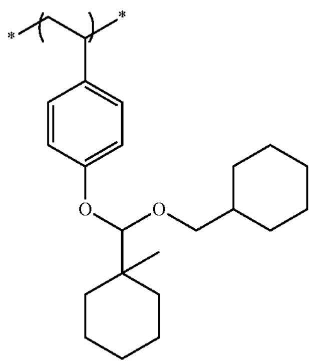
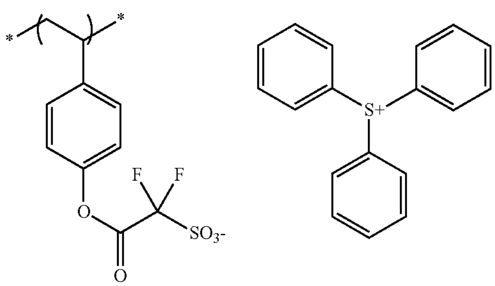
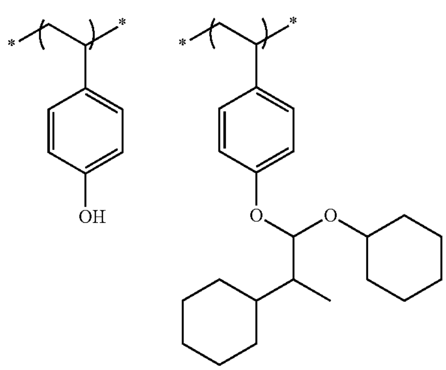
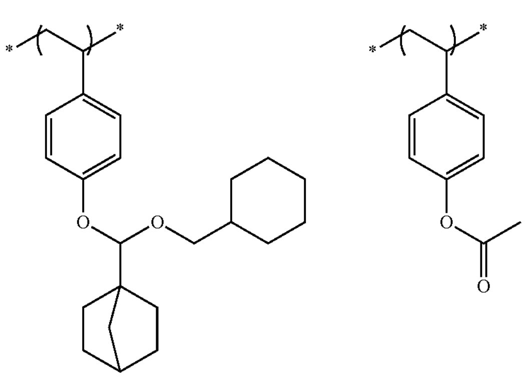
-continued
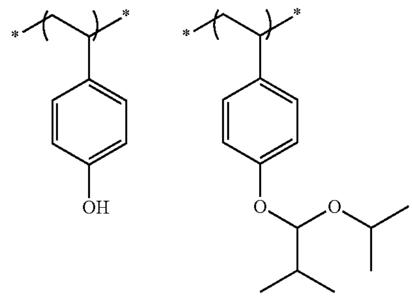
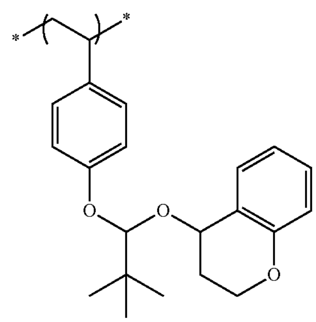
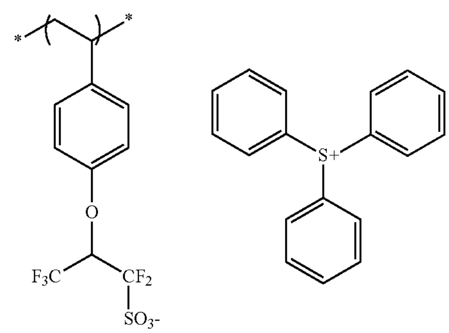
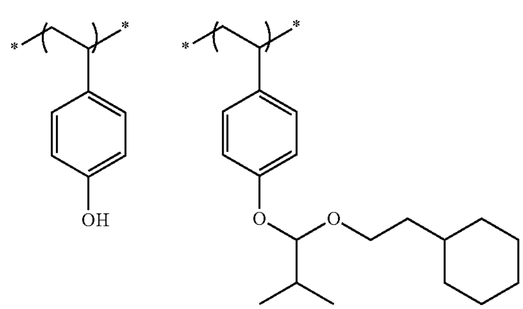
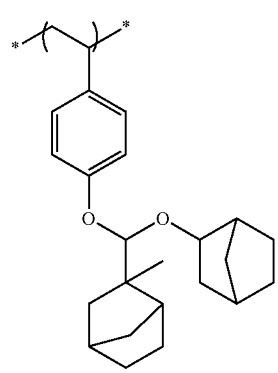

-continued
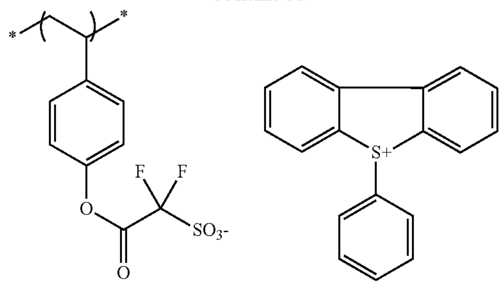
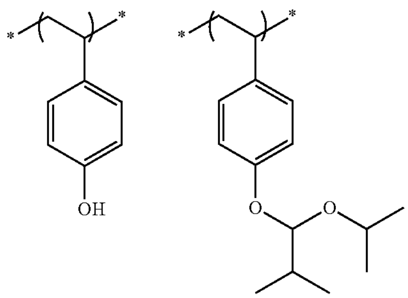
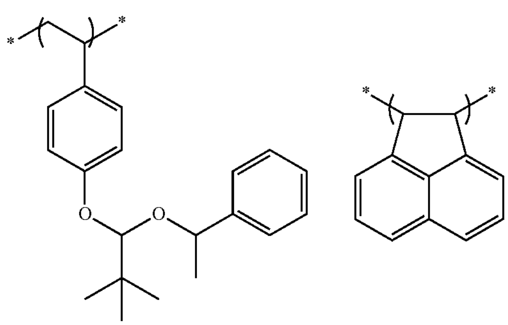
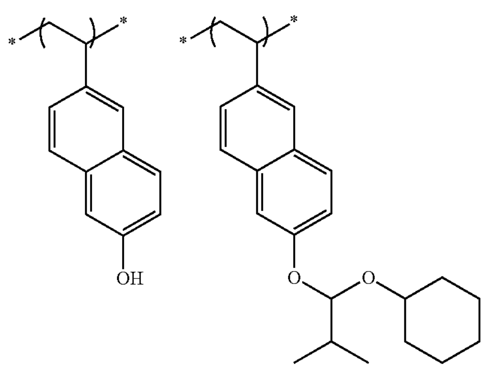
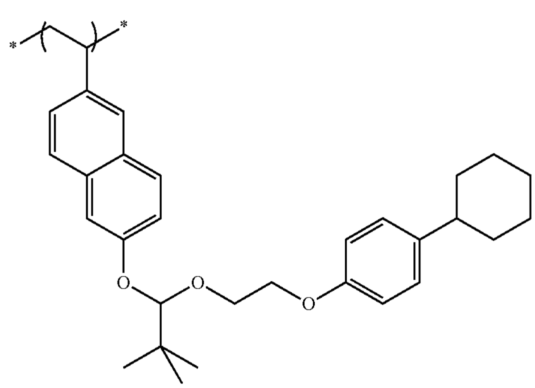
-continued
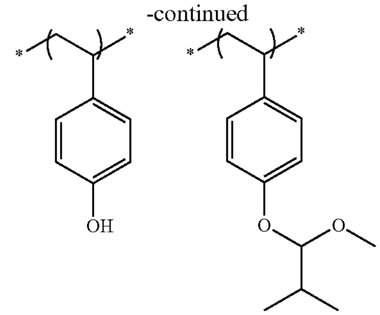
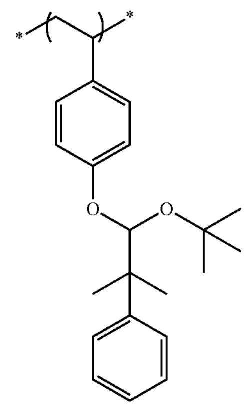
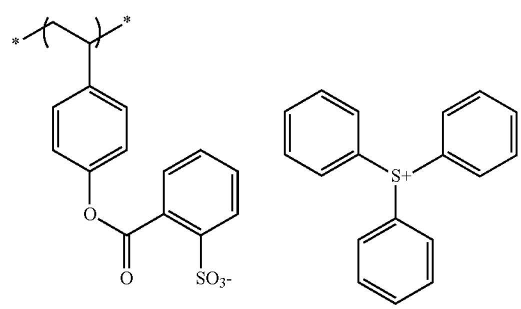
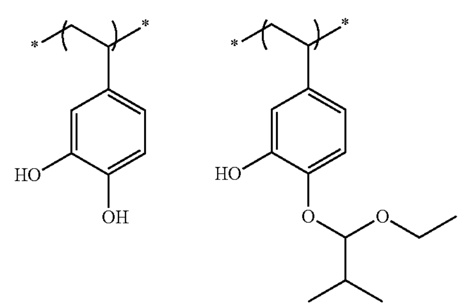
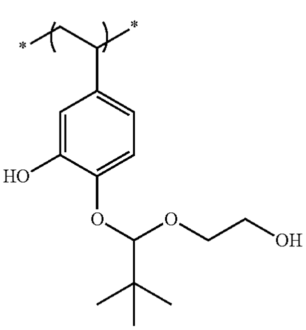

-continued
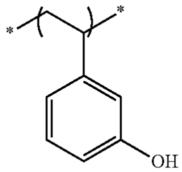
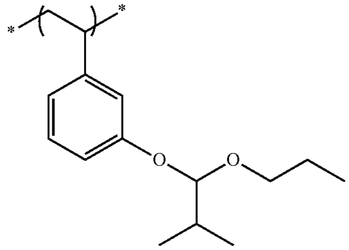
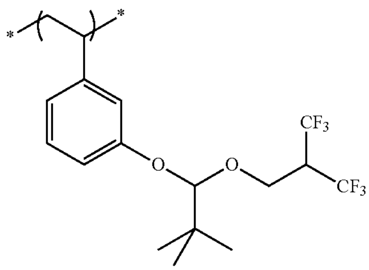
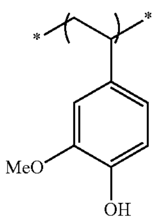
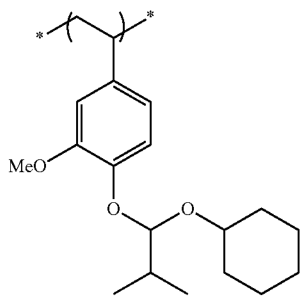
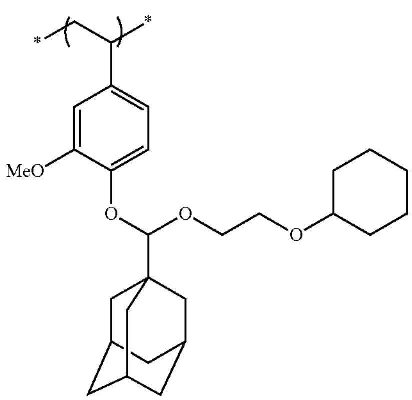
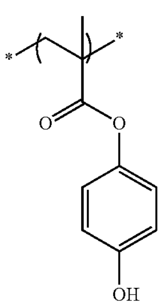
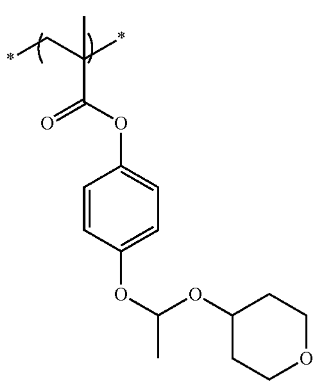
-continued
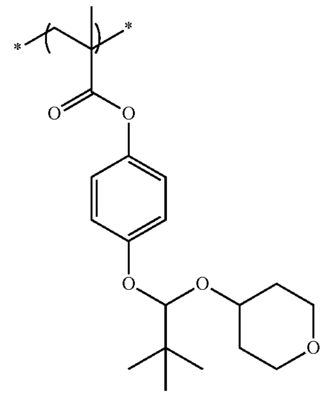
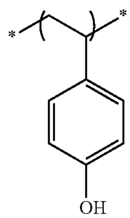
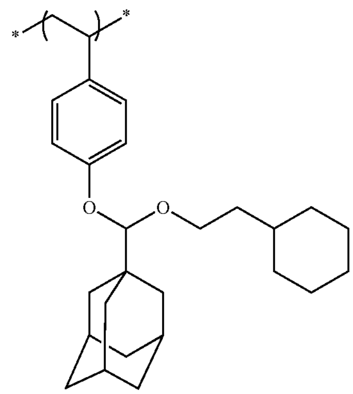
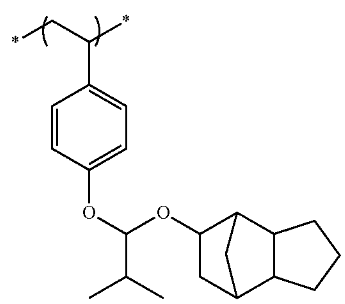
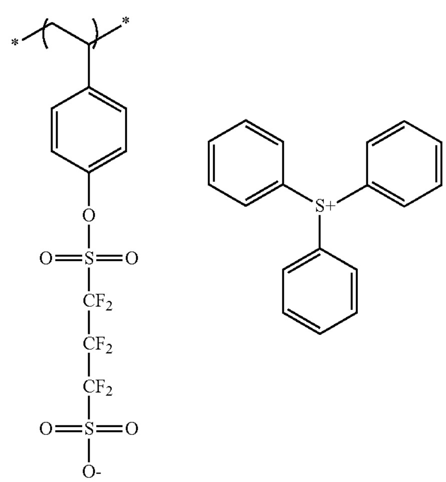

-continued
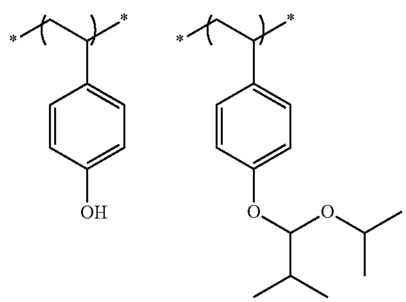
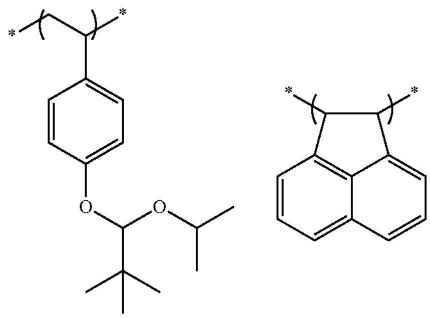
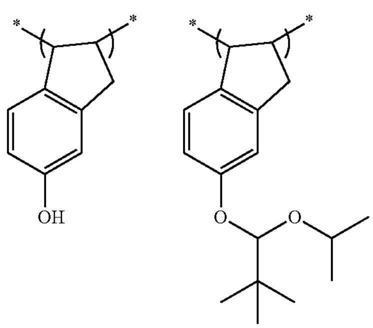
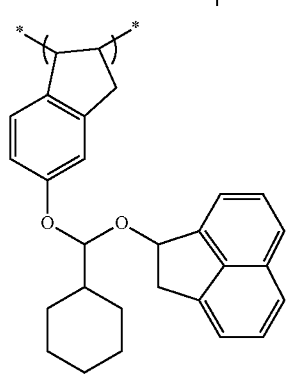
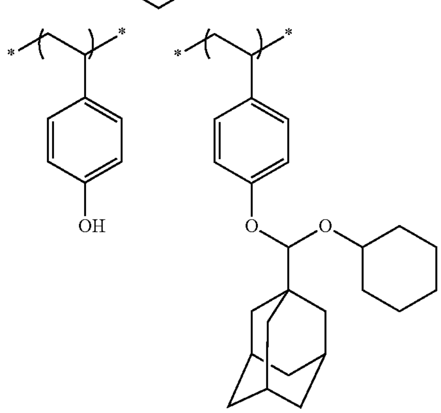
-continued
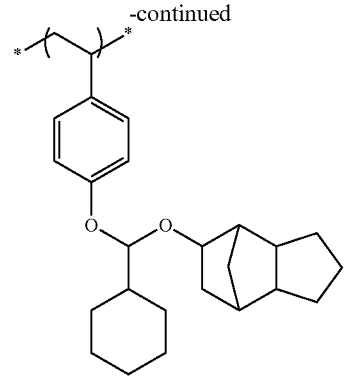
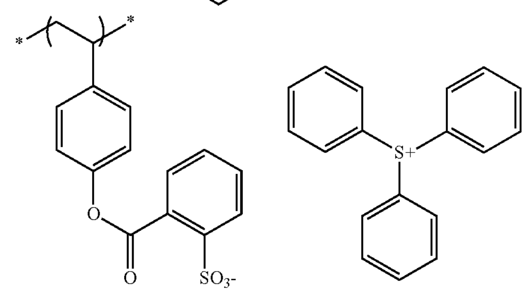
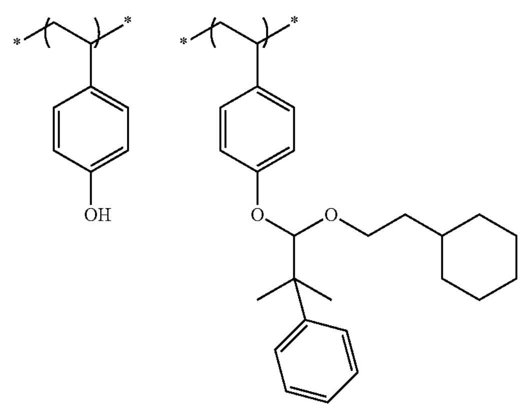
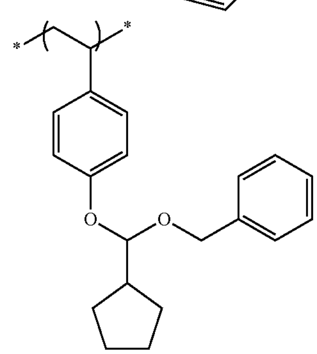
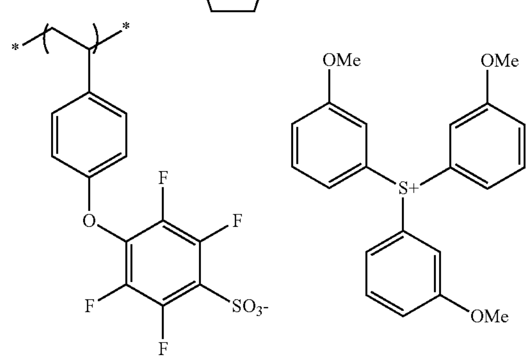

-continued
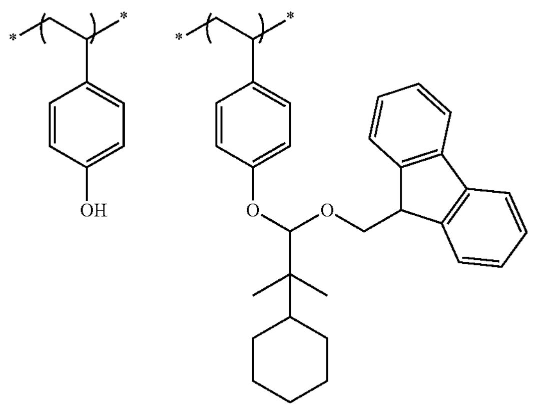
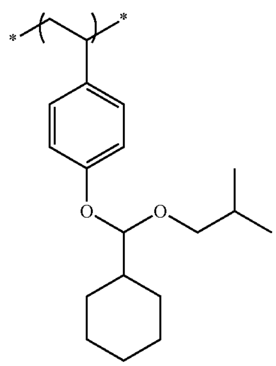
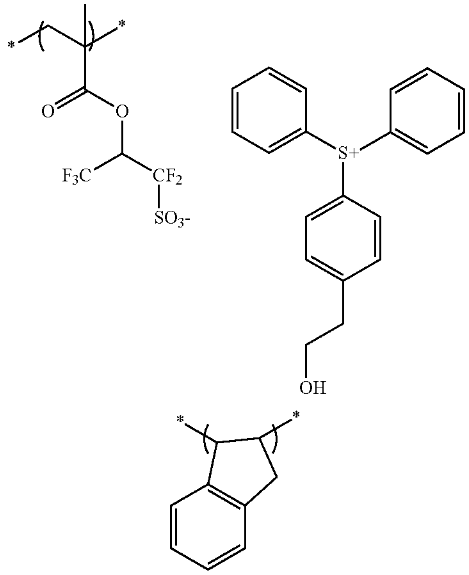
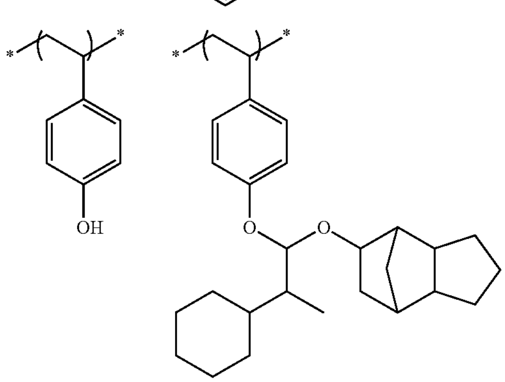
-continued
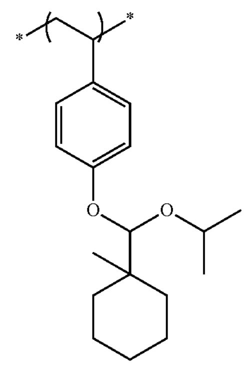
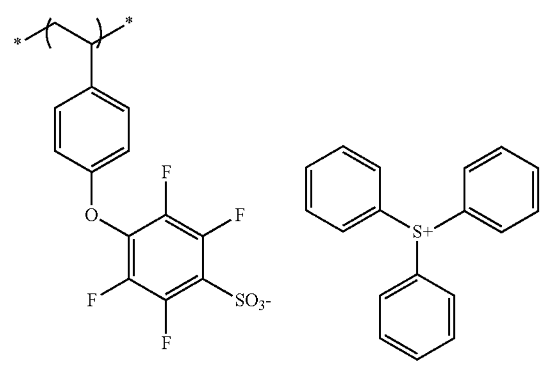
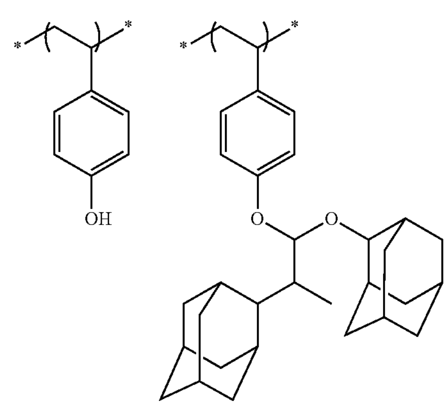
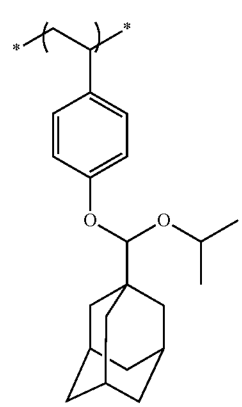

-continued
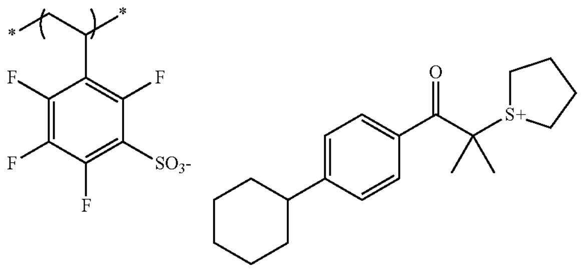
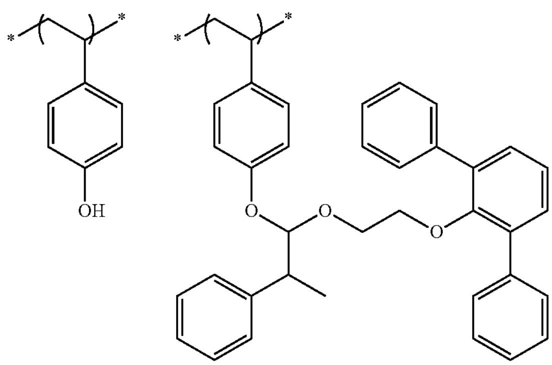
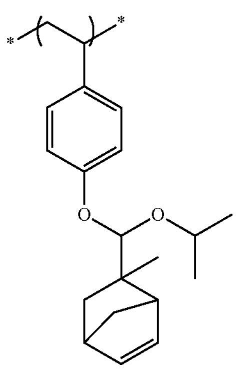
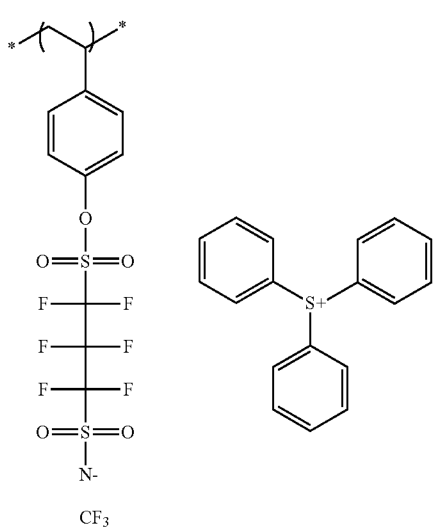
-continued
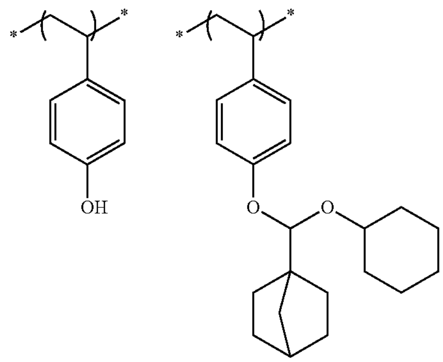
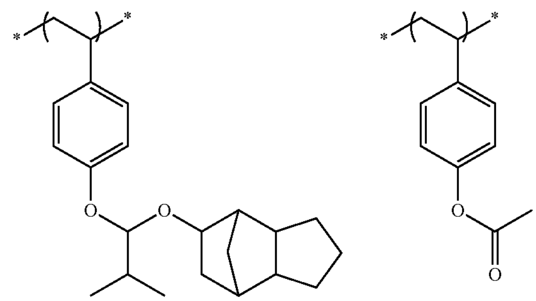
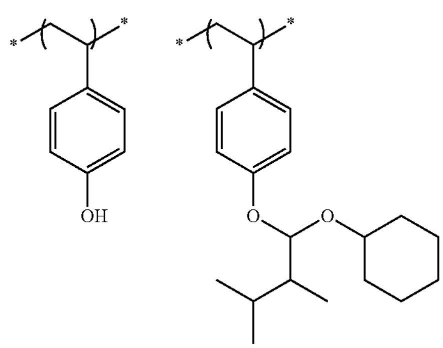
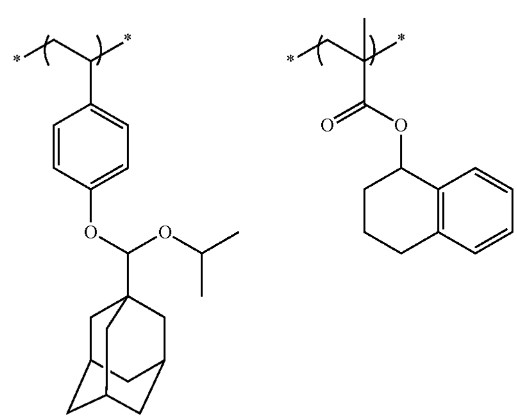
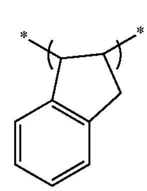

-continued
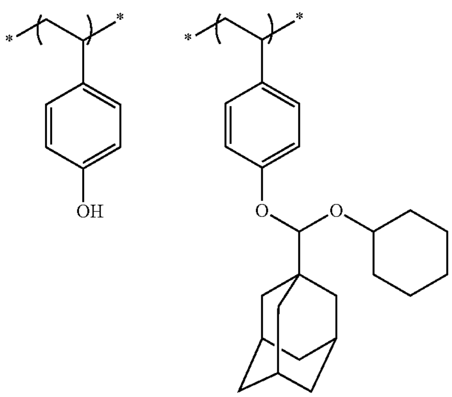
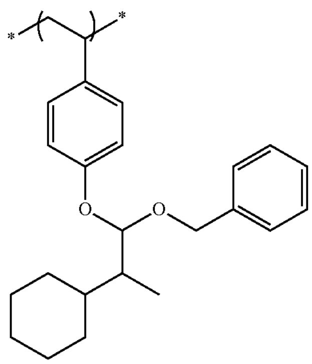
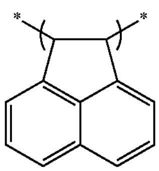
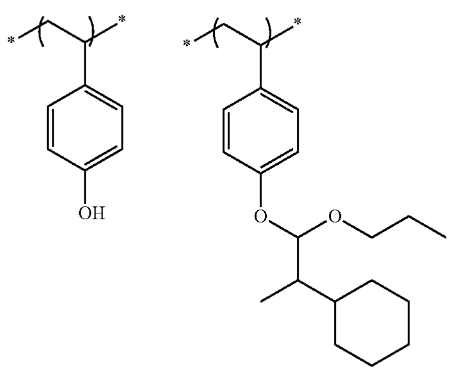
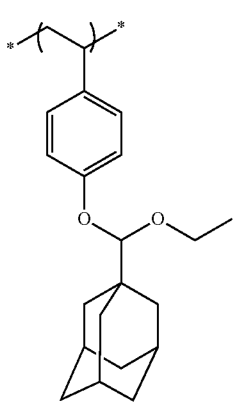
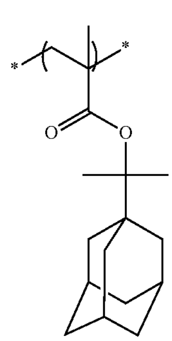
-continued
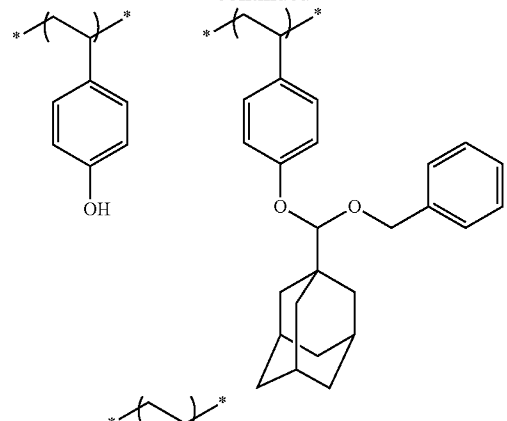
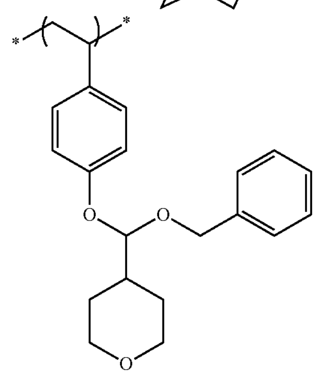
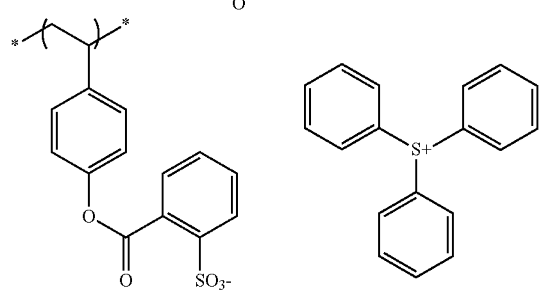
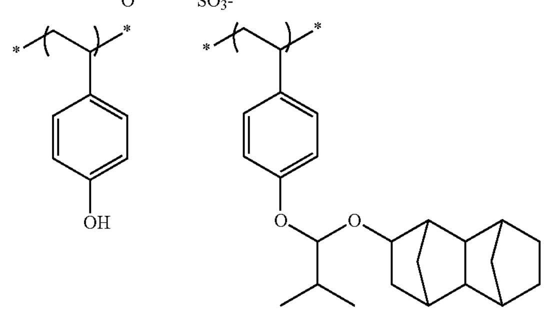
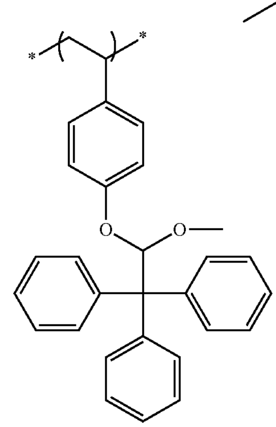
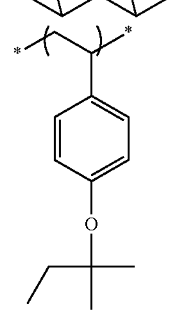

-continued
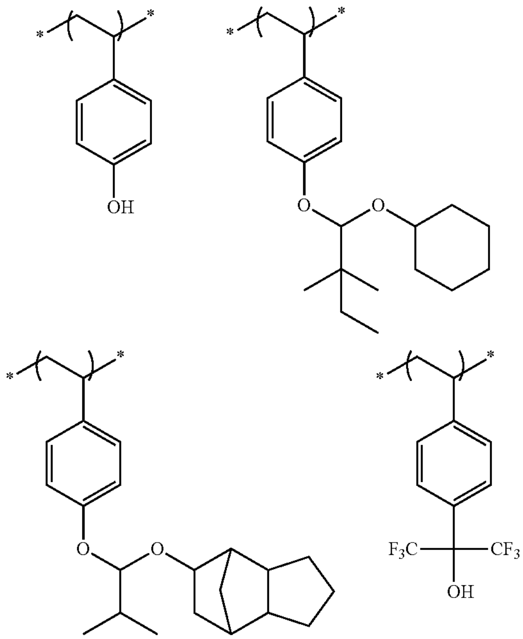
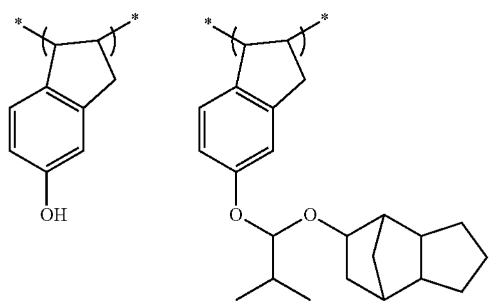
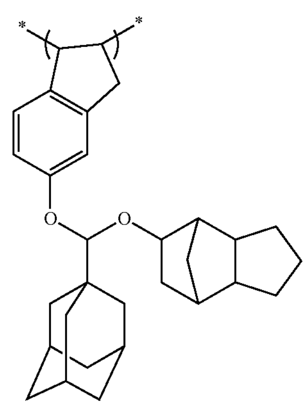
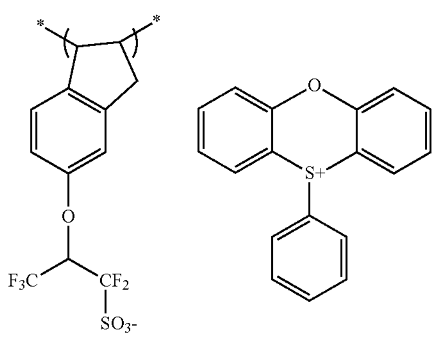
-continued
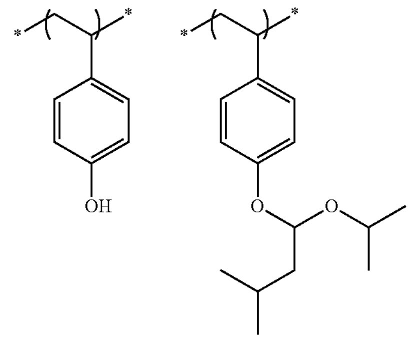
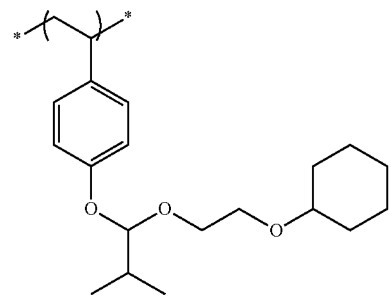
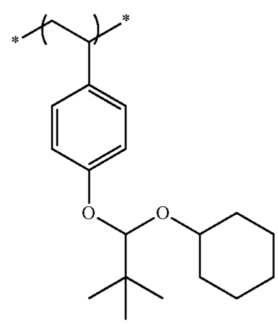
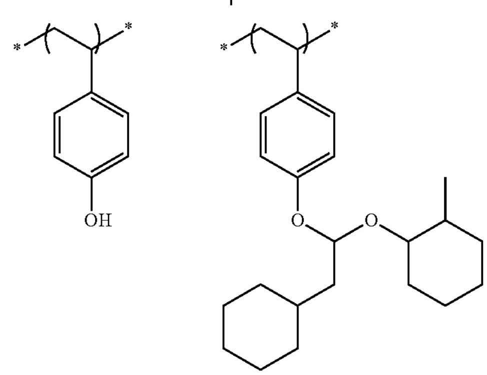
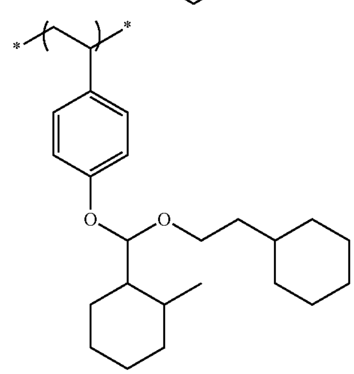

-continued
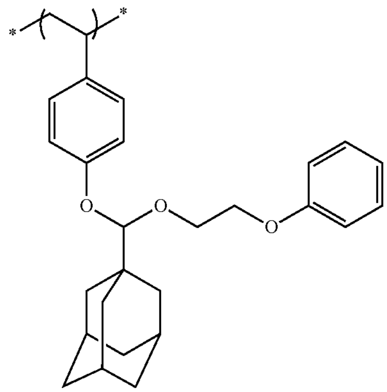
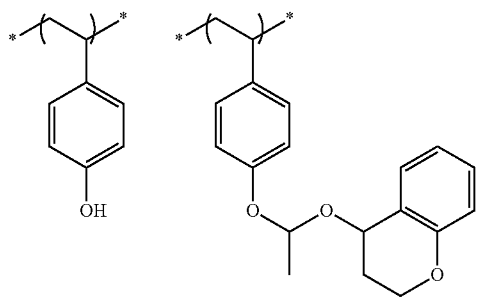
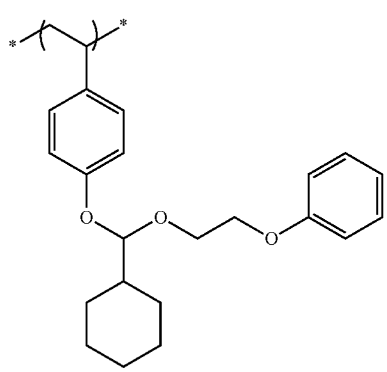
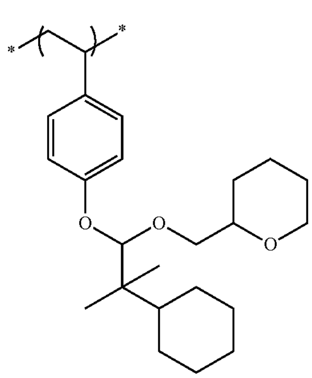
-continued
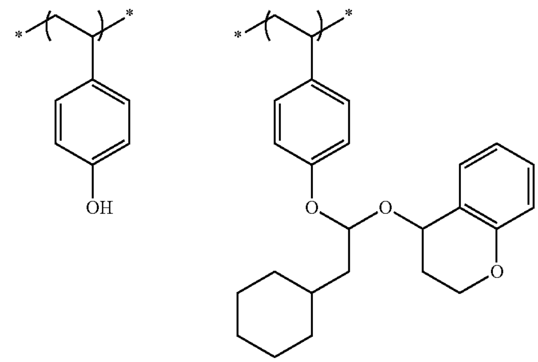
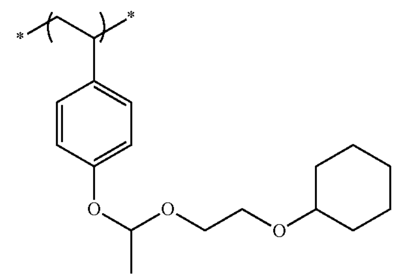
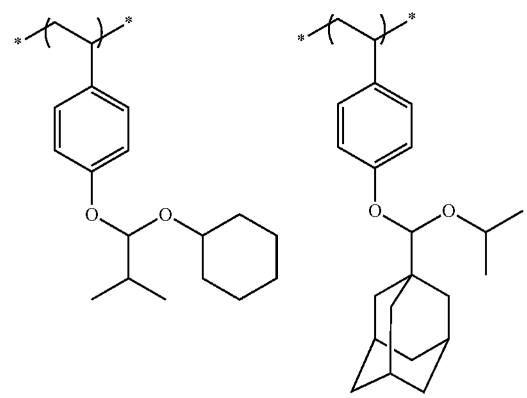
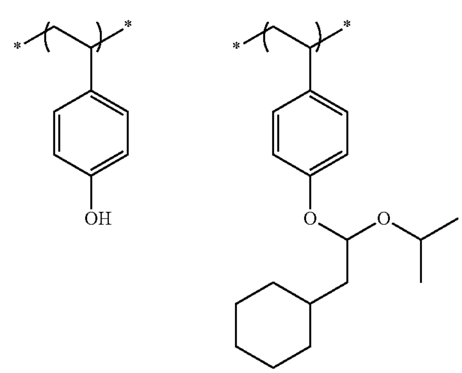

-continued
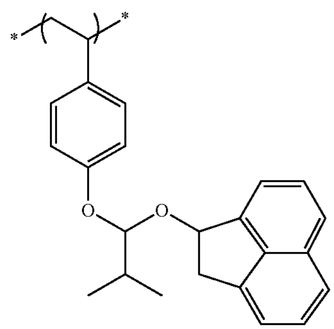
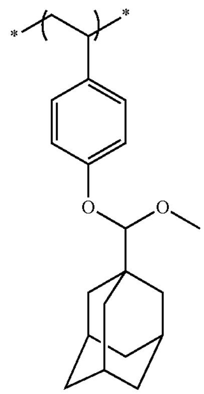
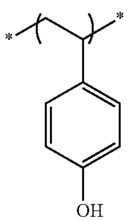
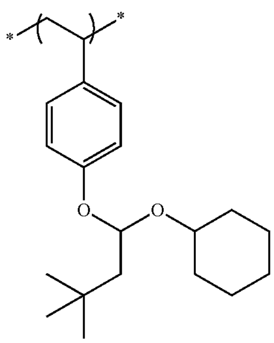
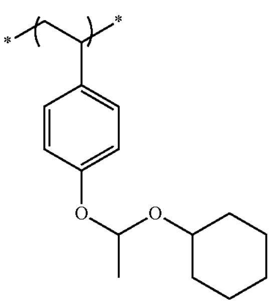
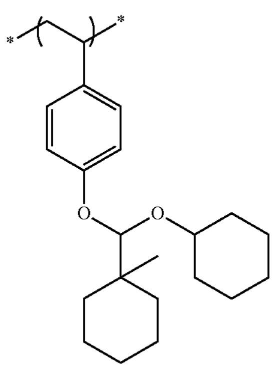
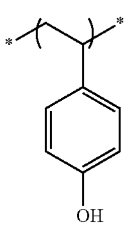
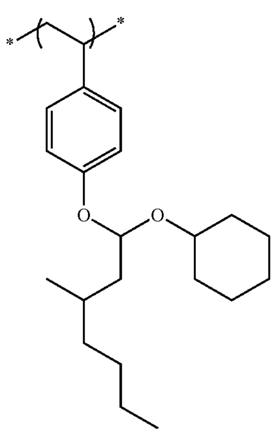
-continued
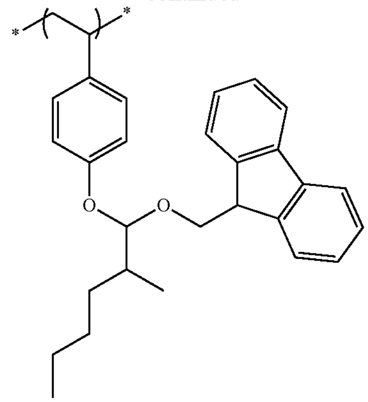
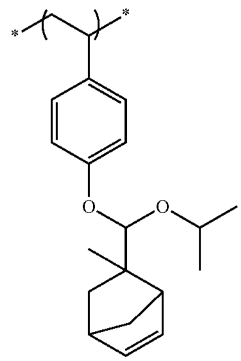
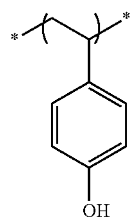
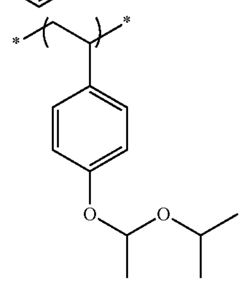
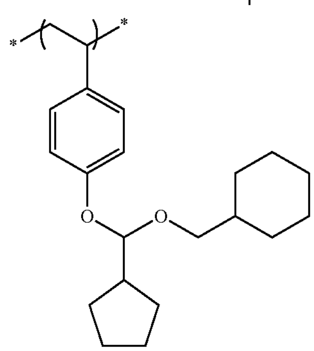
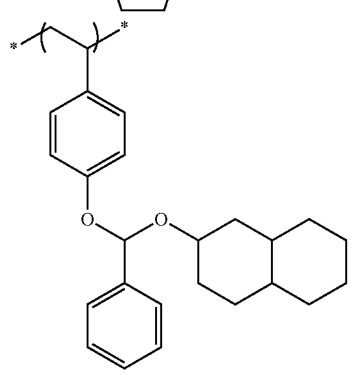

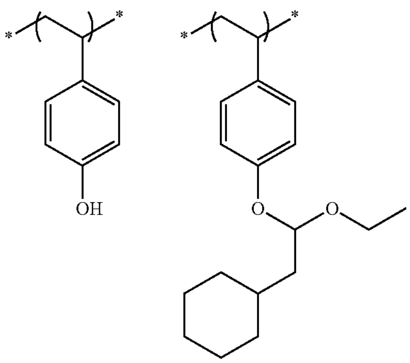
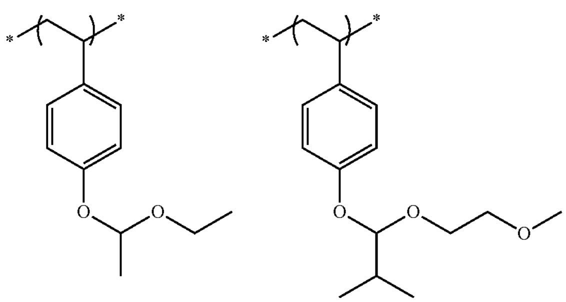
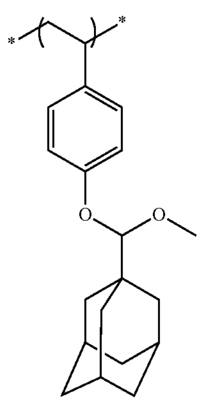
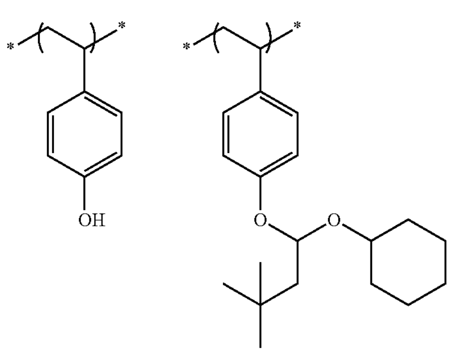
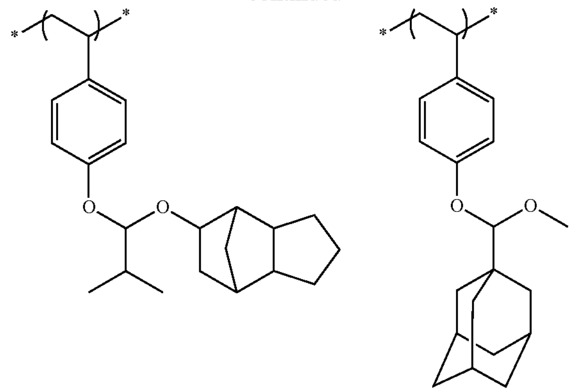
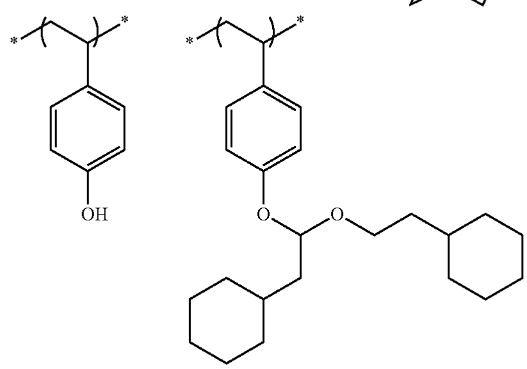
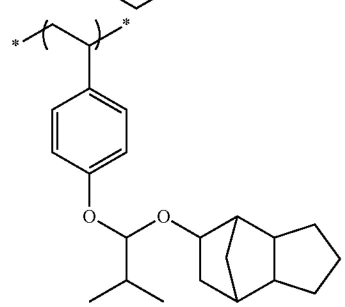
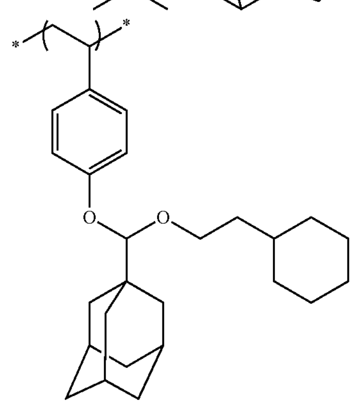
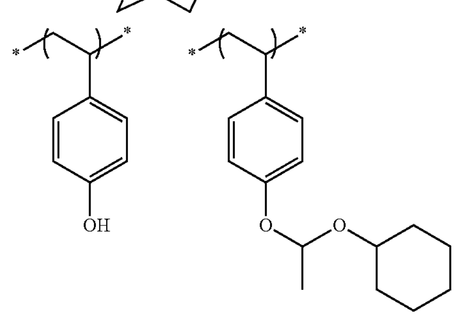

-continued
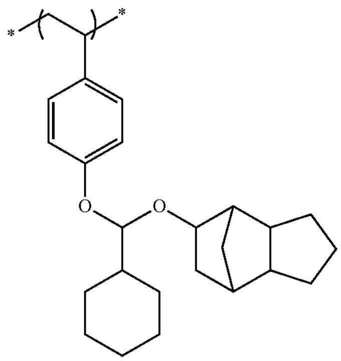
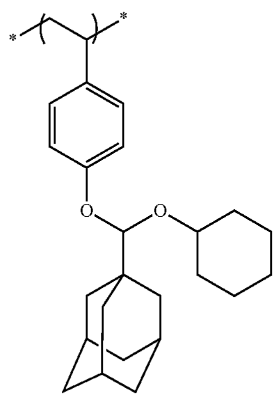
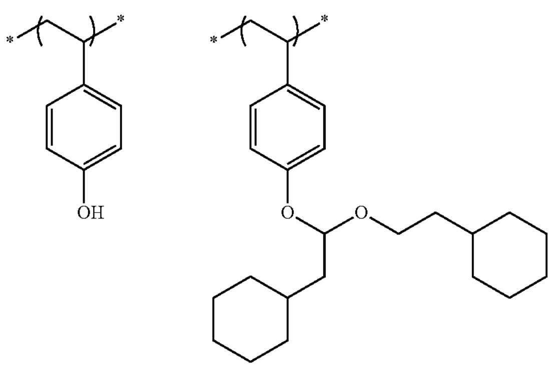
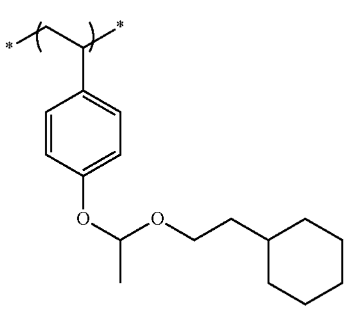
-continued
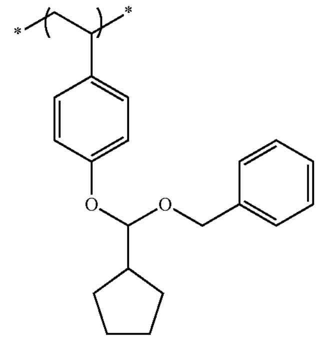
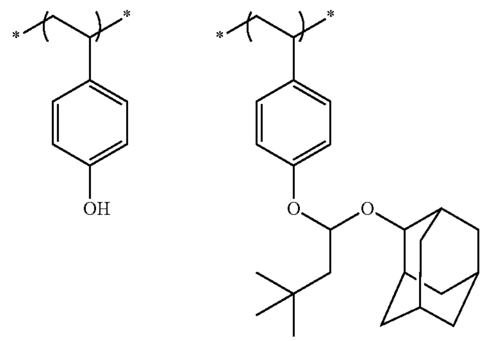
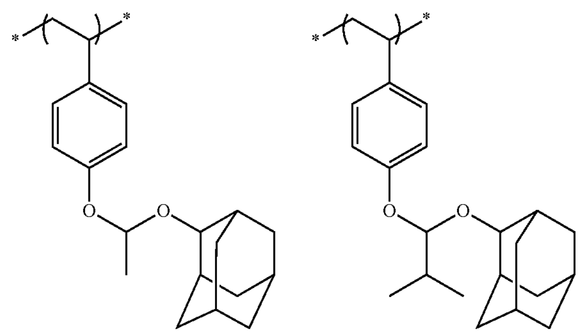
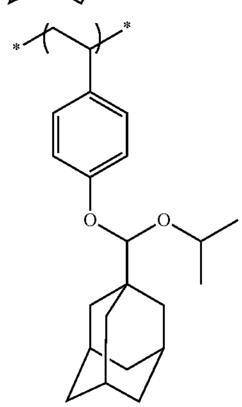
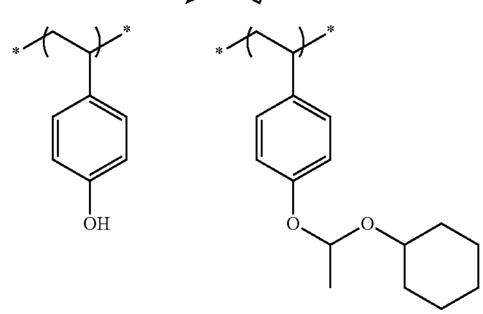

-continued
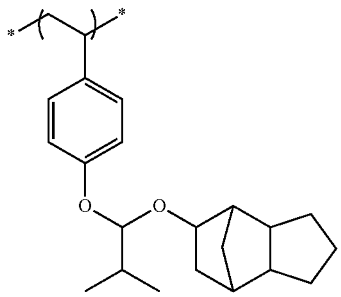
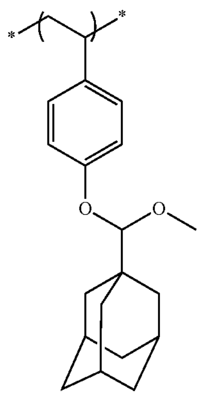
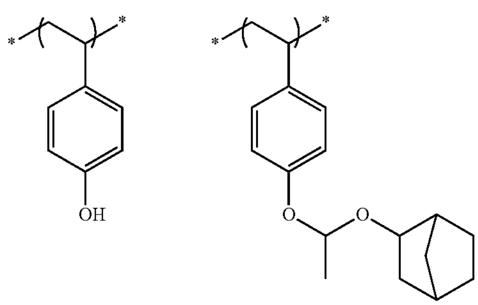
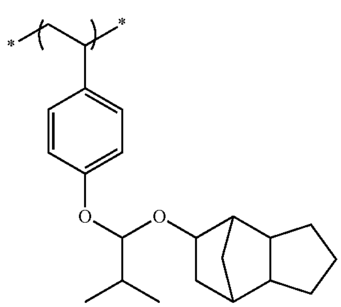
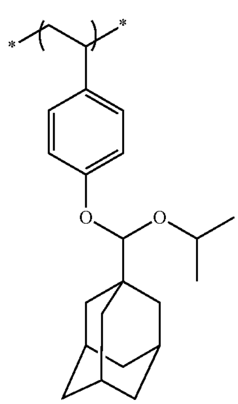
-continued
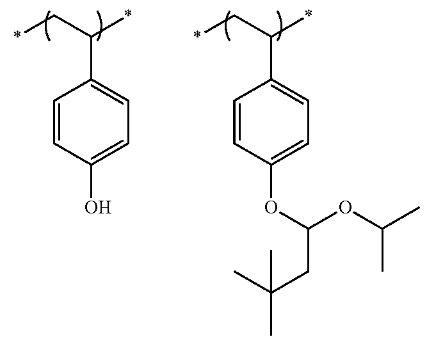
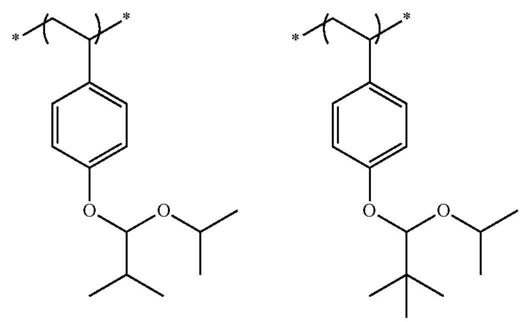
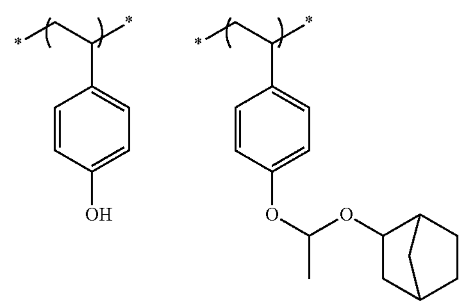
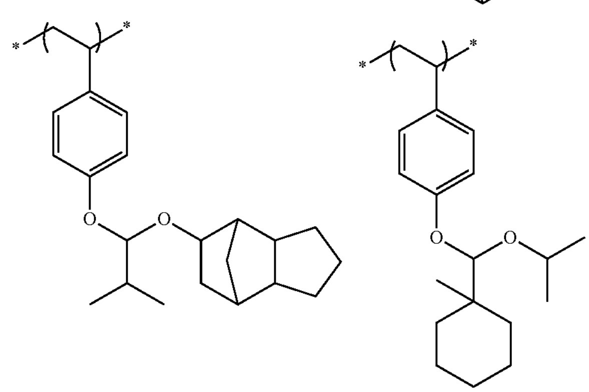
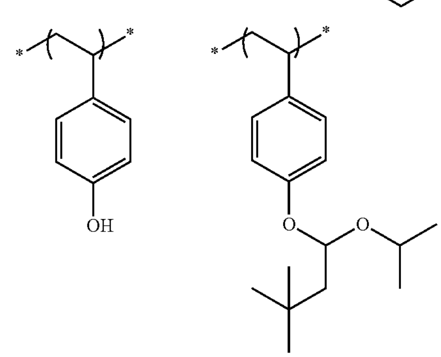

-continued
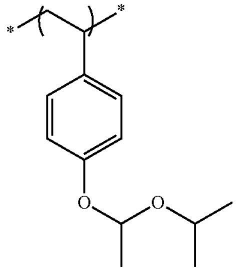
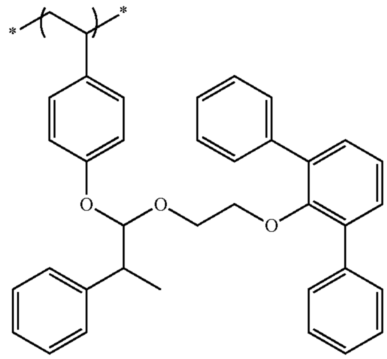
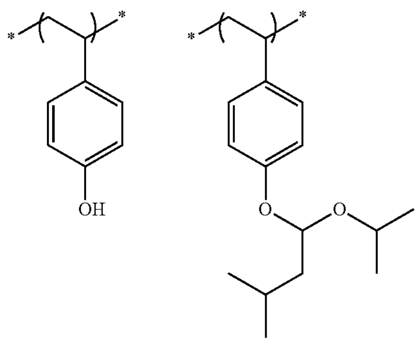
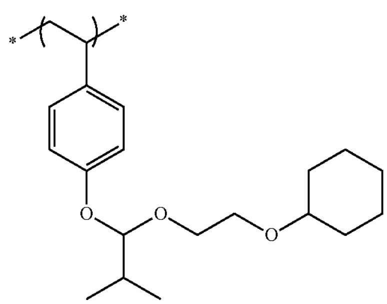
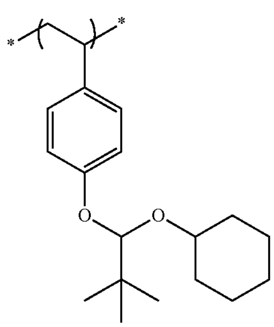
-continued
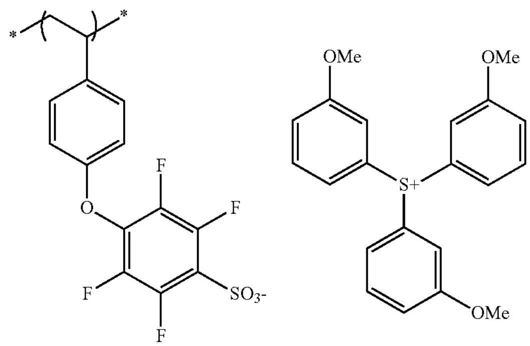
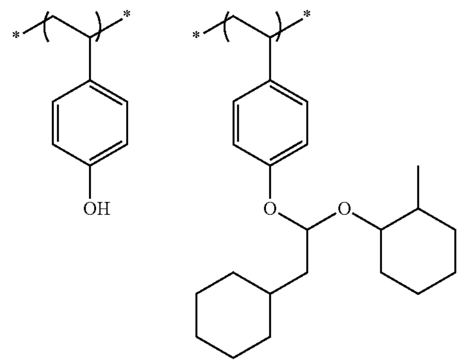
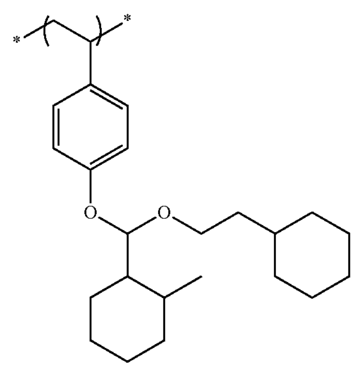
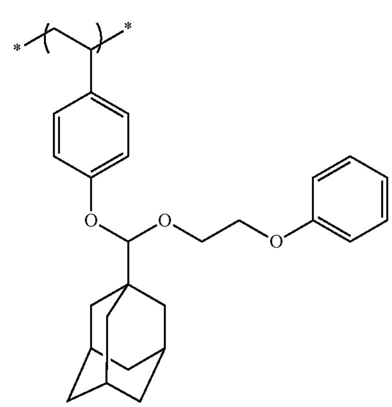

-continued
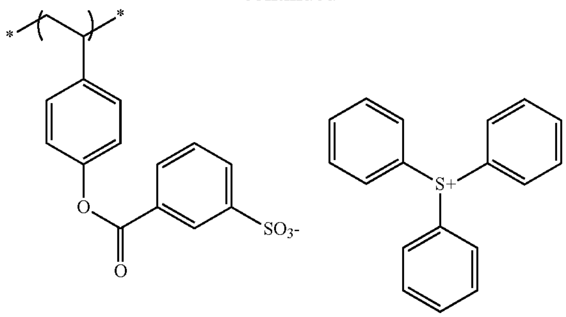
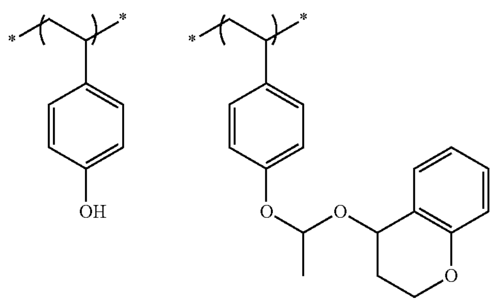
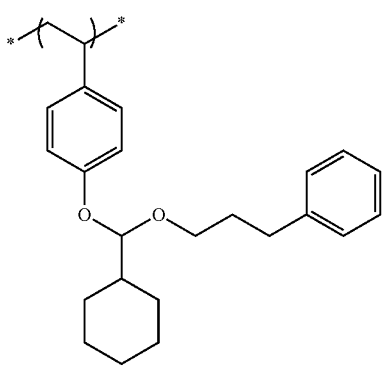
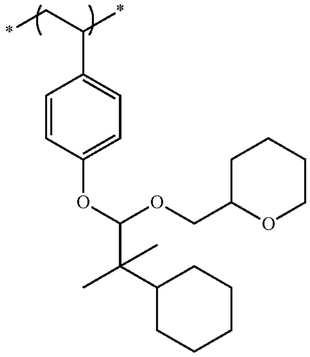
-continued
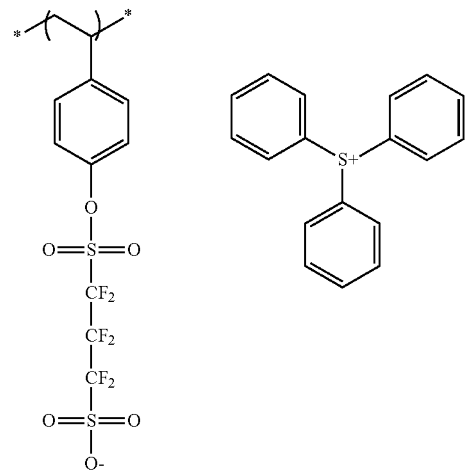
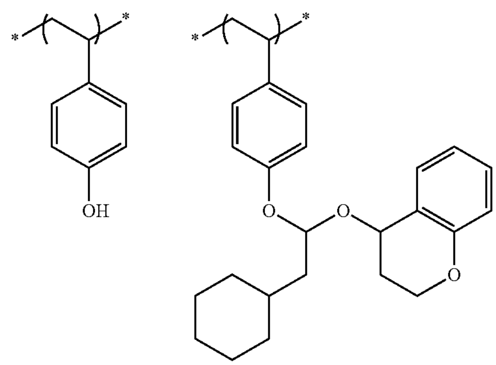
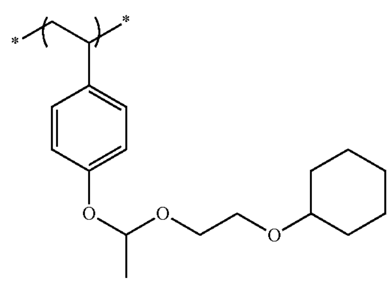
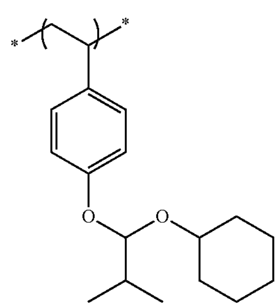
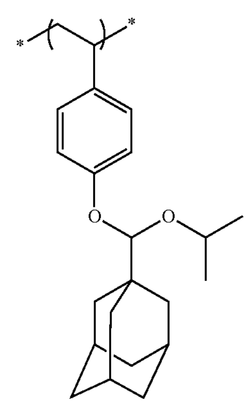

-continued
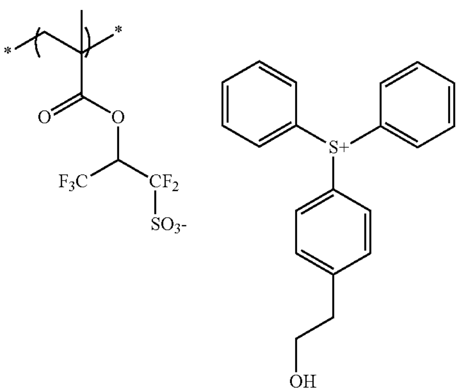
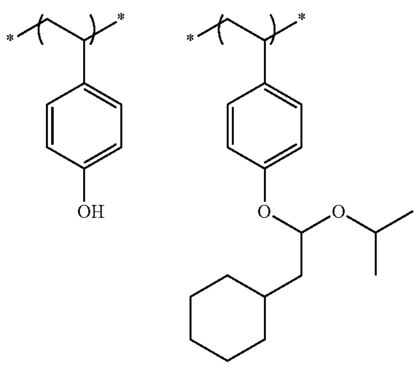
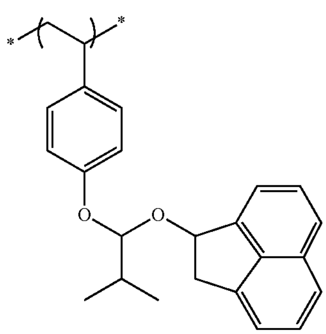
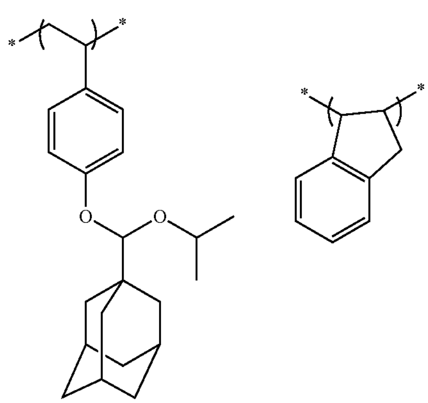
-continued
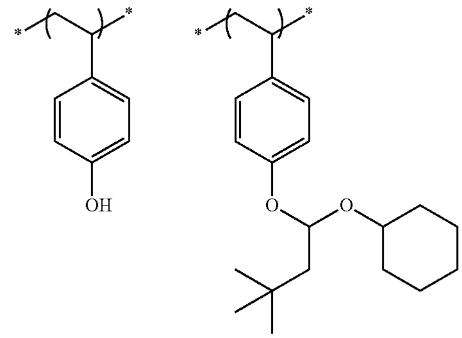
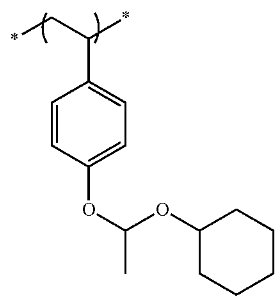
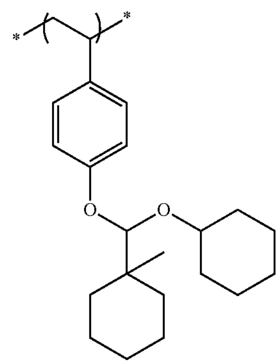
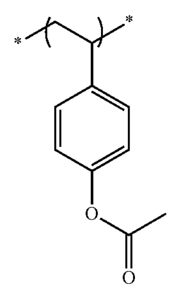
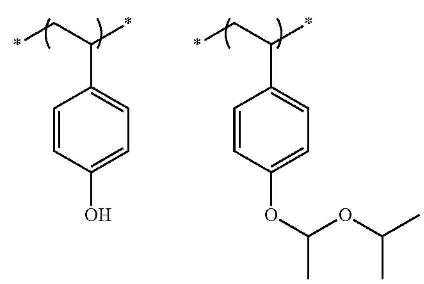
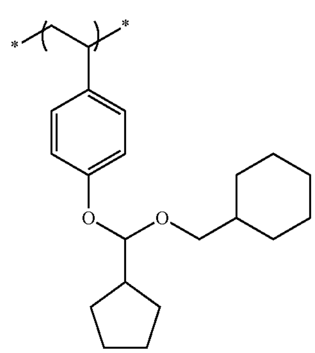

-continued
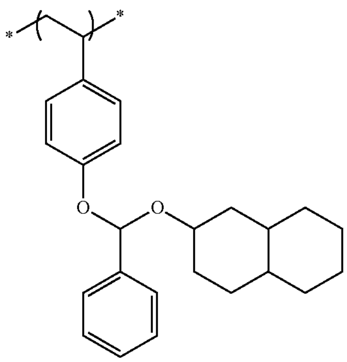
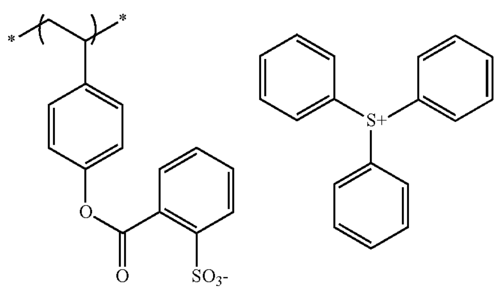
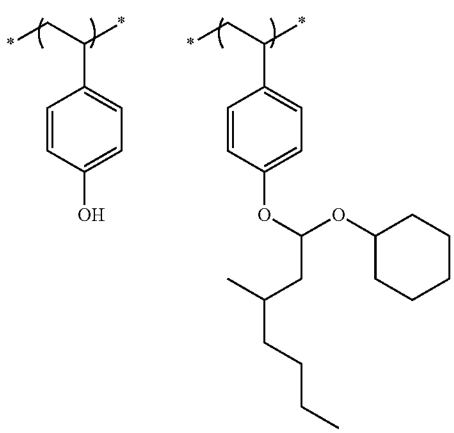
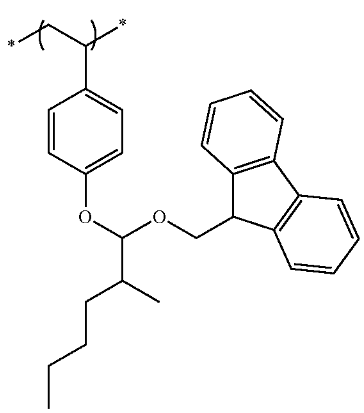
-continued
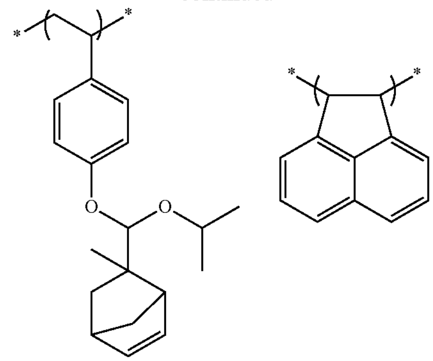
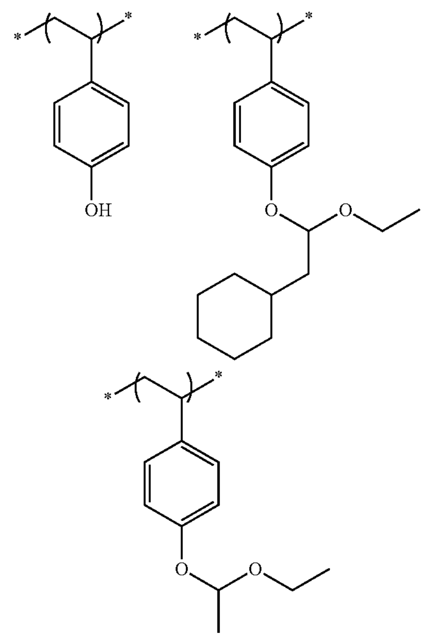
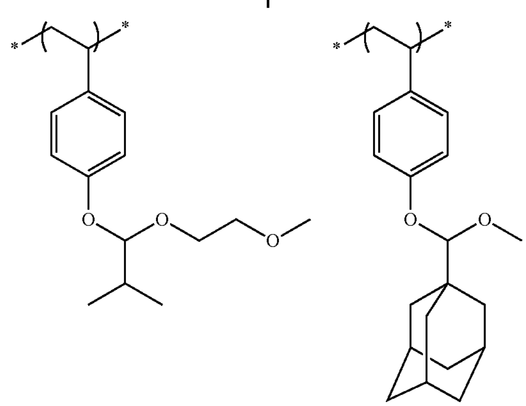
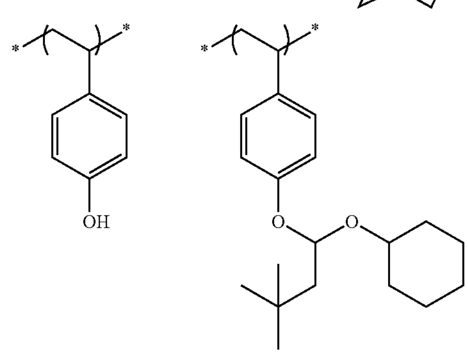

-continued
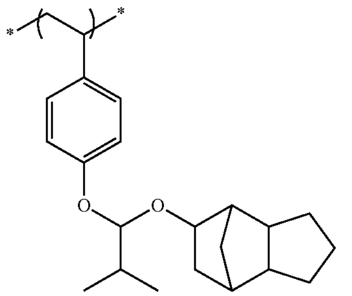
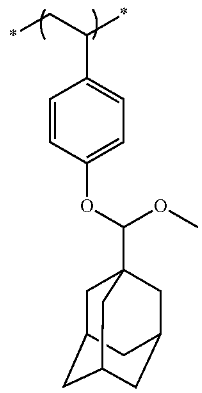
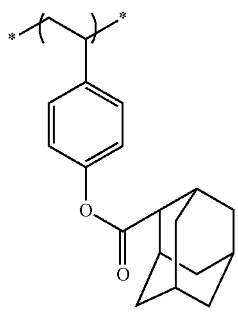
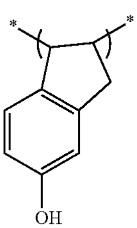
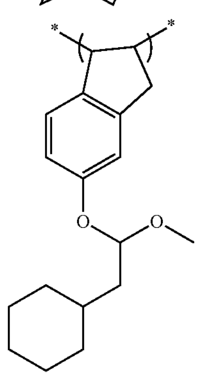
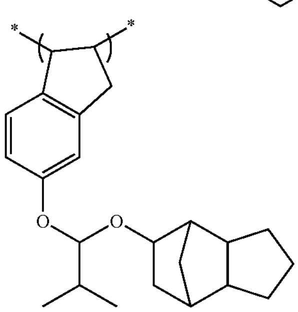
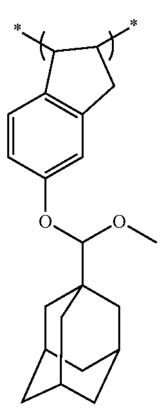
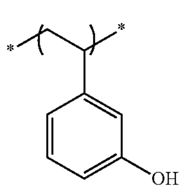
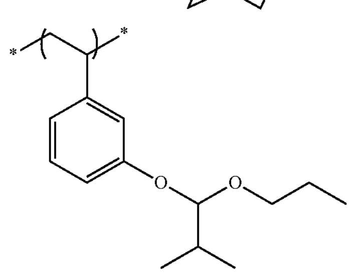
-continued
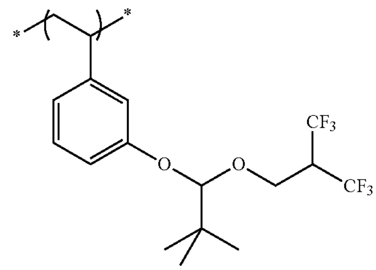
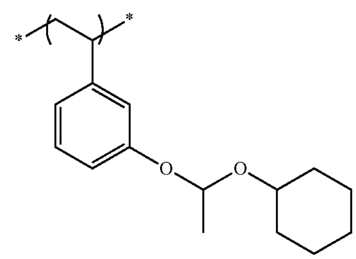
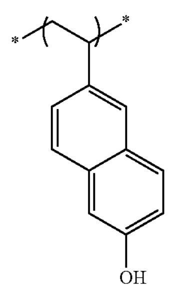
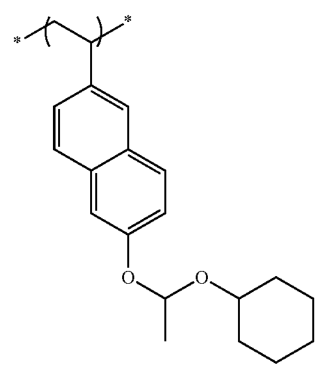
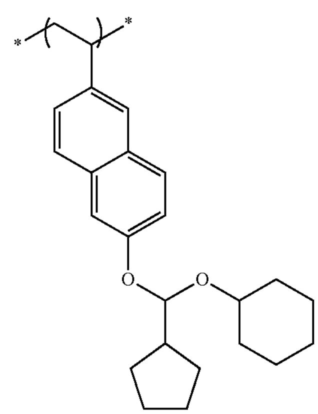
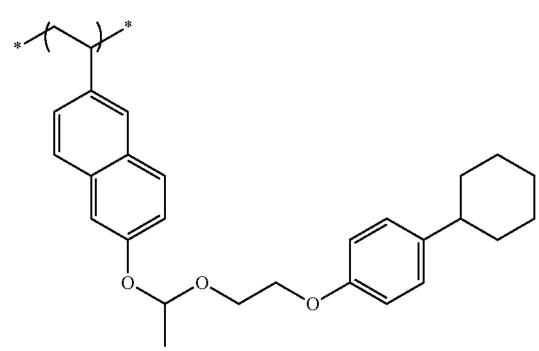

-continued
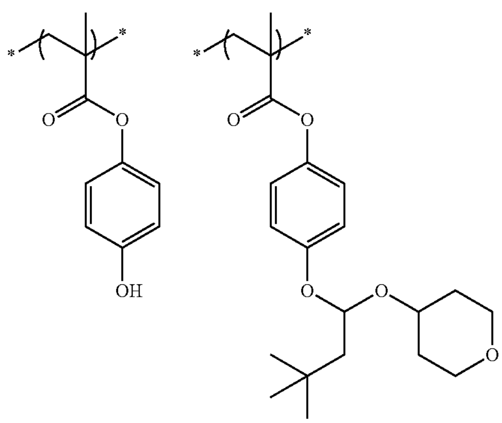
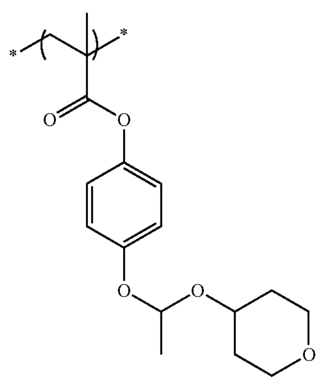
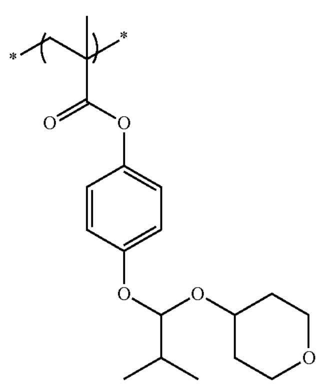
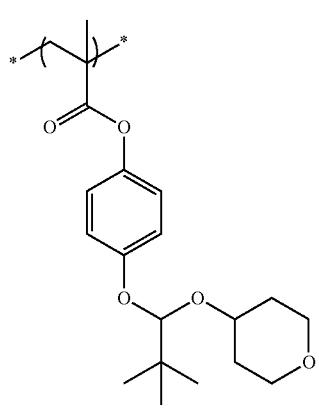
-continued
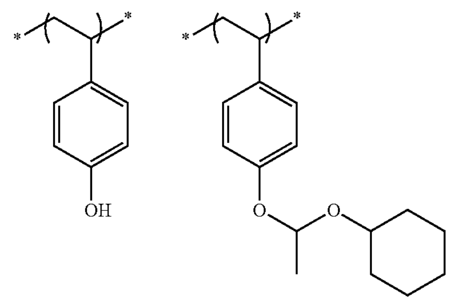
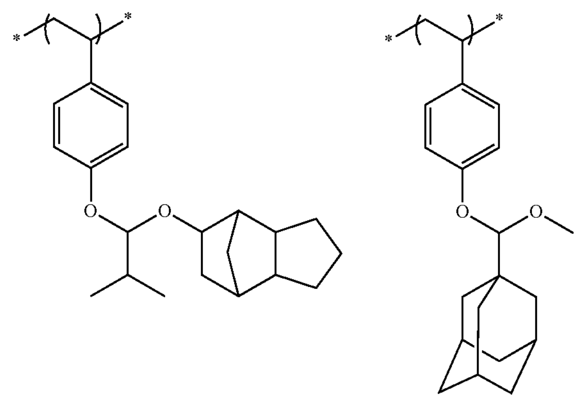
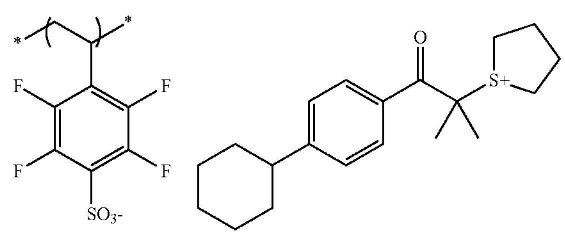
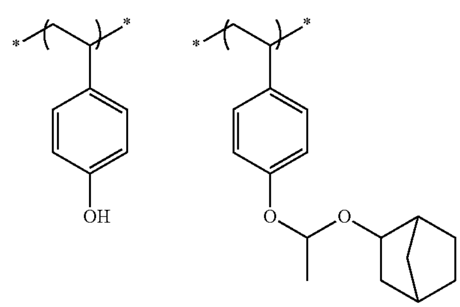
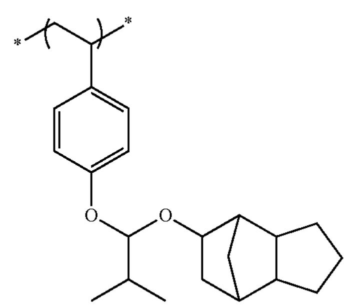

-continued
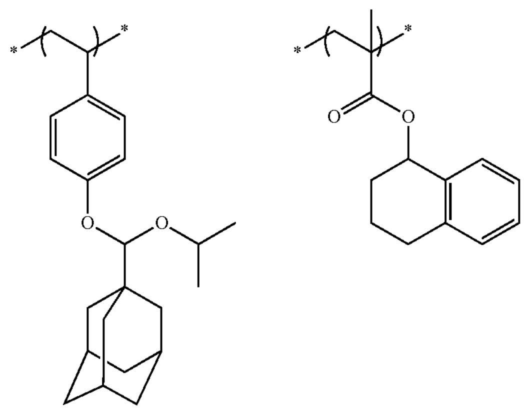
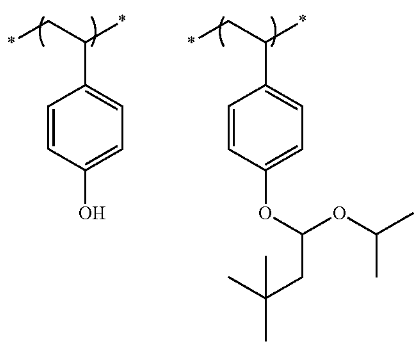
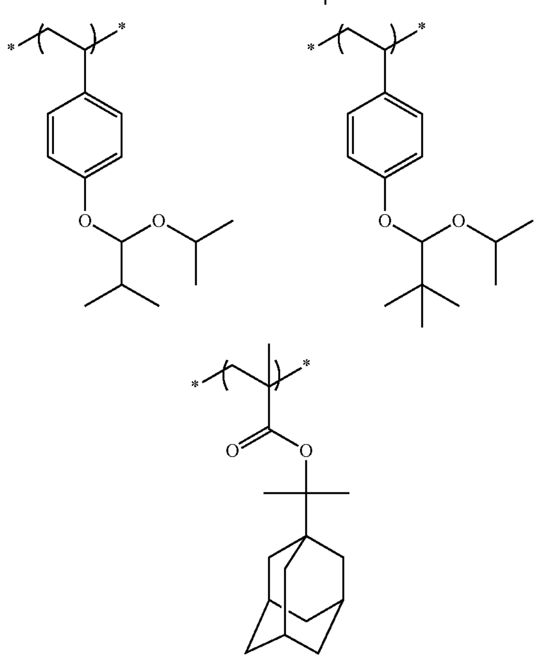
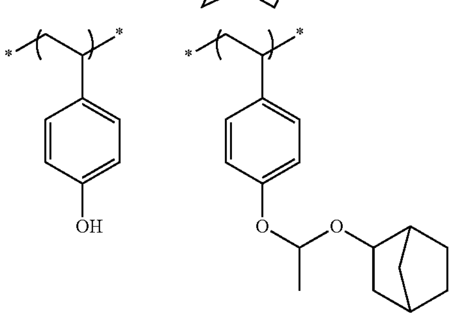
-continued
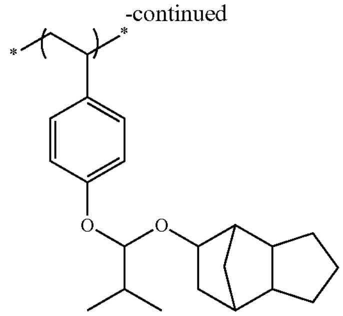
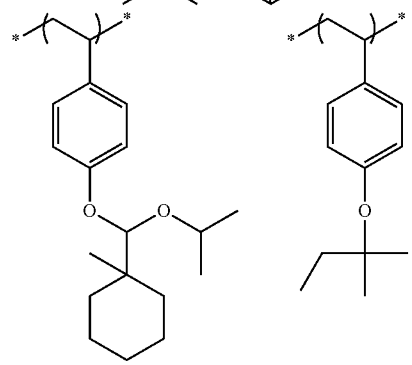
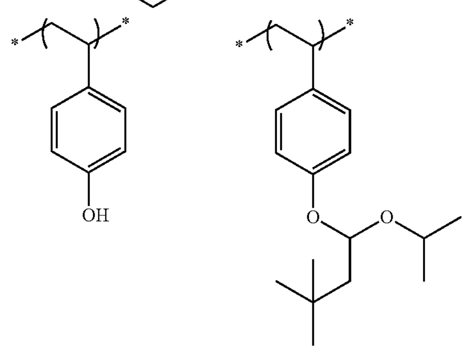
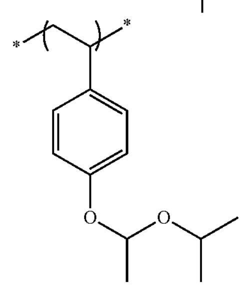
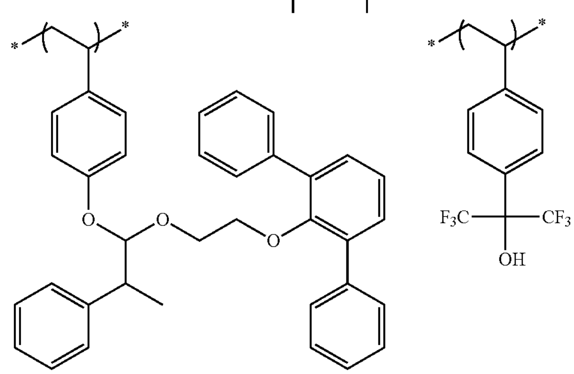
[2] Resin (B') Whose Solubility in an Alkai Developer is Increased by the Action of an Acid, Other than Resin (P)
The actinic ray-sensitive or radiation-sensitive composition of the present invention may contain a resin (B') whose solubility in an alkai developer is increased by the action of an acid (hereinafter, referred to as resin (B')), other than the resin (P).

The resin (B') is a resin whose alkali solubility is changed by the action of an acid.

The resin (B') is preferably insoluble or sparingly soluble in an alkali developer.

The resin (B') preferably has a repeating unit having an acid-decomposable group.

Examples of the acid-decomposable group may include a group protected by a group capable of leaving a hydrogen atom of an alkali soluble group such as a carboxyl group, a phenolic hydroxyl group, a sulfonate group and a thiol group by the action of an acid.

Examples of the group capable of leaving by the action of an acid may include —$C(R_{36})(R_{37})(R_{38})$, —$C(R_{36})(R_{37})(OR_{39})$, —C(═O)—O—$C(R_{36})(R_{37})(R_{38})$, —$C(R_{01})(R_{02})(OR_{39})$, —$C(R_{01})(R_{02})$—C(═O)—O—$C(R_{36})(R_{37})(R_{38})$ and the like.

In the formula, each of $R_{36}$ to $R_{39}$ independently represents an alkyl group, a cycloalkyl group, an aryl group, an aralkyl group or an alkenyl group. $R_{36}$ and $R_{37}$ may be bound with each other to form a ring. Each of $R_{01}$ to $R_{02}$ independently represents a hydrogen atom, an alkyl group, a cycloalkyl group, an aryl group, an aralkyl group or an alkenyl group.

The resin (B') may be synthesized according to a conventional method (for example, radical polymerization).

The weight average molecular weight of the resin (B') is preferably 1,000 to 200,000, more preferably 2,000 to 20,000, still more preferably 3,000 to 15,000, and particularly preferably 3,000 to 10,000 in terms of polystyrene by the GPC method. By setting the weight average molecular weight within 1,000 to 200,000, it is possible to prevent deterioration in the heat resistance or dry etching resistance may be prevented and prevent the film-forming property from deteriorating due to impaired developability or increased viscosity.

The polydispersity (molecular weight distribution) is usually in a range of 1 to 3, preferably is in a range of 1 to 2.6, more preferably in a range of 1 to 2, still more preferably in a range of 1.4 to 1.7, and particularly preferably in a range of 1.4 to 1.7. When the molecular weight distribution is as small as possible, the resolution and resist shape are excellent, the side wall of the resist pattern is smooth, and roughness is excellent.

The resin (B') may be used in combination of two or more kinds.

The actinic ray-sensitive or radiation-sensitive composition of the present invention may or may not contain the resin (B'), but when containing, the amount of the resin (B') added is usually 1% by mass to 50% by mass, preferably 1% by mass to 30% by mass, and particularly preferably 1% by mass to 15% by mass based on the total solid of the actinic ray-sensitive or radiation-sensitive composition.

The resin (B') may be exemplified by those described in paragraphs [0214] to [0594] of Japanese Patent Application Laid-Open No. 2011-217048.

Preferred examples of the resin (B') are shown below, but the present invention is not limited thereto.

(Ab-1)

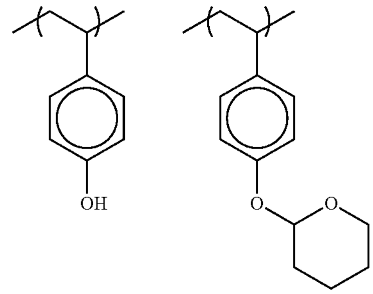

(Ab-5)

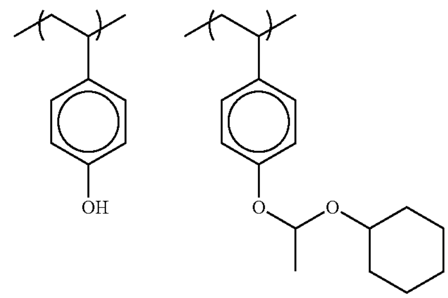

(Ab-8)

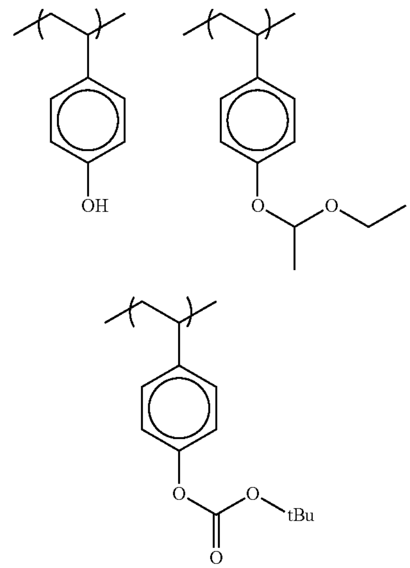

(Ab-12)

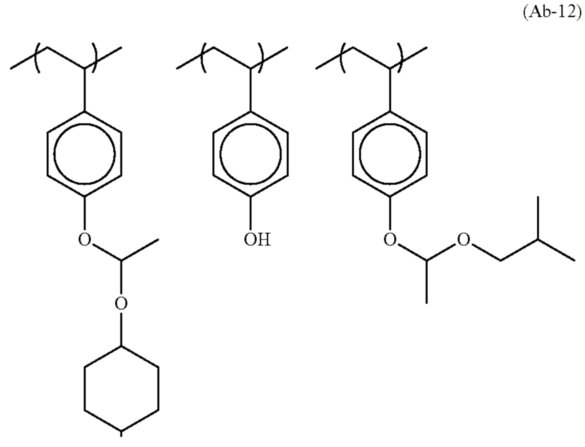

-continued
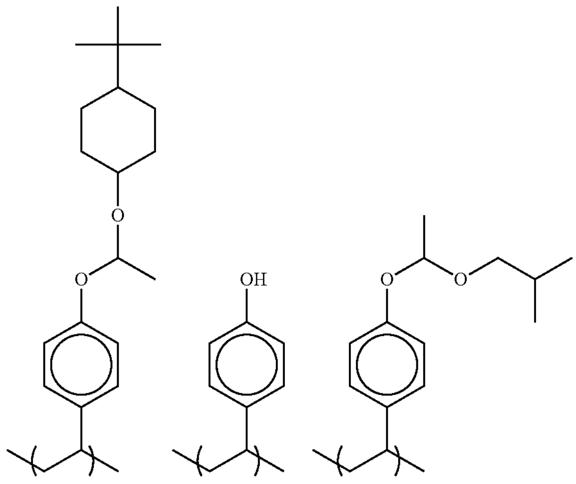
(Ab-14)
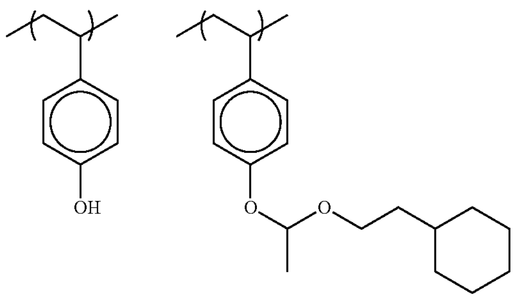
(Ab-20)
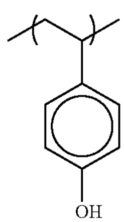
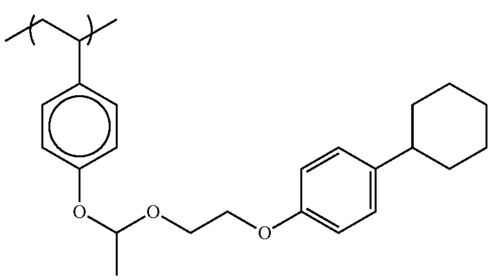
(Ab-21)
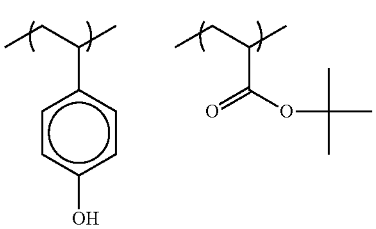
-continued
(Ab-22)
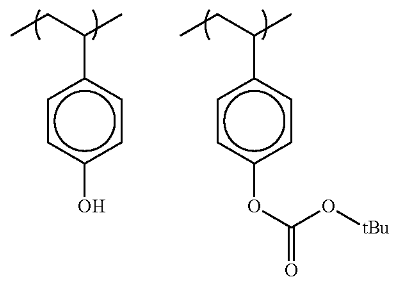
(Ab-30)
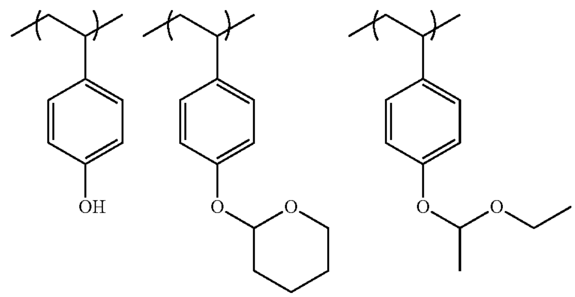
(Ab-33)
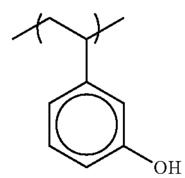
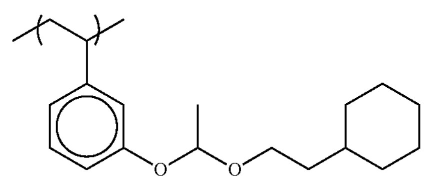
(Ab-35)
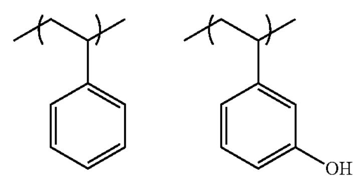
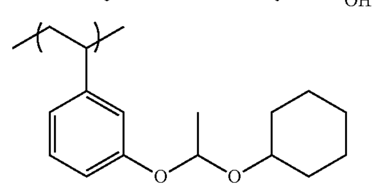
(Ab-39)
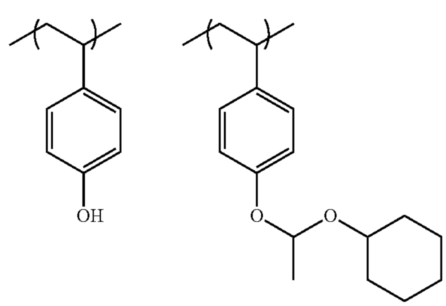

-continued
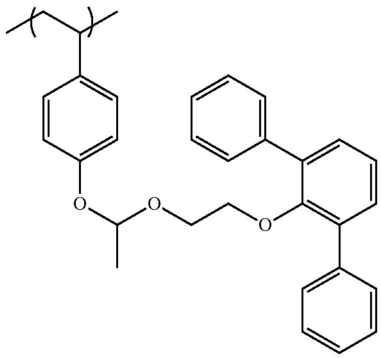
(Ab-41)
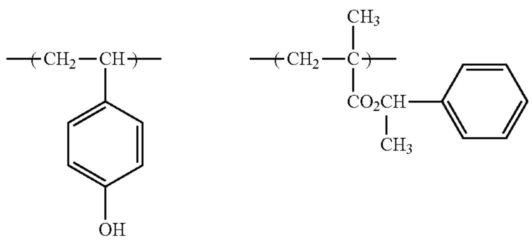
(Ab-57)
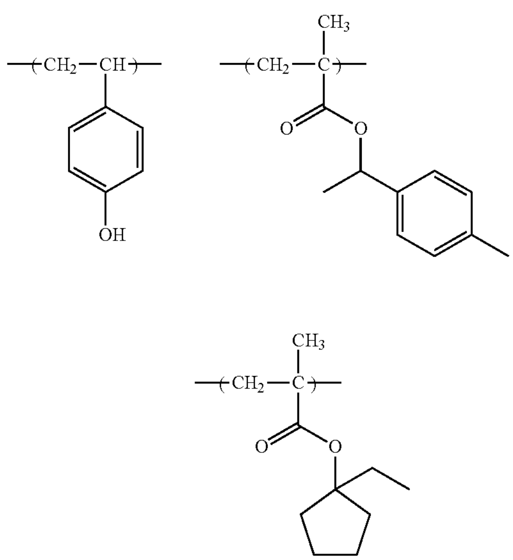
(Ab-58)
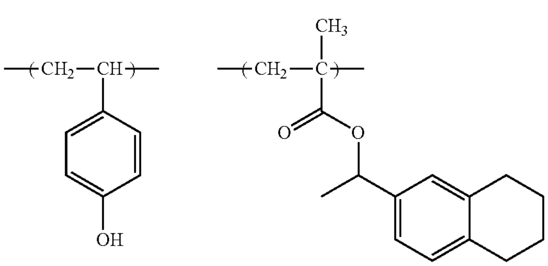
-continued
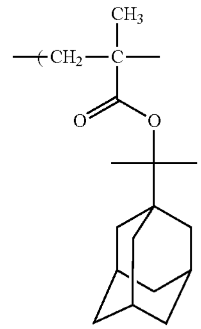
(Ab-60)
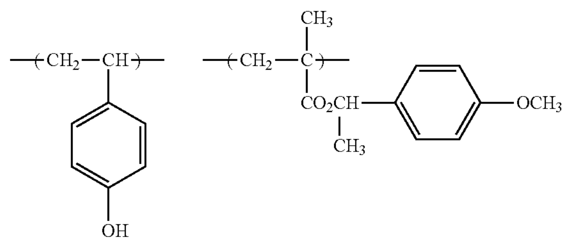
(Ab-64)
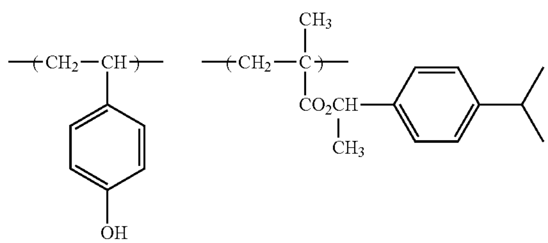
(Ab-71)
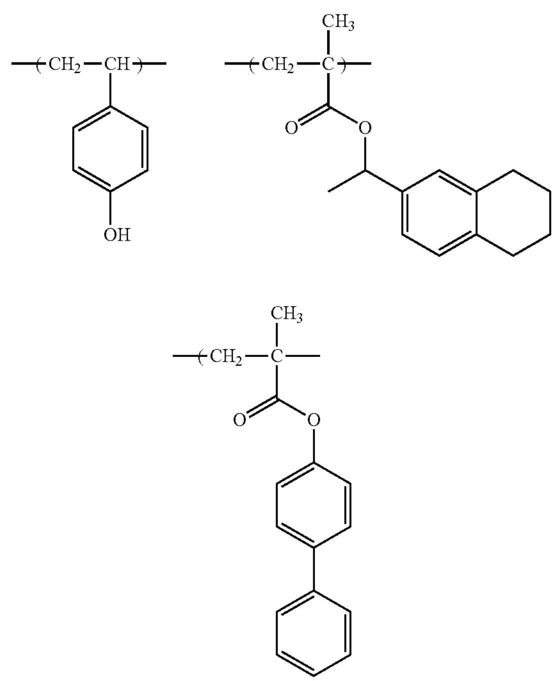

(Ab-73)
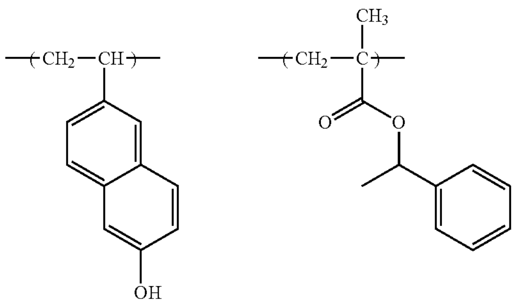
(Ab-80)
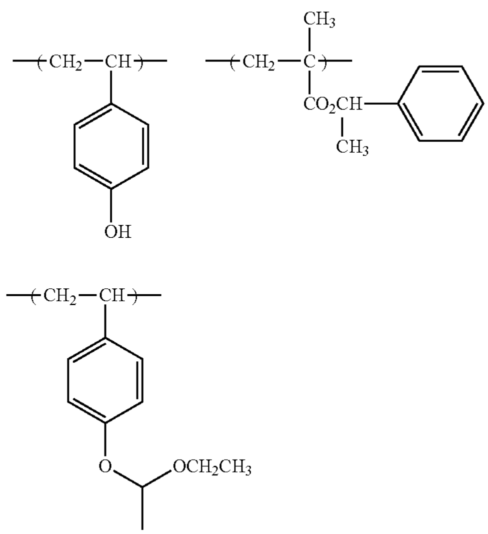
(Ab-86)
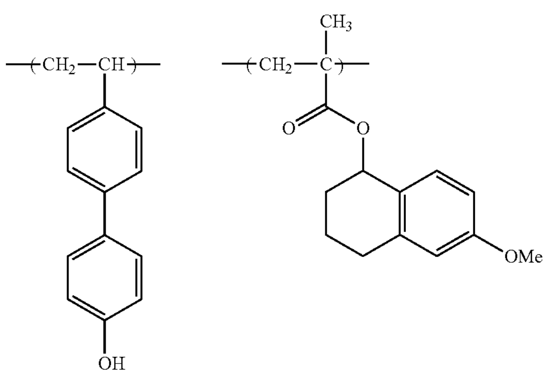
(Ab-87)
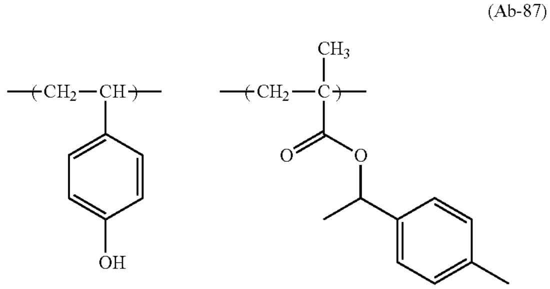
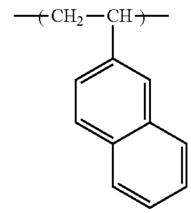
(Ab-88)
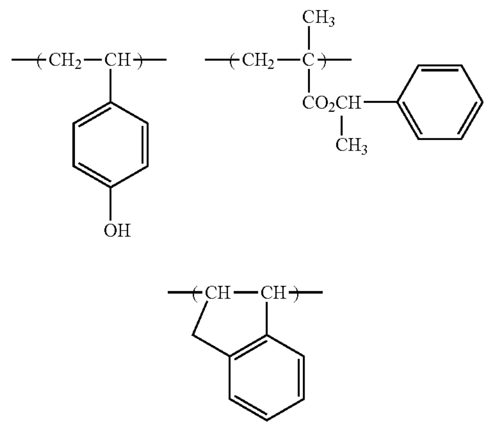
(Ab-91)
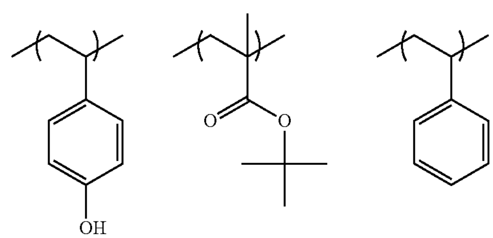
(Ab-93)
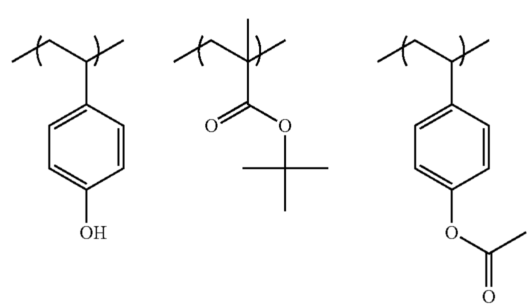
(Ab-106)
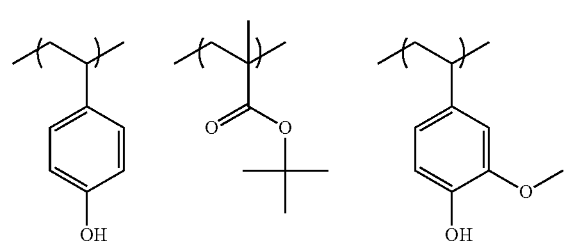

-continued
(Ab-110)
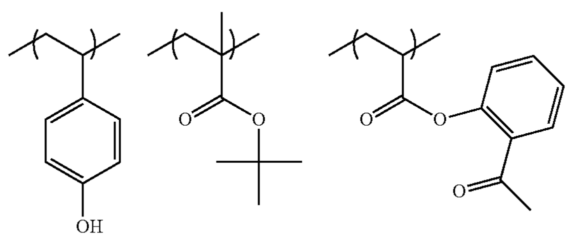
(Ab-120)
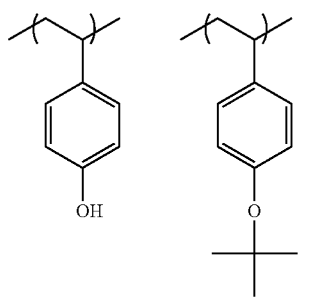
(Ab-121)
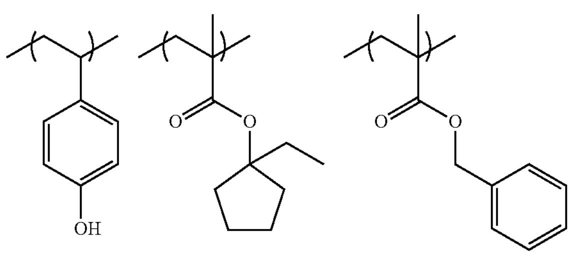
(Ab-128)
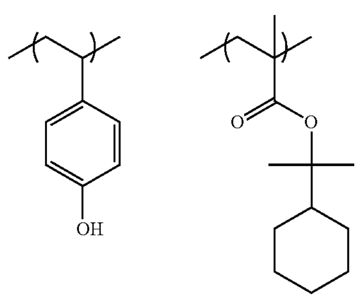
(Ab-131)
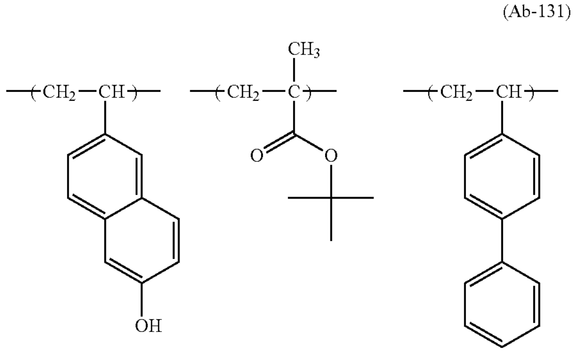
-continued
(Ab-133)
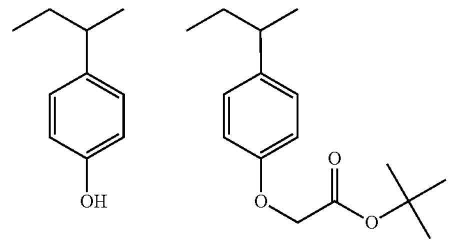
(Ab-135)
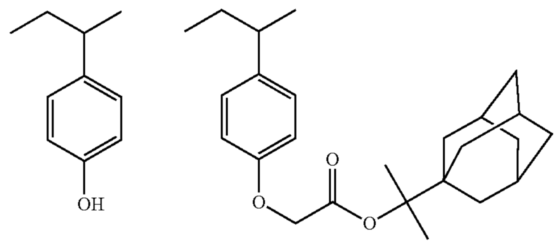
(Ab-143)
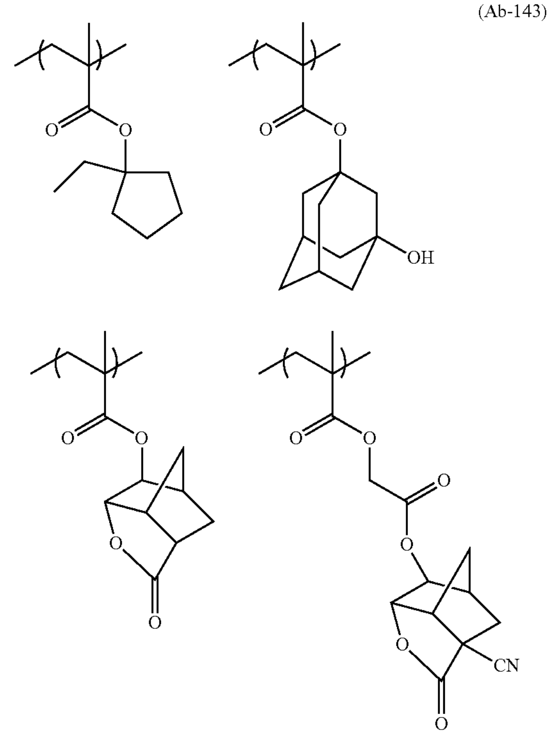
(Ab-149)
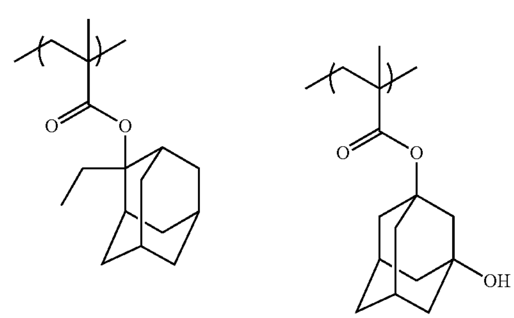

-continued
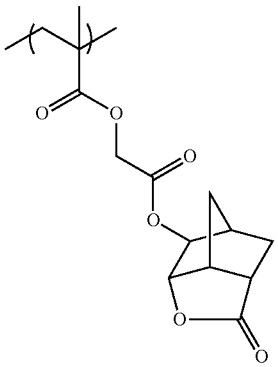
(Ab-160)
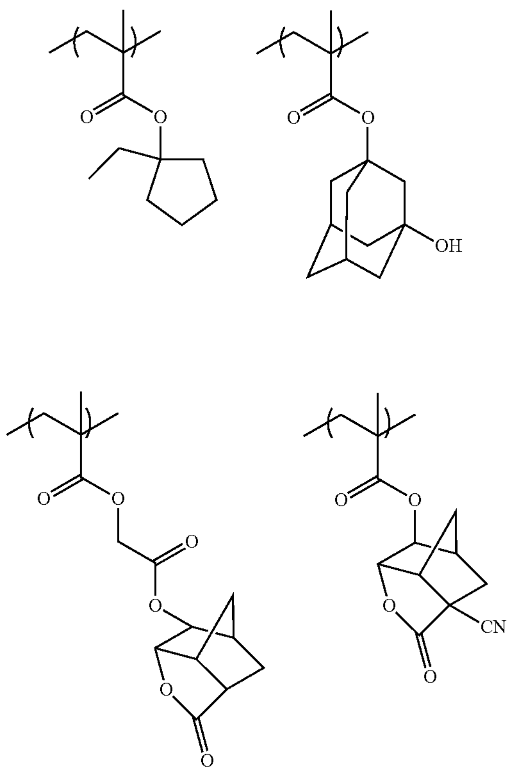
(Ab-161)
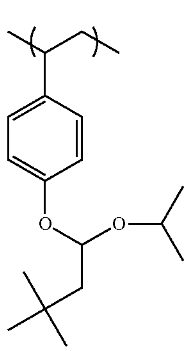
-continued
(Ab-162)
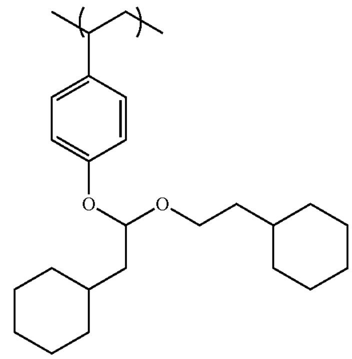
(Ab-165)
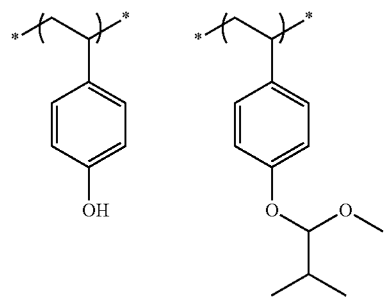
(Ab-166)
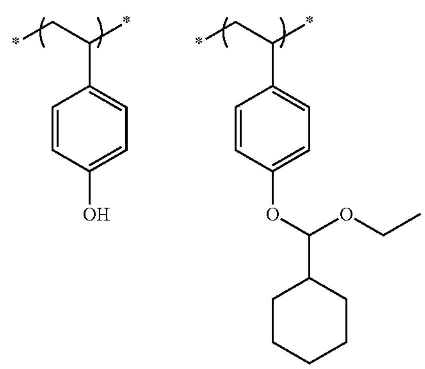
(Ab-167)
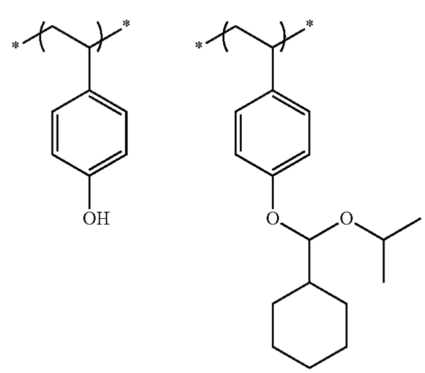

-continued
(Ab-168)
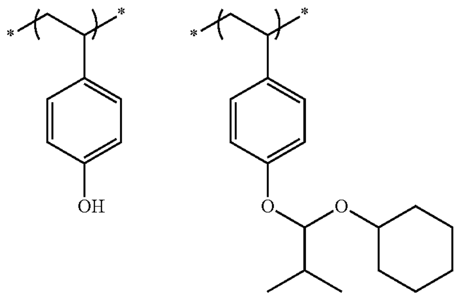
(Ab-169)
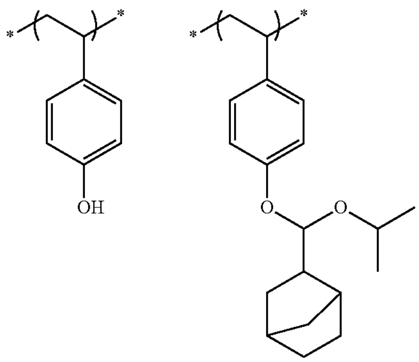
(Ab-170)
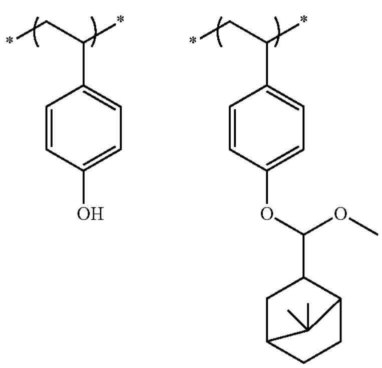
(Ab-171)
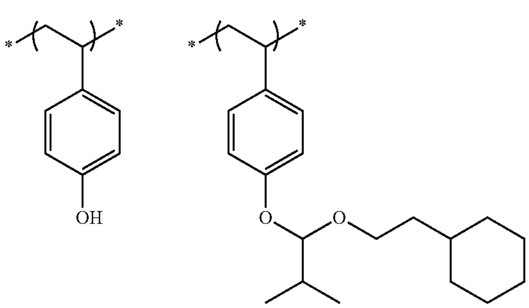
-continued
(Ab-172)
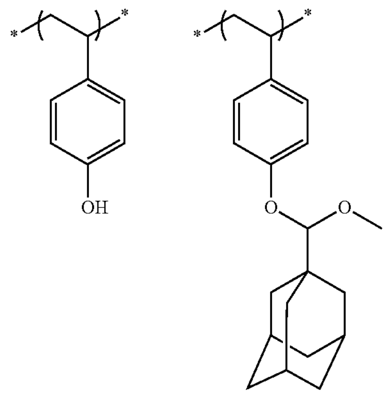
(Ab-173)
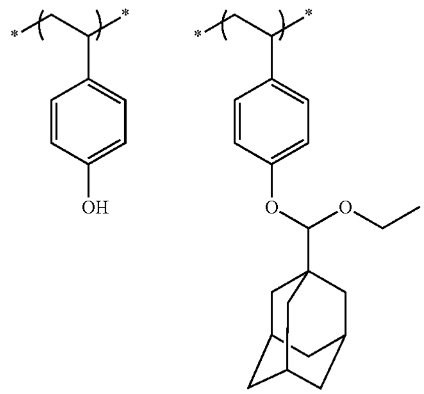
(Ab-174)
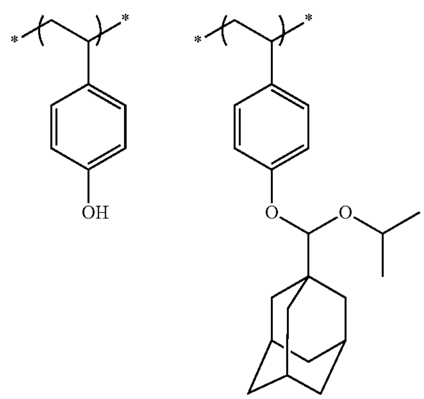
(Ab-175)
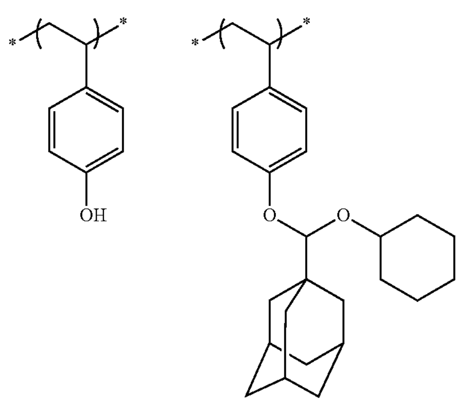

-continued
(Ab-176)
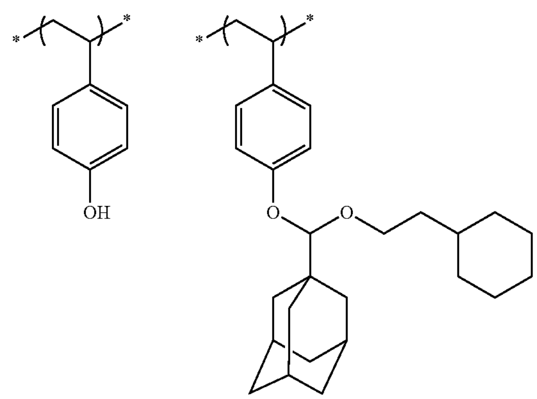
Ab-177
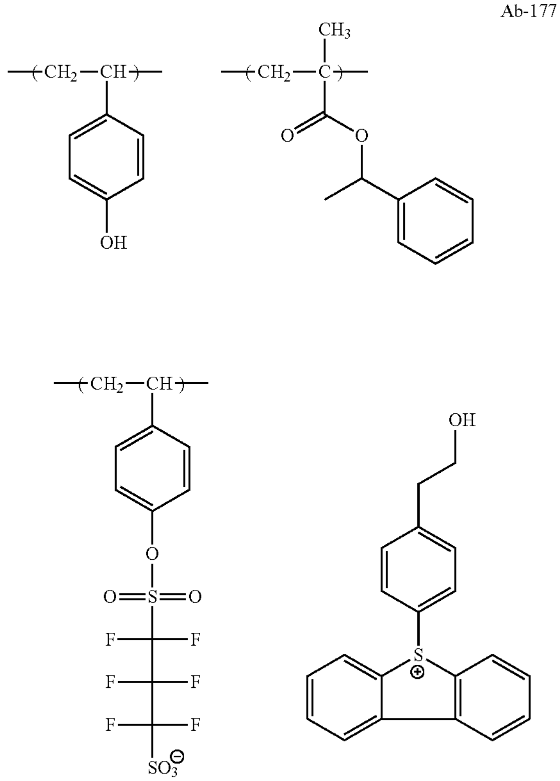
Ab-178
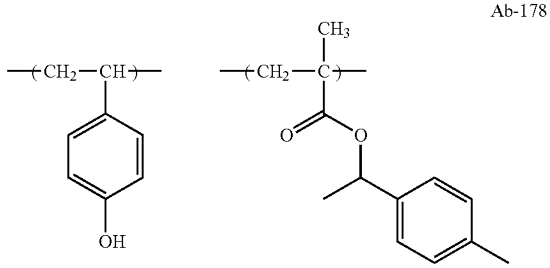
-continued
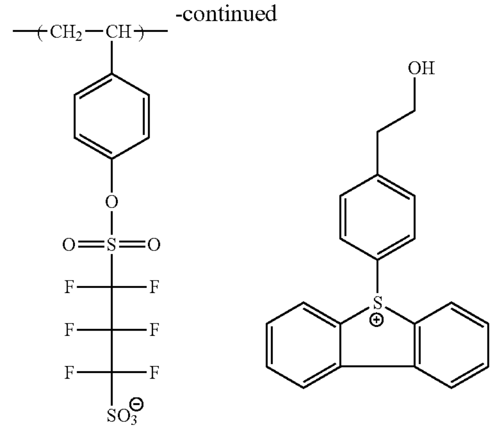
Ab-187
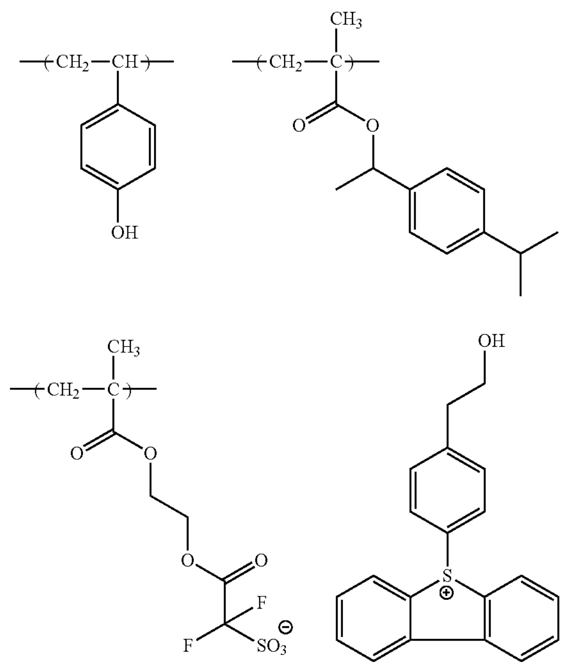
Ab-200
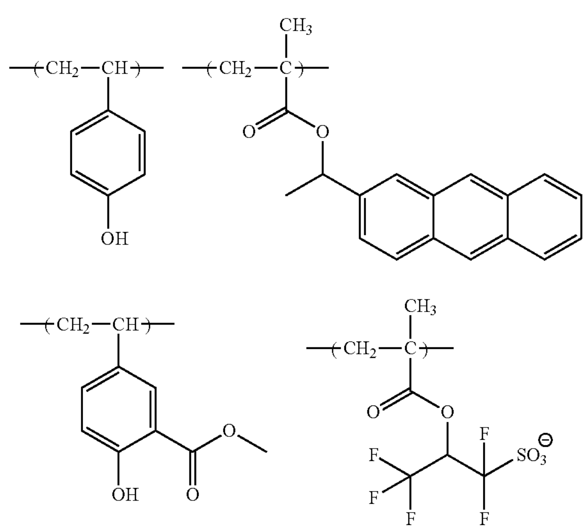

-continued
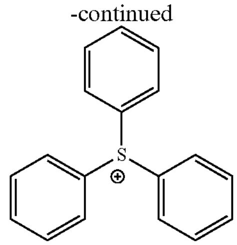
Ab-203
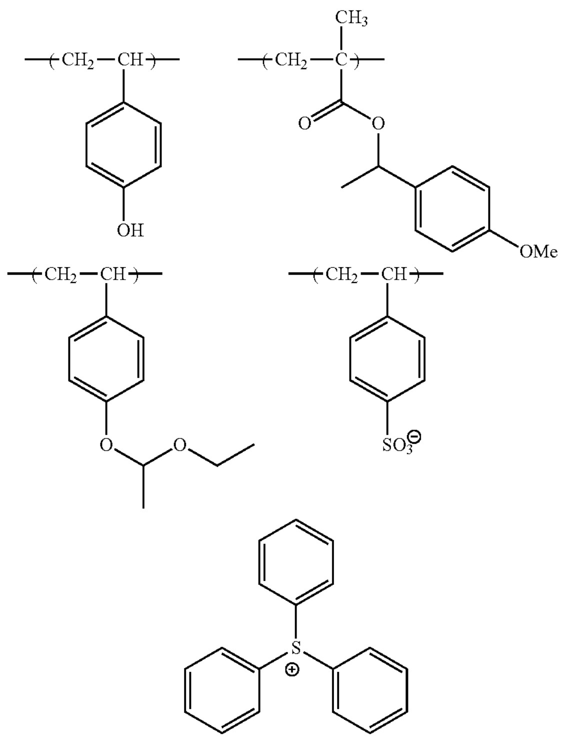
Ab-207
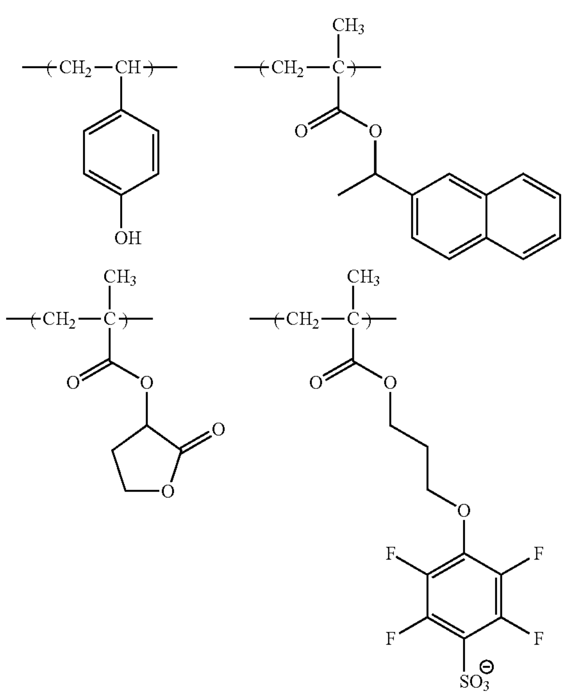
-continued
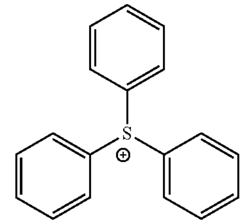
Ab-229
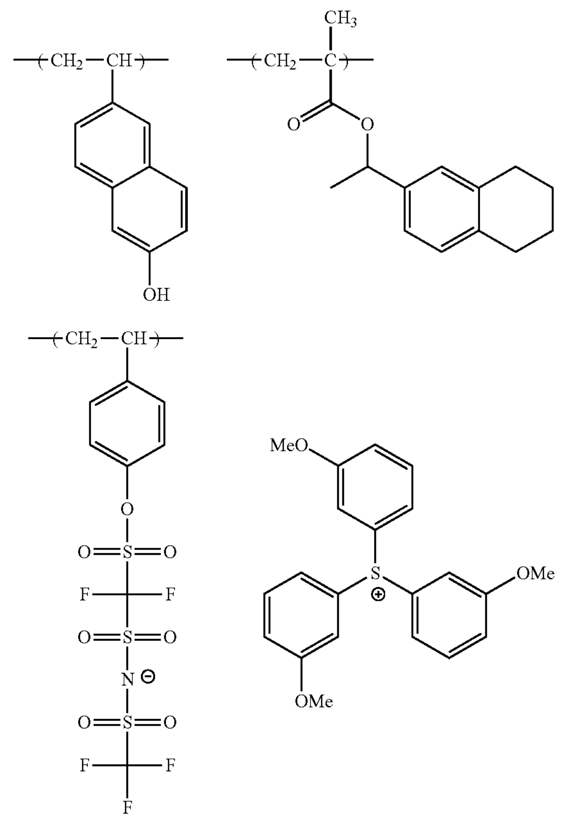
Ab-237
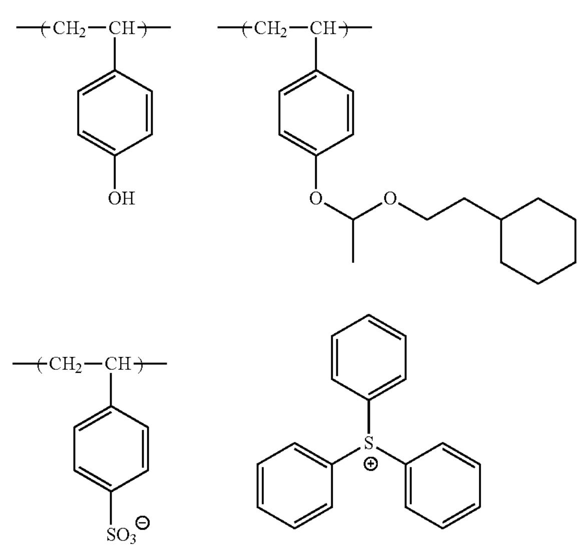

-continued
Ab-244
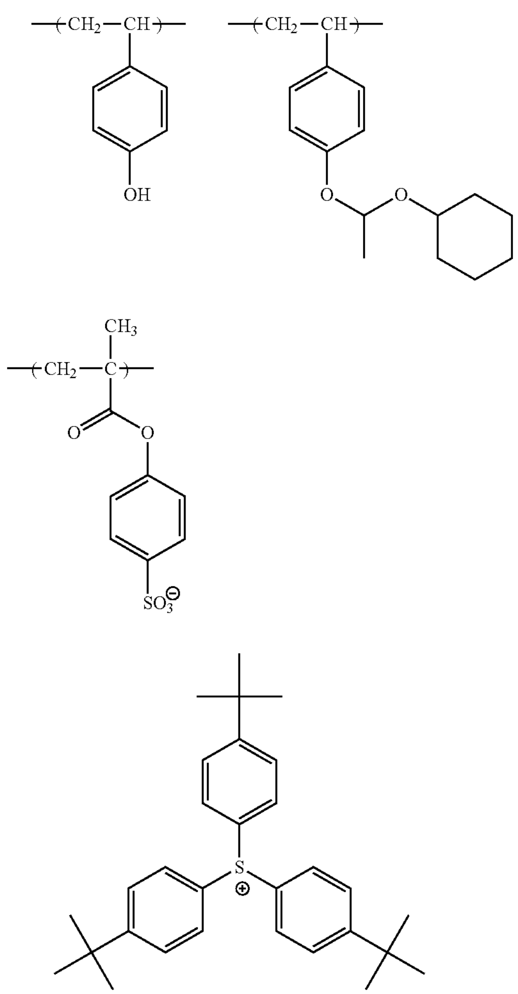
Ab-252
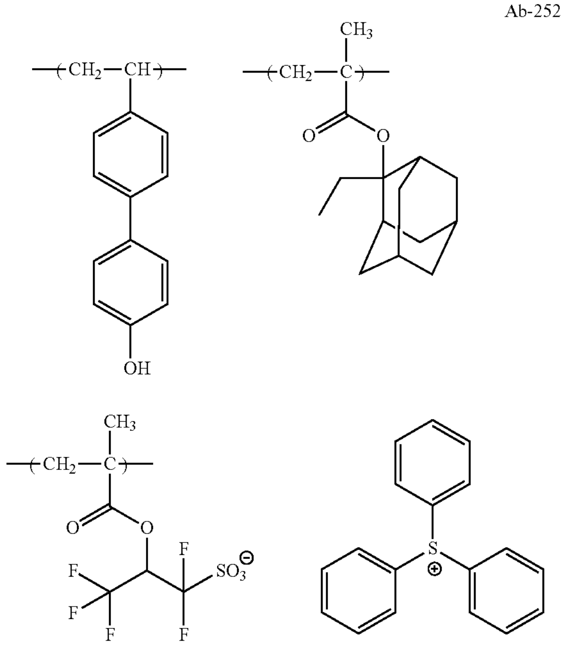
-continued
Ab-264
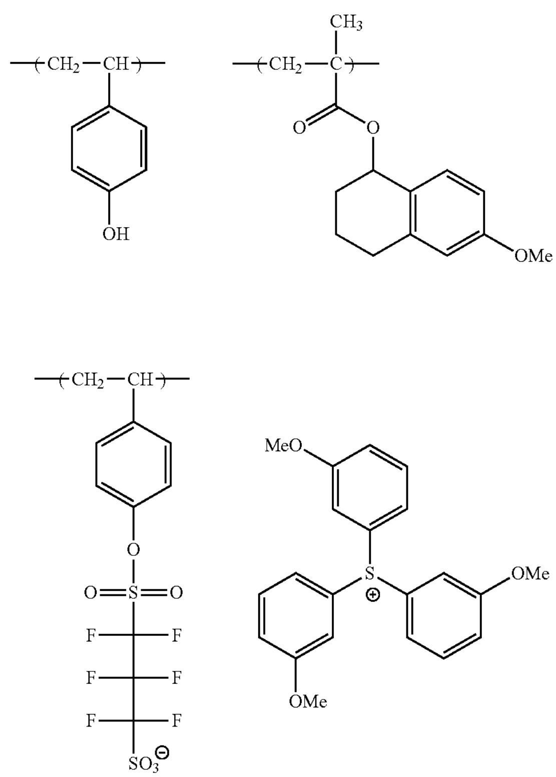
Ab-265
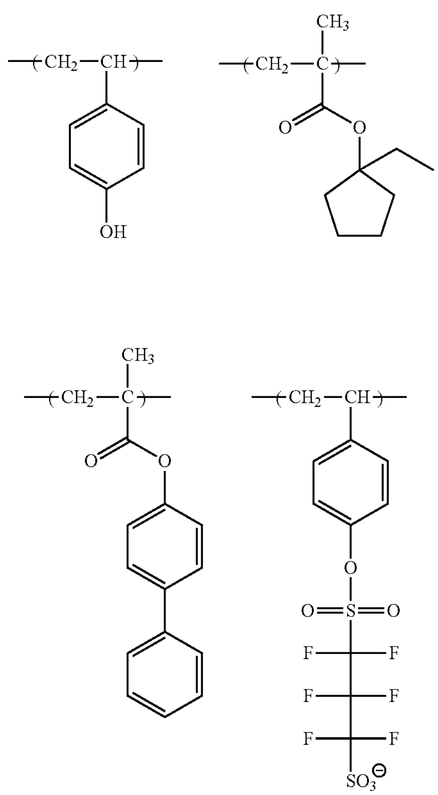

-continued

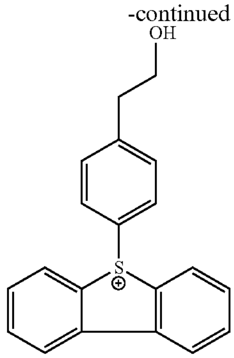

[3] Compound Capable of Generating an Acid Upon Irradiation with an Actinic Ray or Radiation The actinic ray-sensitive or radiation-sensitive composition of the present invention may contain a compound capable of generating an acid upon irradiation with an actinic ray or radiation (hereinafter also referred to as a "photo-acid generator"). In particular, in the case where the actinic ray-sensitive or radiation-sensitive composition does not contain a resin having the repeating unit represented by Formula (4) as the compound (P), generally the actinic ray-sensitive or radiation-sensitive composition further contains a photo-acid generator.

The photo-acid generator may be appropriately selected from a photo-initiator for cationic photopolymerization, a photo-initiator for radical photopolymerization, a photodecoloring agent for dyes, a photodiscoloring agent, a known compound capable of generating an acid upon irradiation with an actinic ray or radiation, which is used for microresist or the like, and a mixture thereof. Examples thereof may include an onium salt such as a sulfonium salt and an iodonium salt and a diazodisulfone compound such as bis(alkylsulfonyldiazomethane).

Preferred examples of the photo-acid generator may include compounds represented by the following Formulas (ZI), (ZII) and (ZIII).

(ZI)

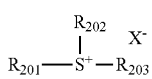

(ZII)

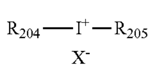

(ZIII)

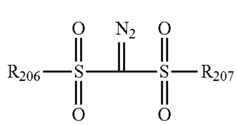

In Formula (ZI), each of $R_{201}$, $R_{202}$ and $R_{203}$ independently represents an organic group. The carbon number of the organic group as $R_{201}$, $R_{202}$ and $R_{203}$ is, for example, 1 to 30, and preferably 1 to 20.

Two of $R_{201}$ to $R_{203}$ may be bound via a single bond or a linking group with each other to form a ring structure. Examples of the linking group in this case may include an ether bond, a thioether bond, an ester bond, an amide bond, a carbonyl group, a methylene group and an ethylene group. Examples of the group which two of $R_{201}$ to $R_{203}$ are bound to form may include an alkylene group such as a butylene group and a pentylene group.

$X^-$ represents a non-nucleophilic anion. Examples of $X^-$ may include a sulfonate anion, bis(alkylsulfonyl)amide anion, tris(alkylsulfonyl)methide anion, $BF_4^-$, $PF_6^-$ and $SbF_6^-$. $X^-$ is preferably an organic anion containing a carbon atom. Examples of preferred organic anions may include organic anions represented by the following AN1 to AN3.

AN1

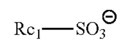

AN2

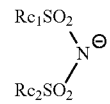

AN3

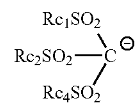

In Formulas AN1 to AN3, each of $Rc_1$ to $Rc_3$ independently represents an organic group. This organic group is, for example, an organic group having 1 to 30 carbon atoms, and preferably an alkyl group, an aryl group or a group in which a plurality of these groups are linked via a linking group. Meanwhile, examples of the linking group may include a single bond, —O—, —$CO_2$—, —S—, —$SO_3$— and —$SO_2N(Rd_1)$—. Herein, $Rd_1$ represents a hydrogen atom or an alkyl group, and may form a ring with the alkyl group or the aryl group which is bound.

The organic group of $Rc_1$ to $Rc_3$ may be an alkyl group substituted with a fluorine atom or a fluoroalkyl group at the 1-position or a phenyl group substituted with a fluorine atom or a fluoroalkyl group. By containing a fluorine atom or a fluoroalkyl group, it is possible to increase the acidity of the acid generated upon irradiation with light. As a result, the sensitivity of the actinic ray-sensitive or radiation-sensitive resin composition may be enhanced. Meanwhile, $Rc_1$ to $Rc_3$ may be bound with other alkyl groups and aryl groups to form a ring structure.

Further, a sulfonate anion represented by Formula (SA1) or Formula (SA2) may be exemplified as preferred X.

(SA1)

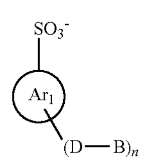

In Formula (SA1), $Ar_1$ represents an aromatic ring, and may further have a substituent other than a sulfonate group and -(D-B) group.

n represents an integer of 1 or more. n is preferably 1 to 4, more preferably 2 to 3, and most preferably 3.

D represents a single bond or a divalent linking group. The divalent linking group is preferably an ether bond, a thioether bond, carbonyl group, a sulfoxide group, a sulfone group, a sulfonate ester bond or an ester bond.

B represents a hydrocarbon group.

(SA2)

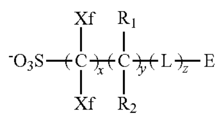

In Formula (SA2), each Xf independently represents a fluorine atom or an alkyl group in which at least one hydrogen atom is substituted by a fluorine atom.

Each of $R_1$ and $R_2$ independently represents a hydrogen atom, a fluorine atom or alkyl group, and when a plurality of $R^1$ and $R^2$ are present, each of $R^1$ and $R^2$ may be the same as or different from every other $R^1$ and $R^2$.

L represents a divalent linking group, and when a plurality of L are present, each L may be the same as or different from every other L.

E represents a cyclic organic group.

x represents an integer of 1 to 20, y represents an integer of 0 to 10, and z represents an integer of 0 to 10.

Examples of the sulfonate anion represented by Formula (SA1) or Formula (SA2) may include the followings.

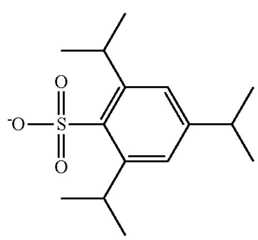

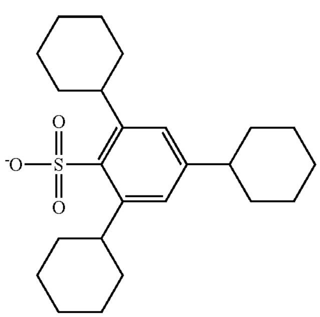

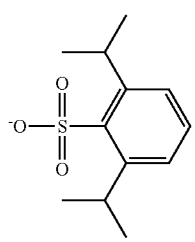

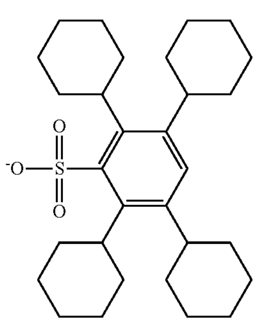

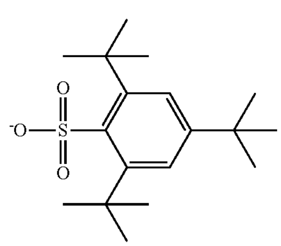

-continued

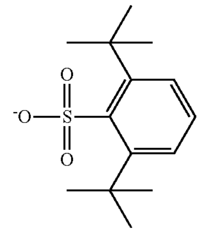

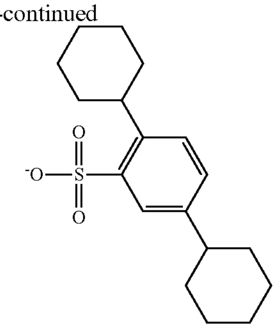

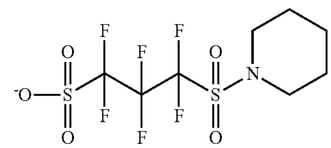

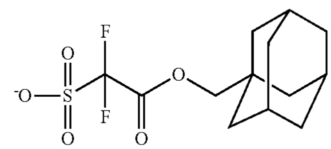

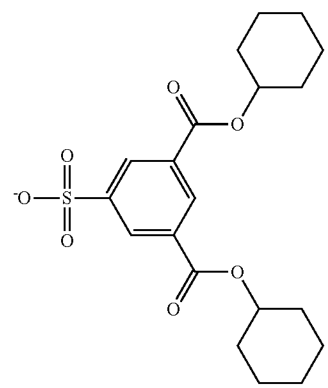

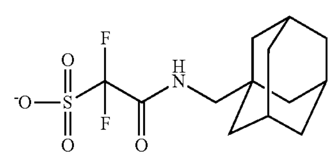

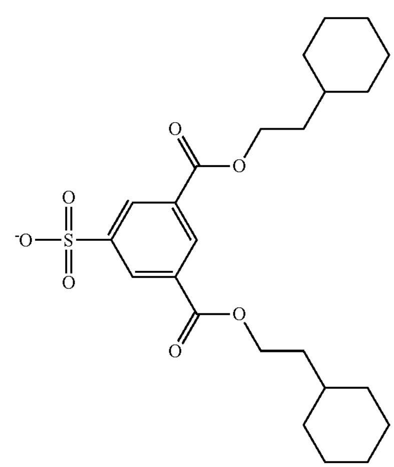

-continued

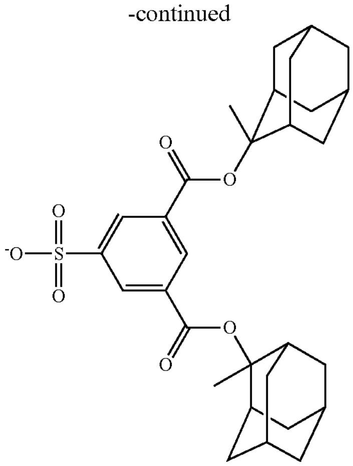
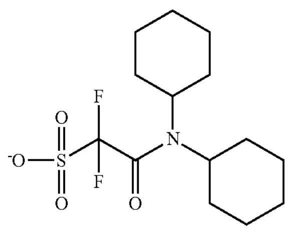
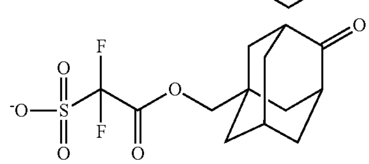
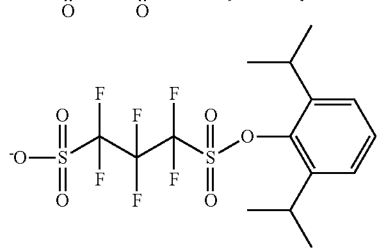
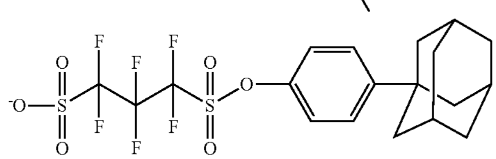
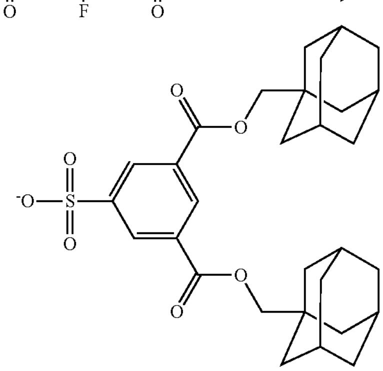
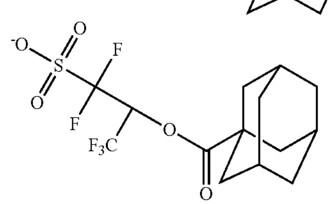

-continued

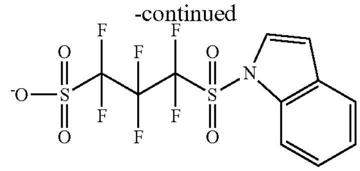
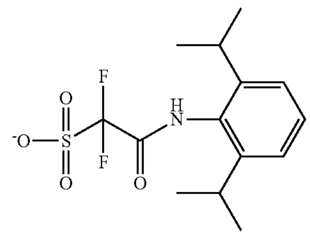
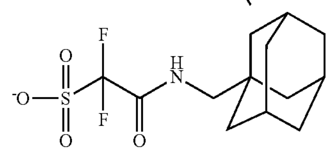
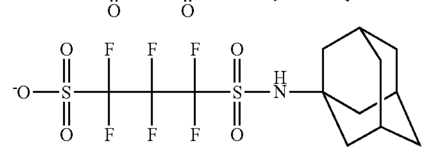
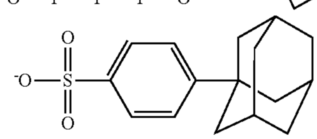
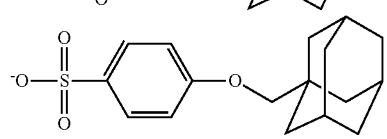
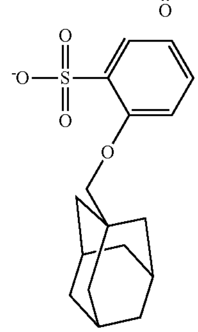
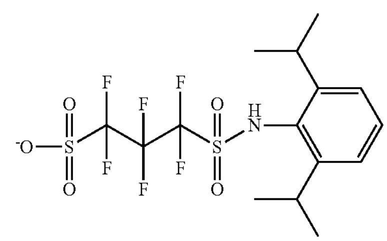

As a photo-acid generator, a compound having a plurality of structures represented by Formula (ZI) may be used. For example, a compound in which at least one of $R_{201}$ to $R_{203}$ of a compound represented by Formula (ZI) is bound with at least one of $R_{201}$ to $R_{203}$ of another compound represented by Formula (ZI) may be used.

Hereinafter, Formula (ZII) and Formula (ZIII) will be described.

In Formula (ZII) and Formula (ZIII), each of $R_{204}$ to $R_{207}$ independently represents an aryl group, an alkyl group or a cycloalkyl group. The aryl group, the alkyl group and the cycloalkyl group may have a substituent.

Meanwhile, $X^-$ in Formula (ZII) has the same meaning as $X^-$ in Formula (ZI).

Other preferred examples of the photo-acid generator may include a compound represented by the following Formula (ZIV), (ZV) or (ZVI).

ZIV $$Ar_3—SO_2—SO_2—Ar_4$$

ZV

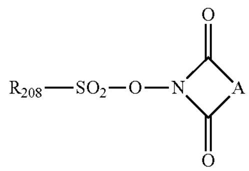

ZVI

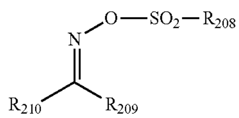

In Formula (ZIV) to Formula (ZVI),

Each of $Ar_3$ and $Ar_4$ independently represents a substituted or unsubstituted aryl group.

A represents an alkylene group, an alkenylene group or an arylene group.

Each $R_{208}$ in Formula (ZV) and Formula (ZVI) independently represents an alkyl group, a cycloalkyl group or an aryl group. The alkyl group, the cycloalkyl group and the aryl group may be either substituted or unsubstituted.

These groups are preferably substituted with a fluorine atom. By doing this, it is possible to enhance the strength of the acid generated by the photo-acid generator.

Each of $R_{209}$ and $R_{210}$ independently represents an alkyl group, a cycloalkyl group, an aryl group or an electron-withdrawing group. The alkyl group, the cycloalkyl group, the aryl group and the electron-withdrawing group may be either substituted or unsubstituted.

Preferred $R_{209}$ may be exemplified by a substituted or unsubstituted aryl group.

Preferred $R_{210}$ may be exemplified by an electron-withdrawing group. The electron-withdrawing group may be preferably exemplified by a cyano group and a fluoroalkyl group.

Examples of the alkylene group of A may include alkylene having 1 to 12 carbon atoms (for example, a methylene group, an ethylene group, a propylene group, an isopropylene group, a butylene group, an isobutylene group and the like), examples of the alkenylene group of A may include an alkenylene group having 2 to 12 carbon atoms (for example, an ethenylene group, a prophenylene group, a butenylene group and the like), and examples of the arylene group of A may include an arylene group having 6 to 10 carbon atoms (for example, a phenylene group, a tolylene group, a naphthylene group and the like). The alkylene group, the alkenylene group and the arylene group may have a substituent.

Meanwhile, a compound having a plurality of structures represented by Formula (ZVI) as a photo-acid generator is also preferred. Examples of such a compound may include a compound in which at least one of $R_{209}$ to $R_{210}$ of a compound represented by Formula (ZVI) is bound with at least one of $R_{209}$ to $R_{210}$ of another compound represented by Formula (ZVI) may be used.

The photo-acid generator is more preferably a compound represented by Formula (ZI) to Formula (ZIII), and still more preferably a compound represented by Formula (ZI).

As a photo-acid generator used in the present invention, a compound capable of decomposing by the action of an acid to increase the solubility in an alkali developer may be also preferably used. Examples of such a photo-acid generator may include compounds described in, for example, Japanese Patent Application Laid-Open No. 2005-97254, Japanese Patent Application Laid-Open No. 2007-199692 and the like.

Specific examples of the photo-acid generator are shown below, but not limited thereto.

B-1

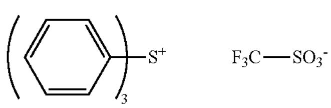

B-2

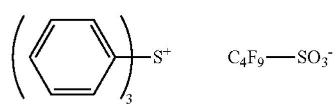

B-3

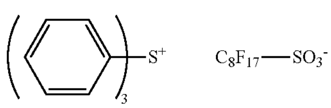

B-4

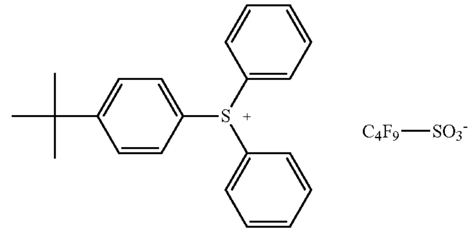

B-5

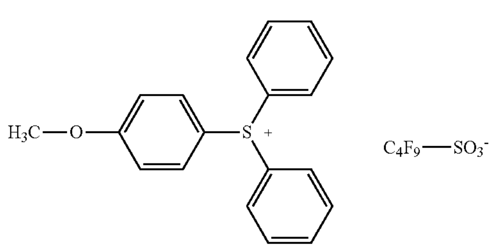

B-6

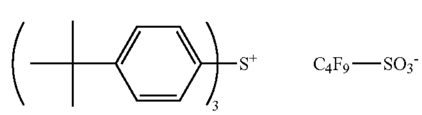

-continued
B-7
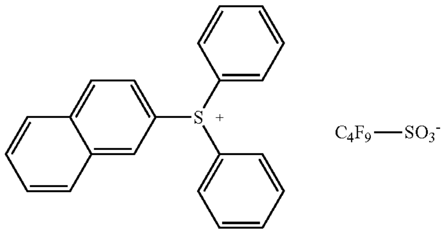
B-8
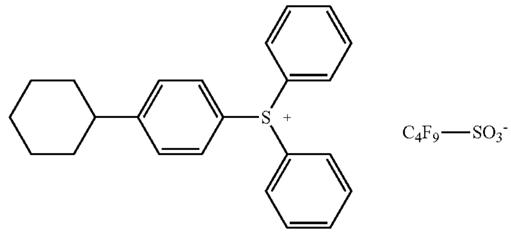
B-9
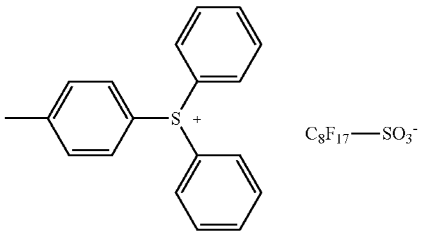
B-10
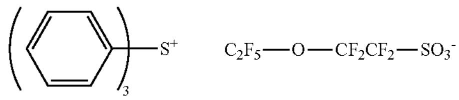
B-11
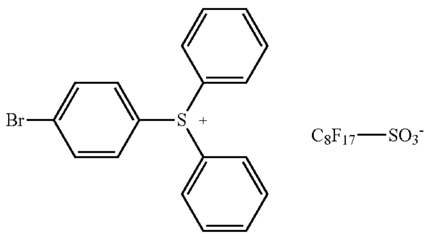
B-12
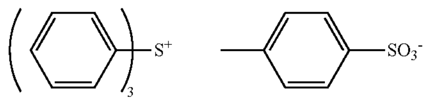
B-13
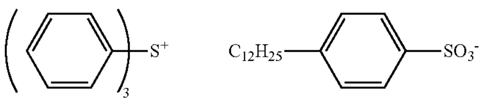
B-14
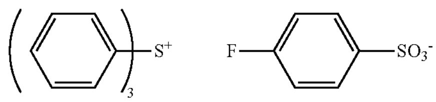
B-15
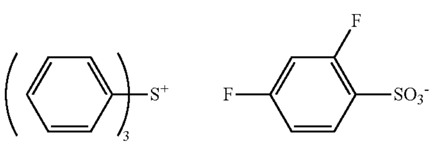
B-16
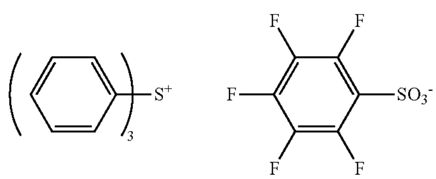
B-17
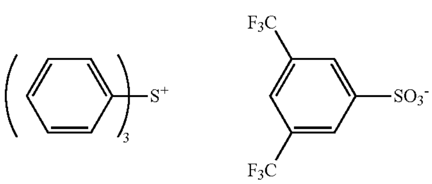
B-18
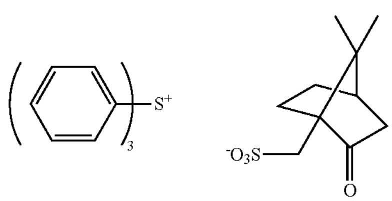
B-19
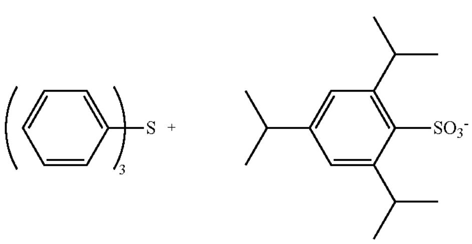
B-20
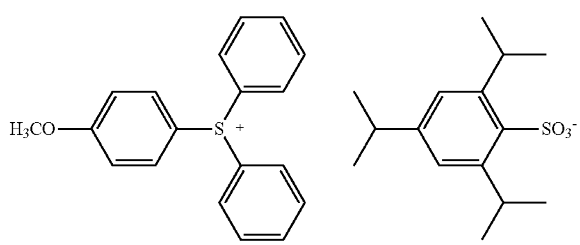
B-21
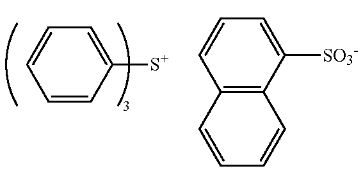

-continued
B-22
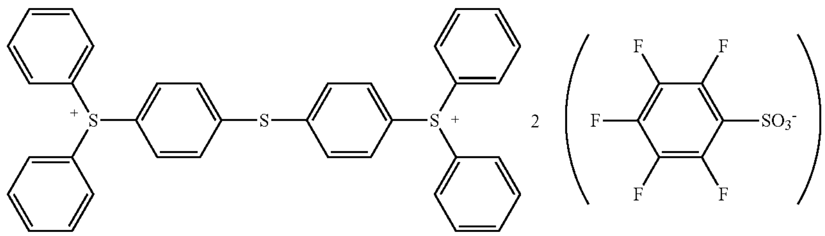
B-23
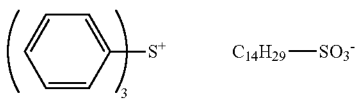
B-24
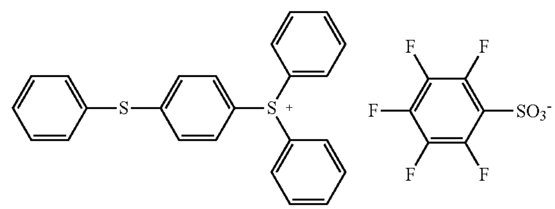
B-25
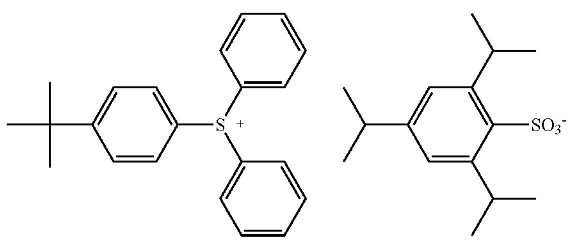
B-26
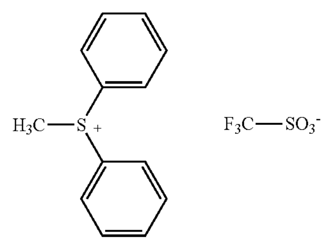
B-27
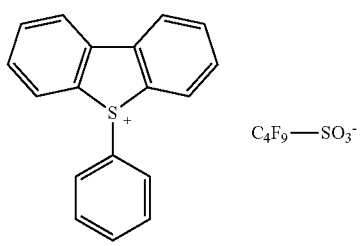
B-28
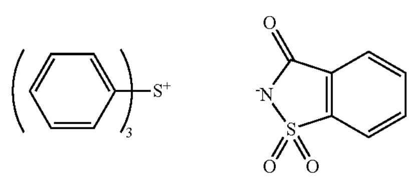
B-29
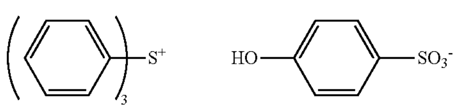
B-30
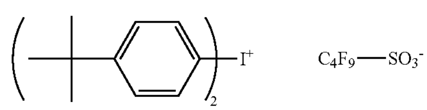
B-31
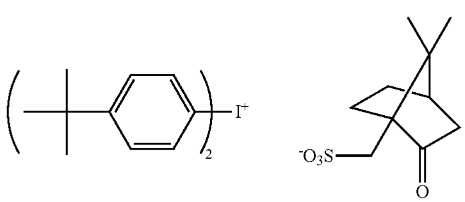
B-32
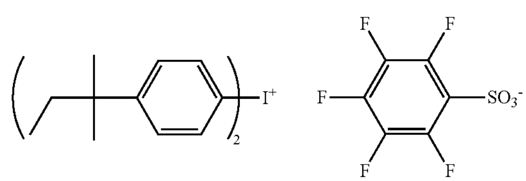
B-33
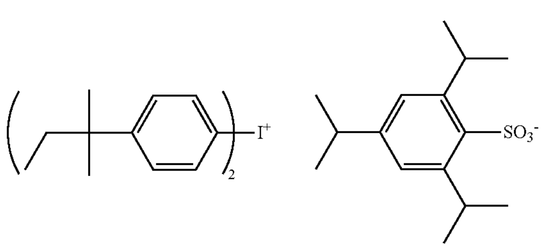
B-34
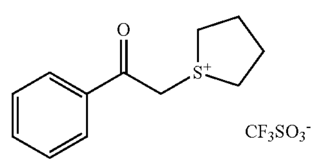

-continued
B-35
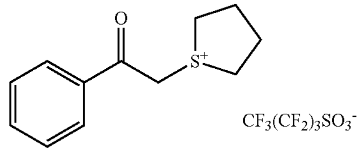
B-36
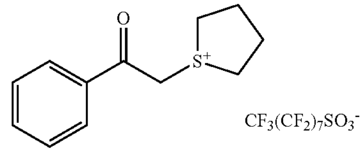
B-37
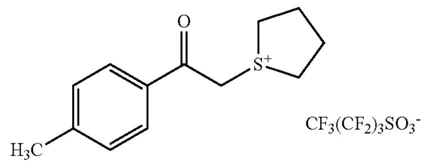
B-38
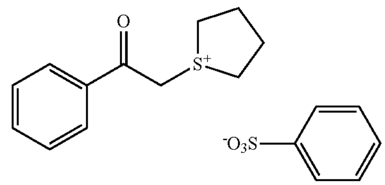
B-39
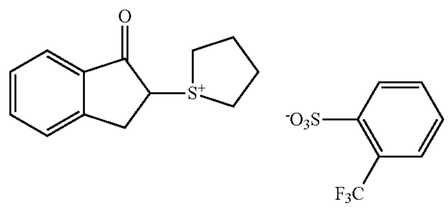
B-40
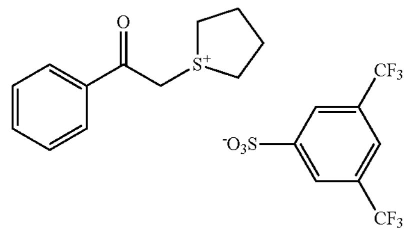
B-41
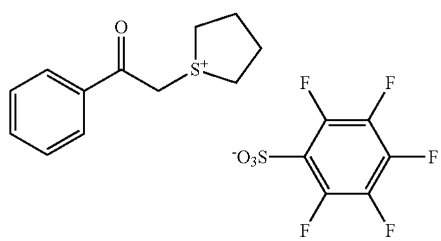
B-42
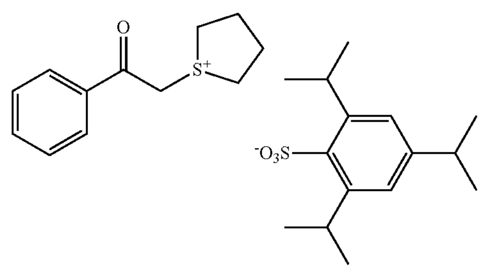
B-43
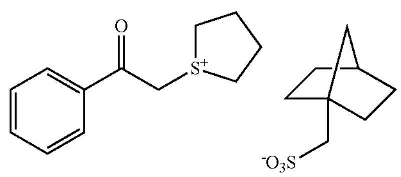
B-44
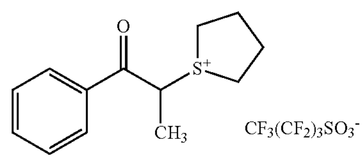
B-45
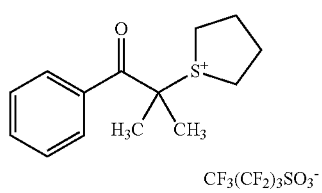
B-46
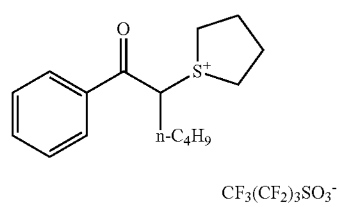
B-47
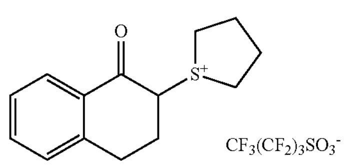
B-48
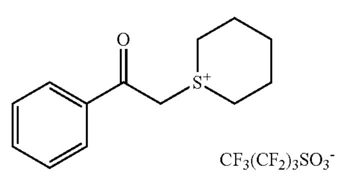
B-49
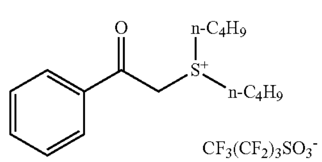
B-50
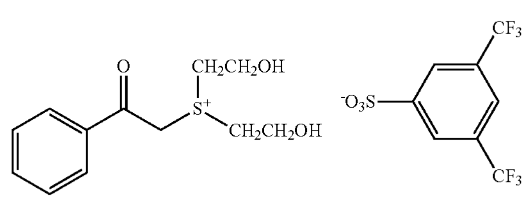

-continued
B-51
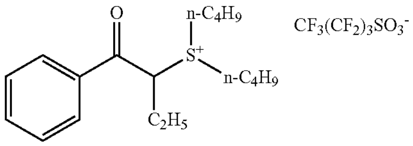
B-52
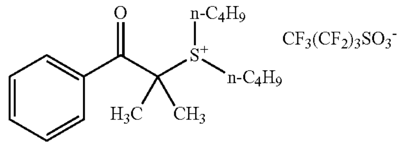
B-53
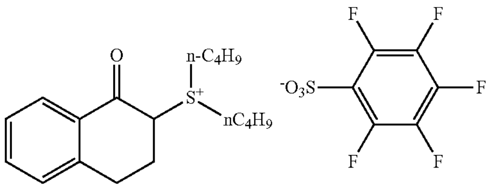
B-54
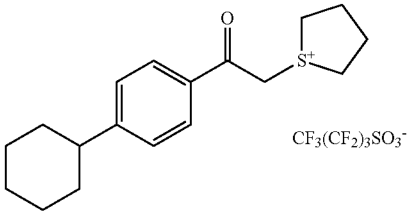
B-55
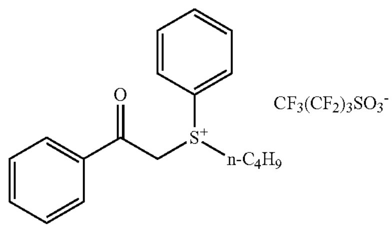
B-56
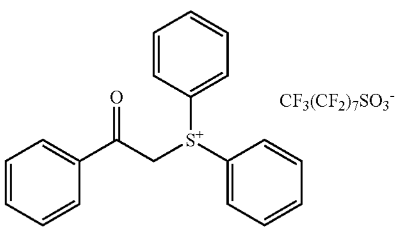
B-57
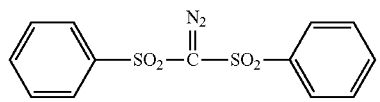
B-58
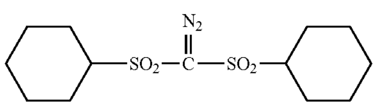
B-59
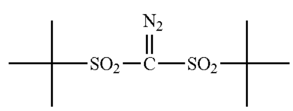
B-60
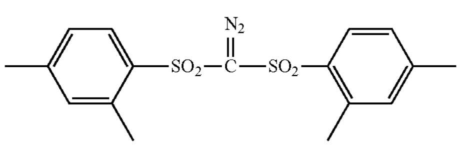
B-61
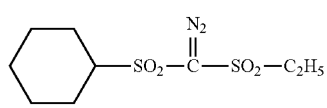
B-62
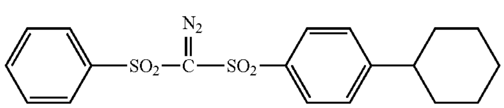
B-63
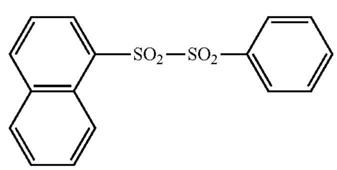
B-64
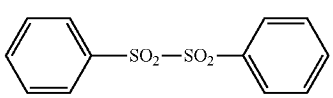
B-65
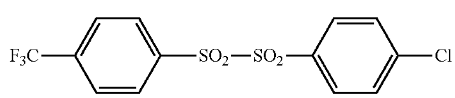
B-66
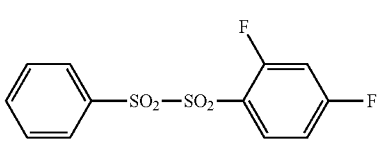
B-67
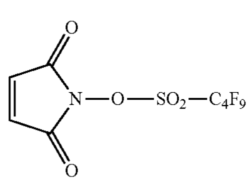

-continued
B-68
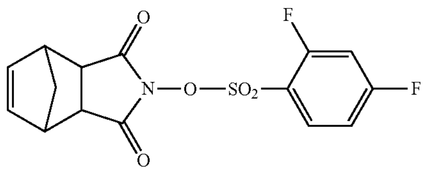
B-69
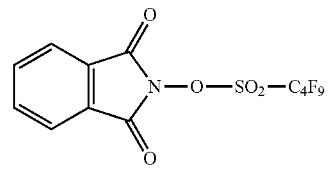
B-70
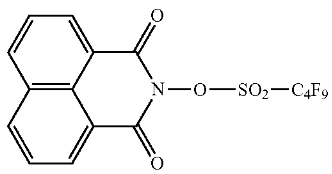
B-71
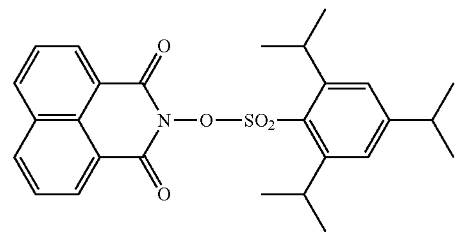
B-72
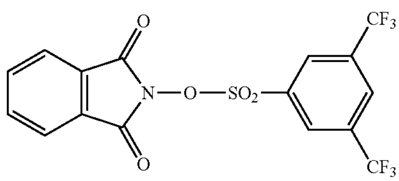
B-73
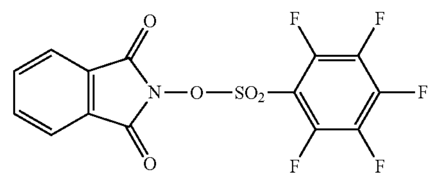
B-74
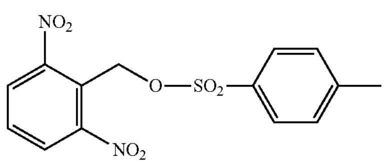
B-75
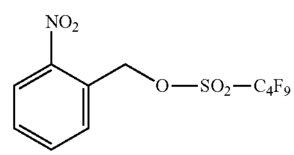
B-76
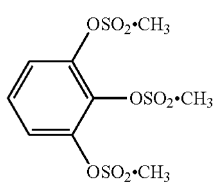
B-77
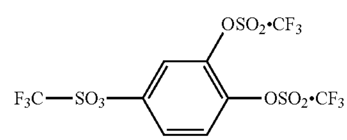
B-78
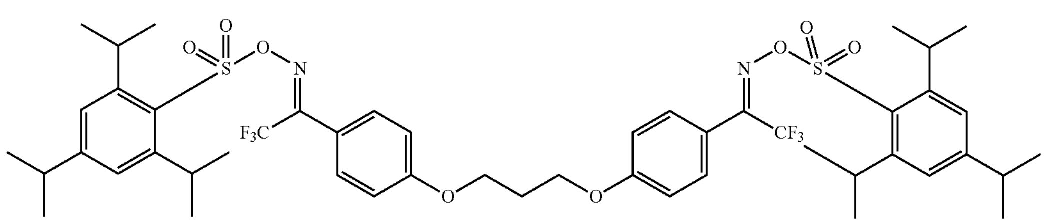
B-79
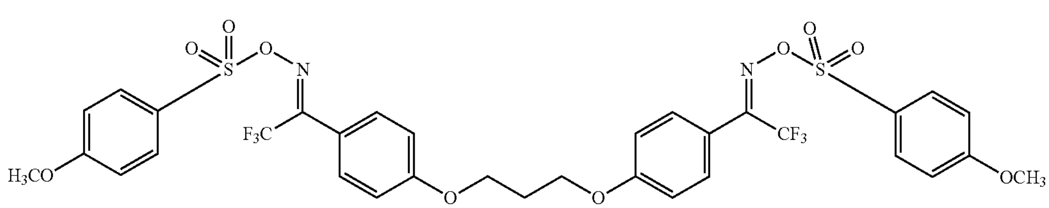
B-80
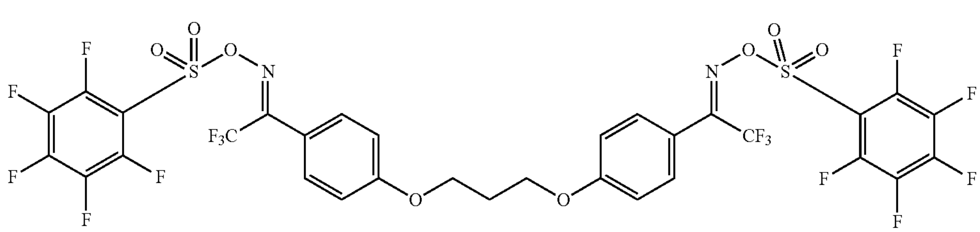

-continued
B-81
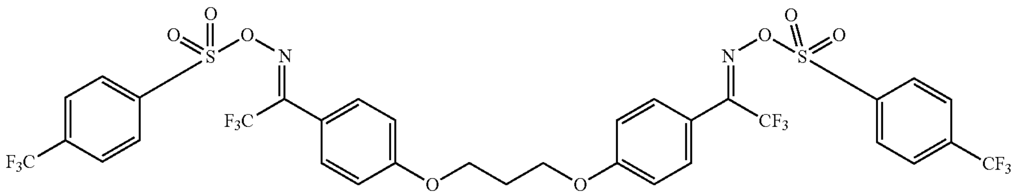
B-82
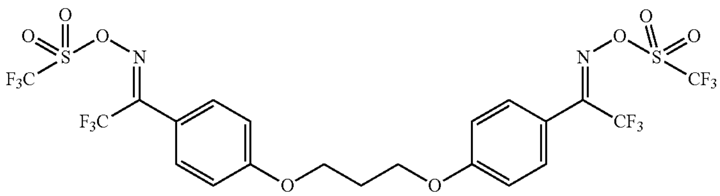
B-83
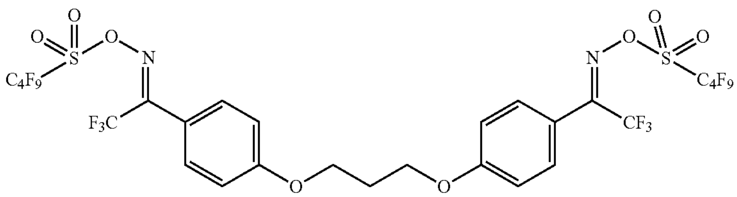
B-84
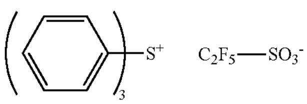
B-85
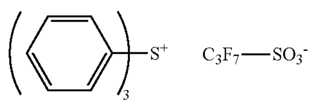
B-86
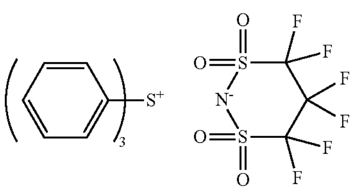
B-87
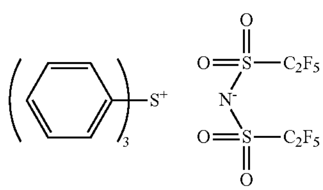
B-88
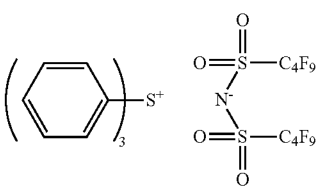
B-89
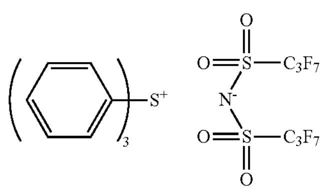
B-90
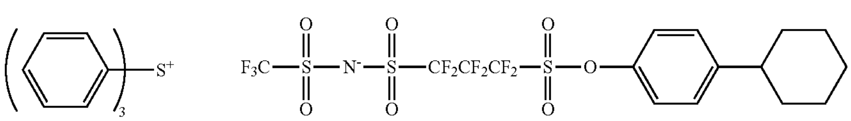
B-91
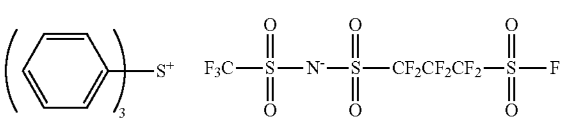
B-92
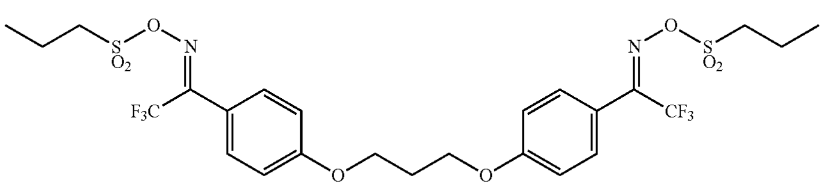

-continued
B-93
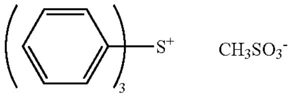
B-94
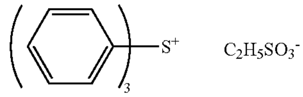
B-95
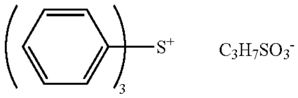
B-96
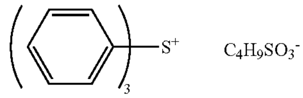
B-97
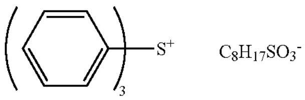
B-98
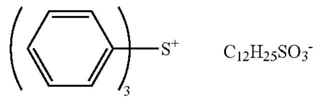
B-99
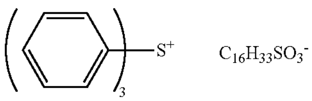
B-100
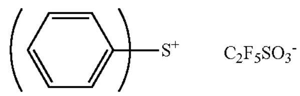
B-101
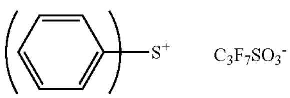
B-102
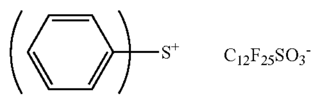
B-103
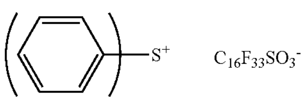
B-104
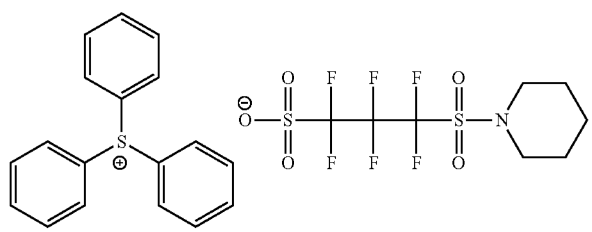
B-105
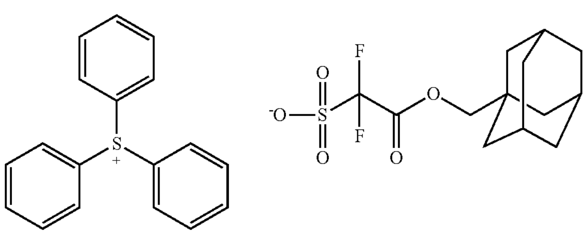
B-106
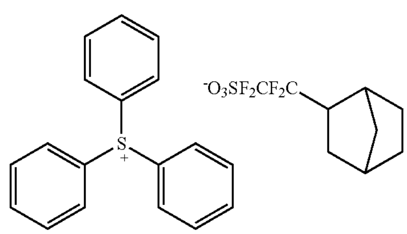
B-107
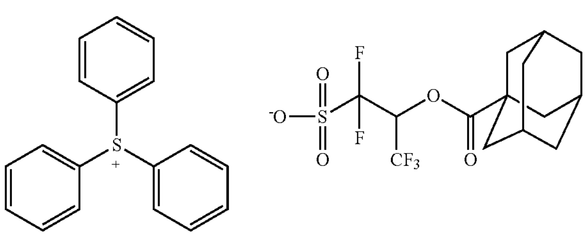
B-108
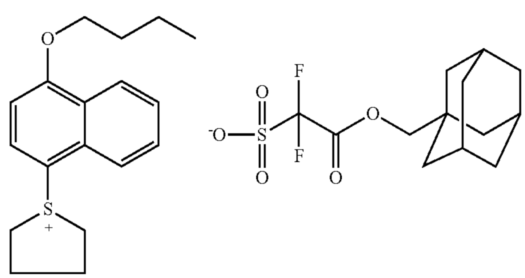

-continued
B-109
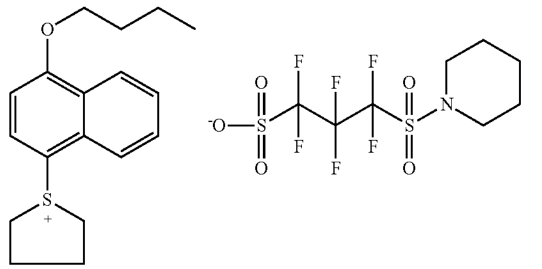
B-110
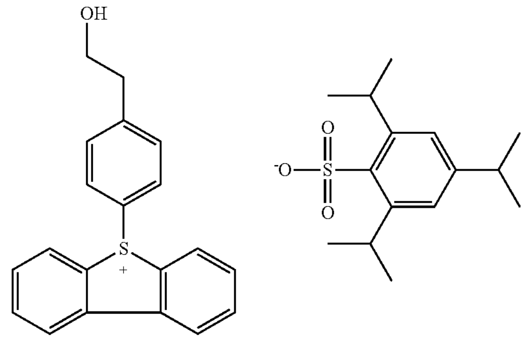
B-111
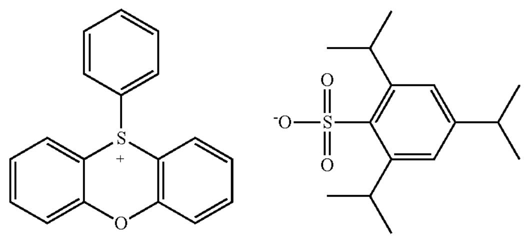
B-112
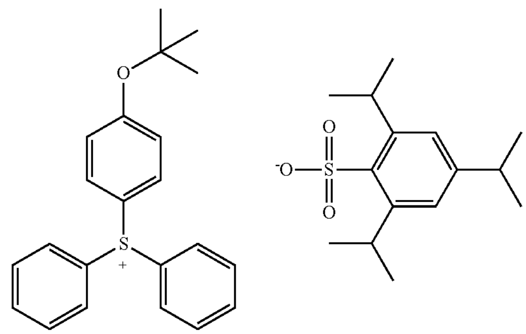
B-113
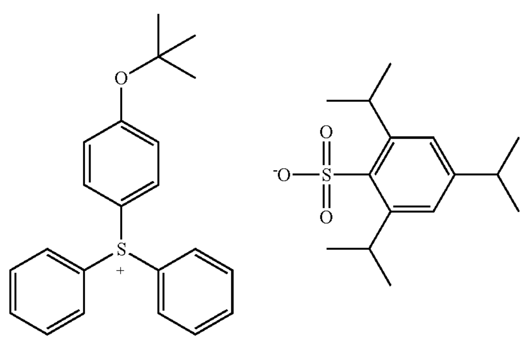
B-114
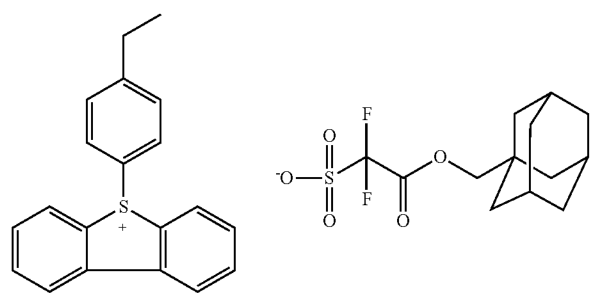
B-115
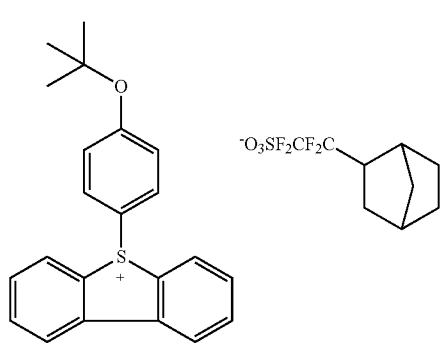
B-116
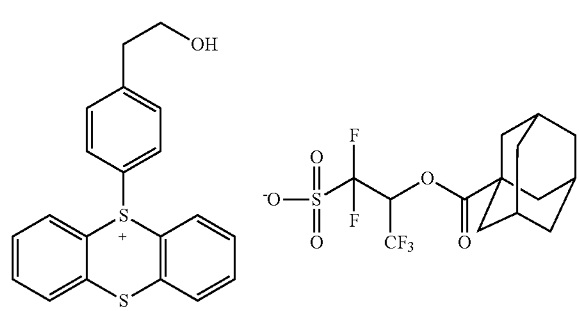

-continued
B-117
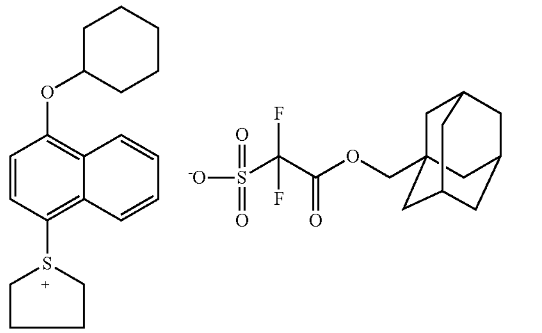
B-118
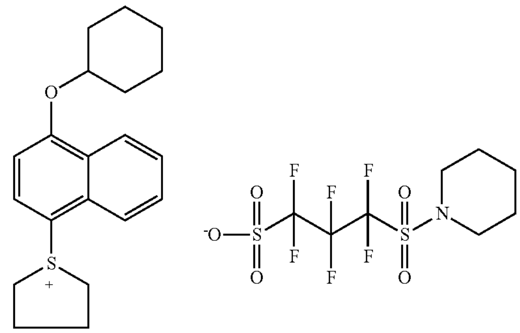
B-119
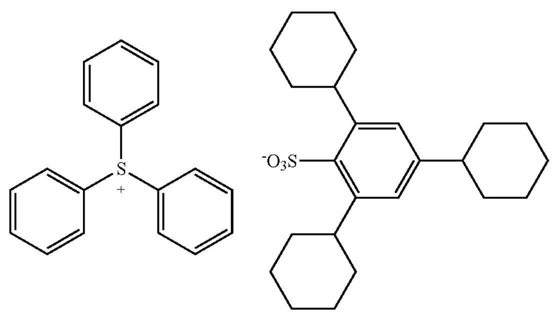
B-120
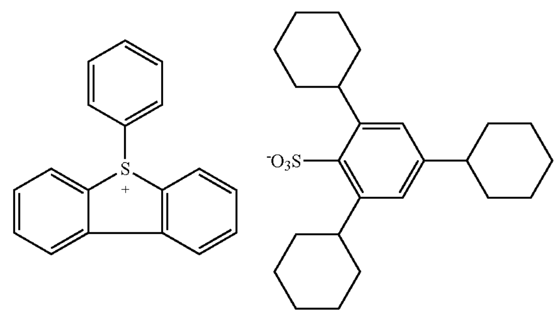
B-121
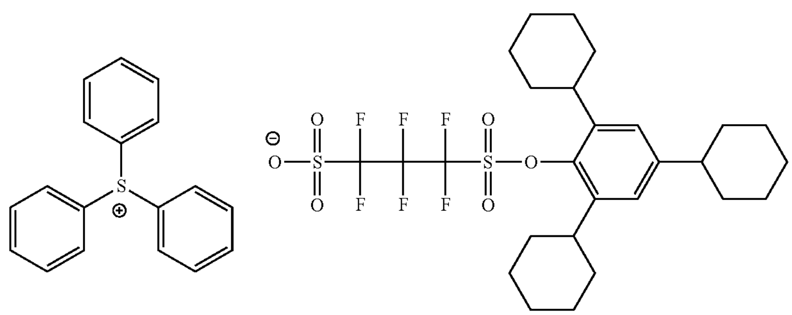
B-122
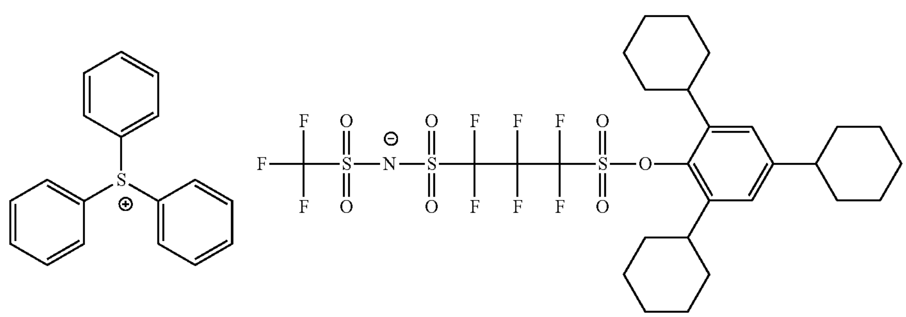
B-123
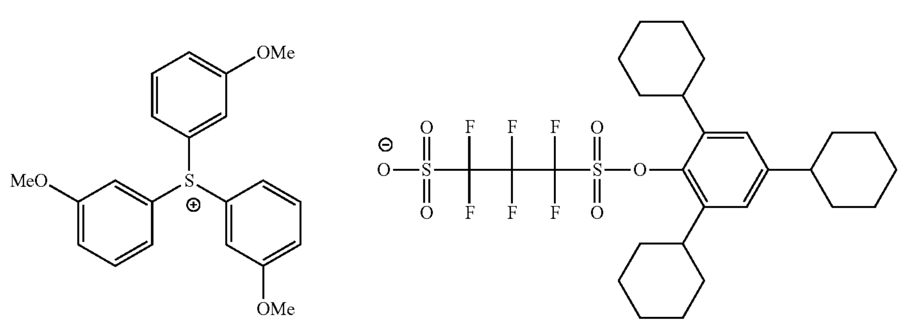

-continued
B-124
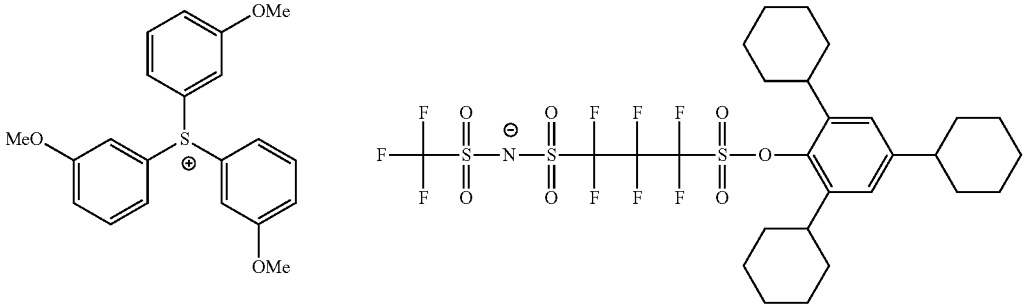
B-125
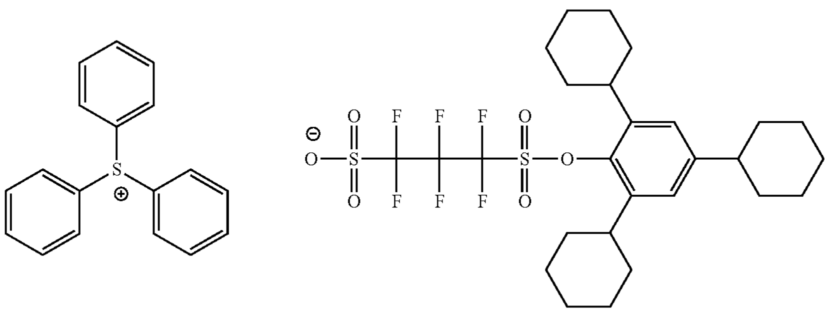
B-126
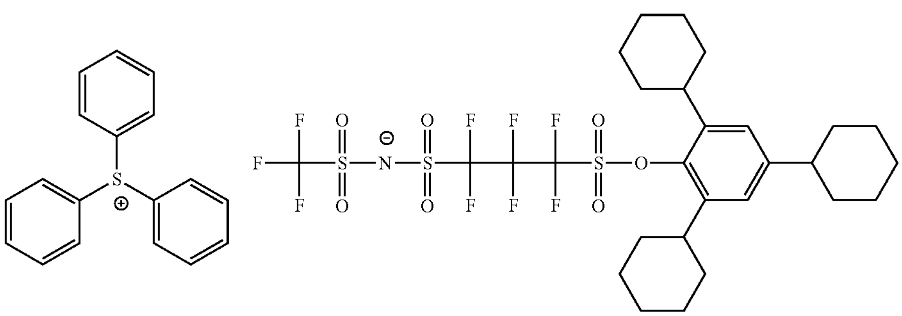
B-127
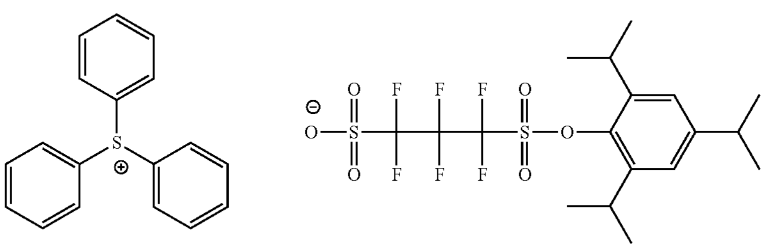
B-128
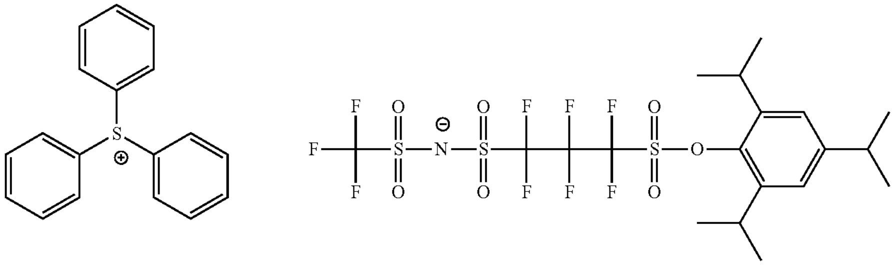

-continued
B-129
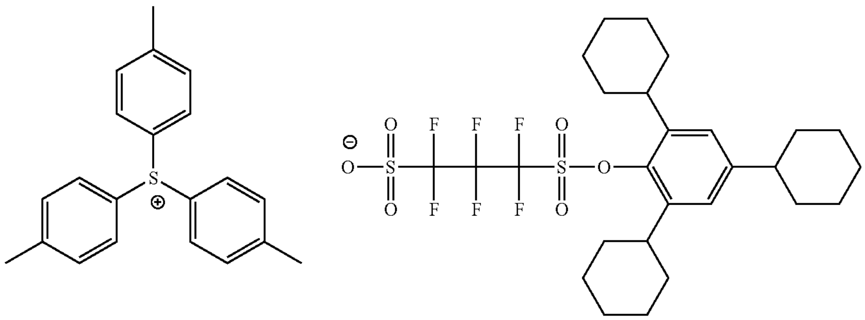
B-130
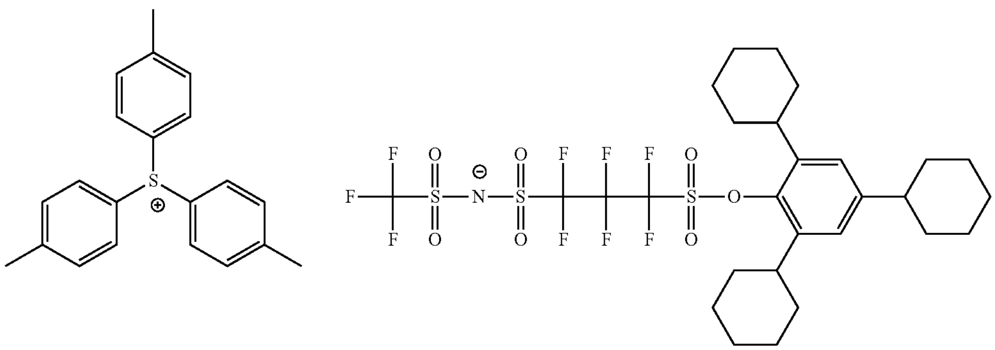
B-131
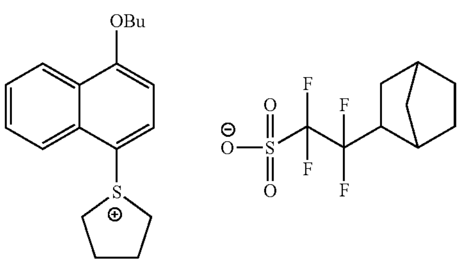
B-132
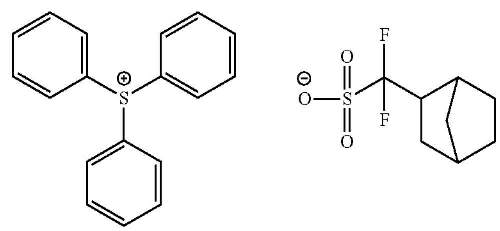
B-133
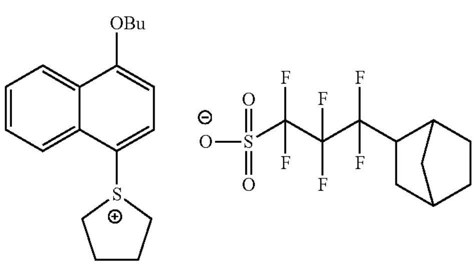
B-134
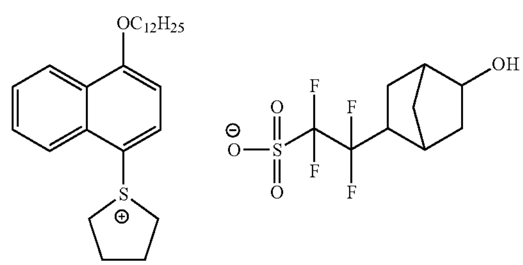
B-135
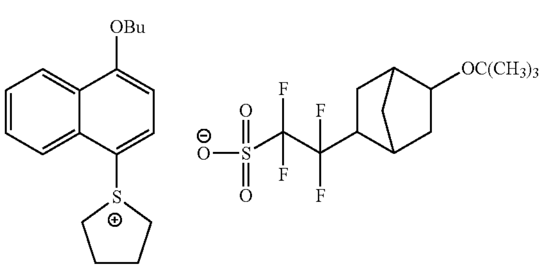
B-136
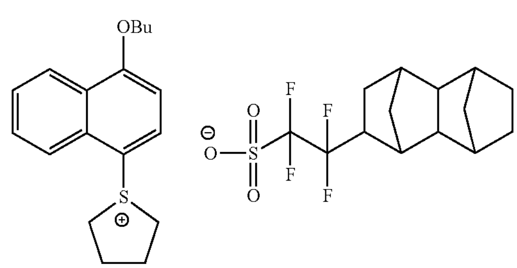

-continued
B-137
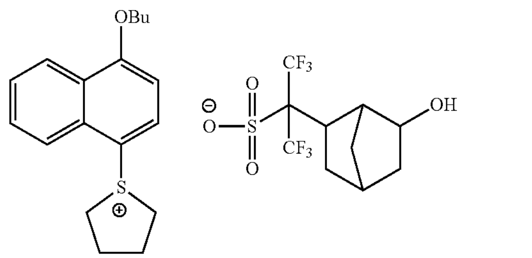
B-138
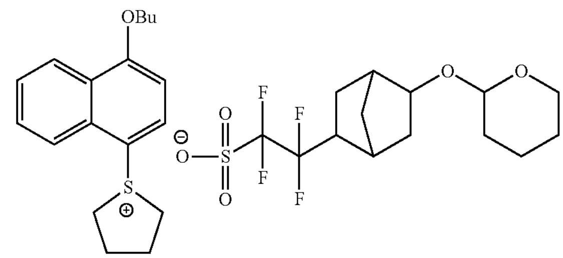
B-139
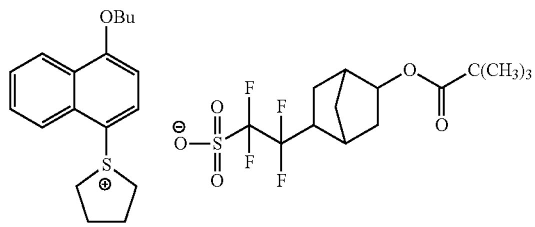
B-140
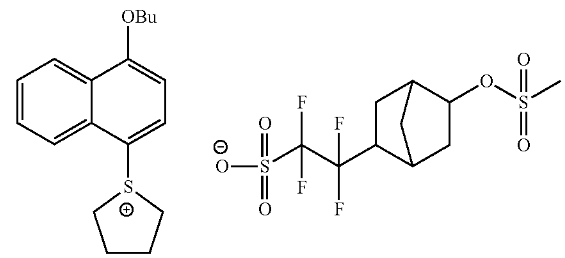
B-141
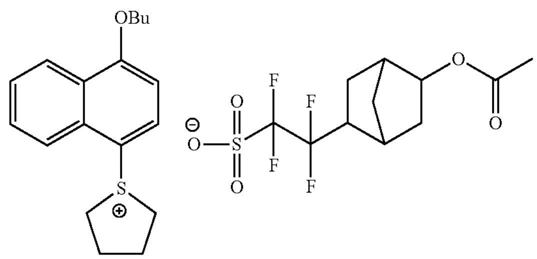
B-142
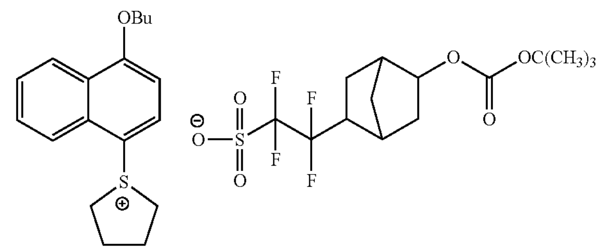
B-143
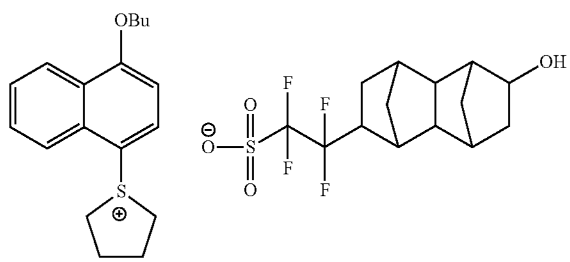
B-144
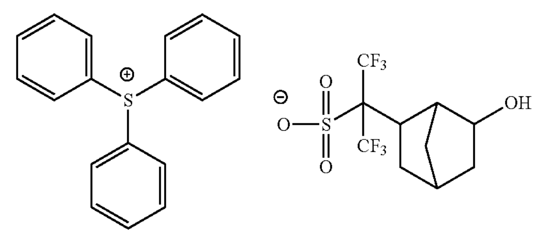
B-145
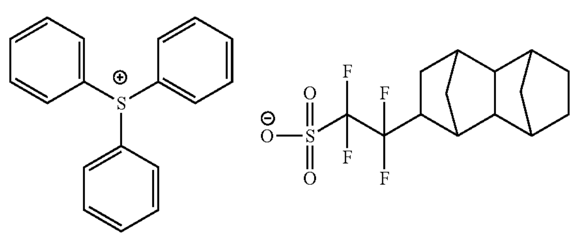
B-146
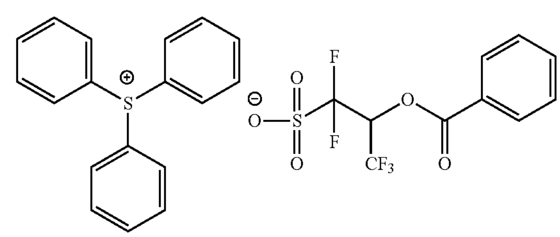
B-147
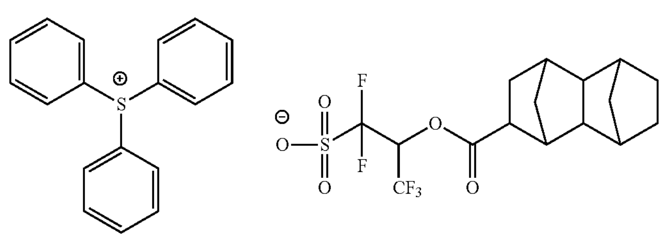

-continued
B-148
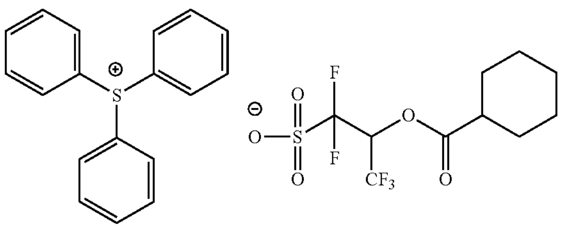
B-149
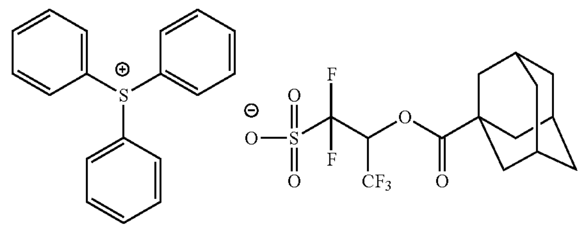
B-150
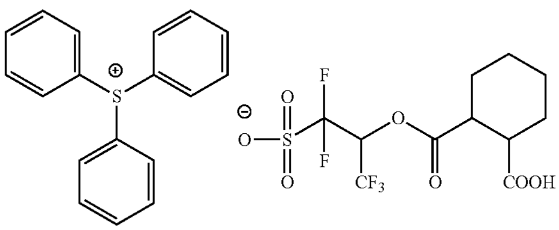
B-151
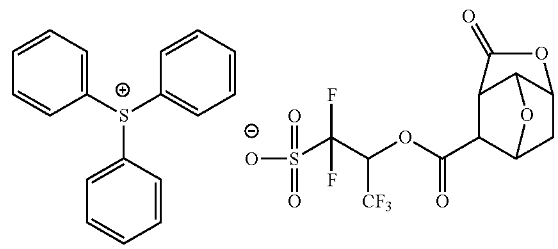
B-152
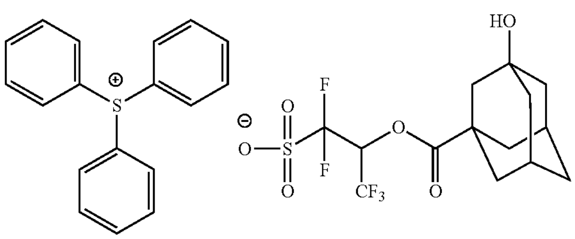
B-153
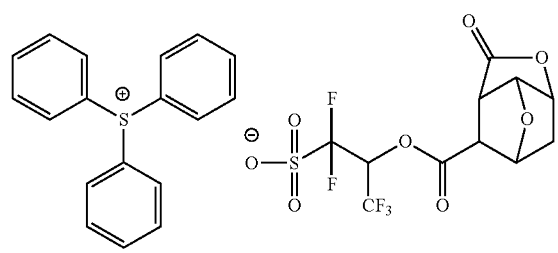
B-154
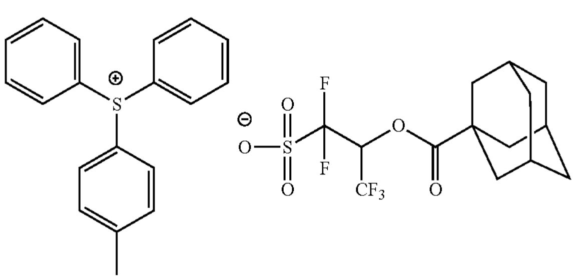
B-155
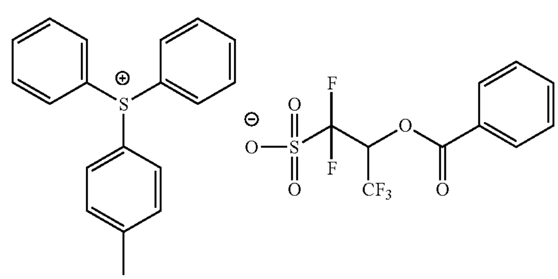
B-156
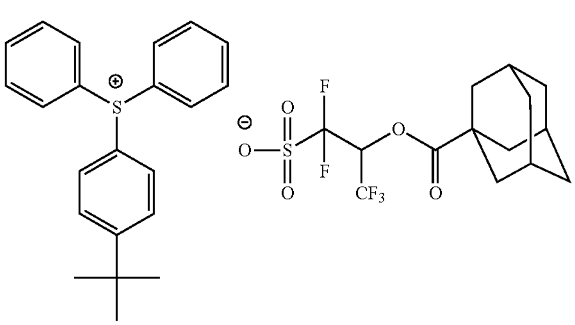
B-157
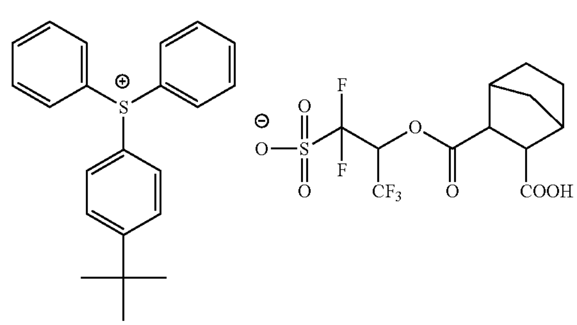

-continued
B-158
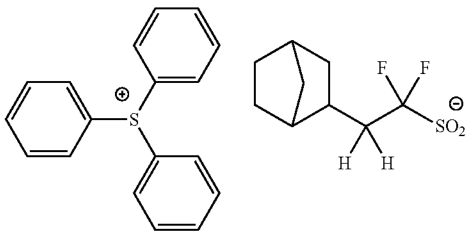
B-159
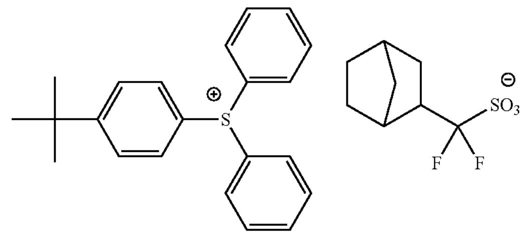
B-160
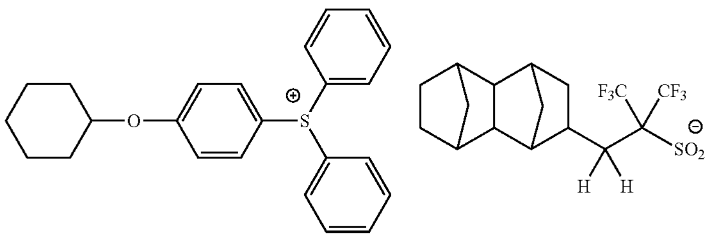
B-161
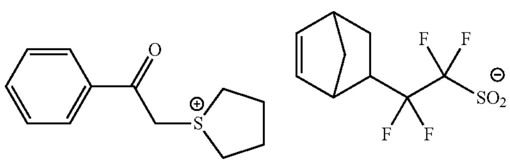
B-162
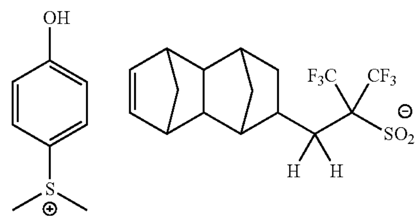
B-163
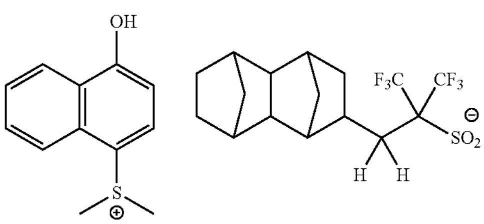
B-164
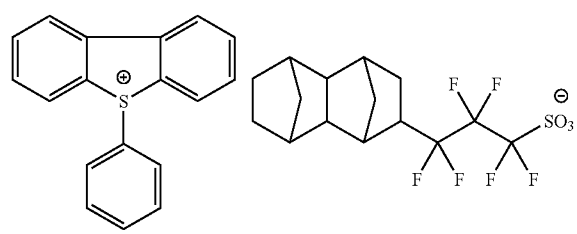
B-165
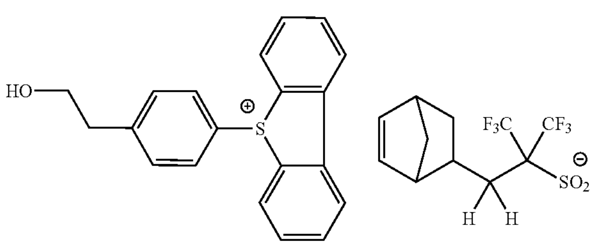
B-166
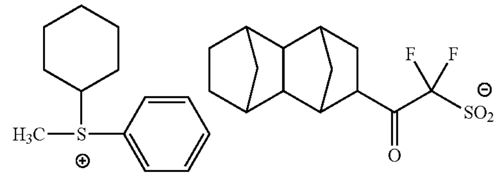
B-167
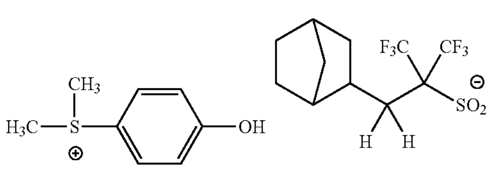
B-168
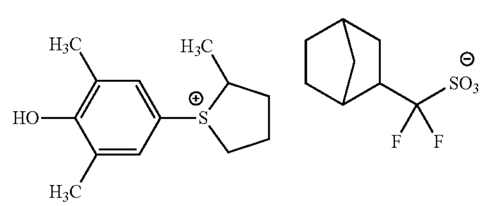

-continued
B-169
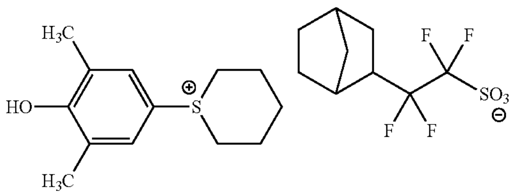
B-170
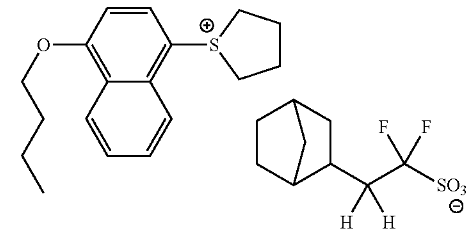
B-171
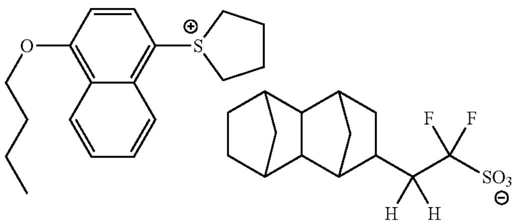
B-172
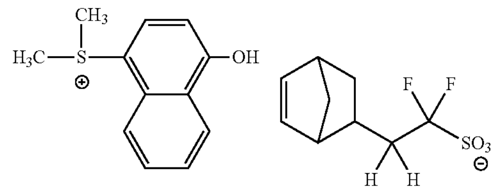
B-173
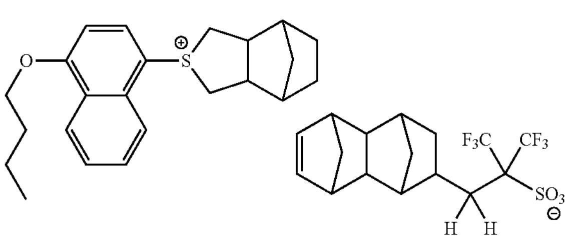
B-174
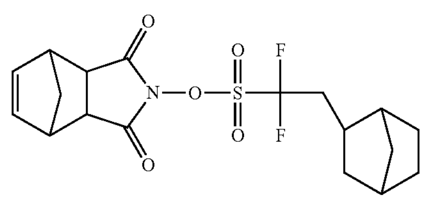
B-175
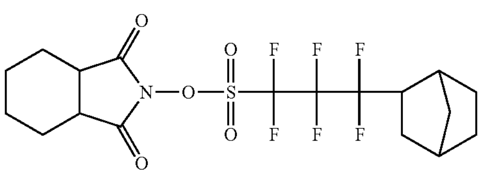
B-176
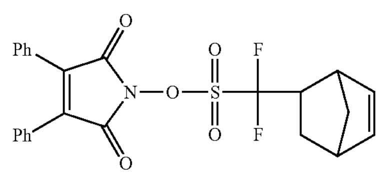
B-177
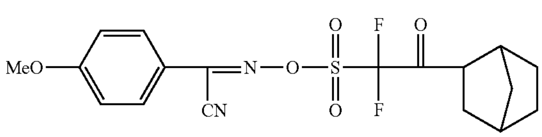
B-178
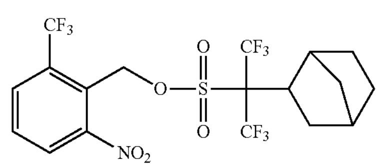
(Y-1)
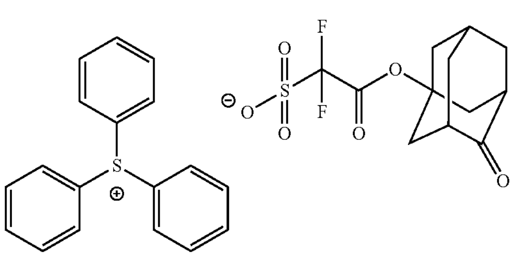
(Y-2)
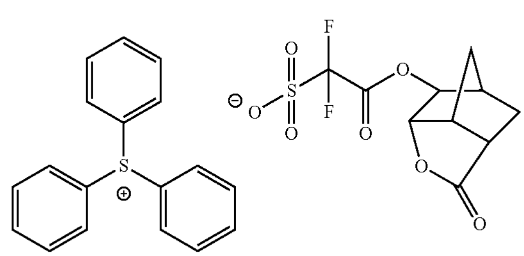
(Y-3)
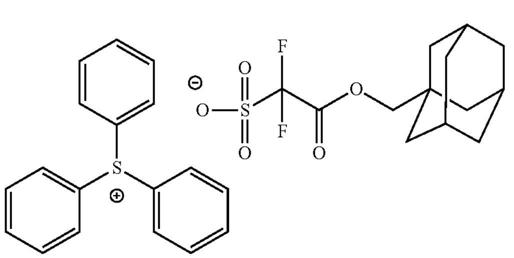
(Y-4)
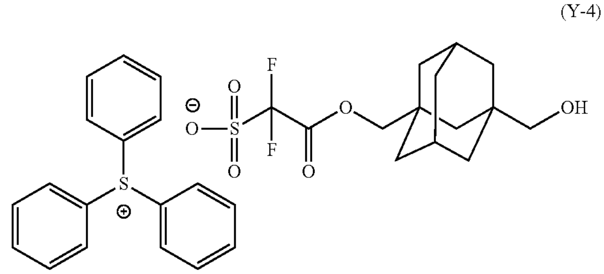

-continued
(Y-5)
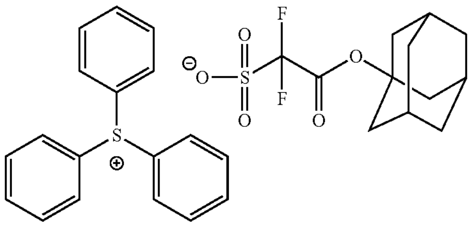
(Y-6)
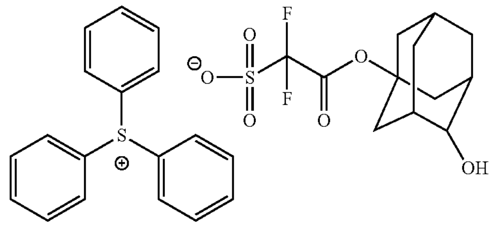
(Y-7)
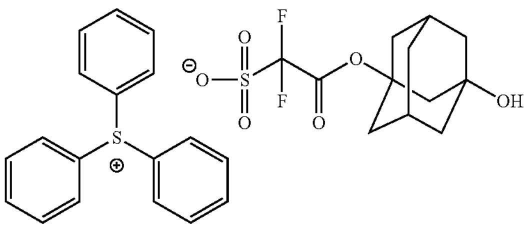
(Y-8)
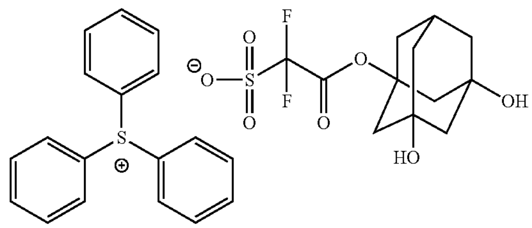
(Y-9)
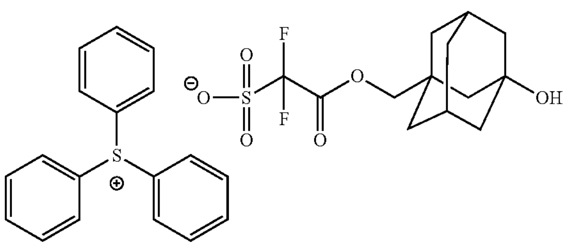
(Y-10)
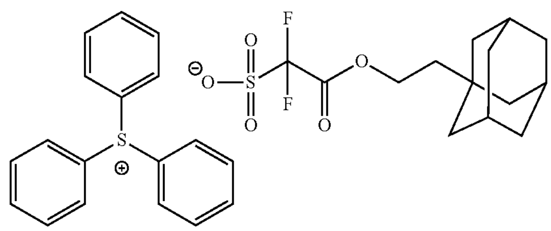
(Y-11)
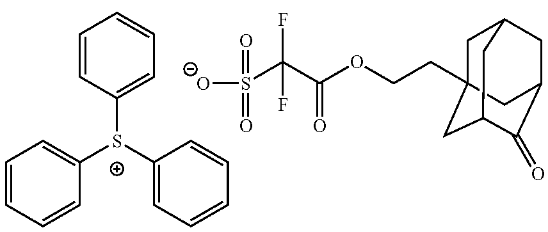
(Y-12)
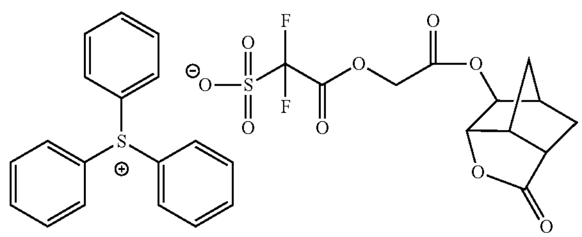
(Y-13)
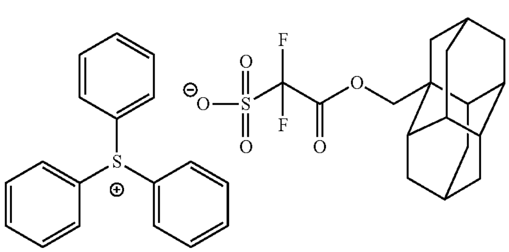
(Y-14)
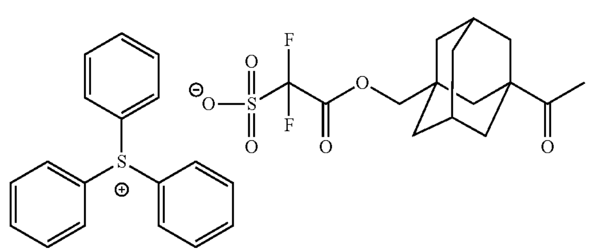
(Y-15)
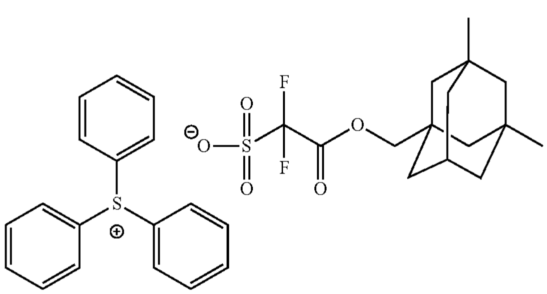
(Y-16)
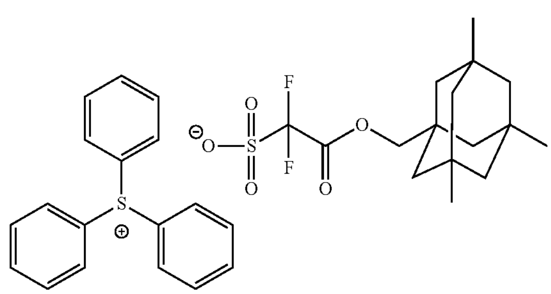

-continued
(Y-17)
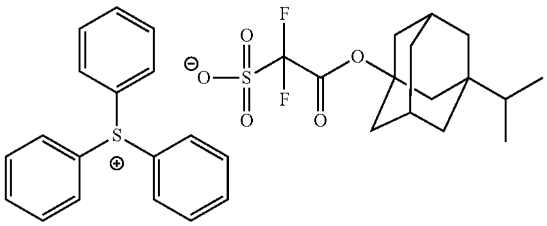
(Y-18)
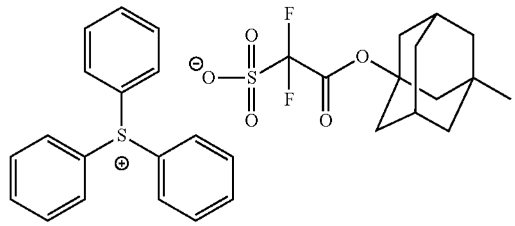
(Y-19)
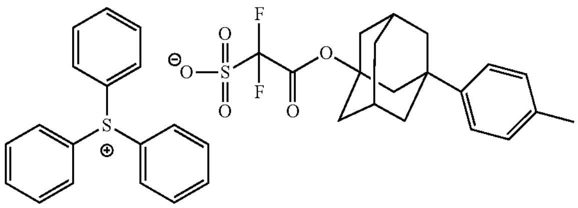
(Y-20)
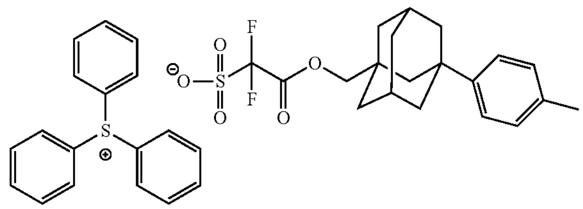
(Y-21)
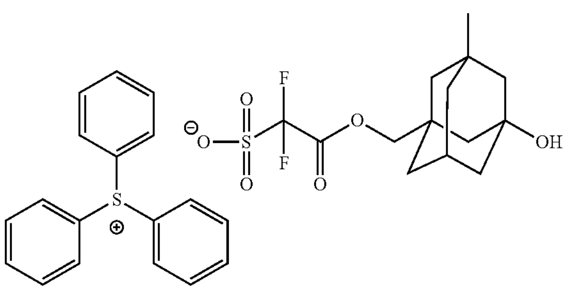
(Y-22)
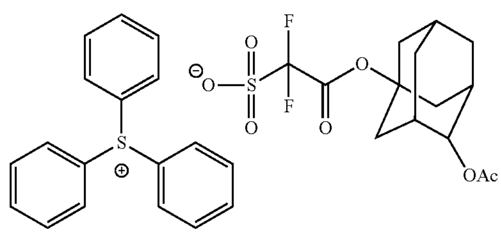
(Y-23)
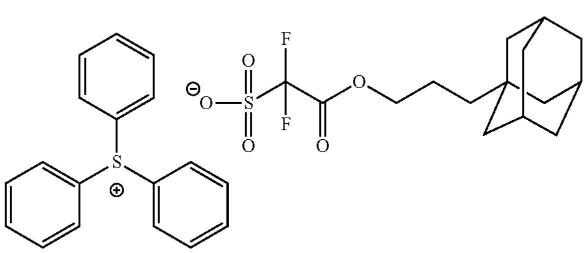
(Y-24)
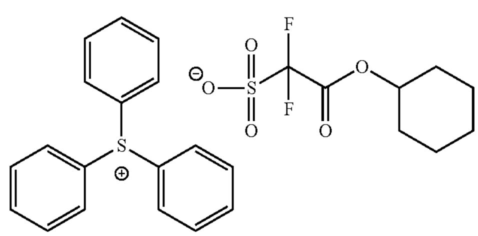
(Y-25)
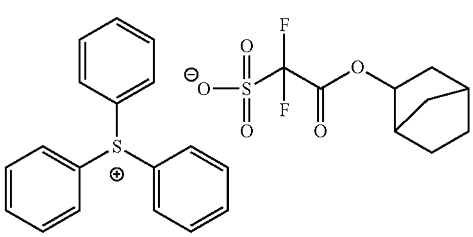
(Y-26)
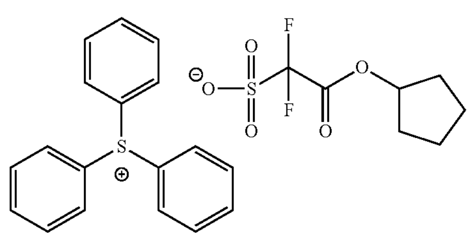
(Y-27)
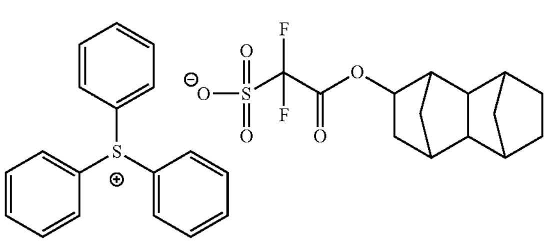
(Y-28)
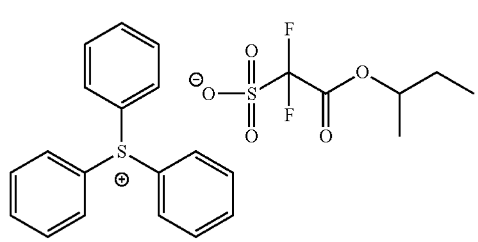

-continued
(Y-29)
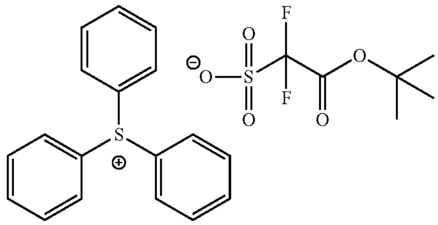
(Y-30)
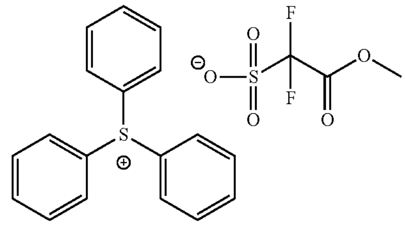
(Y-31)
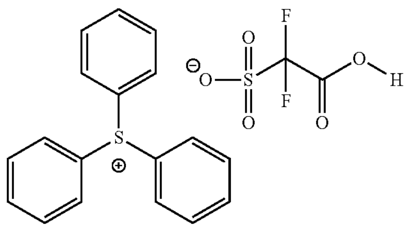
(Y-32)
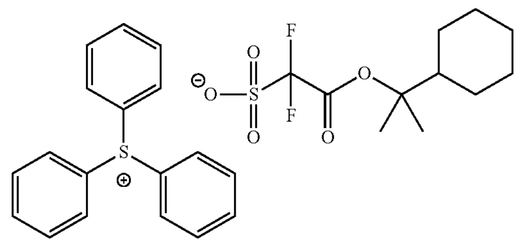
(Y-33)
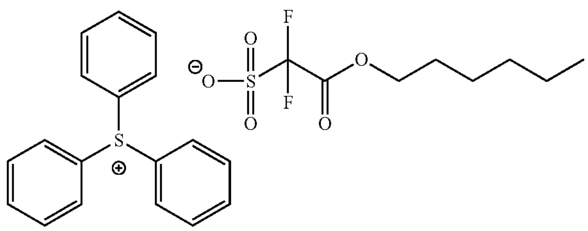
(Y-34)
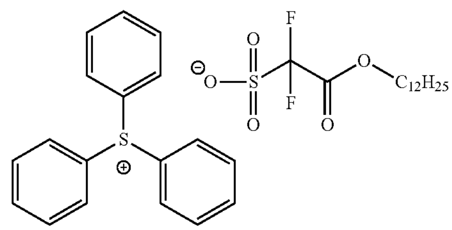
(Y-35)
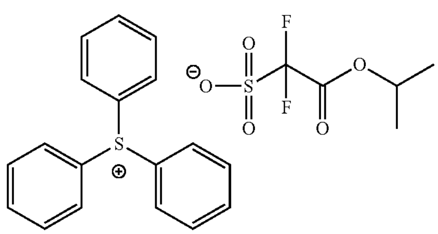
(Y-36)
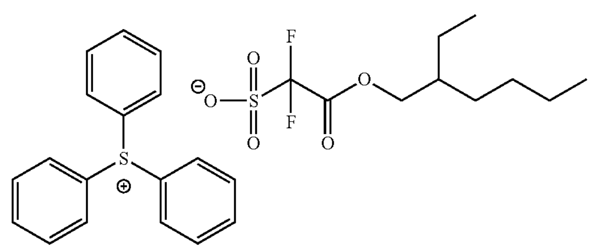
(Y-37)
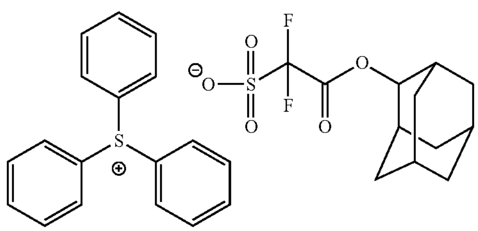
(Y-38)
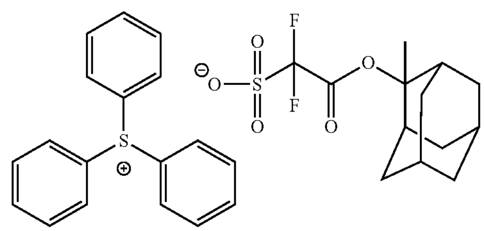
(Y-39)
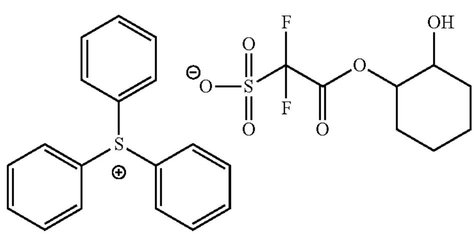
(Y-40)
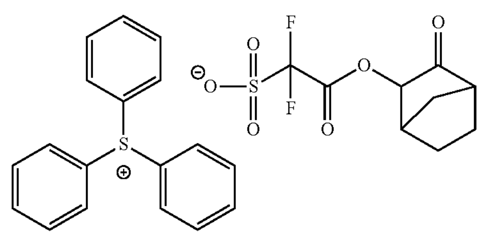

-continued
(Y-41)
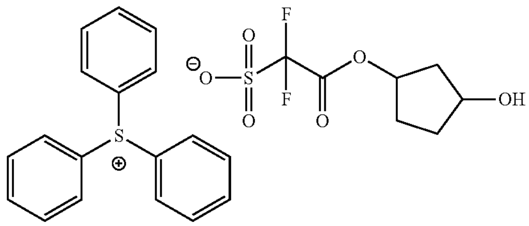
(Y-42)
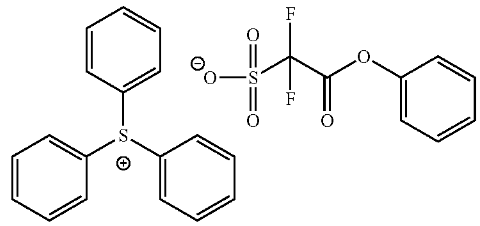
(Y-43)
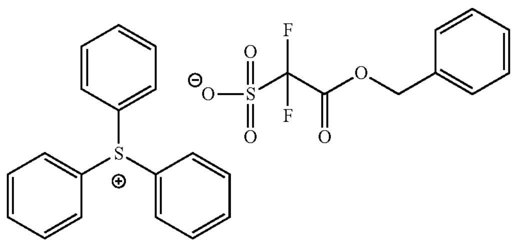
(Y-44)
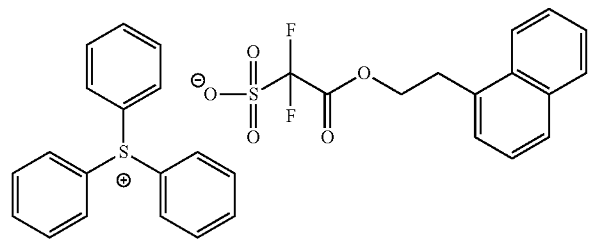
(Y-45)
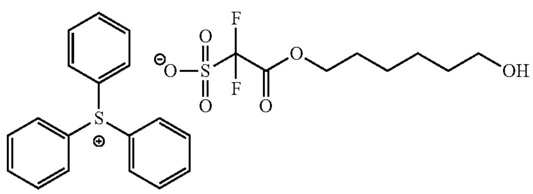
(Y-46)
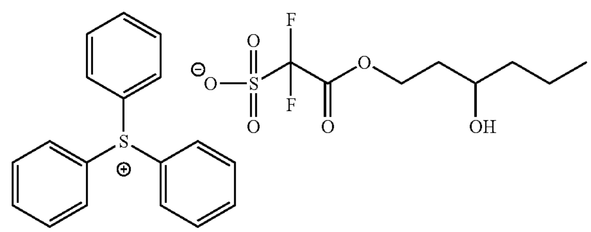
(Y-47)
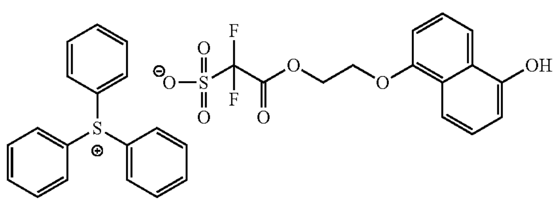
(Y-48)
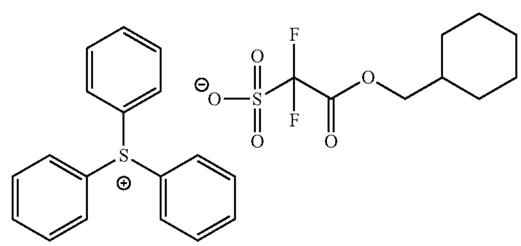
(Y-49)
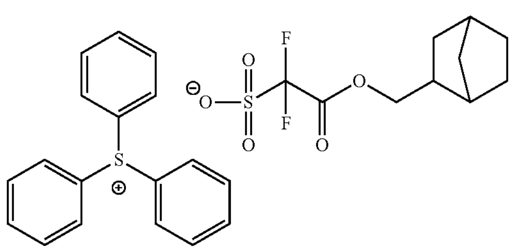
(Y-50)
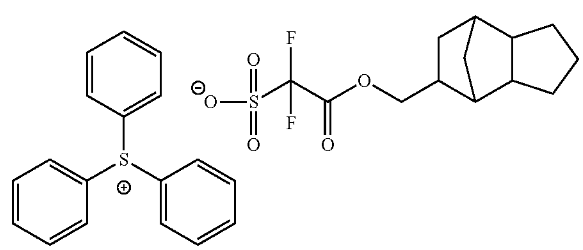
(Y-51)
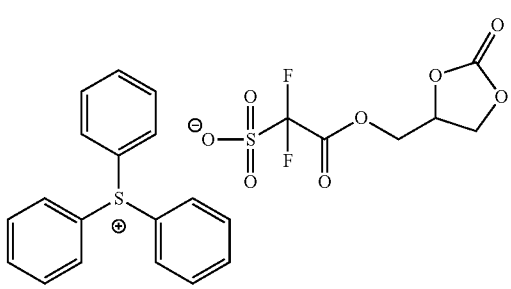
(Y-52)
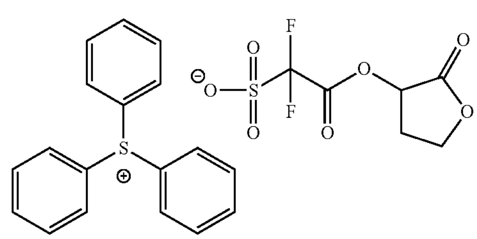

-continued
(Y-53)
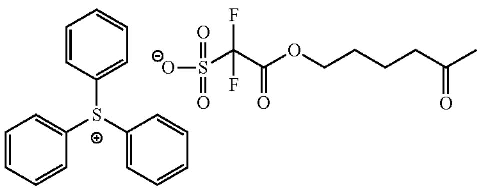
(Y-54)
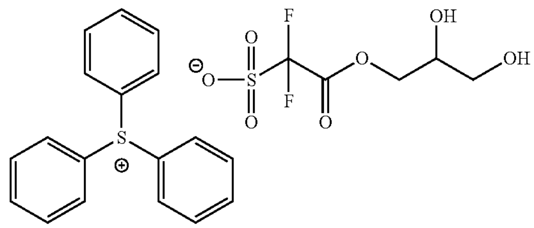
(Y-55)
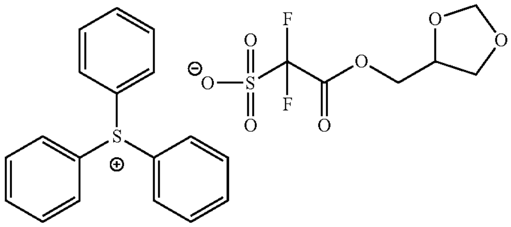
(Y-56)
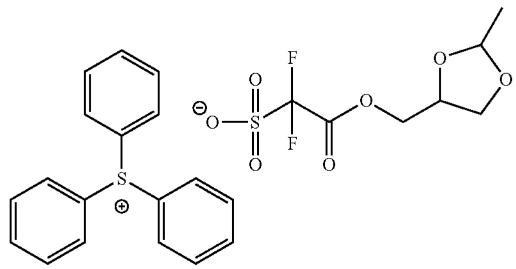
(Y-57)
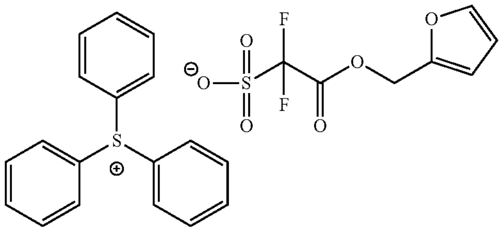
(Y-58)
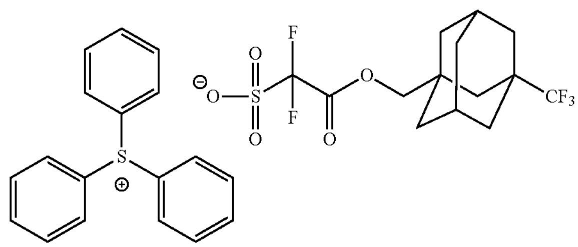
(Y-59)
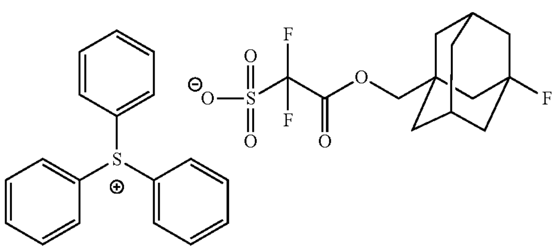
(Y-60)
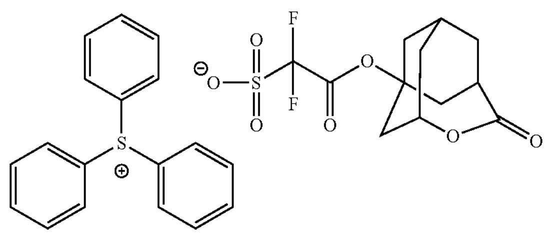
(Y-61)
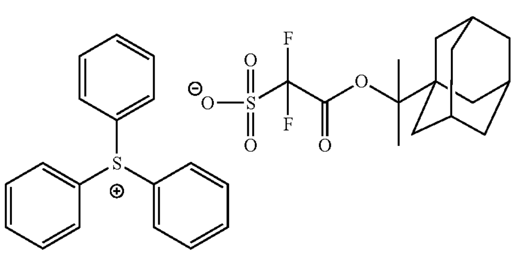
(Y-62)
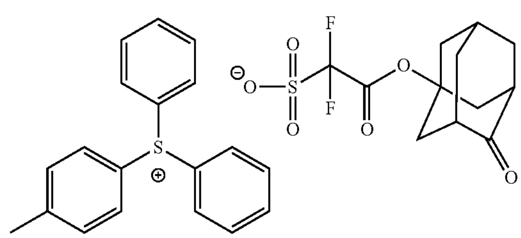
(Y-63)
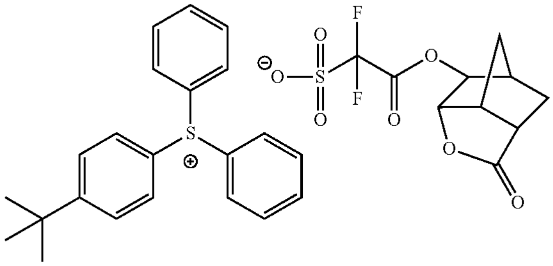
(Y-64)
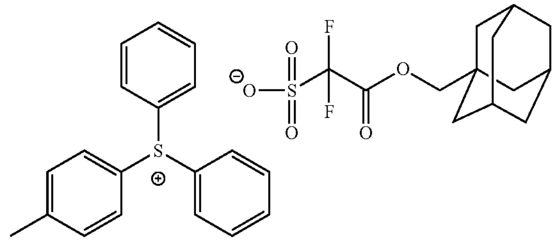

-continued
(Y-65)
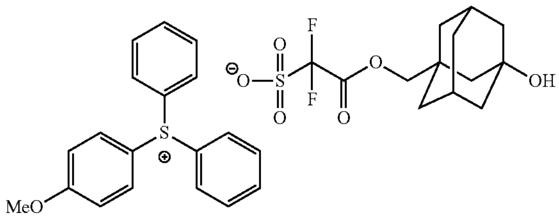
(Y-66)
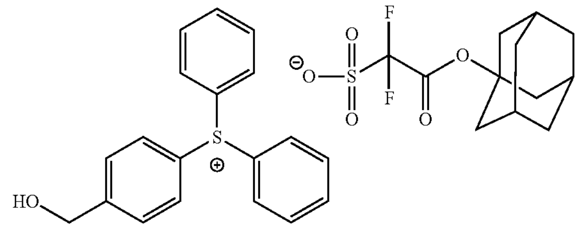
(Y-67)
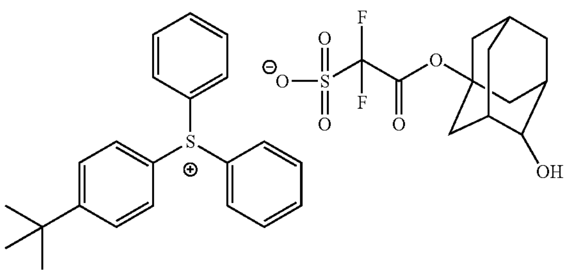
(Y-68)
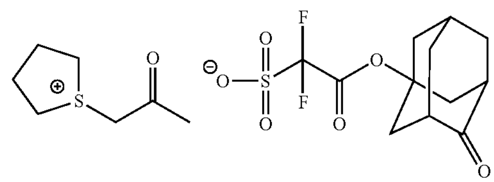
(Y-69)
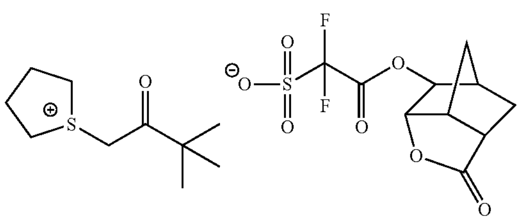
(Y-70)
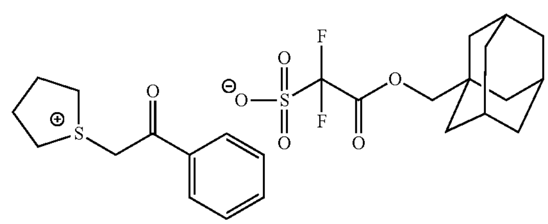
(Y-71)
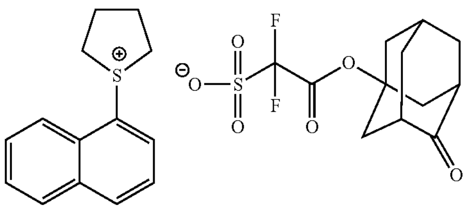
(Y-72)
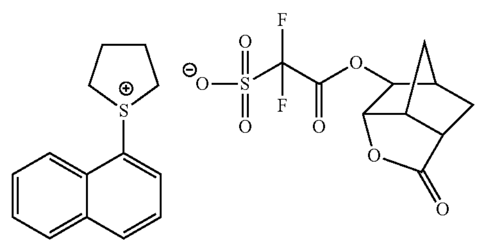
(Y-73)
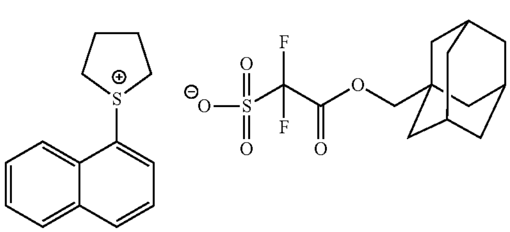
(Y-74)
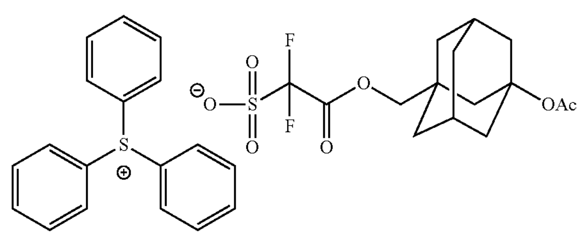
(Y-75)
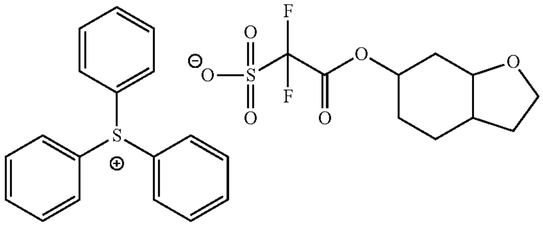

Meanwhile, the photo-acid generator may be used either alone or in combination of two or more thereof. In the case of the latter, it is preferred to combine compounds generating two kinds of organic acids in which the difference in total atom numbers except hydrogen atoms is 2 or more.

Further, the content of the photo-acid generator is preferably 0.1% by mass to 50% by mass, more preferably 0.5% by mass to 45% by mass, and still more preferably 1% by mass to 40% by mass based on the total solid of the composition.

[4] Basic Compound

The actinic ray-sensitive or radiation-sensitive composition according to the present invention may further contain a basic compound. The basic compound is preferably a stronger basic compound, compared to phenol. Further, the basic compound is preferably an organic basic compound, and more preferably a nitrogen-containing basic compound.

A nitrogen-containing basic compound which can be used is not particularly limited, but for example, compounds classified into the following (1) to (7) may be used.

(1) Compound Represented by Formula (BS-1)

(BS-1)

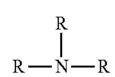

In Formula (BS-1),

Each R independently represents a hydrogen atom or an organic group. However, at least one of three R's is an organic group. The organic group is a straight or branched alkyl group, a monocyclic or polycyclic cycloalkyl group, an aryl group or an aralkyl group.

The carbon number of the alkyl group as R is not particularly limited, but usually 1 to 20, and preferably 1 to 12.

The carbon number of the cycloalkyl group as R is not particularly limited, but usually 3 to 20, and preferably 5 to 15.

The carbon number of the aryl group as R is not particularly limited, but usually 6 to 20, and preferably 6 to 10. Specific examples thereof may include a phenyl group, a naphthyl group and the like.

The carbon number of the aralkyl group as R is not particularly limited, but usually 7 to 20, and preferably 7 to 11. Specific examples thereof may include a benzyl group and the like.

The alkyl group, the cycloalkyl group, the aryl group and the aralkyl group as R may have a substituent by which a hydrogen atom is substituted. Examples of the substituent may include an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group and the like.

Meanwhile, in the compound represented by Formula (BS-1), it is preferred that at least two of R's are an organic group.

Specific examples of the compound represented by Formula (BS-1) may include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(t-butyl)aniline.

Further, a preferred basic compound represented by Formula (BS-1) may be exemplified by a compound in which at least one R is an alkyl group substituted with a hydroxyl group. Specific examples thereof may include triethanolamine and N,N-dihydroxyethylaniline.

Meanwhile, the alkyl group as R may have an oxygen atom in the alkyl chain. That is, an oxyalkylene chain may be formed. The oxyalkylene chain is preferably —$CH_2CH_2O$—. Specific examples thereof may include tris(methoxyethoxyethyl)amine and compounds exemplified after the 60th line in column 3 of U.S. Pat. No. 6,040,112.

Examples of the compound represented by Formula (BS-1) may include the followings.

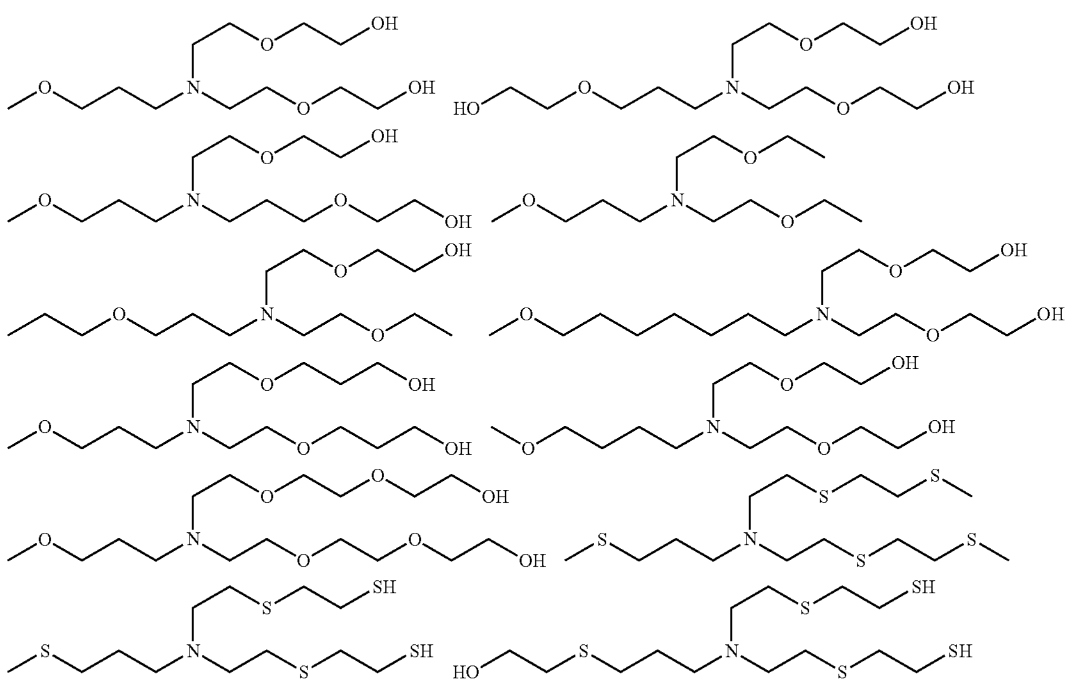

-continued

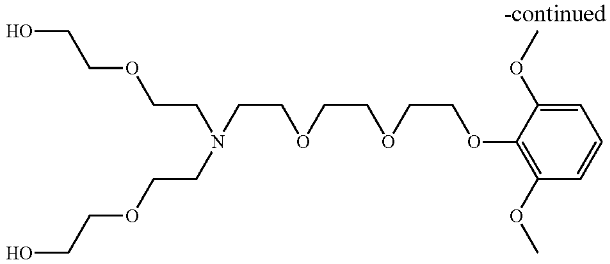

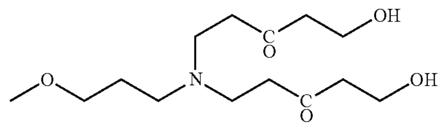

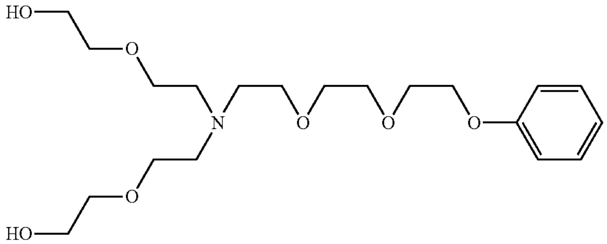

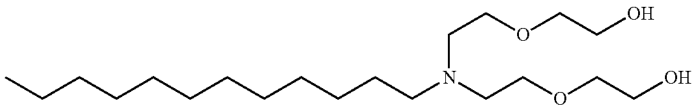

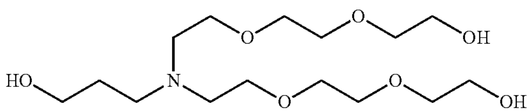

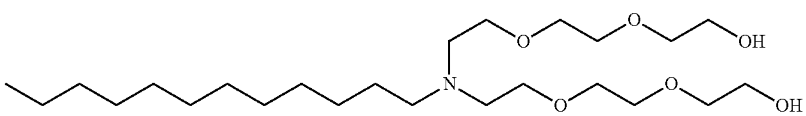

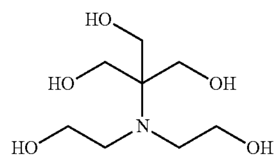

(2) Compound Having a Nitrogen-Containing Heterocyclic Structure

The nitrogen-containing heterocycle may or may not have aromaticity. Further, the nitrogen-containing heterocycle may have a plurality of nitrogen atoms. Furthermore, the nitrogen-containing heterocycle may have a heteroatom other than a nitrogen atom. Specific examples thereof may include a compound having an imidazole structure (2-phenylbenzimidazole, 2,4,5-triphenylimidazole and the like), a compound having a piperidine structure [N-hydroxyethylpiperidine and bis(1,2,2,6,6-pentamethyl-4-piperidyl)sebacate and the like], a compound having a pyridine structure (4-dimethylaminopyridine and the like) and a compound having an antipyrine structure (antipyrine, hydroxyantipyrine and the like).

Further, a compound having two or more ring structure is also suitably used. Specific examples thereof may include 1,5-diazabicyclo[4.3.0]nona-5-ene and 1,8-diazabicyclo[5.4.0]-undeca-7-ene.

(3) Amine Compound Having a Phenoxy Group

An amine compound having a phenoxy group refers to a compound having a phenoxy group at the end of the N atom opposite to the alkyl group contained in an amine compound. The phenoxy group may have a substituent such as an alkyl group, an alkoxy group, a halogen atom, a cyano group, a nitro group, a carboxyl group, a carboxylate ester group, a sulfonate ester group, an aryl group, an aralkyl group, an acyloxy group and an aryloxy group.

More preferably, the compound has at least one oxyalkylene chain between the phenoxy group and the nitrogen atom. The number of the oxyalkylene chain is preferably 3 to 9, and more preferably 4 to 6 per molecule. Among oxyalkylene chains, —$CH_2CH_2O$— is particularly preferred.

Specific examples thereof may include 2-[2-{2-(2,2-dimethoxy-phenoxyethoxy)ethyl}-bis-(2-methoxyethyl)]-amine and compounds (C1-1) to (C3-3) exemplified in paragraph [0066] of U.S. 2007/0224539A1.

The amine compound having a phenoxy group is obtained, for example, by reacting primary or secondary amine having a phenoxy group and haloalkyl ether with heating, adding an aqueous solution of a strong base such as sodium hydroxide, potassium hydroxide and tetraalkyl ammonium, and then extracting with an organic solvent such as ethyl acetate and chloroform. Further, the amine compound having a phenoxy group may be obtained by reacting primary or secondary amine and haloalkyl ether having a phenoxy group at the end with heating, adding an aqueous solution of a strong base such as sodium hydroxide, potassium hydroxide and tetraalkyl ammonium, and then extracting with an organic solvent such as ethyl acetate and chloroform.

(4) Ammonium Salt

An ammonium salt may be also appropriately used as as a basic compound. Examples of anion of the ammonium salt may include halide, sulfonate, borate and phosphate. Among them, halide and sulfonate are particularly preferred.

The halide is particularly chloride, bromide and iodide.

The sulfonate is particularly preferably an organic sulfonate having 1 to 20 carbon atoms. Examples of the organic sulfonate may include an alkylsulfonate and an arylsulfonate having 1 to 20 carbon atoms.

The alkyl group contained in the alkylsulfonate may have a substituent. Examples of the substituent may include a fluorine atom, a chlorine atom, a bromine atom, alkoxy group, an acyl group and an aryl group. Specific examples of the alkylsulfonate may include methanesulfonate, ethanesulfonate, butanesulfonate, hexanesulfonate, octane sulfonate, benzylsulfonate, trifluoromethanesulfonate, pentafluoroethanesulfonate and nonafluorobutanesulfonate.

Examples of the aryl group contained in the arylsulfonate may include a phenyl group, a naphthyl group and an anthryl group. The aryl group may have a substituent. The substituent is preferably, for example, a straight or branched alkyl group having 1 to 6 carbon atoms and a cycloalkyl group having 3 to 6 carbon atoms. Specific examples thereof may include preferably methyl, ethyl, n-propyl, isopropyl, n-butyl, i-butyl, t-butyl, n-hexyl and cyclohexyl group. Examples of other substituents may include an alkoxy group having 1 to 6 carbon atoms, a halogen atom, cyano, nitro, an acyl group and an acyloxy group.

The ammonium salt may be either hydroxide or carboxylate. In this case, the ammonium salt is particularly preferably tetraalkylammonium hydroxide having 1 to 8 carbon atoms (tetraalkylammonium hydroxide such as tetramethylammonium hydroxide, tetraethylammonium hydroxide and tetra-(n-butyl)ammonium hydroxide).

Examples of the preferred basic compound may include guanidine, aminopyridine, aminoalkylpyridine, aminopyrrolidine, indazole, imidazole, pyrazole, pyrazine, pirimidine, purine, imidazoline, pyrazoline, piperazine, aminomorpholine and aminoalkylmorpholine. They may further have a substituent.

Examples of the preferred substituents may include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Examples of the particularly preferred basic compound may include guanidine, 1,1-dimethylguanidine, 1,1,3,3,-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

(5) Compound (PA) Having a Proton Acceptor Functional Group and Capable of Decomposing Upon Irradiation with an Actinic Ray or Radiation to Generate a Compound which is Reduced in or Deprived of the Proton Acceptor Property, or is Changed from the Proton Acceptor Property to Acidity The composition according to the present invention is a basic compound, and may further contains a compound having a proton acceptor functional group and capable of decomposing upon irradiation with an actinic ray or radiation to generate a compound which is reduced in or deprived of the proton acceptor property, or is changed from the proton acceptor property to acidity [hereinafter, also referred to as a compound (PA)].

The proton acceptor functional group refers to a functional group having a group or an electron capable of electrostatically interacting with protons, for example, a functional group having a macrocyclic structure such as a cyclic polyether or a functional group having a nitrogen atom having an unshared electron pair which does not contribute to π-conjugation. The nitrogen atom having an unshared electron pair which does not contribute to π-conjugation means a nitrogen atom having, for example, a partial structure represented by the following formula.

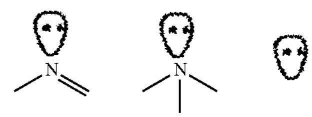

Examples of the preferred partial structure of the proton acceptor functional group may include a crown ether, azacrown ether, primary to tertiary amine, pyridine, imidazole, pyrazine structure and the like.

The compound (PA) decomposes upon an actinic ray or radiation to generate a compound which is reduced in or deprived of the proton acceptor property, or is changed from the proton acceptor property to acidity. Herein, "reduced in or deprived of the proton acceptor property, or changed from the proton acceptor property to acidity" means that the proton acceptor property is changed due to adduction of a proton to the proton acceptor functional group, and specifically, that a proton adduct is produced from the compound (PA) having a proton acceptor functional group and a proton, the equilibrium constant in the chemical equilibrium decreases.

The proton acceptor property may be confirmed by measuring the pH. In the present invention, the acid dissociation constant pKa of the compound generated when the compound (PA) decomposes upon irradiation with an actinic ray or radiation preferably satisfies $pKa<-1$, more preferably $-13<pKa<-1$, and still more preferably $-13<pKa<-3$.

In the present invention, the acid dissociation constant pKa denotes an acid dissociation constant pKa in an aqueous solution, and indicates that the lower the value is, the stronger the acid strength is, as described in, for example, Chemical Handbook (II) (4th revised edition, 1993, The Chemical Society of Japan edited, Maruzen Company, Limited). Specifically, the acid dissociation constant pKa in an aqueous solution may be practically measured by measuring an acid dissociation constant at 25° C. using an infinitely dilute solution, and may also be obtained by calculating a value based on Hammett substituent constants and known literature values using the following software package 1. All the pKa values described in the present specification denotes values obtained by calculation using the software package.

Software package 1: Advanced Chemistry Development (ACD/Labs) Software V 8.14 for Solaris (1994-2007 ACD/Labs)

Specific examples of the compound (PA) are shown below, but not limited thereto.

-continued
(PA-1)
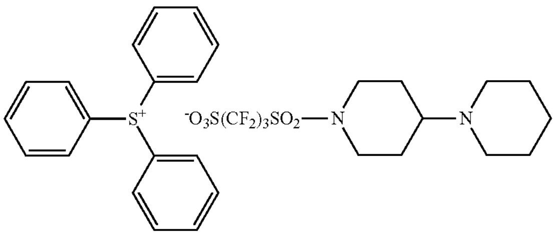
(PA-2)
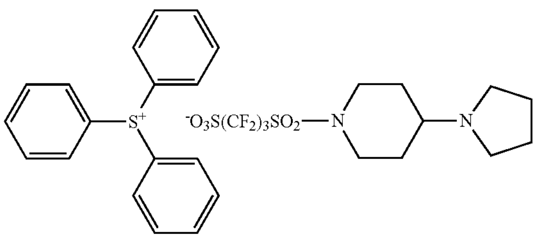
(PA-3)
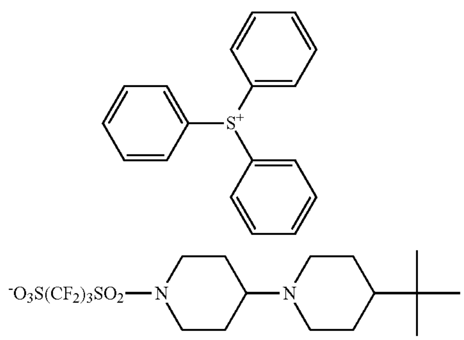
(PA-4)
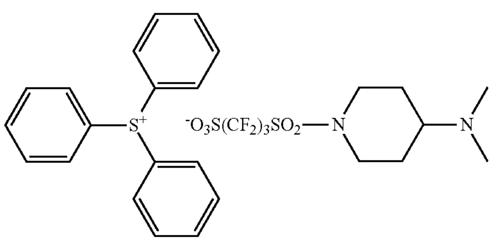
(PA-5)
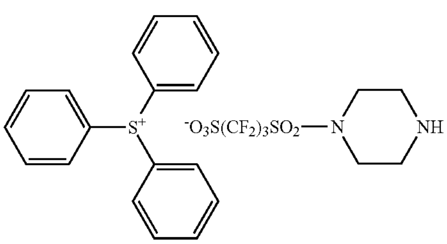
(PA-6)
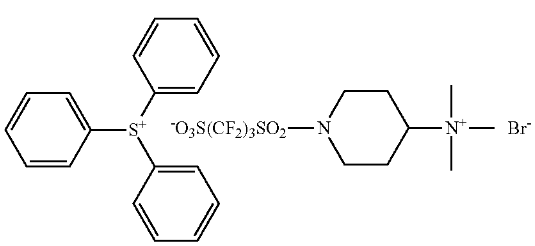
(PA-7)
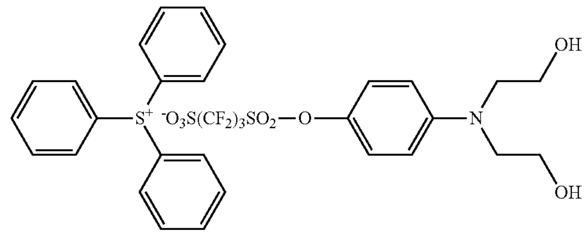
(PA-8)
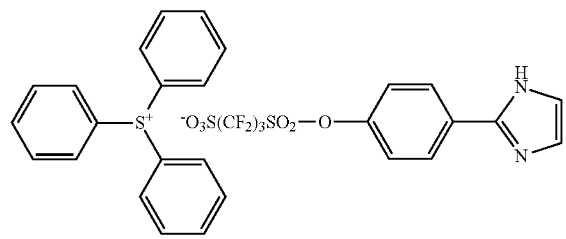
(PA-9)
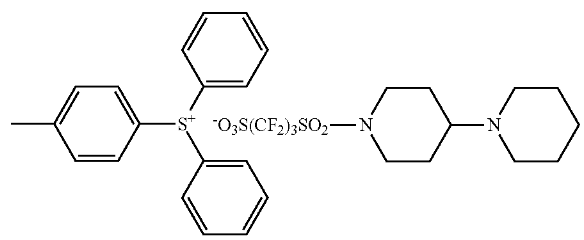
(PA-10)
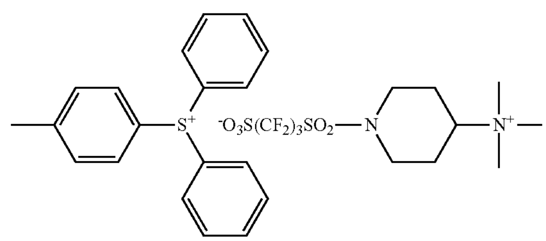
(PA-11)
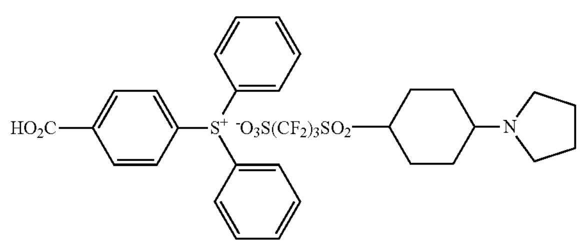
(PA-12)
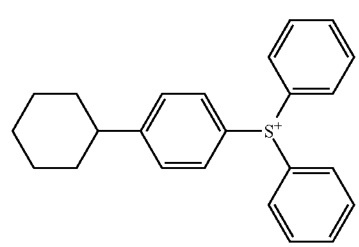

-continued
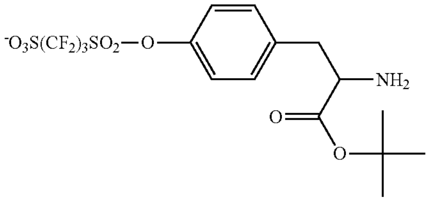
(PA-13)
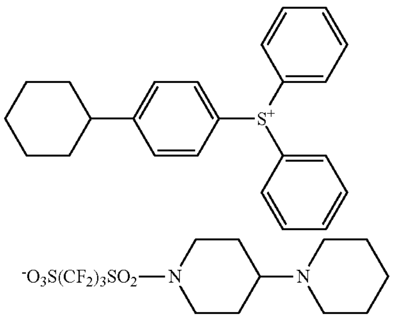
(PA-14)
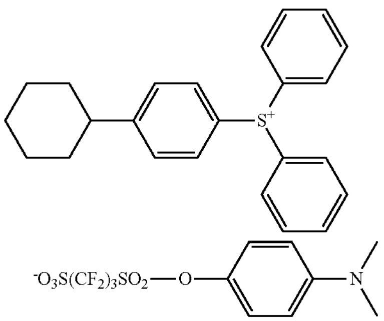
(PA-15)
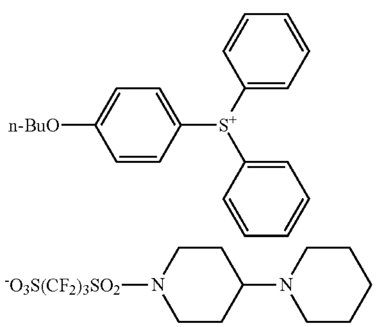
(PA-15)
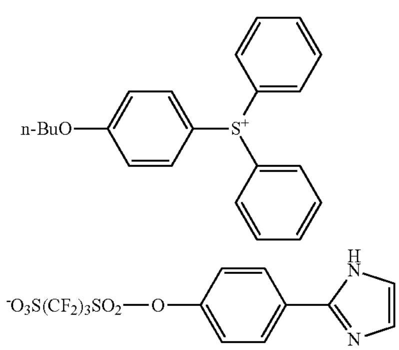
(PA-17)
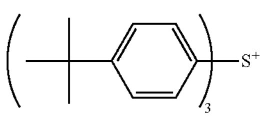
-continued
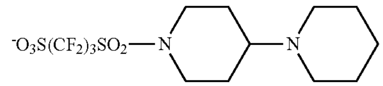
(PA-18)
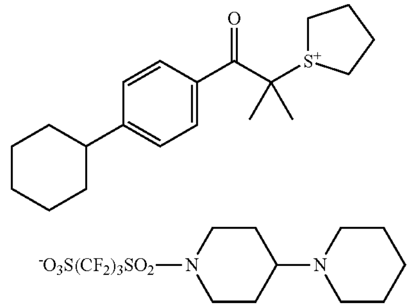
(PA-19)
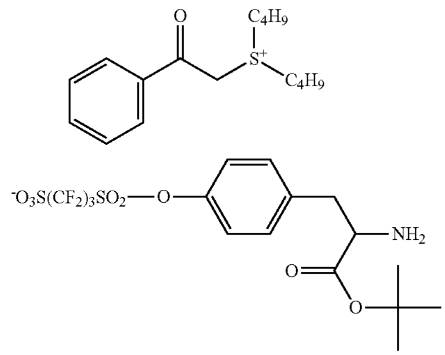
(PA-20)
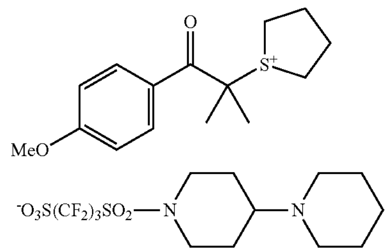
(PA-21)
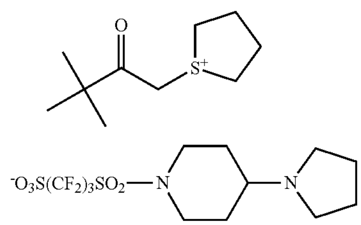
(PA-22)
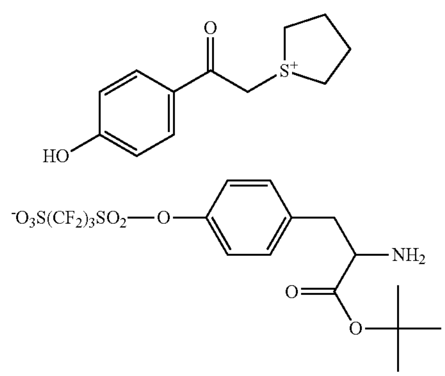

-continued
(PA-23)
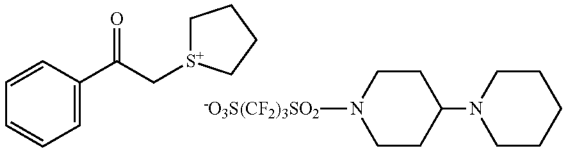
(PA-24)
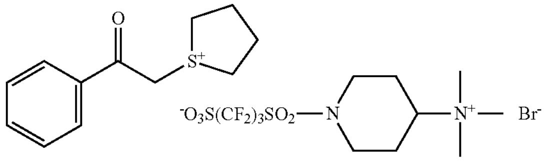
(PA-25)
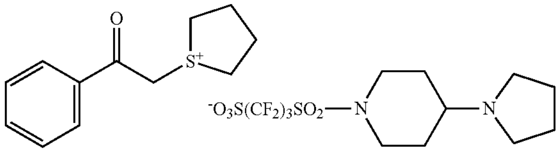
(PA-26)
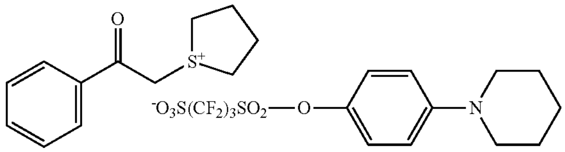
(PA-27)
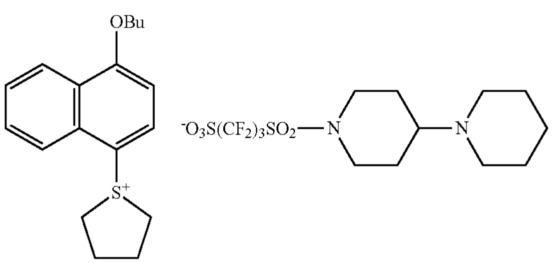
(PA-28)
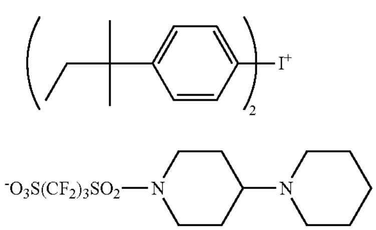
(PA-29)
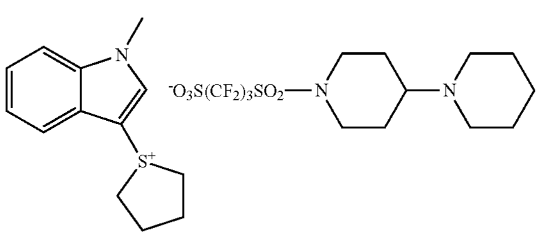
-continued
(PA-30)
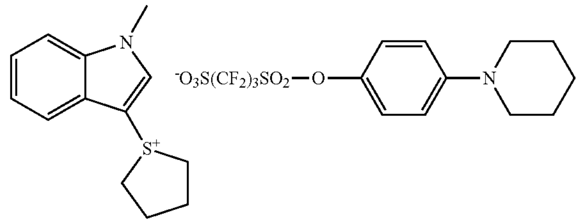
(PA-31)
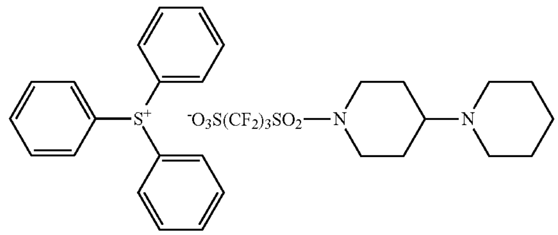
(PA-32)
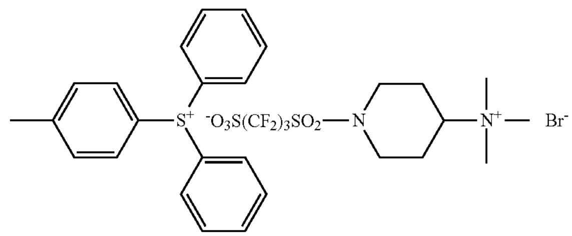
(PA-33)
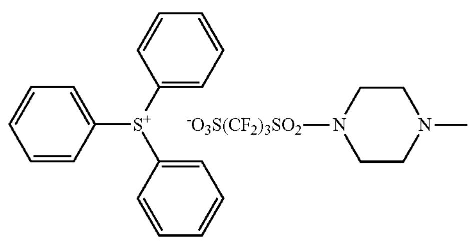
(PA-34)
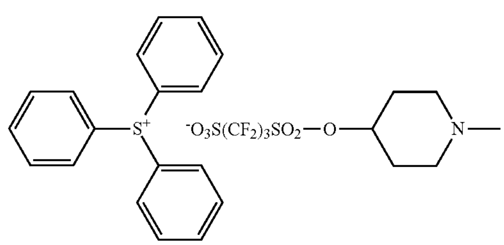
(PA-35)
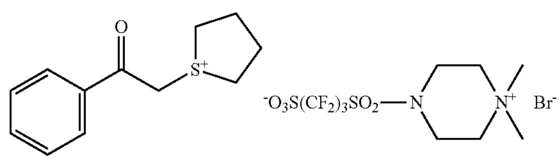

(PA-36)
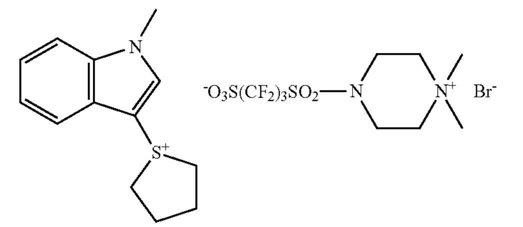
(PA-37)
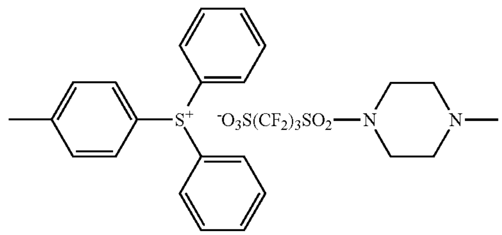
(PA-38)
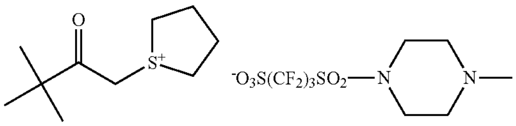
(PA-39)
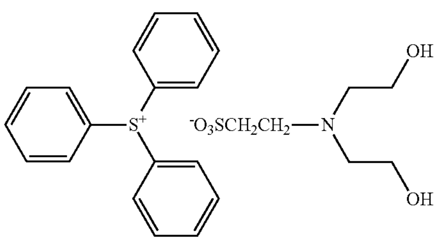
(PA-40)
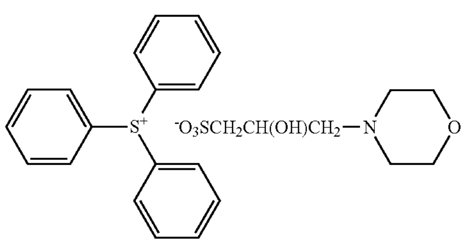
(PA-41)
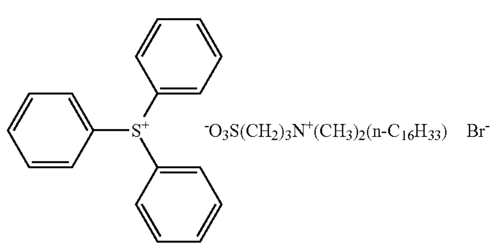
(PA-42)
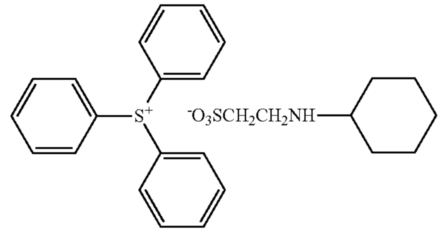
(PA-43)
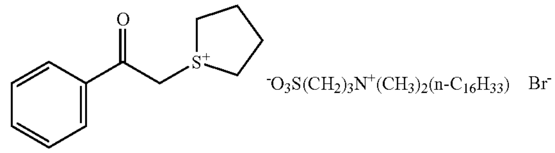
(PA-44)
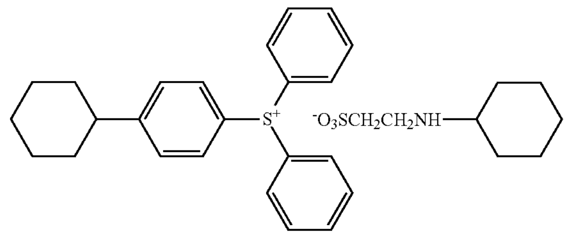
(PA-45)
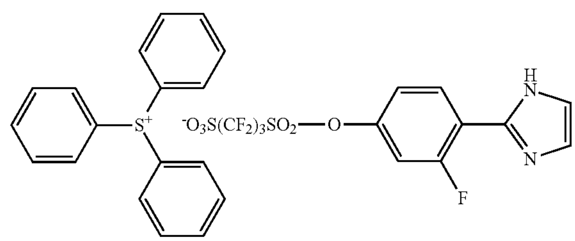
(PA-46)
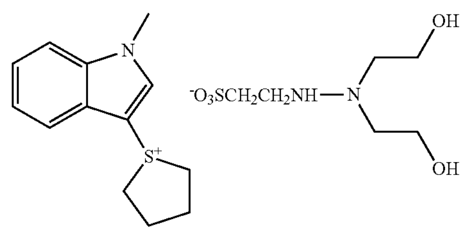
(PA-47)
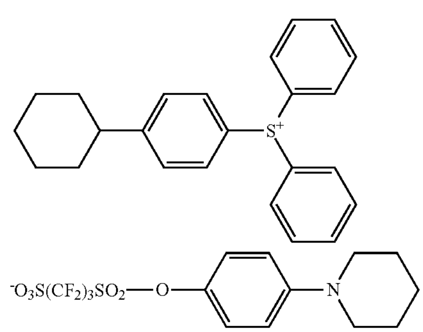
(PA-48)
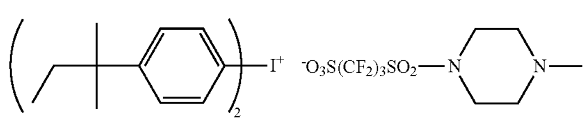

-continued
(PA-49)
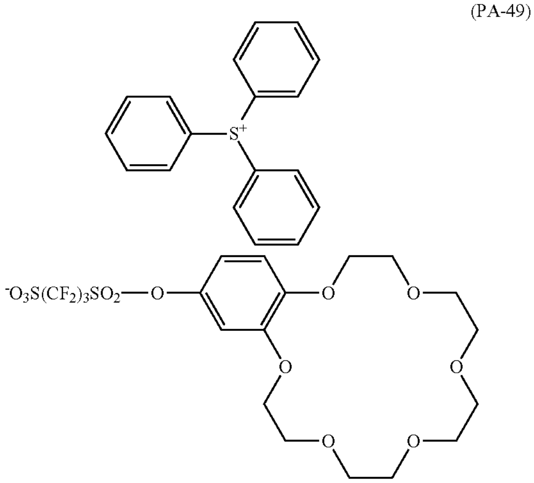
(PA-50)
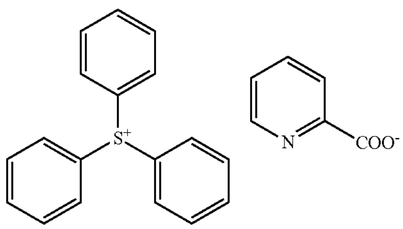
(PA-51)
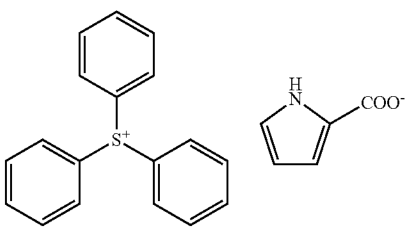
(PA-52)
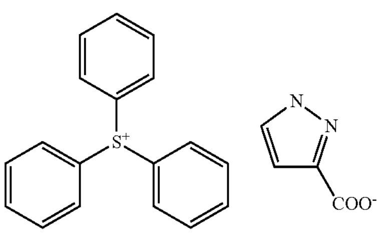
(PA-53)
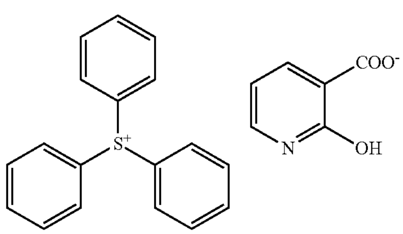
(PA-54)
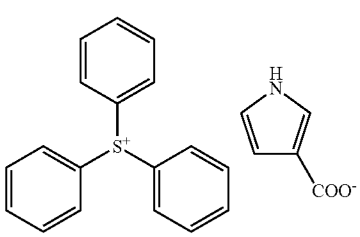
-continued
(PA-55)
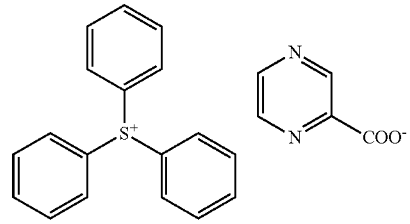
(PA-56)
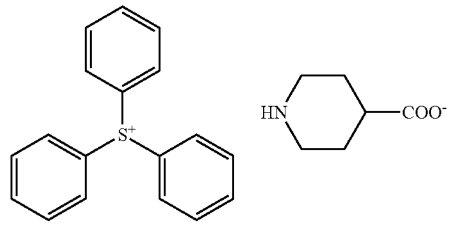
(PA-57)
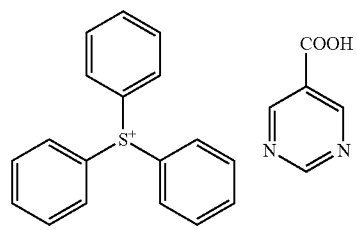
(PA-58)
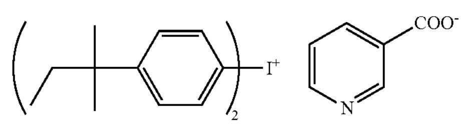
(PA-59)
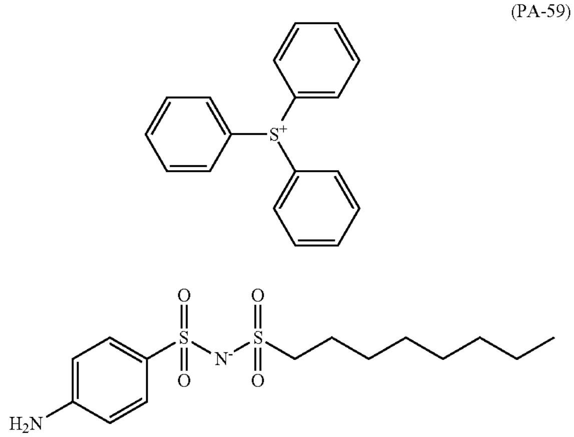
(PA-60)
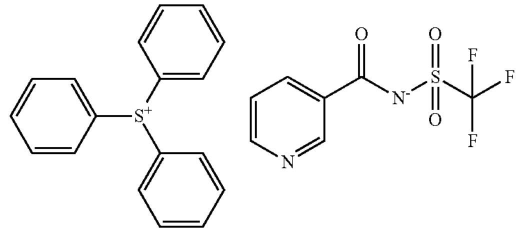

-continued
(PA-61)
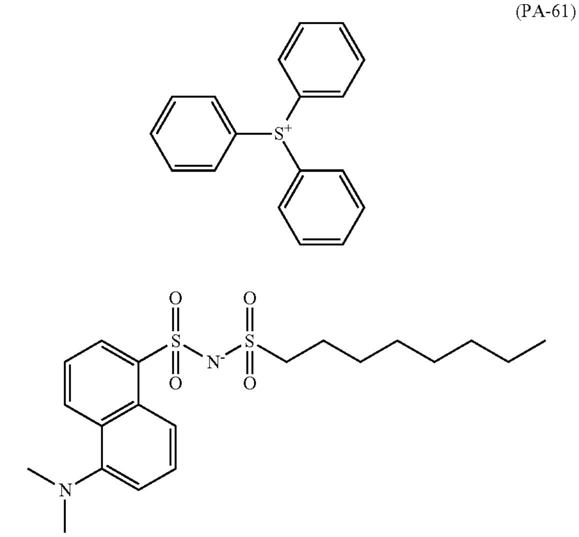
(PA-62)
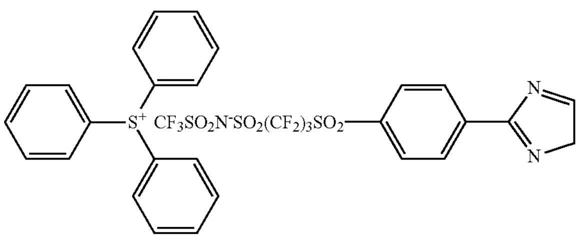
(PA-63)
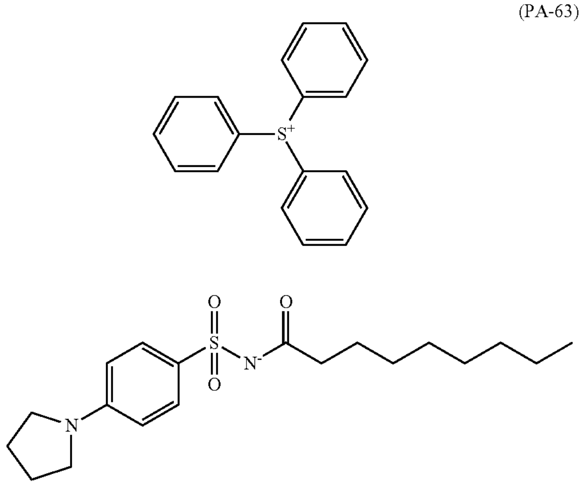
(PA-64)
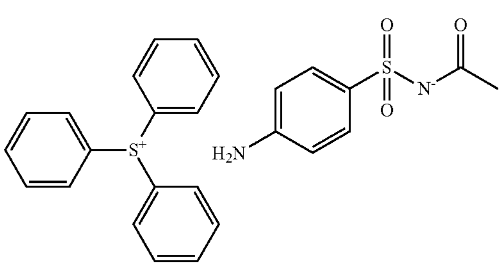
-continued
(PA-65)
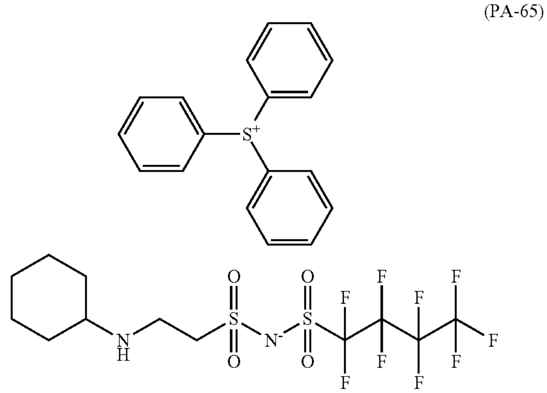
(PA-66)
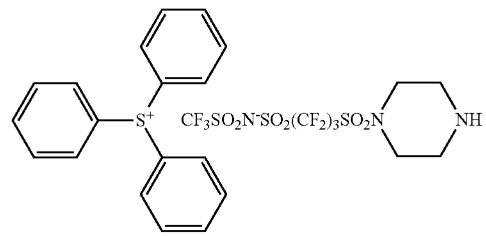
(PA-67)
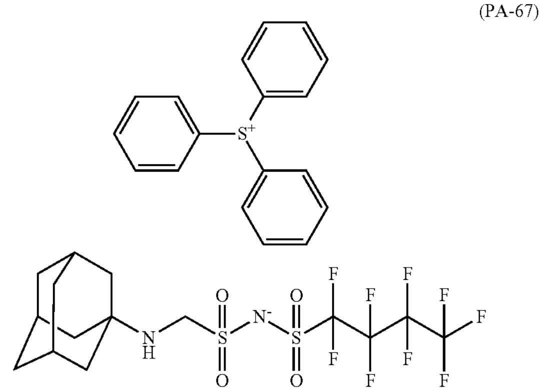
(PA-68)
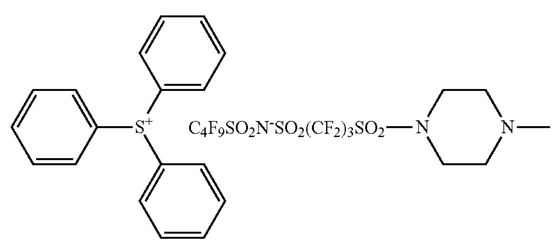
(PA-69)
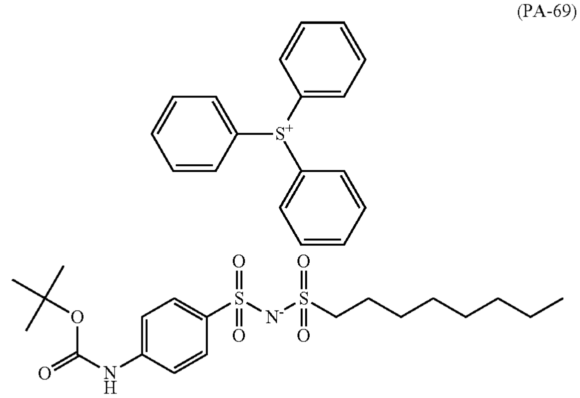

-continued
(PA-70)
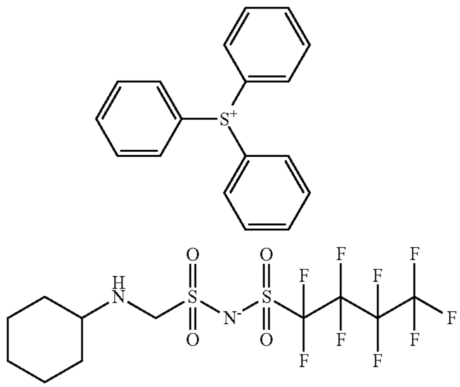
(PA-71)
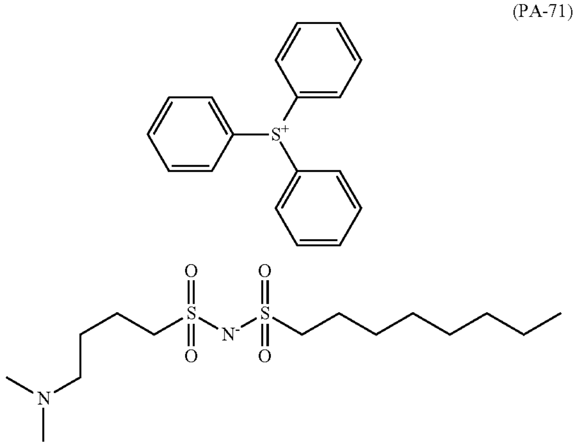
(PA-72)
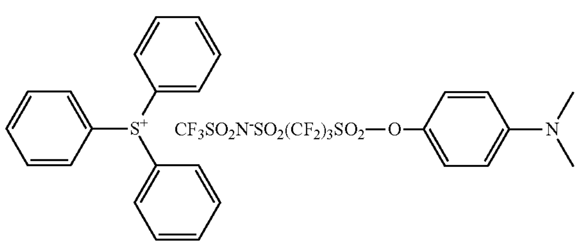
(PA-73)
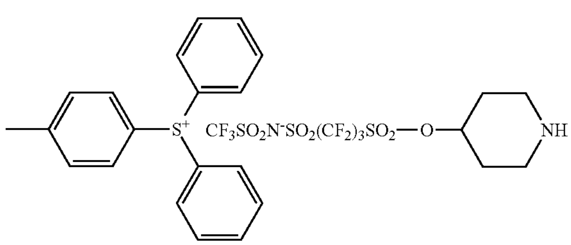
(PA-74)
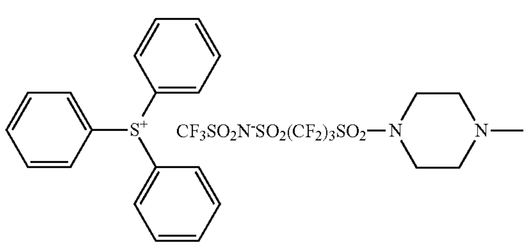
-continued
(PA-75)
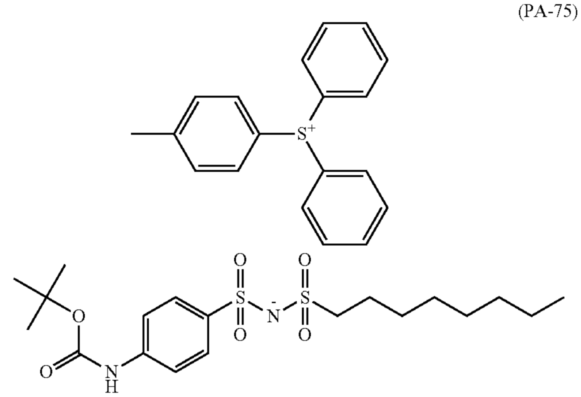
(PA-76)
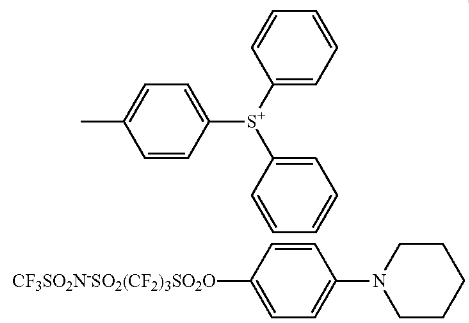
(PA-77)
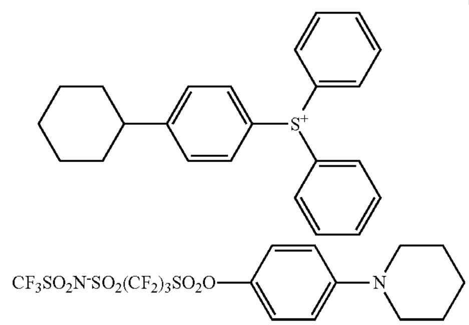
(PA-78)
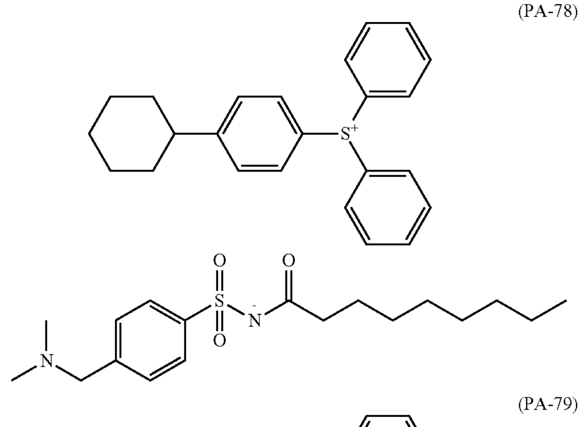
(PA-79)
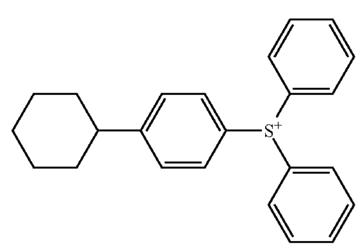

-continued
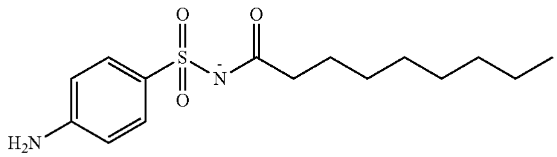
(PA-80)
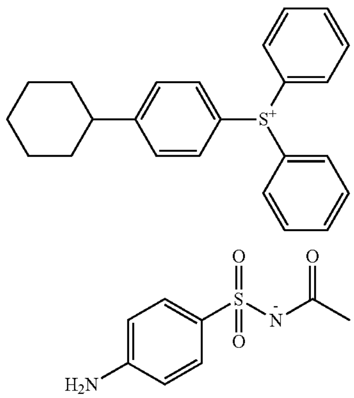
(PA-81)
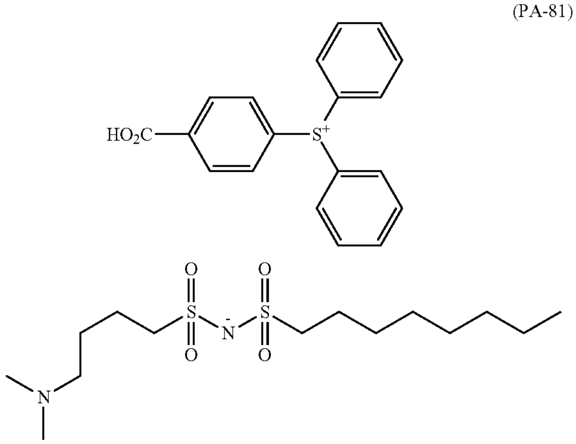
(PA-82)
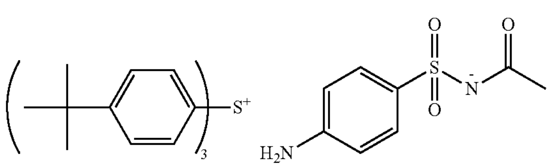
(PA-83)
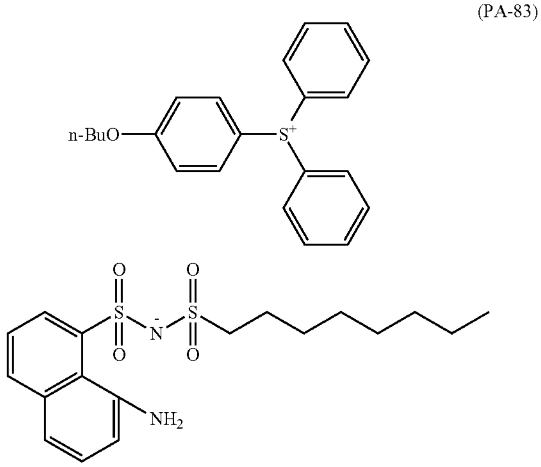
-continued
(PA-84)
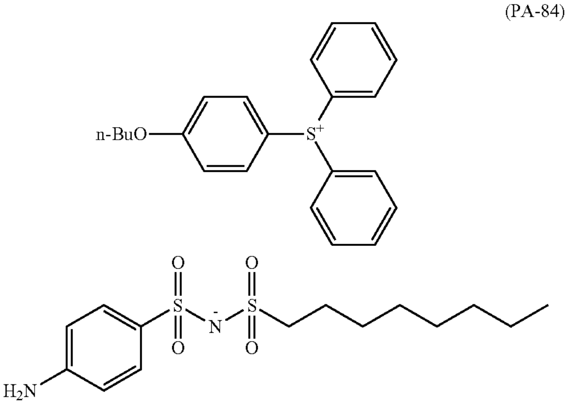
(PA-85)
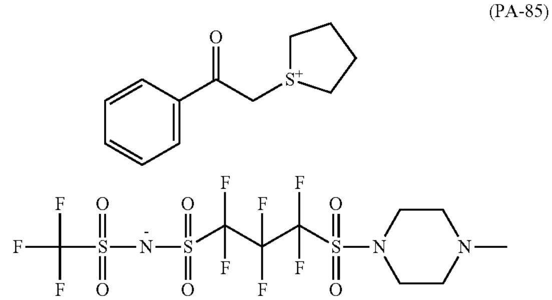
(PA-86)
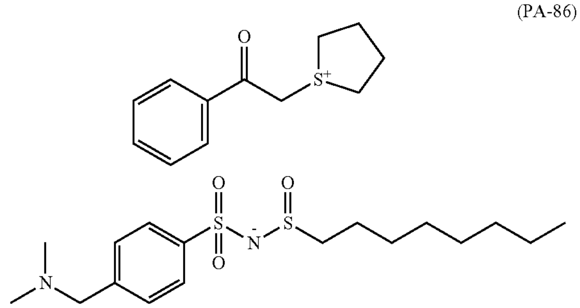
(PA-87)
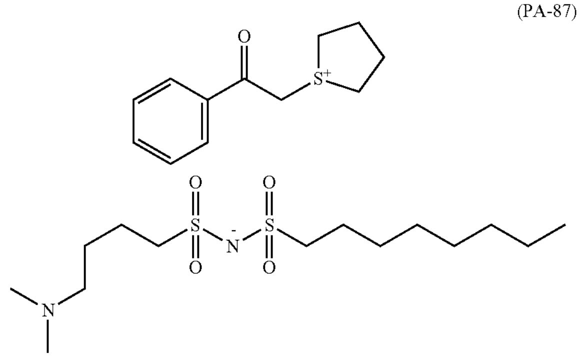
(PA-88)
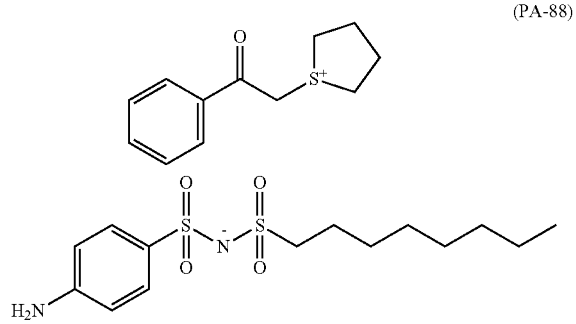

(PA-89)
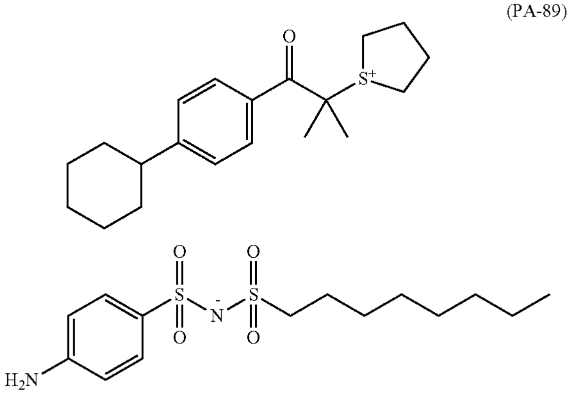
(PA-90)
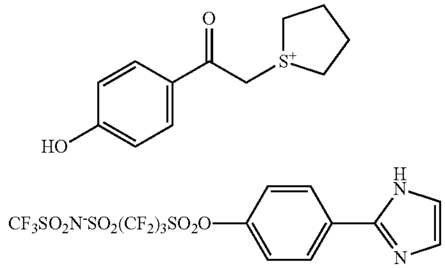
(PA-91)
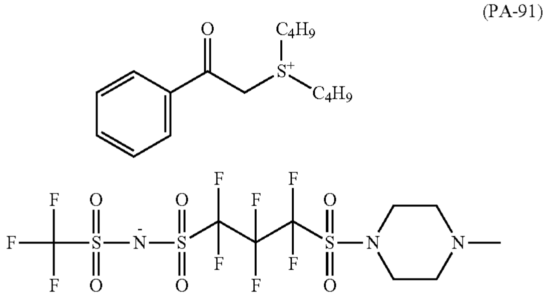
(PA-92)
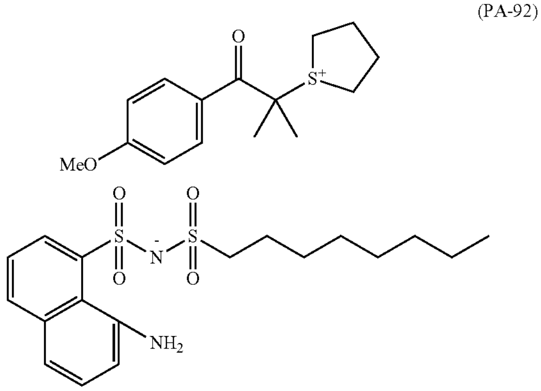
(PA-93)
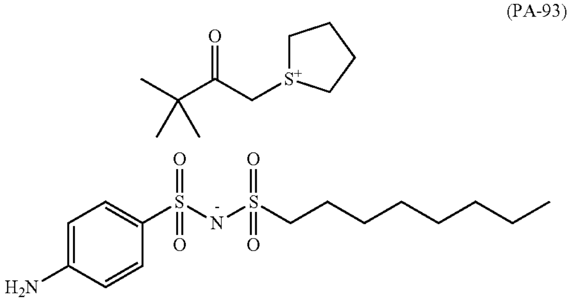
(PA-94)
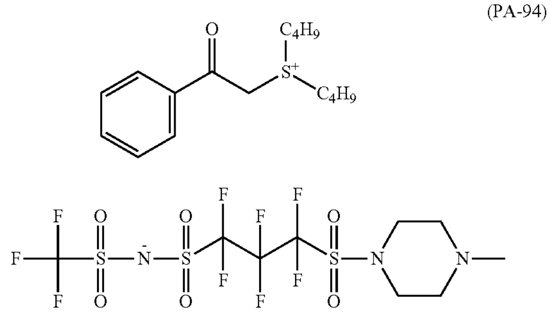
(PA-95)
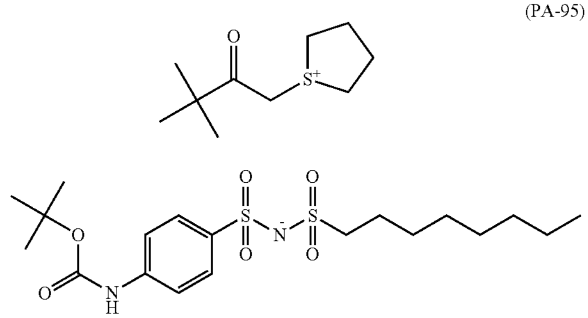
(PA-96)
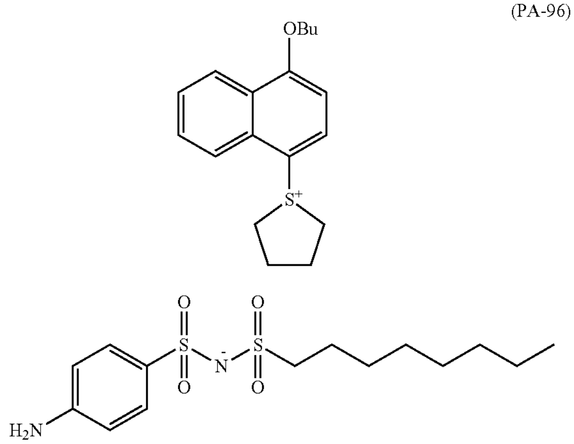
(PA-97)
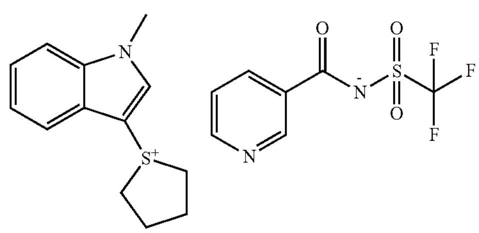
(PA-98)
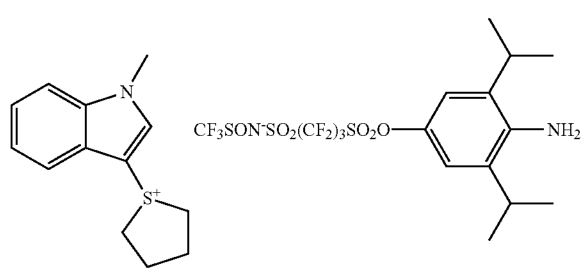

-continued (PA-99)

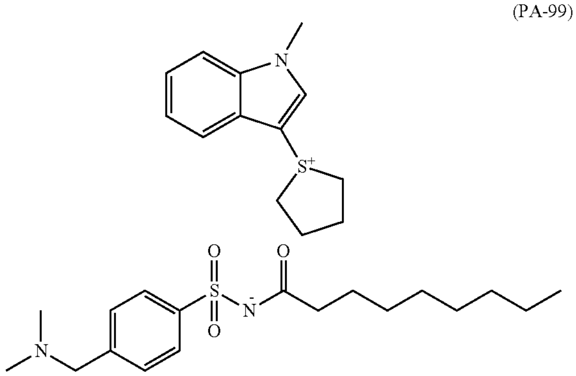

(PA-100)

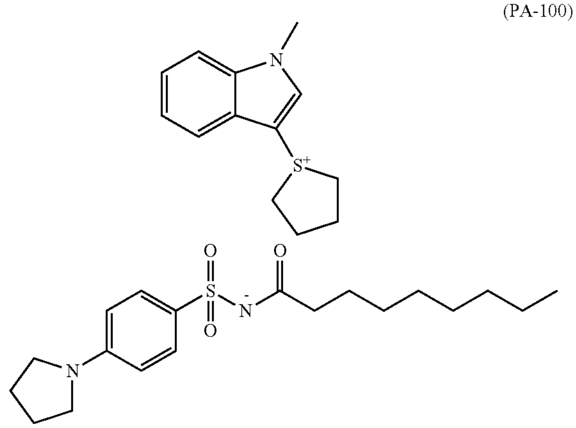

(PA-101)

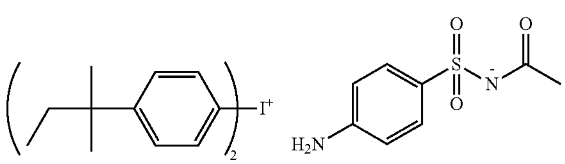

(PA-102)

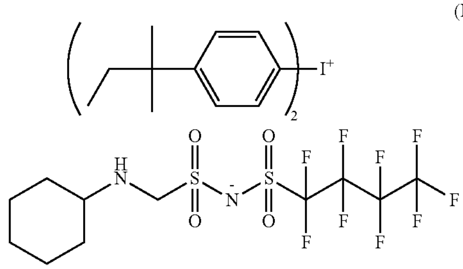

In the composition of the present invention, the blending ratio of the compound (PA) in the whole composition is preferably 0.1% by mass to 10% by mass, and more preferably 1% by mass to 8% by mass based on the total solid.

(6) Guanidine Compound

The composition of the present invention may further contain a guanidine compound having a structure represented by the following formula.

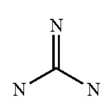

The guanidine compound shows strong basicity because the positive charge of the conjugate acid is dispersion-stabilized by three nitrogens.

As for the basicity of the guanidine compound (A) of the present invention, it is preferred that pKa of the conjugate acid is 6.0 or more. The value of 7.0 to 20.0 is preferred in that the neutralization reactivity with an acid is high and the roughness characteristic is excellent, and the value of 8.0 to 16.0 is more preferred.

Due to the strong basicity, diffusion of an acid is suppressed, thereby contributing to formation of an excellent pattern shape.

Meanwhile, "pKa" as used herein denotes pKa in an aqueous solution, and indicates that the lower the value is, the stronger the acid strength is, as described in, for example, Chemical Handbook (II) (4th revised edition, 1993, The Chemical Society of Japan edited, Maruzen Company, Limited). Specifically, pKa in an aqueous solution may be practically measured by measuring an acid dissociation constant at 25° C. using an infinitely dilute solution, and may also be obtained by calculating a value based on Hammett substituent constants and known literature values using the following software package 1. All the pKa values described in the present specification denotes values obtained by calculation using the software package.

Software package 1: Advanced Chemistry Development (ACD/Labs) Software V 8.14 for Solaris (1994-2007 ACD/Labs).

In the present invention, log P refers to a logarithm value of the partition coefficient of n-octanol/water, and is an effective parameter which can characterize the hydrophilicity/hydrophobicity for various compounds. The partition coefficient is generally obtained by calculation regardless of experiments, and in the present invention, indicates a value calculated by CS Chem Draw Ultra Ver. 8.0 software package (Crippen's fragmentation method).

Further, log P of the guanidine compound (A) is preferably 10 or less. By setting log P to the value or less, the compound can be contained uniformly in a resist film.

Log P of the guanidine compound (A) is preferably in a range of 2 to 10, more preferably in a range of 3 to 8, and still more preferably in a range of 4 to 8.

Further, it is preferred that the guanidine compound (A) in the present invention does not have a nitrogen atom other than the guanidine structure.

Specific examples of the guanidine compound are shown below, but not limited thereto.

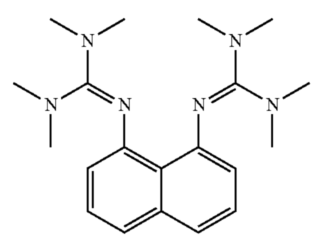

Log P: 4.29

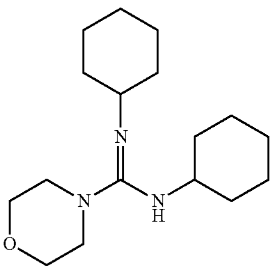
Log P: 3.32
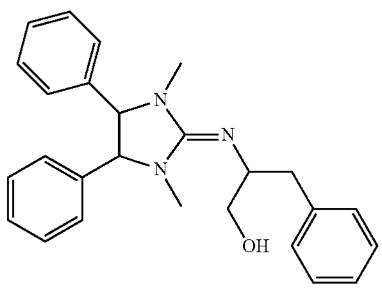
Log P: 5.66
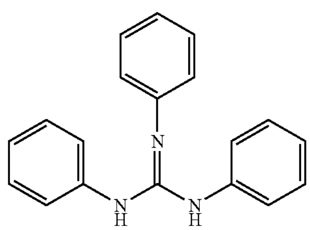
Log P: 5.24
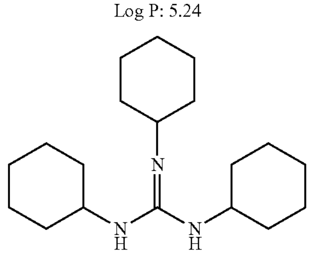
Log P: 4.89
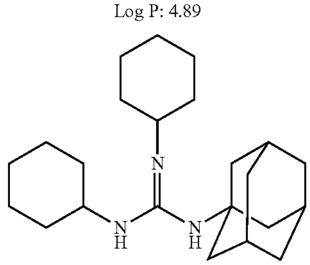
Log P: 5.17
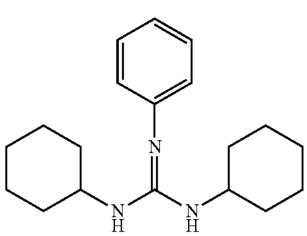
Log P: 5
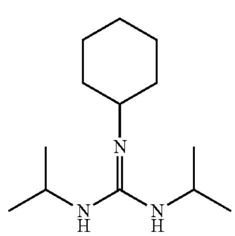
Log P: 3.1
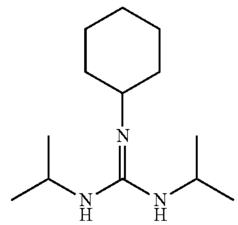
Log P: 3.1
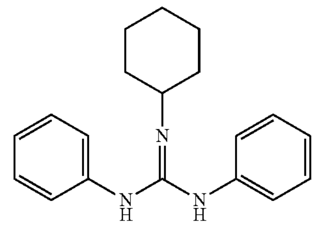
Log P: 5.12
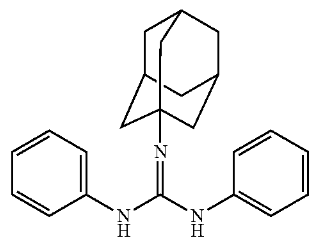
Log P: 5.4
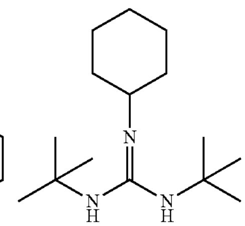
Log P: 3.54
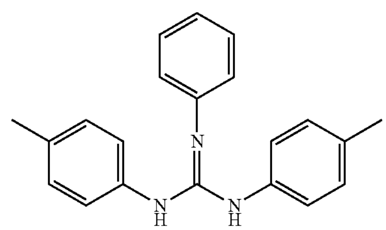
Log P: 6.21
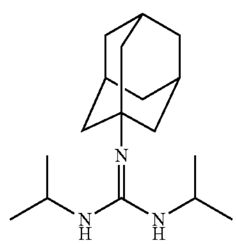
Log P: 3.38
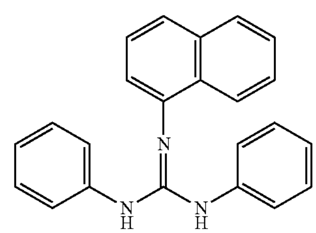
Log P: 6.23
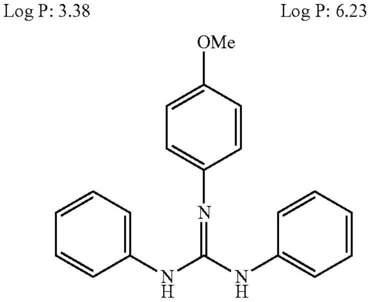
Log P: 5.11
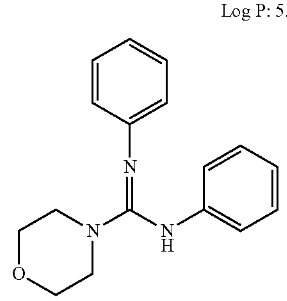
Log P: 3.55
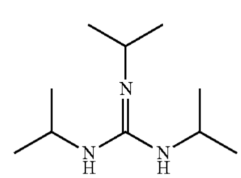
Log P: 2.21

-continued
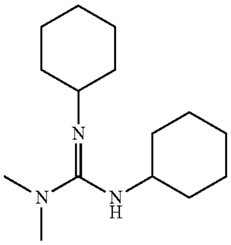
Log P: 3.72
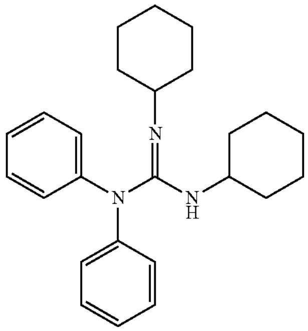
Log P: 7.21
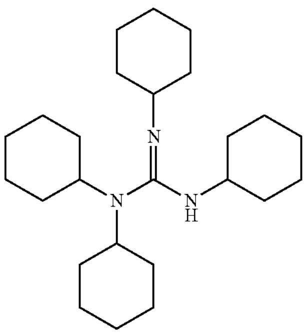
Log P: 6.81
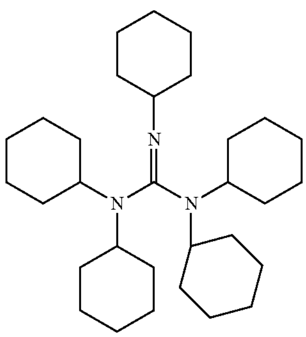
Log P: 8.74
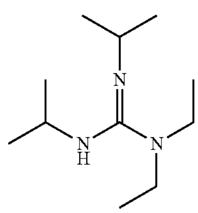
Log P: 2.61
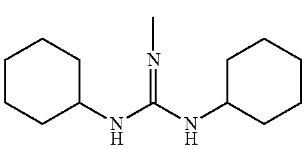
Log P: 3.34
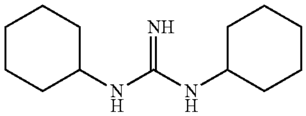
Log P: 3.1
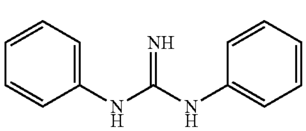
Log P: 3.34
-continued
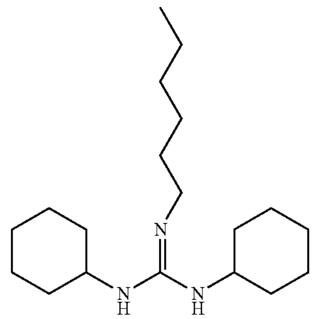
Log P: 5.42
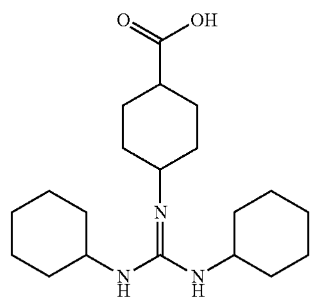
Log P: 4.05
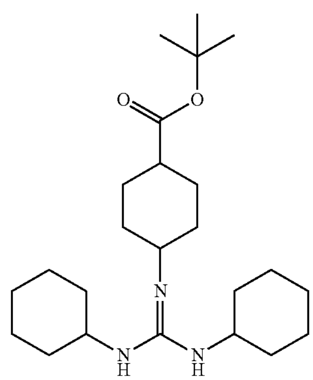
Log P: 5.19
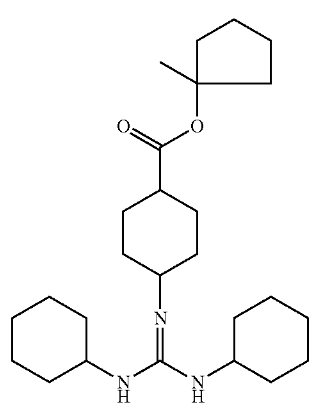
Log P: 5.66

-continued
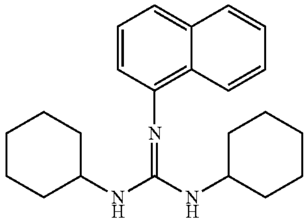
Log P: 6
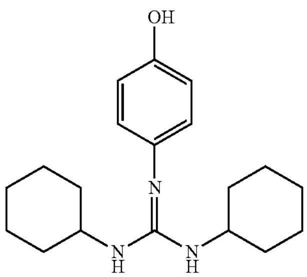
Log P: 4.61
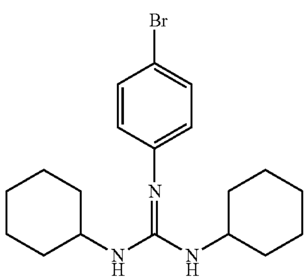
Log P: 5.83
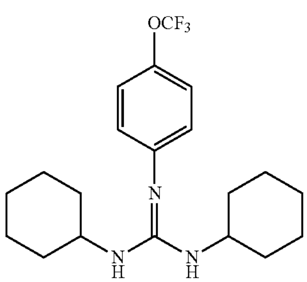
Log P: 5.83
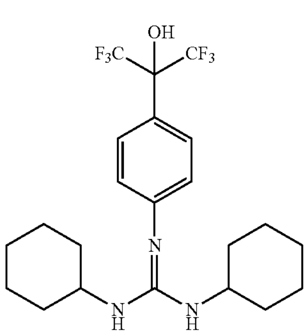
Log P: 6.25
-continued
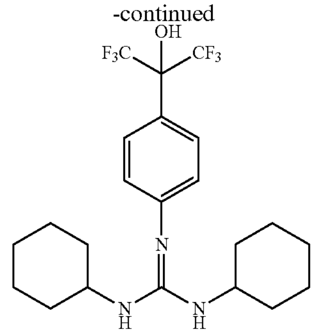
Log P: 6.25
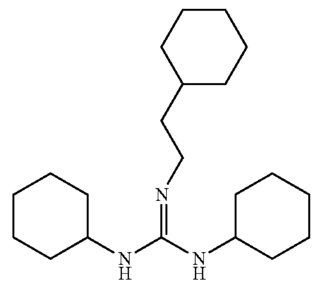
Log P: 5.66
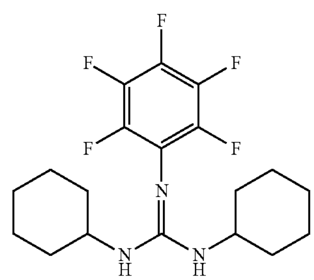
Log P: 5.79
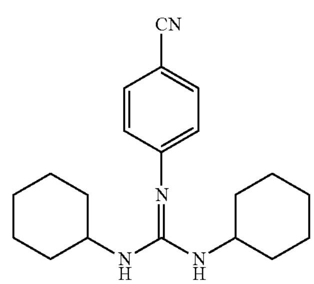
Log P: 5.04
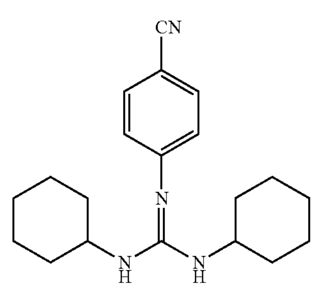
Log P: 5.04

-continued
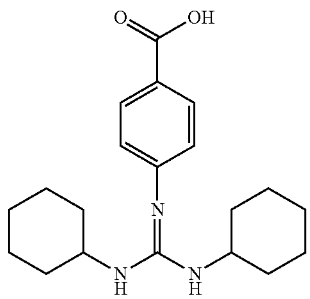
Log P: 4.56
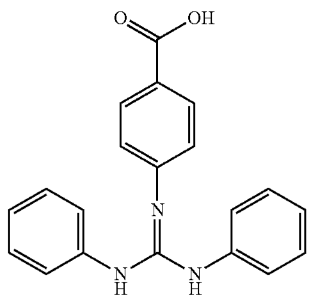
Log P: 4.79
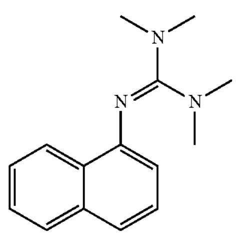
Log P: 3.66
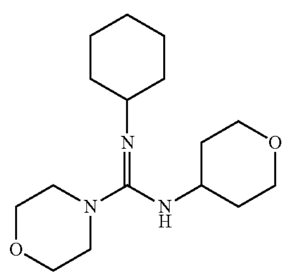
Log P: 1.56
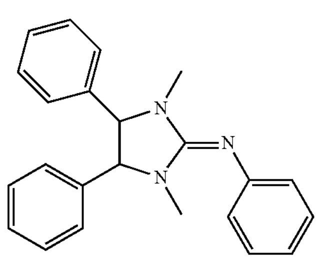
Log P: 5.84
-continued
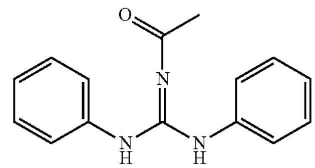
Log P: 3.28
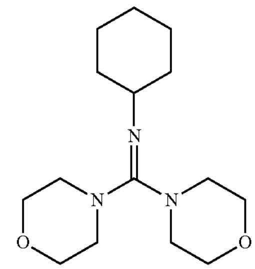
Log P: 1.75
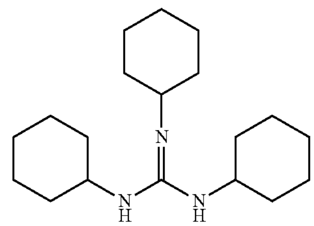
Log P: 4.89
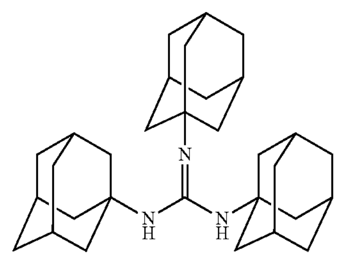
Log P: 5.73
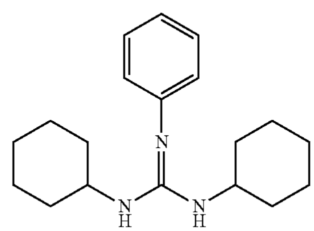
Log P: 5
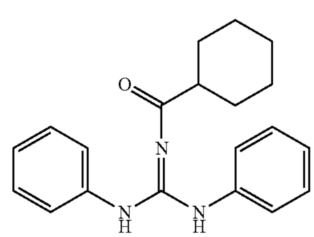
Log P: 5.26
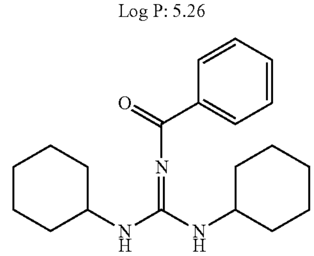
Log P: 4.95

-continued
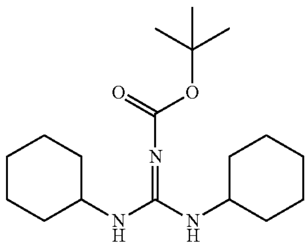
Log P: 4.51
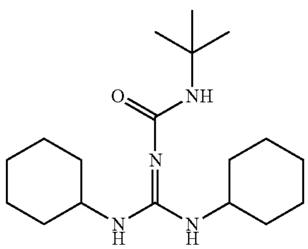
Log P: 3.83
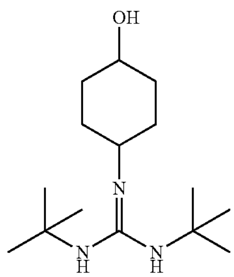
Log P: 2.31
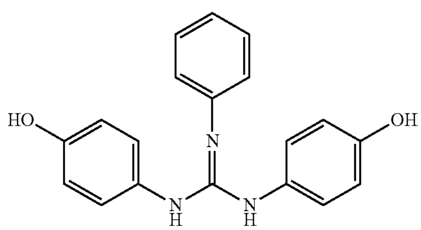
Log P: 4.46
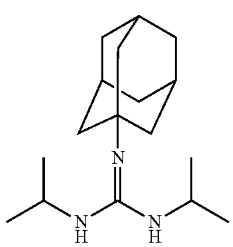
Log P: 3.38
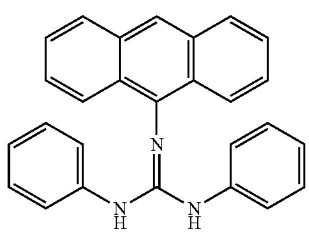
Log P: 7.23
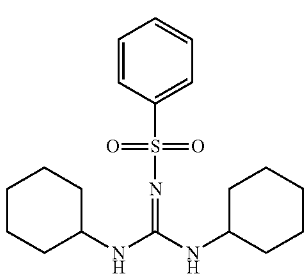
Log P: 4.55
-continued
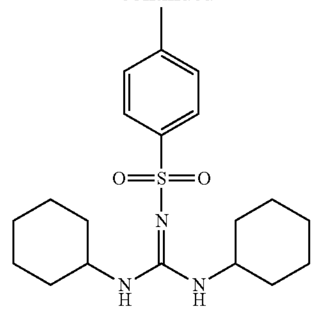
Log P: 5.04
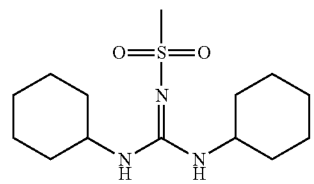
Log P: 2.36
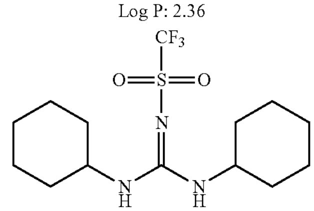
Log P: 4.54
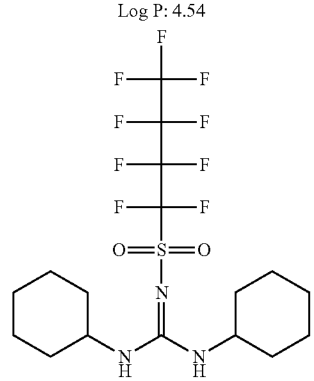
Log P: 6.08
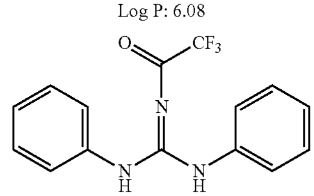
Log P: 4.43
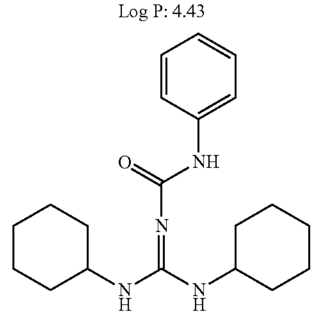
Log P: 4.62

-continued

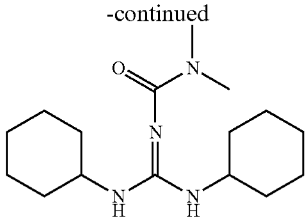

Log P: 3.19

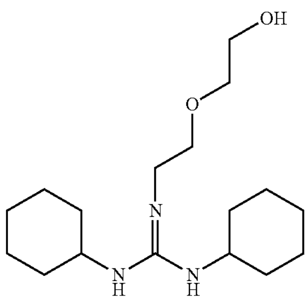

Log P: 2.67

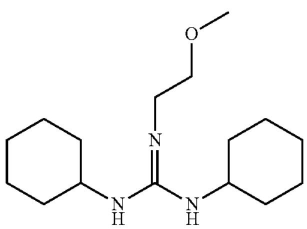

Log P: 3.18

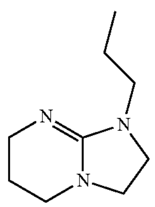

Log P: 1.44

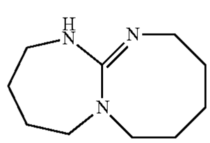

Log P: 1.67

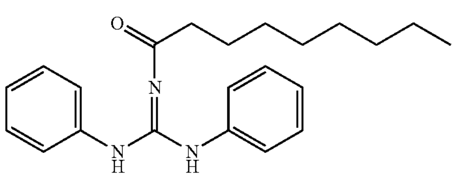

Log P: 6.44

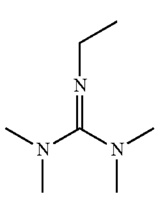

Log P: 1.34

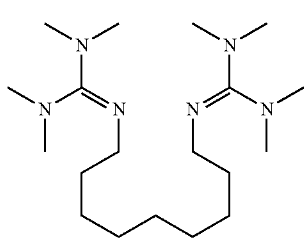

Log P: 4.4

-continued

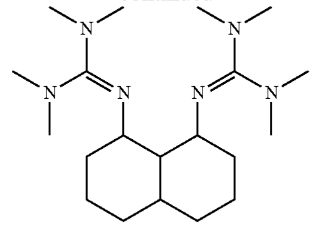

Log P: 3.7

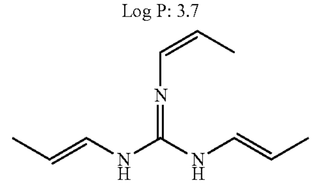

Log P: 3.38

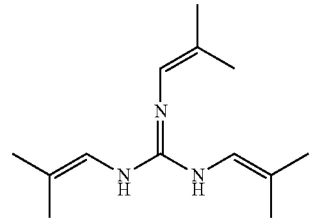

Log P: 3.91

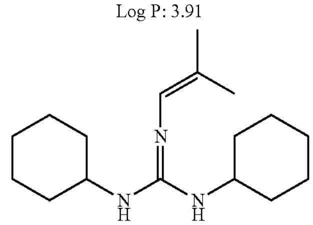

Log P: 4.47

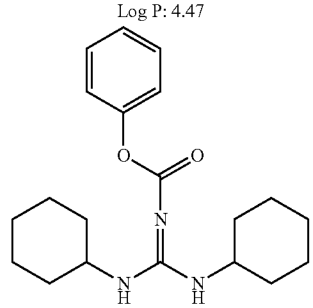

Log P: 5.3

(7) Low Molecular Weight Compound Containing a Nitrogen Atom and Having a Group Capable of Leaving by the Action of an Acid The composition of the present invention may contain a low molecular weight compound containing a nitrogen atom and having a group capable of leaving by the action of an acid (hereinafter, also referred to as a "low molecular weight compound (D)" or "compound (D)"). The low molecular weight compound (D) preferably has basicity after the group capable of leaving by the action of an acid is left.

The group capable of leaving by the action of an acid is, but not particularly limited to, preferably an acetal group, a carbonate group, a carbamate group, a tertiary ester group, a tertiary hydroxyl group or a hemiaminal group, and particularly preferably a carbamate group or a hemiaminal group.

The molecular weight of the low molecular weight compound (D) having a group capable of leaving by the action of an acid is preferably 100 to 1,000, more preferably 100 to 700, and particularly preferably 100 to 500.

The compound (D) is preferably an amine derivative having a group capable of leaving by the action of an acid on its nitrogen atom.

The compound (D) may have a carbamate group having a protecting group on its nitrogen atom. The protecting group constituting the carbamate group may be represented by the following Formula (d-1).

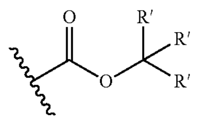

In Formula (d-1),

Each of R' independently represents a hydrogen atom, a straight or branched alkyl group, a cycloalkyl group, an aryl group, an aralkyl group or an alkoxyalkyl group. R' may be bound with each other to form a ring.

R' is preferably a straight or branched alkyl group, a cycloalkyl group or an aryl group, and more preferably a straight or branched alkyl group or a cycloalkyl group.

Particular structures of the group are shown below.

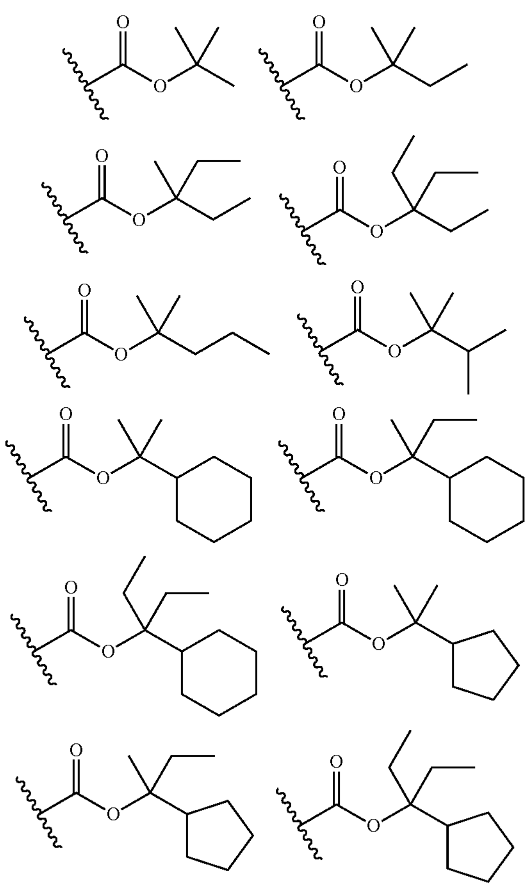

-continued

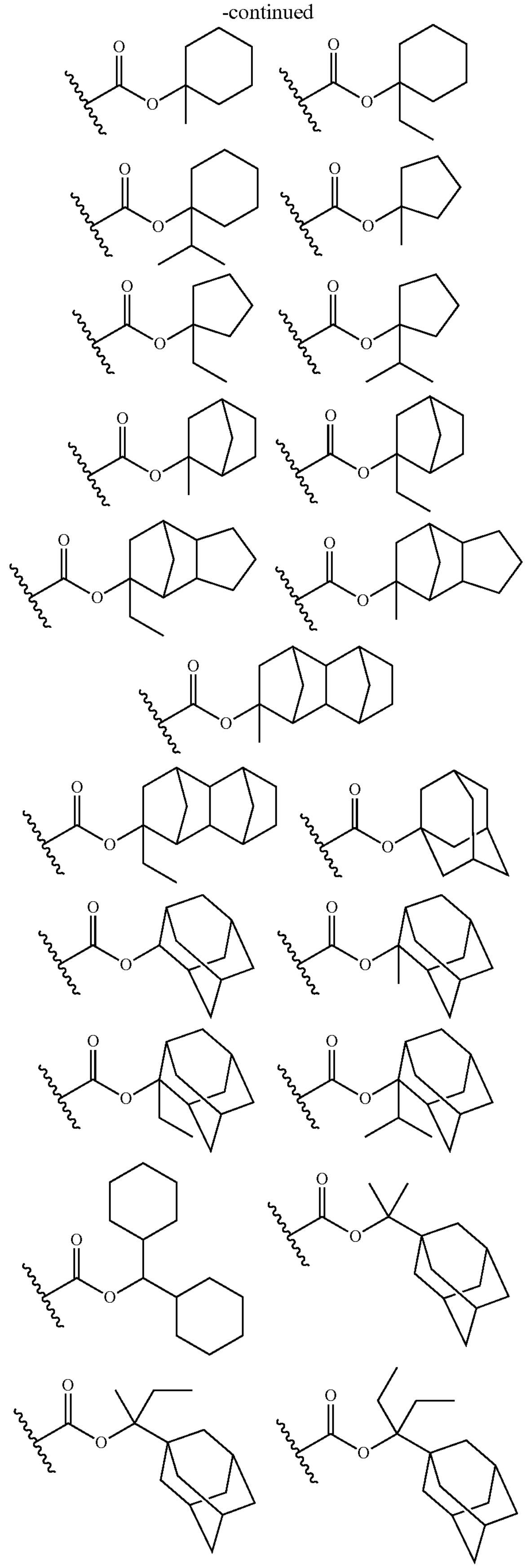

-continued

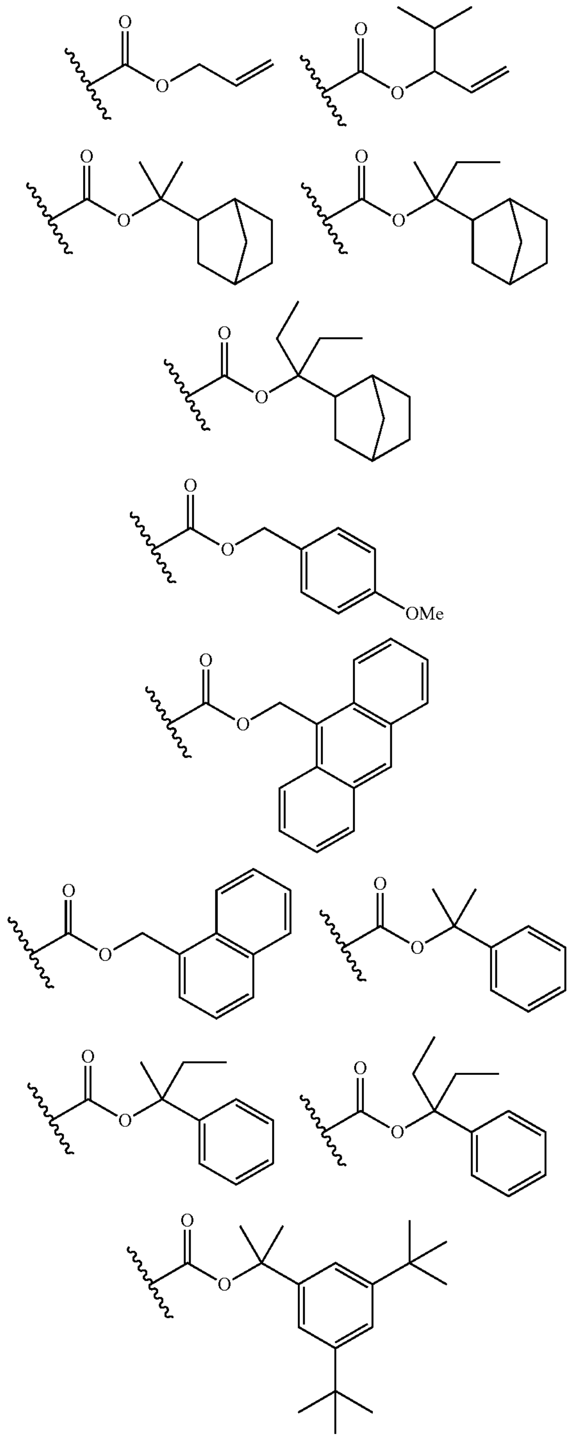

The compound (D) may be constituted by arbitrarily combining the basic compound as described below and the structure represented by Formula (d-1).

The compound (D) particularly preferably has a structure represented by the following Formula (A).

Meanwhile, the compound (D) may correspond to the above-mentioned basic compound as long as the compound is a low molecular compound having a group capable of leaving by the action of an acid.

(A)

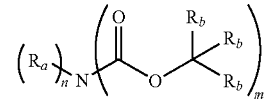

In Formula (A), Ra represents a hydrogen atom, an alkyl group, a cycloalkyl group, an aryl group or an aralkyl group. Further, when n=2, each Ra may be the same as or different from every other Ra, or two of Ra may be bound with each other to form a divalent heterocyclic hydrocarbon group (preferably having 20 or less carbon atoms) or a derivative thereof.

Each Rb independently represents a hydrogen atom, an alkyl group, a cycloalkyl group, an aryl group, an aralkyl group, an alkoxyalkyl group. However, in —C(Rb)(Rb)(Rb), when one or more of Rb's are a hydrogen atom, at least one of the rest of Rb's is a cyclopropyl group, a 1-alkoxyalkyl group or an aryl group.

At least two of Rb's may be bound to form an aliphatic hydrocarbon group, an aromatic hydrocarbon group, a heterocyclic hydrocarbon group or a derivative thereof.

n represents an integer of 0 to 2, m represents an integer of 1 to 3, and n+m=3.

In Formula (A), the alkyl group, the cycloalkyl group, the aryl group and the aralkyl group represented by Ra and Rb may be substituted with a functional group such as a hydroxyl group, a cyano group, amino group, a pyrrolidino group, a piperidino group, a morpholino group and an oxo group, an alkoxy group or a halogen atom. The same is applied to the alkoxyalkyl group represented by Rb.

Examples of the alkyl group, the cycloalkyl group, the aryl group and the aralkyl group of Ra and/or Rb (the alkyl group, the cycloalkyl group, the aryl group and the aralkyl group may be substituted with the above-mentioned functional group, an alkoxy group or a halogen atom) may include:

a group derived from a straight or branched alkane such as methane, ethane, propane, butane, pentane, hexane, heptane, octane, nonane, decane, undecane and dodecane, and a group in which the group derived from an alkane is substituted with one or more kinds of or one or more of cylcoalkyl groups such as a cyclobutyl group, a cyclopentyl group and a cyclohexyl group, a group derived from a cycloalkane such as a cyclobutane, a cyclopentane, a cyclohexane, cycloheptane, cyclooctane, a norbornane, an adamantane and a noradamantane, and a group in which the group derived from an cycloalkane is substituted with one or more kinds of or one or more of straight or branched alkyl groups such as a methyl group, an ethyl group, a n-propyl group, an i-propyl group, a n-butyl group, a 2-methylpropyl group, a 1-methylpropyl group and a t-butyl group, a group derived from an aromatic compound such as benzene, naphthalene and anthracene, and a group in which the group derived from an aromatic compound is substituted with one or more kinds of or one or more of straight or branched alkyl groups such as a methyl group, an ethyl group, a n-propyl group, an i-propyl group, a n-butyl group, a 2-methylpropyl group, a 1-methylpropyl group and a t-butyl group, a group derived from a heterocyclic compound such as pyrrolidine, piperidine, morpholine, tetrahydrofuran, tetrahydropyran, indole, indoline, quinoline, perhydroquinoline, indazole and benzimidazole, and a group in which the group derived from a heterocyclic compound is substituted with one or more kinds of or one or more of groups derived from a straight or branched alkyl group or an aromatic compound, a group in which the group derived from a straight or branched alkane the group derived from a cycloalkane are substituted with one or more kinds or one or more of the group derived from an aromatic compound such as a phenyl group, a naphthyl group and an anthracenyl group, or a group in which the above-mentioned substituent is substituted with a functional group such as a hydroxyl group, a cyano group, an amino group, a pyrrolidino group, a piperidino group, a morpholino group and an oxo group.

Further, examples of the heterocyclic hydrocarbon group (preferably having 1 to 20 carbon atoms) which Ra's are bound with each other to form, or a derivative thereof may include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group in which the group derived from a heterocyclic compound is substituted with one or more kinds of or one or more of the groups derived from a straight or branched alkane, the groups derived from a cycloalkane, the groups derived from an aromatic compounds, the groups derived from a heterocyclic compounds or the functional groups such as a hydroxyl group, a cyano group, amino group, pyrrolidino group, a piperidino group, a morpholino group and an oxo group.

Specific examples of the particularly preferred compounds (D) in the present inventions are shown, but the present invention is not limited thereto.

(D-1)

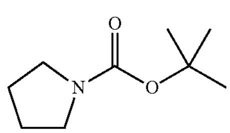

(D-2)

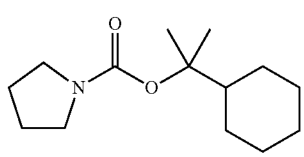

(D-3)

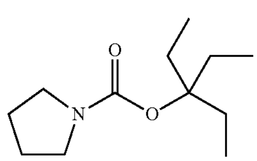

(D-4)

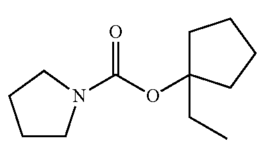

(D-5)

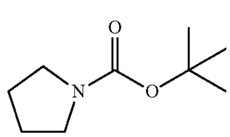

-continued (D-6)

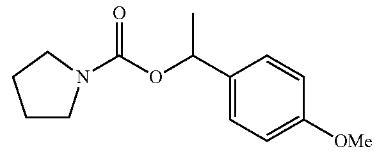

(D-7)

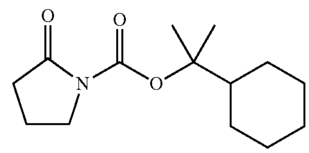

(D-8)

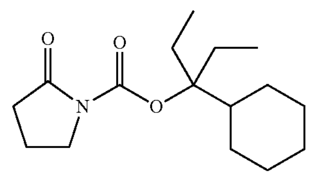

(D-9)

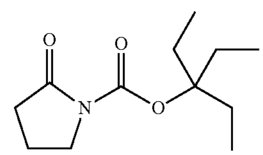

(D-10)

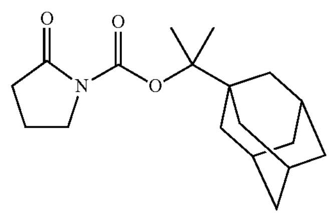

(D-11)

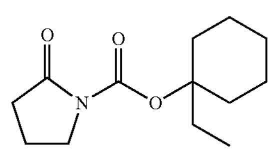

(D-12)

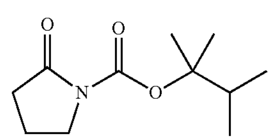

(D-13)

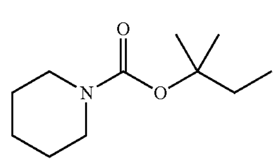

(D-14)

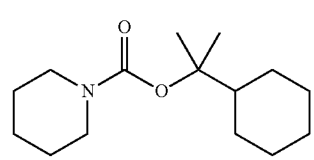

(D-15)
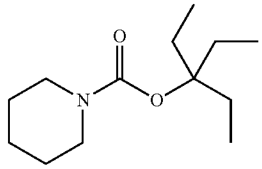
(D-16)
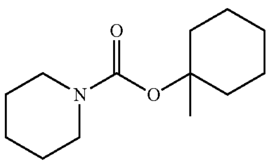
(D-17)
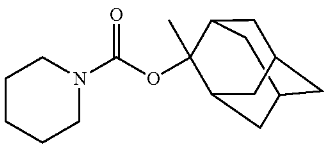
(D-18)
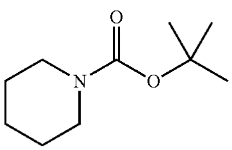
(D-19)
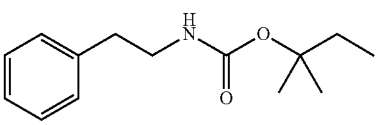
(D-20)
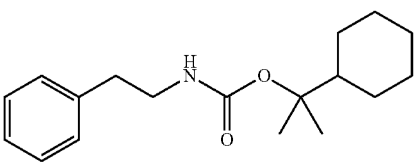
(D-21)
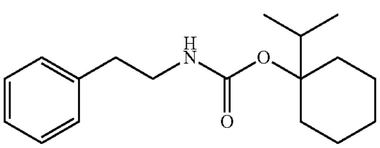
(D-22)
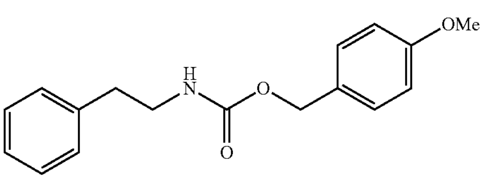
(D-23)
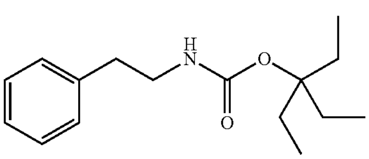
(D-24)
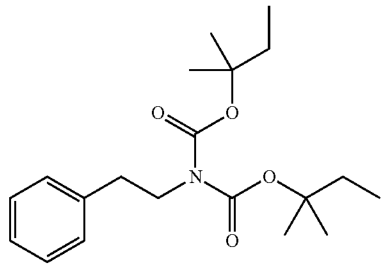
(D-25)
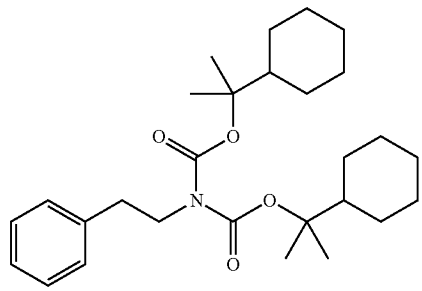
(D-26)
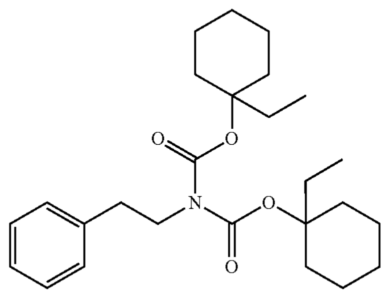
(D-27)
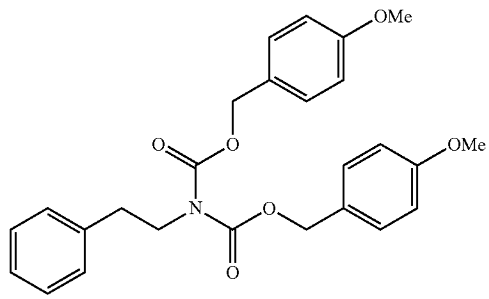
(D-28)
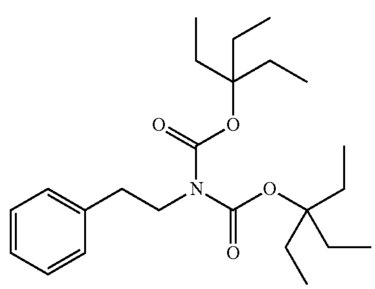

-continued
(D-29)
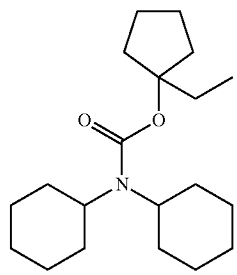
(D-30)
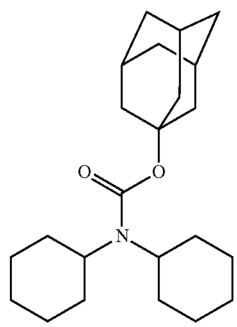
(D-31)
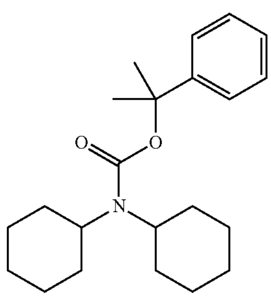
(D-32)
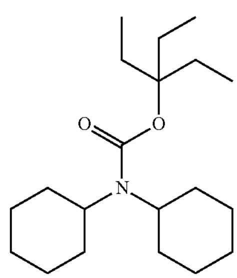
(D-33)
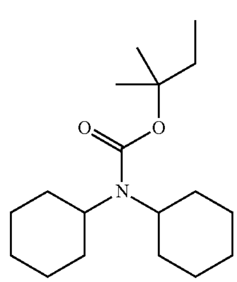
-continued
(D-34)
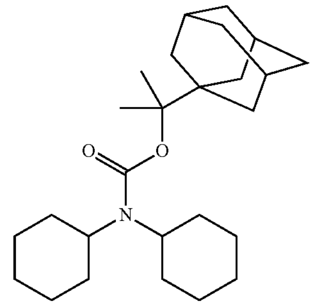
(D-35)
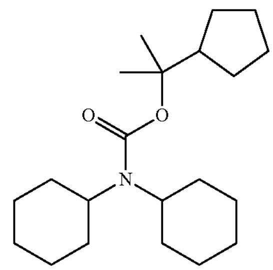
(D-36)
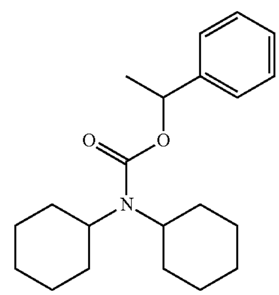
(D-37)
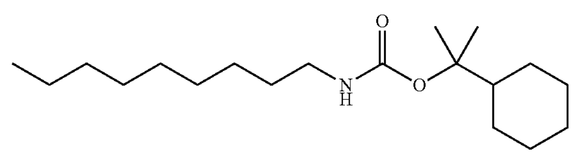
(D-38)
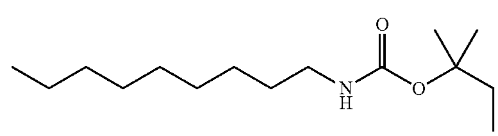
(D-39)
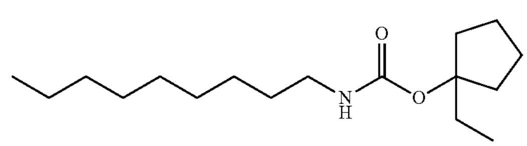
(D-40)
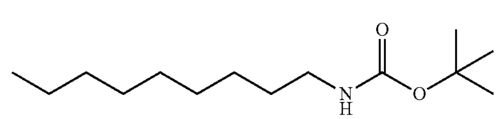

-continued
(D-41)
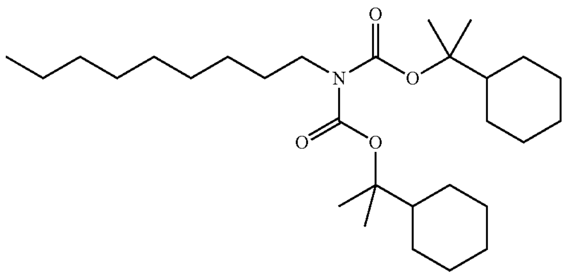
(D-42)
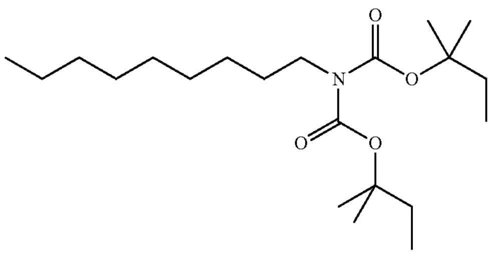
(D-43)
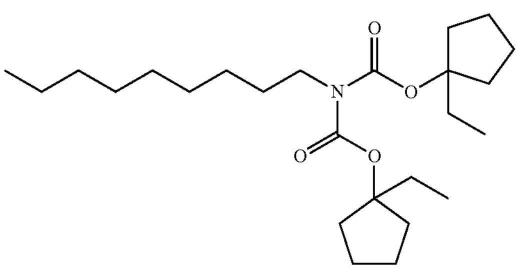
(D-44)
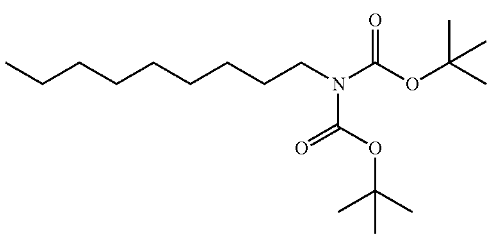
(D-45)
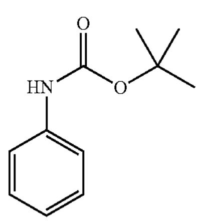
(D-46)
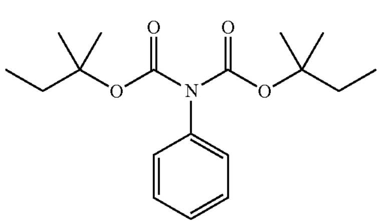
-continued
(D-47)
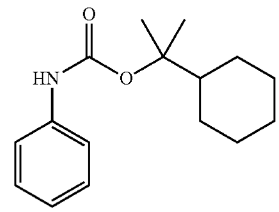
(D-48)
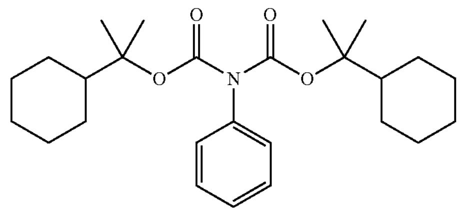
(D-49)
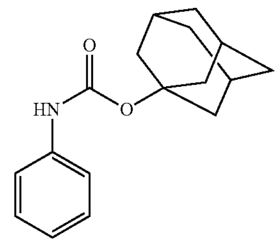
(D-50)
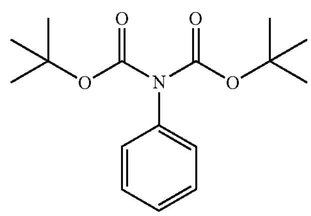
(D-51)
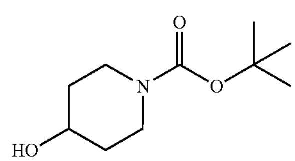
(D-52)
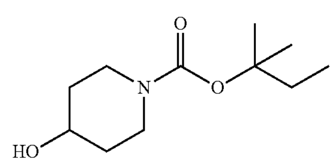
(D-53)
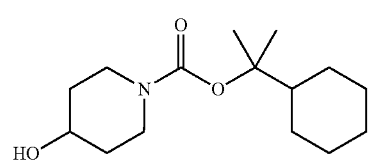
(D-54)
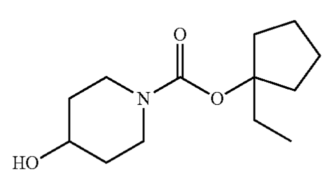

-continued (D-55)

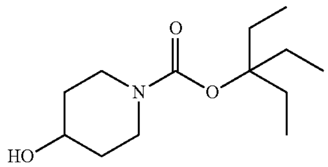

(D-56)

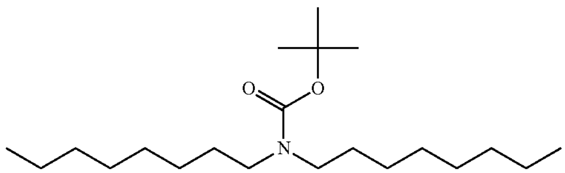

(D-57)

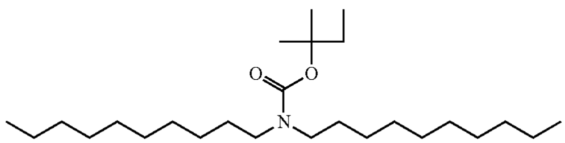

(D-58)

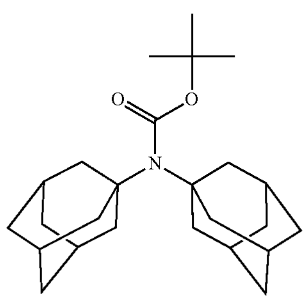

(D-59)

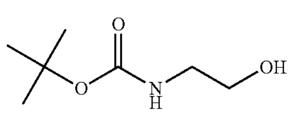

(D-60)

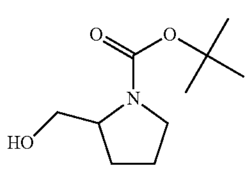

(D-61)

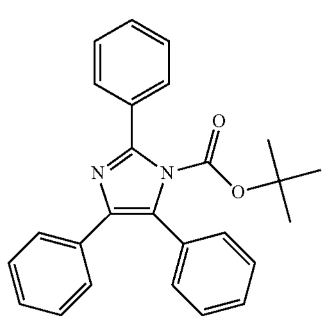

-continued (D-62)

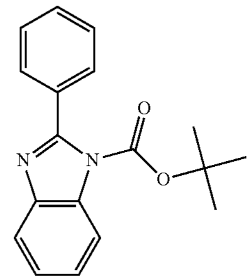

(D-63)

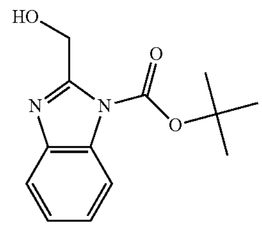

(D-64)

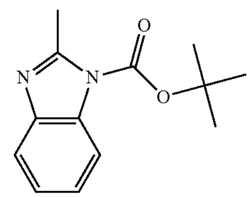

(D-65)

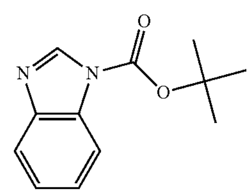

The compound represented by Formula (A) may be synthesized based on Japanese Patent Application Laid-Open No. 2007-298569, Japanese Patent Application Laid-Open No. 2009-199021 and the like.

In the present invention, the low molecular weight compound (D) may be used either alone or in combination of two or more thereof.

Although the composition of the present invention may or may not contain the low molecular compound (D), when containing, the content of the compound (D) is usually 0.001% by mass to 20% by mass, preferably 0.001% by mass to 10% by mass, and more preferably 0.01% by mass to 5% by mass based on the total solid of the composition adding up the above-mentioned basic compound.

Further, in the case where the composition of the present invention contains an acid generator, the ratio of the acid generator and the compound (D) used in the composition is preferably Acid generator/[Compound (D)+The following basic compound] (molar ratio)=2.5 to 300. That is, the ratio is preferably the molar ratio is preferably 2.5 or more from the viewpoint of the sensitivity and the resolution, and is preferably 300 or less from the viewpoint of suppressing the reduction in resolution caused by thickening of the resist pattern over time after exposure until heat treatment. Acid generator/[Compound (D)+The following basic compound] (molar ratio) is more preferably 5.0 to 200, and still more preferably 7.0 to 150.

Besides, the compounds which may be used in the composition according to the present invention may include compounds synthesized in Examples of Japanese Patent Application Laid-Open No. 2002-363146 and compounds described in paragraph 0108 of Japanese Patent Application Laid-Open No. 2007-298569.

As the basic compound, a photosensitive basic compound may be used. As the photosensitive basic compound, compounds described in, for example, Japanese Patent Publication No. 2003-524799, J. Photopolym. Sci&Tech. Vol. 8, P. 543-553 (1995) and the like may be used.

The molecular weight of the basic compound is usually 100 to 1,500, preferably 150 to 1,300, and more preferably 200 to 1,000.

The basic compound may be used either alone or in combination of two or more thereof.

In the case where the composition according to the present invention contains a basic compound, the content is preferably 0.01% by mass to 8.0% by mass, more preferably 0.1 to 5.0% by mass, and particularly preferably 0.2% by mass to 4.0% by mass based on the total solid of the composition.

The molar ratio of the basic compound to the photo-acid compound is set to preferably 0.01 to 10, more preferably 0.05 to 5, and still more preferably 0.1 to 3. If the molar ratio is set to be excessively high, the sensitivity and/or the resolution may be reduced in some cases. If the molar ratio is set to be excessively low, thinning of patterns is possibly caused between exposure and heating (post-bake). The molar ratio is more preferably 0.05 to 5, and still more preferably 0.1 to 3. Meanwhile, the above-described molar ratio of the photo-acid generator is based on the sum of the repeating unit (B) of the resin and the photo-acid generator which may be further contained in the resin.

[5] Surfactant

The actinic ray-sensitive or radiation-sensitive composition according to the present invention may further contain a surfactant. The surfactant is particularly preferably a fluorine-based and/or silicon-based surfactant.

Examples of the fluorine-based and/or silicon-based surfactant may include Megafac F176 and Megafac R08 manufactured by DAINIPPON INK AND CHEMICALS, INC., PF656 and PF6320 manufactured by OMNOVA Solution Inc., TROYSOL S-366 manufactured by Troy Chemical Corp., Florad FC430 manufactured by Sumitomo 3M Limited and Polysiloxane polymerKP-341 manufactured by Shin-Etsu Chemical Co., Ltd.

Any surfactants other than the fluorine-based and/or silicon-based surfactant may be used. Examples of the surfactants may include non-ionic surfactants such as polyoxyethylene alkyl ethers and polyethylene alkylaryl ethers.

Any other known surfactants may be used as appropriate. Examples of available surfactants may include surfactants described, for example, after paragraph [0237] of U.S. 2008/0248425A1.

The surfactant may be used either alone or in combination of two or more thereof.

In the case where the composition according to the present invention further contains a surfactant, the using amount is set to be preferably 0.0001% by mass to 2% by mass, and more preferably 0.001% by mass to 1% by mass.

[6] Other Additives (Dye)

The actinic ray-sensitive or radiation-sensitive composition according to the present invention may further contain a dye. A suitable dye may be, for example, an oil-based dye and a basic dye. Specific examples thereof may include Oil Yellow #101, Oil Yellow #103, Oil Pink #312, Oil Green BG, Oil Blue BOS, Oil Blue #603, Oil Black BY, Oil Black BS and Oil Black T-505 (all manufactured by Orient Chemical Industries Co., Ltd.) and Crystal Violet (CI 42555), Methyl Violet (CI 42535), Rhodamine B (CI 45170B), Malachite Green (CI-42000) and Methylene Blue (CI 52015).

(Photo-Base Generator)

The actinic ray-sensitive or radiation-sensitive composition according to the present invention may further contain a photo-base generator. If a photo-base generator is contained, it is possible to form a better pattern.

Examples of the photo-base generator may include compounds described in Japanese Patent Application Laid-Open Nos. H4-151156, H4-162040, H5-197148, H5-5995, H6-194834, H8-146608 and H0-83079, and European Patent No. 622682.

Specific examples of the photo-base generator may include 2-nitrobenzyl carbamate, 2,5-dinitrobenzylcyclohexyl carbamate, N-cyclohexyl-4-methylphenyl sulfonamide and 1,1-dimethyl-2-phenylethyl-N-isopropyl carbamate.

(Antioxidant)

The actinic ray-sensitive or radiation-sensitive composition according to the present invention may further contain an antioxidant. If an antioxidant is contained, it is possible to suppress the oxidation of organic materials in the presence of oxygen.

Examples of the antioxidant may include a phenol-based antioxidant, an antioxidant composed of an organic acid derivative, a sulfur-containing antioxidant, a phosphorous-based antioxidant, an amine-based antioxidant, an antioxidant composed of an amine-aldehyde condensate and an antioxidant composed of an amine-ketone condensate. Among those antioxidants, a phenol-based antioxidant and an antioxidant composed of an organic acid derivative are particularly preferably used. By doing this, it is possible to express the function as an antioxidant without deteriorating the performances of the composition.

As a phenol-based antioxidant, for example, substituted phenols or bis-, tris- or polyphenols may be used.

Examples of the substituted phenols may include 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-bis-tert-butyl-α-dimethylamino-p-cresol, 6-(4-hydroxy-3,5-di-tert-butylanilino)2,4-bis.octyl-thio-1,3,5-triazine, n-octadecyl-3-(4'-hydroxy-3',5'-di-tert butyl.phenyl)propionate, octylated phenol, aralkyl-substituted phenols, alkylated-p-cresol and hindered phenol.

Examples of the bis-, tris- or polyphenols may include 4,4'-dihydroxydiphenyl, methylenebis(dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-alphamethyl-benzyl-p-cresol), methylene-crosslinked polyhydric alkylphenol, 4,4'-butylidenebis(3-methyl-6-tert-butylphenol), 1,1-bis-(4-hydroxyphenyl)-a cyclohexane, 2,2'-dihydroxy-3,3'-di-(α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl) butane and tetrakis-[methylene-3-(3',5'-di-tert-butyl-4'-hydroxyphenyl)propionate]methane.

The antioxidant is preferably 2,6-di-t-butyl-4-methylphenol, 4-hydroxymethyl-2,6-di-t-butylphenol, 2,2'-methylenebis(4-methyl-6-t-butylphenol), butylhydroxyanisole, t-butylhydroquinone, 2,4,5-trihydroxybutyrophenone, nordihydroguaiaretic acid, propyl gallate, octyl gallate, lauryl gallate and isopropyl citrate. Among them, 2,6-di-t-butyl-4-methylphenol, 4-hydroxymethyl-2,6-di-t-butylphenol, butylhydroxyanisole or t-butylhydroquinone is more preferred, and 2,6-di-t-butyl-4-methylphenol or 4-hydroxymethyl-2,6-di-t-butylphenol is still more preferred.

The antioxidant may be used either alone or in combination of two or more thereof.

In the case where the antioxidant is contained in the present invention, the adding amount is set to be preferably 1 ppm or more, more preferably 5 ppm or more, still more preferably 10 ppm or more, even still more preferably 50 ppm or more, particularly preferably 100 ppm or more, and most preferably 100 to 1,000 ppm.

[7] Solvent

The actinic ray-sensitive or radiation-sensitive composition according to the present invention may further contain a solvent. As for the solvent, an organic solvent is traditionally used. Examples of the organic solvent may include alkylene glycol monoalkyl ether carboxylate, alkylene glycol monoalkyl ether, alkyl lactate ester, alkyl alkoxypropionate, cyclic lactone (preferably having 4 to 10 carbon atoms), a monoketone compound (preferably having 4 to 10 carbon atoms) which may contain a ring, alkylene carbonate, alkyl alkoxyacetate and alkyl pyruvate.

Examples of alkylene glycol monoalkyl ether carboxylate may include propylene glycol monomethyl ether acetate (PGMEA; another name: 1-methoxy-2acetoxylpropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Examples of alkylene glycol monoalkyl ether may include propylene glycol monomethyl ether (PGME; another name: 1-methoxy-2-propanol), propylene glycol monoethyl ether, propylene glycol monopropyl ether, propylene glycol monobutyl ether, ethylene glycol monomethyl ether and ethylene glycol monoethyl ether.

Examples of alkyl lactate ester may include methyl lactate, ethyl lactate, propyl lactate and butyl lactate.

Examples of alkyl alkoxypropionate may include ethyl 3-ethoxypropionate, methyl 3-methoxypropionate, methyl 3-ethoxypropionate and ethyl 3-methoxypropionate.

Examples of cyclic lactone may include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Examples of the monoketone compound which may contain a ring may include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Examples of alkylene carbonate may include propylene carbonate, vinylene carbonate, ethylene carbonate and butylene carbonate.

Examples of alkyl alkoxyacetate may include 2-methoxyethyl acetate, 2-ethoxyethyl acetate, 2-(2-ethoxyethoxy)ethyl acetate, 3-methoxy-3methylbutyl acetate and 1-methoxy-2-propyl acetate.

Examples of alkyl pyruvate may include methyl pyruvate, ethyl pyruvate and propyl pyruvate.

It is preferred to use a solvent whose boiling point is 130° C. or higher at room temperature and atmospheric pressure. Specific examples thereof may include cyclopentanone, γ-butyrolactone, cyclohexanone, ethyl lactate, ethylene glycol monoethyl ether acetate, PGMEA, ethyl 3-ethoxypropionate, ethyl pyruvate, 2-ethoxyethyl pyruvate, 2-(2-ethoxyethoxy) ethyl acetate and propylene carbonate.

The solvent may be used either alone or in a mixture of two or more thereof. In the case of the latter, it is preferred to use a mixed solvent of a solvent containing a hydroxyl group and a solvent containing no hydroxyl group.

Examples of the solvent containing a hydroxyl group may include ethylene glycol, ethylene glycol monomethyl ether, ethylene glycol monoethyl ether, propylene glycol, PGME, propylene glycol monoethyl ether and ethyl lactate. Among them, PGME and ethyl lactate are particularly preferred.

Examples of the solvent containing no hydroxyl group may include PGMEA, ethyl ethoxypropionate, 2-heptanone, γ-butyrolactone, cyclohexanone, butyl acetate, N-methylpyrrolidone, N,N-dimethylacetamide, dimethylsulfoxide and the like, and among them, propylene glycol monomethyl ether acetate, ethyl ethoxypropionate, 2-heptanone, γ-butyrolactone, cyclohexanone and butyl acetate. Among them, PGMEA, ethyl ethoxypropionate and 2-heptanone are particularly preferred.

In the case of using the mixed solvent of the solvent containing a hydroxyl group and the solvent containing no hydroxyl group a hydroxyl group, the mass ratio is set to be preferably 1/99 to 99/1, more preferably 10/90 to 90/10, still more preferably 20/80 to 60/40.

Meanwhile, when using a mixed solvent in which the solvent containing a hydroxyl group is contained in an amount of 50% by mass or more, especially excellent coating uniformity may be achieved. Further, the solvent is particularly preferably a mixed solvent of PGMEA and one or more kinds of other solvents.

The content of the solvent in the actinic ray-sensitive or radiation-sensitive composition of the present invention may be adjusted appropriately depending on the desired film thickness and the like, but the solvent is generally prepared such that the total solid concentration of the composition is 0.5% by mass to 30% by mass, preferably 1.0% by mass to 20% by mass, and more preferably 1.5% by mass to 10% by mass.

[8] Pattern Forming Method

The present invention relates to an actinic ray-sensitive or radiation-sensitive film (hereinafter, also referred to as a resist film) formed by using the composition of the present invention as described above. Further, the pattern forming method of the present invention includes exposing and developing the actinic ray-sensitive or radiation-sensitive film The composition according to the present invention is conventionally used as follows. That is, the composition according to the present invention is coated on a support such as a substrate to form a film. The thickness of the film is preferably 0.02 μm to 0.1 μm. The method of coating on a substrate is preferably spin coating, and the rotation speed is preferably 1000 rpm to 3000 rpm.

The composition is coated on a substrate for use in manufacturing, for example, precision integrated circuit devices or molds for implant (e.g., silicon/silicon dioxide coating, silicon nitride and chrome-deposited quartz substrate and the like) by a spiner, a coater and the like. Thereafter, the actinic ray-sensitive or radiation-sensitive film can be formed by drying the composition.

The resist film is irradiated with an actinic ray or radiation through a predetermined mask, subjected to preferably bake (heating), developed and rinsed. Accordingly, a good pattern can be obtained.

It is also preferred that the method includes, after film formation, a pre-baking step (PB) before the exposure step.

Further, it is also preferred that the method includes a post-exposure baking step (PEB) after the exposure step but before the development step.

As for the heating temperature, both PB and PEB are performed preferably at 70° C. to 120° C., and more preferably at 80° C. to 110° C.

The heating time is preferably 30 to 300 seconds, more preferably 30 to 180 seconds, and still more preferably 30 to 90 seconds.

The heating may be performed using a means equipped with a typical exposure/developing machine or may be performed using a hot plate or the like.

By means of baking, the reaction in the exposed portion is accelerated, and thus the sensitivity or pattern profile is improved.

Examples of the actinic ray or radiation may include an infrared light, visible light, ultraviolet light, far ultraviolet light, X-ray and an electron beam. More preferably, the actinic ray or radiation has a wavelength of, for example, 250 nm or less, particularly 220 nm or less. Examples of such an actinic ray or radiation may include a KrF excimer laser (248 nm), an ArF excimer laser (193 nm), a $F_2$ excimer laser (157 nm), an X-ray and an electron beam. A preferred acticnic ray or radiation is, for example, a KrF excimer laser, an electron beam, an X-ray and an EUV light. An electron beam, an X-ray and an EUV light are more preferred.

That is, the present invention also relates to an actinic ray-sensitive or radiation-sensitive composition for a KrF excimer laser, an electron beam, an X-ray or an EUV light (more preferably for an electron beam, an X-ray or an EUV light).

Before forming the resist film, an antireflection film may be formed on a substrate in advance.

Examples of the antireflection film may include an inorganic film type such as titanium, titanium dioxide, titanium nitride, chromium oxide, carbon or amorphous silicon, and an organic film type composed of a light absorbent and a polymer material. Further, as an organic antireflection film, a commercially available organic antireflection film such as DUV 30 series or DUV-40 series manufactured by Brewer Science, Inc., and AR-2, AR-3 and AR-5 manufactured by Shipley Company may be used.

In the developing step, a common alkali developer is used.

Examples of the alkali developer may include inorganic alkali such as sodium hydroxide, potassium hydroxide, sodium carbonate, sodium silicate, sodium metasilicate and an ammonia water, an alkaline aqueous solution including primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide or cyclic amines such as pyrrole and piperidine.

Alcohols and/or a surfactant may be added to the alkali developer in a suitable amount.

The concentration of the alkali developer is usually 0.1% by mass to 20% by mass. The pH of the alkali developer is usually 10.0 to 15.0.

A deionized water is used as a rinse liquid, and a surfactant may be added thereto in a suitable amount.

As for the developing method, it is possible to apply, for example, a method of dipping a substrate in a bath filled with a developer for a fixed time (dipping method), a method of raising a developer on a substrate surface sufficiently by the effect of a surface tension and keeping the substrate still for a fixed time, thereby performing development (puddle method), a method of spraying a developer on a substrate surface (spraying method), a method of continuously ejecting a developer on a substrate spinning at a constant speed while scanning a developer ejecting nozzle at a constant rate (dynamic dispense method) and the like.

In the rinsing step, the wafer subjected to development is rinsed by using the above-described rinse liquid. The method of rinsing treatment is not particularly limited, but it is possible to apply, for example, a method of continuously ejecting a rinse liquid on a substrate spinning at a constant speed (spin coating method), a method of dipping a substrate in a bath filled with a rinse liquid for a fixed time (dipping method), a method of spraying a rinse liquid on a substrate surface (spraying method), and the like, and among them, it is preferred that the rinsing treatment is performed by the spin coating method and after the rinsing, the substrate is spun at a rotational speed from 2,000 rpm to 4,000 rpm to remove the rinse liquid from the substrate. It is also preferred that a heating step (post baking) is included after the rinsing step. The developer and rinse liquid remaining between patterns and in the inside of the pattern are removed by the baking. The heating step after the rinsing step is performed at usually 40° C. to 160° C., and preferably 70° C. to 95° C., for usually 10 seconds to 3 minutes, and preferably 30 to 90 seconds.

Further, after the development step or rinsing step, a treatment of removing the developer or rinsing solution adhering on the pattern by a supercritical fluid may be performed.

Meanwhile, The composition according to the present invention may be used to fabricate a mold for implant, and the details may be found in, for example, Japanese Patent No. 4109085, Japanese Patent Application Laid-Open No. 2008-162101 and "Fundamentals of nanoimprint and its technology development.application deployment-technology of nanoimprint substrate and its latest technology deployment, edited by Yoshihiko Hirai, (Frontier Publishing)".

Further, the present invention also relates to a method for manufacturing a electronic device including the above-mentioned pattern forming method of the present invention, and an electronic device manufactured by the method.

The electronic device of the present invention is mounted appropriately on electric electronic instruments (Home appliances, OA.media related apparatuses, optical apparatuses and communication apparatuses and the like).

EXAMPLE 1

REFERENCE SYNTHESIS EXAMPLE 1

Synthesis of Modified Polyhydroxystyrene Compound (PHS-M1)

30.0 g of poly(p-hydroxystyrene) (VP-2500, manufactured by NIPPON SODA CO., LTD.) as a polyhydroxystyrene compound was dissolved in 120 g of acetone, and 2.21 g of 1-chloromethyl naphthalene, 2.07 g of potassium carbonate (2 equivalents with respect to 1-chloromethyl naphthalene), 0.56 g of sodium iodide (0.5 equivalents with respect to 1-chloromethyl naphthalene), followed by refluxing for 4 hours. After approximately half of the aceton was distilled off by an evaporator, 200 mL of ethyl acetate followed by 200 mL of 1 N hydrochloric acid was added while stirring. After being transferred to a separatory funnel to remove the aqueous phase, the organic phase was washed with 200 ml of 1N hydrochloric acid followed by 200 ml of distilled water and the organic phase was concentrated by an evaporator. By the operations, 5% naphthylmethylated poly(p-hydroxystyrene) was obtained.

REFERENCE SYNTHESIS EXAMPLE 2

Synthesis of Meta-Polyhydroxystyrene (MHS)

After a 2 L flask reaction vessel was dried under reduced pressure, 1,500 g of a tetrahydrofuran solution, which has been subjected to distillation and dehydration, was introduced under a nitrogen atmosphere and cooled to −75° C. After that, 13.5 g of s-butyllithium (a cyclohexane solution: 1 N) was introduced, and 235 g of m-t-butoxy styrene, which has been subjected to distillation and dehydration with metal sodium, was added dropwise. At this time, attention was paid such that the inner temperature does not rise to −65° C. or higher. After reacting for 30 minutes, the reaction was quenched by adding 10 g of methanol. The temperature of reaction solution was increased to room temperature, the obtained reaction solution was concentrated under reduced pressure, 800 g of methanol was added followed by stirring, and left standing to remove the upper methanol layer. This operation was repeated three times to remove metal Li. The polymer solution in the lower layer was concentrated, and 840 mL of acetone and 13.3 g of aqueous hydrochloric acid solution (15% by mass) were added and heated to 40° C., subjected to deprotection reaction for 5 hours, and neutralized using 37 g of pyridine 37 g. The reaction solution was concentrated, and then, dissolved in 0.6 L of acetone, washed by precipitation in 7.0 L of water. Then the obtained white solid was filtrated and then dried under reduced pressure at 40° C. to obtain 138 g of white polymer.

SYNTHESIS EXAMPLE 1

Synthesis of Compound 1

(Synthesis of Chloroether Compound)

To a 300 mL side arm flask equipped with a Dean-Stark tube, 10.51 g of isovaleraldehyde, 12.35 g of 2-propanol, 1.41 g of caphorsulfonic acid and 100 mL of heptanes were added and refluxed for 8 hours. After being returned to room temperature, 3.1 g of triethylamine was added and stirred. The organic layer was washed with saturated sodium bicarbonate twice, and with distilled water once. Heptane and unreacted ethanol were removed by heating under reduced pressure to obtain the acetal compound 1 as shown below as an acetal compound.

Subsequently, with respect to the total amount of the obtained Compound 1, 11.47 g of acetyl chloride was added and stirred in a water bath at 45° C. for 4 hours. After being returned to room temperature, unreacted acetyl chloride was removed under reduced pressure to obtain a liquid containing the compound Cl-1 as shown below as chloroether compound.

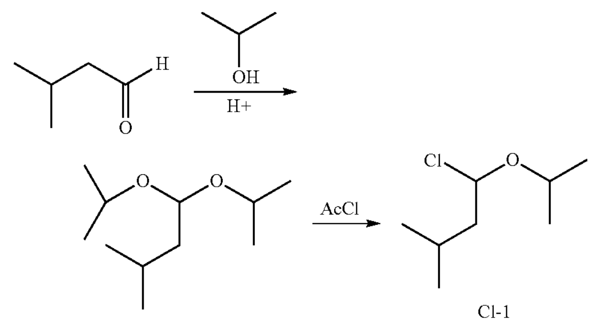

Cl-1

Synthesis of Resin (P-1)

10.0 g of poly(p-hydroxystyrene) (VP-2500, manufactured by NIPPON SODA Co., Ltd.) as a polyhydroxystyrene compound was dissolved in 50 g of tetrahydrofuran (THF), 8.85 g of triethylamine was added and stirred in an ice-water bath. 5.01 g of the compound Cl-1 obtained above was added dropwise to the reaction solution and stirred for 4 hours. The protection rate was 39.2 mol % as determined by $^{1}$H-NMR by taking the reaction solution in a small amount. The reaction was quenched by adding distilled water. THF was distilled off under reduced pressure, and the reactant was dissolved in ethyl acetate. The obtained organic layer was washed with distilled water 5 times, and then, the organic layer was added dropwise to 1.5 L of hexane. The obtained precipitate was separated by filtration, washed with a small amount of hexane, and then, dissolved in 35 g of propylene glycol monomethyl ether acetate (PGMEA). A low boiling point solvent was removed from the obtained solution by an evaporator to obtain 48.7 g of a PGMEA solution of the resin (P-1)' (28.1% by mass).

13.7 g of the obtained resin (P-1)' 13.7 g was dissolved in 50 g of tetrahydrofuran (THF), 8.85 g of triethylamine was added and stirred in an ice-water bath. To the reaction solution, Cl-2 obtained in the same manner as in the synthesis of Cl-1 was added dropwise and stirred for 4 hours. The total protection rate was 51.2 mol % as determined by $^{1}$H-NMR by taking the reaction solution in a small amount. The reaction was quenched by adding distilled water. THF was distilled off under reduced pressure, and the reactant was dissolved in ethyl acetate. The obtained organic layer was washed with distilled water 5 times, and then, the organic layer was added dropwise to 1.5 L of hexane. The obtained precipitate was separated by filtration, washed with a small amount of hexane, and then, dissolved in 35 g of propylene glycol monomethyl ether acetate (PGMEA). A low boiling point solvent was removed from the obtained solution by an evaporator to obtain 48.7 g of a PGMEA solution of the resin (P-1) (28.1% by mass).

Cl-2

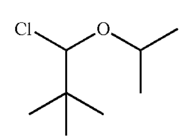

SYNTHESIS EXAMPLES 2 to 22, 25 and 26

Synthesis of Resins (P-2) to (P-22), (P-25) and (P-26)

In accordance with the method described in Synthesis Example 1, the resins (P-2) to (P-22), (P-25) and (P-26) were synthesized. Meanwhile, P-5 was synthesized using PHS-M1, and P-15 was synthesized using MHS.

SYNTHESIS EXAMPLE 23

Synthesis of Resin (P-23)

13.7 g of the resin (Pi-23) synthesized by a method in accordance with Synthesis Example 1 was dissolved in 40 g of N,N-dimethylformamide (DMF), and 1.36 g of pyridine, 2.40 g of 2-sulfobenzoic anhydride (hereinafter, referred to as SN-1 in some cases) as a sulfonating agent and 122 mg of N,N-dimethylaminopyridine was added and stirred at room temperature for 5 hours. The reaction solution was transferred to a separatory funnel containing 100 mL of ethyl acetate, the organic layer was washed with 100 mL of saturated saline 5 times, and the organic layer was concentrated by an evaporator to remove ethyl acetate.

Pi-23

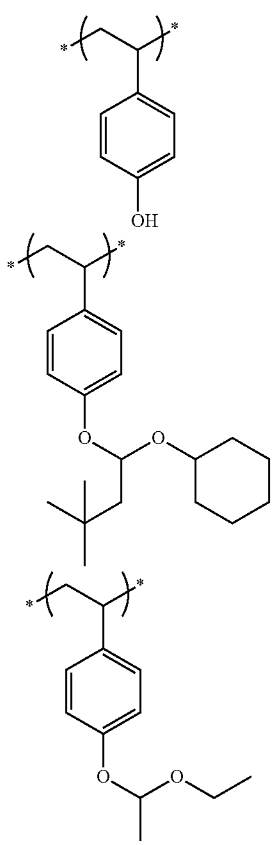

Composition ratio 60/20/20
Mw 7500
PDI 1.10

The obtained polymer was dissolved in 30 mL of tetrahydrofuran (THF) and 10 mL of methanol, and 4.32 g of triphenylsulfonium bromide (hereinafter, referred to as PG-1 in some cases) as a PAG precursor was added and stirred at room temperature for 3 hours. After the reaction solution was concentrated by an evaporator, and then, dissolved in 100 mL of ethyl acetate, the organic layer was washed with 100 mL of distilled water 5 times. The organic layer was concentrated, dissolved in 50 mL of acetone, and then, added dropwise to 700 mL of a mixed solution of distilled water:methanol (15:1 volume ratio). The solid obtained by removing the supernatant liquid was dissolved in 50 mL of ethyl acetate, and added dropwise to 700 mL of hexane. The precipitate obtained by removing the supernatant liquid was dissolved in 32 g of PGMEA. A low boiling point solvent was removed from the obtained solution by an evaporator to obtain 51.3 g of PGMEA solution of the resin (P-32) (37.6% by mass).

SYNTHESIS EXAMPLE 24, 27 and 29

Synthesis of Resins (P-24), (P-27) and (P-29)

In accordance with the method described in Synthesis Example 23, the resins (P-24), (P-27) and (P-29) were synthesized.

SYNTHESIS EXAMPLE 37

Synthesis of Resin (P-37)

11.0 g of 1-methoxy-2-propanol was heated to 70° C. under nitrogen flow. While stirring this liquid, 6.35 g of a mixed solution of 10.0 g of monomer (M-1), 8.1 g of monomer (M-2), 2.7 g of monomer (M-3), 43.96 g of 1-methoxy-2-propanol and 6.35 g of dimethyl 2,2'-azobisisobutyrate [V-601, manufactured by Wako Pure Chemical Industries, Ltd.] was added dropwise over 2 hours. After the completion of the dropwise addition, the liquid was stirred at 70° C. for further 4 hours. After the reaction solution was left to cool, the reaction solution was re-precipitated with a large amount of hexane/ethyl acetate, and dried under vacuum to obtain 17.28 g of the resin (P-37).

M-1

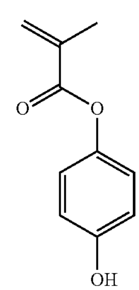

M-2

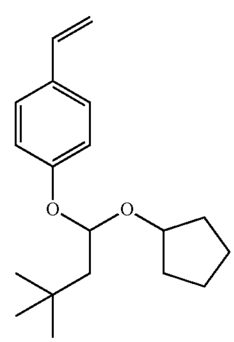

-continued

M-3

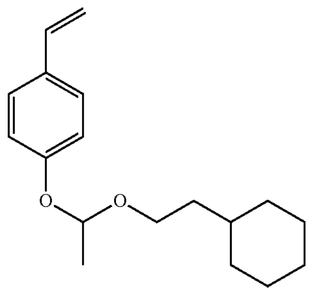

SYNTHESIS EXAMPLE 28, 30 to 36 and 38

Synthesis of Resins (P-28) and (P-30) to (P-36) and (P-38)

In accordance with the method described in Synthesis Example 37, the resins (P-28) and (P-30) to (P-36) and (P-38) were synthesized.

Hereinafter, the polymer structure, weight average molecular weight (Mw) and polydispersity (Mw/Mn) (PDI) of the resin (P-1) to resin (P-38) are shown. Further, the composition ratio of each of the repeating units of the following polymer structure is shown as a molar ratio.

P-1

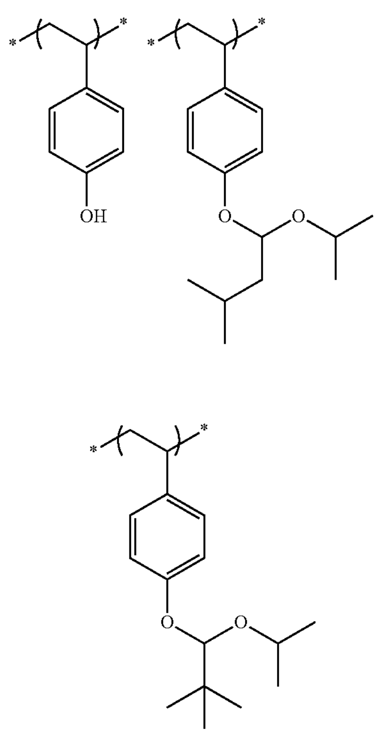

Composition ratio 50/40/10
Mw 5800
PDI 1.21

-continued

P-2

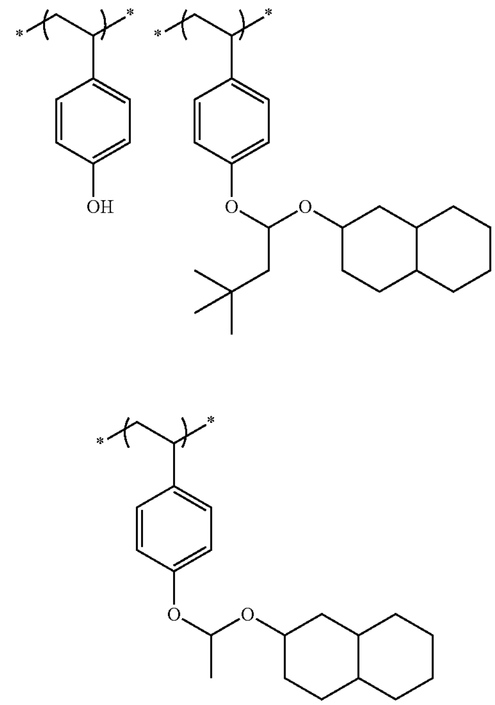

Composition ratio 63/27/10
Mw 6300
PDI 1.25

P-3

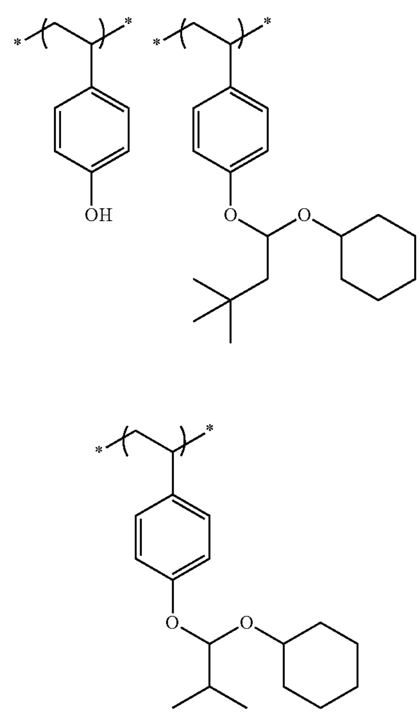

Composition ratio 51/25/24
Mw 5800
PDI 1.23

-continued
P-4
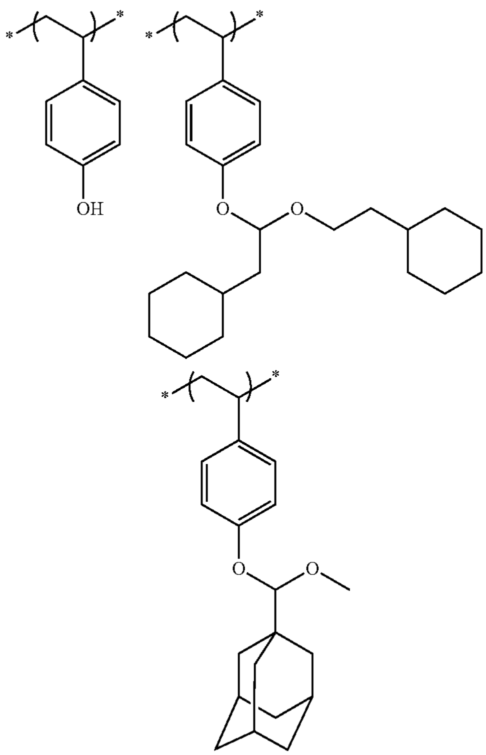
Composition ratio 75/15/10
Mw 6400
PDI 1.19
P-5
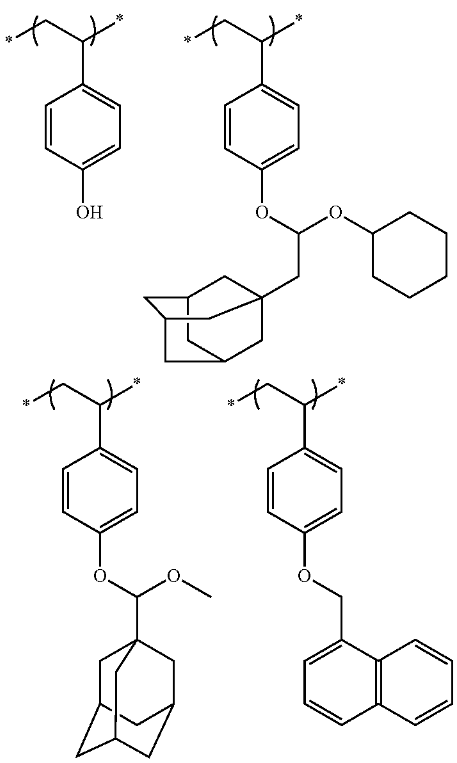
Composition ratio 48/25/22/5
Mw 6300
PDI 1.30
-continued
P-6
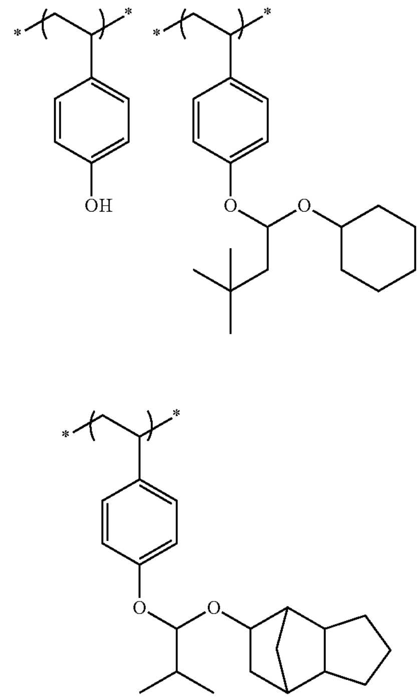
Composition ratio 57/30/13
Mw 6200
PDI 1.25
P-7
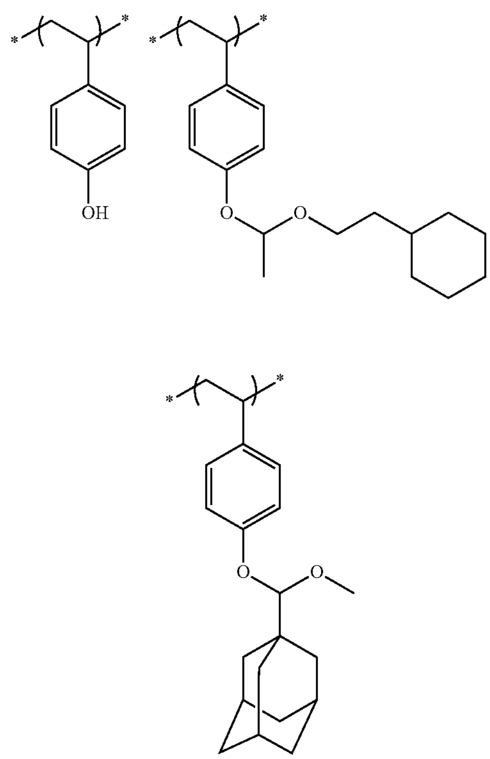
Composition ratio 50/30/20
Mw 6000
PDI 1.18

-continued
P-8
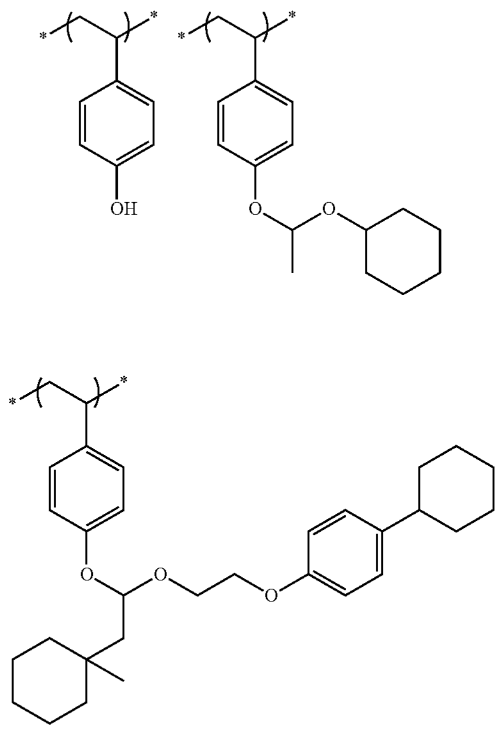
Composition ratio 65/25/10
Mw 6500
PDI 1.15
P-9
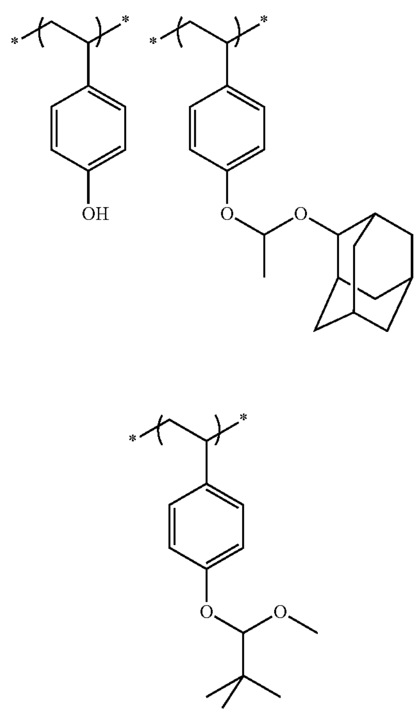
Composition ratio 60/30/10
Mw 5900
PDI 1.25
-continued
P-10
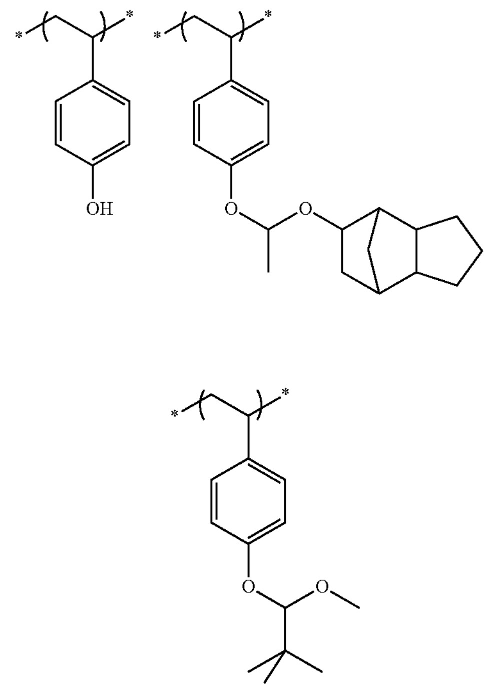
Composition ratio 68/16/16
Mw 6400
PDI 1.30
P-11
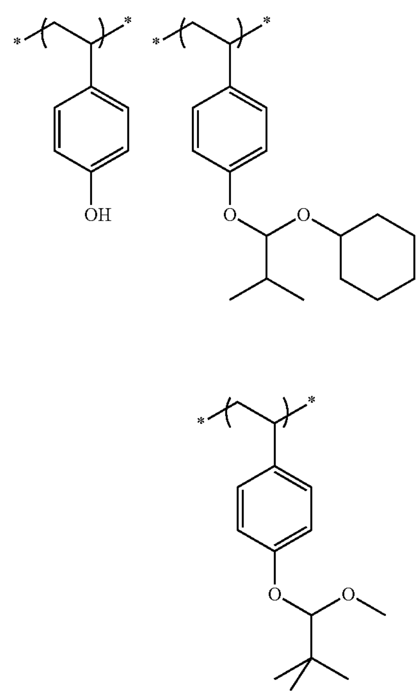
Composition ratio 60/30/10
Mw 5900
PDI 1.25

-continued
P-12
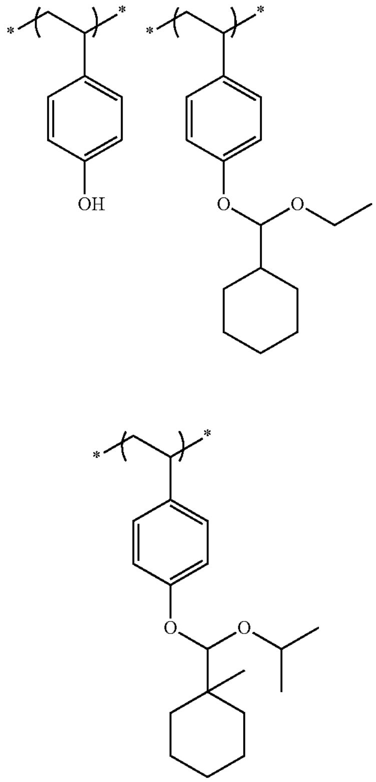
Composition ratio 58/32/10
Mw 6400
PDI 1.30
P-13
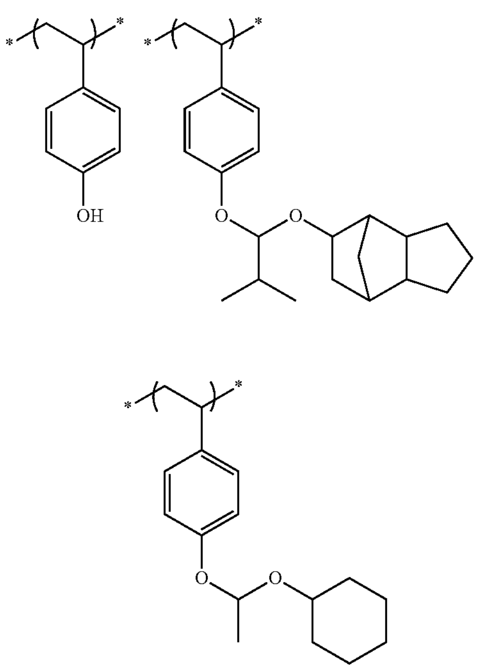
Composition ratio 45/25/30
Mw 5900
PDI 1.25
-continued
P-14
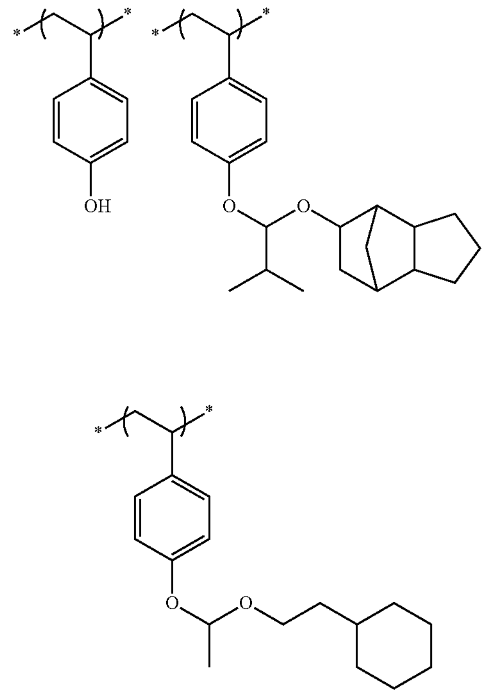
Composition ratio 55/20/25
Mw 5900
PDI 1.25
P-15
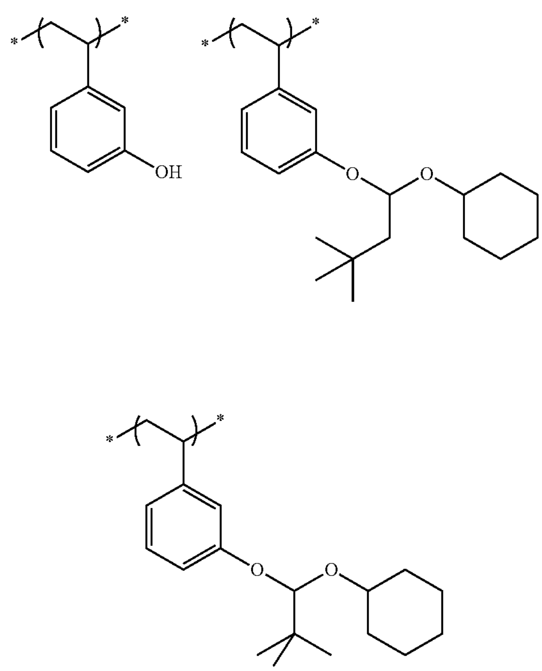
Composition ratio 62/28/10
Mw 12500
PDI 1.12

-continued
P-16
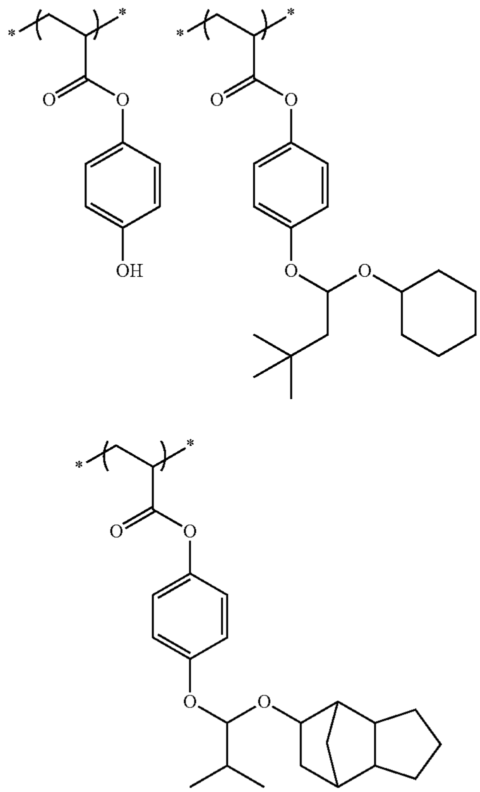
Composition ratio 56/32/12
Mw 11000
PDI 1.15
P-17
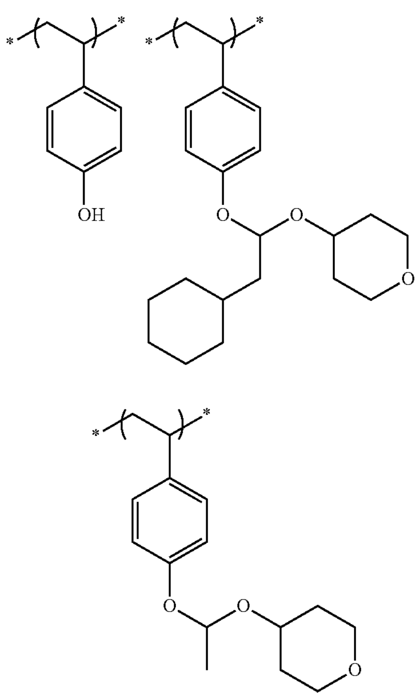
Composition ratio 60/20/20
Mw 6300
PDI 1.20
-continued
P-18
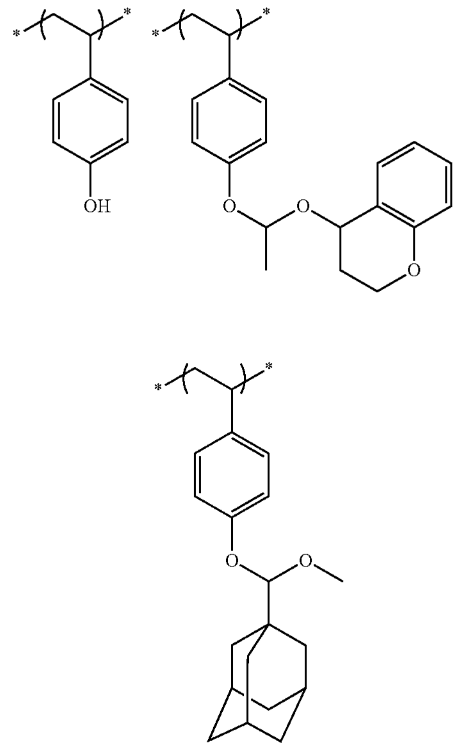
Composition ratio 55/31/14
Mw 6500
PDI 1.13
P-19
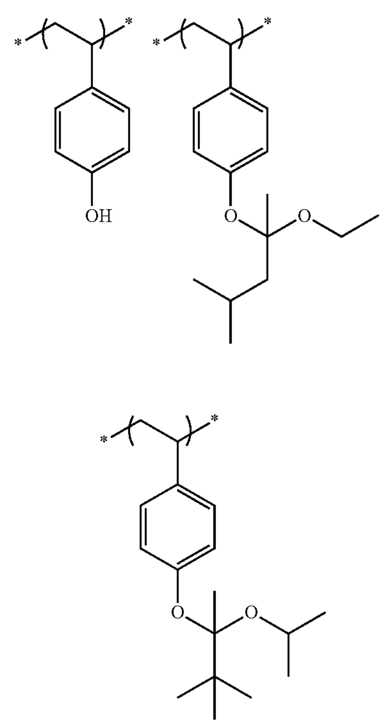
Composition ratio 51/37/12
Mw 5900
PDI 1.23

-continued
P-20
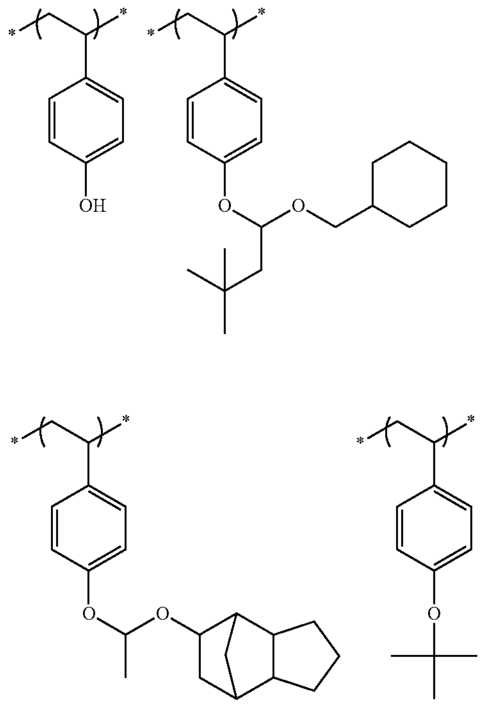
Composition ratio 64/13/13/10
Mw 5900
PDI 1.25
P-21
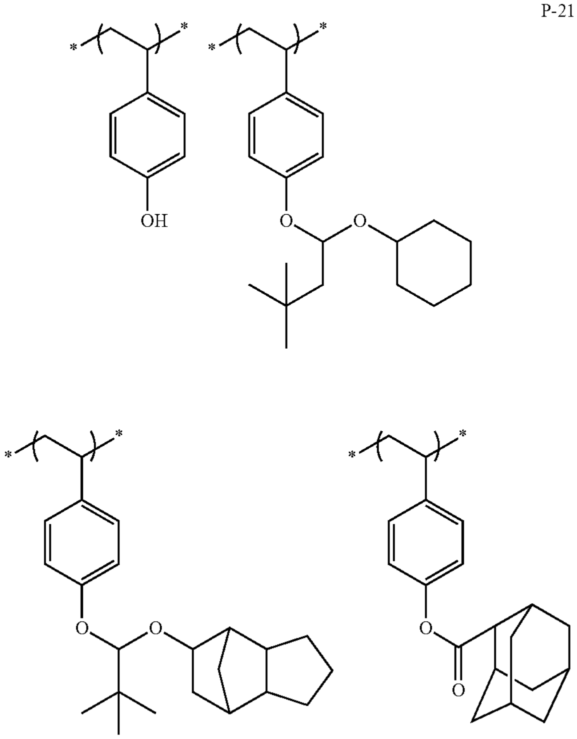
Composition ratio 52/28/15/5
Mw 6000
PDI 1.25
-continued
P-22
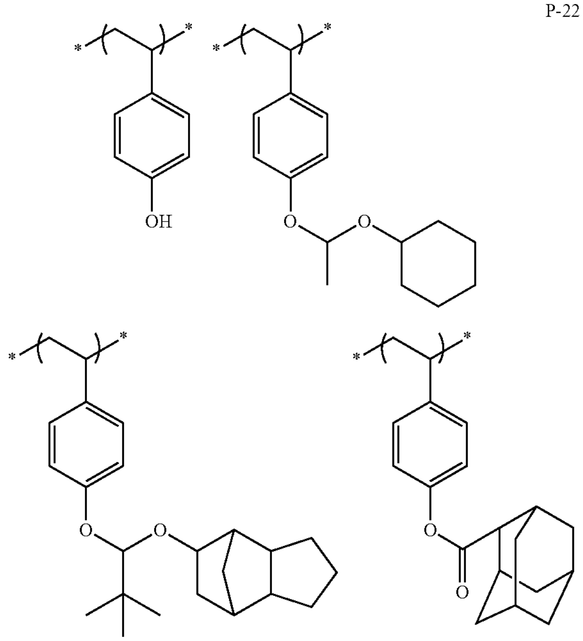
Composition ratio 40/25/25/10
Mw 6200
PDI 1.18
P-23
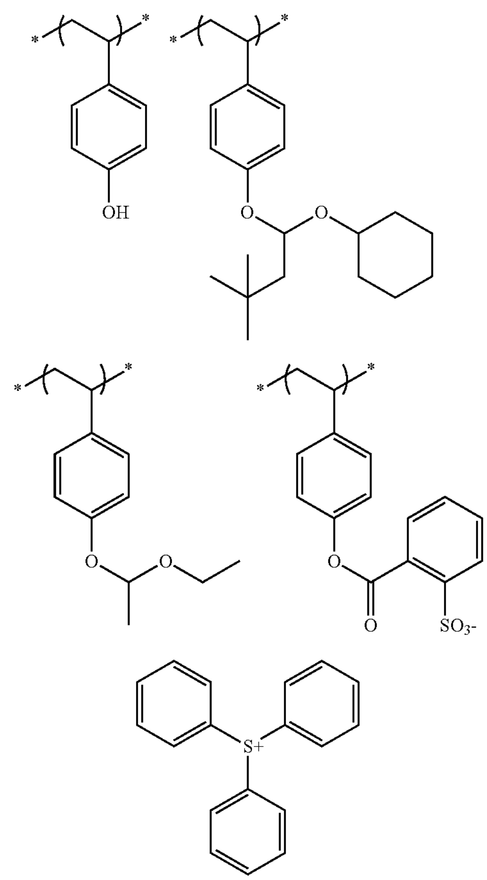
Composition ratio 45/20/20/15
Mw 12000
PDI 1.17

-continued
P-24
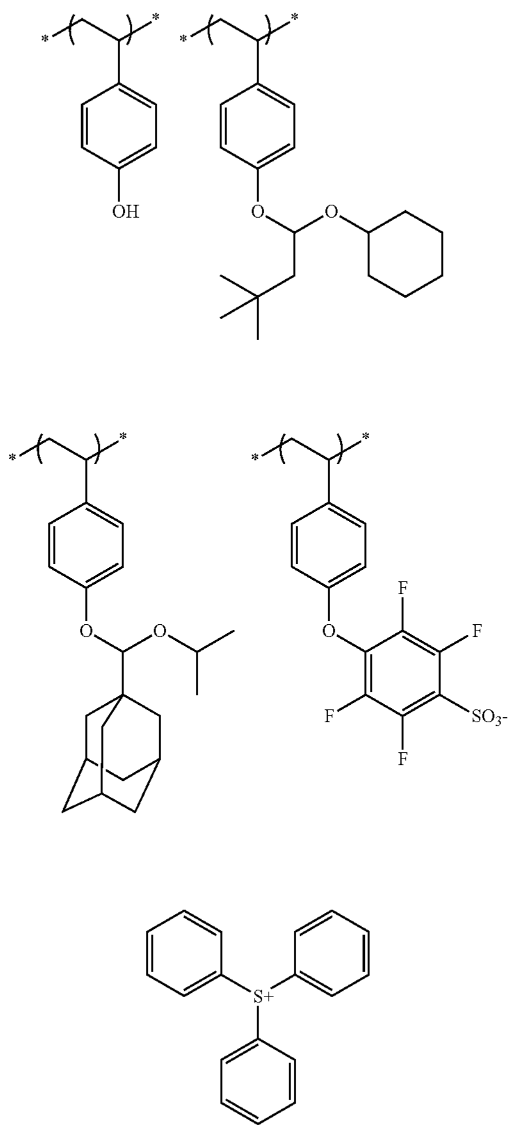
Composition ratio 43/20/20/17
Mw 12800
PDI 1.19
P-25
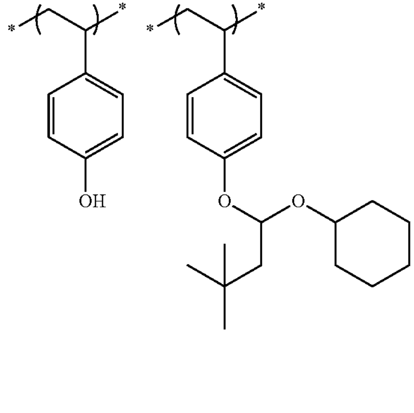
-continued
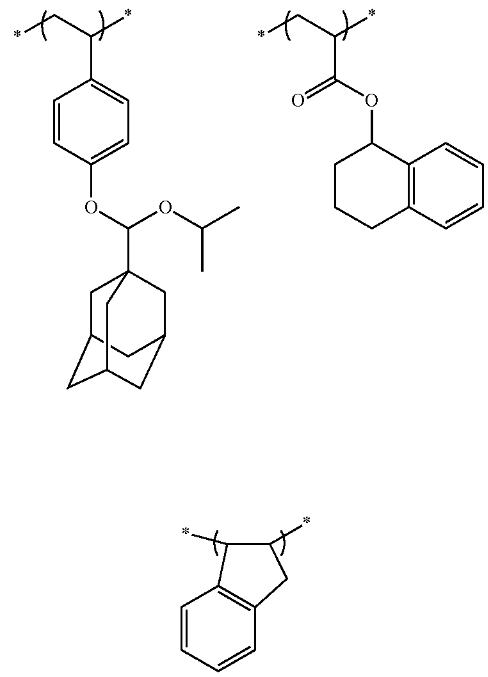
Composition ratio 52/13/20/5/10
Mw 7500
PDI 1.20
P-26
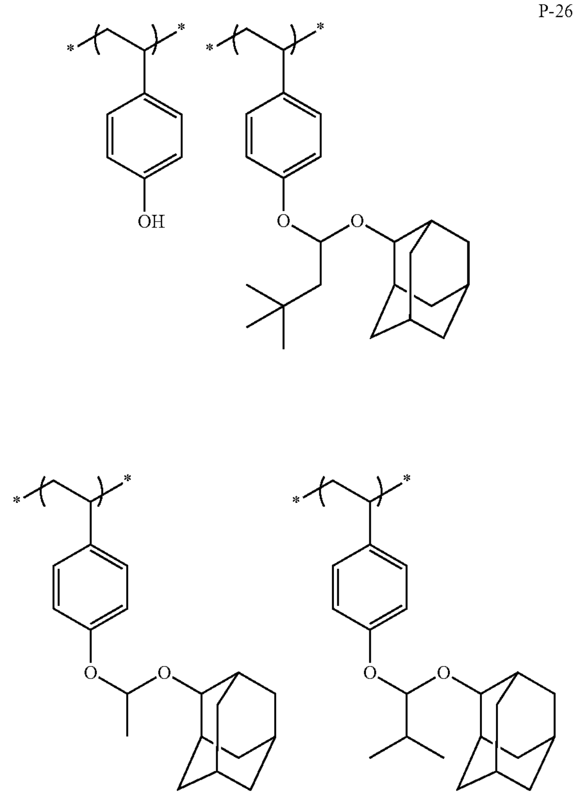

-continued
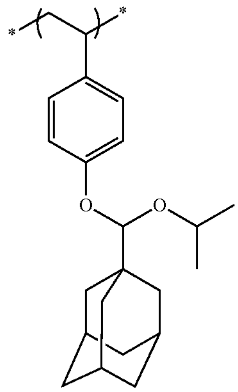
Composition ratio 55/21/12/7/5
Mw 7500
PDI 1.20
P-27
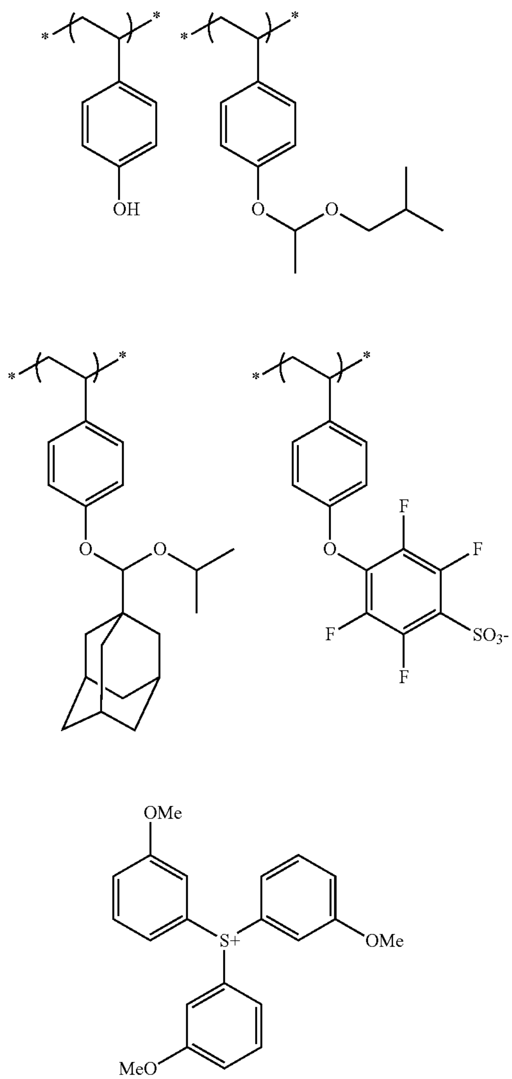
Composition ratio 50/20/23/7
Mw 10000
PDI 1.16
-continued
P-28
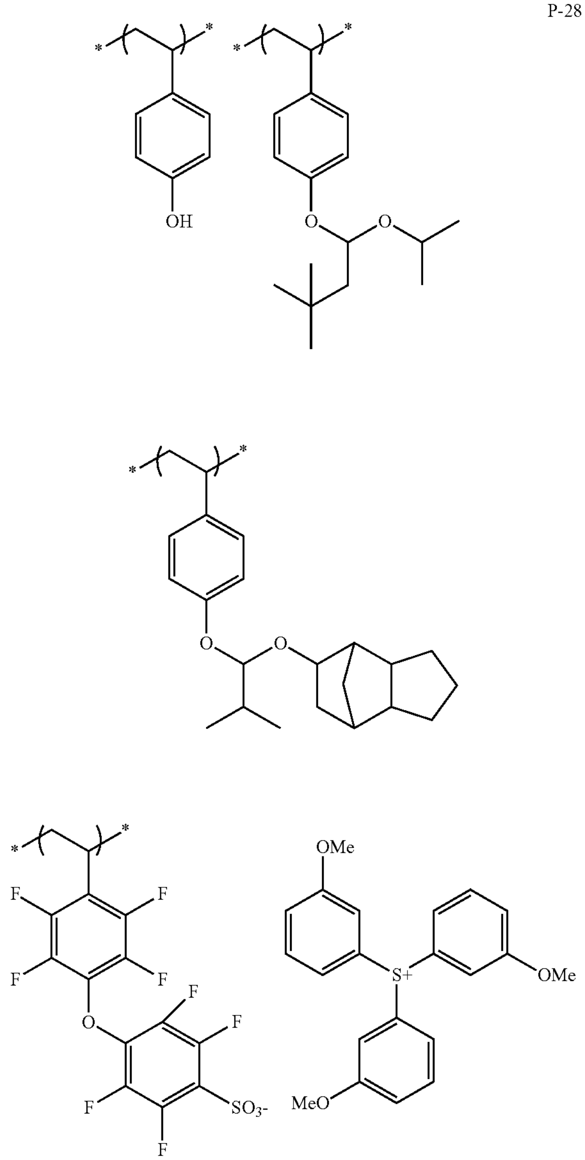
Composition ratio 20/34/30/16
Mw 13200
PDI 1.60
P-29
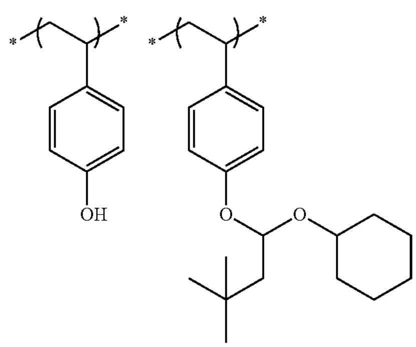

-continued
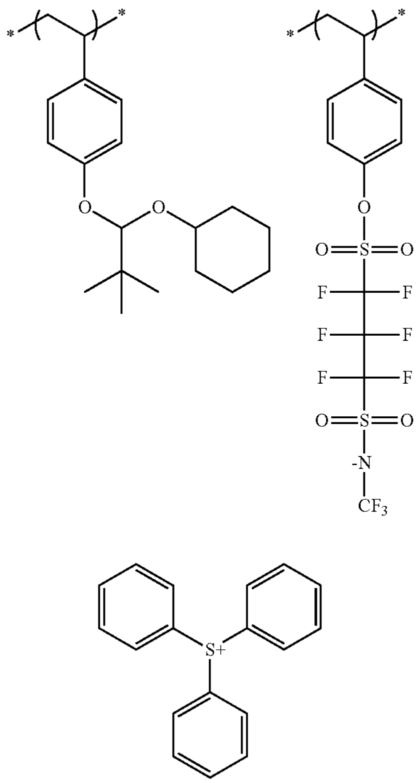
Composition ratio 61/20/14/5
Mw 13800
PDI 1.30
P-30
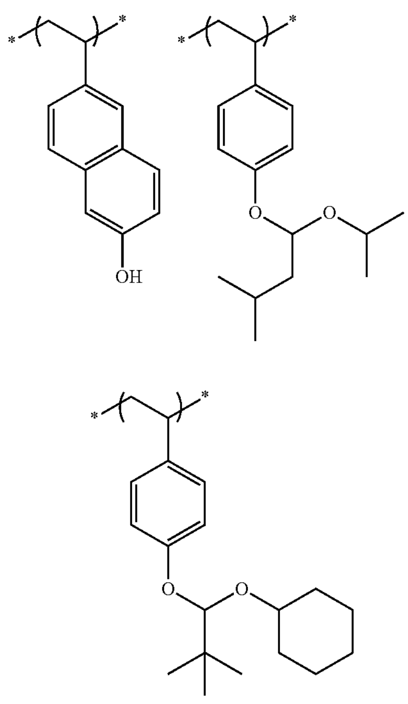
Composition ratio 42/38/20
Mw 7200
PDI 1.52
-continued
P-31
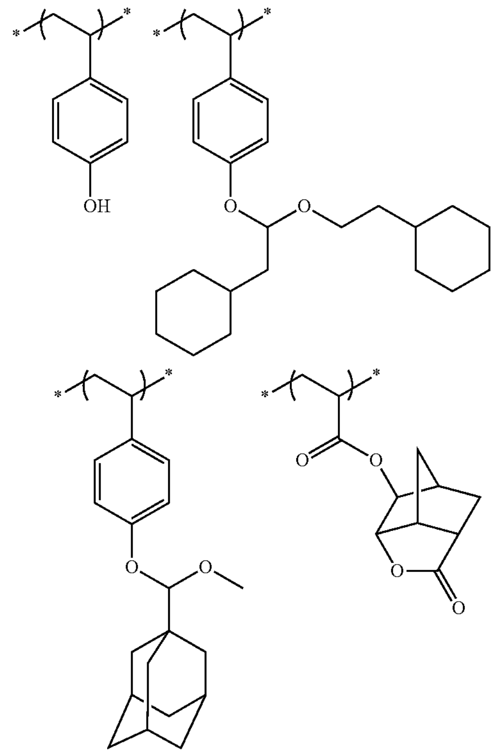
Composition ratio 34/45/11/10
Mw 12600
PDI 1.60
P-32
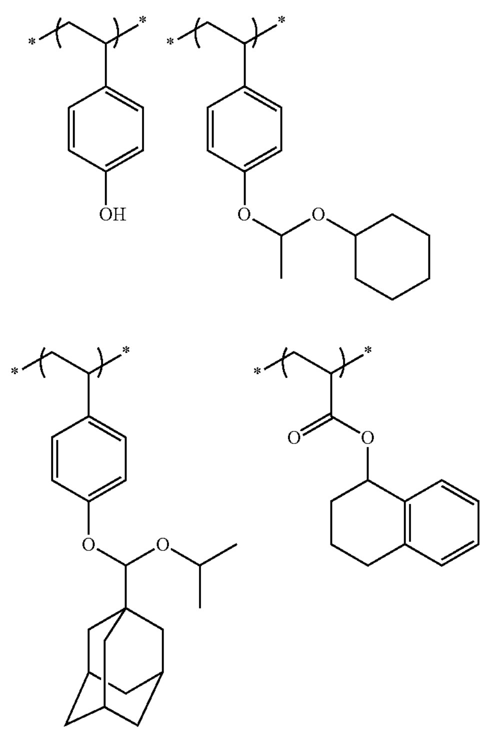
Composition ratio 56/22/12/10
Mw 5800
PDI 1.44

-continued
P-33
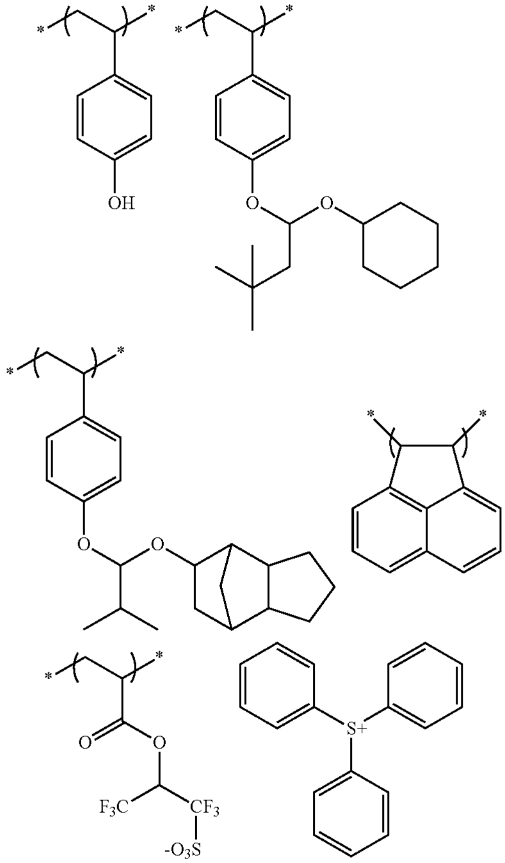
Composition ratio 26/40/10/9/15
Mw 13400
PDI 1.63
P-34
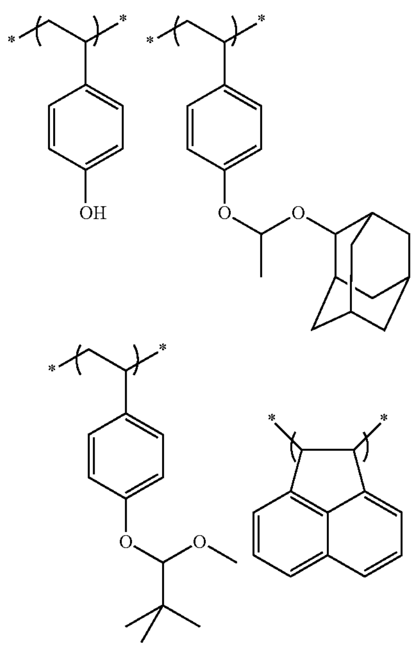
Composition ratio 39/37/19/5
Mw 6200
PDI 1.49
-continued
P-35
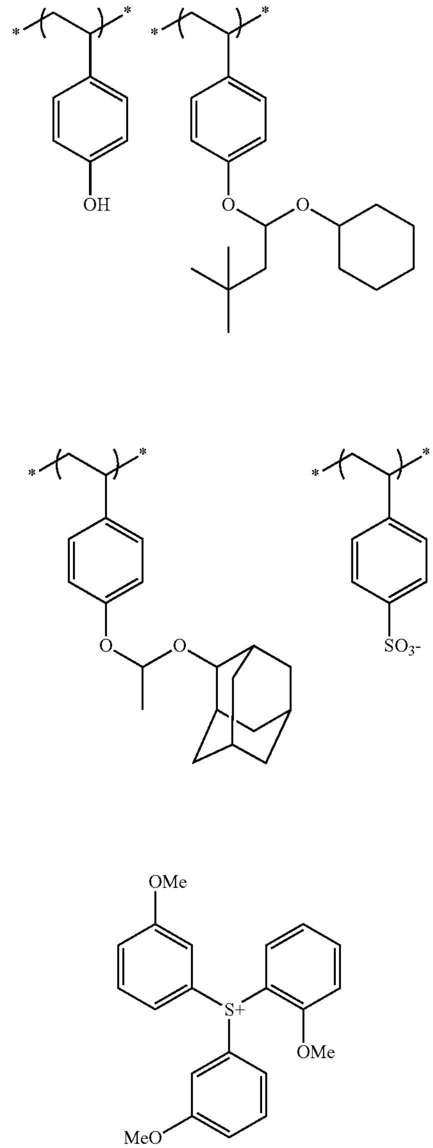
Composition ratio 53/20/20/7
Mw 17500
PDI 1.68
P-36
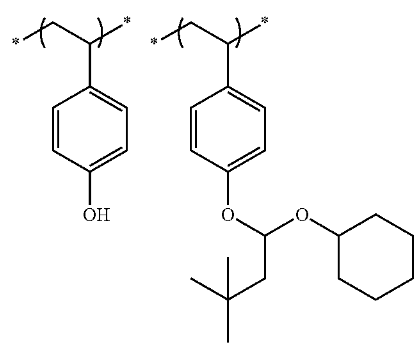

-continued
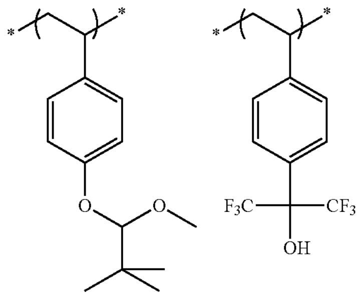
Composition ratio 30/25/30/15
Mw 11800
PDI 1.55
P-37
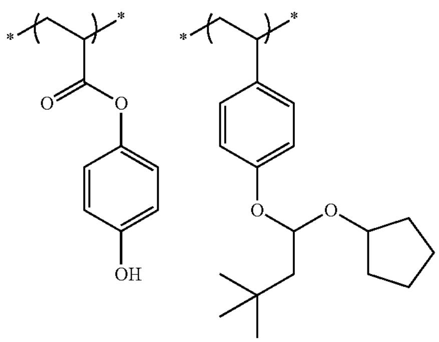
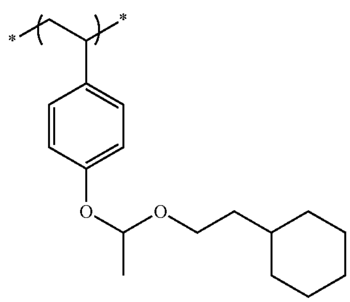
Composition ratio 60/30/10
Mw 5400
PDI 1.66
P-38
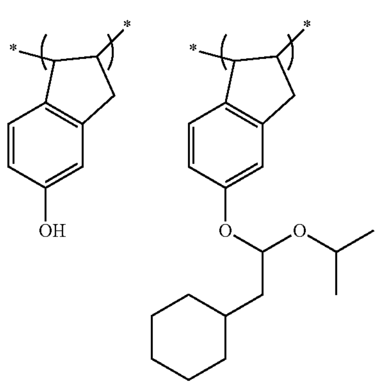
-continued
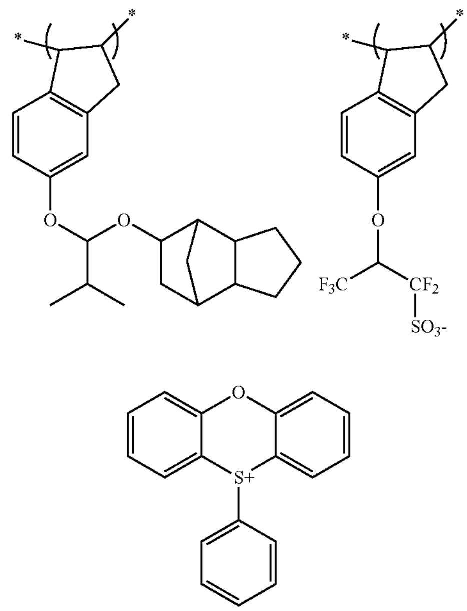
Composition ratio 47/25/20/8
Mw 18600
PDI 1.25
Further, the following resin was used in combination. Meanwhile, the composition ratio of each component denotes a molar ratio.
Ab-73
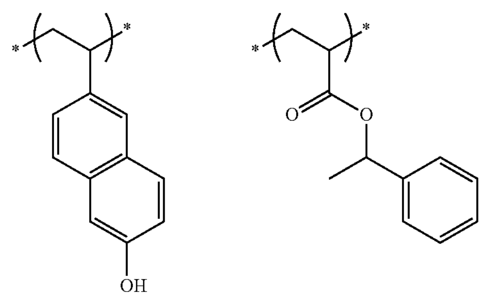
Composition ratio 35/65
Mw 9200
PDI 1.60
Ab-120
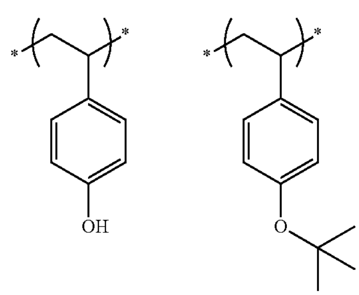
Composition ratio 50/50
Mw 5800
PDI 1.12

-continued
Ab-244
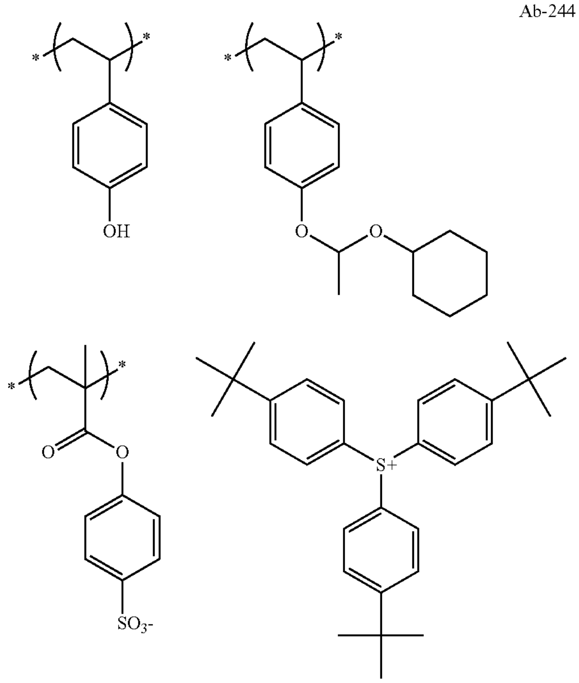
Composition ratio 50/40/10
Mw 14000
PDI 2.10
Ab-264
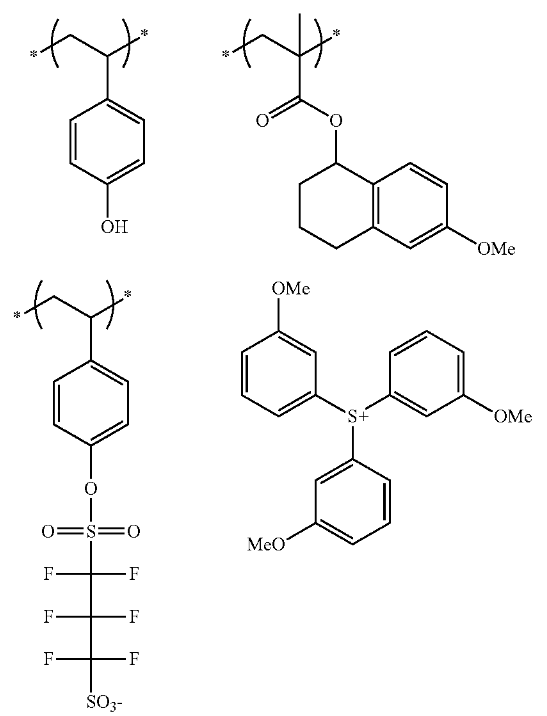
Composition ratio 65/20/15
Mw 15000
PDI 1.92
The following compounds were synthesized and used as Comparative Examples. Meanwhile, the composition ratio of each component denotes a molar ratio.
R-1
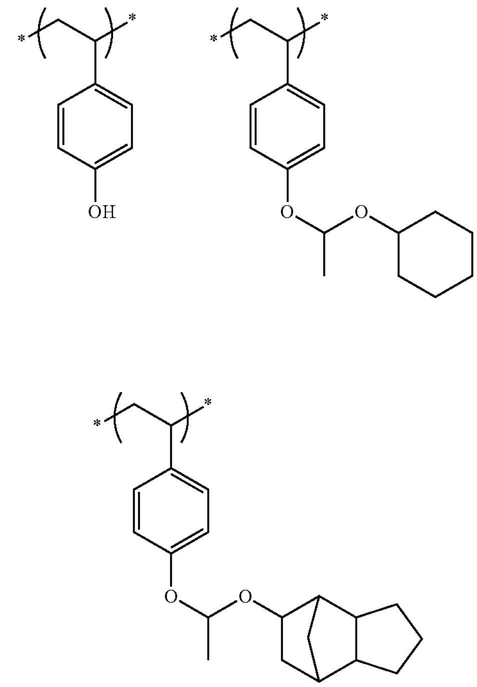
Composition ratio 45/40/15
Mw 6200
PDI 1.20
R-2
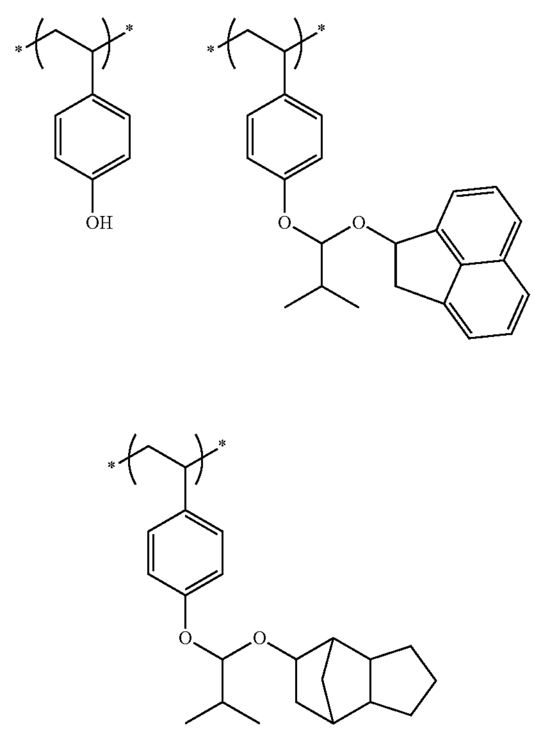
Composition ratio 65/20/15
Mw 5800
PDI 1.92

-continued
R-3
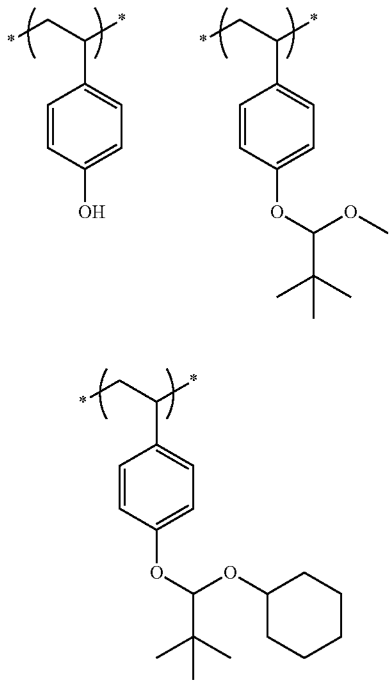
Composition ratio 65/20/15
Mw 7200
PDI 1.26
[Photo-Acid Generator]
As a photo-acid generator, the compounds having the following formulas were used.
PAG-1
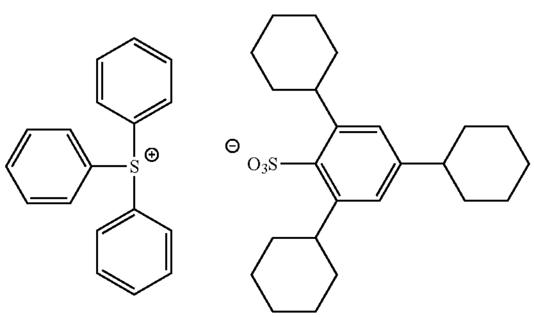
PAG-2
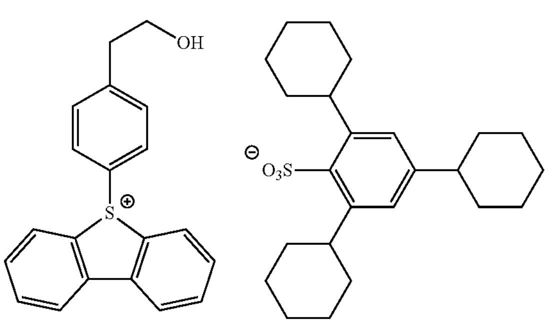
-continued
PAG-3
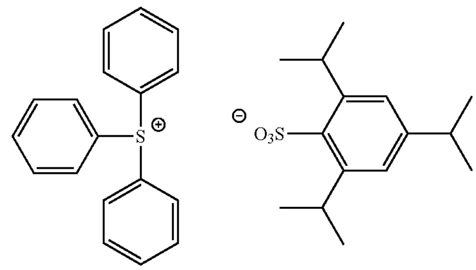
PAG-4
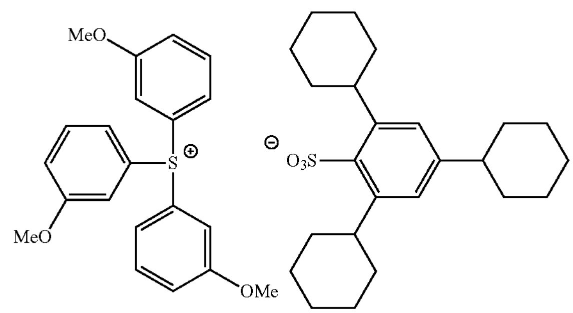
PAG-5
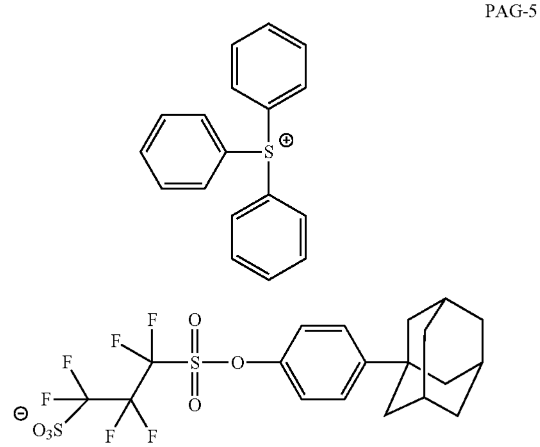
PAG-6
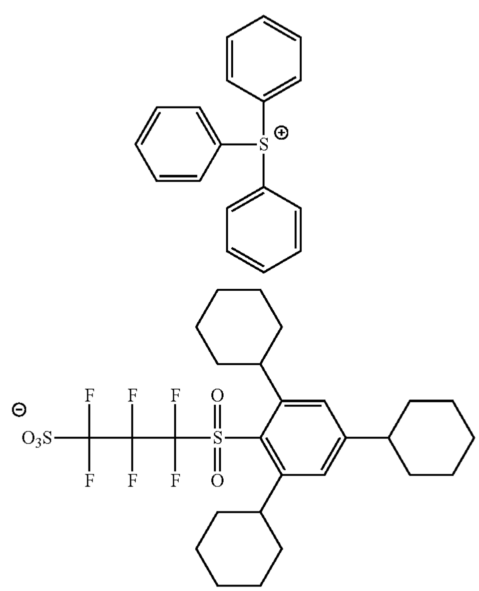

-continued

PAG-7

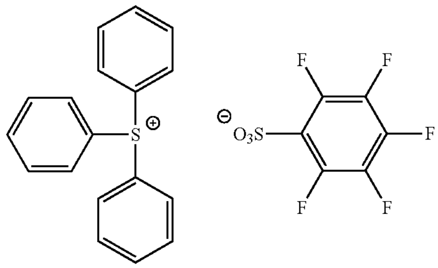

PAG-8

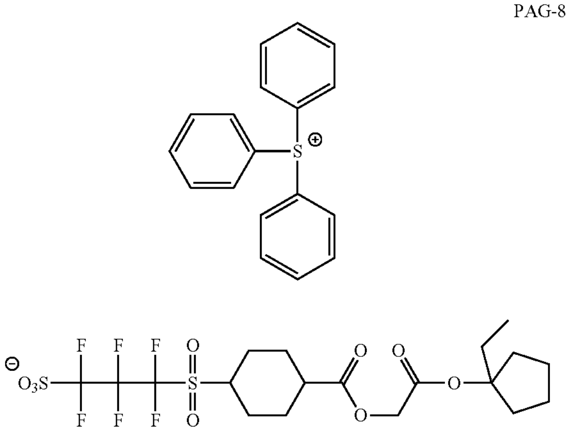

[Basic Compound]

As a basic compound, any of the following compound (N-1) to compound (N-10) were used.

N-1

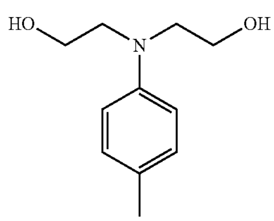

N-2

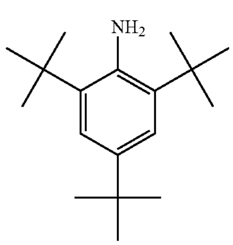

N-3

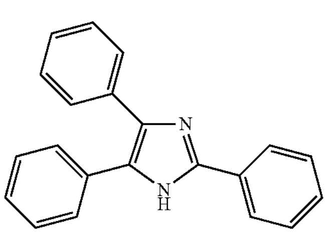

-continued

N-4

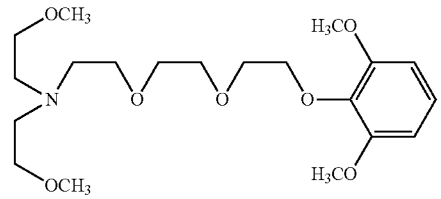

N-5

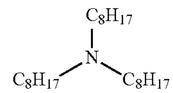

N-6

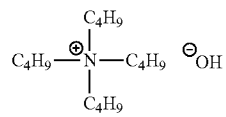

N-7

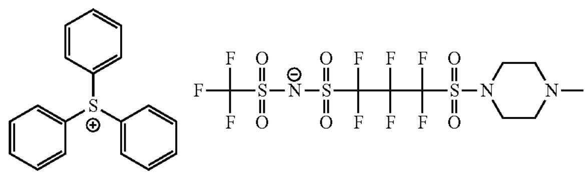

N-8

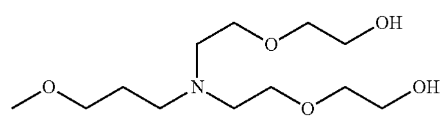

N-9

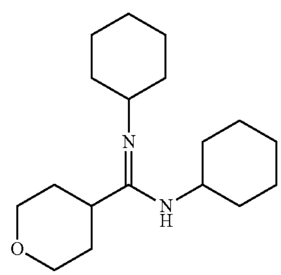

N-10

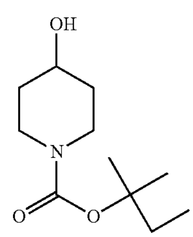

SYNTHESIS EXAMPLE 39

Compound N-7

The compound (N-7) corresponds to the above-described compound (PA), and synthesized based on the description of [0354] in Japanese Patent Application Laid-Open No. 2006-330098.

[Surfactant and Solvent]

As a surfactant, the following W-1 to W-3 were used.

W-1: Megaface R08 (manufactured by DIC Corporation; fluorine and silicon-based)

W-2: Polysiloxane Polymer KP-341 (manufactured by Shin-Etsu Chemical Co., Ltd.; silicon-based)

W-3: Troysol S-366 (manufactured by Troy Chemical Corp.; fluorine-based)

As a solvent, the following S1 to S4 were appropriately mixed and used,

S1: PGMEA (b.p.=146° C.)

S2: PGME (b.p.=120° C.)

S3: methyl lactate (b.p.=145° C.)

S4: cyclohexanone (b.p.=157° C.)

<Resist Evaluation>

The components shown in Tables 1 and 2 below were dissolved in a solvent, and each solution having a solid concentration of 4% by mass was prepared, and filtered by a polytetrafluoroethylene filter having a pore size of 0.10 μm to prepare an actinic ray-sensitive or radiation-sensitive resin composition (resist composition). The actinic ray-sensitive or radiation-sensitive resin composition was evaluated by the following method, and the results were shown in Tables 1 and 2 below.

The ratio when used for a plurality of components in the following tables is a mass ratio.

(Exposure Condition 1: EB (Electron Beam) Exposure) Examples 1-1 to 1-51 and Comparative Examples 1-1 to 1-3

The prepared actinic ray-sensitive or radiation-sensitive resin composition was uniformly applied onto a hexamethyldisilazane-treated silicon substrate by using a spin coater, and heat-dried on a hot plate at 120° C. for 90 seconds to form an actinic ray-sensitive or radiation-sensitive film (resist film) having a film thickness of 100 nm. The actinic ray-sensitive or radiation-sensitive film was subjected to irradiation with an electron beam using an electron irradiation apparatus (HL750 manufactured by Hitachi, Ltd., acceleration voltage: 50 keV). Immediately after the irradiation, the actinic ray-sensitive or radiation-sensitive film was heated on a hot plate at 110° C. for 90 seconds. Further, the actinic ray-sensitive or radiation-sensitive film was developed using a tetramethylammonium hydroxide in a concentration of 2.38% by mass at 23° C. for 60 seconds, rinsed with deionized water for 30 seconds, and spin-dried to obtain a resist pattern.

(Exposure Condition 2: EUV(Extreme Ultraviolet-Ray) Exposure) Examples 2-1 to 2-51 and Comparative Examples 2-1 to 2-3

The prepared actinic ray-sensitive or radiation-sensitive resin composition was uniformly applied onto a hexamethyldisilazane-treated silicon substrate by using a spin coater, and heat-dried on a hot plate at 120° C. for 90 seconds to form an actinic ray-sensitive or radiation-sensitive film (resist film) having a film thickness of 100 nm. The wafer coated by the resist film was subjected to patternwise exposure using an EUV exposure apparatus (Micro Exposure Tool, NA 0.3, Quadrupole, outer sigma 0.68, inner sigma 0.36, manufactured by Exitech Corporation) and a exposure mask (line/space=1/1). Immediately after the exposure, the resist film was heated on a hot plate at 110° C. for 90 seconds. Further, the resist film was developed using a tetramethylammonium hydroxide in a concentration of 2.38% by mass at 23° C. for 60 seconds, rinsed with deionized water for 30 seconds, and spin-dried to obtain a resist pattern.

(Sensitivity Evaluation (EB Exposure))

The cross-sectional shape of the obtained patterns was observed with a scanning electron microscope (S-9220 manufactured by Hitachi, Ltd.). The minimum irradiation energy when resolving a line & space pattern (line:space=1:1) having a line width of 100 nm was designated as a sensitivity. The smaller the value is, the higher the sensitivity is.

(Sensitivity Evaluation (EUV Exposure))

The cross-sectional shape of the obtained patterns was observed with a scanning electron microscope (S-9220 manufactured by Hitachi, Ltd.). The minimum irradiation energy when resolving a line & space pattern (line:space=1:1) having a line width of 50 nm was designated as a sensitivity. The smaller the value is, the higher the sensitivity is.

(Resolution Evaluation)

A limiting resolution (the minimum line width at which the line and the space are separately resolved) in the irradiation quantity indicating the sensitivity described above was designated as a resolution.

(Exposure Latitude (EL) Evaluation (EB Exposure))

The exposure amount reproducing a line & space pattern (line:space=1:1) having a line width of 100 nm was designated as an optimum exposure amount, and the exposure amount width in which the pattern size allows 100 nm±20% when changing the exposure amount was determined, and expressed as a percentage by dividing the determined value by the optimum exposure amount. The greater the value is, the smaller the change in performance by the change in exposure amount, and the better the exposure latitude.

(Exposure Latitude (EL) Evaluation (EUV Exposure))

The exposure amount reproducing a line & space pattern (line:space=1:1) having a line width of 50 nm was designated as an optimum exposure amount, and the exposure amount width in which the pattern size allows 50 nm±10% when changing the exposure amount was determined, and expressed as a percentage by dividing the determined value by the optimum exposure amount. The greater the value is, the smaller the change in performance by the change in exposure amount, and the better the exposure latitude.

(Line Edge Roughness (LER) Evaluation (EB Exposure))

Concerning arbitrary 30 points in 50 μm in the longitudinal direction of line pattern of 100 nm in the irradiation quantity indicating the sensitivity described above, a distance from a base line at which edges should be located was measured with a scanning electron microscope (S-9220 manufactured by Hitachi, Ltd.), and standard deviation was obtained to calculate 3σ.

(Line Edge Roughness (LER) Evaluation (EUV Exposure))

Concerning arbitrary 30 points in 50 μm in the longitudinal direction of line pattern of 50 nm in the irradiation quantity indicating the sensitivity described above, a distance from a base line at which edges should be located was measured with a scanning electron microscope (S-9220 manufactured by Hitachi, Ltd.), and standard deviation was obtained to calculate 3σ.

(Pattern Shape Evaluation (EB Exposure))

The cross-sectional shape of the line & space pattern having a line width of 100 nm in the irradiation quantity indicating the sensitivity described above, was observed with a scanning electron microscope (S-4300 manufactured by Hitachi, Ltd.), and evaluated as a rectangular, slightly tapered, slightly inversed tapered, tapered or inversed tapered shape.

(Pattern Shape Evaluation (EUV Exposure))

The cross-sectional shape of the line & space pattern having a line width of 50 nm in the irradiation quantity indicating the sensitivity described above, was observed with a scanning electron microscope (S-4300 manufactured by Hitachi, Ltd.), and evaluated as a rectangular, slightly tapered, slightly inversed tapered, tapered or inversed tapered shape.

<Film Reduction (EB Exposure)>

The remaining film rate in which pattern formation was performed with the minimum irradiation energy when resolving a line & space pattern having a line width of 100 nm was observed with a scanning electron microscope (SEM). The "remaining film rate" means a value as calculated by (the film thickness of an unexposed portion after exposure and development)/(the film thickness after forming a resist film)×

100%. The film reduction quantity due to a flare photosensitization was evaluated by three steps. The greater the remaining film rate is, the better the flare characteristic is.

(Judgement Criteria)

A: the remaining film rate of 90% or more.

B: the remaining film rate of 80% to less than 90%.

C: the remaining film rate of less than 80%.

<Film Reduction (EUV Exposure)>

The remaining film rate in which pattern formation was performed with the minimum irradiation energy when resolving a line & space pattern having a line width of 50 nm was observed with a scanning electron microscope (SEM). The "remaining film rate" means a value as calculated by (the film thickness of an unexposed portion after exposure and development)/(the film thickness after forming a resist film)×100%. The film reduction quantity due to a flare photosensitization was evaluated by three steps. The greater the remaining film rate is, the better the flare characteristic is.

(Judgement Criteria)

A: the remaining film rate of 90% or more.

B: the remaining film rate of 80% to less than 90%.

C: the remaining film rate of less than 80%.

The measurement results in the EB exposure are shown in Table 1 below. The measurement results in the EUV exposure is shown in Table 2 below. Meanwhile, in Tables 1 and 2, the concentration of each component denotes "% by mass" based on the total solid of the composition.

TABLE 1

| | Acid-decomposable compound (% by mass) | Photo-acid generator (% by mass) | Basic compound (% by mass) | Solvent (mass ratio) | Surfactant (% by mass) | Resolution (% by mass) | EL (%) | Sensitivity ($\mu C/cm^2$) | LER (nm) | Shape | Film reduction |
|---|---|---|---|---|---|---|---|---|---|---|---|
| Ex 1-1 | P-1<br>93.85 | PAG-1<br>5.50 | N-1<br>0.60 | S1/S2<br>80/20 | W-3<br>0.05 | 37.50 | 23.00 | 21.40 | 4.00 | Rectangular | A |
| Ex 1-2 | P-1<br>93.85 | PAG-1<br>5.50 | N-9<br>0.60 | S1/S2<br>80/20 | W-3<br>0.05 | 37.50 | 24.00 | 21.40 | 3.90 | Rectangular | A |
| Ex 1-3 | P-1<br>93.85 | PAG-7<br>5.50 | N-1<br>0.60 | S1/S2<br>80/20 | W-3<br>0.05 | 37.50 | 23.00 | 21.10 | 4.20 | Rectangular | A |
| Ex 1-4 | P-1<br>93.85 | PAG-1<br>5.50 | N-1<br>0.60 | S3/S4<br>80/20 | W-3<br>0.05 | 37.50 | 24.00 | 22.10 | 4.10 | Rectangular | A |
| Ex 1-5 | P-1<br>93.85 | PAG-6<br>5.50 | N-6<br>0.60 | S1/S2<br>80/20 | W-2<br>0.05 | 37.50 | 24.00 | 22.30 | 4.20 | Rectangular | A |
| Ex 1-6 | P-2<br>93.85 | PAG-4<br>5.50 | N-9<br>0.60 | S1/S2<br>80/20 | W-3<br>0.05 | 50.00 | 21.00 | 24.50 | 5.00 | Rectangular | A |
| Ex 1-7 | P-3<br>93.85 | PAG-4<br>5.50 | N-9<br>0.60 | S1/S2<br>80/20 | W-2<br>0.05 | 50.00 | 21.00 | 25.10 | 5.10 | Rectangular | A |
| Ex 1-8 | P-4<br>93.85 | PAG-2<br>5.50 | N-8<br>0.60 | S1/S2<br>80/20 | W-3<br>0.05 | 37.50 | 23.00 | 21.30 | 4.30 | Rectangular | A |
| Ex 1-9 | P-4<br>93.85 | PAG-6<br>5.50 | N-3<br>0.60 | S1/S2<br>80/20 | W-3<br>0.05 | 37.50 | 23.00 | 22.10 | 3.80 | Rectangular | A |
| Ex 1-10 | P-5<br>93.85 | PAG-4<br>5.50 | N-10<br>0.60 | S1/S2<br>80/20 | W-3<br>0.05 | 62.50 | 22.00 | 15.30 | 6.00 | Rectangular | A |
| Ex 1-11 | P-6<br>93.85 | PAG-5<br>5.50 | N-8<br>0.60 | S1/S2<br>80/20 | W-3<br>0.05 | 50.00 | 20.00 | 24.50 | 5.20 | Rectangular | A |
| Ex 1-12 | P-7<br>93.85 | PAG-6<br>5.50 | N-3<br>0.60 | S1/S2<br>80/20 | W-3<br>0.05 | 62.50 | 22.00 | 24.10 | 4.90 | Rectangular | A |
| Ex 1-13 | P-8<br>93.85 | PAG-1<br>5.50 | N-10<br>0.60 | S1/S2<br>80/20 | W-3<br>0.05 | 75.00 | 19.00 | 27.00 | 6.50 | Slightly Tapered | A |
| Ex 1-14 | P-9<br>93.85 | PAG-1<br>5.50 | N-4<br>0.60 | S1/S2<br>80/20 | W-2<br>0.05 | 75.00 | 19.00 | 27.10 | 6.20 | Slightly Tapered | A |
| Ex 1-15 | P-10<br>93.85 | PAG-1<br>5.50 | N-4<br>0.60 | S1/S2<br>80/20 | W-3<br>0.05 | 50.00 | 21.00 | 24.60 | 4.90 | Rectangular | A |
| Ex 1-16 | P-11<br>93.85 | PAG-1<br>5.50 | N-4<br>0.60 | S1/S2<br>80/20 | W-3<br>0.05 | 62.50 | 22.00 | 25.30 | 4.60 | Rectangular | A |
| Ex 1-17 | P-12<br>93.85 | PAG-1<br>5.50 | N-4<br>0.60 | S1/S2<br>80/20 | W-1<br>0.05 | 62.50 | 20.00 | 24.10 | 4.70 | Rectangular | A |
| Ex 1-18 | P-13<br>93.85 | PAG-8<br>5.50 | N-4<br>0.60 | S1/S2<br>80/20 | W-3<br>0.05 | 62.50 | 20.00 | 26.00 | 5.20 | Rectangular | A |
| Ex 1-19 | P-14<br>93.85 | PAG-8<br>5.50 | N-4<br>0.60 | S1/S2<br>80/20 | W-3<br>0.05 | 50.00 | 21.00 | 25.20 | 4.90 | Rectangular | A |
| Ex 1-20 | P-15<br>93.85 | PAG-1<br>5.50 | N-4<br>0.60 | S1/S2<br>80/20 | W-2<br>0.05 | 37.50 | 23.00 | 21.30 | 4.10 | Rectangular | A |
| Ex 1-21 | P-16<br>93.85 | PAG-1<br>5.50 | N-4<br>0.60 | S1/S2<br>80/20 | W-3<br>0.05 | 62.50 | 20.00 | 24.10 | 5.30 | Rectangular | A |
| Ex 1-22 | P-17<br>93.85 | PAG-1<br>5.50 | N-4<br>0.60 | S1/S2<br>80/20 | W-1<br>0.05 | 50.00 | 21.00 | 24.70 | 5.20 | Rectangular | A |
| Ex 1-23 | P-18<br>93.85 | PAG-4<br>5.5 | N-4<br>0.6 | S1/S2<br>80/20 | W-3<br>0.05 | 50 | 22 | 25.3 | 5.0 | Rectangular | A |
| Ex 1-24 | P-19<br>93.85 | PAG-4<br>5.5 | N-4<br>0.6 | S1/S2<br>50/50 | W-3<br>0.05 | 37.5 | 24 | 21.7 | 4.1 | Rectangular | A |
| Ex 1-25 | P-20<br>93.85 | PAG-4<br>5.5 | N-4<br>0.6 | S1/S2<br>50/50 | W-3<br>0.05 | 50 | 23 | 24.3 | 5.2 | Rectangular | A |
| Ex 1-26 | P-21<br>93.85 | PAG-4<br>5.5 | N-4<br>0.6 | S1/S2<br>50/50 | W-3<br>0.05 | 37.5 | 24 | 22.6 | 4.1 | Rectangular | A |
| Ex 1-27 | P-22<br>92.45 | PAG-4<br>5.5 | N-8<br>2.0 | S1/S2<br>50/50 | W-3<br>0.05 | 50 | 22 | 24.5 | 5.2 | Rectangular | A |
| Ex 1-28 | P-22<br>92.45 | PAG-4<br>5.5 | N-6<br>2.0 | S1/S2<br>50/50 | W-3<br>0.05 | 62.5 | 20 | 24.9 | 4.8 | Rectangular | A |

TABLE 1-continued

| | Acid-decomposable compound (% by mass) | Photo-acid generator (% by mass) | Basic compound (% by mass) | Solvent (mass ratio) | Surfactant (% by mass) | Resolution (% by mass) | EL (%) | Sensitivity ($\mu C/cm^2$) | LER (nm) | Shape | Film reduction |
|---|---|---|---|---|---|---|---|---|---|---|---|
| Ex 1-29 | P-23<br>99.35 | — | N-7<br>0.6 | S1/S2<br>50/50 | W-3<br>0.05 | 75 | 19 | 27.4 | 6.2 | Rectangular | A |
| Ex 1-30 | P-24<br>99.35 | — | N-8<br>0.6 | S1/S2<br>50/50 | W-3<br>0.05 | 37.5 | 23 | 21.4 | 4.1 | Rectangular | A |
| Ex 1-31 | P-25<br>93.85 | PAG-4<br>5.5 | N-3<br>0.6 | S1/S2<br>50/50 | W-3<br>0.05 | 37.5 | 24 | 19.9 | 3.8 | Rectangular | A |
| Ex 1-32 | P-26<br>93.85 | PAG-4<br>5.5 | N-4<br>0.6 | S1/S2<br>50/50 | W-3<br>0.05 | 37.5 | 24 | 18 | 3.7 | Rectangular | A |
| Ex 1-33 | P-27<br>99.35 | — | N-3<br>0.6 | S1/S2<br>80/20 | W-3<br>0.05 | 62.5 | 22 | 24.6 | 5.0 | Rectangular | A |
| Ex 1-34 | P-28<br>99.35 | — | N-10<br>0.6 | S1/S2<br>50/50 | W-3<br>0.05 | 62.5 | 21 | 24.2 | 4.9 | Rectangular | A |
| Ex 1-35 | P-29<br>98.95 | — | N-10<br>1.0 | S1/S2<br>50/50 | W-3<br>0.05 | 37.5 | 24 | 20.1 | 4.1 | Rectangular | A |
| Ex 1-36 | P-29<br>93.45 | PAG-4<br>5.5 | N-7<br>1.0 | S1/S2<br>50/50 | W-3<br>0.05 | 37.5 | 23 | 19.9 | 4.3 | Rectangular | A |
| Ex 1-37 | P-30<br>93.85 | PAG-4<br>5.5 | N-1<br>0.6 | S1/S2<br>50/50 | W-3<br>0.05 | 37.5 | 24 | 21.4 | 3.7 | Rectangular | A |
| Ex 1-38 | P-31<br>93.85 | PAG-4<br>5.5 | N-8<br>0.6 | S1/S2<br>80/20 | W-3<br>0.05 | 37.5 | 24 | 21.5 | 3.9 | Rectangular | A |
| Ex 1-39 | P-32<br>93.85 | PAG-4<br>5.5 | N-3<br>0.6 | S1/S2<br>80/20 | W-3<br>0.05 | 62.5 | 21 | 26 | 4.6 | Rectangular | A |
| Ex 1-40 | P-33<br>99.35 | — | N-3<br>0.6 | S1/S2<br>80/20 | W-3<br>0.05 | 50 | 21 | 24.1 | 4.8 | Rectangular | A |
| Ex 1-41 | P-34<br>93.85 | PAG-4<br>5.5 | N-3<br>0.6 | S1/S2<br>50/50 | W-3<br>0.05 | 62.5 | 21 | 24.8 | 5.4 | Rectangular | A |
| Ex 1-42 | P-35<br>99.35 | — | N-3<br>0.6 | S1/S2<br>80/20 | W-3<br>0.05 | 50 | 22 | 25.4 | 5.3 | Rectangular | A |
| Ex 1-43 | P-36<br>99.35 | — | N-3<br>0.6 | S1/S2<br>80/20 | W-3<br>0.05 | 37.5 | 24 | 21 | 4.2 | Rectangular | A |
| Ex 1-44 | P-37<br>93.85 | PAG-4<br>5.5 | N-3<br>0.6 | S1/S2<br>80/20 | W-3<br>0.05 | 50 | 20 | 25.1 | 5.3 | Rectangular | A |
| Ex 1-45 | P-38<br>99.35 | — | N-3<br>0.6 | S1/S2<br>80/20 | W-3<br>0.05 | 50 | 20 | 24.9 | 5.5 | Rectangular | A |
| Ex 1-46 | P-1/Ab-120<br>50/43.85 | PAG-4<br>5.5 | N-3<br>0.6 | S1/S2<br>80/20 | W-3<br>0.05 | 50 | 23 | 20.1 | 4.1 | Rectangular | A |
| Ex 1-47 | P-1/Ab-264<br>80/13.85 | PAG-4<br>5.5 | N-3<br>0.6 | S1/S2<br>80/20 | W-3<br>0.05 | 50 | 23 | 21.3 | 3.7 | Rectangular | A |
| Ex 1-48 | P-4/Ab-73<br>50/43.85 | PAG-4<br>5.5 | N-3<br>0.6 | S1/S2<br>80/20 | W-3<br>0.05 | 50 | 23 | 19.8 | 3.9 | Rectangular | A |
| Ex 1-49 | P-4/Ab-244<br>80/13.85 | PAG-4<br>5.5 | N-3<br>0.6 | S1/S2<br>80/20 | W-3<br>0.05 | 50 | 24 | 20.4 | 4.1 | Rectangular | A |
| Ex 1-50 | P-1<br>93.85 | PAG-1/PAG-4<br>2/3.5 | N-3<br>0.6 | S1/S2<br>80/20 | W-3<br>0.05 | 50 | 19 | 20.4 | 4.1 | Rectangular | A |
| Ex 1-51 | P-4<br>93.9 | PAG-4<br>5.5 | N-3<br>0.6 | S1/S2<br>80/20 | — | 50 | 23 | 20.4 | 4.0 | Rectangular | A |
| C. Ex 1-1 | R-1<br>93.85 | PAG-1<br>5.5 | N-6<br>0.6 | S1/S2<br>80/20 | W-3<br>0.05 | 100 | 15 | 22 | 7.2 | Inversed tapered | C |
| C. Ex 1-2 | R-2<br>93.85 | PAG-1<br>5.5 | N-6<br>0.6 | S1/S2<br>80/20 | W-3<br>0.05 | 87.5 | 16 | 35.1 | 7.1 | tapered | B |
| C. Ex 1-3 | R-3<br>93.85 | PAG-1<br>5.5 | N-6<br>0.6 | S1/S2<br>80/20 | W-3<br>0.05 | 87.5 | 16 | 40.2 | 7.3 | tapered | A |

TABLE 2

| | Acid-decomposable compound (% by mass) | Photo-acid generator (% by mass) | Basic compound (% by mass) | Solvent (mass ratio) | Surfactant (% by mass) | Resolution (% by mass) | EL (%) | Sensitivity ($\mu C/cm^2$) | LER (nm) | Shape | Film reduction |
|---|---|---|---|---|---|---|---|---|---|---|---|
| Ex 2-1 | P-1<br>62.95 | PAG-1<br>35 | N-1<br>2 | S1/S2<br>80/20 | W-3<br>0.05 | 22 | 23 | 12.8 | 3.4 | Rectangular | A |
| Ex 2-2 | P-1<br>62.95 | PAG-1<br>35 | N-9<br>2 | S1/S2<br>80/20 | W-3<br>0.05 | 22 | 24 | 13.5 | 3.2 | Rectangular | A |
| Ex 2-3 | P-1<br>62.95 | PAG-7<br>35 | N-1<br>2 | S1/S2<br>80/20 | W-3<br>0.05 | 22 | 23 | 11.2 | 3.6 | Rectangular | A |
| Ex 2-4 | P-1<br>62.95 | PAG-1<br>35 | N-1<br>2 | S3/S4<br>80/20 | W-3<br>0.05 | 22 | 24 | 12.3 | 3.4 | Rectangular | A |
| Ex 2-5 | P-1<br>62.95 | PAG-6<br>35 | N-6<br>2 | S1/S2<br>80/20 | W-2<br>0.05 | 22 | 24 | 13.5 | 3.8 | Rectangular | A |

TABLE 2-continued

| | Acid-decomposable compound (% by mass) | Photo-acid generator (% by mass) | Basic compound (% by mass) | Solvent (mass ratio) | Surfactant (% by mass) | Resolution (% by mass) | EL (%) | Sensitivity ($\mu C/cm^2$) | LER (nm) | Shape | Film reduction |
|---|---|---|---|---|---|---|---|---|---|---|---|
| Ex 2-6 | P-2<br>62.95 | PAG-2<br>35 | N-1<br>2 | S1/S2<br>80/20 | W-3<br>0.05 | 24 | 20 | 14.0 | 4.5 | Rectangular | A |
| Ex 2-7 | P-3<br>62.95 | PAG-6<br>35 | N-3<br>2 | S1/S2<br>80/20 | W-2<br>0.05 | 26 | 21 | 15.2 | 4.7 | Rectangular | A |
| Ex 2-8 | P-4<br>62.95 | PAG-2<br>35 | N-8<br>2 | S1/S2<br>80/20 | W-3<br>0.05 | 22 | 23 | 11.2 | 4.0 | Rectangular | A |
| Ex 2-9 | P-4<br>62.95 | PAG-6<br>35 | N-3<br>2 | S1/S2<br>80/20 | W-3<br>0.05 | 22 | 23 | 12.4 | 3.9 | Rectangular | A |
| Ex 2-10 | P-5<br>60.95 | PAG-4<br>35 | N-10<br>4 | S1/S2<br>80/20 | W-3<br>0.05 | 18 | 21 | 18.6 | 3.2 | Rectangular | A |
| Ex 2-11 | P-6<br>62.95 | PAG-8<br>35 | N-8<br>2 | S1/S2<br>80/20 | W-3<br>0.05 | 26 | 21 | 15.2 | 4.3 | Rectangular | A |
| Ex 2-12 | P-7<br>62.95 | PAG-6<br>35 | N-3<br>2 | S1/S2<br>80/20 | W-3<br>0.05 | 28 | 21 | 16.0 | 4.2 | Rectangular | A |
| Ex 2-13 | P-8<br>81.95 | PAG-2<br>35 | N-2<br>1 | S1/S2<br>80/20 | W-3<br>0.05 | 28 | 19 | 18.2 | 5.6 | Rectangular | A |
| Ex 2-14 | P-9<br>63.95 | PAG-1<br>35 | N-3<br>1 | S1/S2<br>80/20 | W-2<br>0.05 | 28 | 19 | 17.5 | 5.5 | Rectangular | A |
| Ex 2-15 | P-10<br>62.95 | PAG-2<br>35 | N-4<br>2 | S1/S2<br>80/20 | W-3<br>0.05 | 26 | 20 | 14.2 | 4.6 | Rectangular | A |
| Ex 2-16 | P-11<br>62.95 | PAG-5<br>35 | N-3<br>2 | S1/S2<br>80/20 | W-3<br>0.05 | 26 | 20 | 13.9 | 5.0 | Rectangular | A |
| Ex 2-17 | P-12<br>62.95 | PAG-6<br>35 | N-3<br>2 | S1/S2<br>80/20 | W-1<br>0.05 | 24 | 20 | 14.0 | 4.9 | Rectangular | A |
| Ex 2-18 | P-13<br>62.95 | PAG-7<br>35 | N-3<br>2 | S1/S2<br>80/20 | W-3<br>0.05 | 24 | 21 | 15.2 | 4.8 | Rectangular | A |
| Ex 2-19 | P-14<br>62.95 | PAG-3<br>35 | N-3<br>2 | S1/S2<br>80/20 | W-3<br>0.05 | 24 | 21 | 14.0 | 5.2 | Rectangular | A |
| Ex 2-20 | P-15<br>62.95 | PAG-4<br>35 | N-3<br>2 | S1/S2<br>80/20 | W-2<br>0.05 | 22 | 23 | 11.4 | 3.8 | Rectangular | A |
| Ex 2-21 | P-16<br>62.95 | PAG-5<br>35 | N-3<br>2 | S1/S2<br>80/20 | W-3<br>0.05 | 26 | 20 | 13.9 | 4.8 | Rectangular | A |
| Ex 2-22 | P-17<br>62.95 | PAG-6<br>35 | N-4<br>2 | S1/S2<br>80/20 | W-1<br>0.05 | 24 | 21 | 14.2 | 4.7 | Rectangular | A |
| Ex 2-23 | P-18<br>62.95 | PAG-4<br>35 | N-4<br>2.0 | S1/S2<br>80/20 | W-3<br>0.05 | 24 | 22 | 13.6 | 4.6 | Rectangular | A |
| Ex 2-24 | P-19<br>62.95 | PAG-4<br>35 | N-5<br>2.0 | S1/S2<br>50/50 | W-3<br>0.05 | 22 | 24 | 11.4 | 4.2 | Rectangular | A |
| Ex 2-25 | P-20<br>62.95 | PAG-4<br>35 | N-6<br>2.0 | S1/S2<br>50/50 | W-3<br>0.05 | 24 | 20 | 14.2 | 5.2 | Rectangular | A |
| Ex 2-26 | P-21<br>62.95 | PAG-4<br>35 | N-6<br>2.0 | S1/S2<br>50/50 | W-3<br>0.05 | 22 | 24 | 10.9 | 3.8 | Rectangular | A |
| Ex 2-27 | P-22<br>62.95 | PAG-4<br>35 | N-8<br>2.0 | S1/S2<br>50/50 | W-3<br>0.05 | 26 | 20 | 15.4 | 4.9 | Rectangular | A |
| Ex 2-28 | P-22<br>62.95 | PAG-4<br>35 | N-6<br>2.0 | S1/S2<br>50/50 | W-3<br>0.05 | 26 | 20 | 14.2 | 5.0 | Rectangular | A |
| Ex 2-29 | P-23<br>62.95 | — | N-6<br>2.0 | S1/S2<br>50/50 | W-3<br>0.05 | 28 | 19 | 17.6 | 5.9 | Rectangular | A |
| Ex 2-30 | P-24<br>97.95 | — | N-6<br>2.0 | S1/S2<br>50/50 | W-3<br>0.05 | 22 | 23 | 12.3 | 4.1 | Rectangular | A |
| Ex 2-31 | P-25<br>62.95 | PAG-4<br>35 | N-6<br>2.0 | S1/S2<br>50/50 | W-3<br>0.05 | 22 | 24 | 12.3 | 3.8 | Rectangular | A |
| Ex 2-32 | P-26<br>62.95 | PAG-4<br>35 | N-6<br>2.0 | S1/S2<br>50/50 | W-3<br>0.05 | 22 | 24 | 11.3 | 3.9 | Rectangular | A |
| Ex 2-33 | P-27<br>97.95 | — | N-6<br>2.0 | S1/S2<br>80/20 | W-3<br>0.05 | 24 | 21 | 13.1 | 4.8 | Rectangular | A |
| Ex 2-34 | P-28<br>97.95 | — | N-6<br>2.0 | S1/S2<br>50/50 | W-3<br>0.05 | 24 | 21 | 14.1 | 4.7 | Rectangular | A |
| Ex 2-35 | P-29<br>98.95 | — | N-10<br>1.0 | S1/S2<br>50/50 | W-3<br>0.05 | 22 | 24 | 11.4 | 4.1 | Rectangular | A |
| Ex 2-36 | P-29<br>63.95 | PAG-4<br>35 | N-7<br>1.0 | S1/S2<br>50/50 | W-3<br>0.05 | 22 | 23 | 10.9 | 4.2 | Rectangular | A |
| Ex 2-37 | P-30<br>62.95 | PAG-4<br>35 | N-6<br>2.0 | S1/S2<br>50/50 | W-3<br>0.05 | 22 | 23 | 10.8 | 4.0 | Rectangular | A |
| Ex 2-38 | P-31<br>62.95 | PAG-4<br>35 | N-6<br>2.0 | S1/S2<br>80/20 | W-3<br>0.05 | 22 | 24 | 11.2 | 4.1 | Rectangular | A |
| Ex 2-39 | P-32<br>62.95 | PAG-4<br>35 | N-6<br>2.0 | S1/S2<br>80/20 | W-3<br>0.05 | 26 | 21 | 14 | 4.9 | Rectangular | A |
| Ex 2-40 | P-33<br>97.95 | — | N-6<br>2.0 | S1/S2<br>80/20 | W-3<br>0.05 | 26 | 20 | 13.9 | 5.2 | Rectangular | A |
| Ex 2-41 | P-34<br>62.95 | PAG-4<br>35 | N-6<br>2.0 | S1/S2<br>50/50 | W-3<br>0.05 | 24 | 22 | 13.7 | 5.3 | Rectangular | A |
| Ex 2-42 | P-35<br>97.95 | — | N-6<br>2.0 | S1/S2<br>80/20 | W-3<br>0.05 | 24 | 20 | 14.9 | 5.1 | Rectangular | A |

TABLE 2-continued

| | Acid-decomposable compound (% by mass) | Photo-acid generator (% by mass) | Basic compound (% by mass) | Solvent (mass ratio) | Surfactant (% by mass) | Resolution (% by mass) | EL (%) | Sensitivity (μC/cm²) | LER (nm) | Shape | Film reduction |
|---|---|---|---|---|---|---|---|---|---|---|---|
| Ex 2-43 | P-36<br>62.95 | PAG-3<br>35 | N-6<br>2.0 | S1/S2<br>80/20 | W-3<br>0.05 | 22 | 24 | 11.2 | 4.0 | Rectangular | A |
| Ex 2-44 | P-37<br>62.95 | PAG-3<br>35 | N-6<br>2.0 | S1/S2<br>80/20 | W-3<br>0.05 | 24 | 22 | 14.3 | 4.8 | Rectangular | A |
| Ex 2-45 | P-38<br>99.35 | — | N-3<br>0.6 | S1/S2<br>80/20 | W-3<br>0.05 | 24 | 20 | 13.2 | 4.6 | Rectangular | A |
| Ex 2-46 | P-1/Ab-120<br>40/22.95 | PAG-4<br>35 | N-3<br>2.0 | S1/S2<br>80/20 | W-3<br>0.05 | 22 | 23 | 10.5 | 3.9 | Rectangular | A |
| Ex 2-47 | P-1/Ab-264<br>40/22.95 | PAG-4<br>35 | N-3<br>2.0 | S1/S2<br>80/20 | W-3<br>0.05 | 24 | 23 | 10.6 | 4.1 | Rectangular | A |
| Ex 2-48 | P-4/Ab-73<br>40/22.95 | PAG-4<br>35 | N-3<br>2.0 | S1/S2<br>80/20 | W-3<br>0.05 | 22 | 23 | 11.2 | 3.9 | Rectangular | A |
| Ex 2-49 | P-4/Ab-244<br>40/22.95 | PAG-4<br>35 | N-3<br>2.0 | S1/S2<br>80/20 | W-3<br>0.05 | 22 | 24 | 11.4 | 3.8 | Rectangular | A |
| Ex 2-50 | P-1<br>62.95 | PAG-1/PAG-4<br>10/25 | N-3<br>2.0 | S1/S2<br>80/20 | W-3<br>0.05 | 22 | 19 | 10.1 | 4.0 | Rectangular | A |
| Ex 2-51 | P-4<br>63 | PAG-4<br>35 | N-3<br>2.0 | S1/S2<br>80/20 | — | 22 | 23 | 11.2 | 4.1 | Rectangular | A |
| C. Ex 2-1 | R-1<br>62.95 | PAG-4<br>35 | N-3<br>2.0 | S1/S2<br>80/20 | W-3<br>0.05 | 38 | 15 | 16.2 | 7.2 | Inversed tapered | C |
| C. Ex 2-2 | R-2<br>62.95 | PAG-4<br>35 | N-3<br>2.0 | S1/S2<br>80/20 | W-3<br>0.05 | 38 | 16 | 30.1 | 7.0 | tapered | B |
| C. Ex 2-3 | R-3<br>62.95 | PAG-4<br>35 | N-3<br>2.0 | S1/S2<br>80/20 | W-3<br>0.05 | 38 | 16 | 32.2 | 7.0 | tapered | A |

From the results shown in the tables, it is understood that, in the EB exposure, the actinic ray-sensitive or radiation-sensitive resin composition of Examples satisfies the high resolution property, the high sensitivity, the good pattern shape, the good roughness characteristic, the good flare resistance and the good exposure latitude (EL) at the same time, compared to Comparative Examples 1-1 to 1-3.

Further, it is understood that, even in the EUV exposure, the actinic ray-sensitive or radiation-sensitive resin composition of Examples satisfies the high resolution property, the high sensitivity, the good pattern shape, the good roughness characteristic, the good flare resistance and the good exposure latitude (EL) at the same time, compared to Comparative Examples 2-1 to 2-3.

Furthermore, in the case where the actinic ray-sensitive or radiation-sensitive resin composition of Examples contains the resin (P) having the repeating unit represented by Formula (A), the repeating unit represented by Formula (B) and the repeating unit represented by Formula (E), in the EB exposure, the sensitivity of the actinic ray-sensitive or radiation-sensitive resin composition is further enhanced, and, in the EUV exposure, the resolution of the actinic ray-sensitive or radiation-sensitive resin composition is further enhanced.

Industrial Applicability

According to the present invention, it is possible to provide an actinic ray-sensitive or radiation-sensitive composition satisfying a high resolution property, a high sensitivity, a good pattern shape, a good roughness characteristic, a good flare resistance and a good exposure latitude (EL) at the same time, an actinic ray-sensitive or radiation-sensitive film using the same, a pattern forming method, a method for manufacturing an electronic device, and an electronic device.

This application is based on Japanese patent application No. 2012-064522 filed on Mar. 21, 2012, the entire content of which is hereby incorporated by reference, the same as if set forth at length.

What is claimed is:

1. An actinic ray-sensitive or radiation-sensitive resin composition comprising: a resin (P) containing a repeating unit represented by the following Formula (A) and containing at least two of a repeating unit represented by the following Formula (B), a repeating unit represented by the following Formula (C), a repeating unit represented by the following Formula (D) and a repeating unit represented by the following Formula (E):

(A)

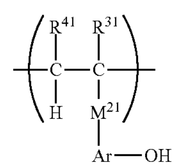

wherein in Formula (A), $R^{41}$ represents a hydrogen atom or an alkyl group, $R^{41}$, and $M^{21}$ or Ar may be bound with each other to form a ring, and in that case, $R^{41}$ represents an alkylene group;

$R^{31}$ represents a hydrogen atom or an alkyl group;

$M^{21}$ represents a single bond or a divalent linking gorup, and in the case of being bound with $R^{41}$ to form a ring, represents a trivalent linking group; and Ar represents a divalent aromatic ring group, and in the case of being bound with $R^{41}$ to form a ring, represents a trivalent aromatic ring group:

(B)

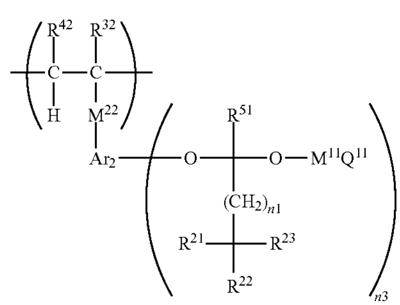

wherein in Formula (B), $R^{51}$ represents a hydrogen atom or an alkyl group;

each of $R^{21}$ to $R^{23}$ independently represents a hydrogen atom, an alkyl group, a cycloalkyl group, an aryl group, an aralkyl group or a heterocyclic group, and each of at least two of $R^{21}$ to $R^{23}$ independently represents an alkyl group, a cycloalkyl group, an aryl group, an aralkyl group or a heterocyclic group;

at least two of $R^{21}$ to $R^{23}$ may be bound with each other to form a ring, provided that at least one of $R^{21}$ to $R^{23}$, and $M^{11}$ or $Q^{11}$ are not bound to form a ring;

$R^{32}$ represents a hydrogen atom or an alkyl group;

$R^{42}$ represents a hydrogen atom or an alkyl group, $R^{42}$, and $M^{22}$ or $Ar_2$ may be bound with each other to form a ring, and in that case, $R^{42}$ represents an alkylene group;

$M^{22}$ represents a single bond or a divalent linking group, and in the case of being bound with $R^{42}$ to form a ring, represents a trivalent linking group;

$Ar_2$ represents a (n3+1)-valent aromatic ring group, and in the case of being bound with $R^{42}$ to form a ring, represents a (n3+2)-valent aromatic ring group;

$M^{11}$ represents a single bond or a divalent linking group;

$Q^{11}$ represents an alkyl group, a cycloalkyl group, an aryl group or a heterocyclic group;

when $M^{11}$ is a divalent linking group, $Q^{11}$ may be bound via a single bond or a separate linking group to $M^{11}$ to form a ring;

n1 represents an integer of 1 or more; and n3 represents an integer of 1 or more:

(C)

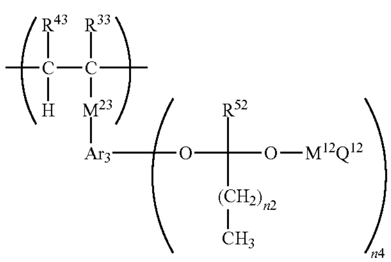

wherein in Formula (C), $R^{52}$ represents a hydrogen atom or an alkyl group;

$R^{33}$ represents a hydrogen atom or an alkyl group;

$R^{43}$ represents a hydrogen atom or an alkyl group, $R^{43}$, and $M^{23}$ or $Ar_3$ may be bound with each other to form a ring, and in that case, $R^{43}$ represents an alkylene group;

$M^{23}$ represents a single bond or a divalent linking gorup, and in the case of being bound with $R^{43}$ to form a ring, represents a trivalent linking group;

$Ar_3$ represents a (n4+1)-valent aromatic ring group, and in the case of being bound with $R^{43}$ to form a ring, represents a (n4+2)-valent aromatic ring group;

$M^{12}$represents a single bond or a divalent linking group;

$Q^{12}$ represents an alkyl group, a cycloalkyl group, an aryl group or a heterocyclic group;

when $M^{12}$ is a divalent linking group, $Q^{12}$ may be bound via a single bond or a separate linking group to $M^{12}$ to form a ring;

n2 represents an integer of 0 or more; and n4 represents an integer of 1 or more:

(D)

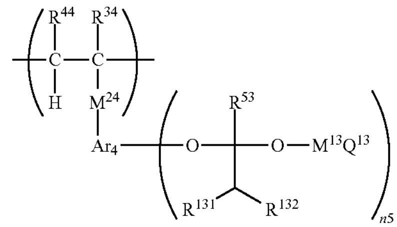

wherein in Formula (D), $R^{53}$ represents a hydrogen atom or an alkyl group;

each of $R^{131}$ and $R^{132}$ independently represents an alkyl group, a cycloalkyl group, an aryl group, an aralkyl group or a heterocyclic group, and each of $R^{131}$ and $R^{132}$ may be bound with each other to form a ring;

$R^{34}$ represents a hydrogen atom or an alkyl group;

$R^{44}$ represents a hydrogen atom or an alkyl group, $R^{44}$, and $M^{24}$ or $Ar_4$ may be bound with each other to form a ring, and in that case, $R^{44}$ represents an alkylene group;

$M^{24}$ represents a single bond or a divalent linking group, and in the case of being bound with $R^{44}$ to form a ring, represents a trivalent linking group;

$Ar_4$ represents a (n5+1)-valent aromatic ring group, and in the case of being bound with $R^{44}$ to form a ring, represents a (n5+2)-valent aromatic ring group;

$M^{13}$ represents a single bond or a divalent linking group;

$Q^{13}$ represents an alkyl group, a cycloalkyl group, an aryl group or a heterocyclic group;

when $M^{13}$ is a divalent linking group, $Q^{13}$ may be bound via a single bond or a separate linking group to $M^{13}$ to form a ring; and n5 represents an integer of 1 or more:

(E)

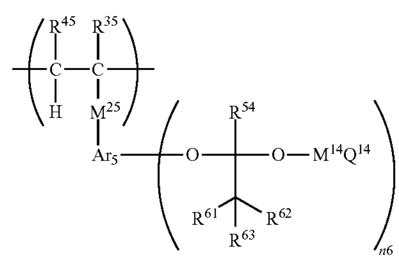

wherein in Formula (E), $R^{54}$ represents a hydrogen atom or an alkyl group;

each of $R^{61}$ to $R^{63}$ independently represents an organic group in which an atom bound to C in —$C(R^{61}R^{62}R^{63})$ is a carbon atom, and at least two of $R^{61}$, $R^{62}$ and $R^{63}$ may be bound with each other to form a ring;

$R^{35}$ represents a hydrogen atom or an alkyl group;

$R^{45}$ represents a hydrogen atom or an alkyl group, $R^{45}$, and $M^{25}$ or $Ar_5$ may be bound with each other to form a ring, and in that case, $R^{45}$ represents an alkylene group;

$M^{25}$ represents a single bond or a divalent linking group, and in the case of being bound with $R^{45}$ to form a ring, represents a trivalent linking group;

$Ar_5$ represents a (n6+1)-valent aromatic ring group, and in the case of being bound with $R^{45}$ to form a ring, represents a (n6+2)-valent aromatic ring group;

$M^{14}$ represents a single bond or a divalent linking group;

$Q^{14}$ represents an alkyl group, a cycloalkyl group, an aryl group or a heterocyclic group; and n6 represents an integer of 1 or more, and wherein the resin (P) contains the repeating unit represented by Formula (A), the repeating unit represented by Formula (B) and the repeating unit represented by Formula (E).

2. The actinic ray-sensitive or radiation-sensitive resin composition of claim 1, wherein, in Formula (B), n1 is 1.

3. The actinic ray-sensitive or radiation-sensitive resin composition of claim 1, wherein, in Formula (B), $R^{51}$ is a hydrogen atom.

4. The actinic ray-sensitive or radiation-sensitive resin composition of claim 1, wherein, in Formula (B), $R^{21}$ to $R^{23}$ are an alkyl group.

5. The actinic ray-sensitive or radiation-sensitive resin composition of claim 1, wherein, in Formulas (B), (C), (D) and (E), a group represented by $-M^{11}-Q^{11}$, a group represented by $-M^{12}-Q^{12}$, a group represented by $-M^{13}-Q^{13}$ and a group represented by $-M^{14}-Q^{14}$ are an alkyl group, a cycloalkyl group, an aralkyl group, an aryloxyalkyl group or a heterocyclic group.

6. The actinic ray-sensitive or radiation-sensitive resin composition of claim 1, wherein, in Formulas (A), (B), (C), (D) and (E), $M^{21}$ to $M^{25}$ are a single bond, and Ar and $Ar_2$ to $Ar_5$ are a phenylene group.

7. The actinic ray-sensitive or radiation-sensitive resin composition of claim 1, wherein the resin (P) further contains a non-decomposable repeating unit represented by the following Formula (3):

(3)

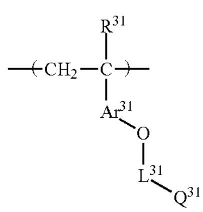

wherein in Formula (3), $R^{31}$ represents a hydrogen atom or an methyl group;

$Ar^{31}$ represents an arylene group;

$L^{31}$ represents a single bond or a divalent linking group; and $Q^{31}$ represents a cycloalkyl group or an aryl group.

8. The actinic ray-sensitive or radiation-sensitive resin composition of claim 1, wherein the resin (P) further contains a repeating unit represented by the following Formula (4):

(4)

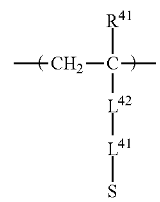

wherein in Formula (4), $R^{41}$ represents a hydrogen atom or an methyl gorup;

$L^{41}$ represents a single bond or a divalent linking group;

$L^{42}$ represents a divalent linking group; and

S represents a structural moiety capable of generating an acid in a side chain upon irradiation with an actinic ray or radiation.

9. A resist film formed from the actinic ray-sensitive or radiation-sensitive resin composition of claim 1.

10. A pattern forming method comprising exposing and developing the resist film of claim 9.

11. A method for manufacturing an electronic device comprising the method of claim 10.

* * * * *